US010230054B2

(12) United States Patent
Kim et al.

(10) Patent No.: US 10,230,054 B2
(45) Date of Patent: Mar. 12, 2019

(54) ORGANIC LIGHT-EMITTING DEVICE

(71) Applicant: SAMSUNG DISPLAY CO., LTD., Yongin-si, Gyeonggi-do (KR)

(72) Inventors: Minkyung Kim, Yongin-si (KR); Taekyung Kim, Yongin-si (KR); Miehwa Park, Yongin-si (KR); Jaeyong Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 240 days.

(21) Appl. No.: 15/227,820

(22) Filed: Aug. 3, 2016

(65) Prior Publication Data

US 2017/0054085 A1 Feb. 23, 2017

(30) Foreign Application Priority Data

Aug. 19, 2015 (KR) ........................ 10-2015-0116851

(51) Int. Cl.
*H01L 51/50* (2006.01)
*H01L 51/00* (2006.01)
(Continued)

(52) U.S. Cl.
CPC ........ *H01L 51/0072* (2013.01); *C09K 11/025* (2013.01); *C09K 11/06* (2013.01); *H01L 51/007* (2013.01); *H01L 51/0067* (2013.01); *H01L 51/0074* (2013.01); *H01L 51/0085* (2013.01); *H05B 33/14* (2013.01); *H05B 33/20* (2013.01); *C09K 2211/1007* (2013.01); *C09K 2211/1011* (2013.01); *C09K 2211/1022* (2013.01); *C09K 2211/1029* (2013.01); *C09K 2211/1037* (2013.01); *C09K 2211/1044* (2013.01); *C09K 2211/1048* (2013.01); *C09K 2211/1051* (2013.01); *C09K 2211/1059* (2013.01); *C09K 2211/1088* (2013.01);
(Continued)

(58) Field of Classification Search
None
See application file for complete search history.

(56) References Cited

U.S. PATENT DOCUMENTS

2006/0051611 A1* 3/2006 Brunner .............. C08G 61/123
428/690
2012/0080670 A1 4/2012 Park et al.
(Continued)

FOREIGN PATENT DOCUMENTS

KR 10-2011-0048838 A 5/2011
KR 10-2011-0092263 A 8/2011
(Continued)

OTHER PUBLICATIONS

Matsuo et al., The chemistry of four-membered aromatics, 2012, Chem. Comm., 48, 9334-9442 (Year: 2012).*

*Primary Examiner* — Gregory D Clark
(74) *Attorney, Agent, or Firm* — Lewis Roca Rothgerber Christie LLP

(57) ABSTRACT

An organic light-emitting device includes: a first electrode; a second electrode facing the first electrode; and an organic layer between the first electrode and the second electrode, the organic layer including an emission layer, wherein the organic layer includes a first compound and a second compound. The organic light-emitting device may have a high efficiency and long lifespan.

20 Claims, 1 Drawing Sheet

(51) Int. Cl.

| | |
|---|---|
| ***C09K 11/06*** | (2006.01) |
| ***C09K 11/02*** | (2006.01) |
| ***H05B 33/14*** | (2006.01) |
| ***H05B 33/20*** | (2006.01) |

(52) U.S. Cl.

CPC ................. *C09K 2211/1092* (2013.01); *C09K 2211/185* (2013.01); *H01L 51/5012* (2013.01); *H01L 51/5016* (2013.01); *H01L 2051/0063* (2013.01); *H01L 2251/5376* (2013.01); *H01L 2251/5384* (2013.01)

(56) References Cited

U.S. PATENT DOCUMENTS

| | | | |
|---|---|---|---|
| 2012/0273764 | A1 | 11/2012 | Yu et al. |
| 2013/0112952 | A1 | 5/2013 | Adamovich et al. |

FOREIGN PATENT DOCUMENTS

| | | | | |
|---|---|---|---|---|
| KR | 10-2012-0079408 A | | 7/2012 | |
| KR | 10-2013-0007390 A | | 1/2013 | |
| KR | 10-2013-0022420 A | | 3/2013 | |
| KR | 10-2013-0073023 A | | 7/2013 | |
| KR | 10-2014-0108477 A | | 9/2014 | |
| WO | WO 2012093852 | * | 7/2012 | ............. C09K 11/06 |

* cited by examiner

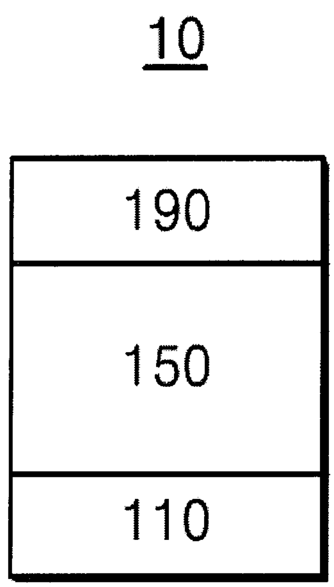
10
190
150
110

ORGANIC LIGHT-EMITTING DEVICE

CROSS-REFERENCE TO RELATED APPLICATION

This application claims priority to and the benefit of Korean Patent Application No. 10-2015-0116851, filed on Aug. 19, 2015, in the Korean Intellectual Property Office, the disclosure of which is incorporated herein in its entirety by reference.

BACKGROUND

1. Field

One or more aspects of example embodiments of the present disclosure relate to an organic light-emitting device.

2. Description of the Related Art

Organic light-emitting devices (OLEDs) are self-emission devices that have wide viewing angles, high contrast ratios, quick response times, high luminance, and excellent driving voltage and response speed characteristics, and can produce full-color images.

An organic light-emitting device may include a first electrode, a hole transport region, an emission layer, an electron transport region, and a second electrode, which are sequentially formed on a substrate in this stated order. Holes provided from the first electrode may move to the emission layer through the hole transport region, and electrons provided from the second electrode may move to the emission layer through the electron transport region. The holes and the electrons are then recombined in the emission layer to produce excitons. These excitons change from an excited state to a ground state to thereby generate light.

SUMMARY

One or more aspects of example embodiments of the present disclosure are directed toward an organic light-emitting device having a high efficiency and long lifespan.

Additional aspects will be set forth in part in the description which follows and, in part, will be apparent from the description, or may be learned by practice of the presented embodiments.

According to one or more example embodiments, an organic light-emitting device includes a first electrode; a second electrode facing the first electrode; and an organic layer between the first electrode and the second electrode, the organic layer including an emission layer, wherein, the organic layer includes a first compound represented by one of Formulae 1-1 to 1-3 and a second compound represented by Formula 2:

Formula 1-1

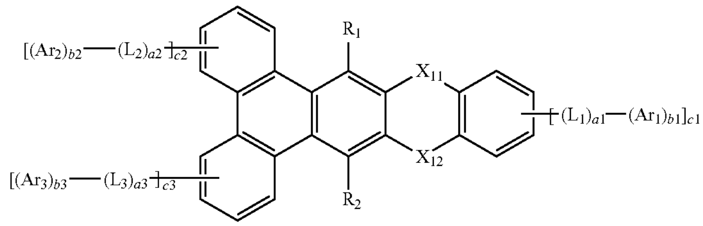

Formula 1-2

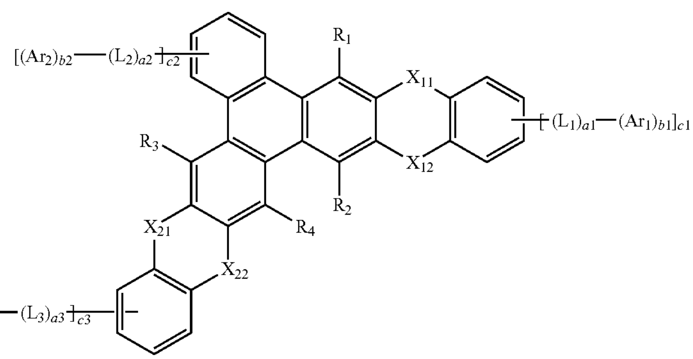

Formula 1-3

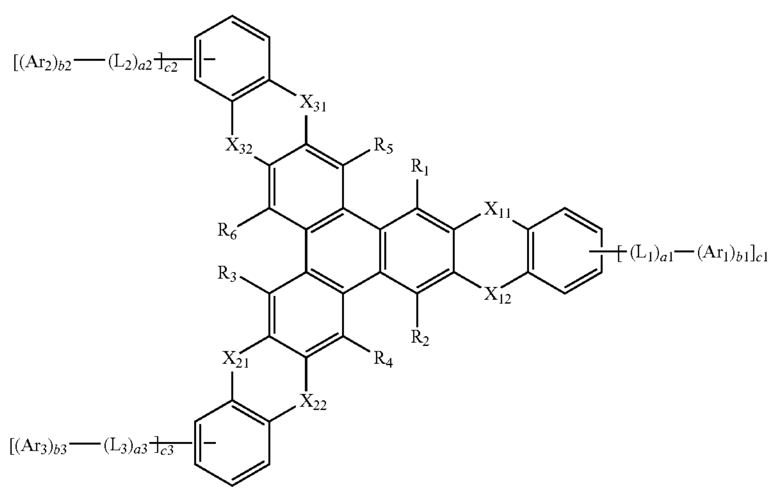

-continued

Formula 2

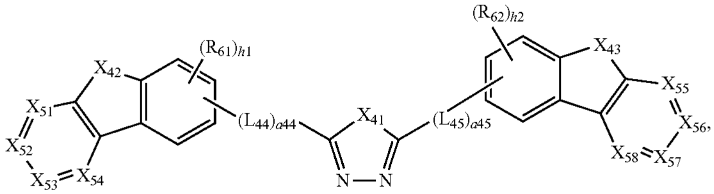

wherein, in Formulae 1-1 to 1-3 and 2, $X_{11}$ is selected from a single bond, $C(R_{11})(R_{12})$, $Si(R_{13})(R_{14})$, $N[(L_4)_{a4}-(Ar_4)_{b4}]$, O, S, S(═O), and $S(═O)_2$, $X_{12}$ is selected from a single bond, $C(R_{15})(R_{16})$, $Si(R_{17})(R_{18})$, $N[(L_5)_{a5}-(Ar_5)_{b5}]$, O, S, S(═O), and $S(═O)_2$, $X_{21}$ is selected from a single bond, $C(R_{21})(R_{22})$, $Si(R_{23})(R_{24})$, $N[(L_6)_{a6}-(Ar_6)_{b6}]$, O, S, S(═O), and $S(═O)_2$, $X_{22}$ is selected from a single bond, $C(R_{25})(R_{26})$, $Si(R_{27})(R_{28})$, $N[(L_7)_{a7}-(Ar_7)_{b7}]$, O, S, S(═O), and $S(═O)_2$, $X_{31}$ is selected from a single bond, $C(R_{31})(R_{32})$, $Si(R_{33})(R_{34})$, $N[(L_8)_{a8}-(Ar_8)_{b8}]$, O, S, S(═O), and $S(═O)_2$, $X_{32}$ is selected from a single bond, $C(R_{35})(R_{36})$, $Si(R_{37})(R_{38})$, $N[(L_9)_{a9}-(Ar_9)_{b9}]$, O, S, S(═O), and $S(═O)_2$, $X_{41}$ is selected from $N[(L_{41})_{a41}-(Ar_{41})_{b41}]$, O, and S, $X_{42}$ is selected from $N[(L_{42})_{a42}-(Ar_{42})_{b42}]$, O, S, $C(R_{41})(R_{42})$, and $Si(R_{43})(R_{44})$, $X_{43}$ is selected from $N[(L_{43})_{a43}-(Ar_{43})_{b43}]$, O, S, $C(R_{45})(R_{46})$, and $Si(R_{47})(R_{48})$, $X_{51}$ is N or $C(R_{51})$, $X_{52}$ is N or $C(R_{52})$, $X_{53}$ is N or $C(R_{53})$, $X_{54}$ is N or $C(R_{54})$, $X_{55}$ is N or $C(R_{55})$, $X_{56}$ is N or $C(R_{56})$, $X_{57}$ is N or $C(R_{57})$, and $X_{58}$ is N or $C(R_{58})$, wherein when $X_{11}$ and $X_{12}$ are each a single bond, $X_{21}$ and $X_{22}$ are each a single bond, or $X_{31}$ and $X_{32}$ are each a single bond, $L_1$ to $L_9$ and $L_{41}$ to $L_{45}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a1 to a9 and a41 to a45 are each independently an integer selected from 0 to 3, $Ar_1$ to $Ar_9$ and $Ar_{41}$ to $Ar_{43}$ are each independently selected from a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$N(Q_4)(Q_5)$, —$B(Q_6)(Q_7)$, and —$P(═O)(Q_8)(Q_9)$ b1 to b9 and b41 to b43 are each independently an integer selected from 1 to 3, c1 to c3 are each independently an integer selected from 0 to 4, and the sum of c1 to c3 is 1 or greater, $R_1$ to $R_6$, $R_{11}$ to $R_{18}$, $R_{21}$ to $R_{28}$, $R_{31}$ to $R_{38}$, $R_{41}$ to $R_{48}$, $R_{51}$ to $R_{58}$, and $R_{61}$ and $R_{62}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, and —$Si(Q_{11})(Q_{12})(Q_{13})$, h1 and h2 are each independently an integer selected from 0 to 3, at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group is selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group, —Si($Q_{21}$)($Q_{22}$)($Q_{23}$), —N($Q_{24}$)($Q_{25}$), and —B($Q_{26}$)($Q_{27}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group, —Si($Q_{31}$)($Q_{32}$)($Q_{33}$), —N($Q_{34}$)($Q_{35}$), and —B($Q_{36}$)($Q_{37}$); and —Si($Q_{41}$)($Q_{42}$)($Q_{43}$), —N($Q_{44}$)($Q_{45}$), and —B($Q_{46}$)($Q_{47}$);

wherein, $Q_1$ to $Q_9$, $Q_{11}$ to $Q_{13}$, $Q_{21}$ to $Q_{27}$, $Q_{31}$ to $Q_{37}$, and $Q_{41}$ to $Q_{47}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group; and a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, and a $C_1$-$C_{60}$ alkyl group.

BRIEF DESCRIPTION OF THE DRAWINGS

These and/or other aspects will become apparent and more readily appreciated from the following description of the example embodiments, taken in conjunction with the accompanying drawing, which is a schematic view of an organic light-emitting device according to an embodiment of the present disclosure.

DETAILED DESCRIPTION

Reference will now be made in more detail to example embodiments, examples of which are illustrated in the accompanying drawing, wherein like reference numerals refer to like elements throughout. In this regard, the present example embodiments may have different forms and should not be construed as being limited to the descriptions set forth herein. Accordingly, the example embodiments are merely described below, by referring to the drawing, to explain aspects of the present description. As used herein, the term "and/or" includes any and all combinations of one or more of the associated listed items. Expressions such as "at least one of," "one of," "at least one selected from," and "one selected from," when preceding a list of elements, modify the entire list of elements and do not modify the individual elements of the list. Further, the use of "may" when describing embodiments of the present invention refers to "one or more embodiments of the present invention."

The drawing is a schematic cross-sectional view of an organic light-emitting device (OLED) according to an example embodiment.

Referring to the drawing, a substrate may be additionally disposed (e.g., positioned) under a first electrode 110 or on a second electrode 190. The substrate may be a glass substrate or transparent plastic substrate, each with excellent mechanical strength, thermal stability, transparency, surface smoothness, ease of handling, and/or water resistance.

The first electrode 110 may be formed by, for example, depositing or sputtering a material for forming the first electrode 110 on the substrate. When the first electrode 110 is an anode, a material for forming the first electrode 110 may be selected from materials with a high work function, so as to facilitate hole injection. The first electrode 110 may be a reflective electrode, a semi-transmissive electrode, or a transmissive electrode. The material for forming the first electrode 110 may be an indium tin oxide (ITO), indium zinc oxide (IZO), tin oxide ($SnO_2$), and/or zinc oxide (ZnO), each with transparency and/or excellent conductivity. In some embodiments, to form the first electrode 110 as a semi-transmissive electrode or a reflective electrode, the material for forming the first electrode 110 may be at least one selected from magnesium (Mg), aluminum (Al), aluminum-lithium (Al—Li), calcium (Ca), magnesium-indium (Mg—In), and magnesium-silver (Mg—Ag).

The first electrode 110 may have a single-layer structure, or a multi-layer structure including a plurality of layers. For example, the first electrode 110 may have a triple-layer structure of ITO/Ag/ITO, but embodiments of the present disclosure are not limited thereto.

An organic layer 150 including an emission layer may be disposed (e.g., positioned) on the first electrode 110. The organic layer 150 may include a hole transport region between the first electrode 110 and the emission layer and an electron transport region between the emission layer and the second electrode 190.

The organic layer 150 may include the first compound represented by one of Formulae 1-1 to 1-3 and the second compound represented by Formula 2:

In Formulae 1-1 to 1-3, $X_{11}$ may be selected from a single bond, $C(R_{11})(R_{12})$, $Si(R_{13})(R_{14})$, $N[(L_4)_{a4}\text{-}(Ar_4)_{b4}]$, O, S, S(═O), and $S(=O)_2$, $X_{12}$ may be selected from a single bond, $C(R_{15})(R_{16})$, $Si(R_{17})(R_{18})$, $N[(L_5)_{a5}\text{-}(Ar_5)_{b5}]$, O, S, S(═O), and $S(=O)_2$, $X_{21}$ may be selected from a single bond, $C(R_{21})(R_{22})$, $Si(R_{23})(R_{24})$, $N[(L_6)_{a6}\text{-}(Ar_6)_{b6}]$, O, S, S(═O), and $S(=O)_2$, $X_{22}$ may be selected from a single bond, $C(R_{25})(R_{26})$, $Si(R_{27})(R_{28})$, $N[(L_7)_{a7}\text{-}(Ar_7)_{b7}]$, O, S, S(═O), and $S(=O)_2$, $X_{31}$ may be selected from a single bond, $C(R_{31})(R_{32})$, $Si(R_{33})(R_{34})$, $N[(L_8)_{a8}\text{-}(Ar_8)_{b8}]$, O, S, S(═O), and $S(=O)_2$, Formula 1-1

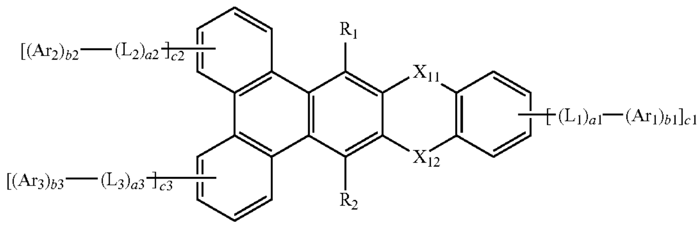

Formula 1-2

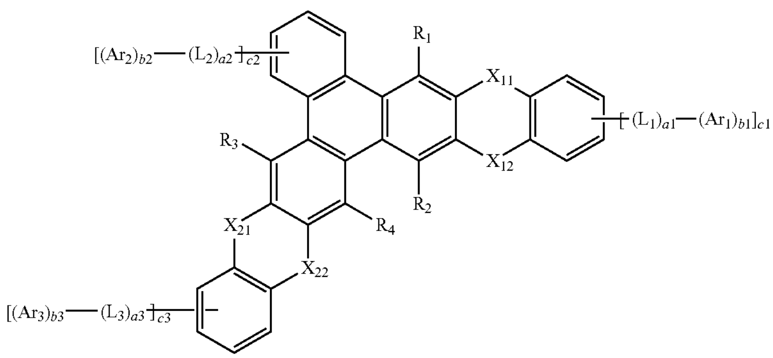

Formula 1-3

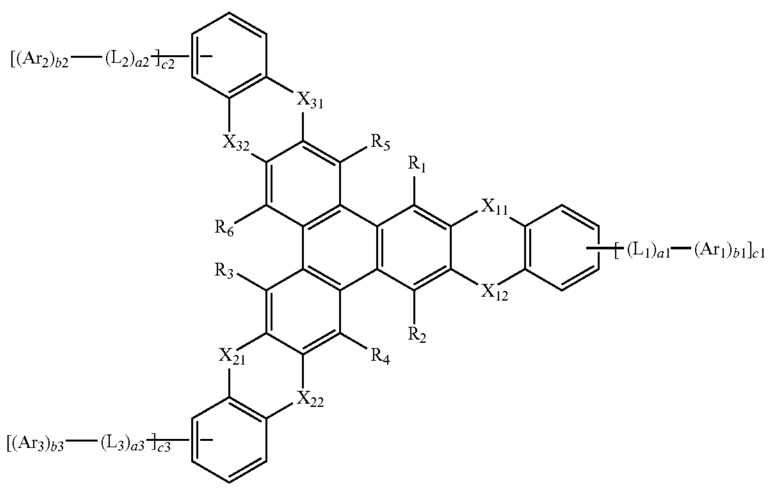

Formula 2

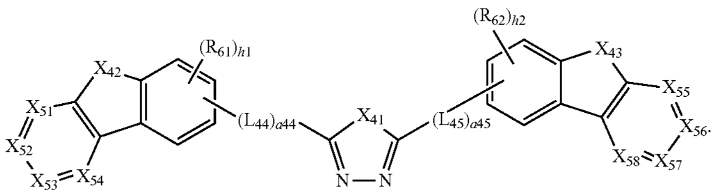

$X_{32}$ may be selected from a single bond, $C(R_{35})(R_{36})$, $Si(R_{37})(R_{38})$, $N[(L_9)_{a9}-(Ar_9)_{b9}]$, O, S, S(=O), and $S(=O)_2$, and when $X_{11}$ and $X_{12}$ are each simultaneously (or concurrently) a single bond, $X_{21}$ and $X_{22}$ are each a single bond, or $X_{31}$ and $X_{32}$ are each a single bond.

Here, $R_{11}$ to $R_{18}$, $R_{21}$ to $R_{28}$, $R_{31}$ to $R_{38}$, $L_4$ to $L_9$, a4 to a9, $Ar_4$ to $Ar_9$, and b4 to b9 may be the same as described in the present specification.

In some embodiments, in Formulae 1-1 to 1-3, $X_{11}$ may be $C(R_{11})(R_{12})$ or $N[(L_4)_{a4}-(Ar_4)_{b4}]$,
$X_{12}$ may be $C(R_{15})(R_{16})$ or $N[(L_5)_{a5}-(Ar_5)_{b5}]$,
$X_{21}$ may be $C(R_{21})(R_{22})$ or $N[(L_6)_{a6}-(Ar_6)_{b6}]$,
$X_{22}$ may be $C(R_{25})(R_{26})$ or $N[(L_7)_{a7}-(Ar_7)_{b7}]$,
$X_{31}$ may be $C(R_{31})(R_{32})$ or $N[(L_8)_{a8}-(Ar_8)_{b8}]$, and
$X_{32}$ may be $C(R_{35})(R_{36})$ or $N[(L_9)_{a9}-(Ar_9)_{b9}]$, In some embodiments, in Formulae 1-1 to 1-3, $X_{11}$ may be $C(R_{11})(R_{12})$ or $N[(L_4)_{a4}-(Ar_4)_{b4}]$,
$X_{12}$ may be $C(R_{15})(R_{16})$,
$X_{21}$ may be $C(R_{21})(R_{22})$,
$X_{22}$ may be $C(R_{25})(R_{26})$,
$X_{31}$ may be $C(R_{31})(R_{32})$, and
$X_{32}$ may be $C(R_{35})(R_{36})$, but embodiments of the present disclosure are not limited thereto.

In Formula 2, $X_{41}$ may be selected from $N[(L_{41})_{a41}-(Ar_{41})_{b41}]$, O, and S,
$X_{42}$ may be selected from $N[(L_{42})_{a42}-(Ar_{42})_{b42}]$, O, S, $C(R_{41})(R_{42})$, and $Si(R_{43})(R_{44})$, and
$X_{43}$ may be selected from $N[(L_{43})_{a43}-(Ar_{43})_{b43}]$, O, S, $C(R_{45})(R_{46})$, and $Si(R_{47})(R_{48})$.

Here, $L_{41}$ to $L_{43}$, a41 to a43, $Ar_{41}$ to $Ar_{43}$, b41 to b43, and $R_{41}$ to $R_{48}$ may be the same as described in the present specification.

In some embodiments, in Formula 2, $X_{41}$ may be selected from $N[(L_{41})_{a41}-(Ar_{41})_{b41}]$, O, and S,
$X_{42}$ may be $N[(L_{42})_{a42}-(Ar_{42})_{b42}]$, and
$X_{43}$ may be $N[(L_{43})_{a43}-(Ar_{43})_{b43}]$.

In Formula 2, $X_{51}$ may be N or $C(R_{51})$, $X_{52}$ may be N or $C(R_{52})$, $X_{53}$ may be N or $C(R_{53})$, $X_{54}$ may be N or $C(R_{54})$, $X_{55}$ may be N or $C(R_{55})$, $X_{56}$ may be N or $C(R_{56})$, $X_{57}$ may be N or $C(R_{57})$, and $X_{58}$ may be N or $C(R_{58})$.

Here, $R_{51}$ to $R_{58}$ may be the same as described in the present specification.

In some embodiments, in Formula 2, $X_{51}$ may be $C(R_{51})$, $X_{52}$ may be $C(R_{52})$, $X_{53}$ may be $C(R_{53})$, $X_{54}$ may be $C(R_{54})$, $X_{55}$ may be $C(R_{55})$, $X_{56}$ may be $C(R_{56})$, $X_{57}$ may be $C(R_{57})$, and $X_{58}$ may be $C(R_{58})$, but embodiments are not limited thereto.

In Formulae 1-1 to 1-3 and 2, $L_1$ to $L_9$ and $L_{41}$ to $L_{45}$ may be each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group.

In some embodiments, in Formulae 1-1 to 1-3 and 2, $L_1$ to $L_9$ and $L_{41}$ to $L_{45}$ may be each independently selected from:

a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, a thiadiazolylene group, an imidazopyridinylene group, and an imidazopyrimidinylene group;

a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, a thiadiazolylene group, an imidazopyridinylene group, and an imidazopyrimidinylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group.

In some embodiments, in Formulae 1-1 to 1-3 and 2, $L_1$ to $L_9$ and $L_{41}$ to $L_{45}$ may be each independently selected from groups represented by Formulae 3-1 to 3-43:

3-1

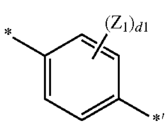

3-2

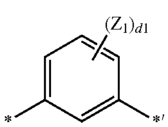

3-3

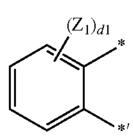

3-4

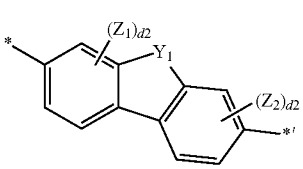

3-5

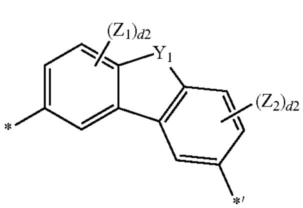

-continued 3-6

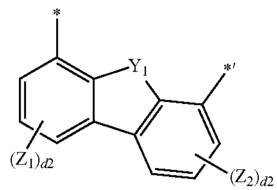

3-7

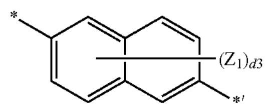

3-8

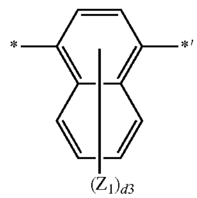

3-9

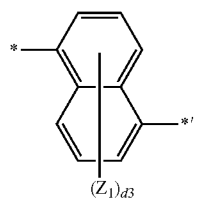

3-10

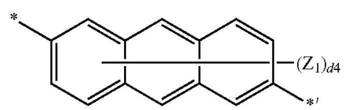

3-11

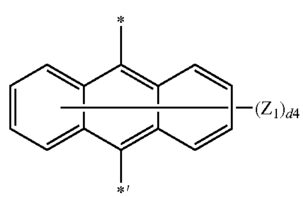

3-12

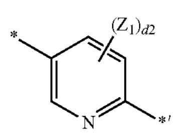

3-13

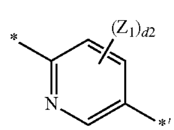

3-14

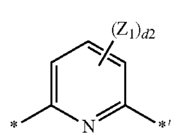

3-15

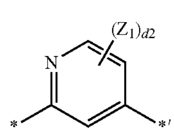

3-16
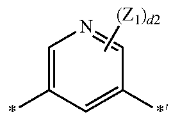
3-17
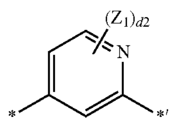
3-18
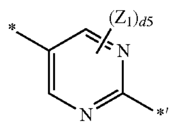
3-19
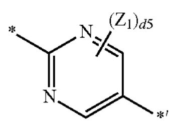
3-20
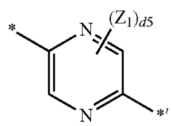
3-21
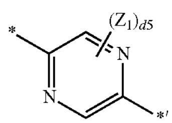
3-22
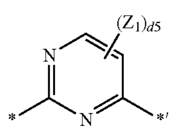
3-23
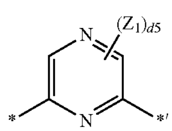
3-24
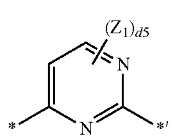
3-25
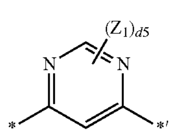
3-26
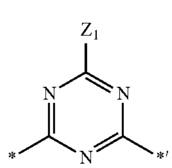
3-27
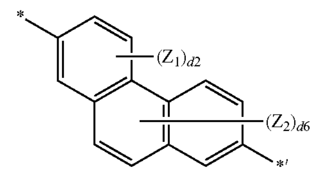
3-28
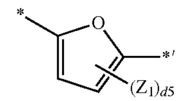
3-29
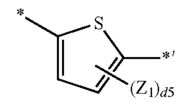
3-30
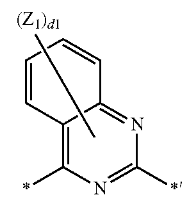
3-31
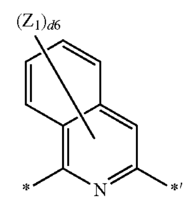
3-32
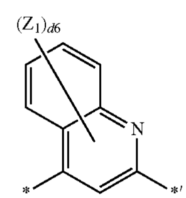
3-33
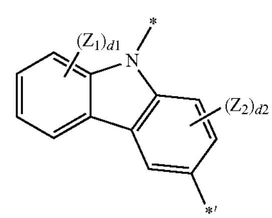
3-34
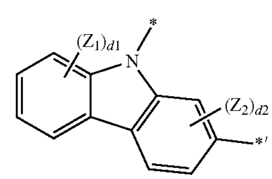
3-35
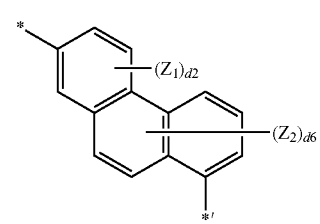

-continued 3-36

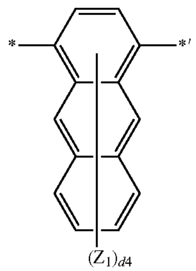

3-37

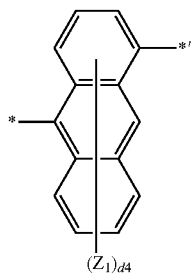

3-38

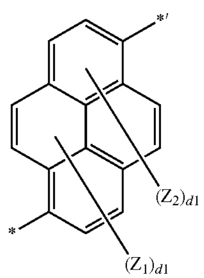

3-39

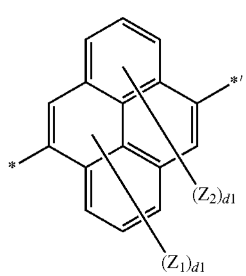

3-40

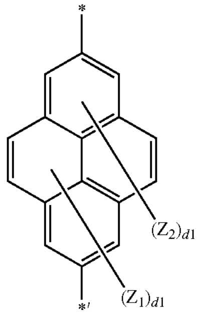

-continued 3-41

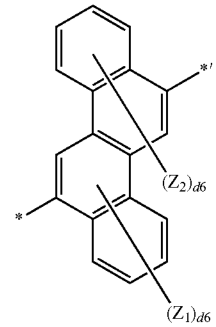

3-42

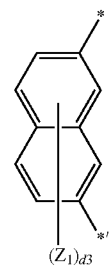

3-43

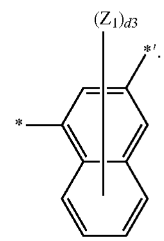

In Formulae 3-1 to 3-43, $Y_1$ may be selected from O, S, $C(Z_3)(Z_4)$, $N(Z_5)$, and $Si(Z_6)(Z_7)$, $Z_1$ to $Z_7$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, and $—Si(Q_{41})(Q_{42})(Q_{43})$, wherein $Q_{41}$ to $Q_{43}$ may be each independently selected from a $C_1$-$C_{10}$ alkyl group, a $C_1$-$C_{10}$ alkoxy group, a phenyl group, a biphenyl group, a terphenyl group, and a naphthyl group, d1 may be an integer selected from 1 to 4, d2 may be an integer selected from 1 to 3, d3 may be an integer selected from 1 to 6, d4 may be an integer selected from 1 to 8, d5 may be an integer of 1 or 2, and d6 may be an integer selected from 1 to 5, and

* and *' are each independently a binding site to a neighboring atom.

According to some embodiments, in Formulae 1-1 to 1-3 and 2, $L_1$ to $L_9$ and $L_{41}$ to $L_{45}$ may be each independently selected from groups represented by Formulae 4-1 to 4-45 but embodiments are not limited thereto:
4-1
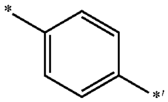
4-2
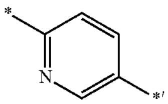
4-3
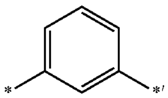
4-4
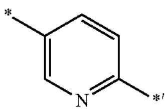
4-5
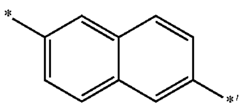
4-6
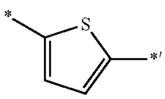
4-7
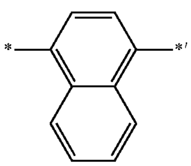
4-8
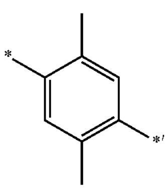
4-9
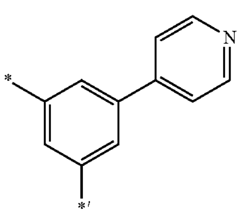
4-10
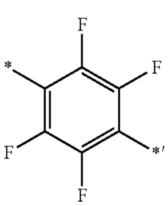
-continued
4-11
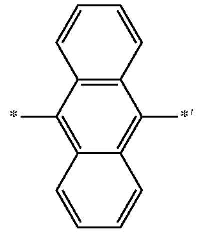
4-12
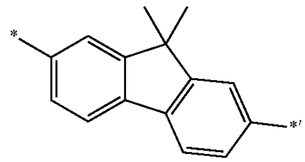
4-13
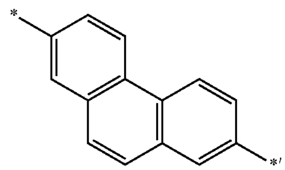
4-14
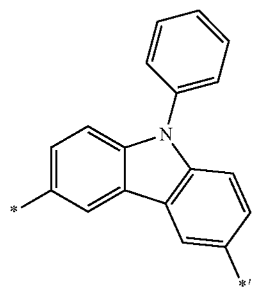
4-15
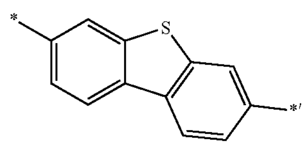
4-16
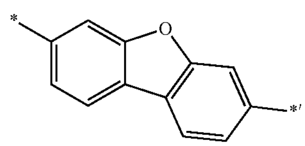
4-17
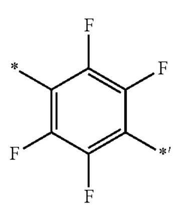
4-18
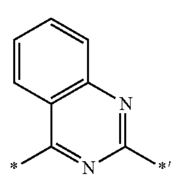

-continued
4-19
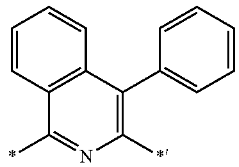
4-20
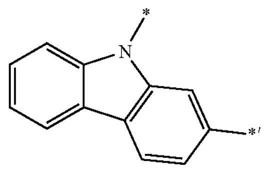
4-21
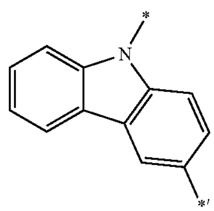
4-22
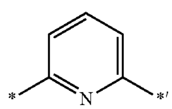
4-23
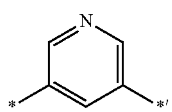
4-24
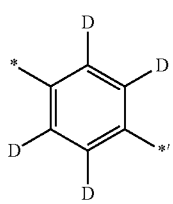
4-25
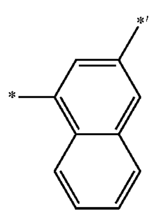
4-26
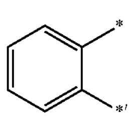
4-27
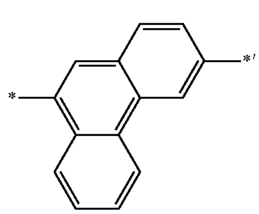
-continued
4-28
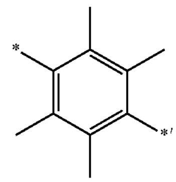
4-29
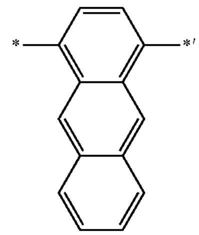
4-30
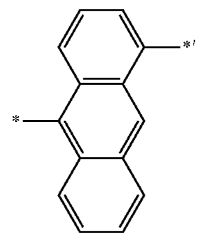
4-31
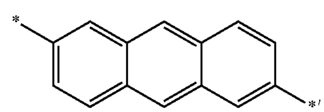
4-32
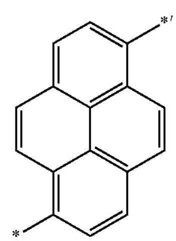
4-33
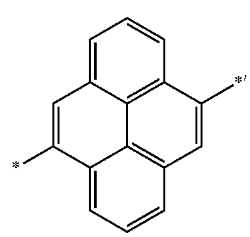
4-34
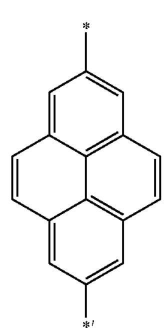

-continued 4-35

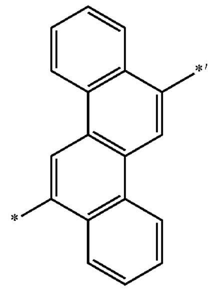

4-36

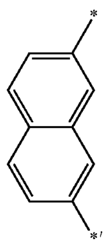

4-37

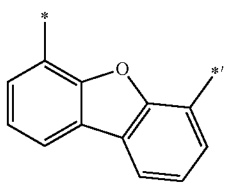

4-38

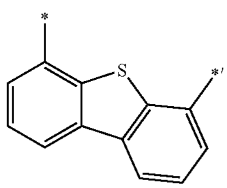

4-39

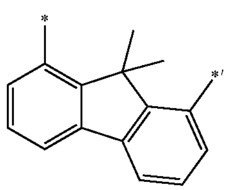

4-40

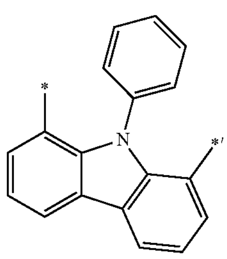

4-41

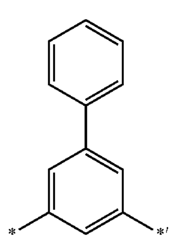

-continued 4-42

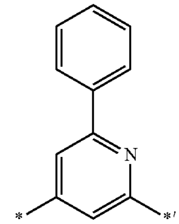

4-43

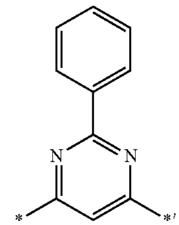

4-44

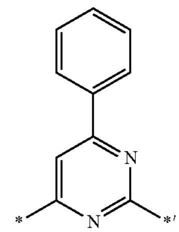

4-45

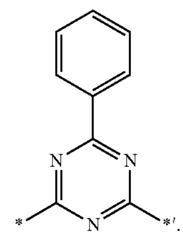

In Formulae 4-1 to 4-45, * and *' are each independently a binding site to a neighboring atom, and "D" may refer to deuterium.

In Formulae 1-1 to 1-3 and 2, a1 to a9 and a41 to a45 may be each independently an integer selected from 0 to 3. In Formulae 1-1 to 1-3, a1 denotes the number of $L_1$s, and when a1 is 2 or greater, two or more $L_1$s may be identical to or different from each other. When a1 is 0, $-(L_1)_{a1}-$ is a single bond. According to an embodiment, a1 may be 0 or 1. Descriptions of a2 to a9 and a41 to a45 may be each independently understood by referring to the description of a1 and corresponding formulae.

In some embodiments, in Formulae 1-1 to 1-3 and 2, a1 to a9 may be each independently selected from 0, 1 and 2, a41 to a43 may be each independently an integer selected from 0 to 3, and a44 and a45 may be each independently 0 or 1.

In some embodiments, in Formulae 1-1 to 1-3 and 2, a1 to a9 may be each independently 0 or 1, a41 to a43 may be each independently an integer selected from 0 to 3, and a44 and a45 may be each independently 0 or 1.

In Formulae 1-1 to 1-3 and 2, $Ar_1$ to $Ar_9$ and $Ar_{41}$ to $Ar_{43}$ may be each independently selected from a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_4$)($Q_5$), —B($Q_6$)($Q_7$), and —P(=O)($Q_8$)($Q_9$).

Here, $Q_1$ to $Q_9$ may be the same as described in the present specification.

In some embodiments, in Formulae 1-1 to 1-3 and 2, $Ar_1$ to $Ar_9$ and $Ar_{41}$ to $Ar_{43}$ may be each independently selected from:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from a phenyl group, a biphenyl group, a terphenyl group, a naphthyl group, a pyridinyl group, and a pyrimidinyl group;

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a dibenzosilolyl group, a thiadiazolyl group, an imidazopyridinyl group, an imidazopyrimidinyl group, —Si($Q_1$)($Q_2$)($Q_3$), —N($Q_4$)($Q_5$), —B($Q_6$)($Q_7$), and —P(=O)($Q_8$)($Q_9$);

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a dibenzosilolyl group, a thiadiazolyl group, an imidazopyridinyl group, and an imidazopyrimidinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, an imidazopyrimidinyl group, and —Si($Q_{41}$)($Q_{42}$)($Q_{43}$), wherein $Q_1$ to $Q_9$ and $Q_{41}$ to $Q_{43}$ are each independently selected from:

phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, an oxadiazolyl group, a triazinyl group, a dibenzofuranyl group, a dibenzothiophenyl group, a benzocarbazolyl group, a dibenzocarbazolyl group, a dibenzosilolyl group, a thiadiazolyl group, an imidazopyridinyl group, and an imidazopyrimidinyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, an oxadiazolyl group, a triazinyl group, a dibenzofuranyl group, a dibenzothiophenyl group, a benzocarbazolyl group, a dibenzocarbazolyl group, a dibenzosilolyl group, a thiadiazolyl group, an imidazopyridinyl group, and an imidazopyrimidinyl group, each substituted with at least one selected from a $C_1$-$C_{10}$ alkyl group and a $C_1$-$C_{10}$ alkoxy group.

In some embodiments, in Formulae 1-1 to 1-3 and 2, $Ar_1$ to $Ar_9$ and $Ar_{41}$ to $Ar_{43}$ may be each independently selected from:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from a phenyl group, a biphenyl group, a terphenyl group, a naphthyl group, a pyridinyl group, and a pyrimidinyl group;

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a phenalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a phthalazinyl group, a quinoxalinyl group, a quinazolinyl group, a cinnolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, an imidazopyrimidinyl group, —Si($Q_1$)($Q_2$)($Q_3$), —N($Q_4$)($Q_5$), —B($Q_6$)($Q_7$), and —P(=O)($Q_8$)($Q_9$); and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a phenalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a phthalazinyl group, a quinoxalinyl group, a quinazolinyl group, a cinnolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, and an imidazopyrimidinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a phenalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a phthalazinyl group, a quinoxalinyl group, a quinazolinyl group, a cinnolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, an imidazopyrimidinyl group, and —Si($Q_{41}$)($Q_{42}$)($Q_{43}$), wherein $Q_1$ to $Q_9$ and $Q_{41}$ to $Q_{43}$ are each independently selected from:

a phenyl group, a biphenyl group, a terphenyl group, and a naphthyl group; and a phenyl group, a biphenyl group, a terphenyl group, and a naphthyl group, each substituted with at least one selected from a $C_1$-$C_{10}$ alkyl group and a $C_1$-$C_{10}$ alkoxy group.

According to some embodiments, in Formulae 1-1 to 1-3 and 2, $Ar_1$ to $Ar_9$ and $Ar_{41}$ to $Ar_{43}$ may be each independently selected from:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from a phenyl group, a biphenyl group, a terphenyl group, a naphthyl group, a pyridinyl group, and a pyrimidinyl group;

—Si($Q_1$)($Q_2$)($Q_3$), —N($Q_4$)($Q_5$), —B($Q_6$)($Q_7$), and —P(=O)($Q_8$)($Q_9$), wherein $Q_1$ to $Q_9$ are each independently selected from:

a $C_1$-$C_{10}$ alkyl group and a $C_1$-$C_{10}$ alkoxy group;

a phenyl group, a biphenyl group, a terphenyl group, and a naphthyl group; and a phenyl group, a biphenyl group, a terphenyl group, and a naphthyl group, each substituted with at least one selected from a $C_1$-$C_{10}$ alkyl group and a $C_1$-$C_{10}$ alkoxy group; and groups represented by Formulae 5-1 to 5-58:

5-1

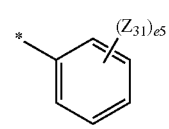

5-2

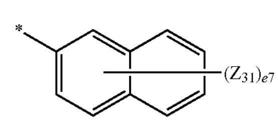

-continued
5-3
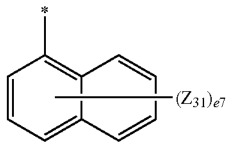
5-4
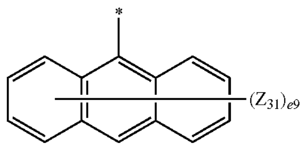
5-5
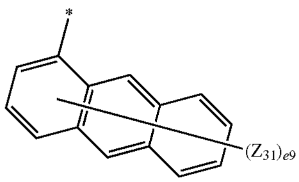
5-6
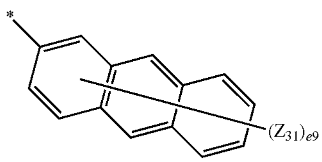
5-7
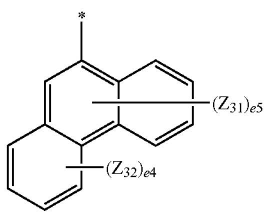
5-8
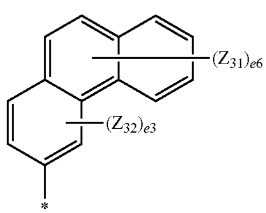
5-9
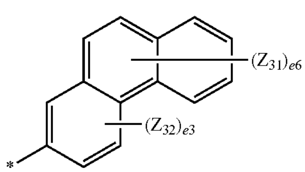
5-10
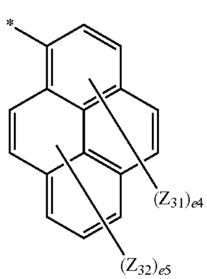
-continued
5-11
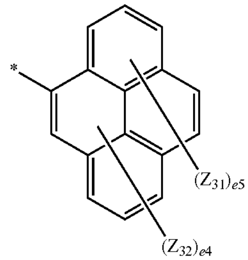
5-12
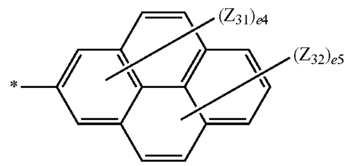
5-13
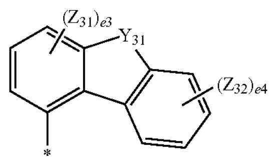
5-14
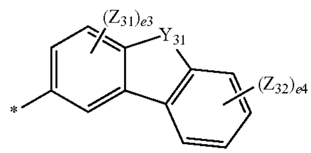
5-15
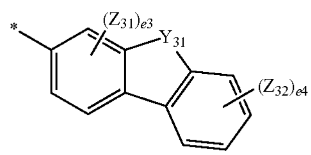
5-16
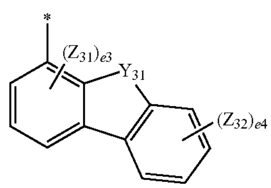
5-17
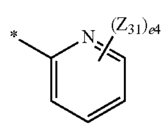
5-18
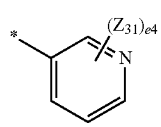
5-19
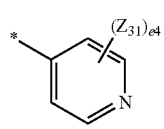
5-20
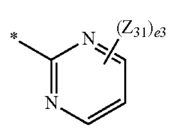

-continued
5-21
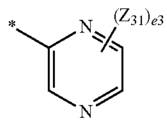
5-22
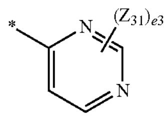
5-23
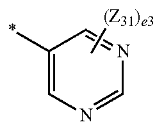
5-24
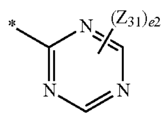
5-25
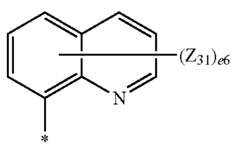
5-26
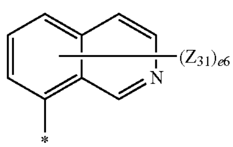
5-27
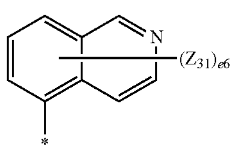
5-28
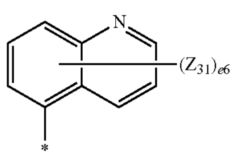
5-29
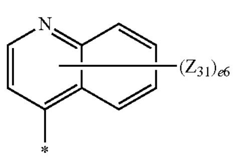
5-30
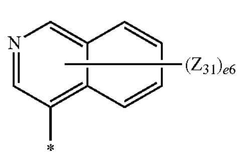
5-31
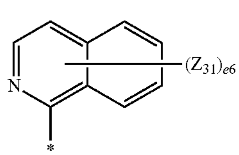
-continued
5-32
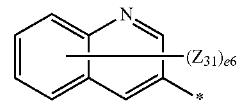
5-33
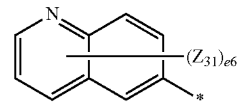
5-34
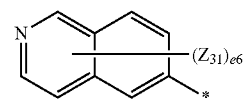
5-35
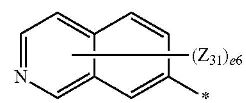
5-36
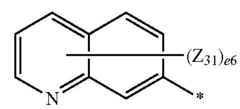
5-37
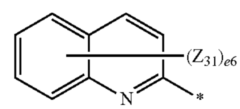
5-38
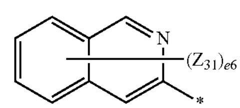
5-39
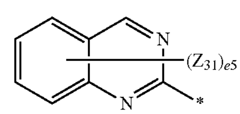
5-40
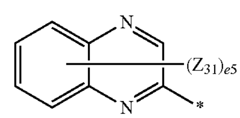
5-41
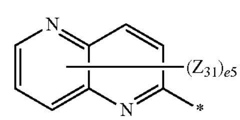
5-42
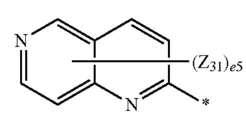
5-43
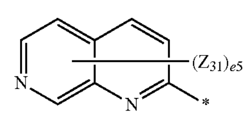
5-44
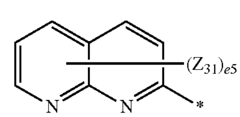
5-45
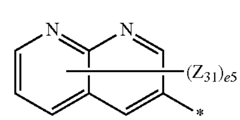

-continued 5-46

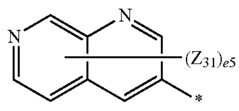

5-47

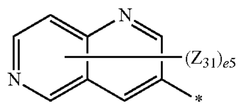

5-48

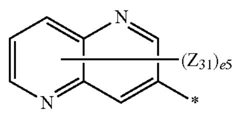

5-49

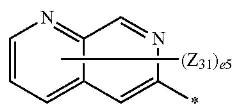

5-50

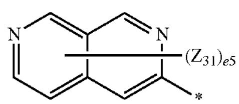

5-51

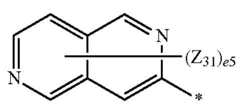

5-52

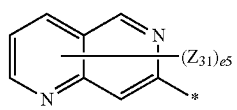

5-53

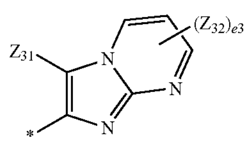

5-54

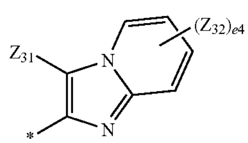

5-55

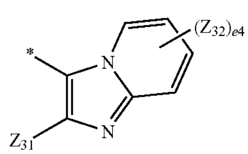

5-56

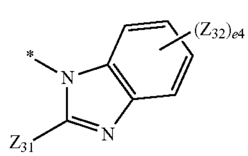

5-57

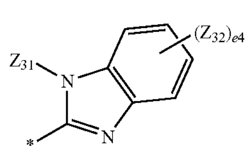

-continued 5-58

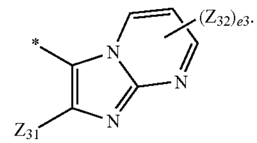

In Formulae 5-1 to 5-58, $Y_{31}$ may be selected from O, S, $C(Z_{33})(Z_{34})$, $N(Z_{35})$, and $Si(Z_{36})(Z_{37})$, $Z_{31}$ to $Z_{37}$ may be each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, and a dibenzothiophenyl group;

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, and a dibenzothiophenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, and a dibenzothiophenyl group; and —Si($Q_{41}$)($Q_{42}$)($Q_{43}$), wherein $Q_{41}$ to $Q_{43}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, and a carbazolyl group, e2 may be an integer of 1 or 2, e3 may be an integer selected from 1 to 3, e4 may be an integer selected from 1 to 4, e5 may be an integer selected from 1 to 5, e6 may be an integer selected from 1 to 6, e7 may be an integer selected from 1 to 7, and e9 may be an integer selected from 1 to 9, and

* is a binding site to a neighboring atom.

According to some embodiments, in Formulae 1-1 to 1-3 and 2, $Ar_1$ to $Ar_9$ and $Ar_{41}$ to $Ar_{43}$ may be each independently selected from:

a $C_1$-$C_{20}$ alkyl group and a $C_1$-$C_{20}$ alkoxy group; and groups represented by Formulae 6-1 to 6-178:

6-1

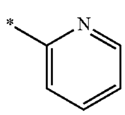

6-2

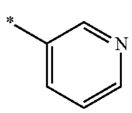

6-3

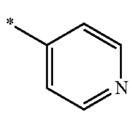

6-4

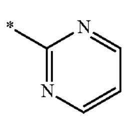

6-5

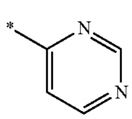

6-6

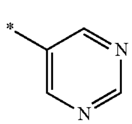

-continued 6-7

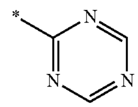

6-8

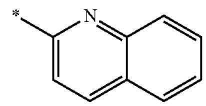

6-9

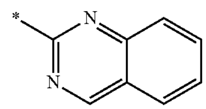

6-10

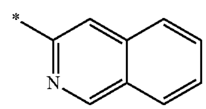

6-11

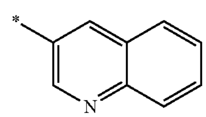

6-12

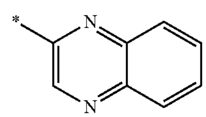

6-13

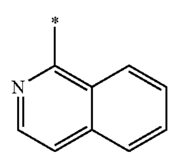

6-14

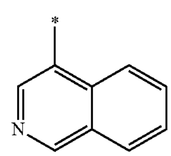

6-15

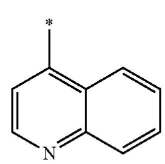

6-16

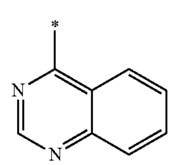

6-17

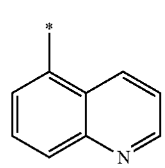

6-18
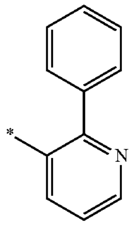
6-19
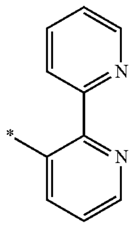
6-20
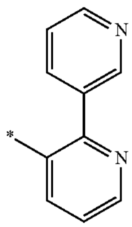
6-21
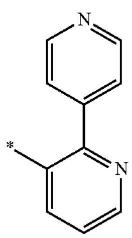
6-22
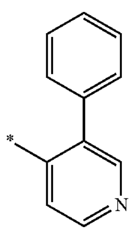
6-23
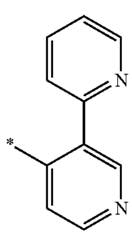
6-24
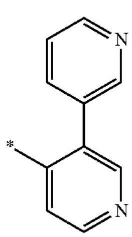
6-25
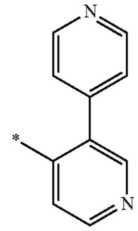
6-26
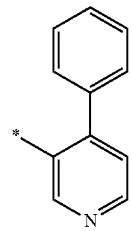
6-27
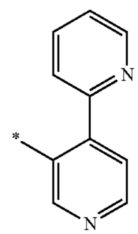
6-28
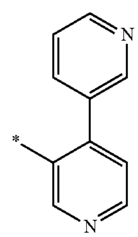
6-29
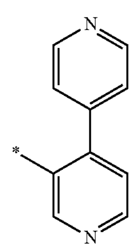
6-30
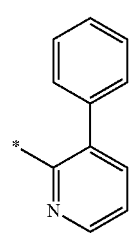

-continued
6-31
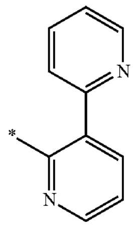
6-32
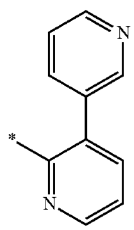
6-33
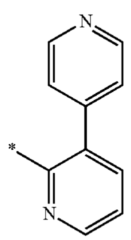
6-34
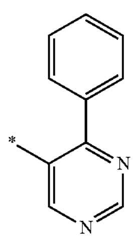
6-35
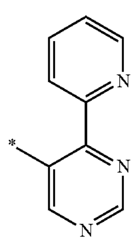
6-36
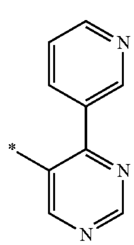
-continued
6-37
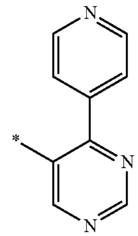
6-38
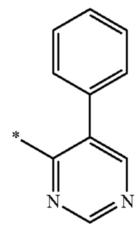
6-39
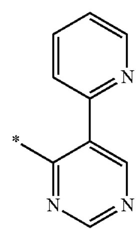
6-40
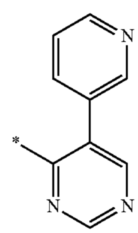
6-41
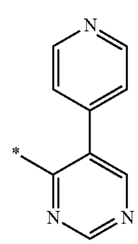
6-42
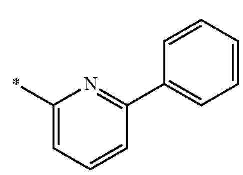
6-43
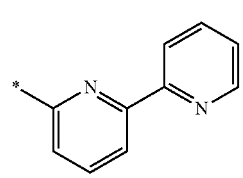

-continued
6-44
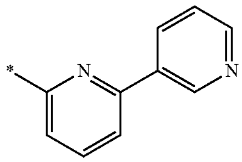
6-45
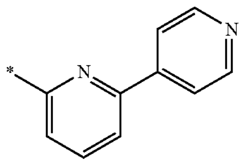
6-46
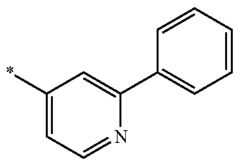
6-47
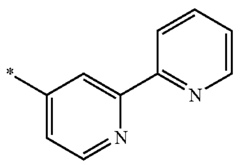
6-48
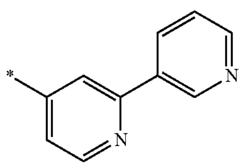
6-49
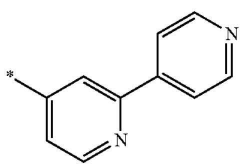
6-50
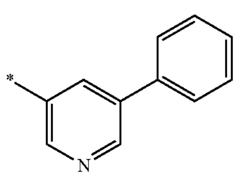
6-51
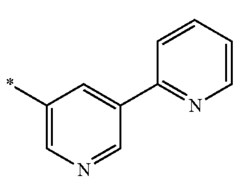
6-52
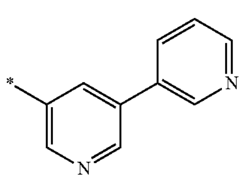
-continued
6-53
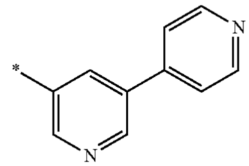
6-54
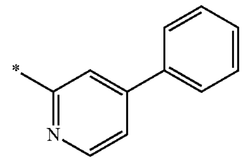
6-55
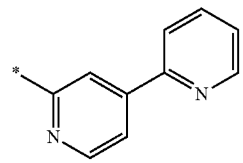
6-56
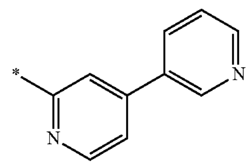
6-57
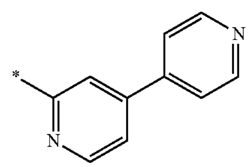
6-58
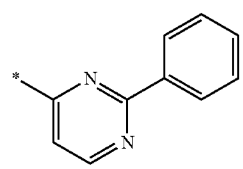
6-59
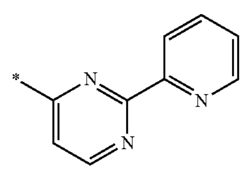
6-60
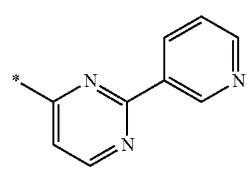
6-61
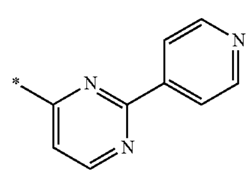

-continued
6-62
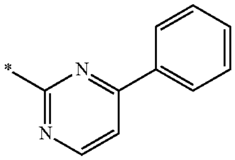
6-63
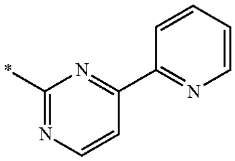
6-64
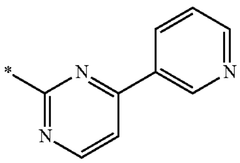
6-65
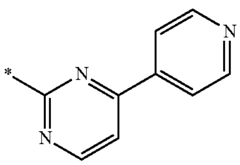
6-66
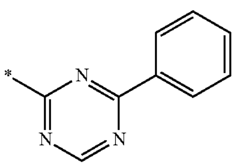
6-67
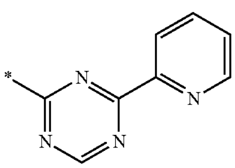
6-68
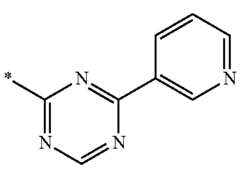
6-69
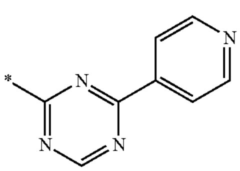
6-70
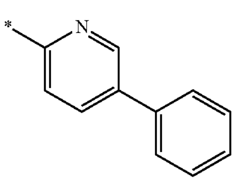
-continued
6-71
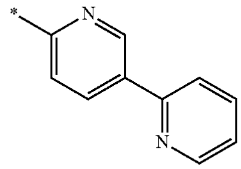
6-72
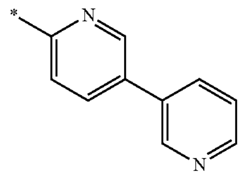
6-73
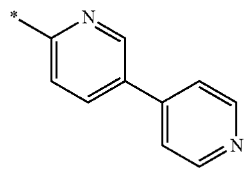
6-74
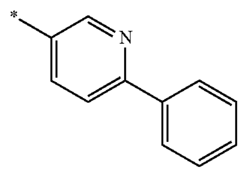
6-75
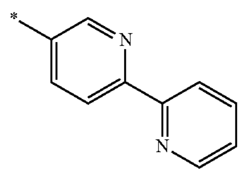
6-76
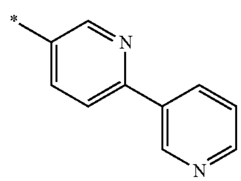
6-77
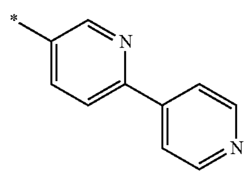
6-78
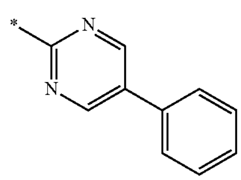
6-79
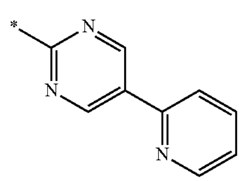

6-80
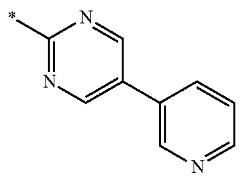
6-81
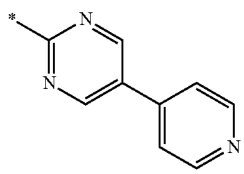
6-82
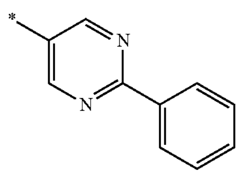
6-83
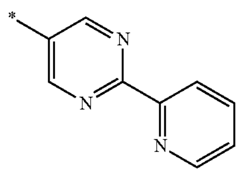
6-84
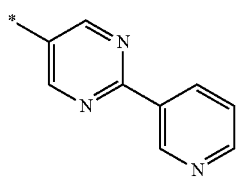
6-85
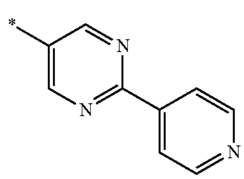
6-86
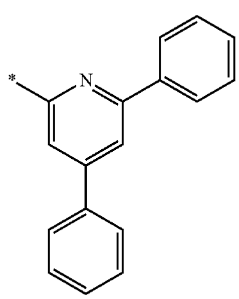
6-87
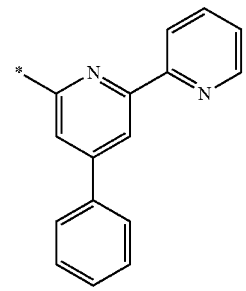
6-88
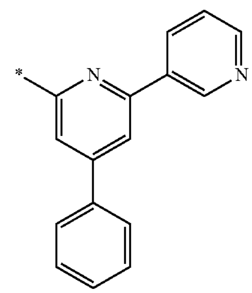
6-89
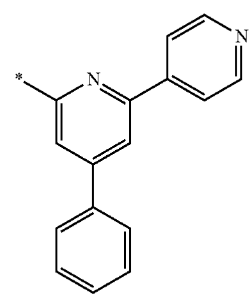
6-90
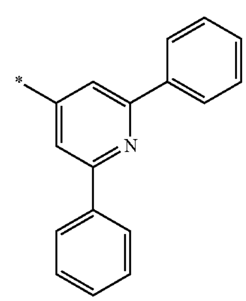
6-91
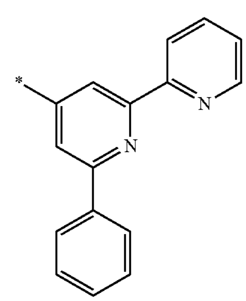

-continued
6-92
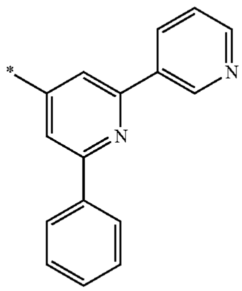
6-93
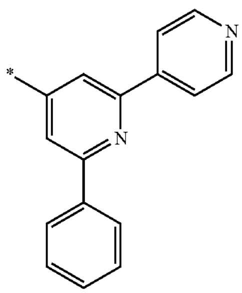
6-94
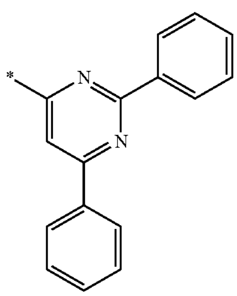
6-95
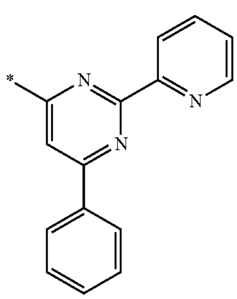
6-96
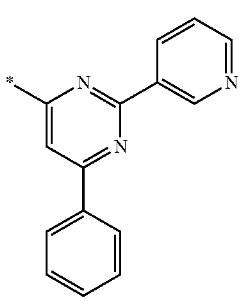
-continued
6-97
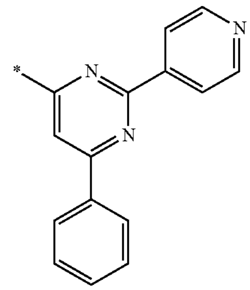
6-98
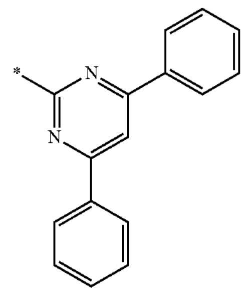
6-99
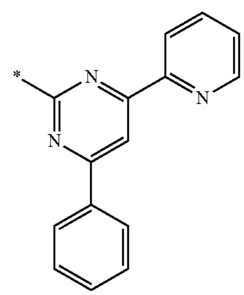
6-100
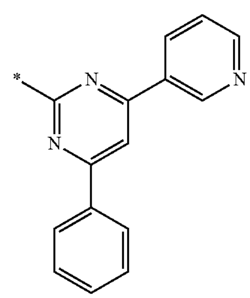
6-101
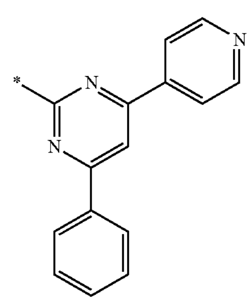

-continued
6-102
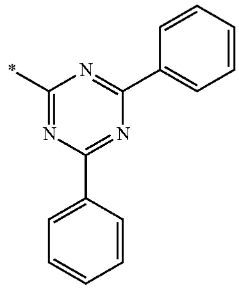
6-103
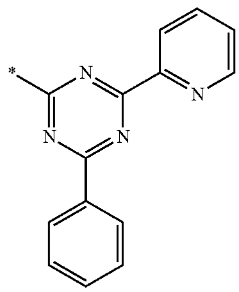
6-104
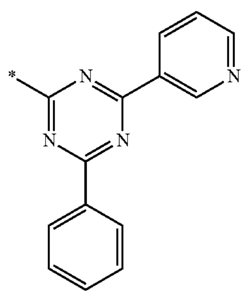
6-105
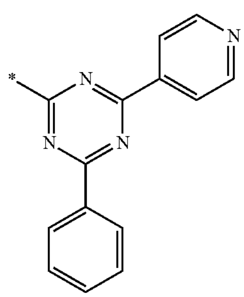
6-106
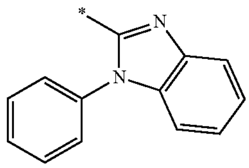
6-107
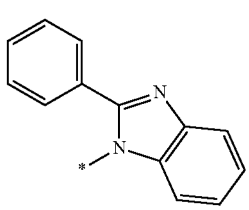
-continued
6-108
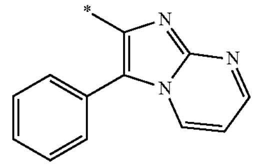
6-109
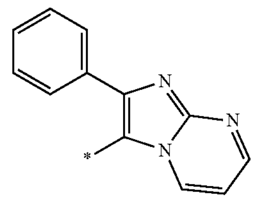
6-110
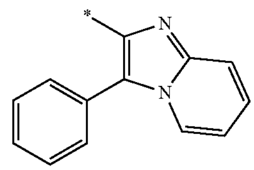
6-111
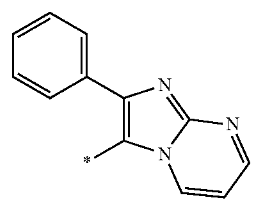
6-112
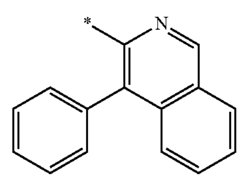
6-113
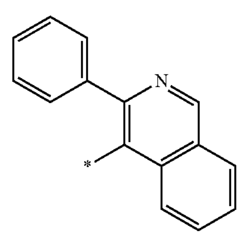
6-114
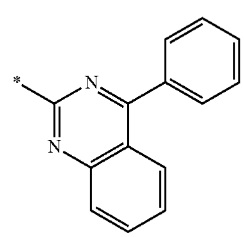
6-115
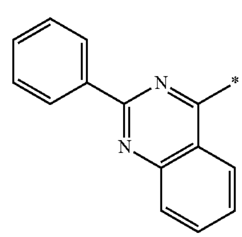

-continued
6-116
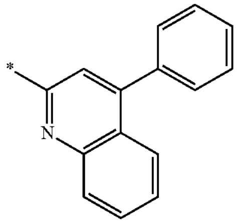
6-117
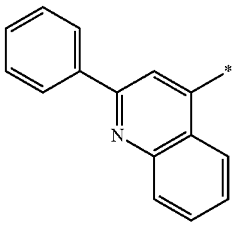
6-118
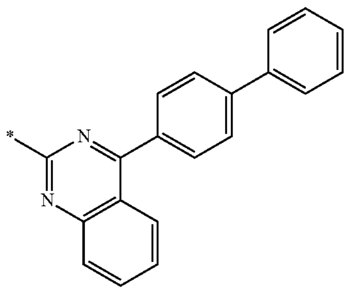
6-119
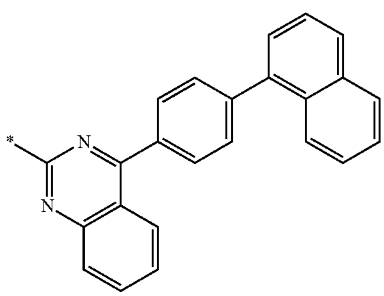
6-120
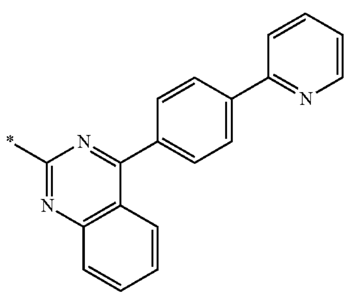
6-121
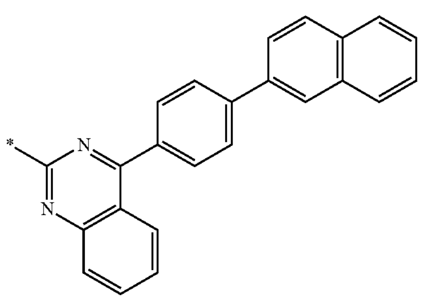
-continued
6-122
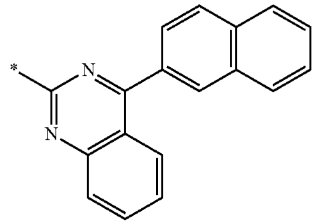
6-123
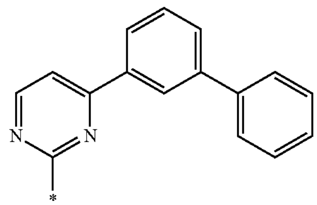
6-124
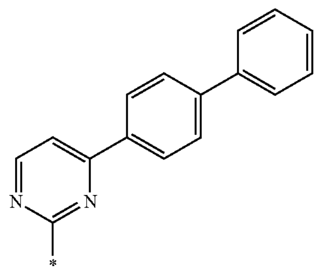
6-125
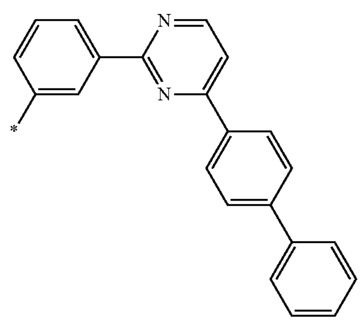
6-126
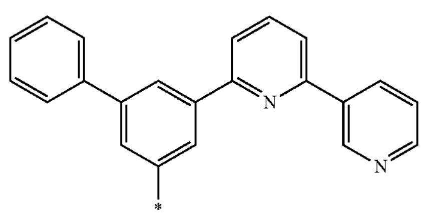
6-127
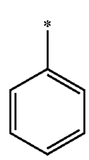
6-128
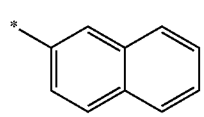

-continued
6-129
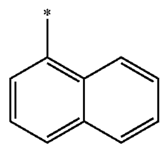
6-130
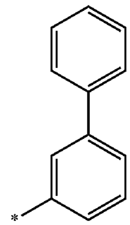
6-131
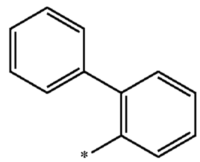
6-132
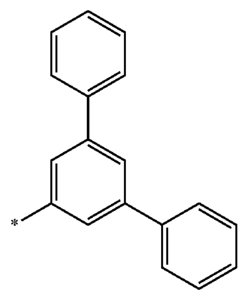
6-133
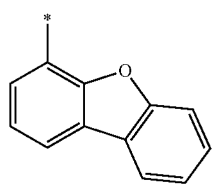
6-134
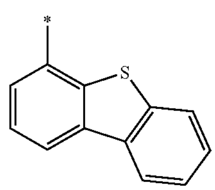
6-135
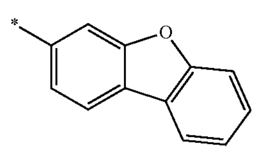
6-136
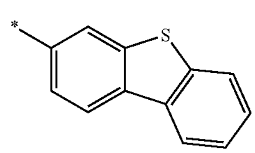
-continued
6-137
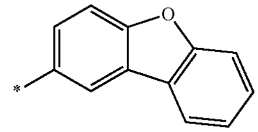
6-138
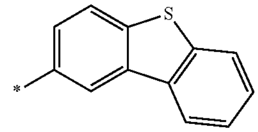
6-139
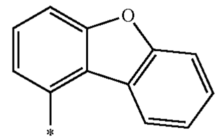
6-140
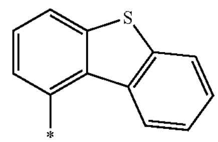
6-141
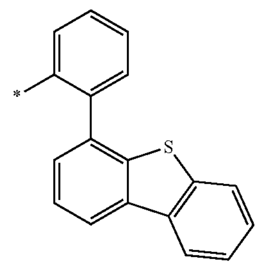
6-142
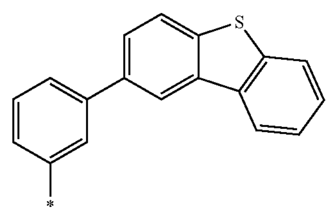
6-143
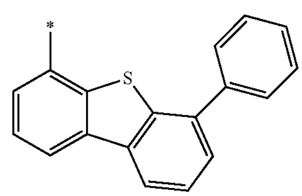
6-144
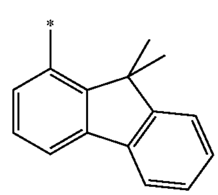

-continued
6-145
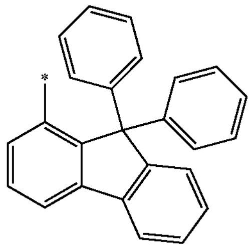
6-146
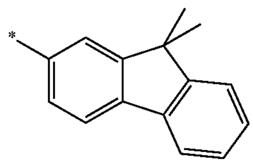
6-147
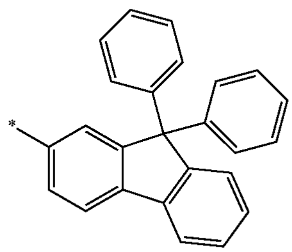
6-148
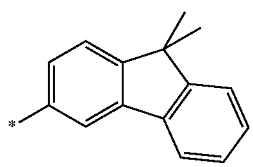
6-149
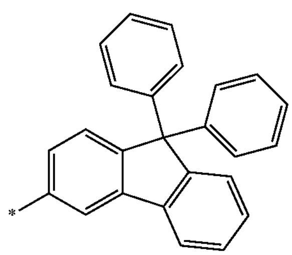
6-150
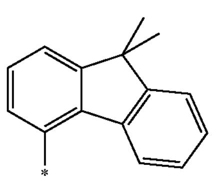
6-151
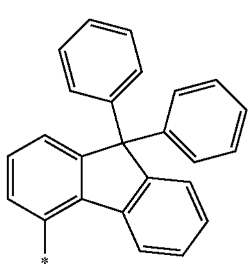
-continued
6-152
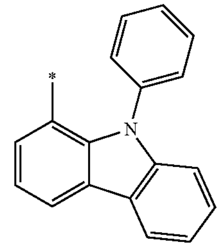
6-153
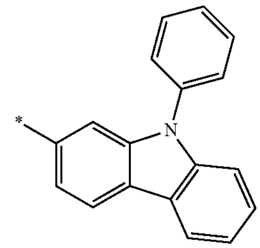
6-154
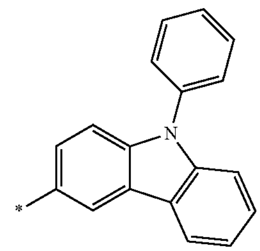
6-155
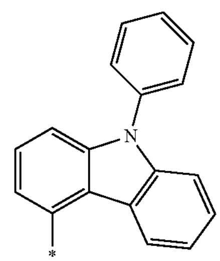
6-156
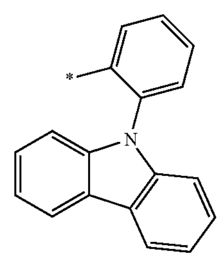
6-157
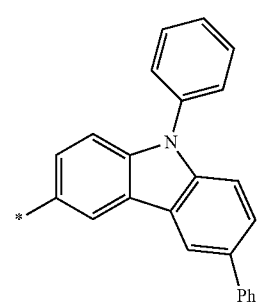

-continued
6-158
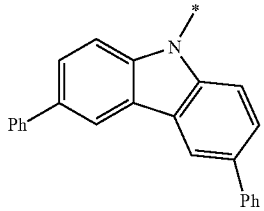
6-159
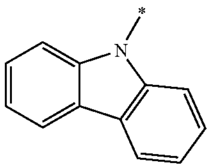
6-160
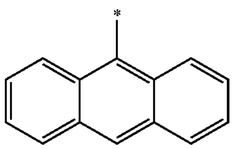
6-161
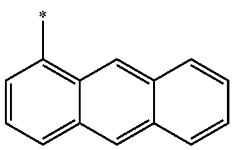
6-162
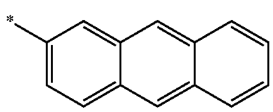
6-163
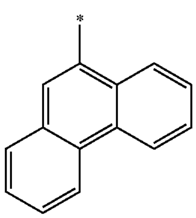
6-164
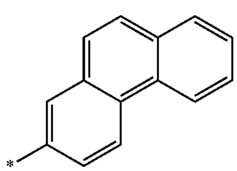
6-165
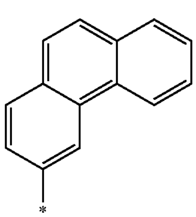
-continued
6-166
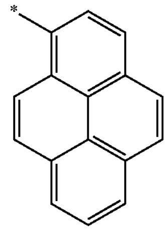
6-167
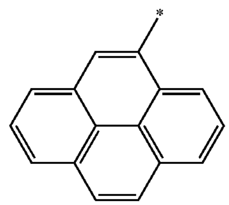
6-168
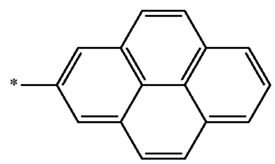
6-169
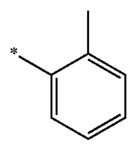
6-170
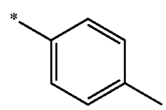
6-171
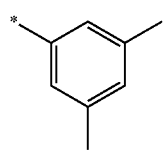
6-172
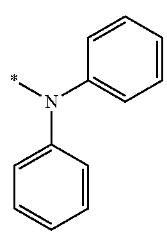
6-173
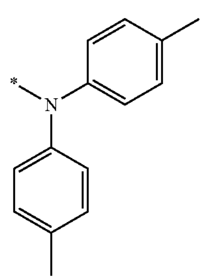

-continued 6-174

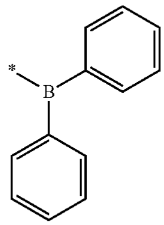

6-175

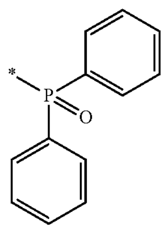

6-176

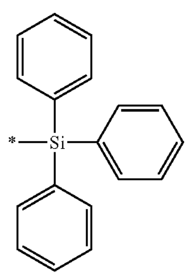

6-177

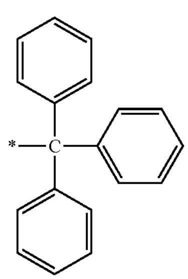

6-178

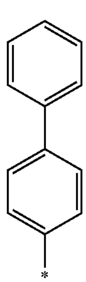

In Formulae 6-1 to 6-178, * is a binding site to a neighboring atom, and Ph is a phenyl group.

In Formulae 1-1 to 1-3 and 2, b1 to b9 and b41 to b43 may be each independently an integer selected from 1 to 3. In Formulae 1-1 to 1-3, b1 denotes the number of $Ar_1$s, and when b1 is 2 or greater, two or more $Ar_1$s may be identical to or different from each other. Descriptions of b2 to b8 and b41 to b43 may be each independently understood by referring to the description of b1 and corresponding formulae.

For example, b1 to b9 and b41 to b43 may be each independently 1 or 2.

In Formula 1-1 to 1-3, c1 to c3 may be each independently an integer selected from 0 to 4, and the sum of c1 to c3 may be 1 or greater. In Formula 1-1, c1 denotes the number of -[$(L_1)_{a1}$-$(Ar_1)_{b1}$]s, and when c1 is 2 or greater, two or more -[$(L_1)_{a1}$-$(Ar_1)_{b1}$]s may be identical to or different from each other. c2 and c3 may be each independently understood by referring to the description of c1 and corresponding formulae.

For example, in Formulae 1-1 to 1-3, c1 may be 1, and c2 and c3 may each be 0.

In Formulae 1-1 to 1-3 and 2, $R_1$ to $R_6$, $R_{11}$ to $R_{18}$, $R_{21}$ to $R_{28}$, $R_{31}$ to $R_{38}$, $R_{41}$ to $R_{48}$, $R_{51}$ to $R_{58}$, and $R_{61}$ and $R_{62}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, and —Si($Q_{11}$)($Q_{12}$)($Q_{13}$). Here, $Q_{11}$ to $Q_{13}$ may be the same as described in the present specification.

For example, in Formulae 1-1 to 1-3 and 2, $R_1$ to $R_6$, $R_{11}$ to $R_{18}$, $R_{21}$ to $R_{28}$, $R_{31}$ to $R_{38}$, $R_{41}$ to $R_{48}$, $R_{51}$ to $R_{58}$, and $R_{61}$ and $R_{62}$ may be each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a biphenyl group, a terphenyl group, a naphthyl group, a pyridinyl group, and a pyrimidinyl group;

a phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, and —$Si(Q_{41})(Q_{42})(Q_{43})$; and —$Si(Q_{11})(Q_{12})(Q_{13})$, wherein $Q_{11}$ to $Q_{13}$, and $Q_{41}$ to $Q_{43}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, and a carbazolyl group.

In some embodiments, in Formulae 1-1 to 1-3 and 2, $R_1$ to $R_6$, $R_{11}$ to $R_{18}$, $R_{21}$ to $R_{28}$, $R_{31}$ to $R_{38}$, $R_{41}$ to $R_{48}$, $R_{51}$ to $R_{58}$, and $R_{61}$ and $R_{62}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group.

According to some embodiments, in Formulae 1-1 to 1-3 and 2, $R_1$ to $R_6$, $R_{41}$ to $R_{48}$, $R_{51}$ to $R_{58}$, and $R_{61}$ and $R_{62}$ may be each independently selected from hydrogen, deuterium, —F, —Cl, —Br, —I, a methyl group, an ethyl group, a propyl group, an iso-propyl group, a butyl group, iso-a butyl group, a sec-butyl group, and a tert-butyl group, and $R_{11}$ to $R_{18}$, $R_{21}$ to $R_{28}$, and $R_{31}$ to $R_{38}$ may be each independently selected from a methyl group, an ethyl group, a propyl group, an iso-propyl group, a butyl group, iso-a butyl group, a sec-butyl group, and a tert-butyl group.

According to some embodiments, in Formulae 1-1 to 1-3 and 2, $R_1$ to $R_6$, $R_{41}$ to $R_{48}$, $R_{51}$ to $R_{58}$, and $R_{61}$ and $R_{62}$ may each be hydrogen, and $R_{11}$ to $R_{18}$, $R_{21}$ to $R_{28}$, and $R_{31}$ to $R_{38}$ may be each independently selected from a methyl group, an ethyl group, a propyl group, an iso-propyl group, a butyl group, iso-a butyl group, a sec-butyl group, and a tert-butyl group.

In Formula 2, h1 and h2 may be each independently an integer selected from 0 to 3. In Formula 2, h1 denotes the number of $R_{61}$s, and when h1 is 2 or greater, two or more $R_{61}$s are identical to or different from each other. Description of h2 may be understood by referring to the description of h1.

According to an embodiment, the first compound may be represented by one of Formulae 1A to 1F, and the second compound may be represented by one of Formulae 2A to 2J:

Formula 1A

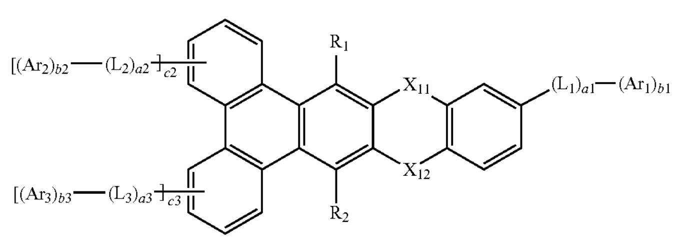

Formula 1B

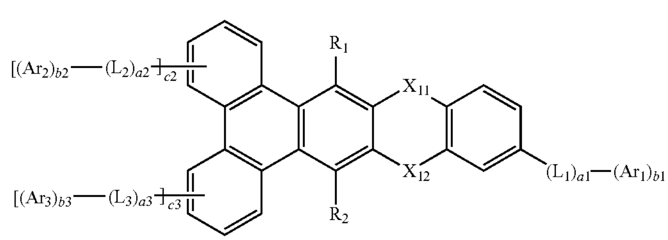

-continued
Formula 1C
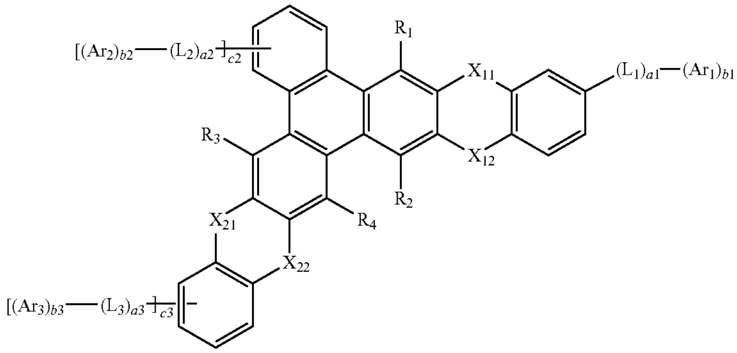
Formula 1D
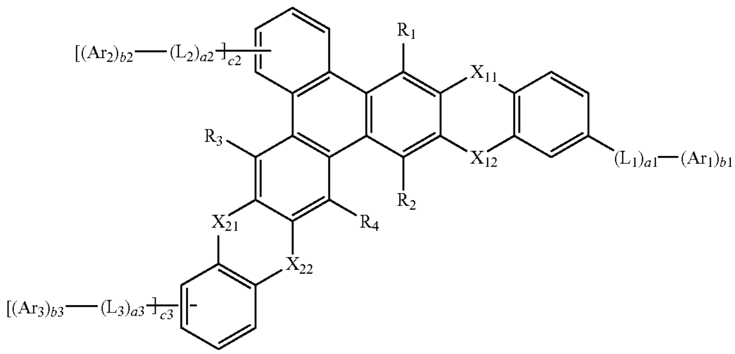
Formula 1E
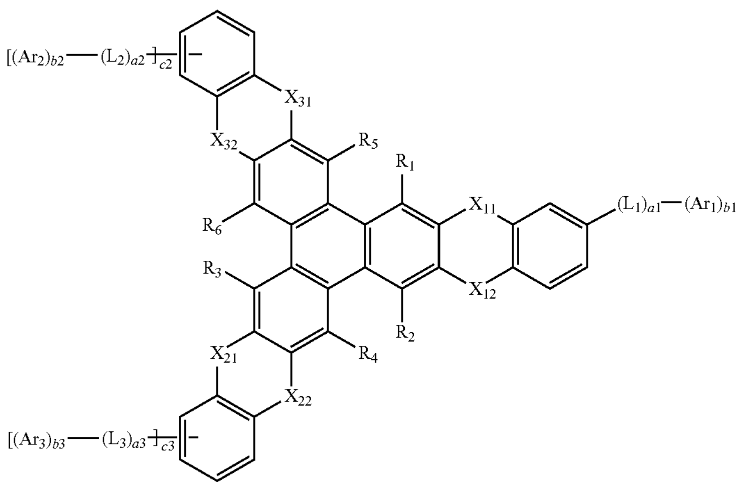
Formula 1F
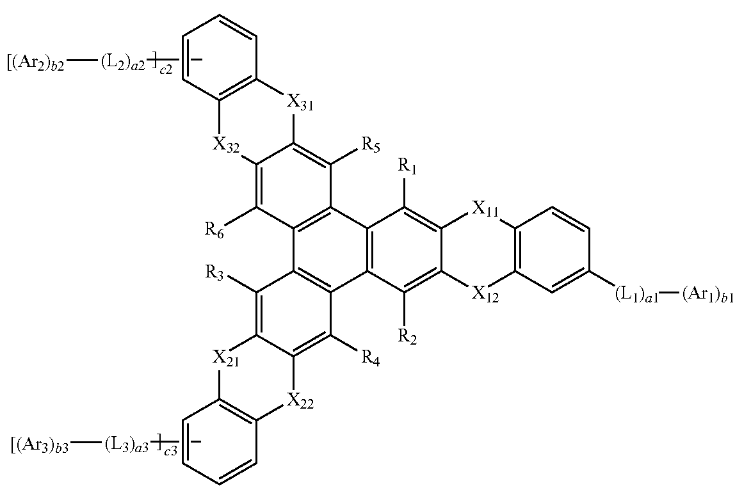

-continued
Formula 2A
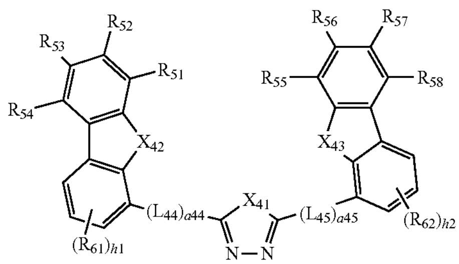
Formula 2B
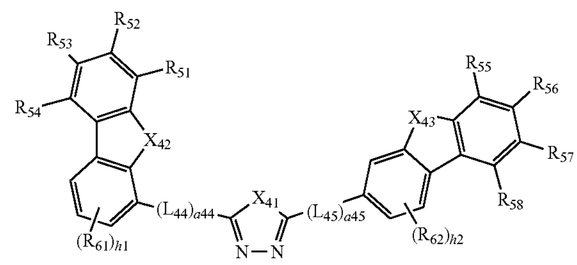
Formula 2C
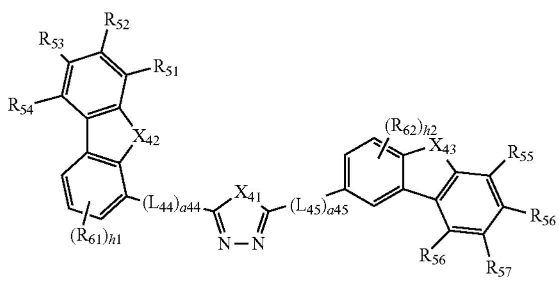
Formula 2D
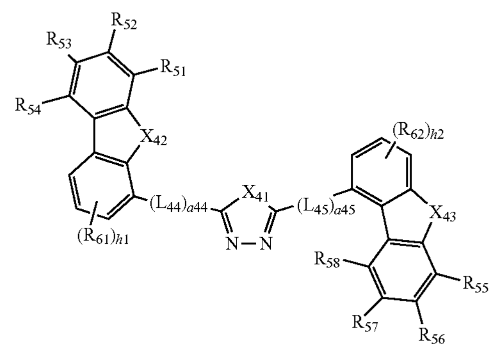
Formula 2E
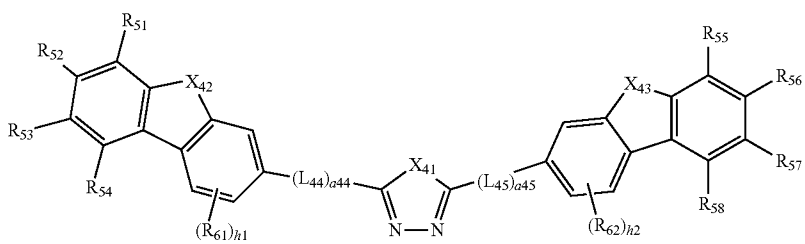
Formula 2F
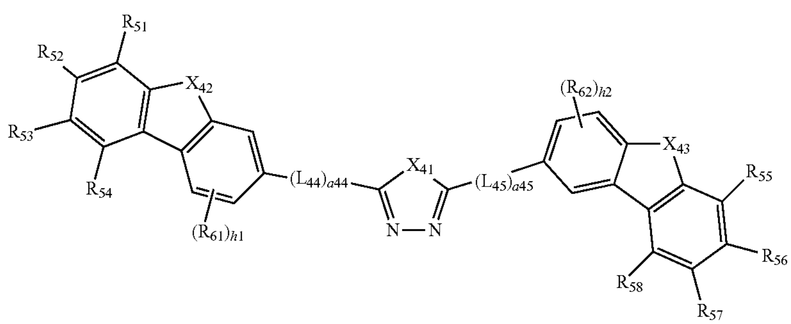
Formula 2G
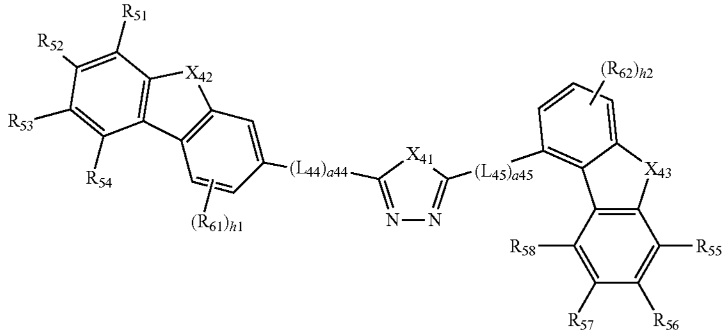

-continued

Formula 2H

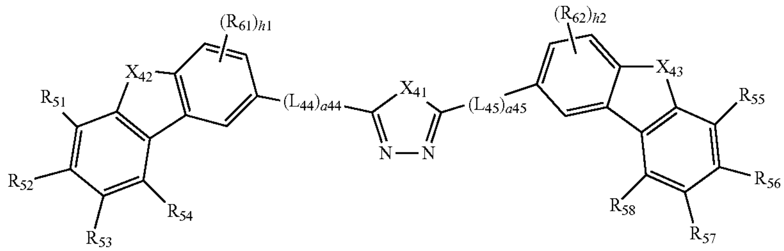

Formula 2I

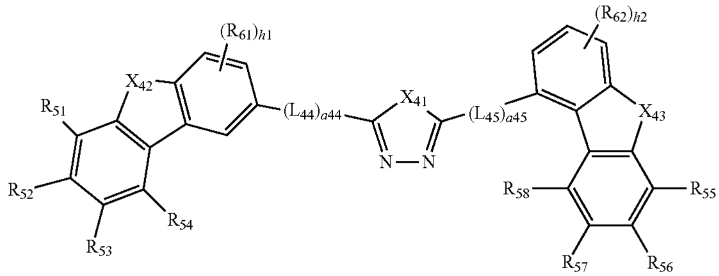

Formula 2J

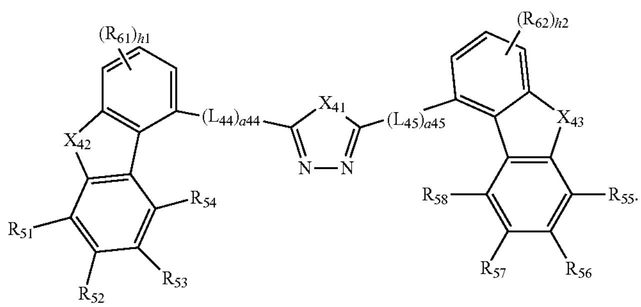

In Formulae 1A to 1F and 2A to 2J,

Descriptions of $X_{11}$, $X_{12}$, $X_{21}$, $X_{22}$, $X_{31}$, $X_{32}$, $X_{41}$ to $X_{43}$, Li to $L_3$, $L_{44}$, $L_{45}$, a1 to a3, a44, a45, $Ar_1$ to $Ar_3$, b1 to b3, c2, c3, $R_1$ to $R_6$, $R_{51}$ to $R_{58}$, $R_{61}$, $R_{62}$, h1, and h2 may be the same as provided in the present specification.

For example, in Formulae 1A to 1F and 2A to 2J, $X_{11}$ may be $C(R_{11})(R_{12})$ or $N[(L_4)_{a4}\text{-}(Ar_4)_{b4}]$, $X_{12}$ may be $C(R_{15})(R_{16})$, $X_{21}$ may be $C(R_{21})(R_{22})$, $X_{22}$ may be $C(R_{25})(R_{26})$, $X_{31}$ may be $C(R_{31})(R_{32})$, $X_{32}$ may be $C(R_{35})(R_{36})$, $X_{41}$ may be selected from $N[(L_{41})_{a41}\text{-}(Ar_{41})_{b41}]$, O, and S, $X_{42}$ may be $N[(L_{42})_{a42}\text{-}(Ar_{42})_{b42}]$, and $X_{43}$ may be $N[(L_{43})_{a43}\text{-}(Ar_{43})_{b43}]$, In some embodiments, in Formulae 1A to 1F and 2A to 2J, $L_1$ to $L_4$ and $L_{41}$ to $L_{45}$ may be each independently selected from groups represented by Formulae 4-1 to 4-45, and $Ar_1$ to $Ar_4$ and $Ar_{41}$ to $Ar_{43}$ may be each independently selected from:

a $C_1$-$C_{20}$ alkyl group and a $C_1$-$C_{20}$ alkoxy group; and groups represented by Formulae 6-1 to 6-178, but embodiments of the present disclosure are not limited thereto.

In some embodiments, the first compound may be represented by one of Formulae 1A(1), 1A(2), 1B(1), 1C(1), 1C(2), 1D(1), 1D(2), 1E(1), 1E(2), 1F(1) and 1F(2), and the second compound may be represented by one of Formulae 2A(1) to 2J(1), but embodiments are not limited thereto:

Formula 1A(1)

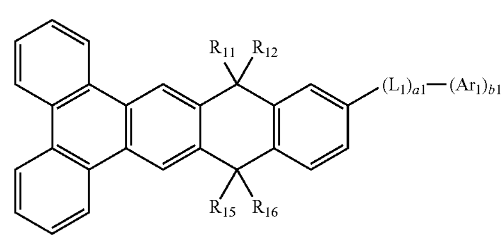

Formula 1A(2)

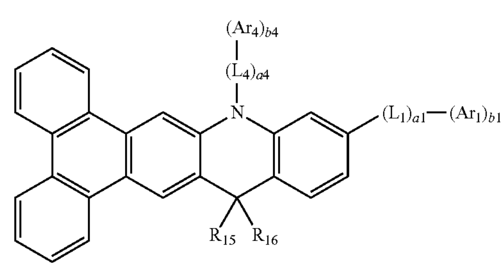

-continued
Formula 1B(1)
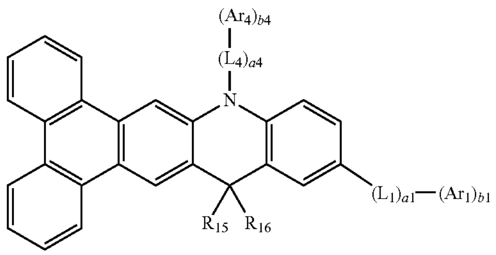
Formula 1C(1)
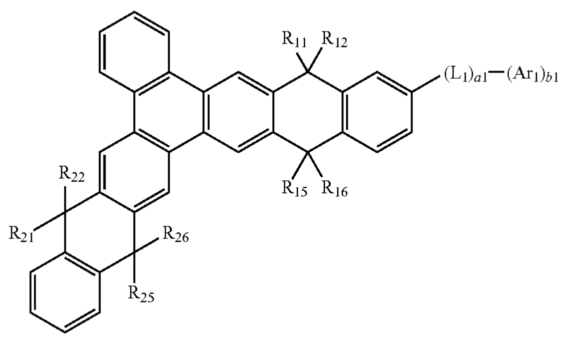
Formula 1C(2)
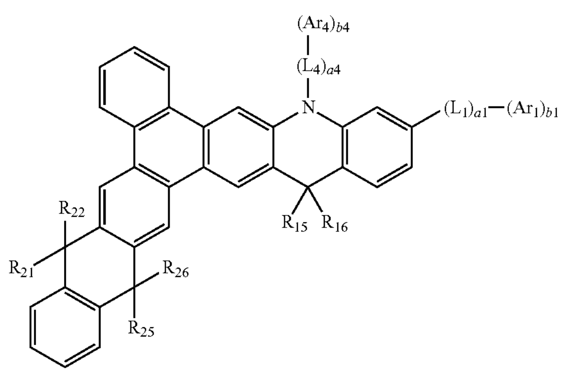
Formula 1D(1)
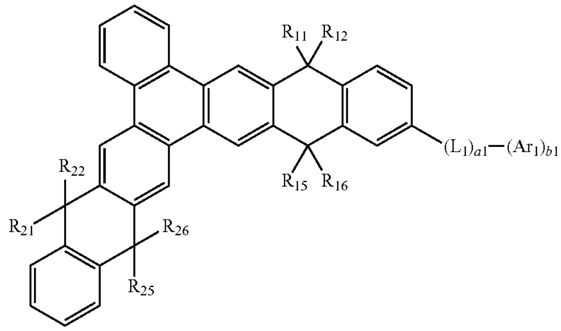
-continued
Formula 1D(2)
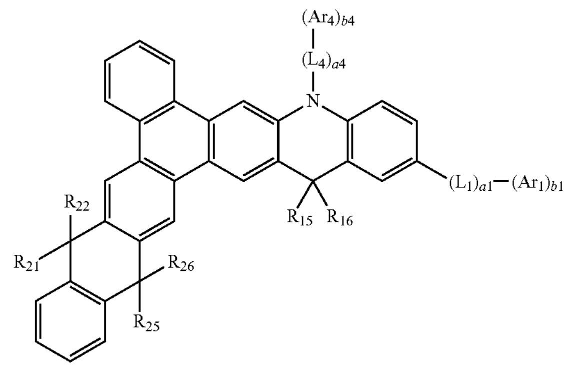
Formula 1E(1)
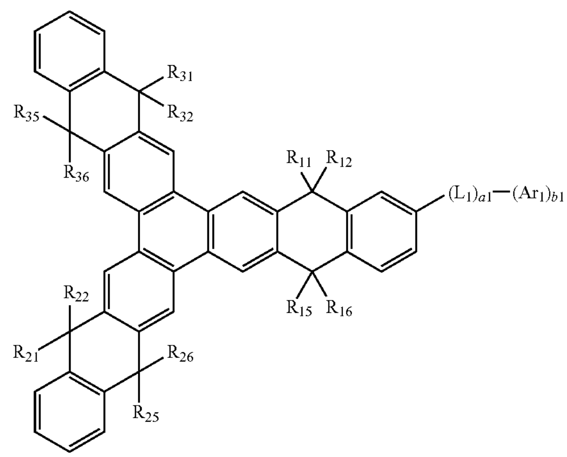
Formula 1E(2)
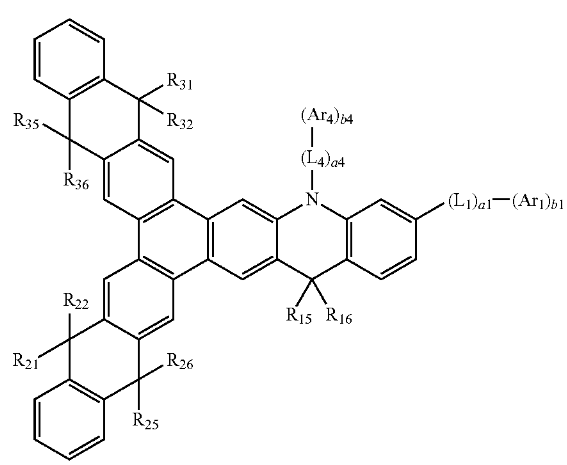

-continued
Formula 1F(1)
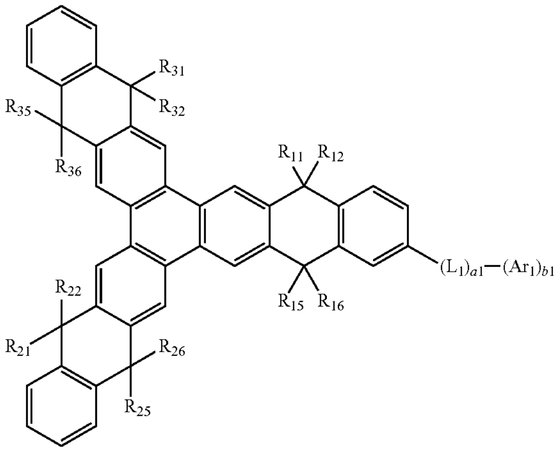
Formula 1F(2)
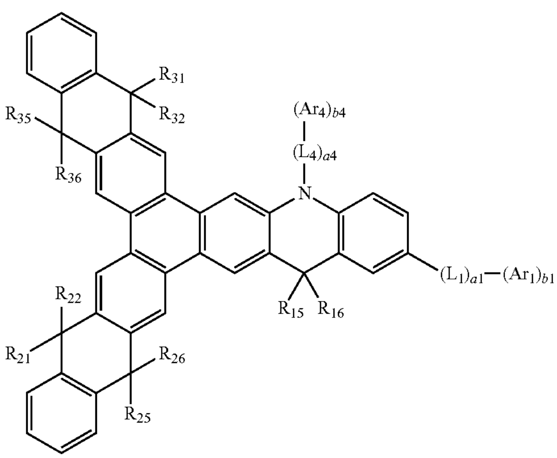
Formula 2A(1)
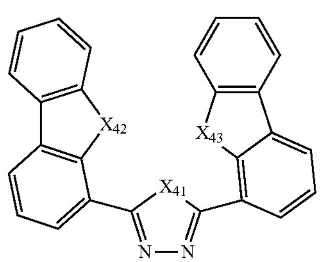
Formula 2B(1)
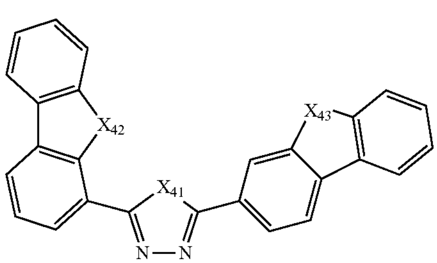
-continued
Formula 2C(1)
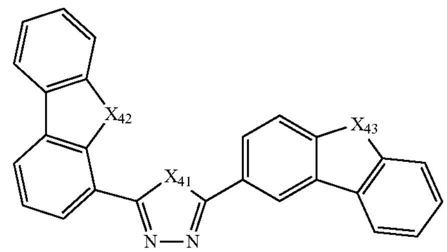
Formula 2D(1)
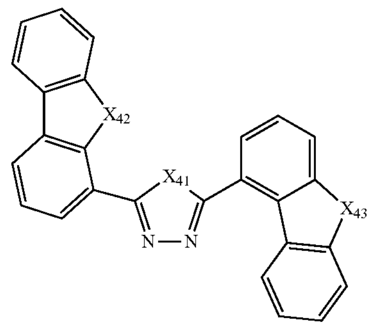
Formula 2E(1)
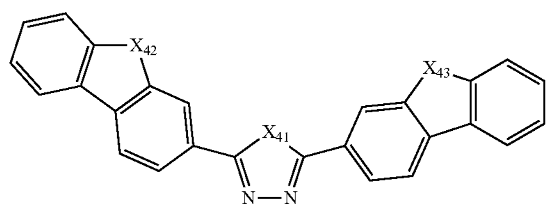
Formula 2F(1)
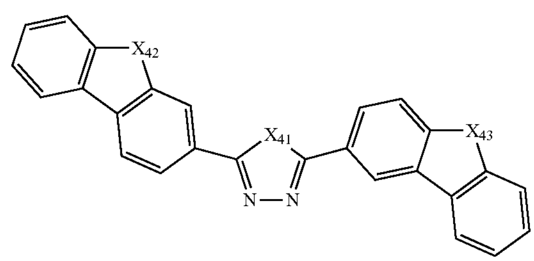
Formula 2G(1)
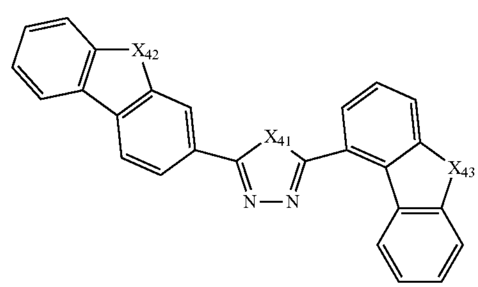
Formula 2H(1)
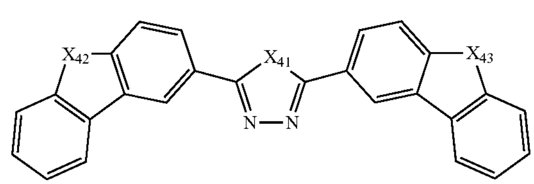

-continued

Formula 2I(1)

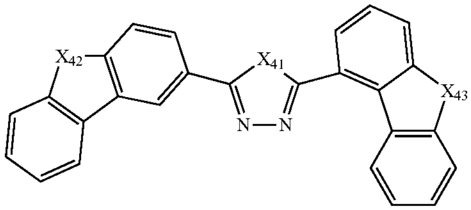

Formula 2J(1)

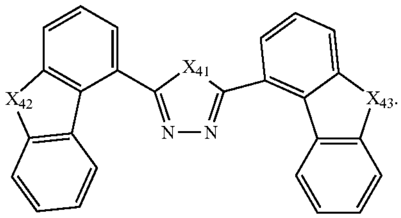

In Formulae 1A(1), 1A(2), 1B(1), 1C(1), 1C(2), 1D(1), 1D(2), 1E(1), 1E(2), 1F(1), 1F(2), and 2A(1) to 2J(1), descriptions of $X_{41}$ to $X_{43}$, $L_1$, $L_4$, a1, a4, $Ar_1$, $Ar_4$, b1, b4, $R_{11}$, $R_{12}$, $R_{15}$, $R_{16}$, $R_{21}$, $R_{22}$, $R_{25}$, $R_{26}$, $R_{31}$, $R_{32}$, and $R_{35}$ and $R_{36}$ may be the same as provided in the present specification.

In Formulae 1A(1), 1A(2), 1B(1), 1C(1), 1C(2), 1D(1), 1D(2), 1E(1), 1E(2), 1F(1), 1F(2), and 2A(1) to 2J(1), $X_{42}$ may be $N[(L_{42})_{a42}\text{-}(Ar_{42})_{b42}]$, and $X_{43}$ may be $N[(L_{43})_{a43}\text{-}(Ar_{43})_{b43}]$.

According to an embodiment, the first compound may be one of Compounds In-A-1 to In-A-16, In-B-1 to In-B-18, and In-C-1 to In-C-14, and the second compound may be one of Compounds C1 to C389:

In-A-1

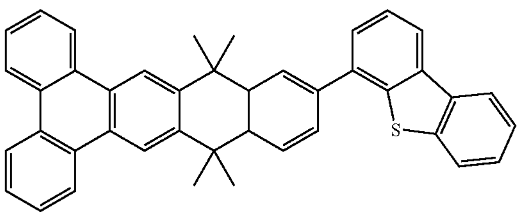

In-A-2

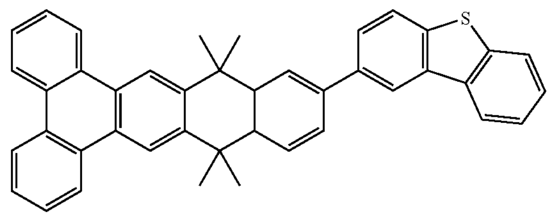

In-A-3

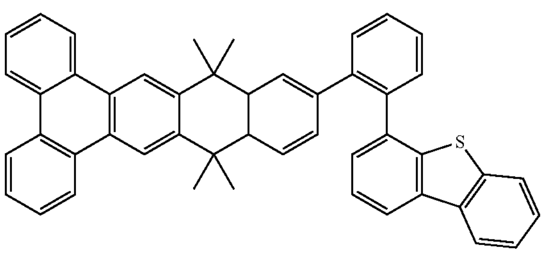

In-A-4

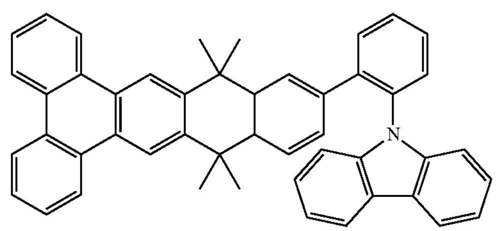

In-A-5

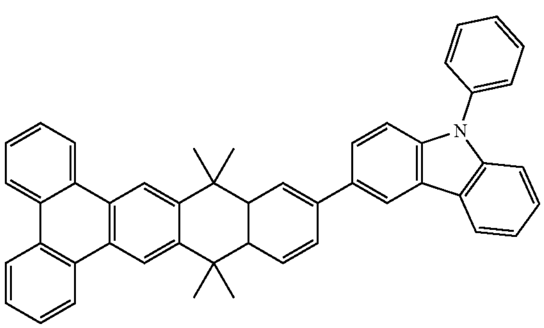

In-A-6

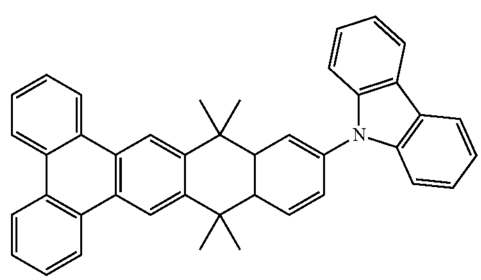

-continued
In-A-7
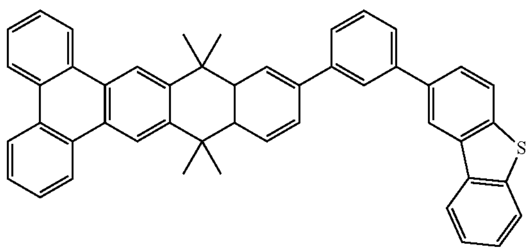
In-A-8
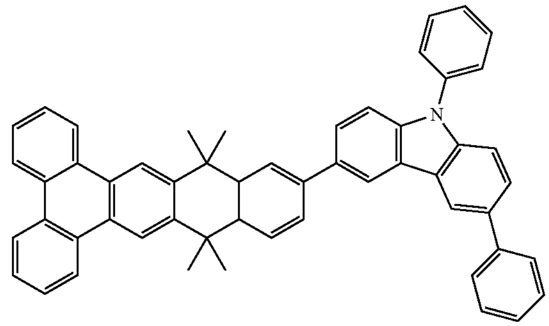
In-A-9
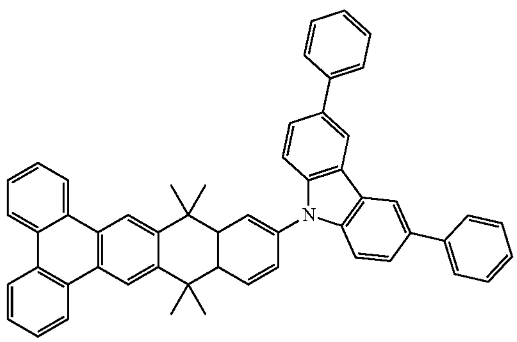
In-A-10
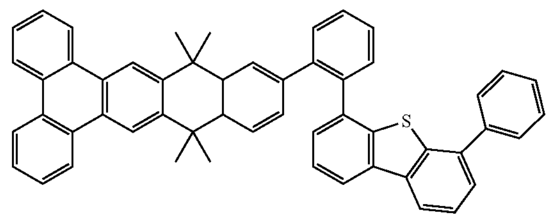
In-A-11
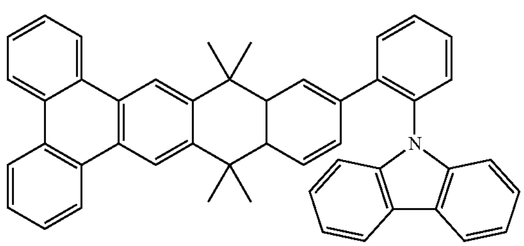
In-A-12
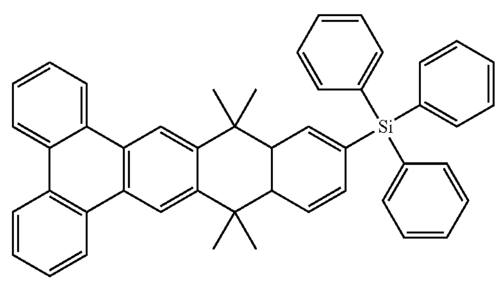
In-A-13
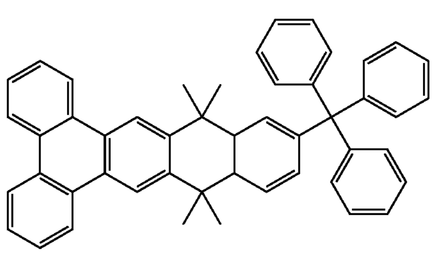
In-A-14
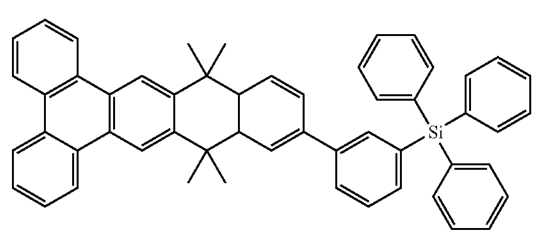
In-A-15
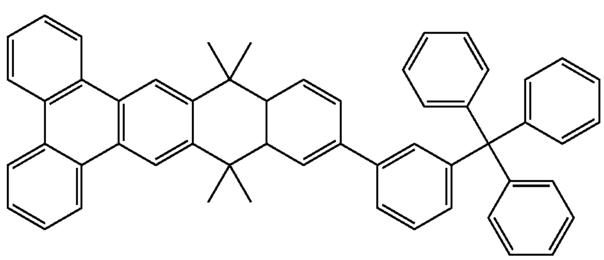

-continued
In-A-16
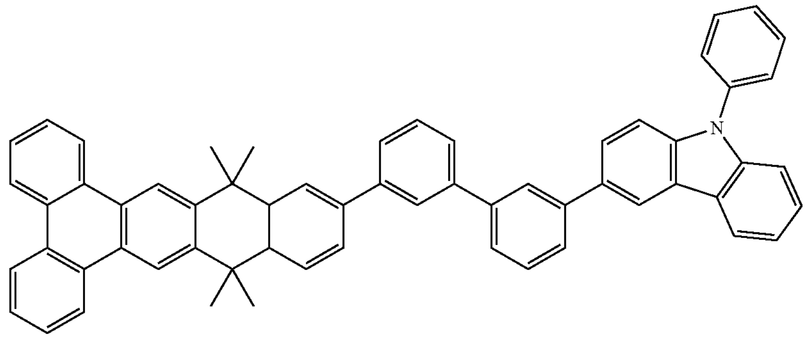
In-B-1
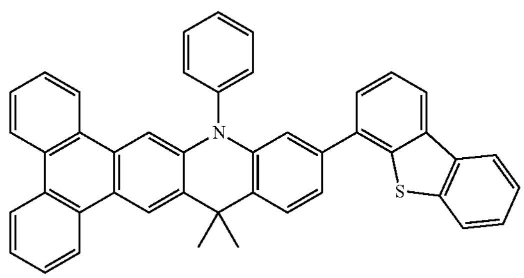
In-B-2
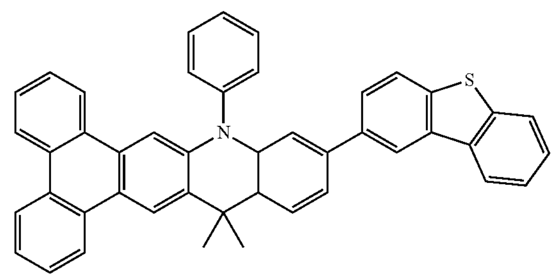
In-B-3
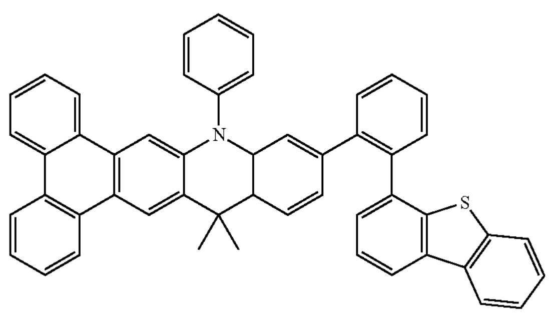
In-B-4
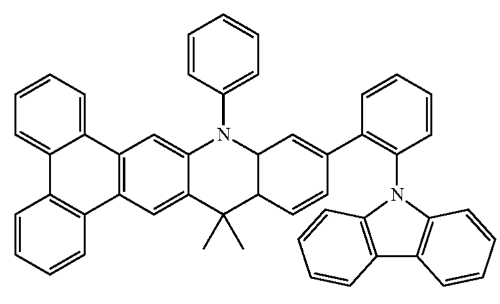
In-B-5
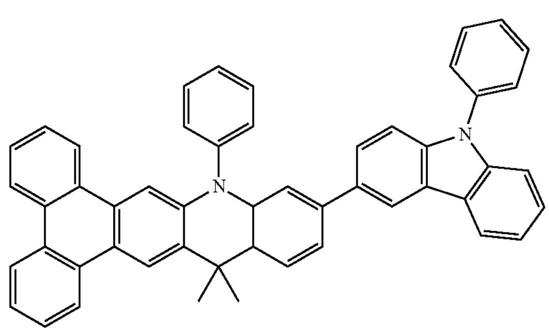
In-B-6
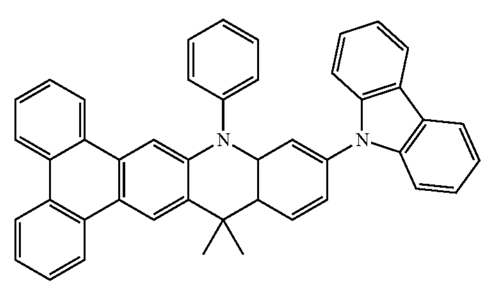

-continued
In-B-7
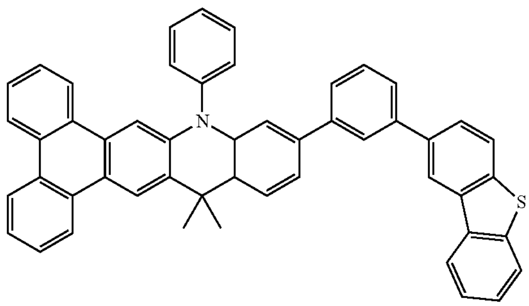
In-B-8
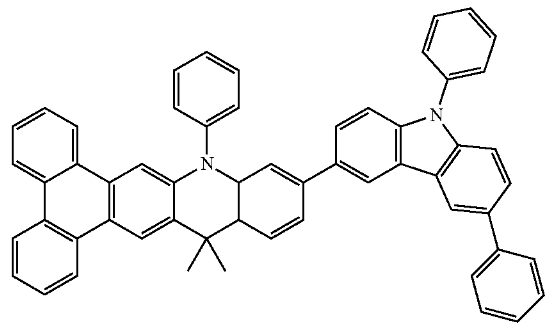
In-B-9
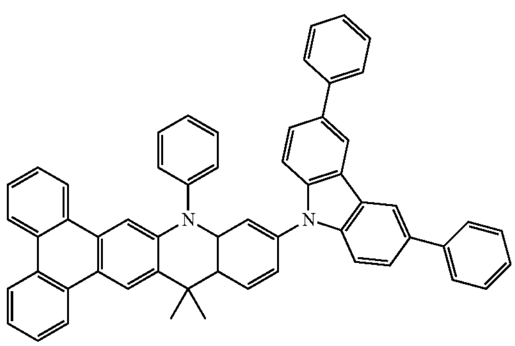
In-B-10
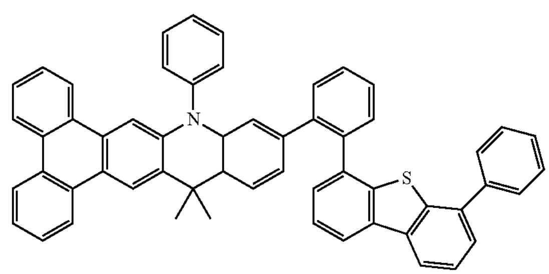
In-B-11
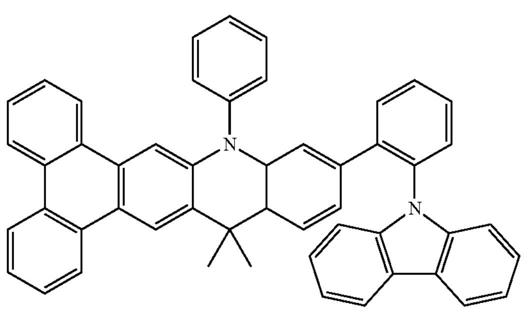
In-B-12
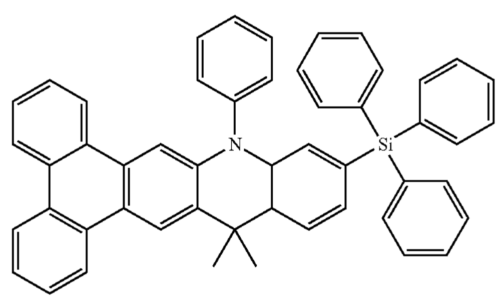
In-B-13
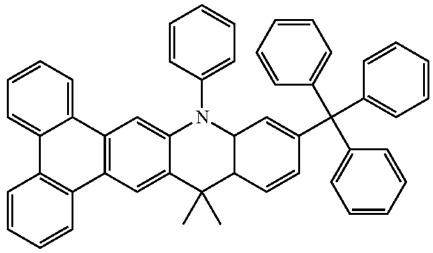
In-B-14
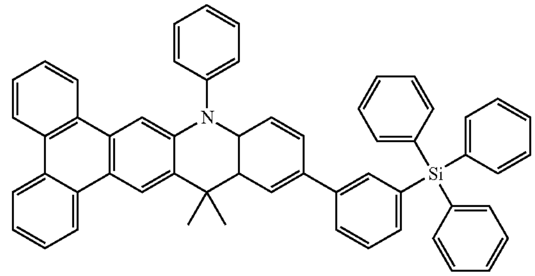

-continued
In-B-15
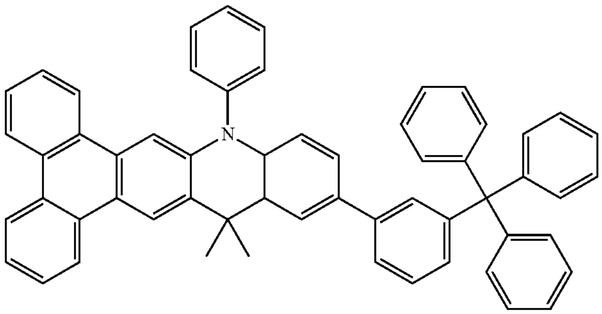
In-B-16
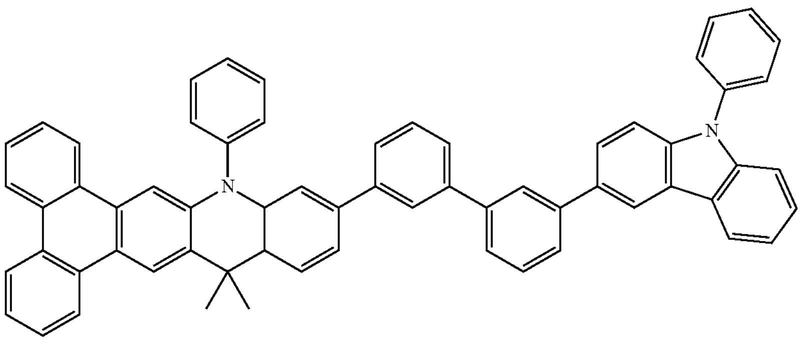
In-B-17
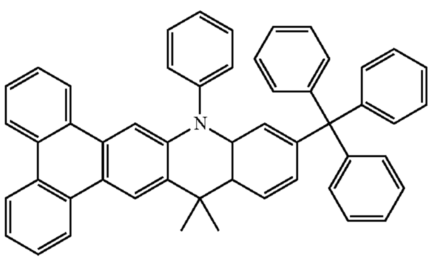
In-B-18
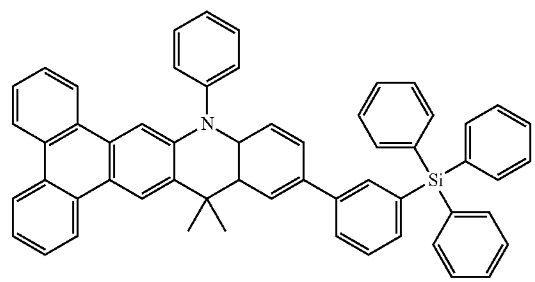
In-C-1
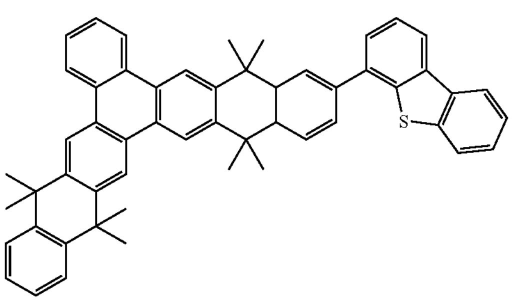
In-C-2
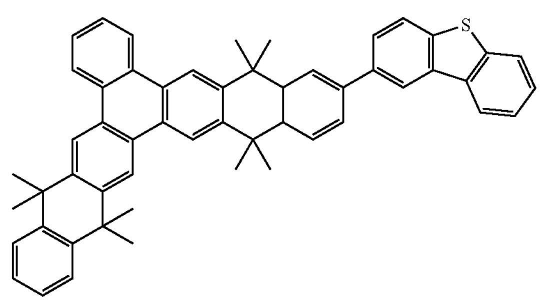
In-C-3
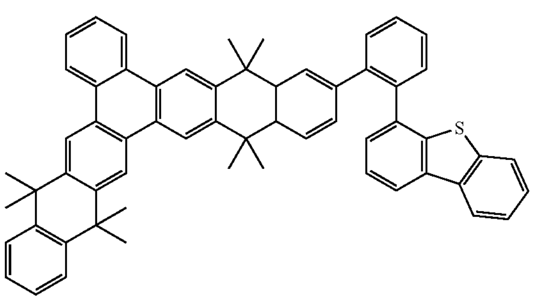
In-C-4
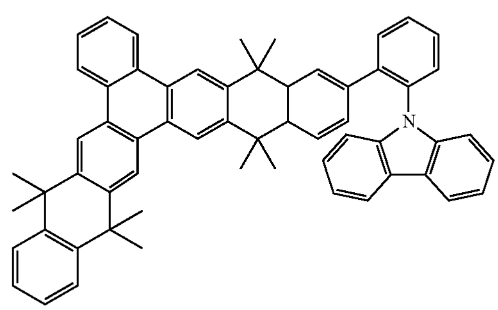

-continued
In-C-5
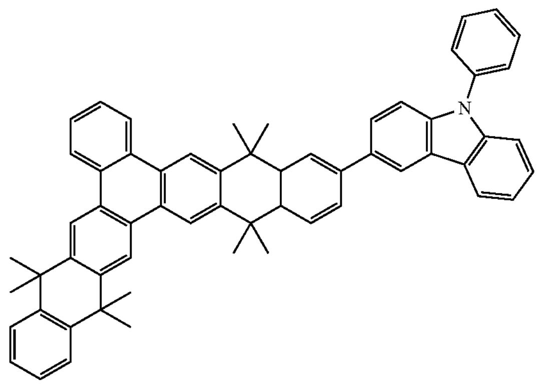
In-C-6
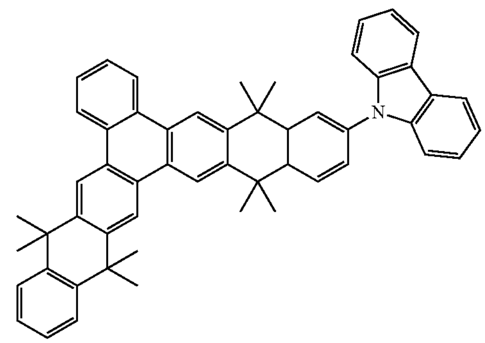
In-C-7
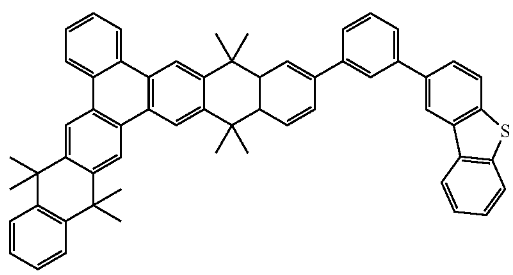
In-C-8
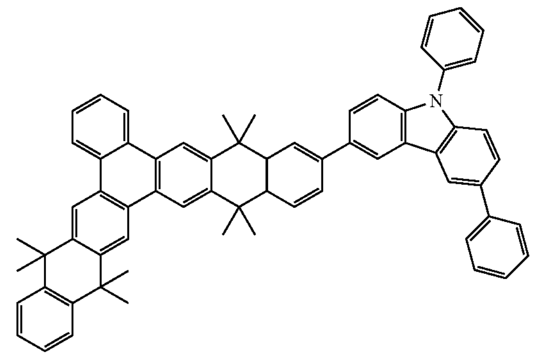
In-C-9
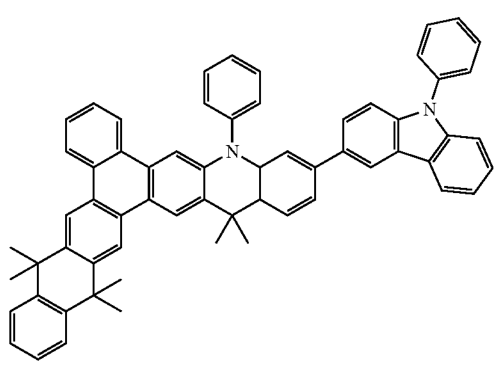
In-C-10
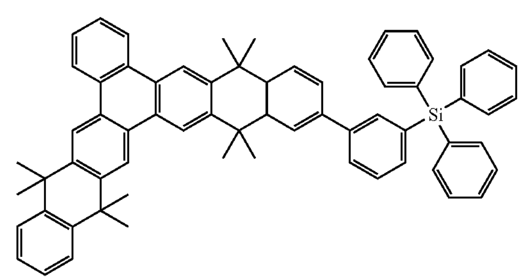
In-C-11
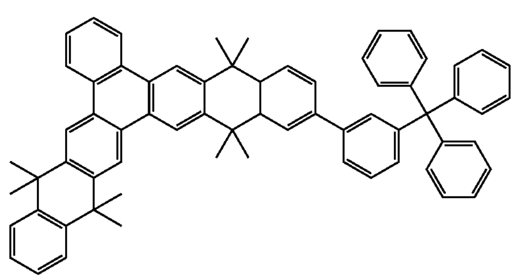
In-C-12
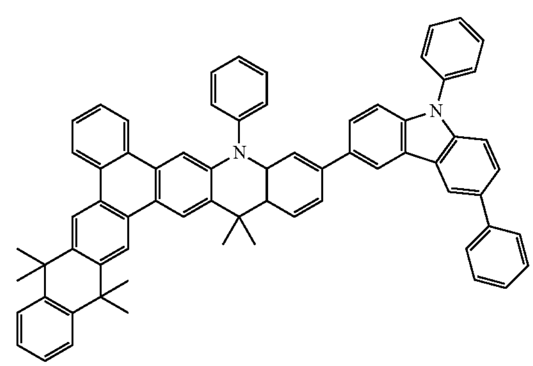

-continued
In-C-13
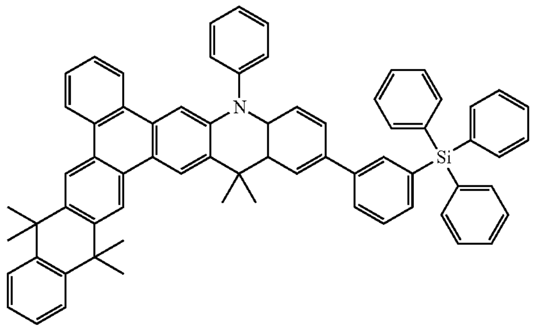
In-C-14
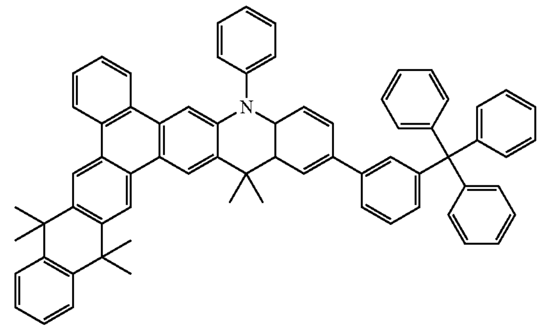
C1
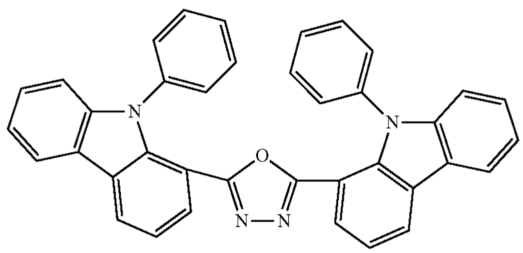
C2
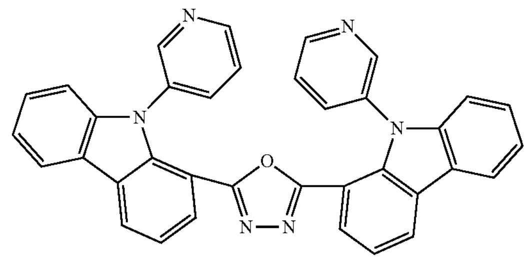
C3
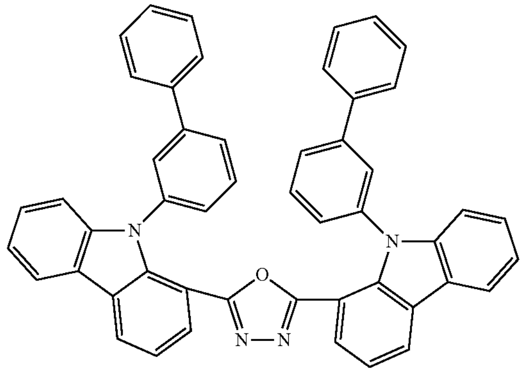
C4
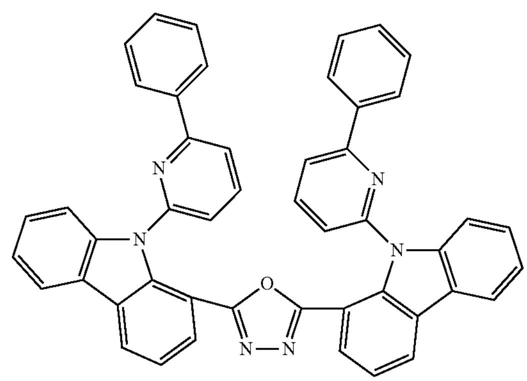
C5
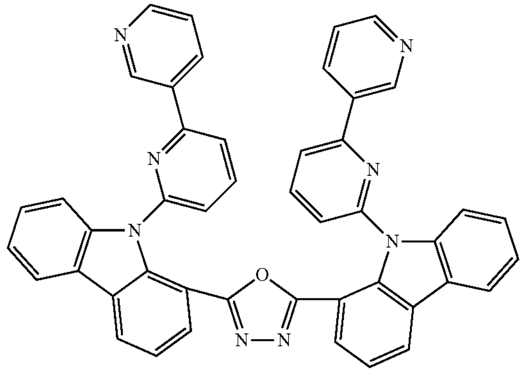
C6
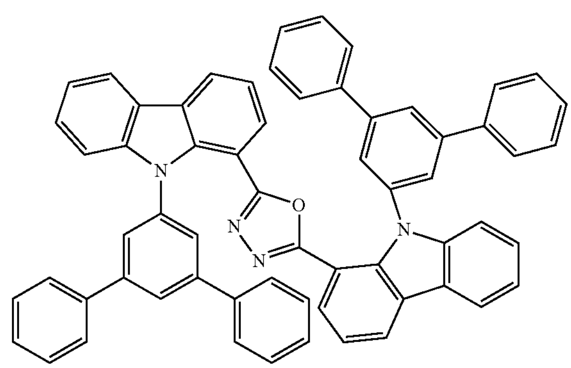

-continued
C7
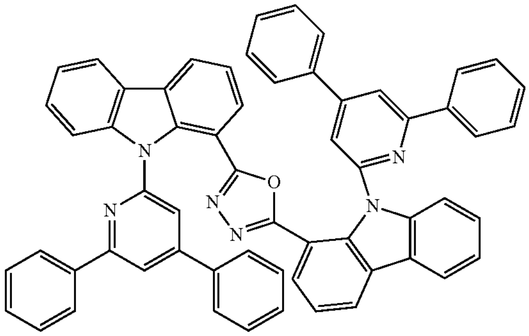
C8
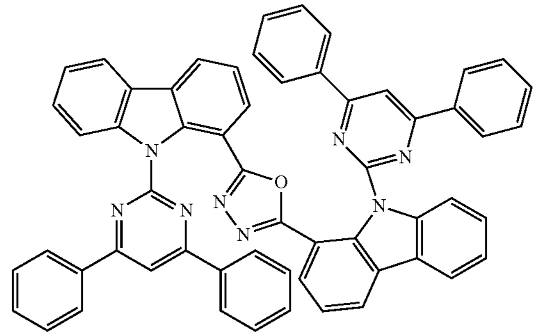
C9
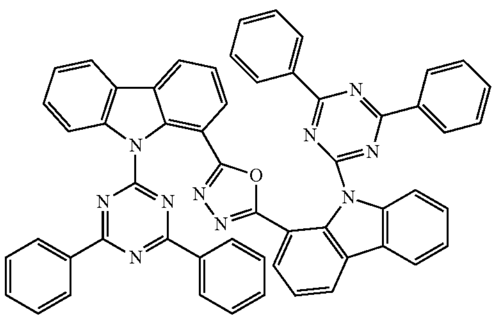
C10
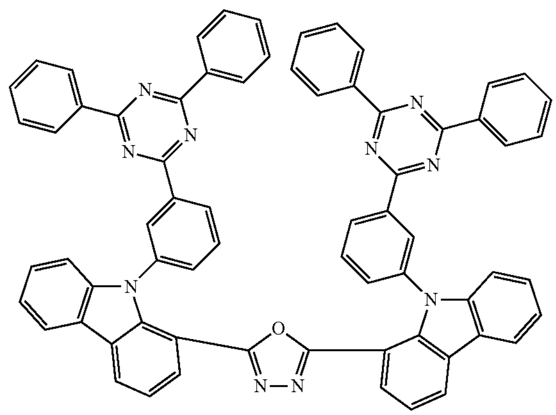
C11
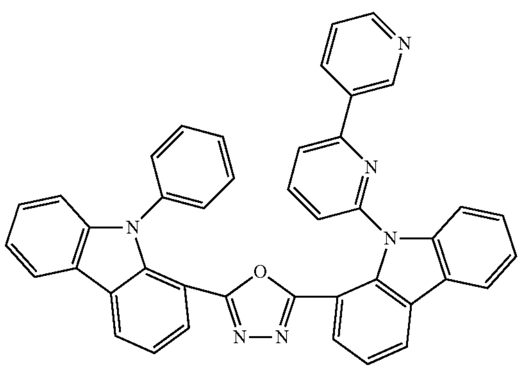
C12
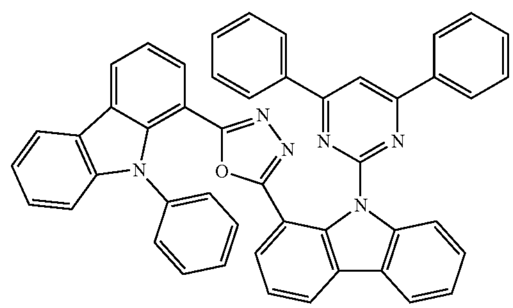
C13
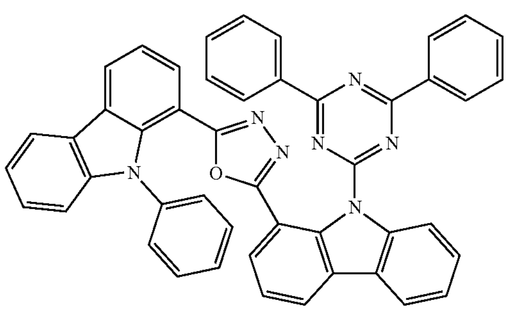
C14
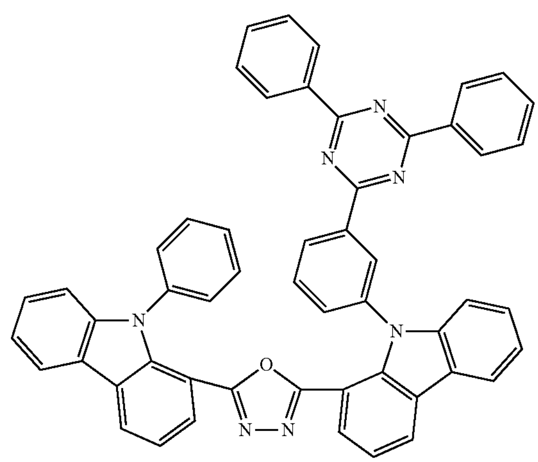

-continued
C15
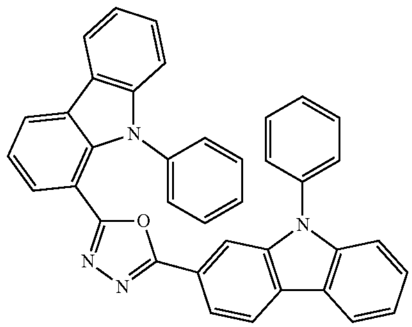
C16
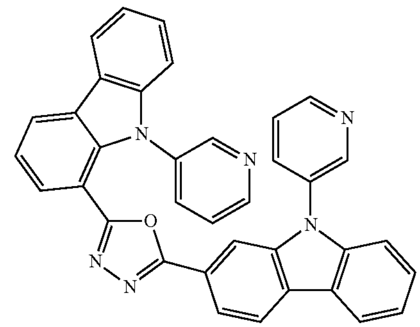
C17
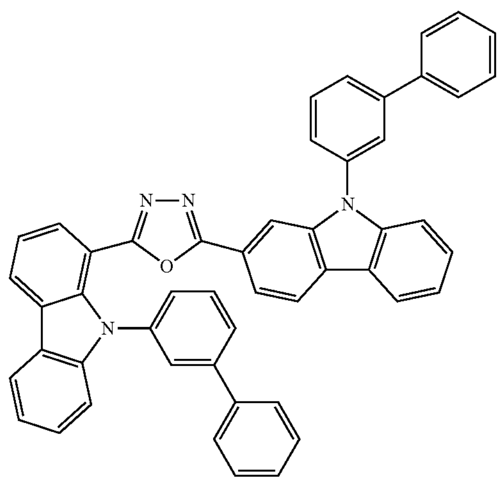
C18
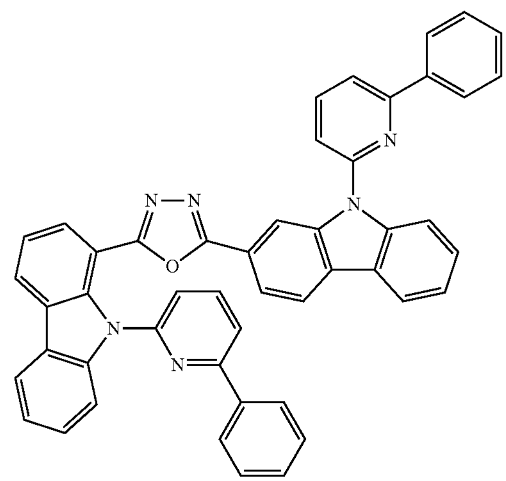
C19
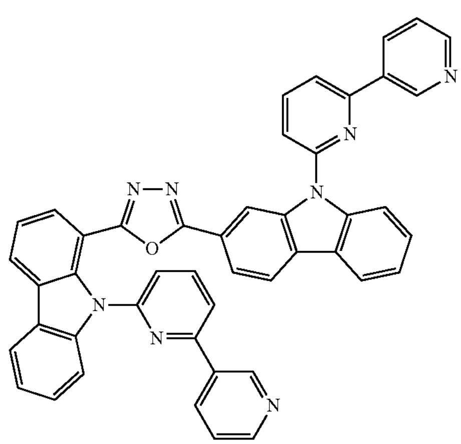
C20
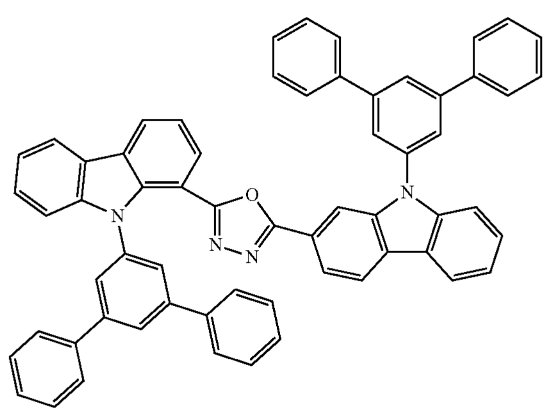

-continued
C21
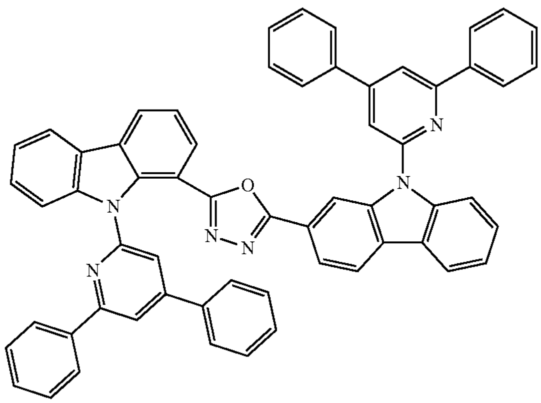
C22
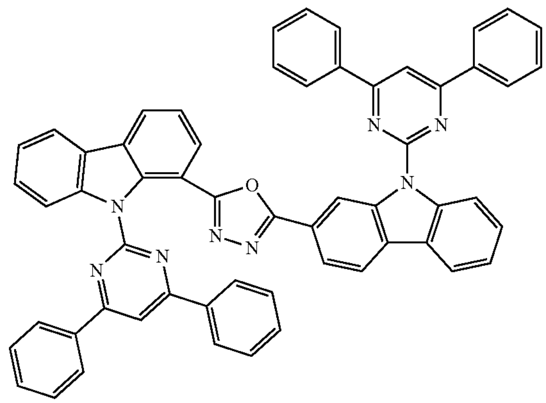
C23
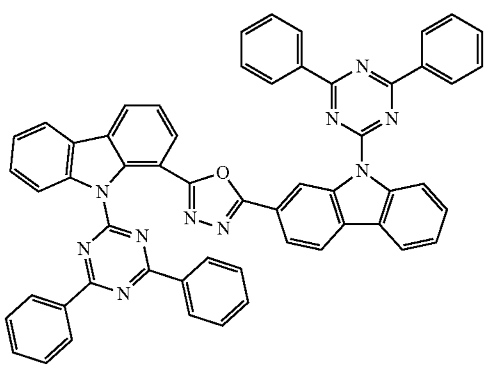
C24
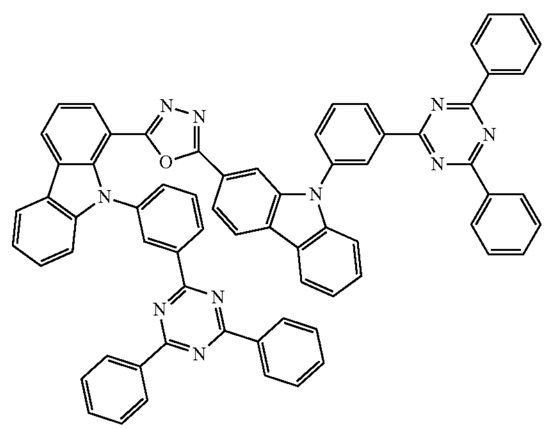
C25
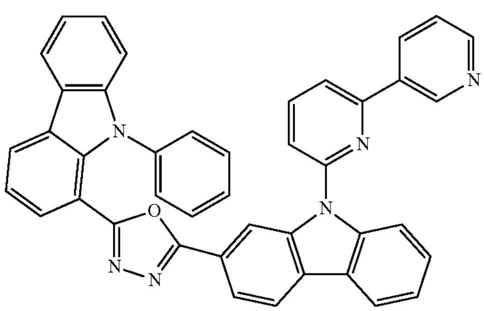
C26
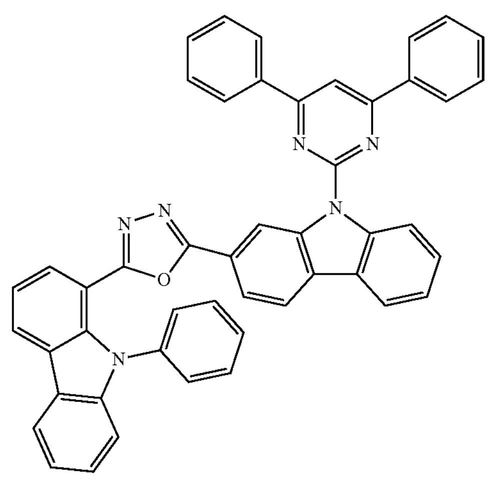

-continued
C27
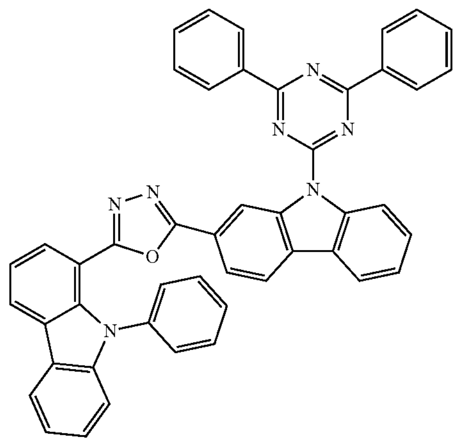
C28
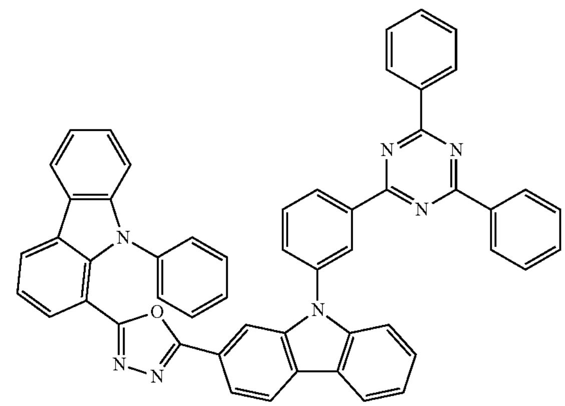
C29
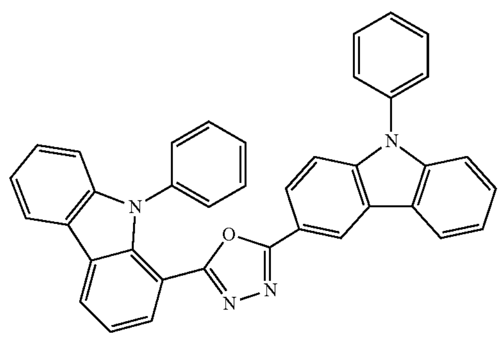
C30
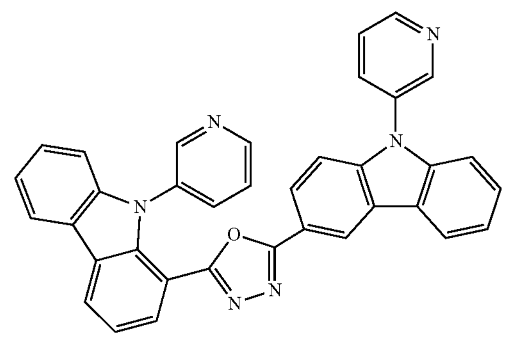
C31
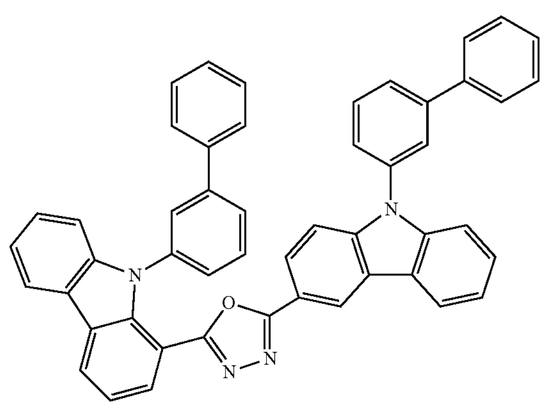
C32
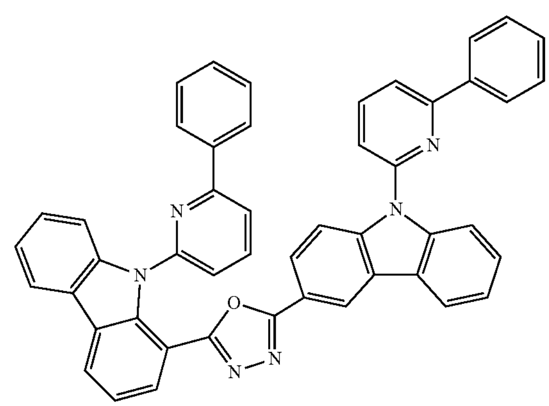
C33
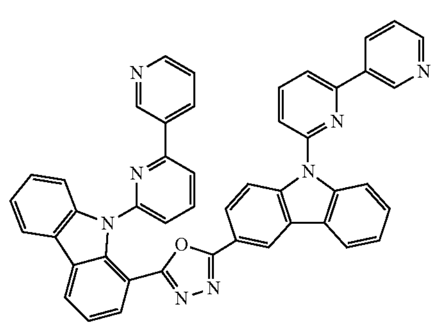
C34
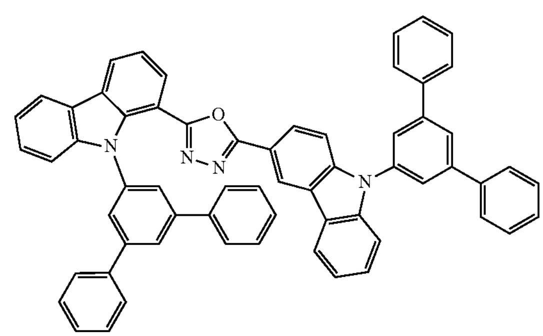

-continued
C35
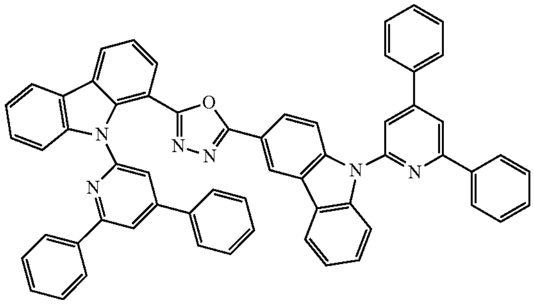
C36
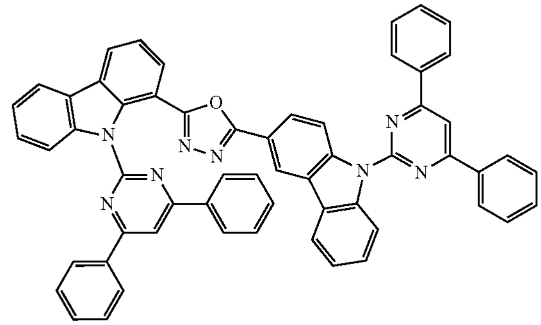
C37
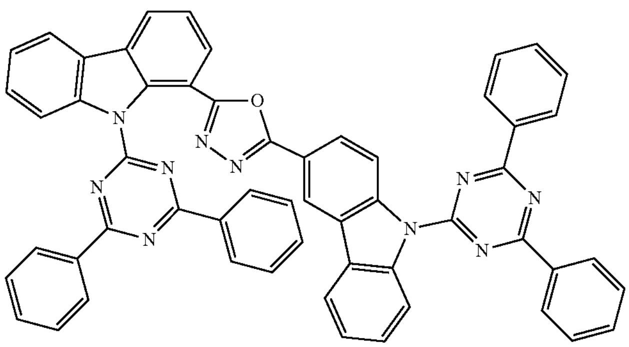
C38
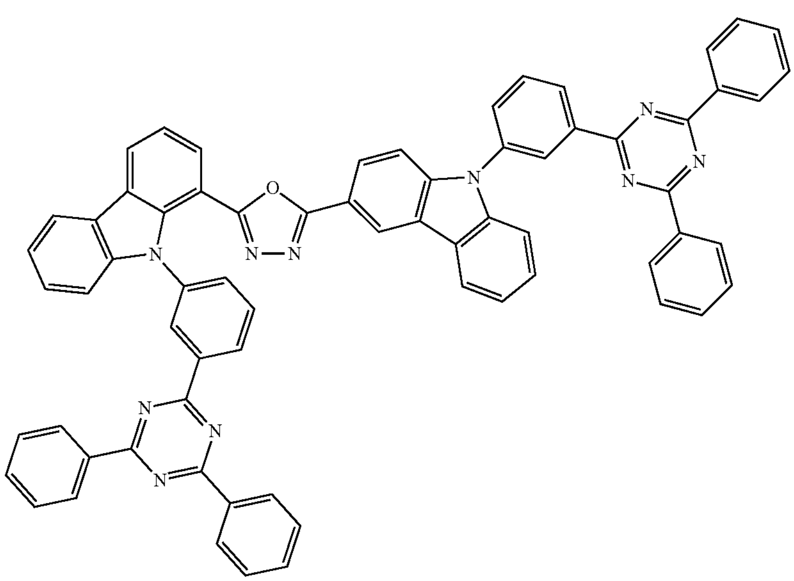

-continued
C39
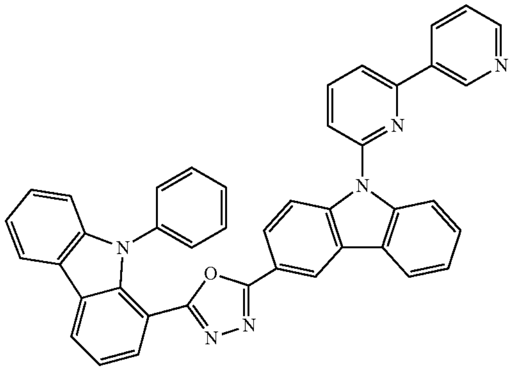
C40
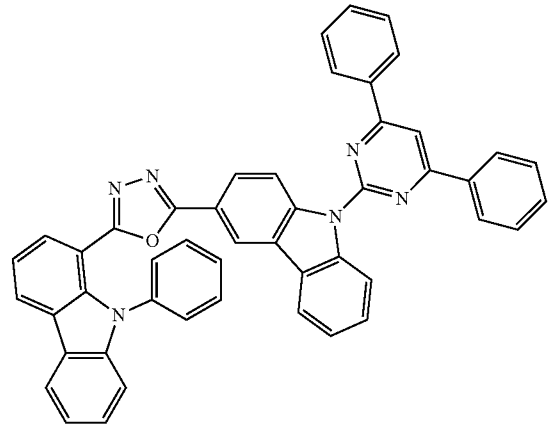
C41
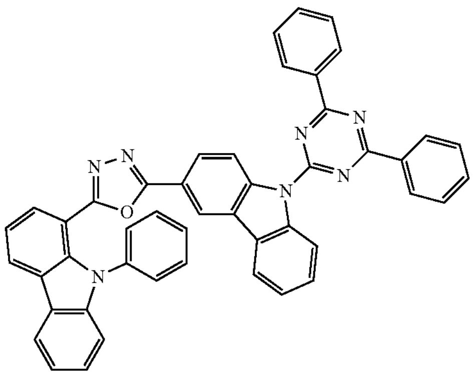
C42
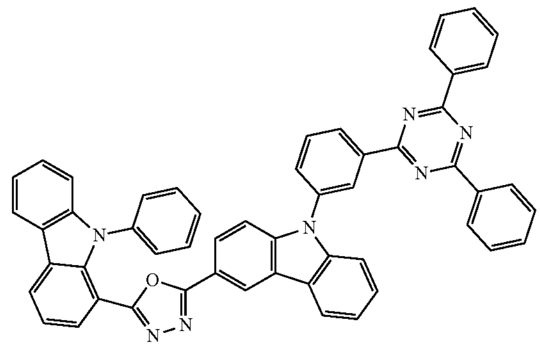
C43
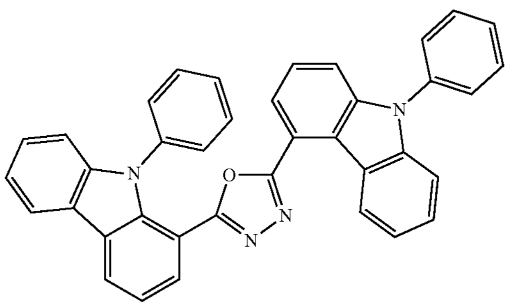
C44
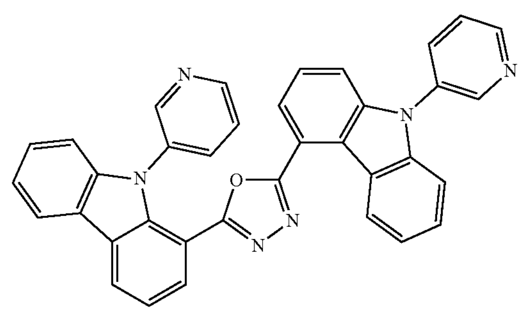
C45
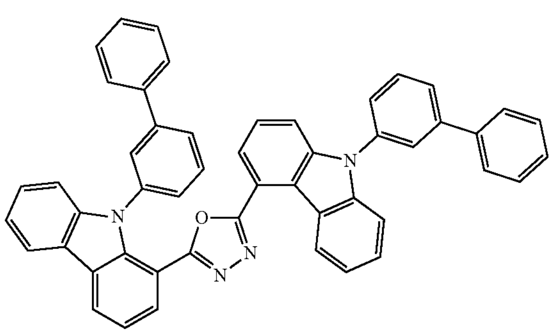
C46
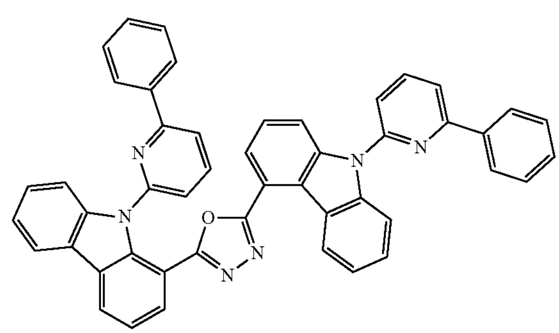

-continued
C47
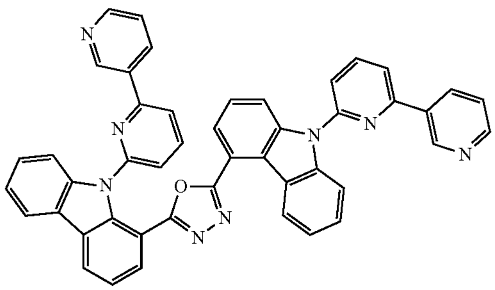
C48
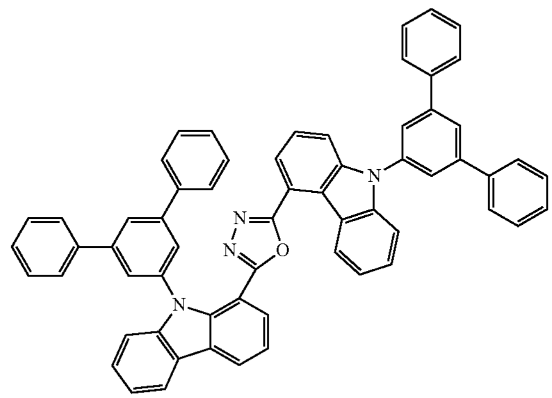
C49
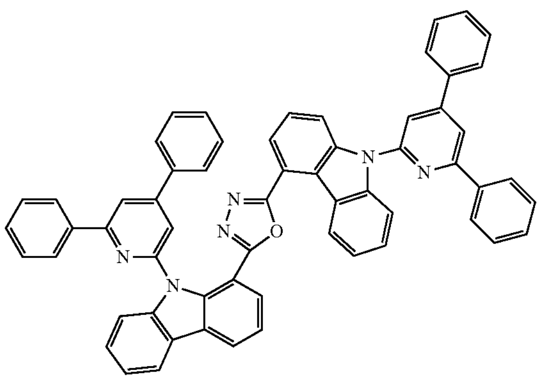
C50
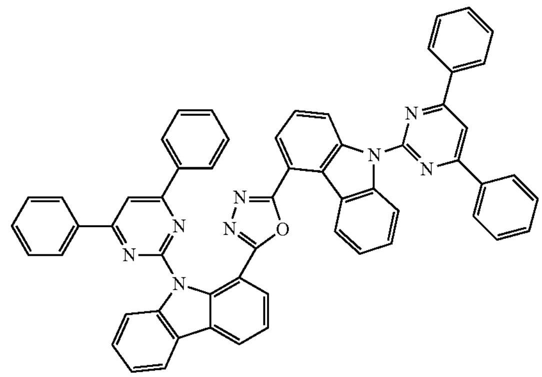
C51
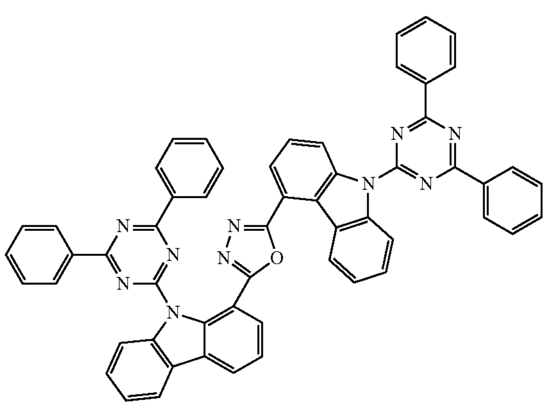
C52
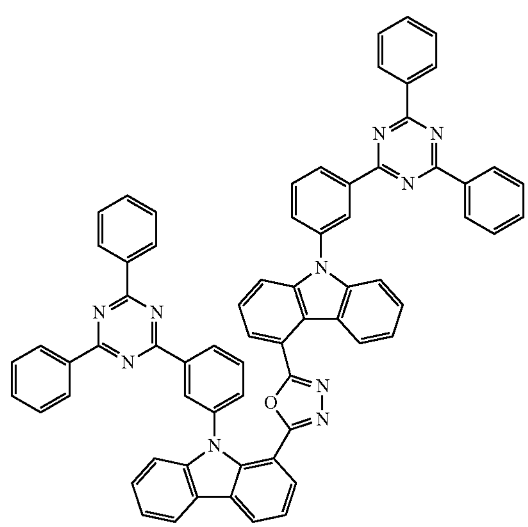

-continued
C53
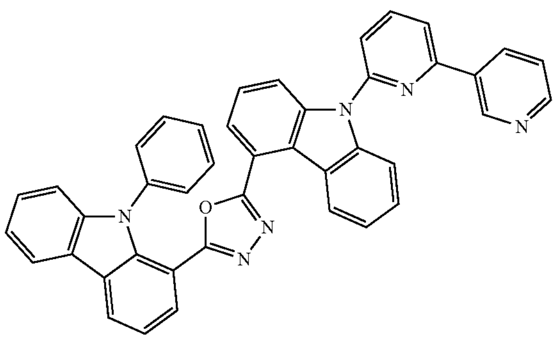
C54
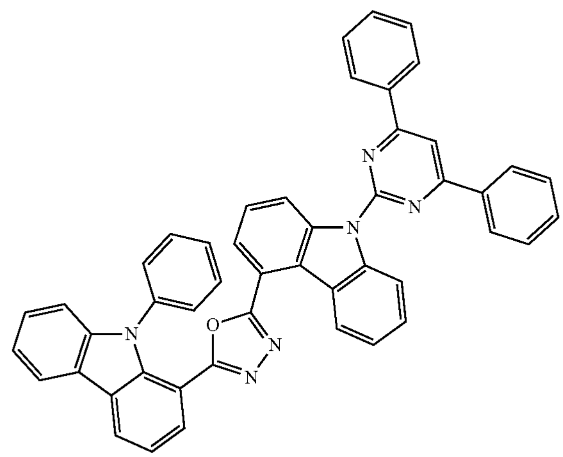
C55
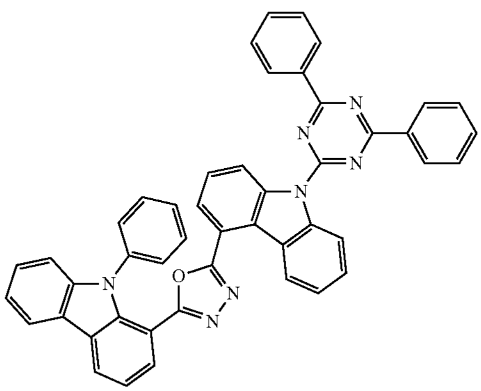
C56
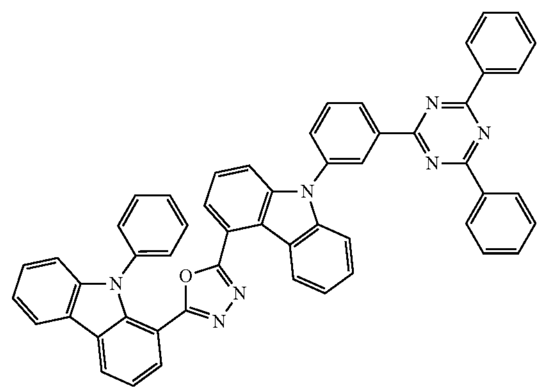
C57
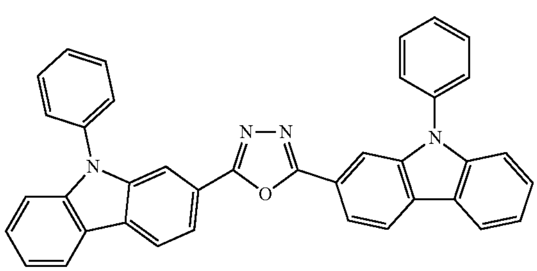
C58
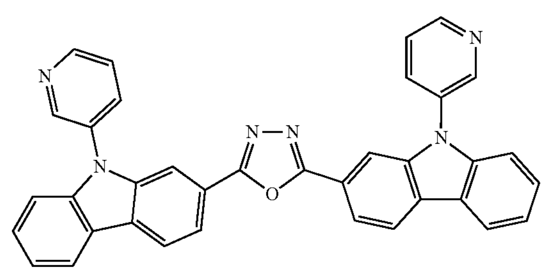
C59
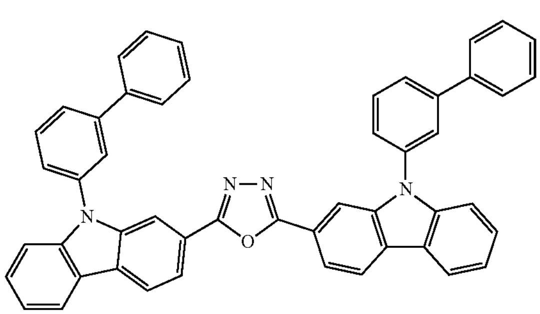
C60
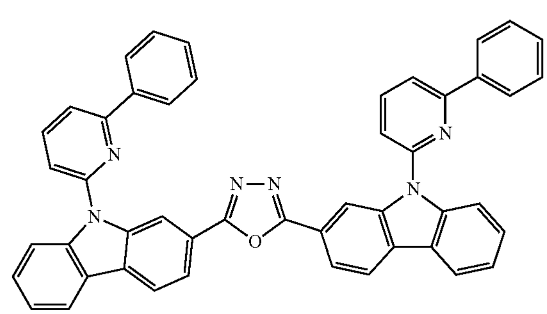

-continued
C61
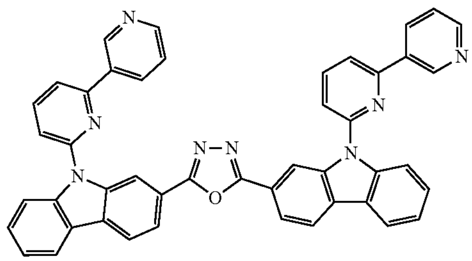
C62
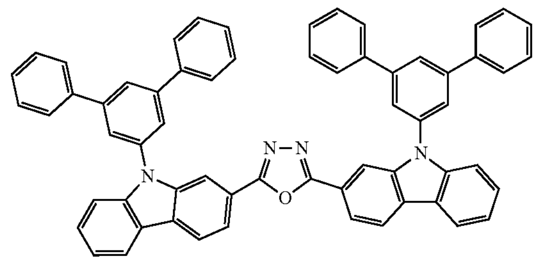
C63
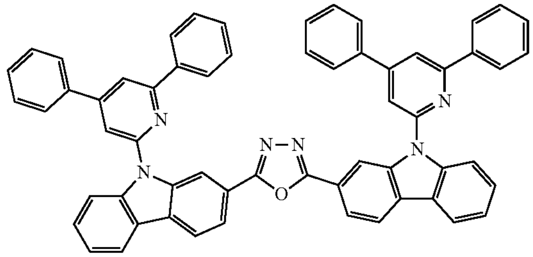
C64
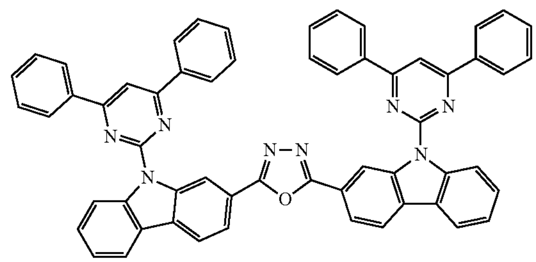
C65
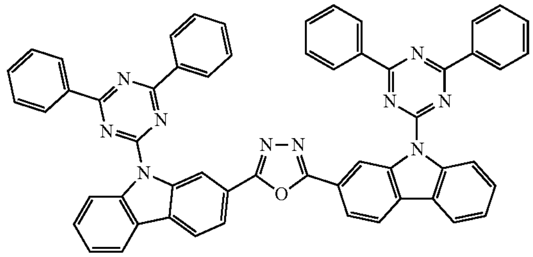
C66
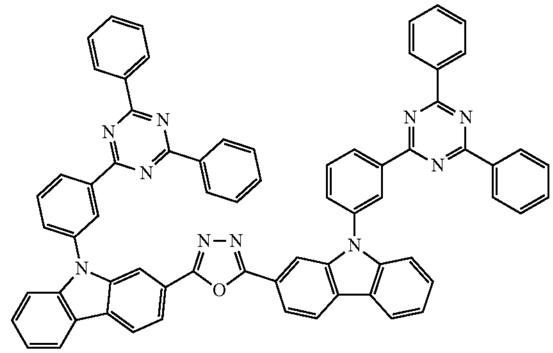
C67
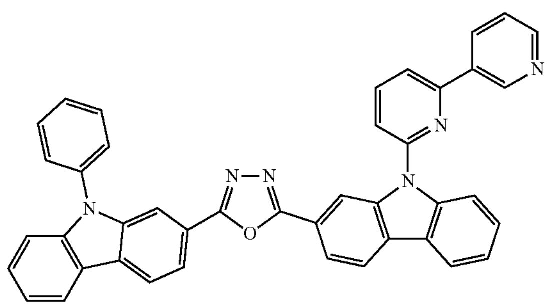
C68
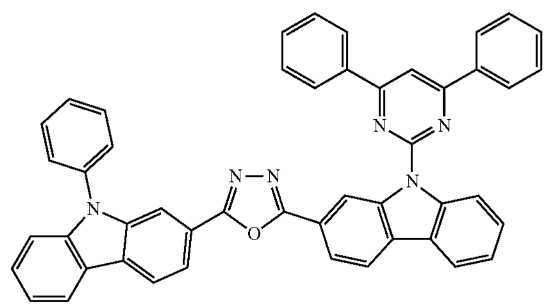
C69
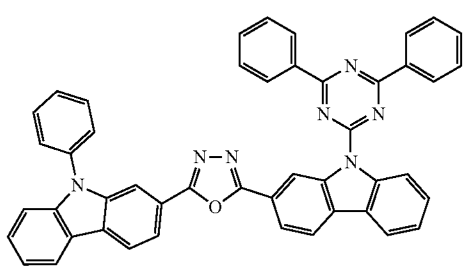
C70
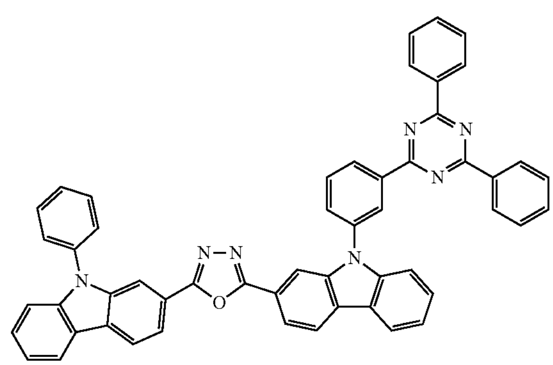

-continued
C71
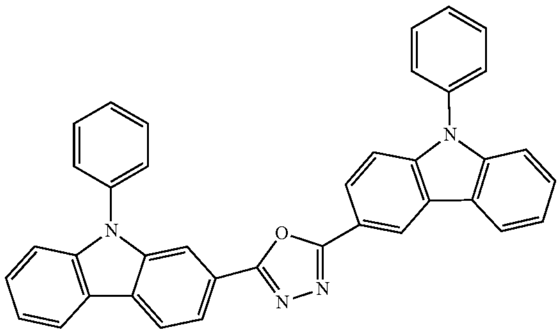
C72
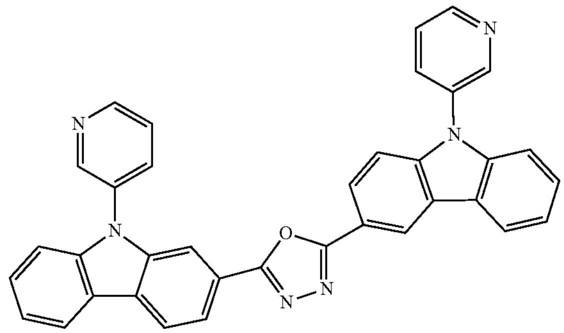
C73
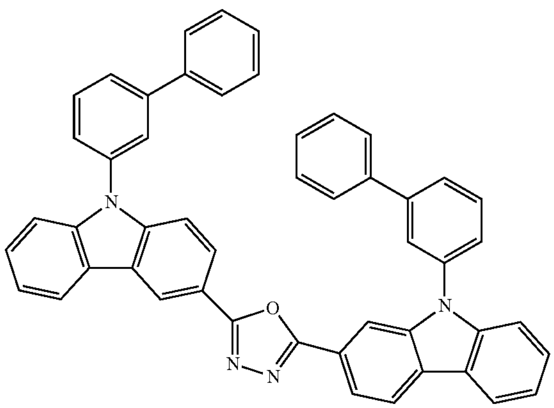
C74
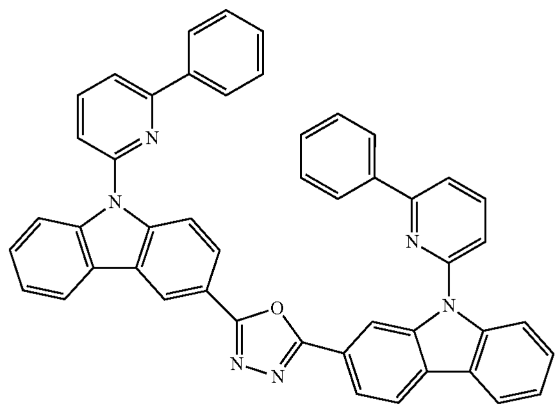
C75
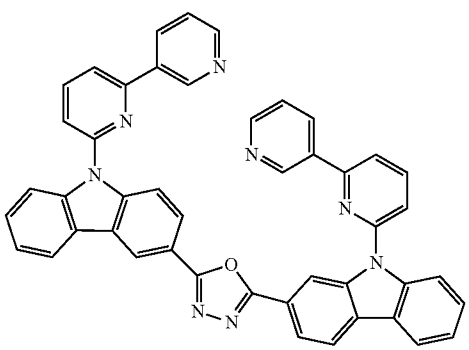
C76
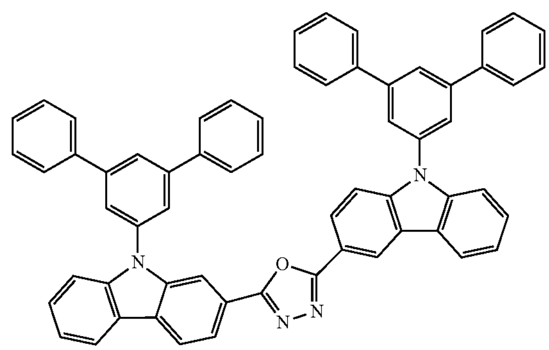
C77
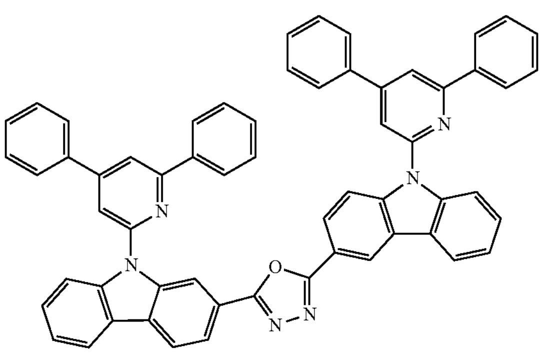
C78
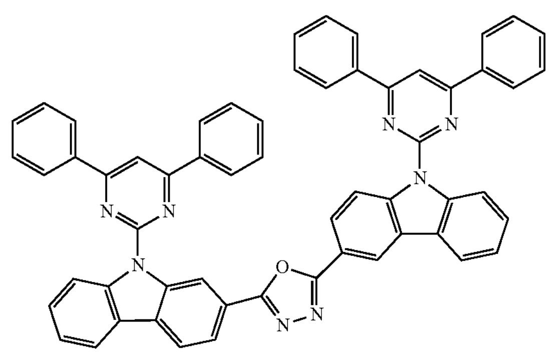

-continued
C79
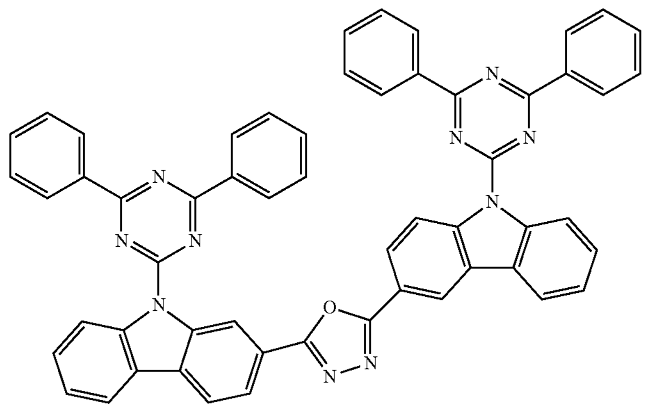
C80
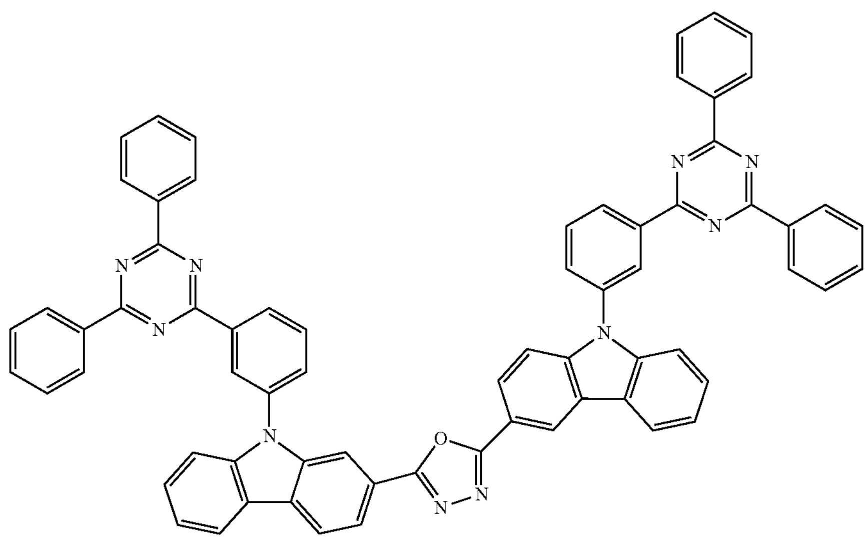
C81
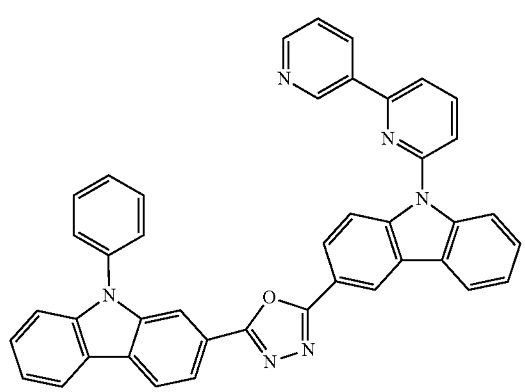
C82
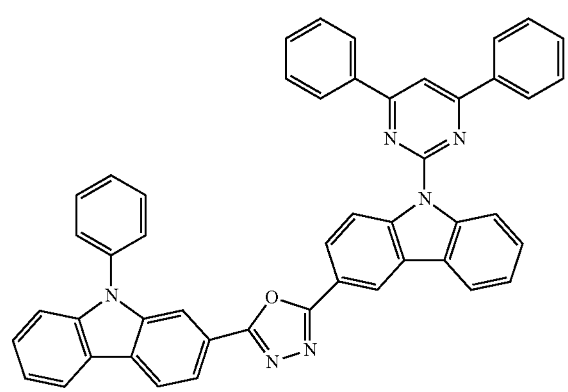

-continued
C83
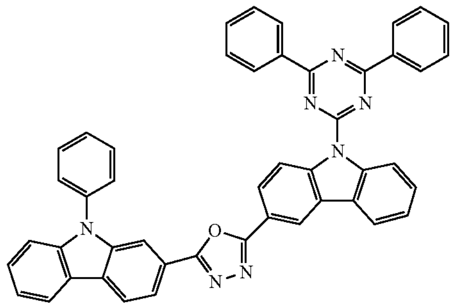
C84
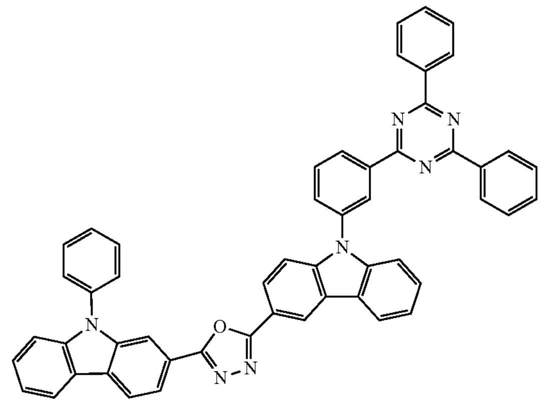
C85
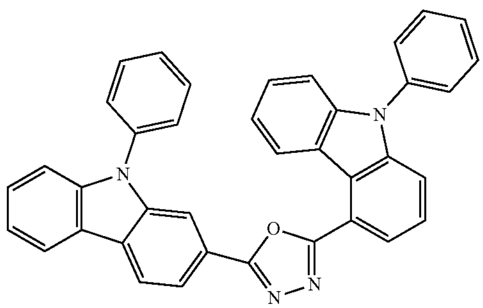
C86
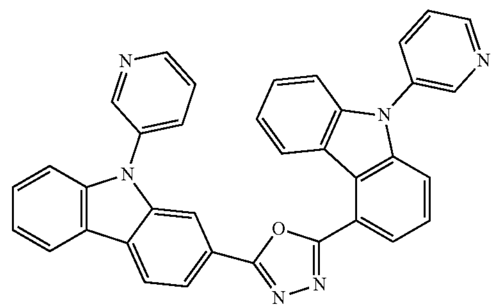
C87
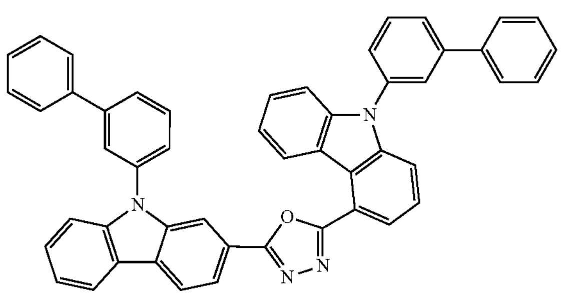
C88
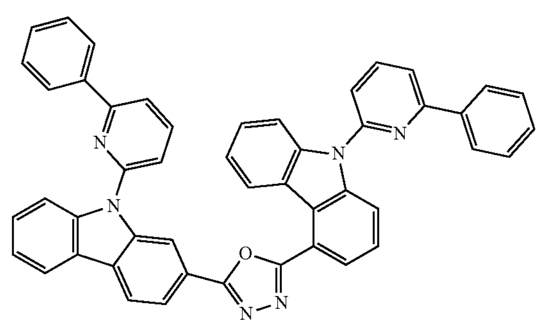
C89
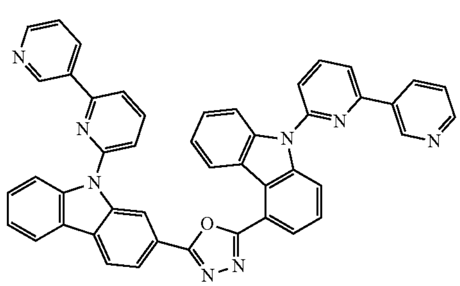
C90
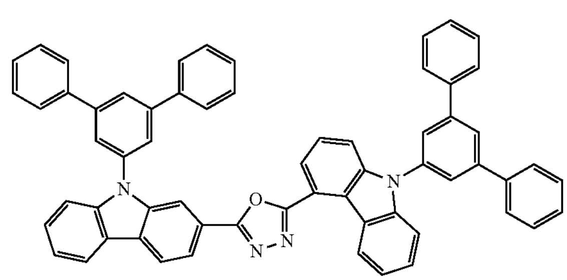

-continued
C91
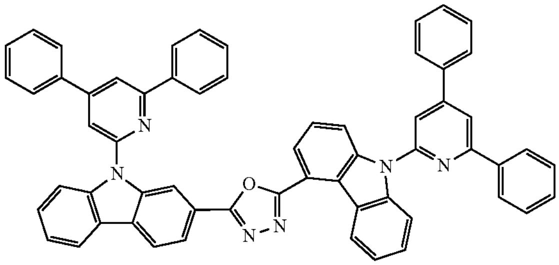
C92
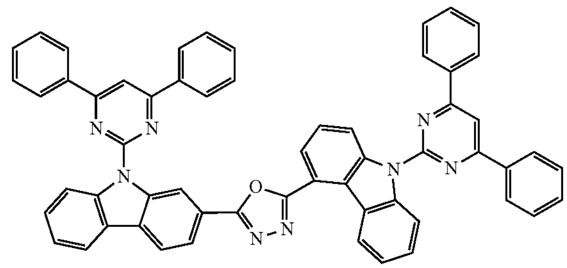
C93
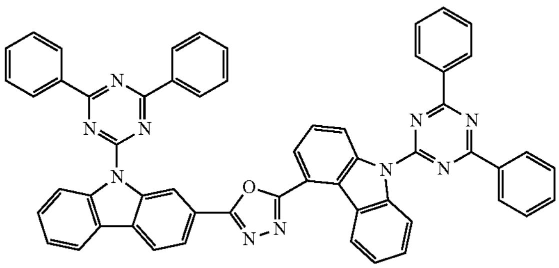
C94
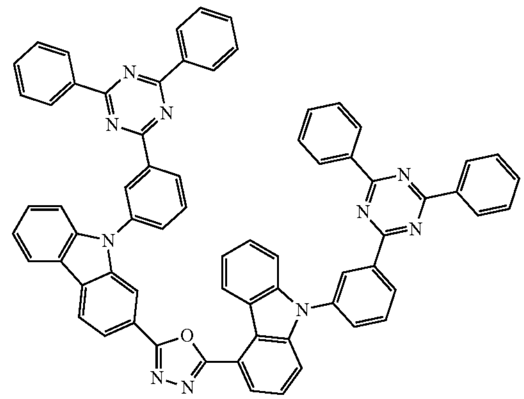
C95
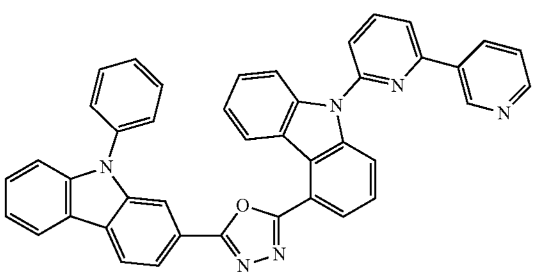
C96
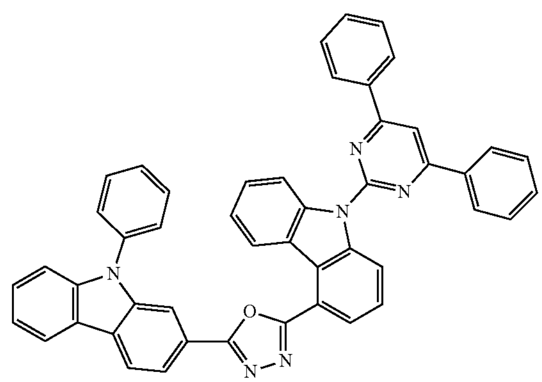
C97
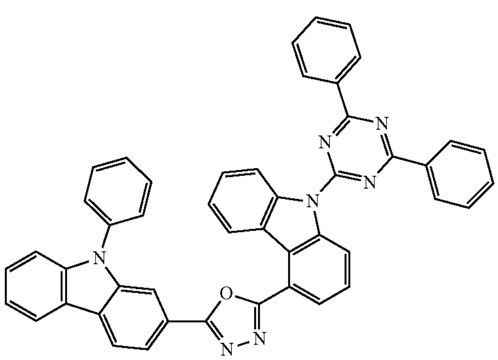
C98
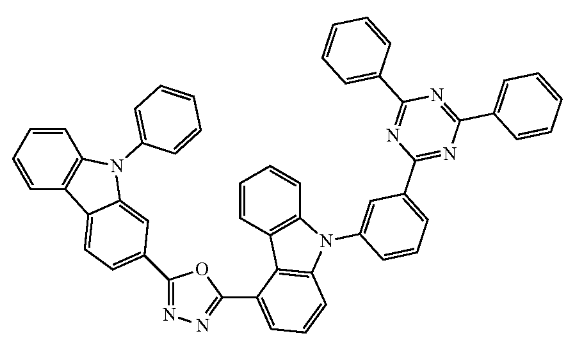

-continued
C99
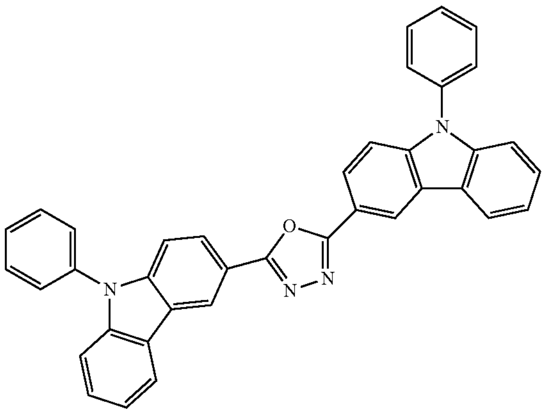
C100
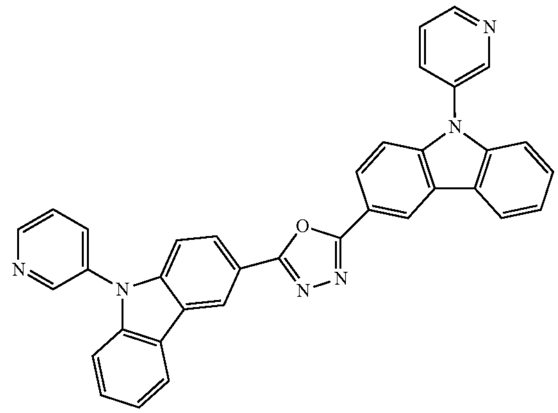
C101
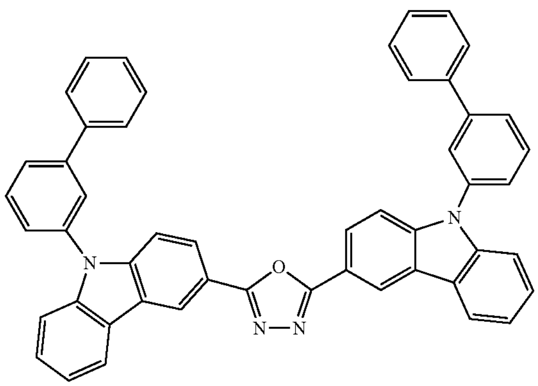
C102
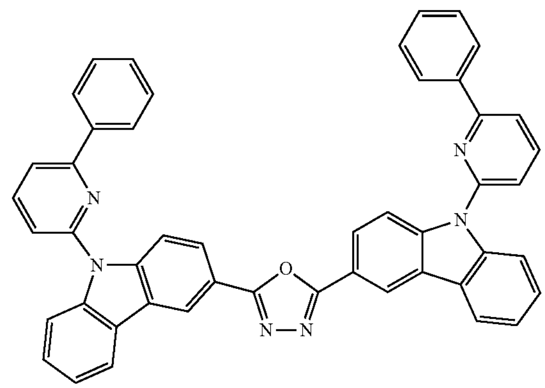
C103
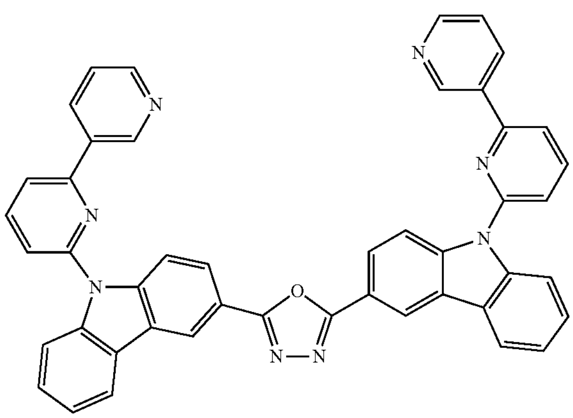
C104
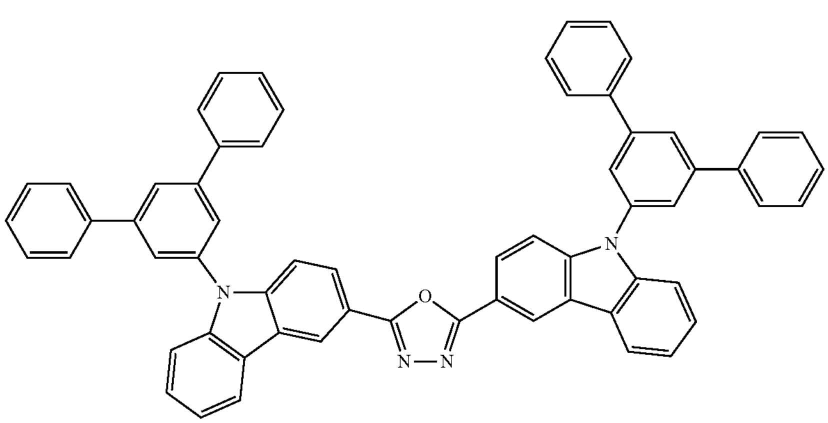

-continued
C105
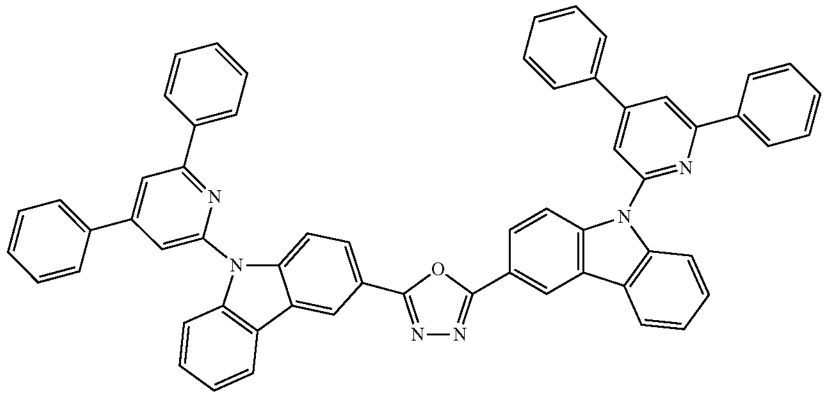
C106
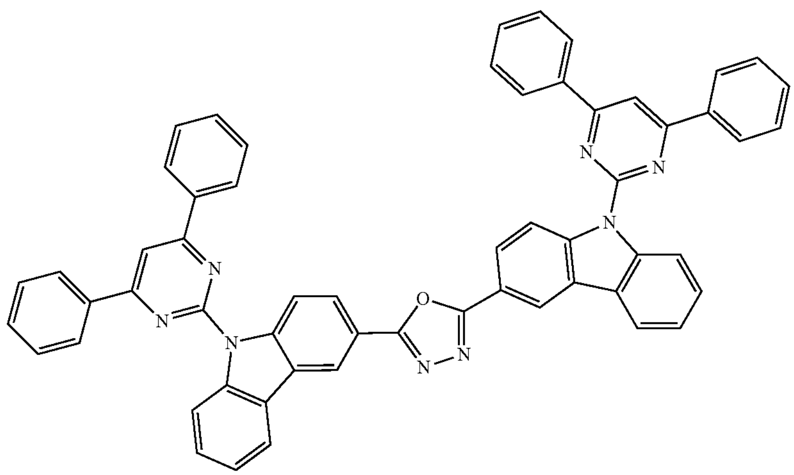
C107
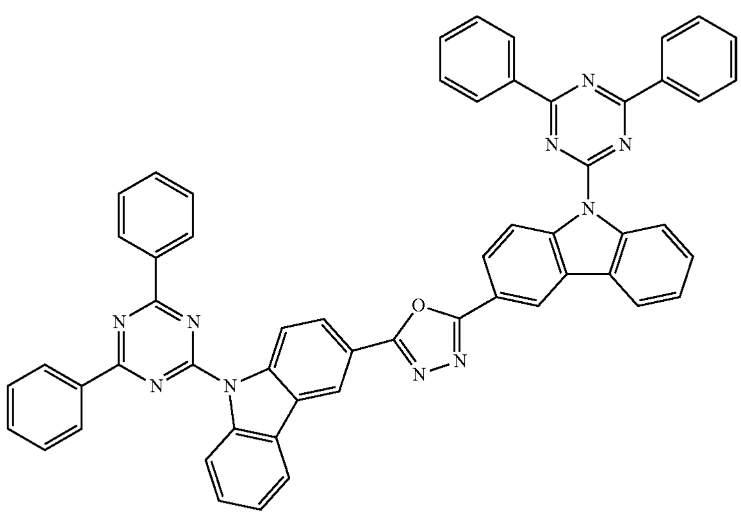

-continued
C108
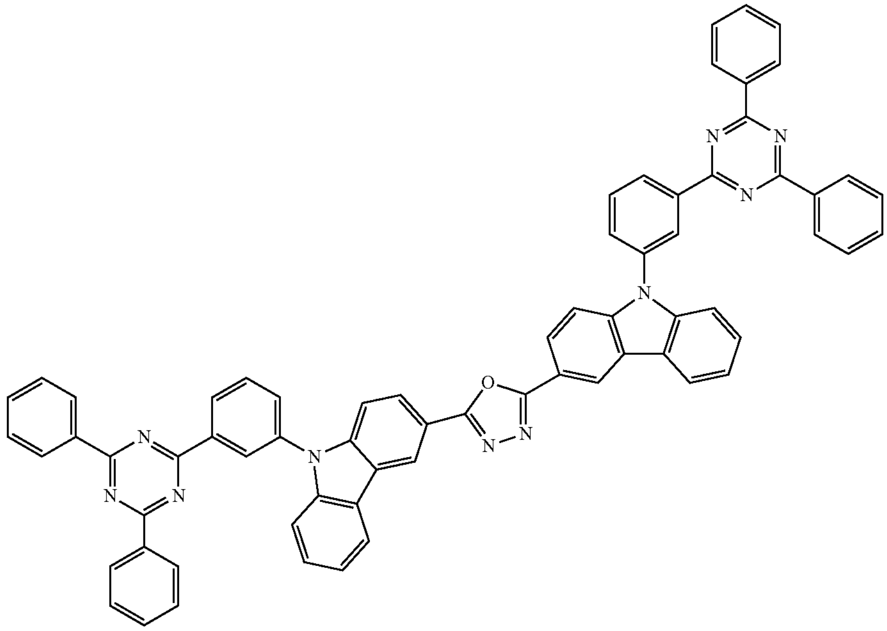
C109
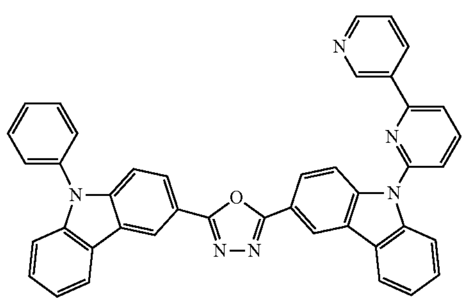
C110
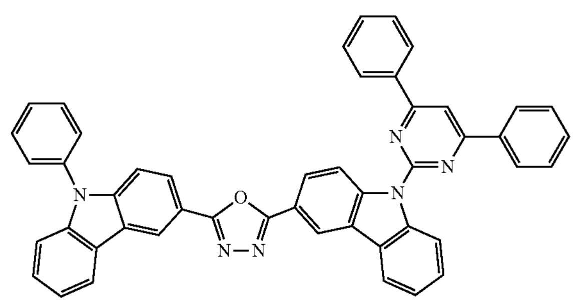
C111
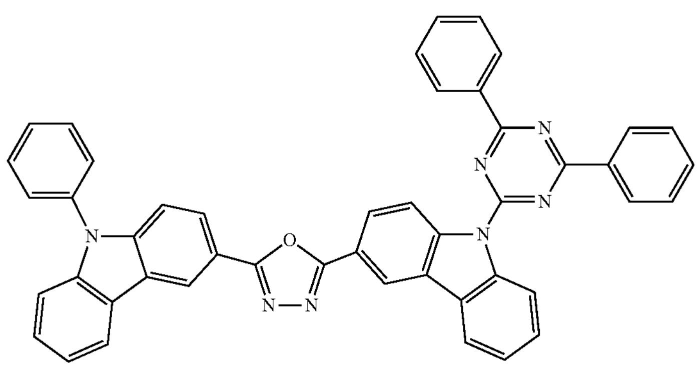

-continued
C112
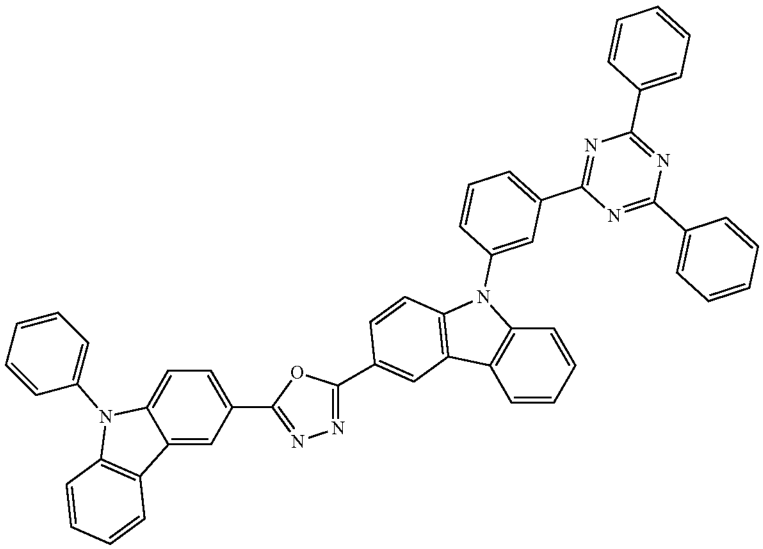
C113
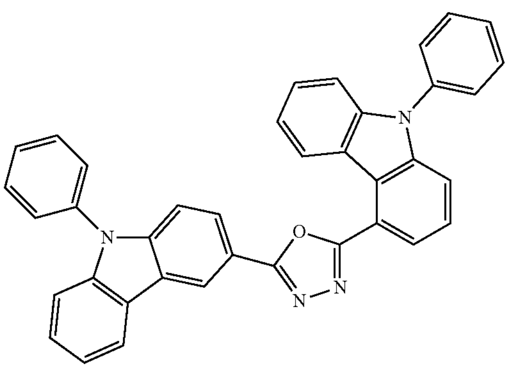
C114
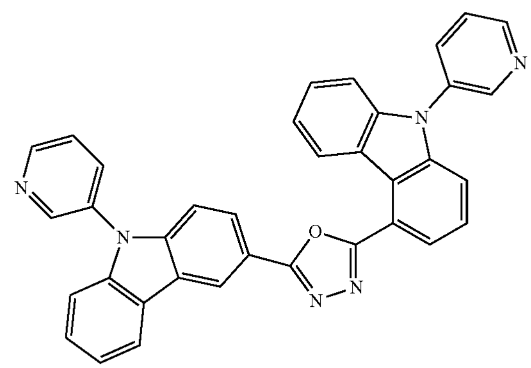
C115
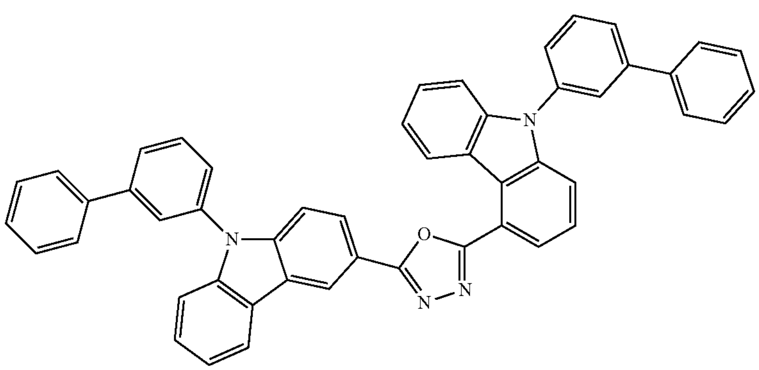
C116
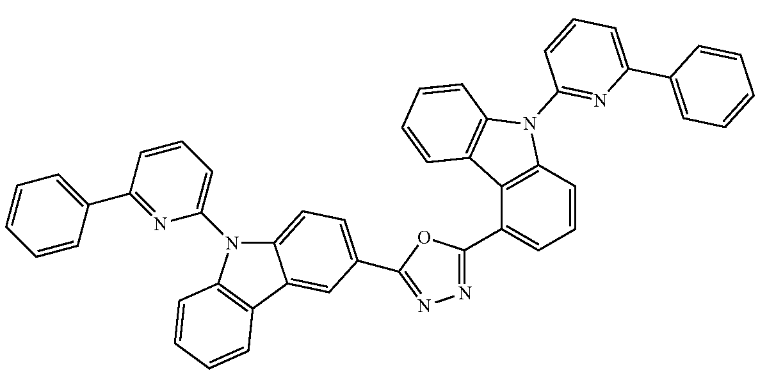

-continued
C117
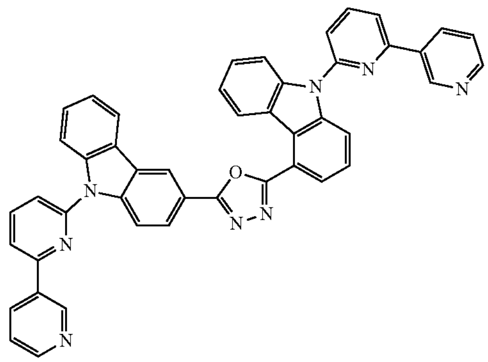
C118
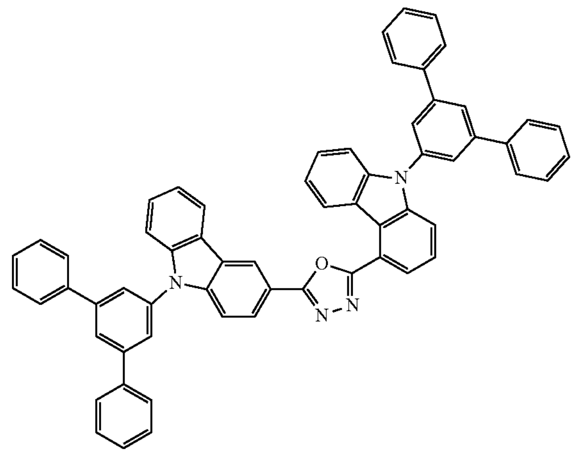
C119
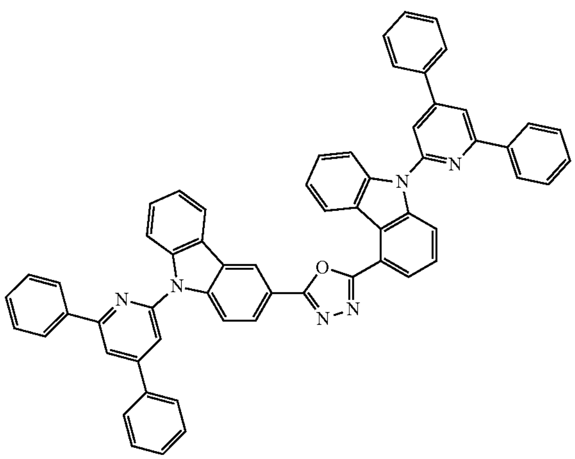
C120
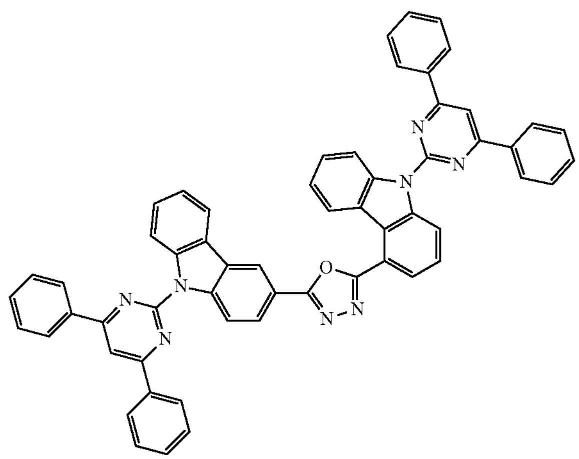
C121
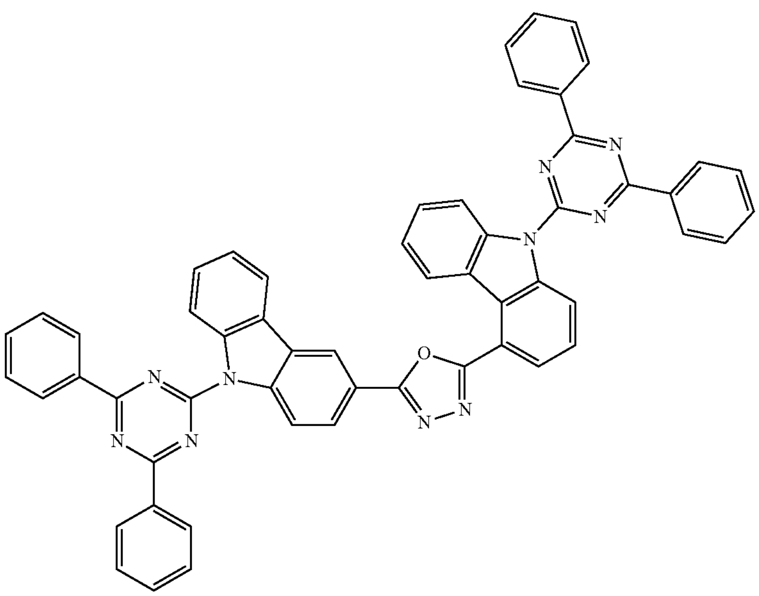

-continued
C122
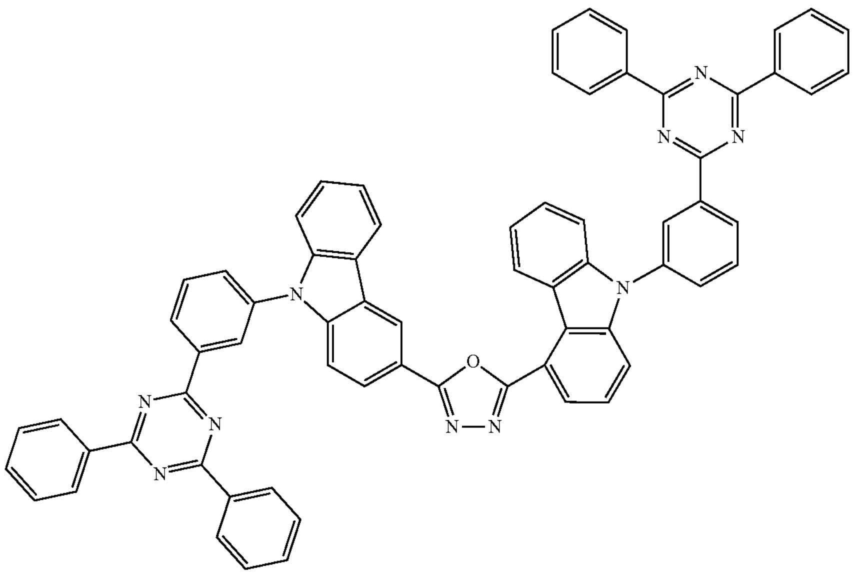
C123
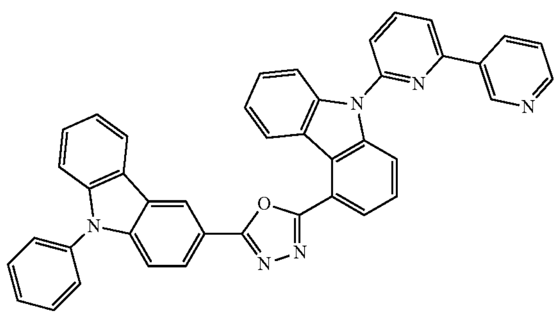
C124
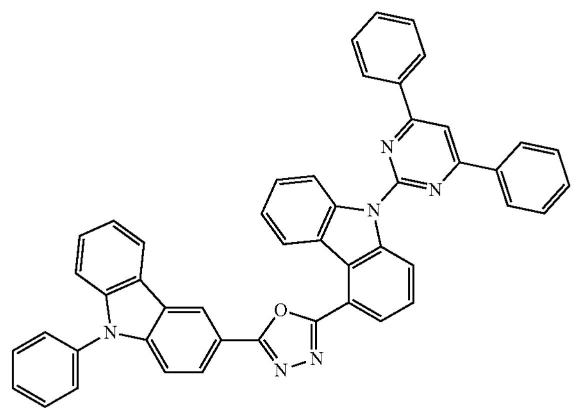
C125
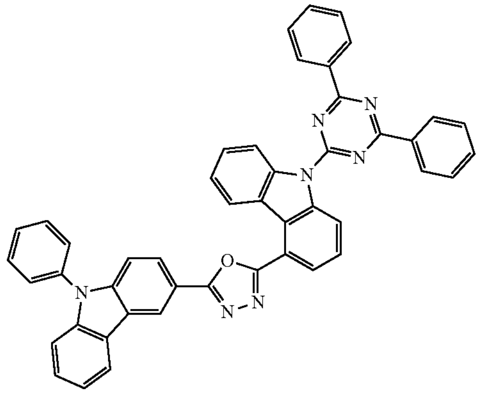
C126
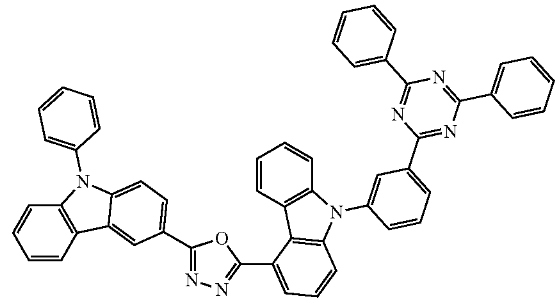

-continued
C127
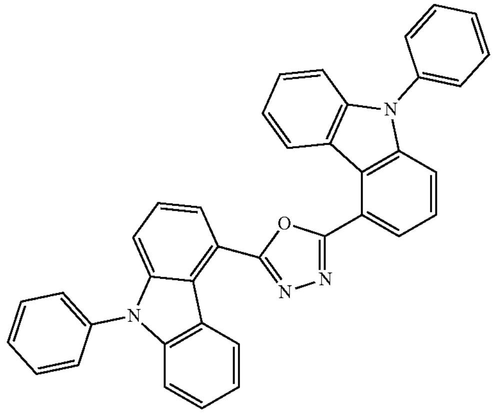
C128
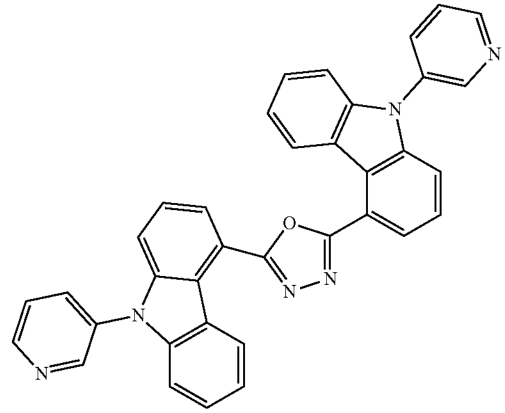
C129
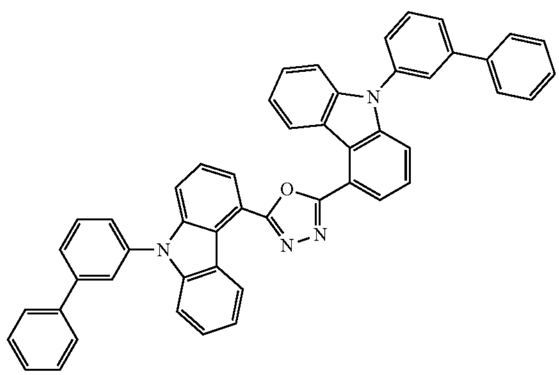
C130
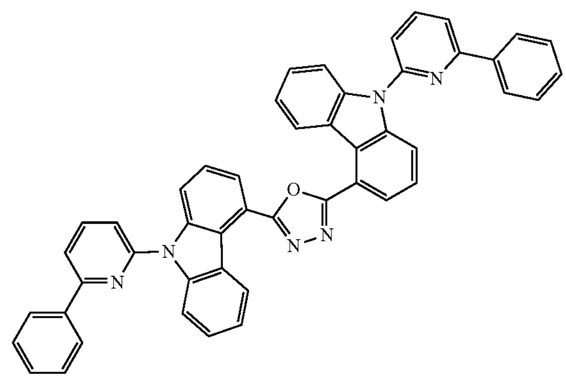
C131
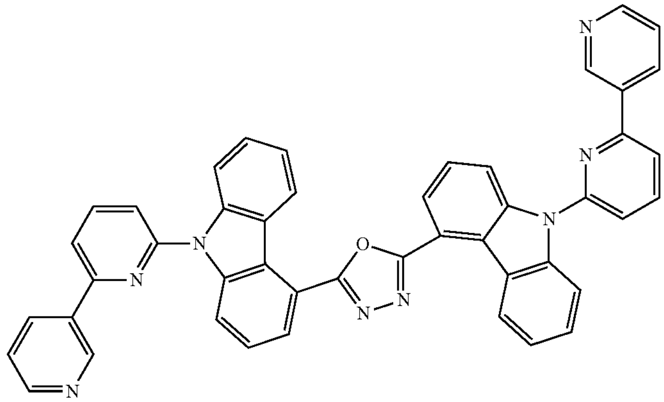

-continued
C132
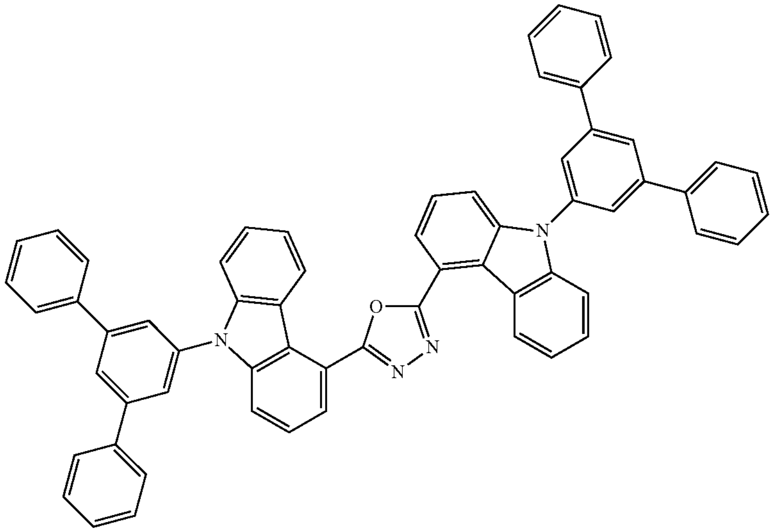
C133
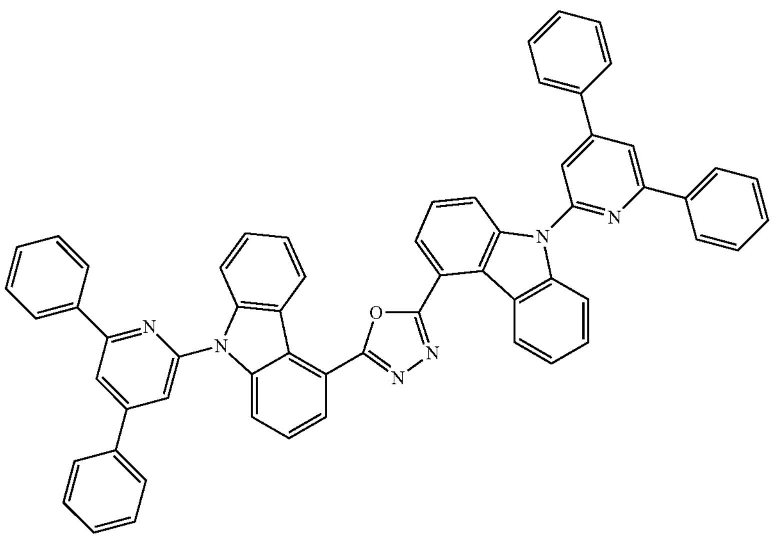
C134
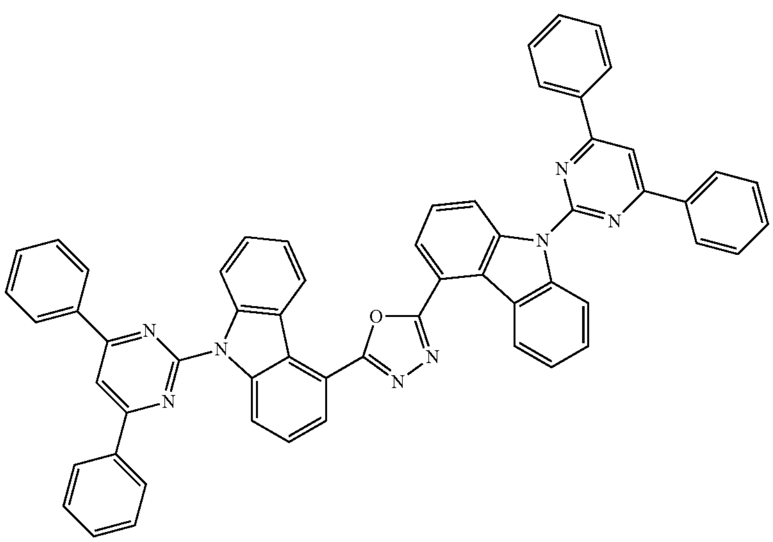

-continued
C135
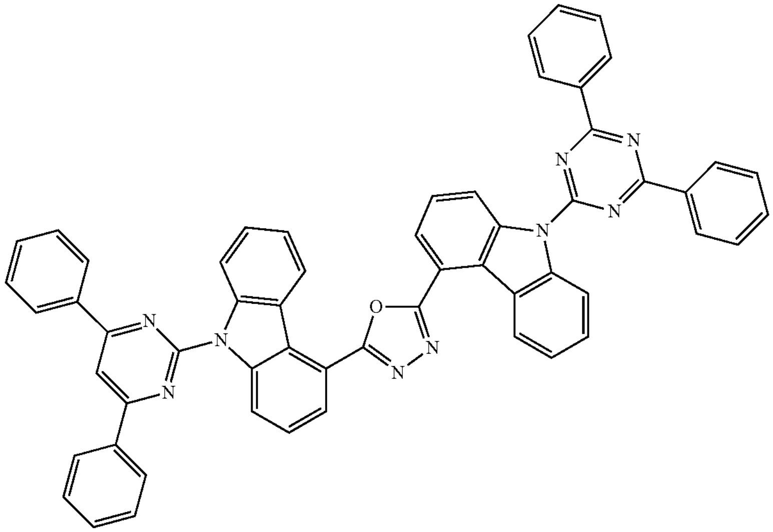
C136
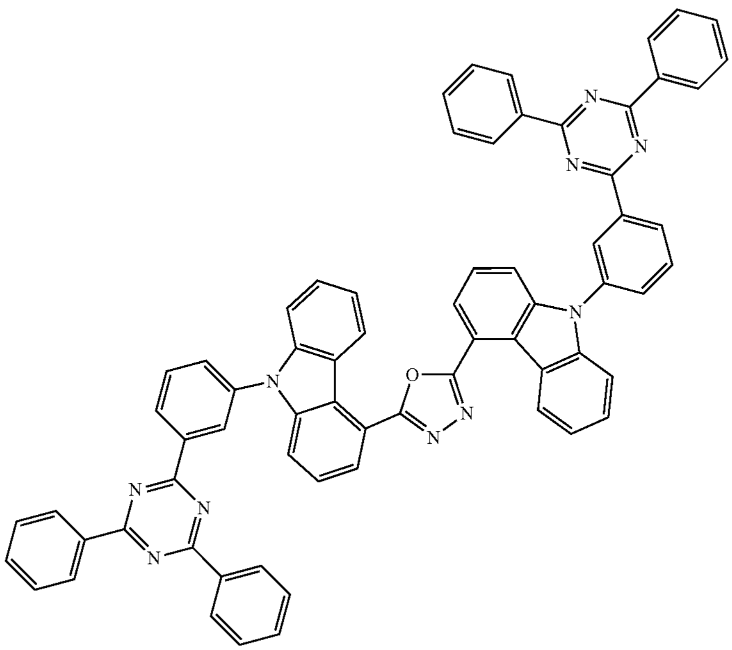
C137
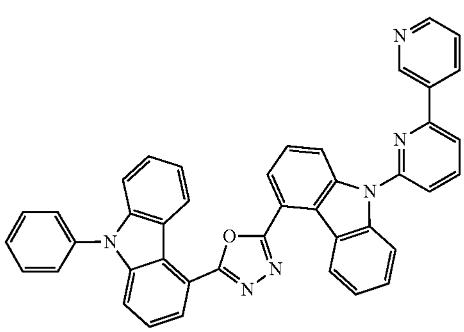
C138
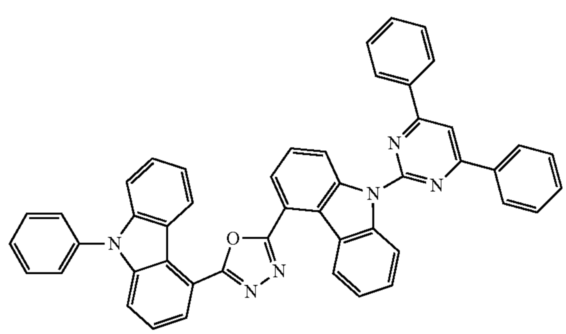

-continued
C139
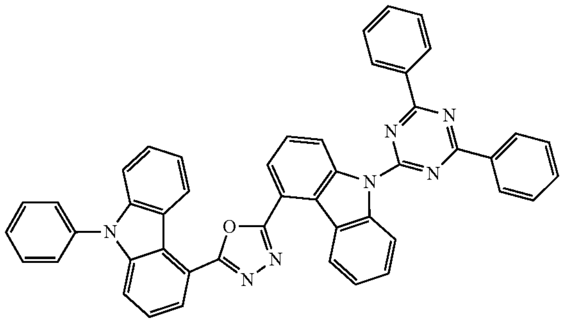
C140
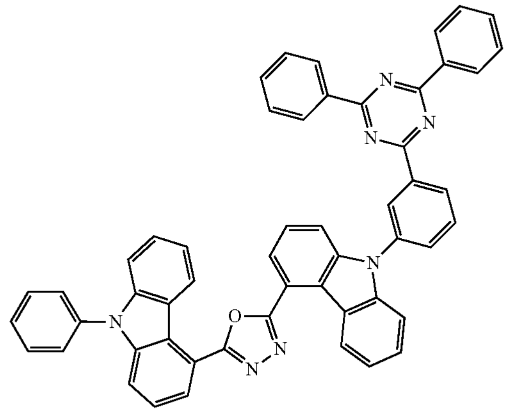
C141
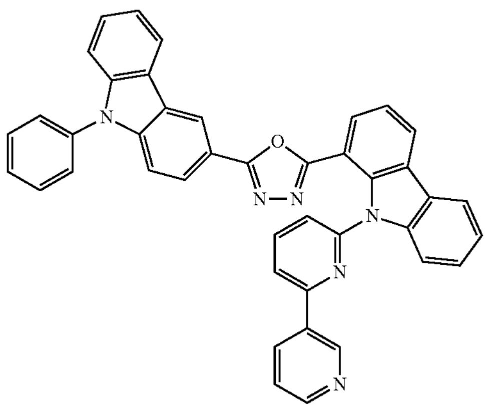
C142
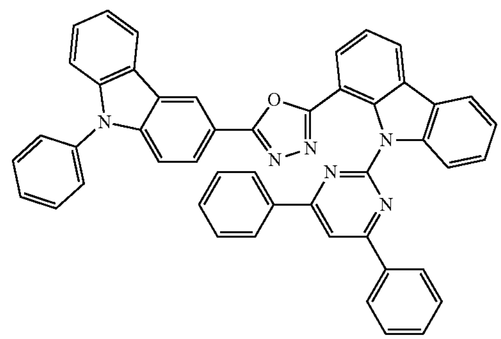
C143
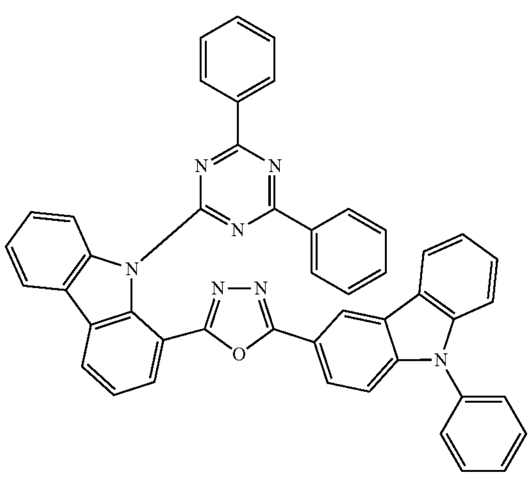
C144
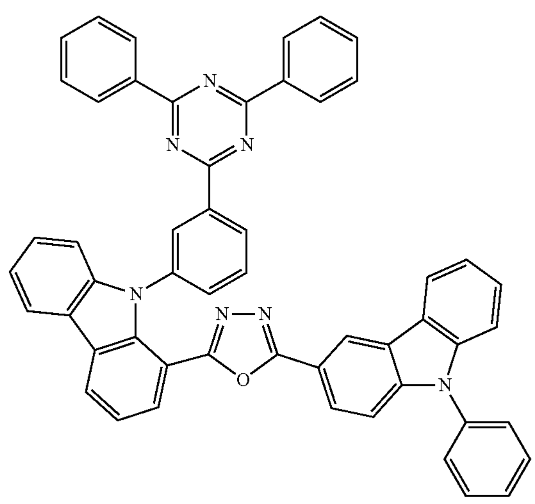

-continued
C145
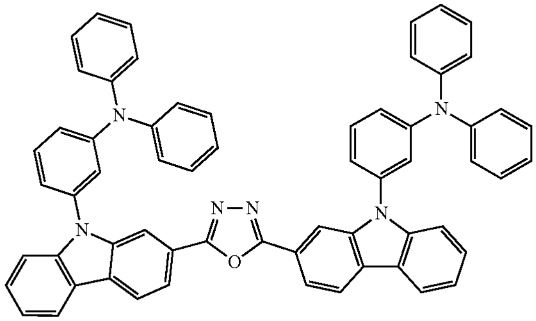
C146
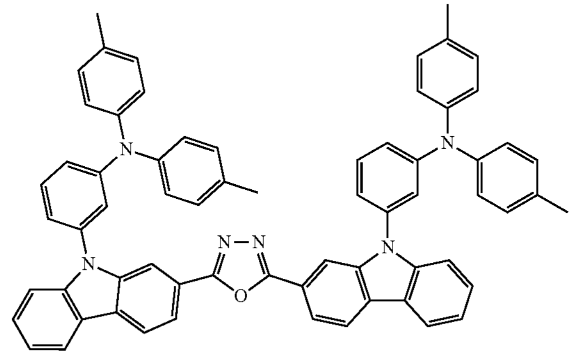
C147
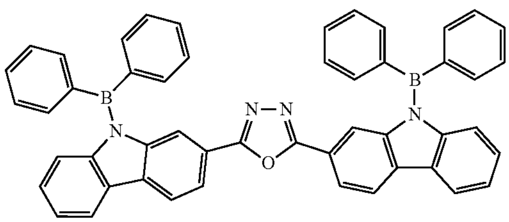
C148
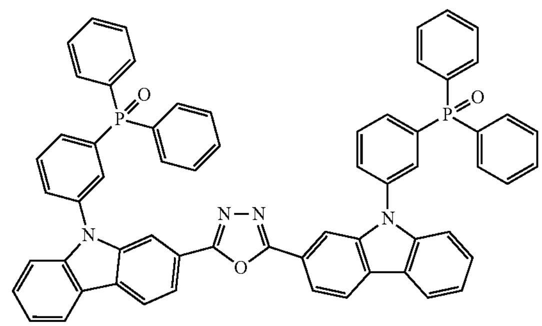
C149
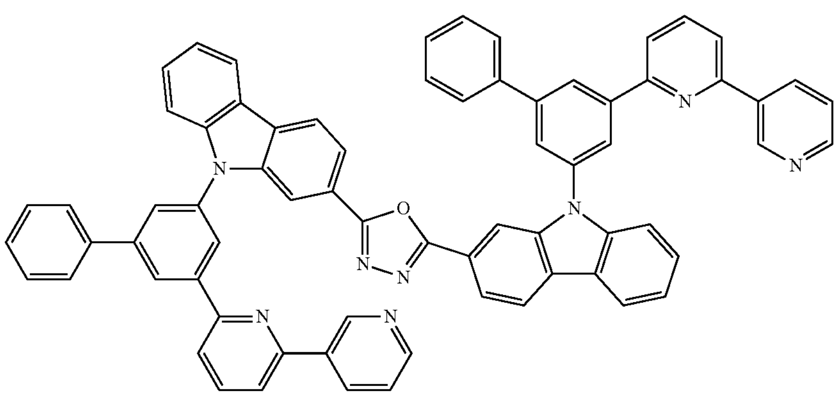
C150
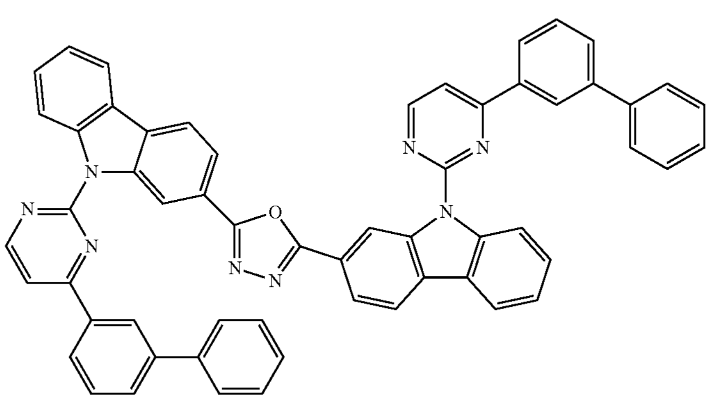

-continued
C151
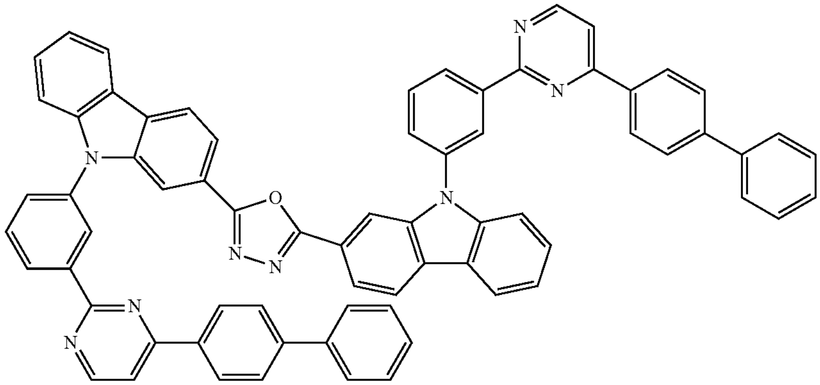
C152
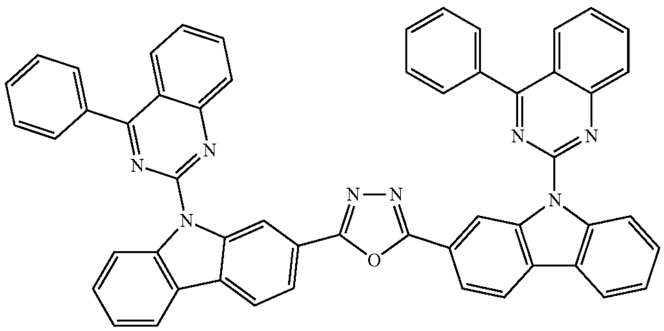
C153
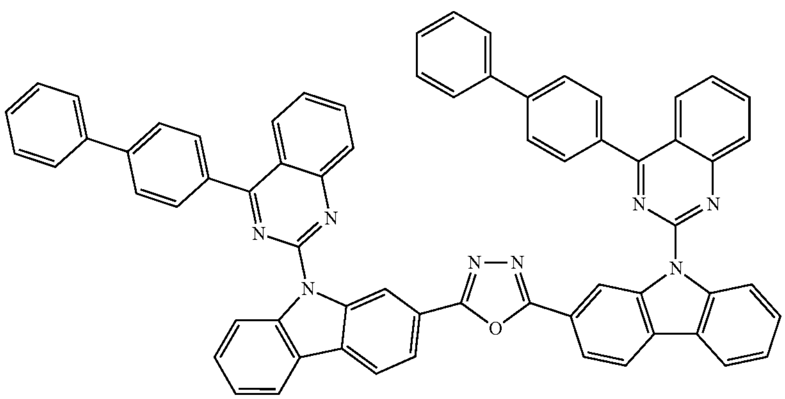
C154
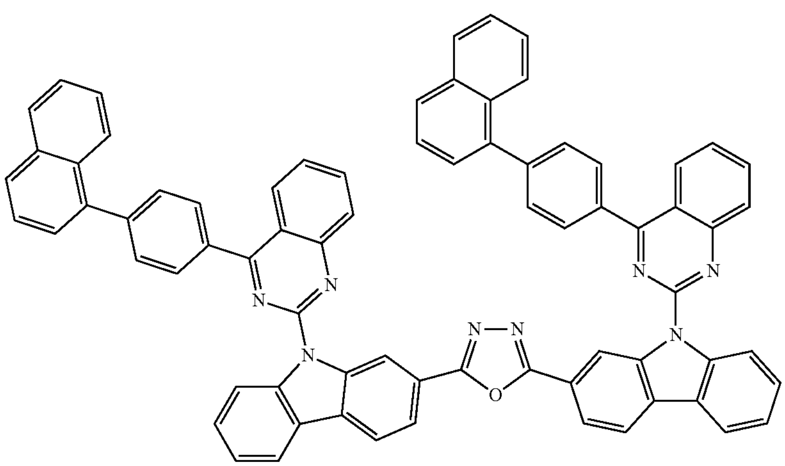

-continued
C155
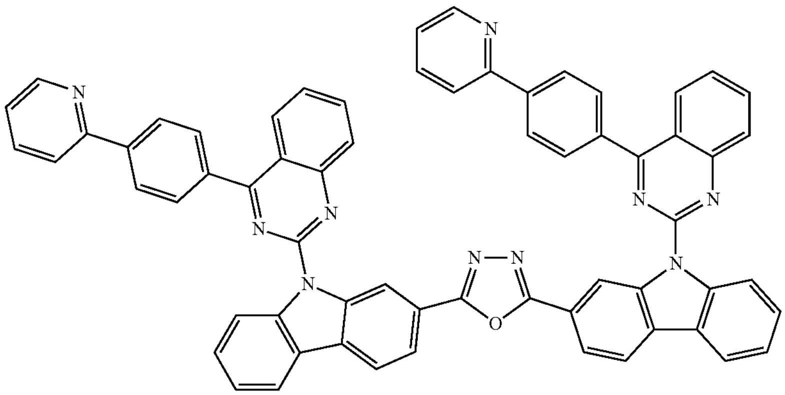
C156
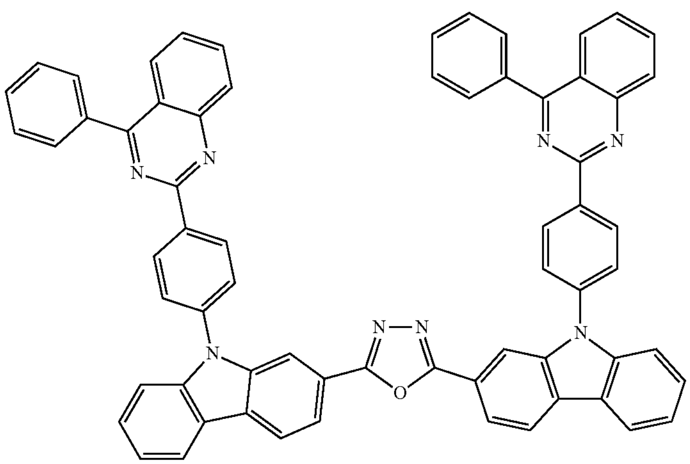
C157
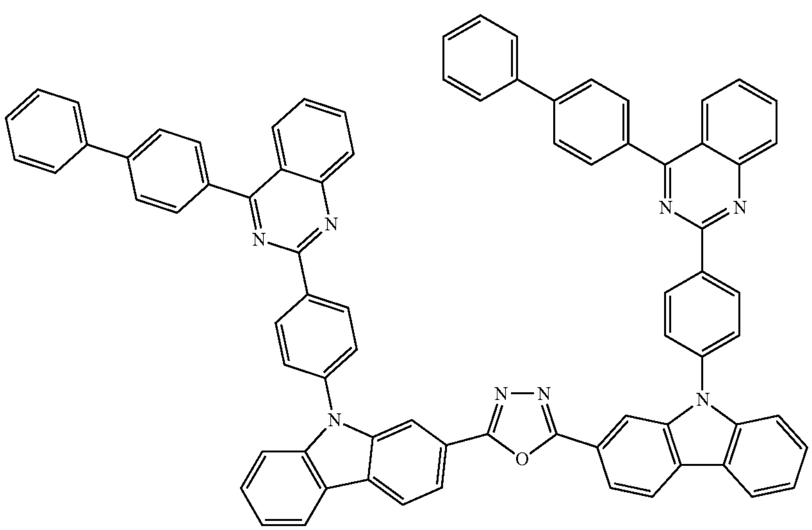

-continued
C158
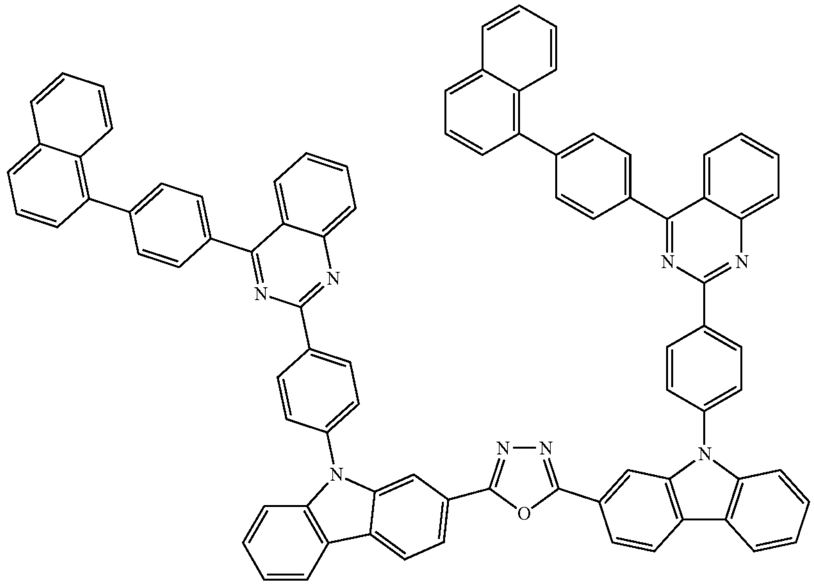
C159
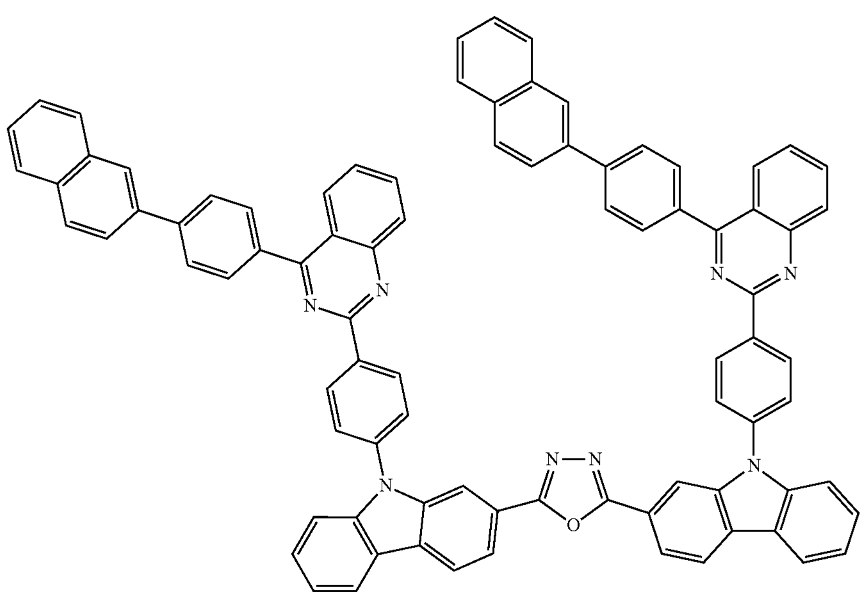

-continued
C160
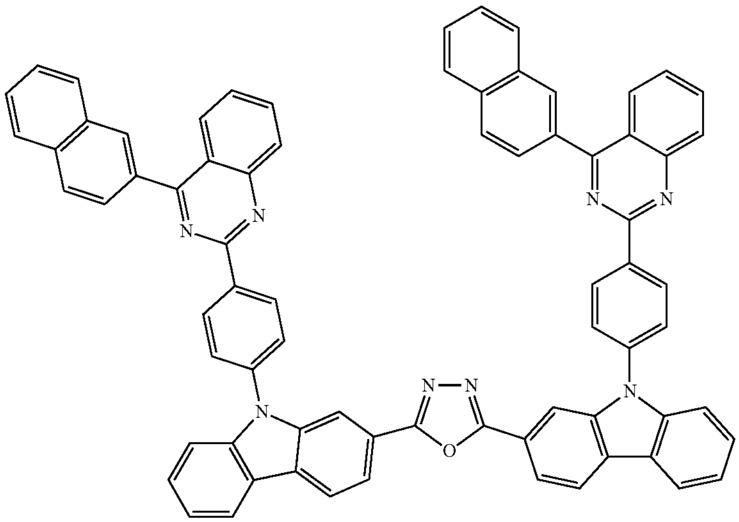
C161
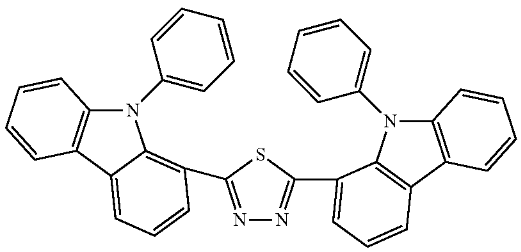
C162
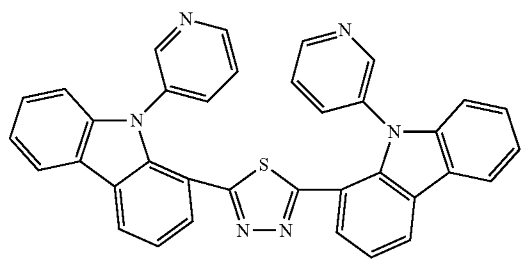
C163
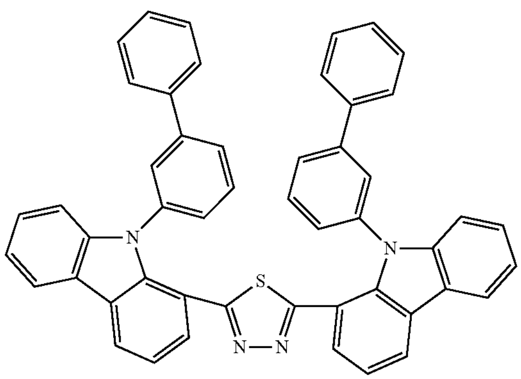
C164
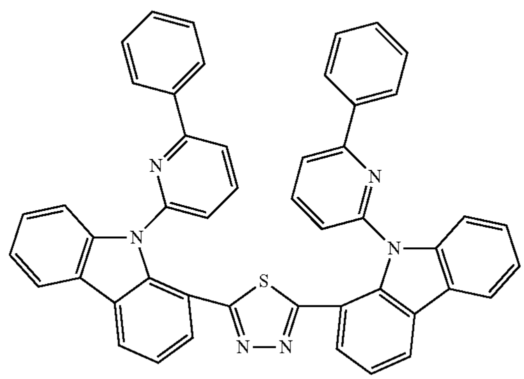
C165
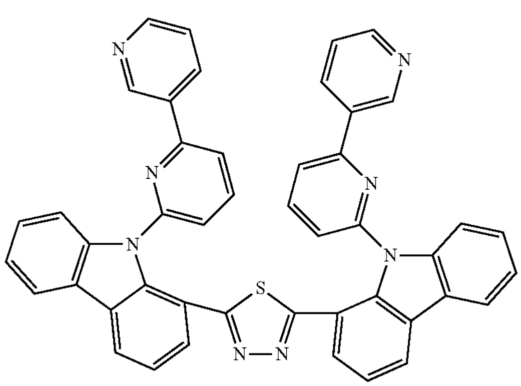
C166
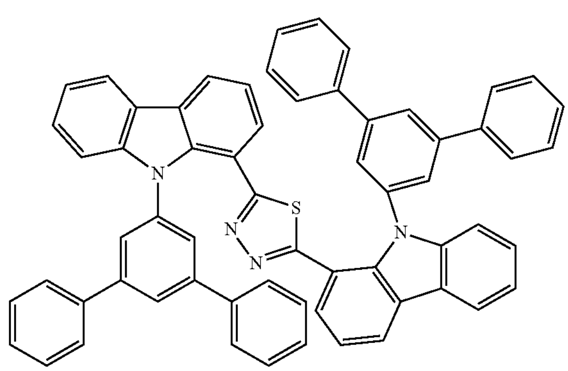

-continued
C167
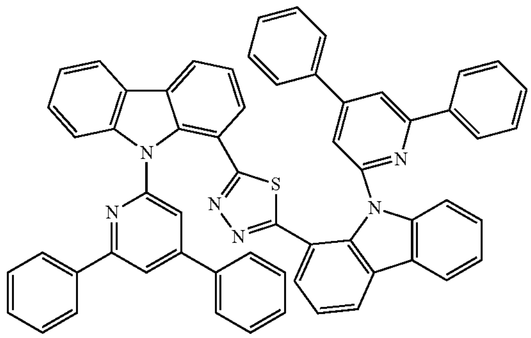
C168
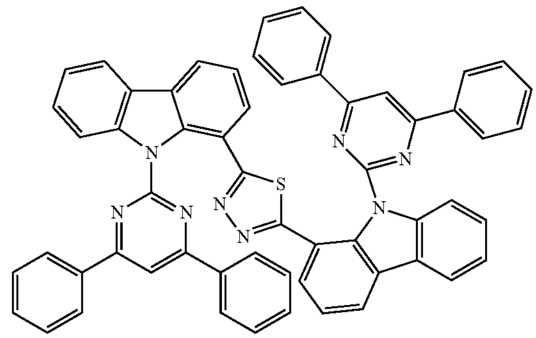
C169
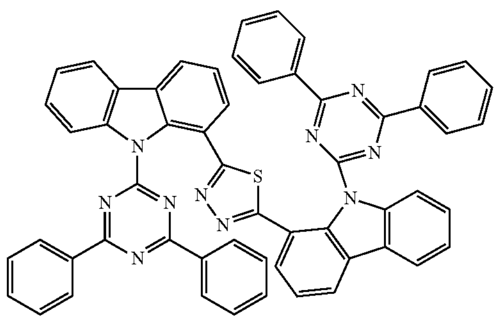
C170
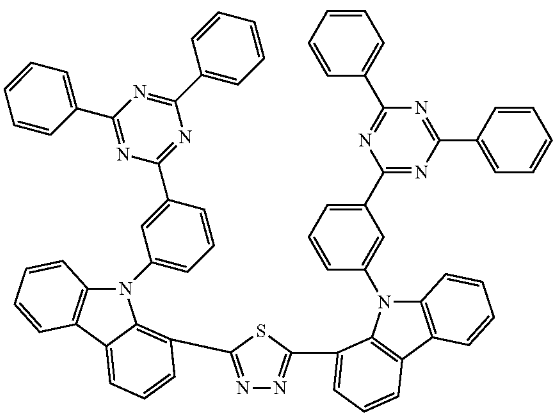
C171
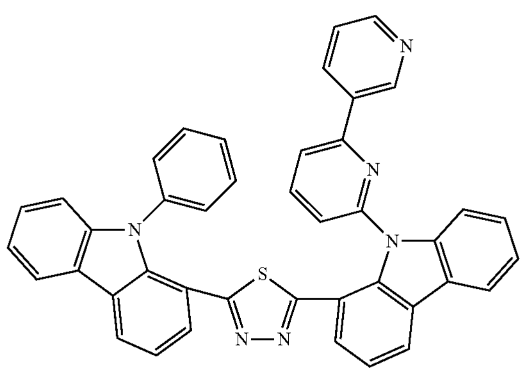
C172
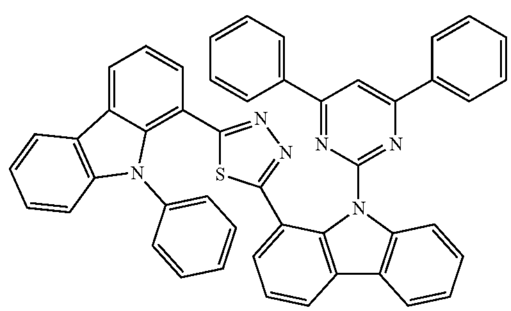
C173
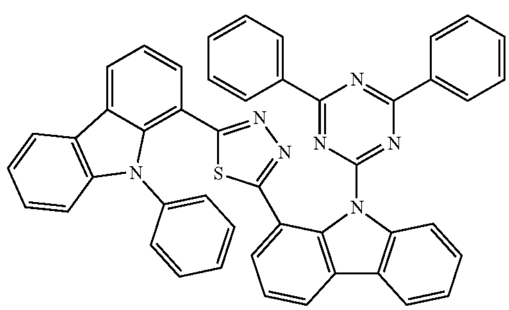
C174
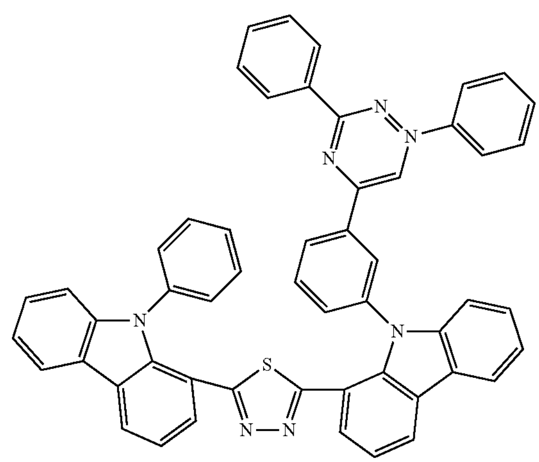

-continued
C175
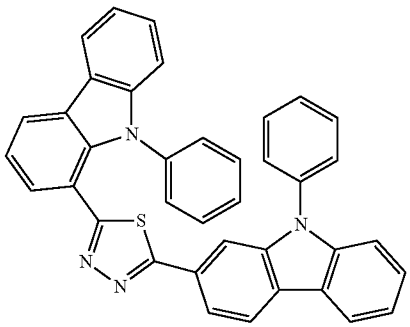
C176
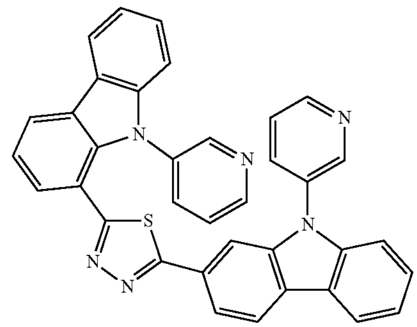
C177
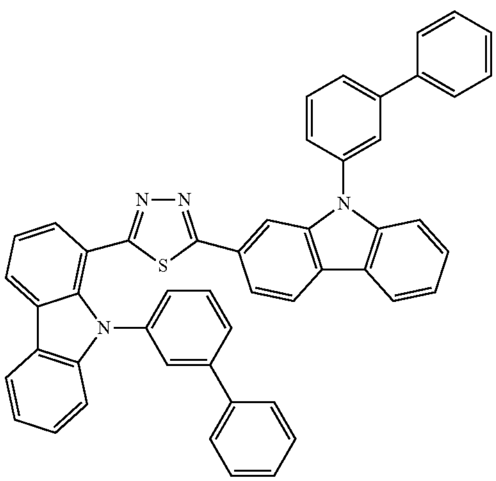
C178
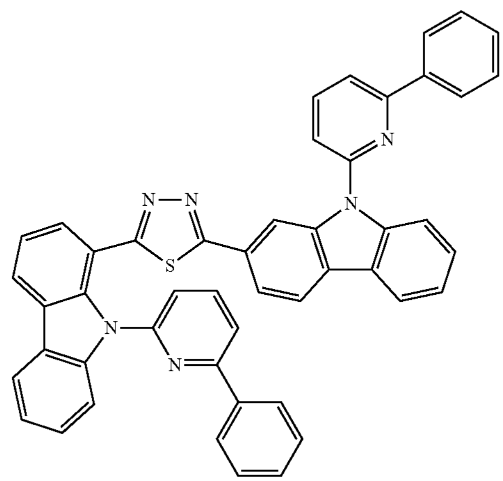
C179
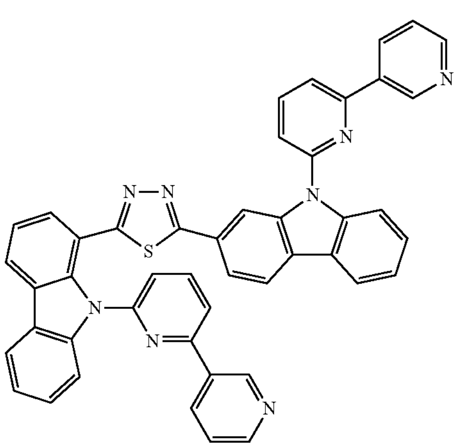
C180
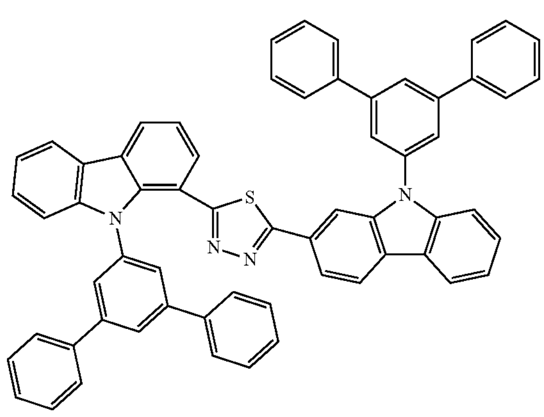

-continued
C181
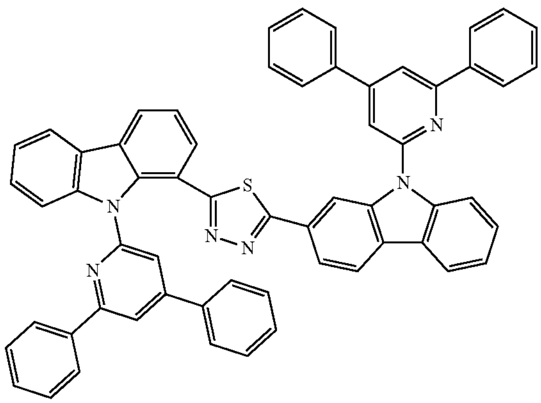
C182
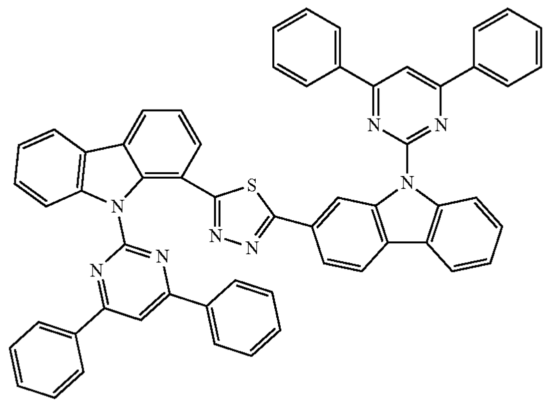
C183
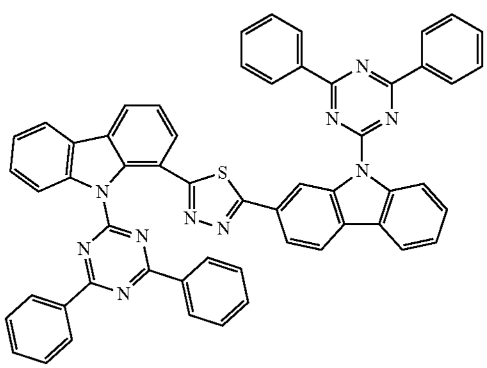
C184
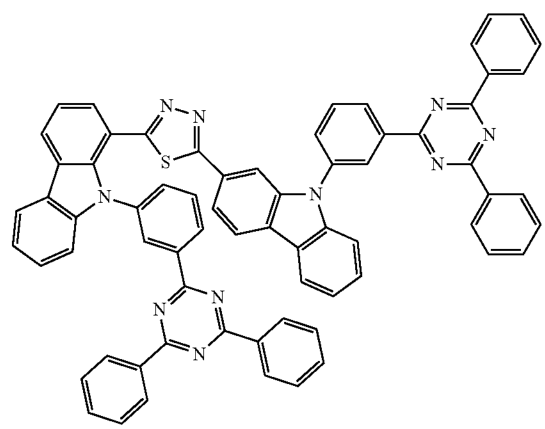
C185
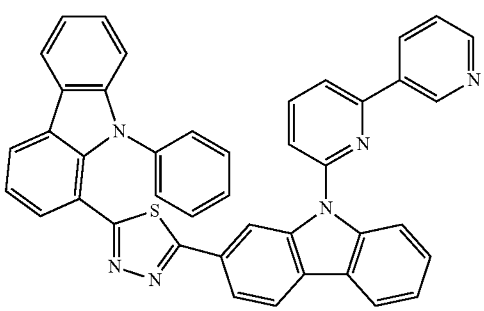
C186
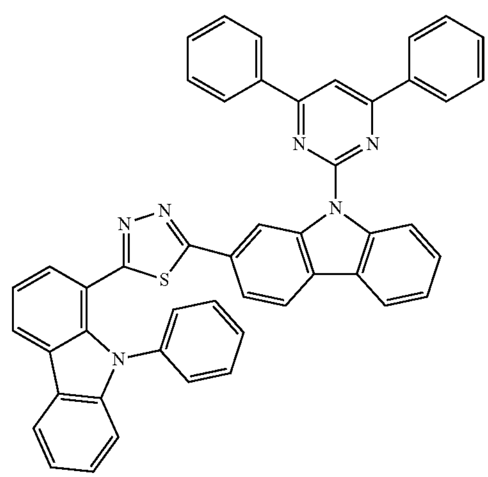

-continued
C187
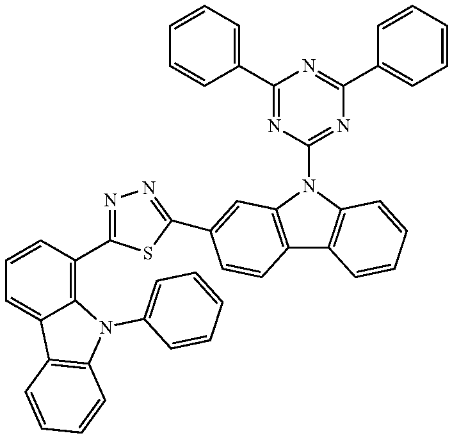
C188
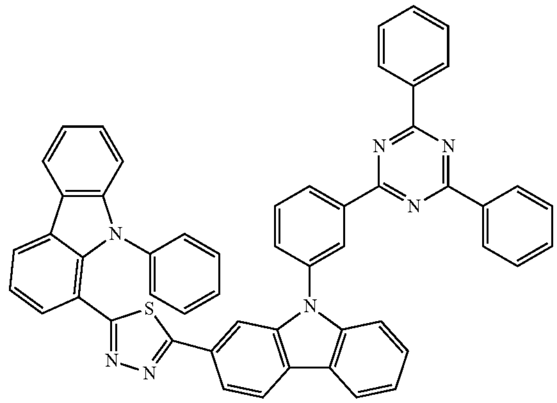
C189
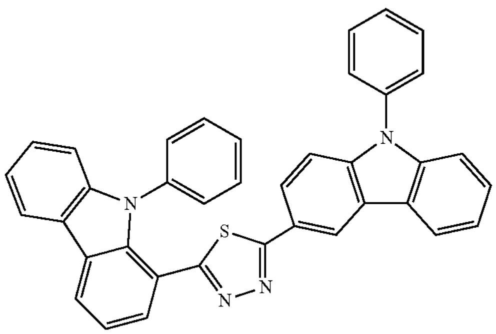
C190
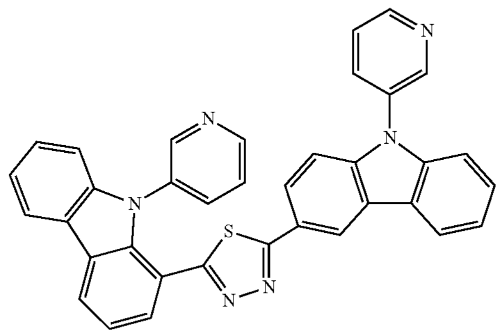
C191
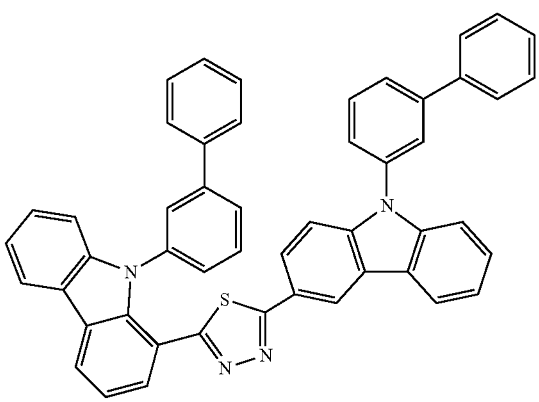
C192
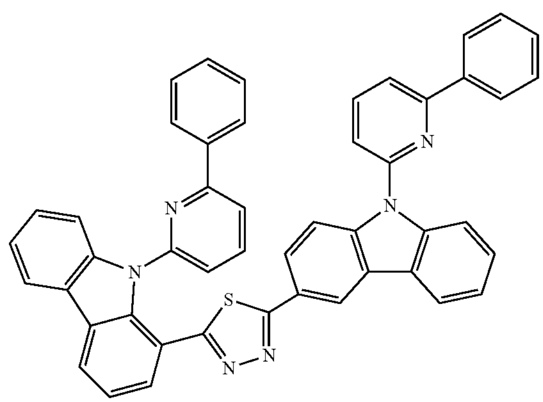
C193
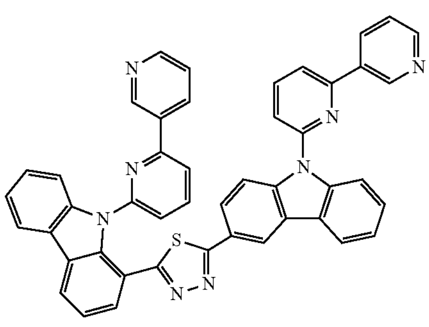
C194
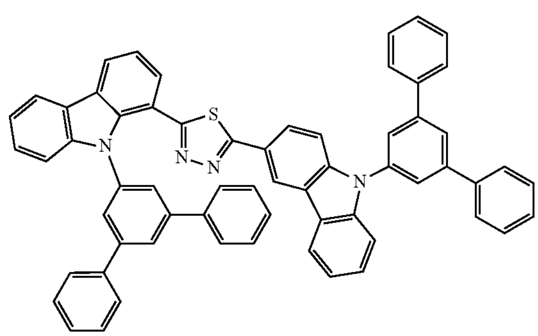

-continued
C195
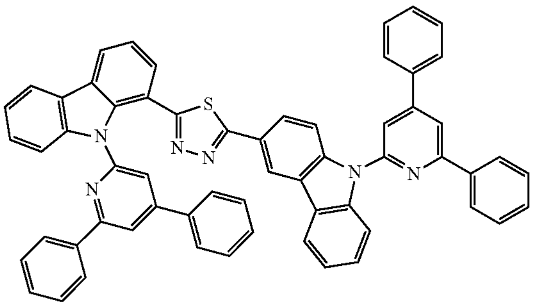
C196
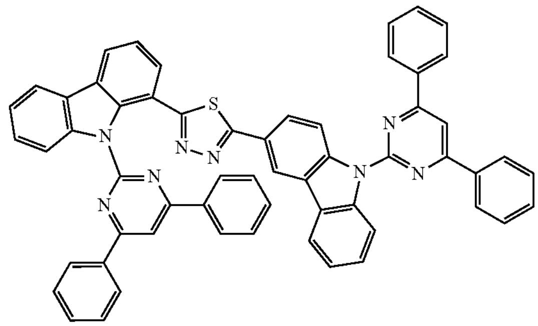
C197
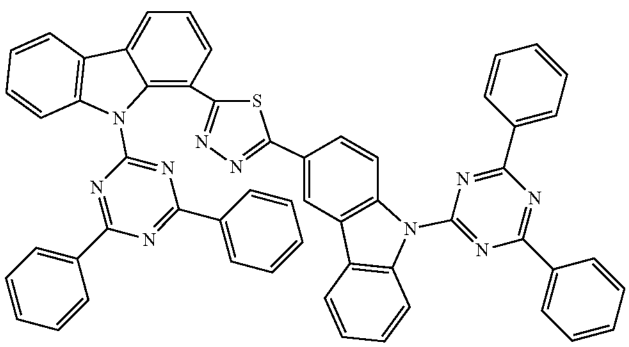
C198
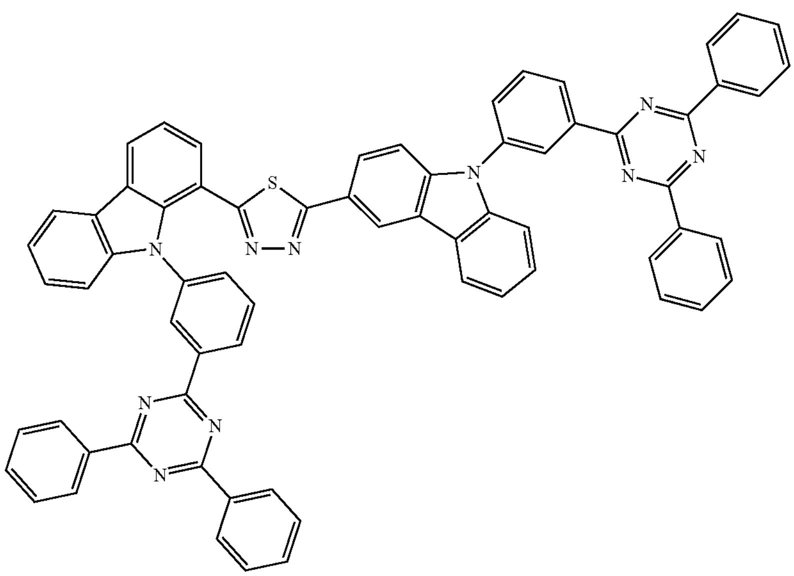

-continued
C199
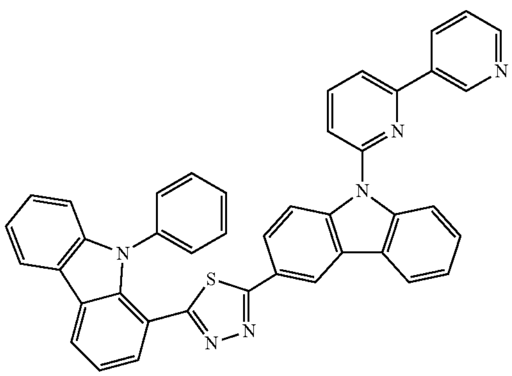
C200
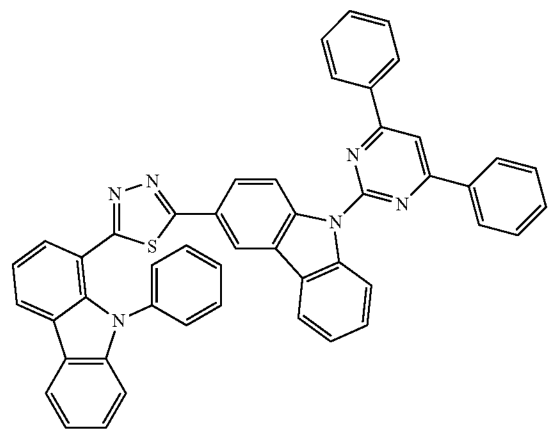
C201
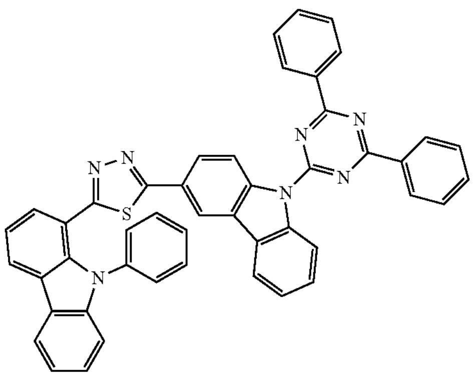
C202
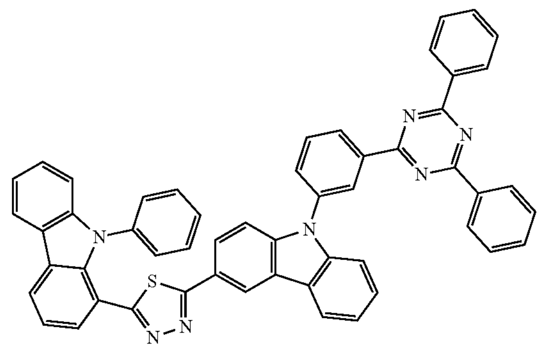
C203
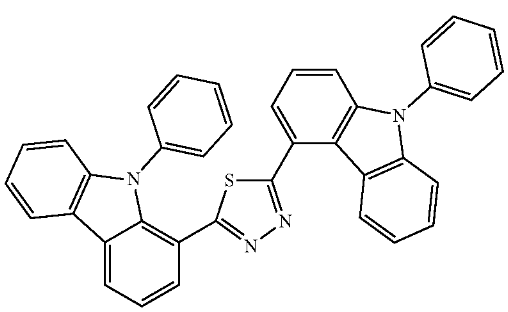
C204
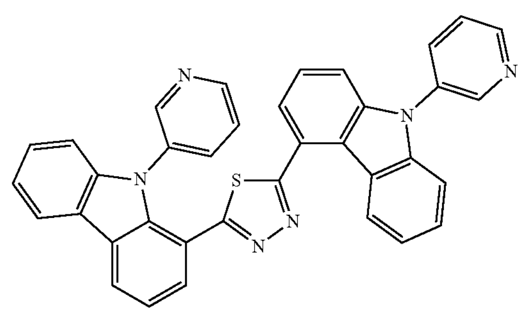
C205
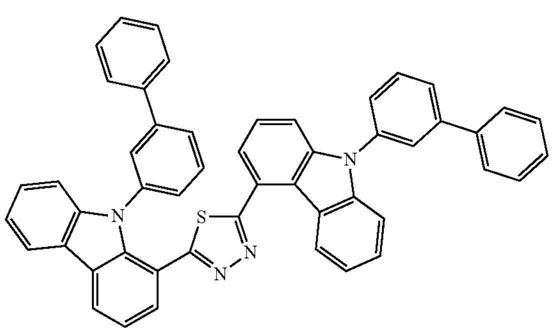
C206
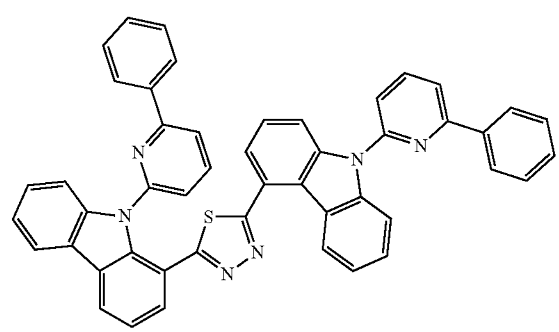

-continued
C207
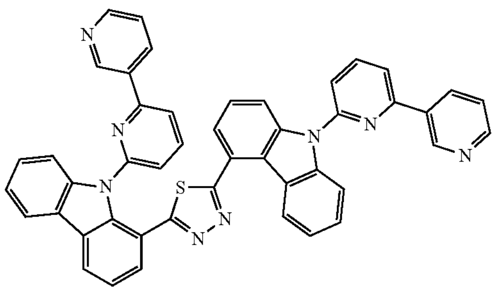
C208
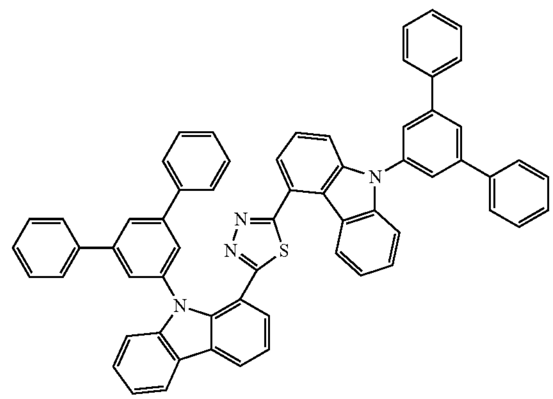
C209
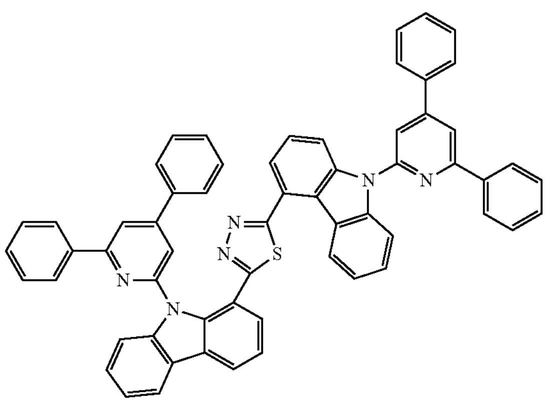
C210
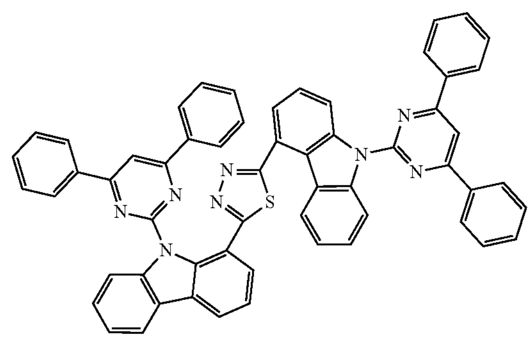
C211
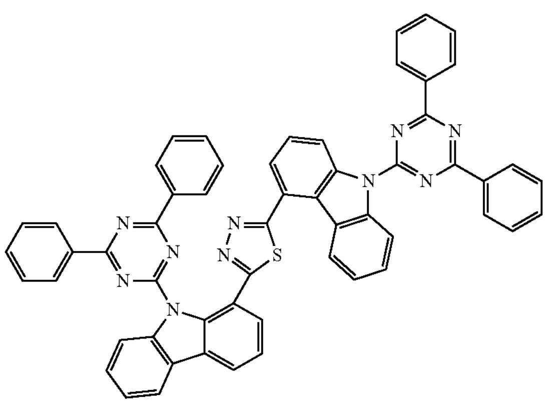
C212
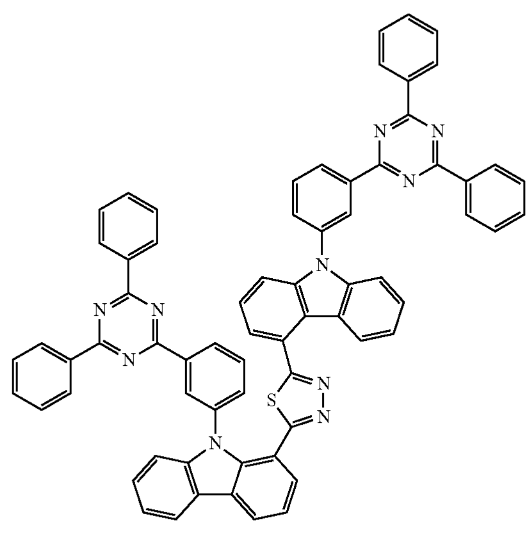

-continued
C213
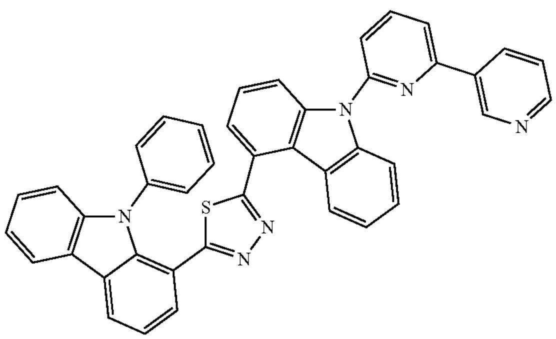
C214
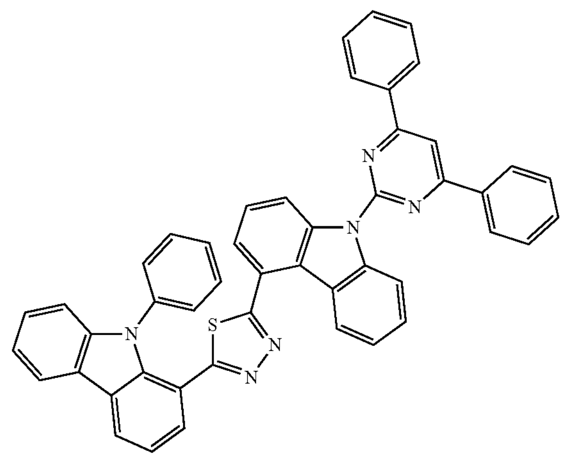
C215
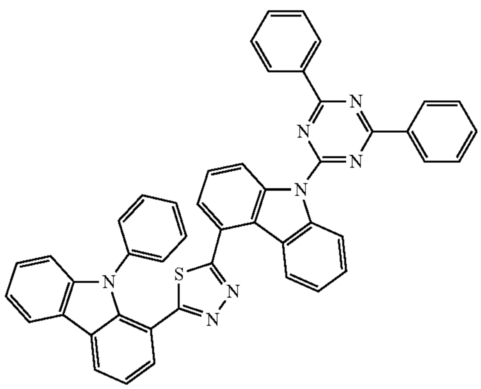
C216
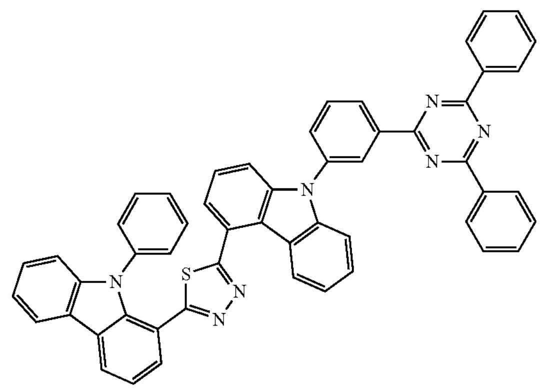
C217
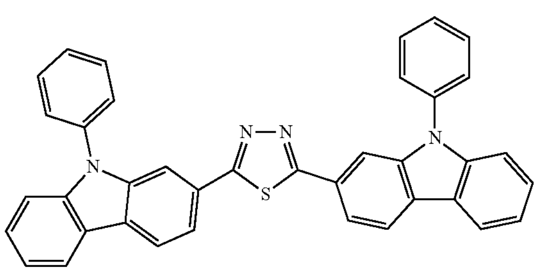
C218
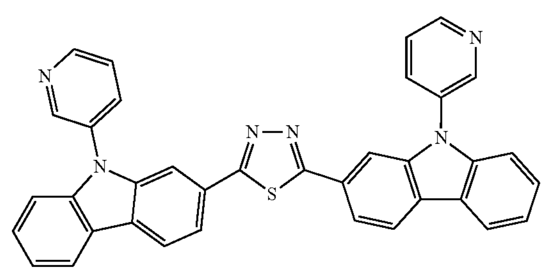
C219
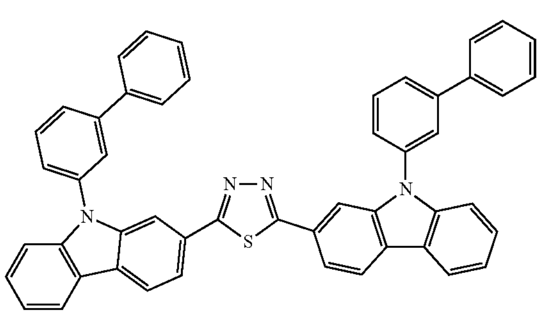
C220
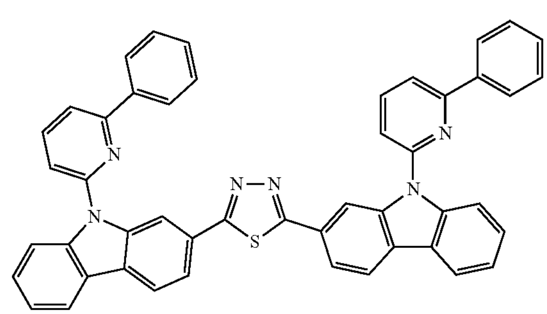

-continued
C221
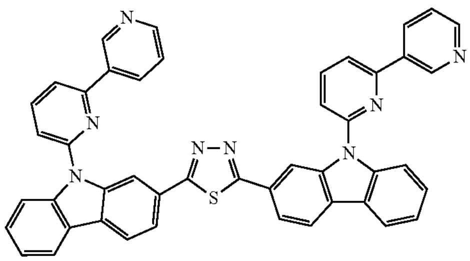
C222
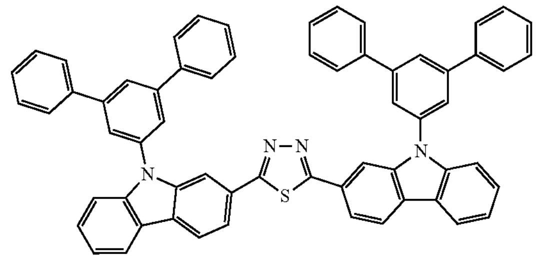
C223
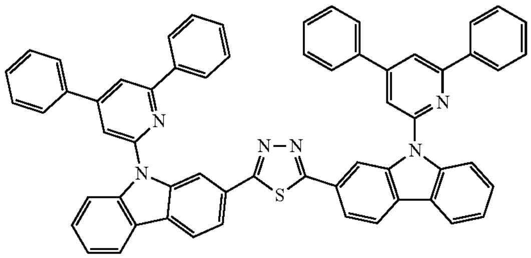
C224
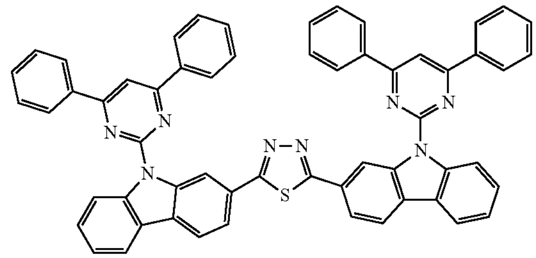
C225
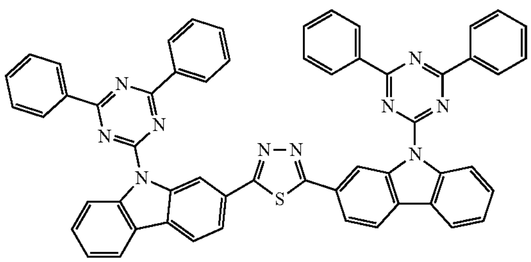
C226
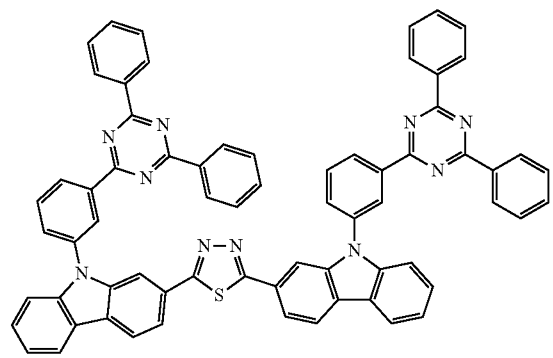
C227
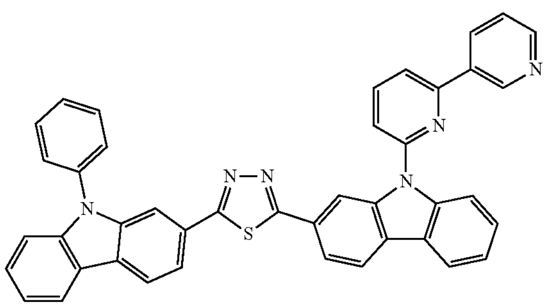
C228
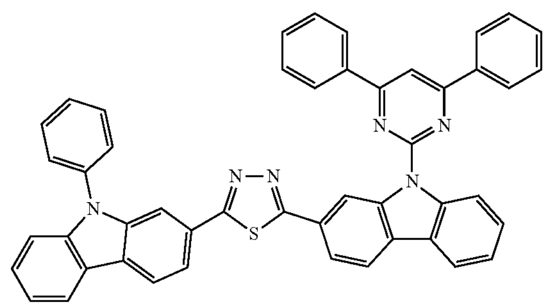
C229
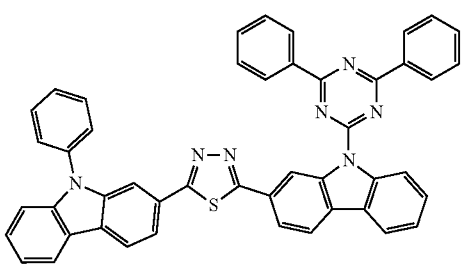
C230
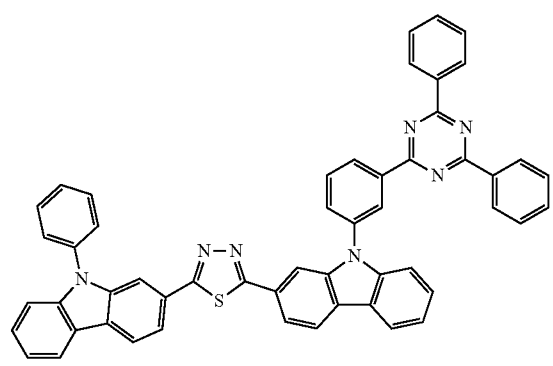

-continued
C231
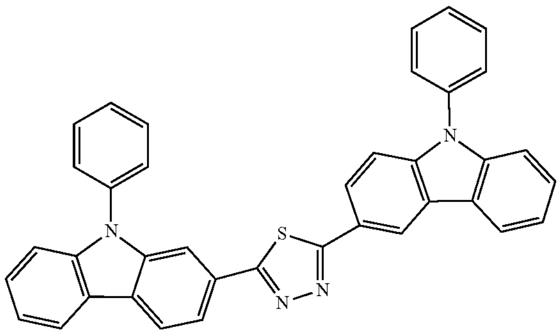
C232
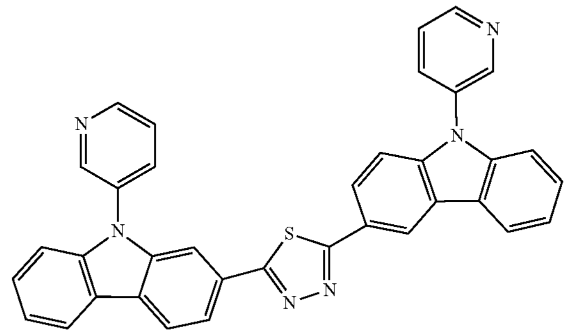
C233
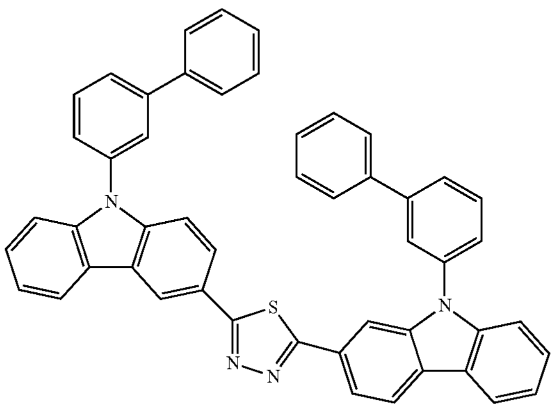
C234
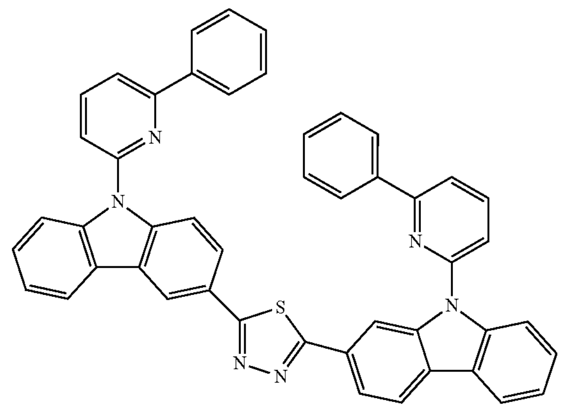
C235
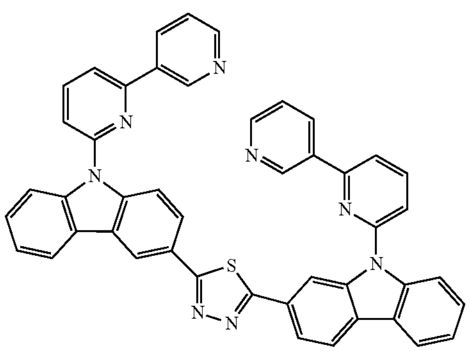
C236
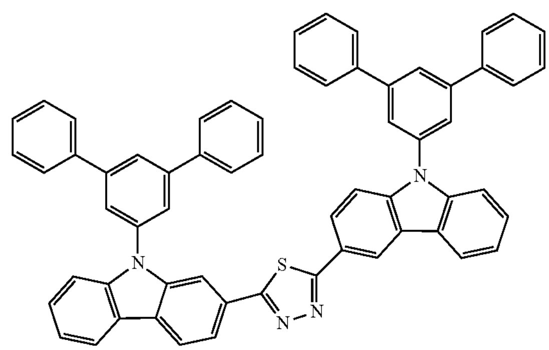
C237
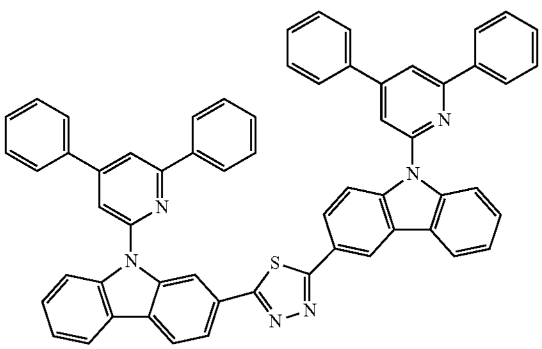
C238
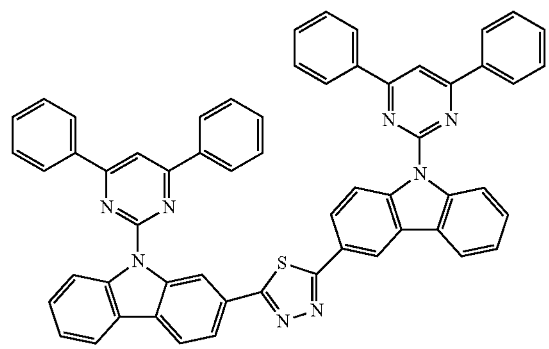

-continued
C239
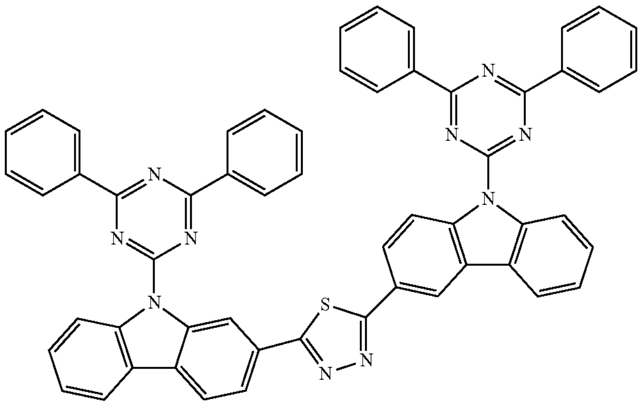
C240
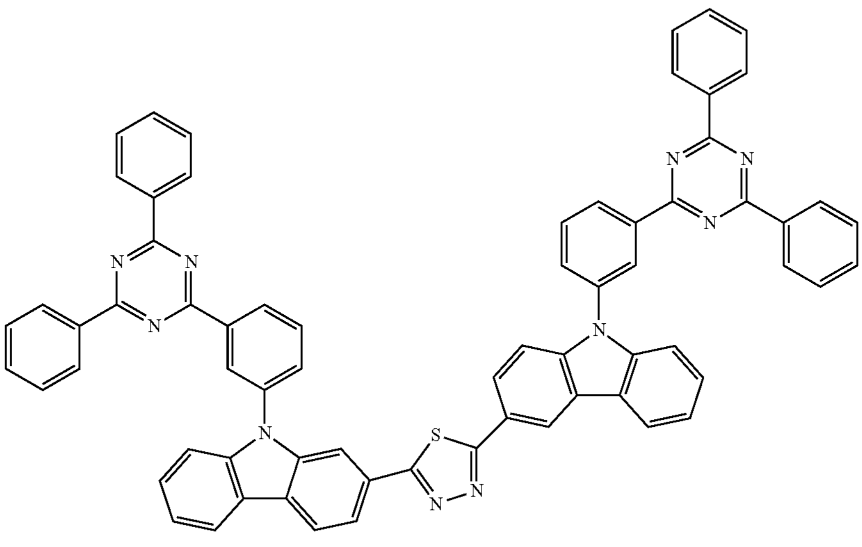
C241
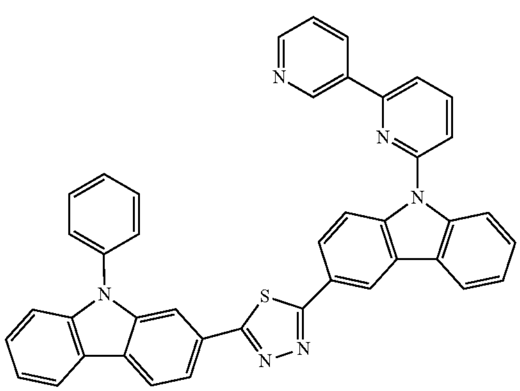
C242
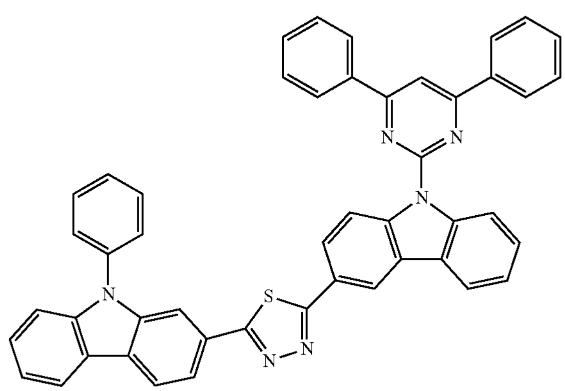

-continued
C243
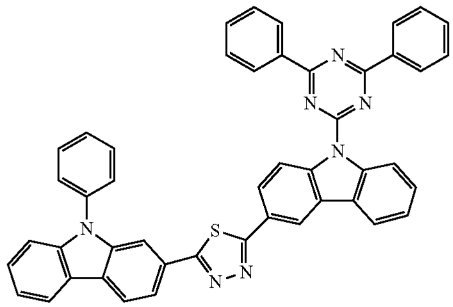
C244
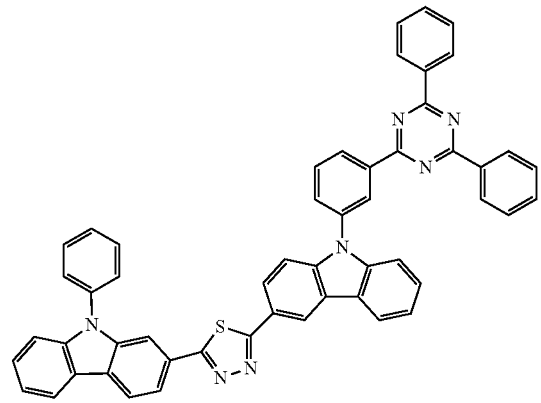
C245
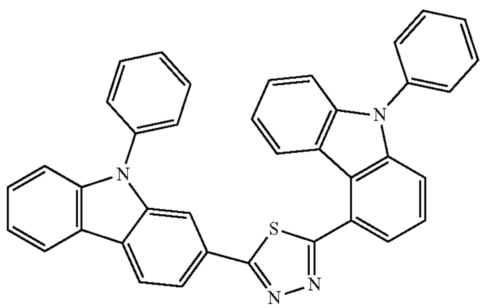
C246
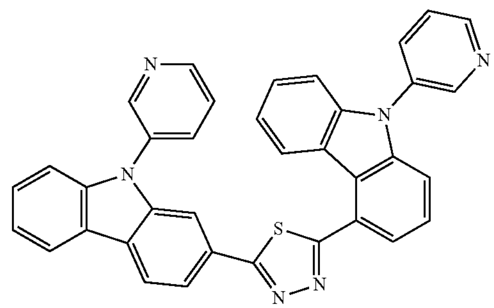
C247
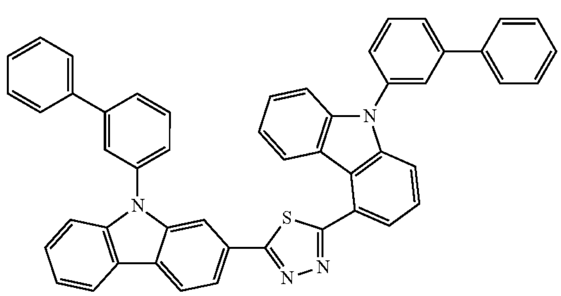
C248
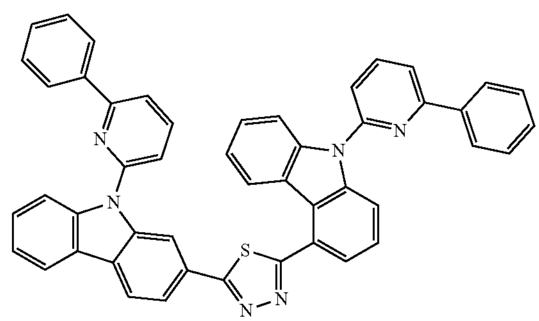
C249
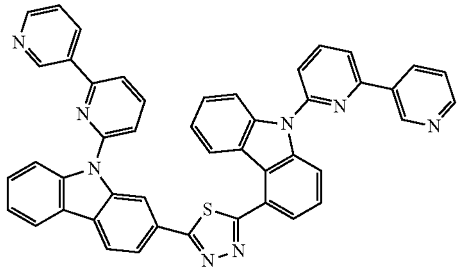
C250
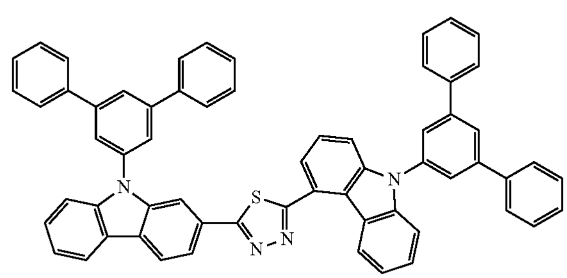

-continued
C251
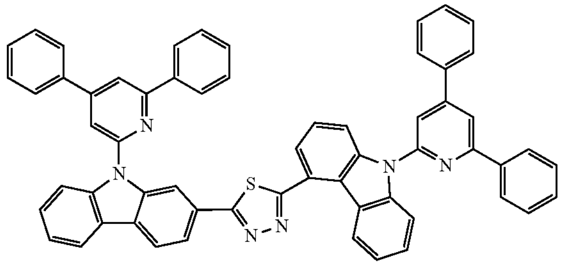
C252
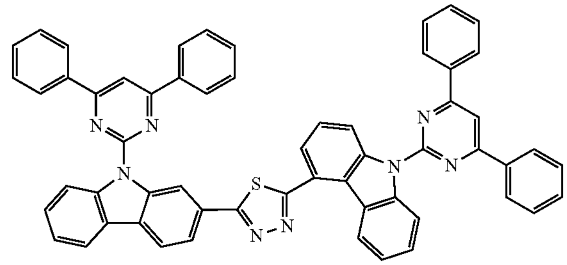
C253
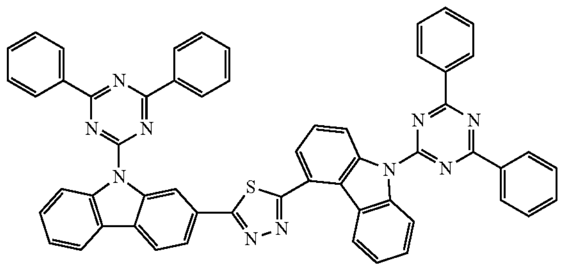
C254
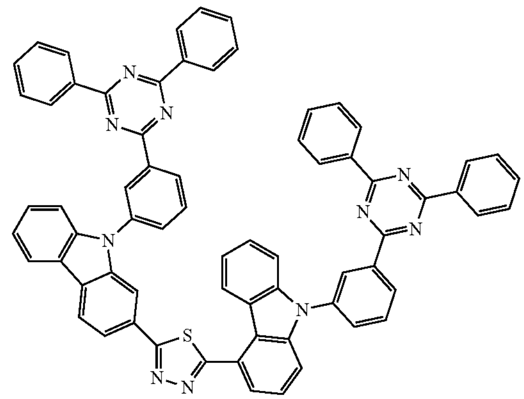
C255
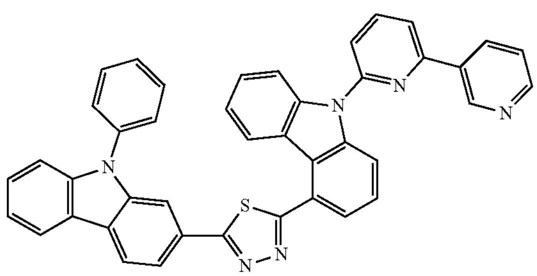
C256
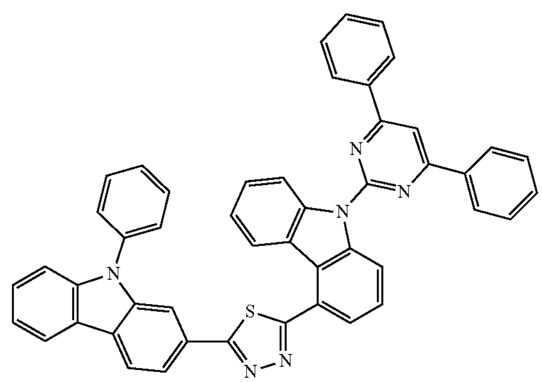
C257
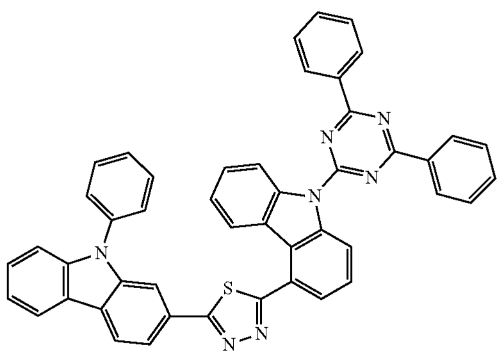
C258
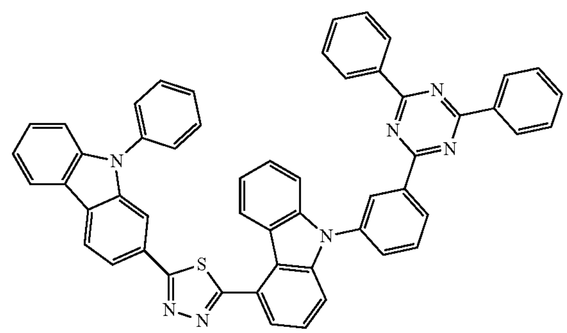

-continued
C259
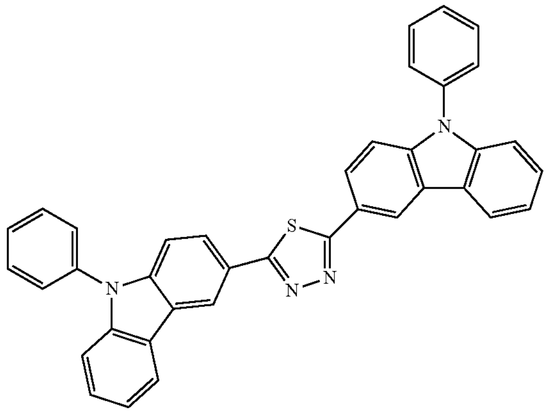
C260
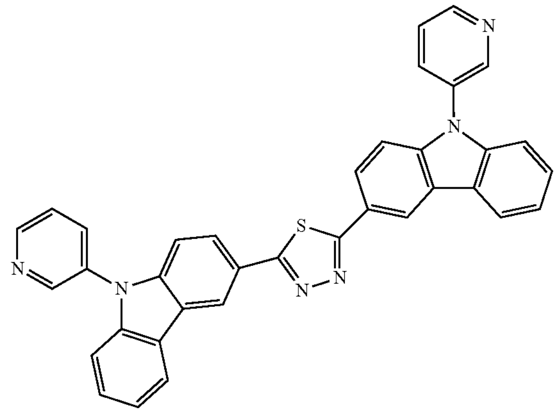
C261
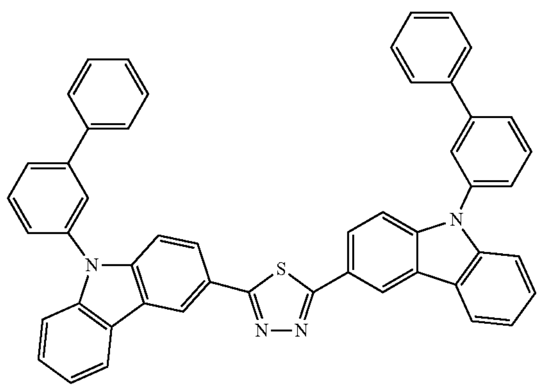
C262
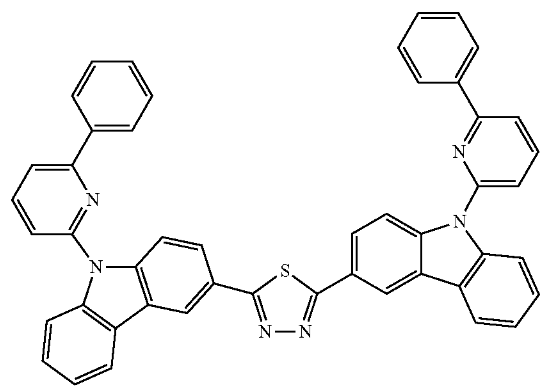
C263
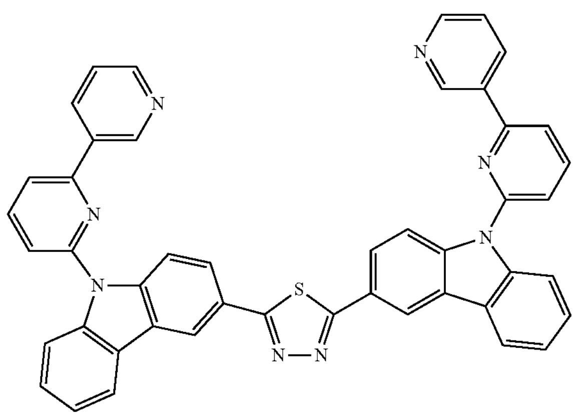
C264
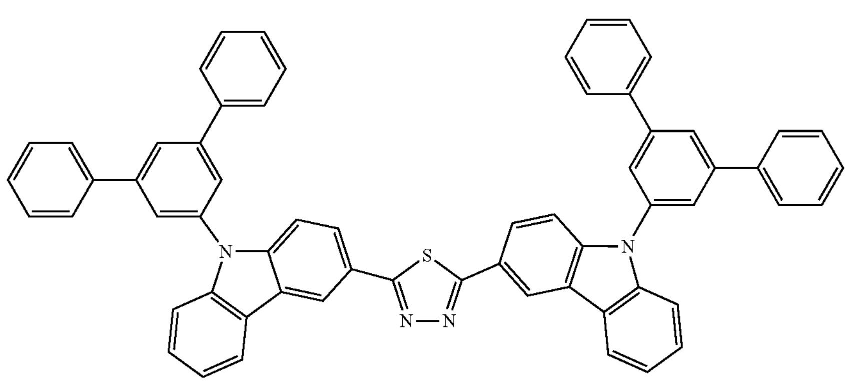

-continued
C265
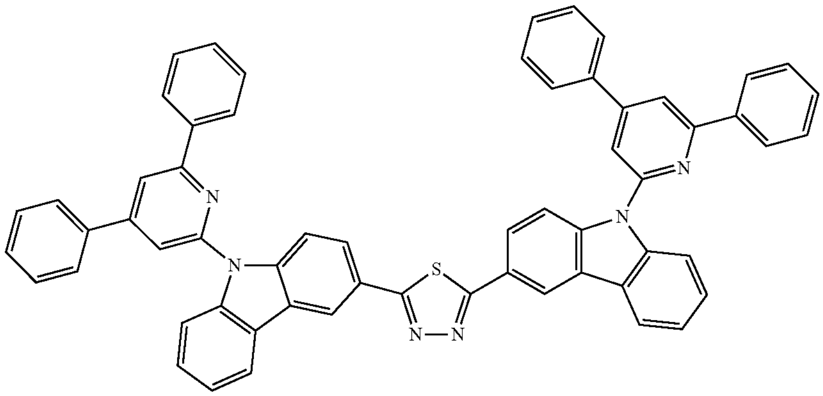
C266
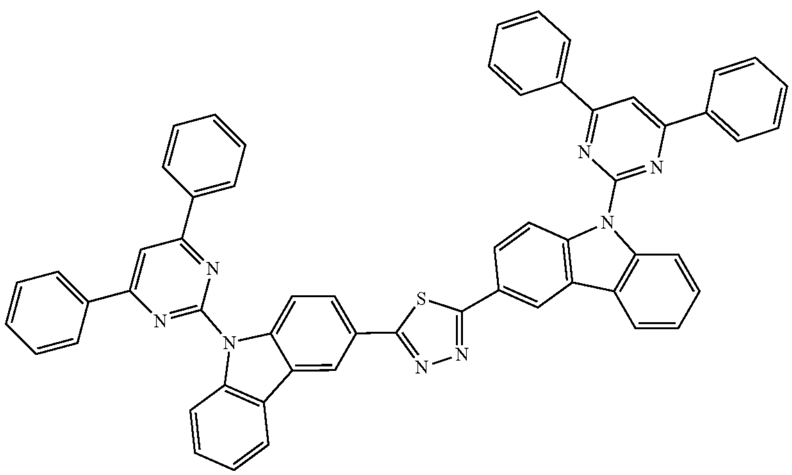
C267
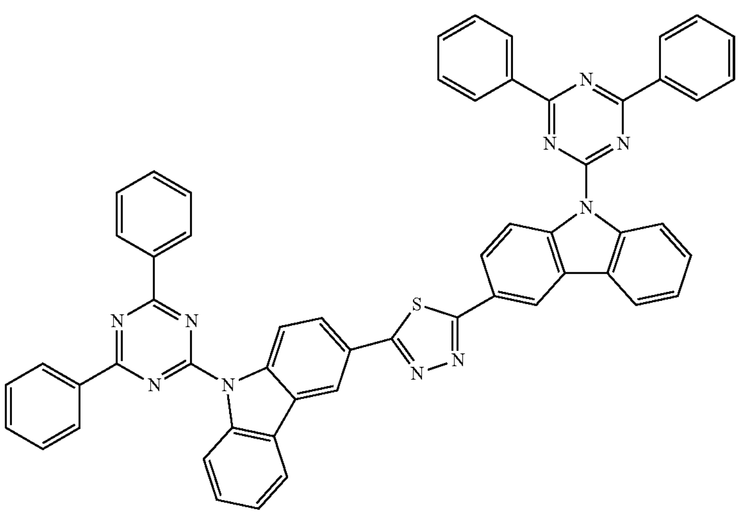

-continued
C268
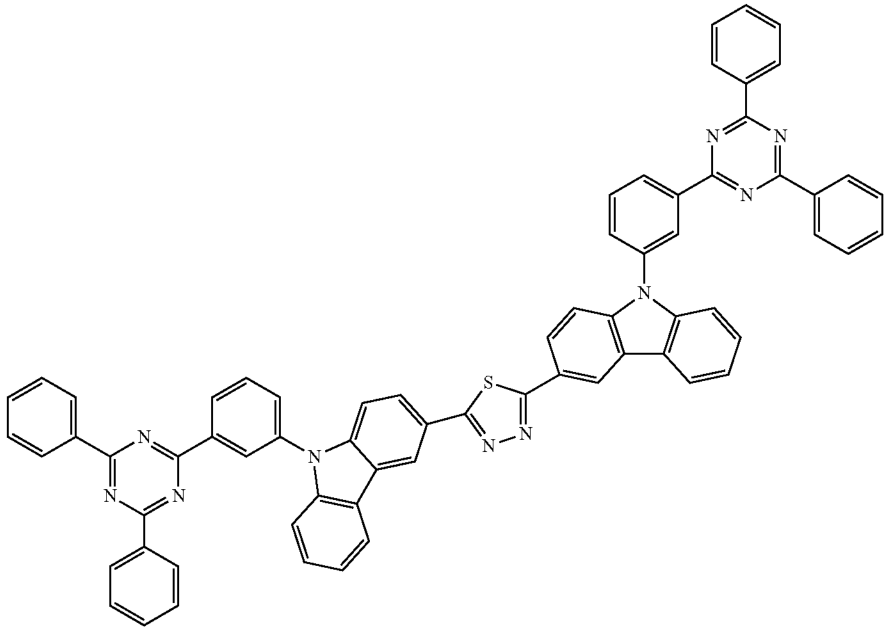
C269
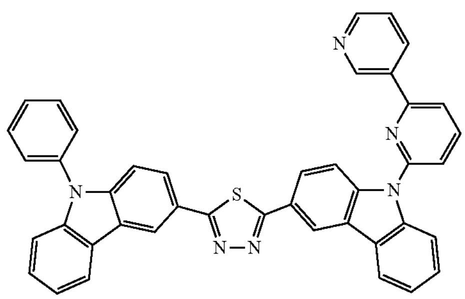
C270
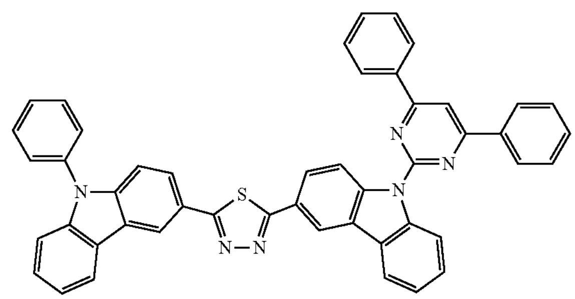
C271
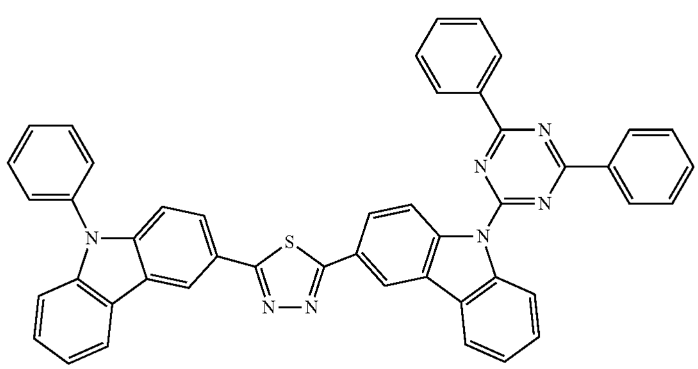

-continued
C272
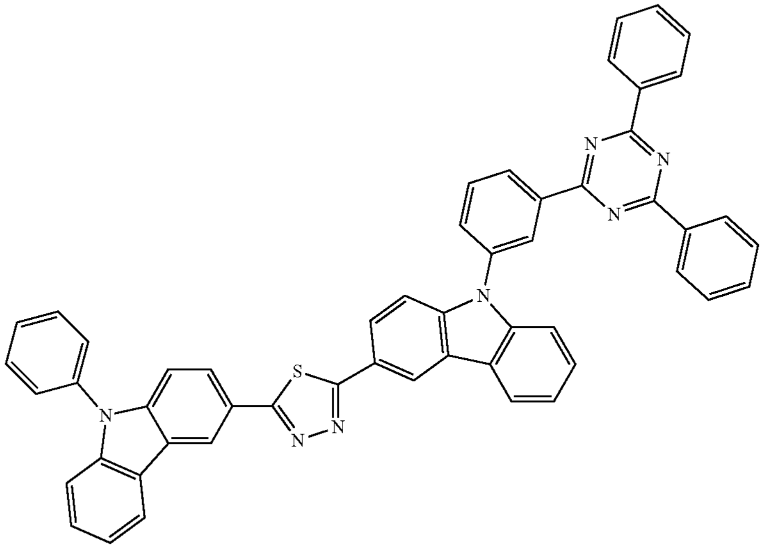
C273
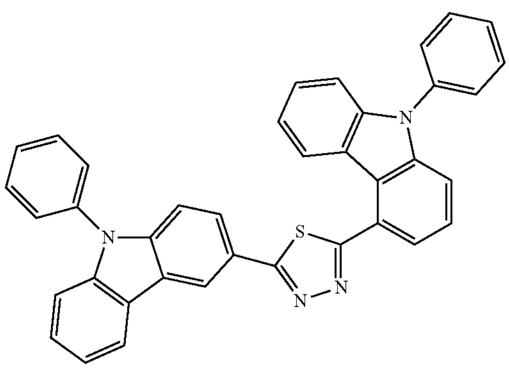
C274
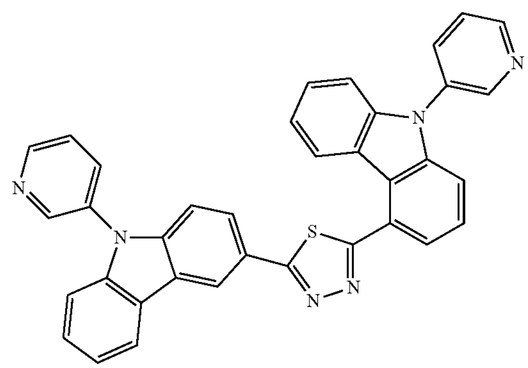
C275
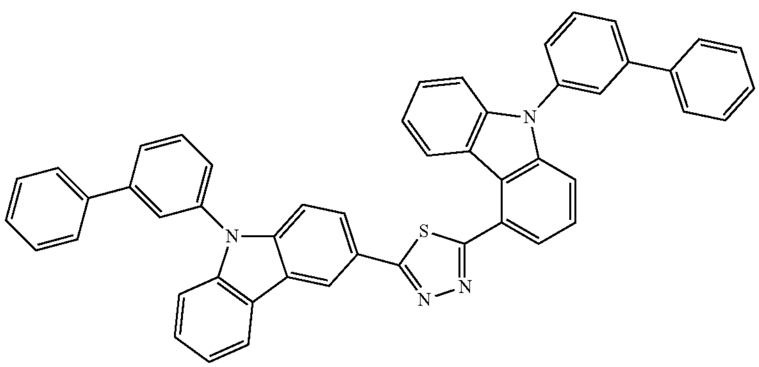
C276
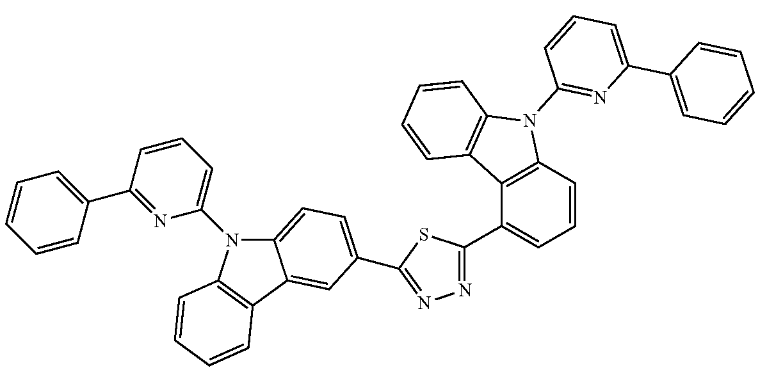

-continued
C277
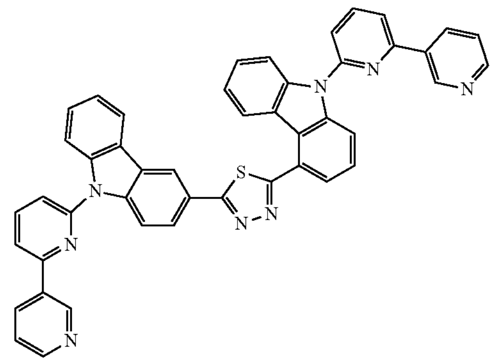
C278
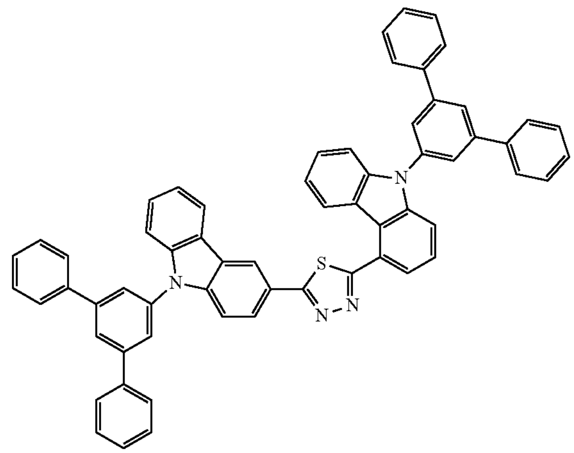
C279
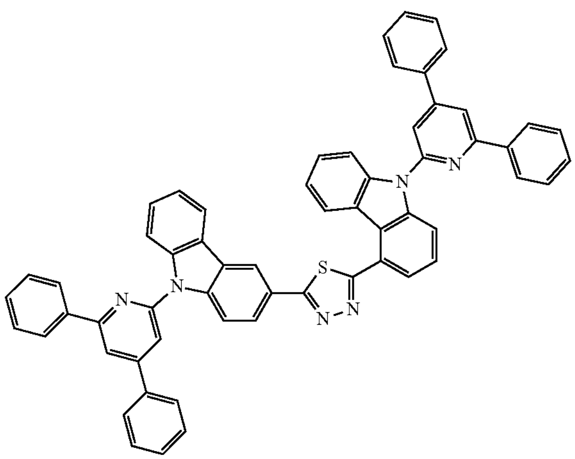
C280
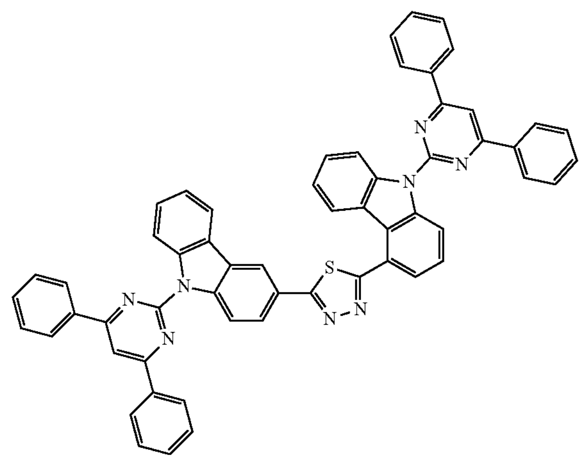
C281
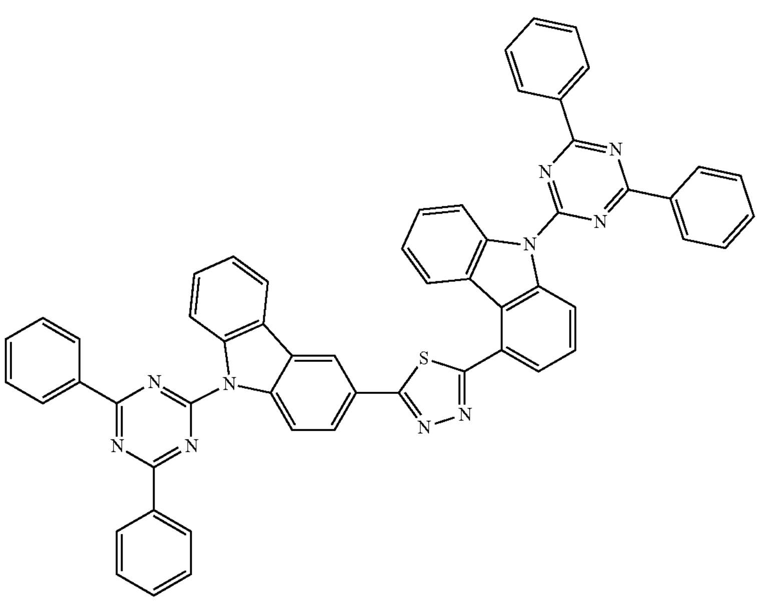

-continued
C282
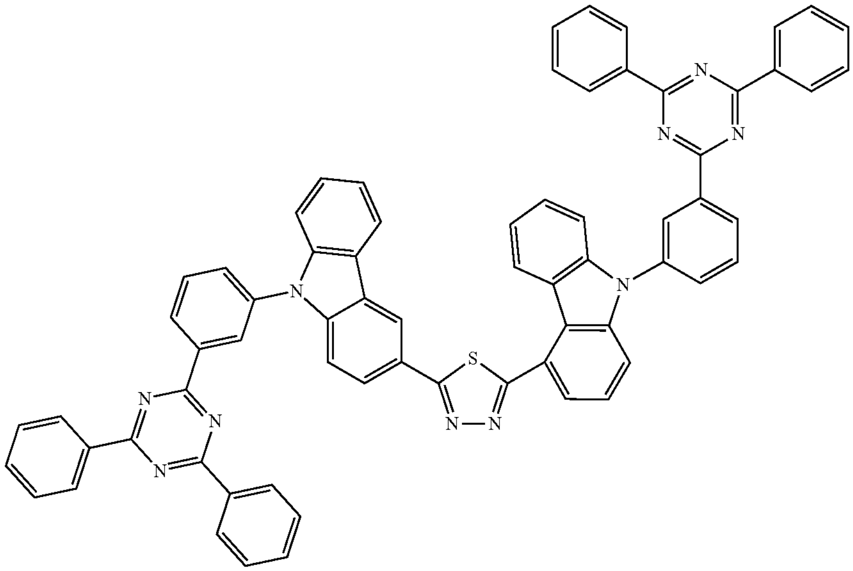
C283
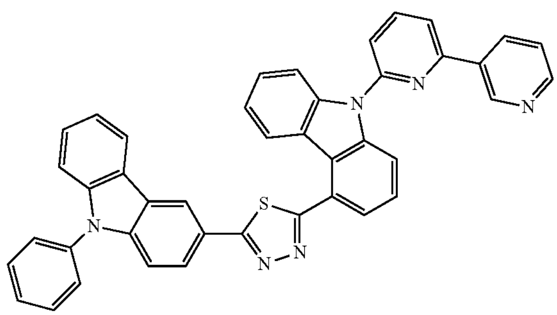
C284
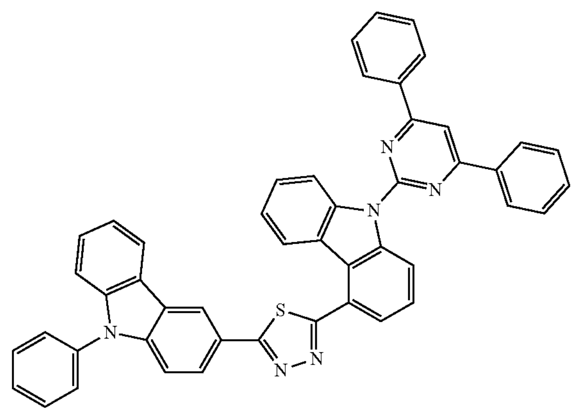
C285
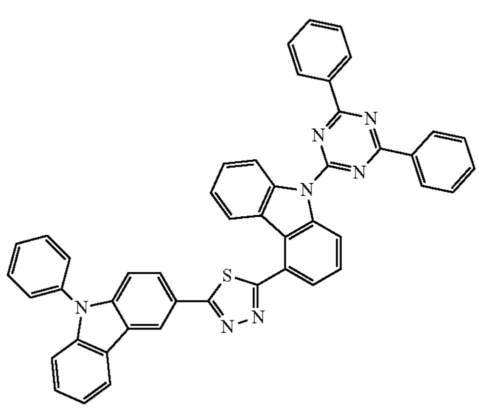
C286
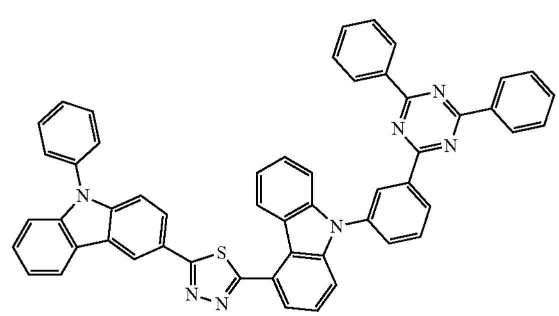

-continued
C287
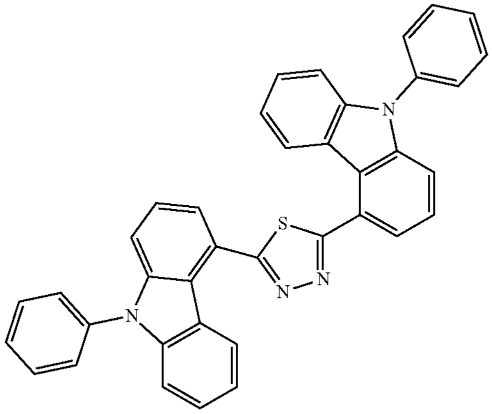
C288
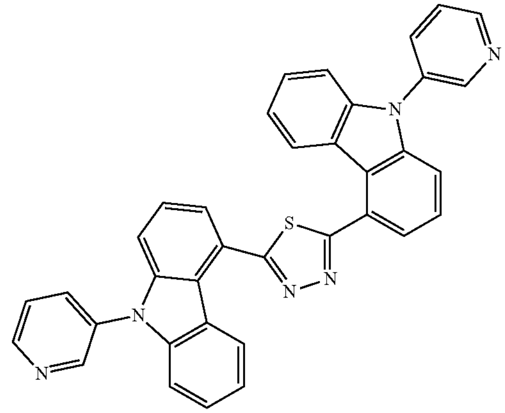
C289
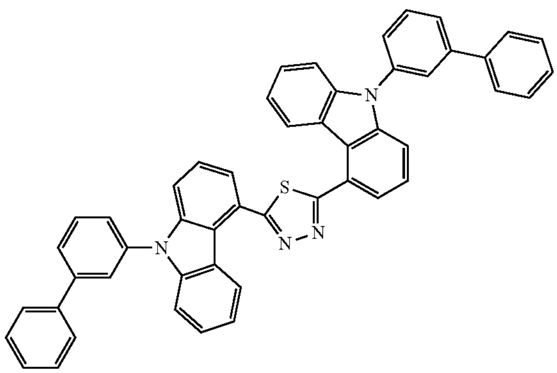
C290
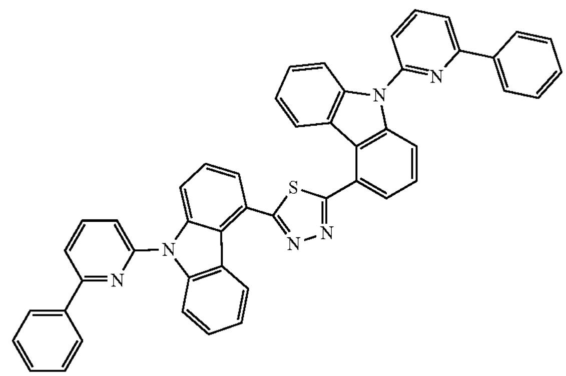
C291
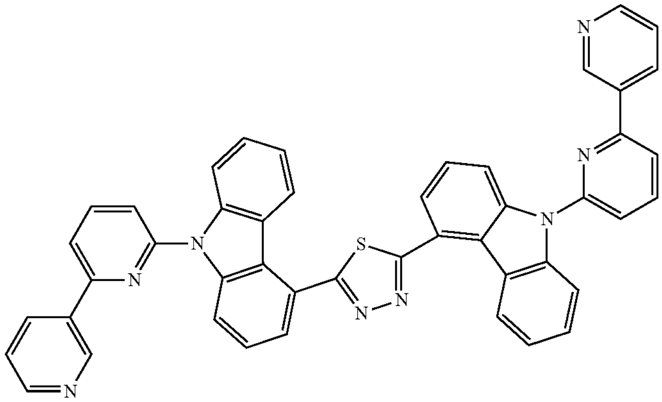

-continued
C292
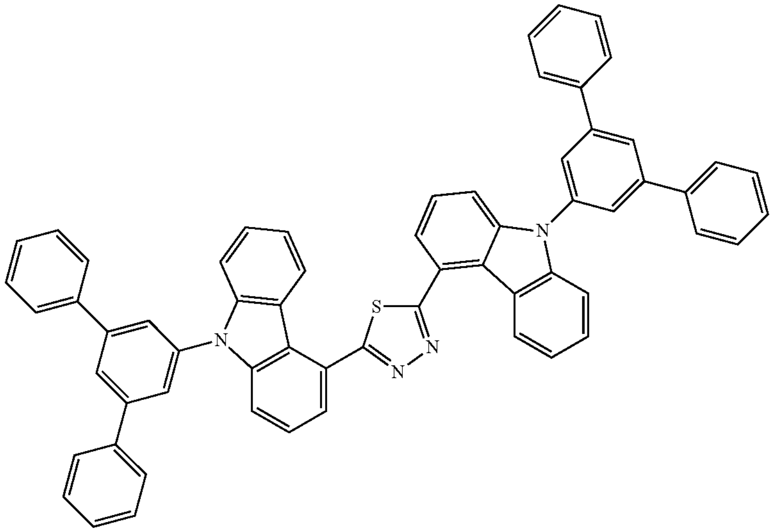
C293
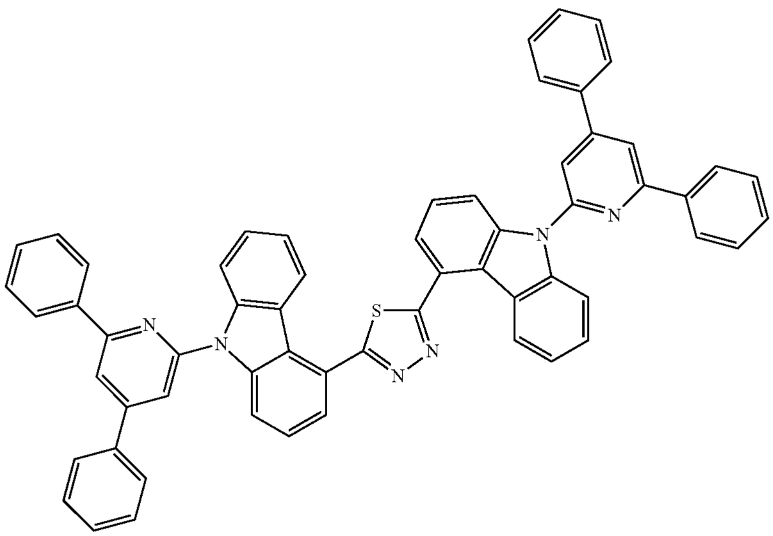
C294
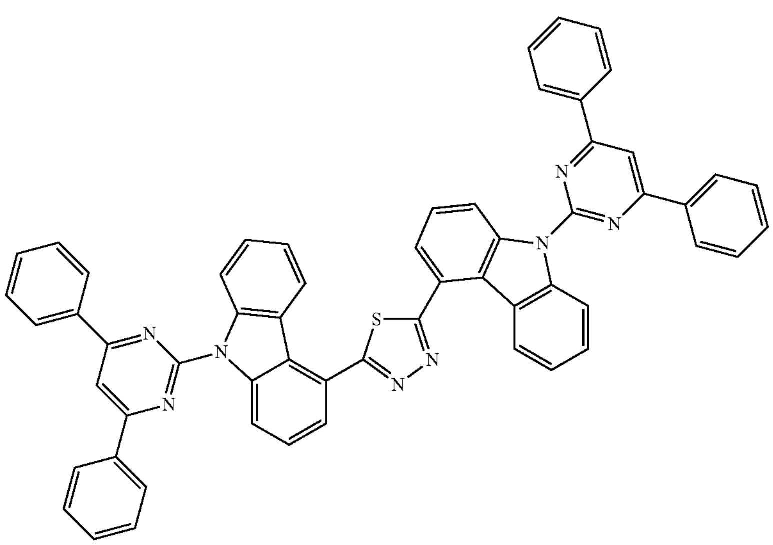

-continued
C295
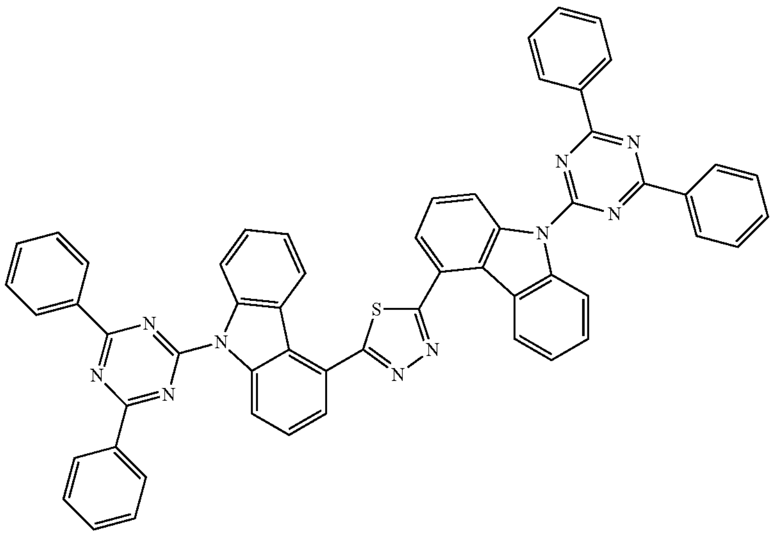
C296
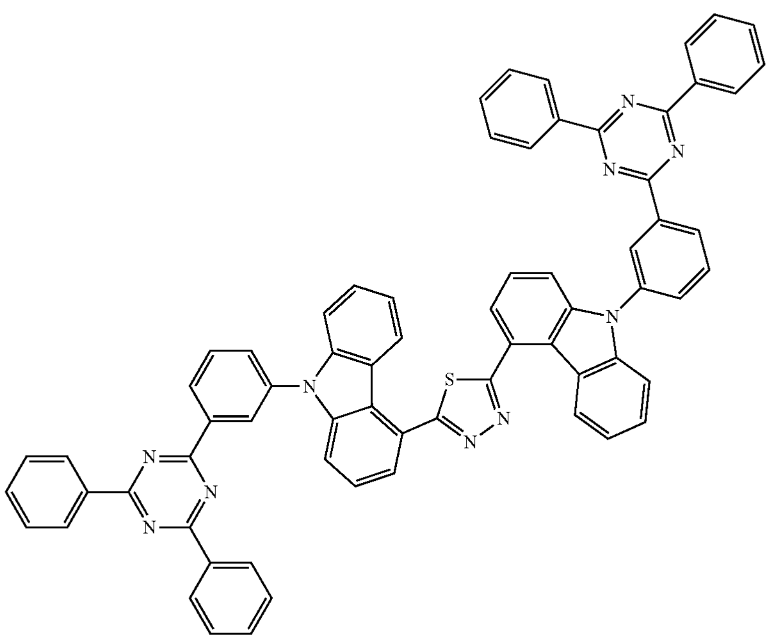
C297
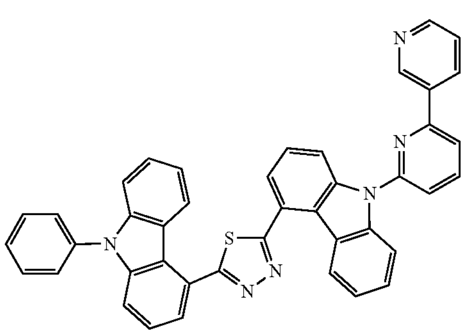
C298
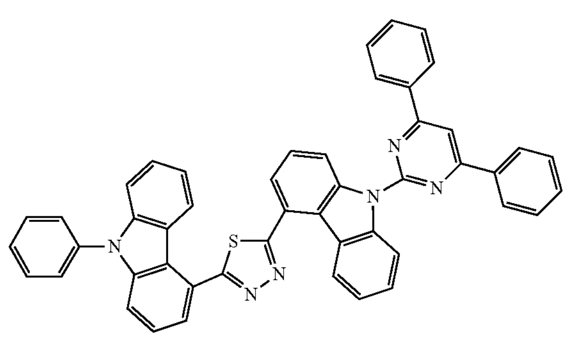

-continued
C299
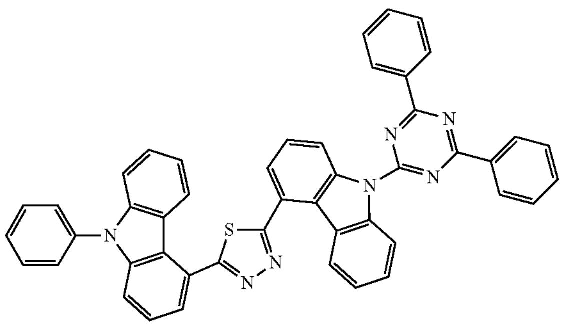
C300
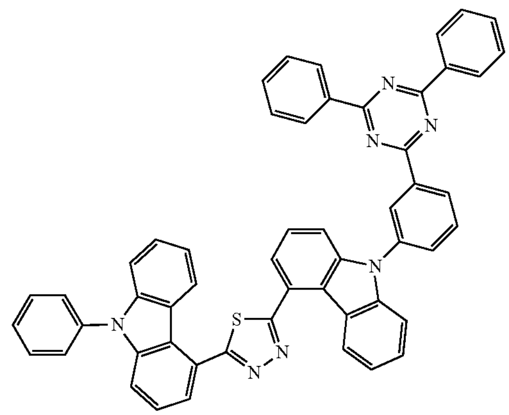
C301
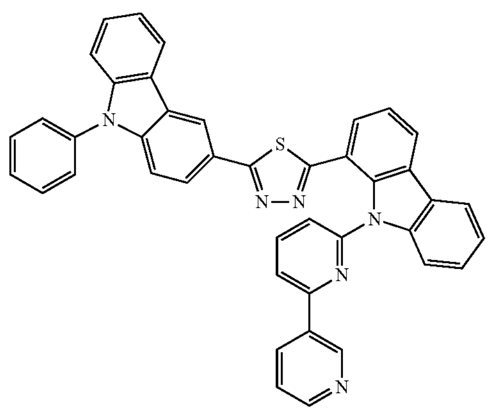
C302
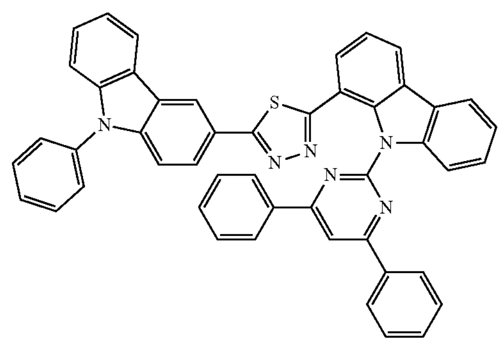
C303
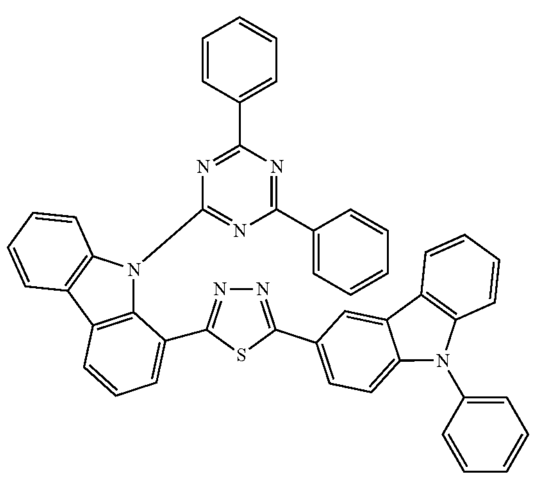
C304
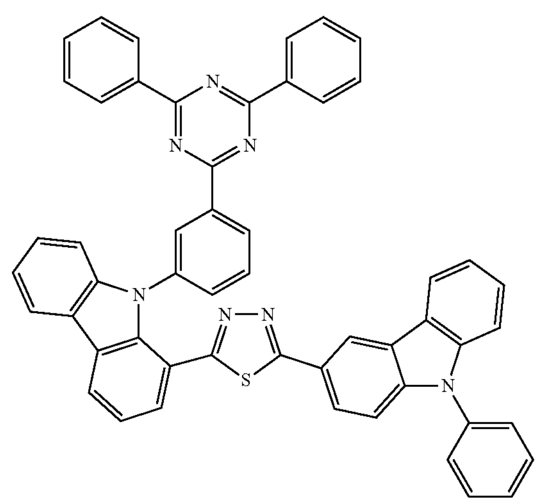

-continued
C305
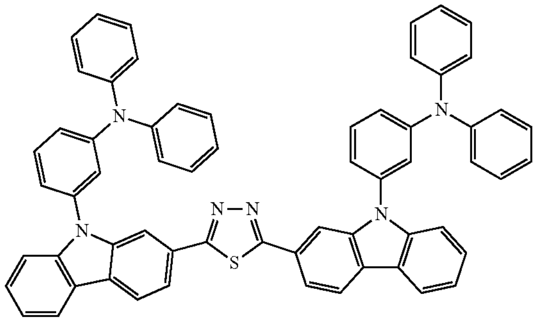
C306
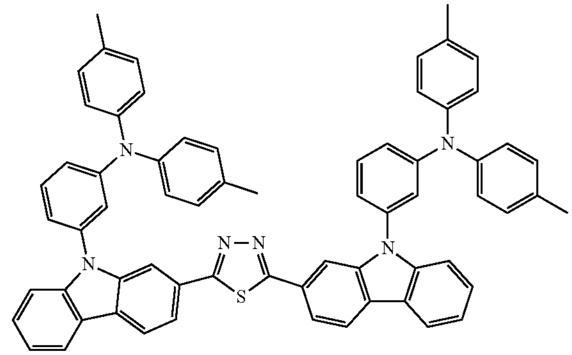
C307
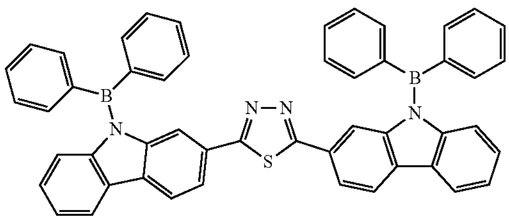
C308
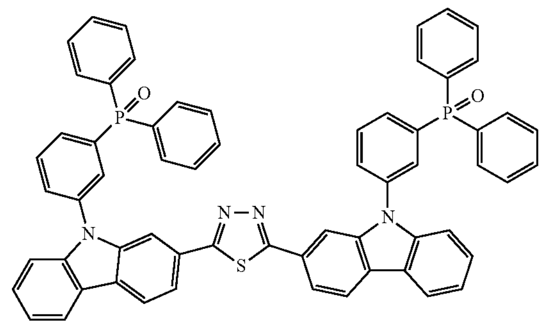
C309
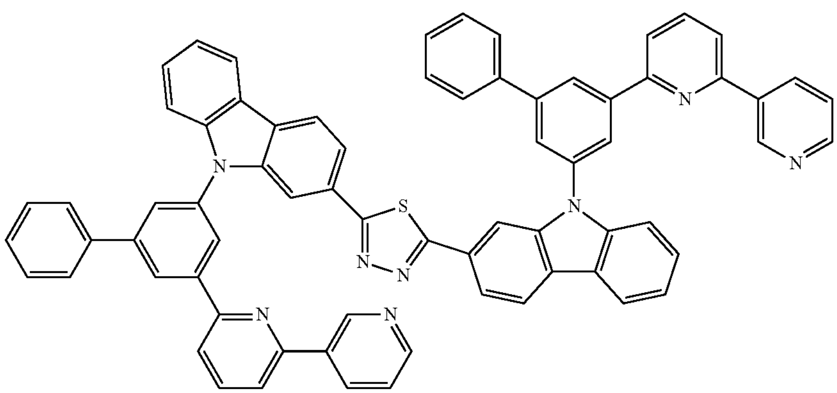
C310
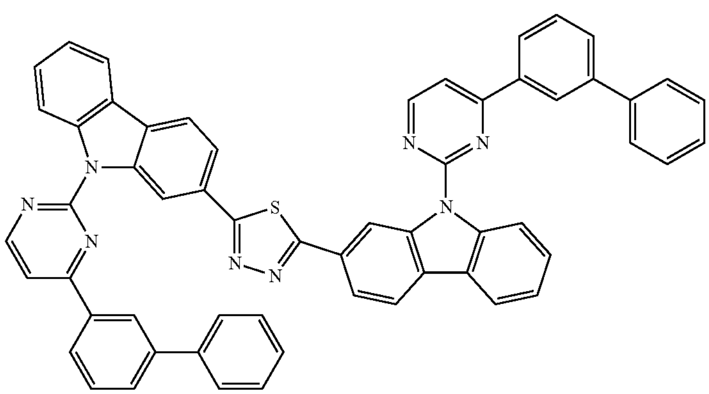

-continued
C311
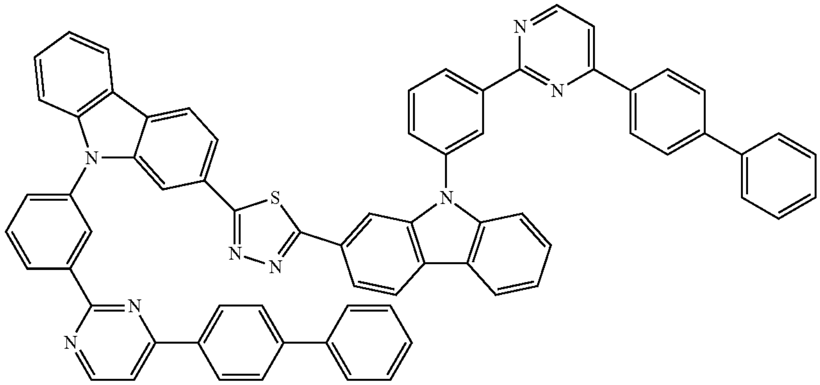
C312
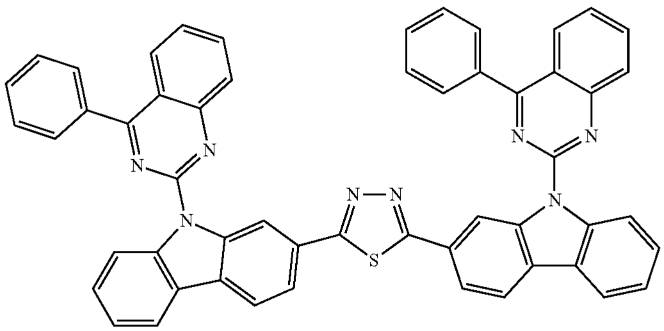
C313
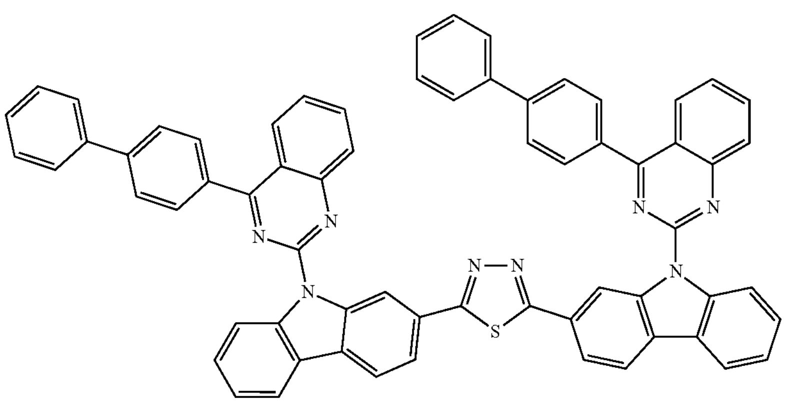
C314
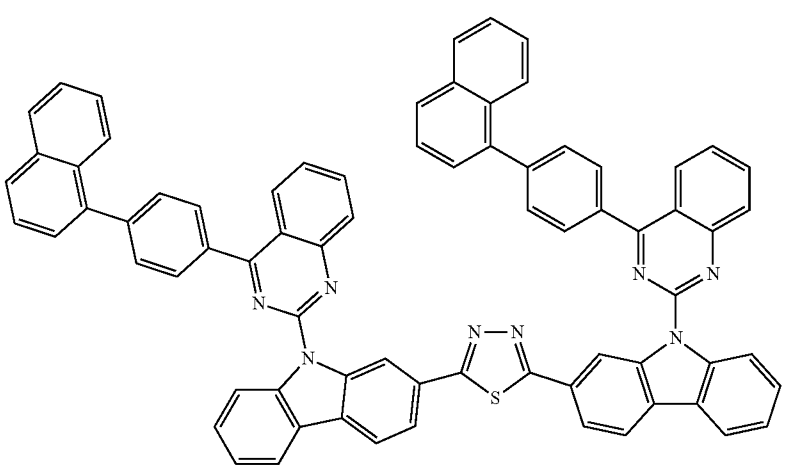

-continued
C315
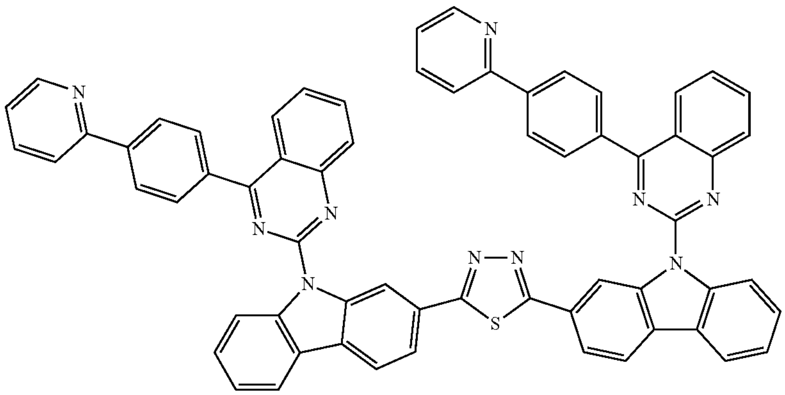
C316
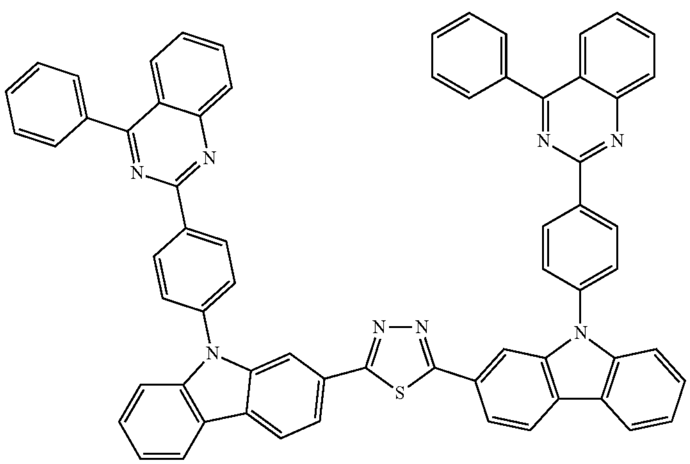
C317
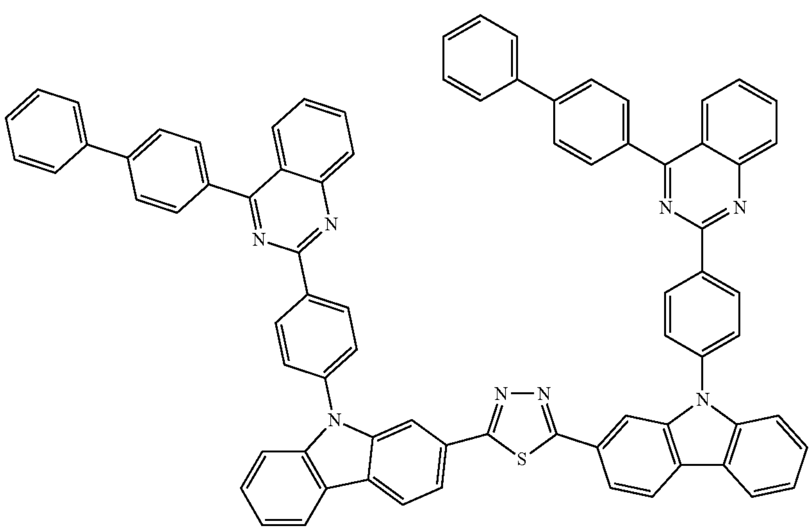

-continued
C318
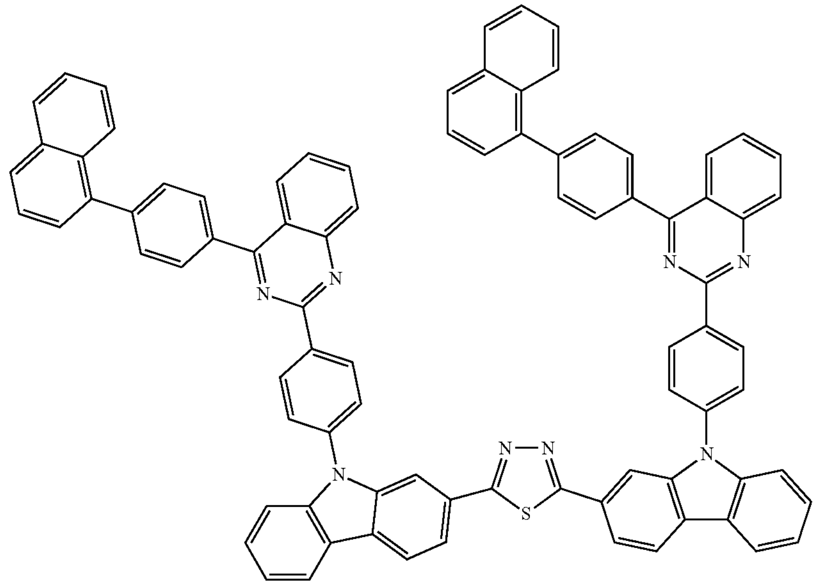
C319
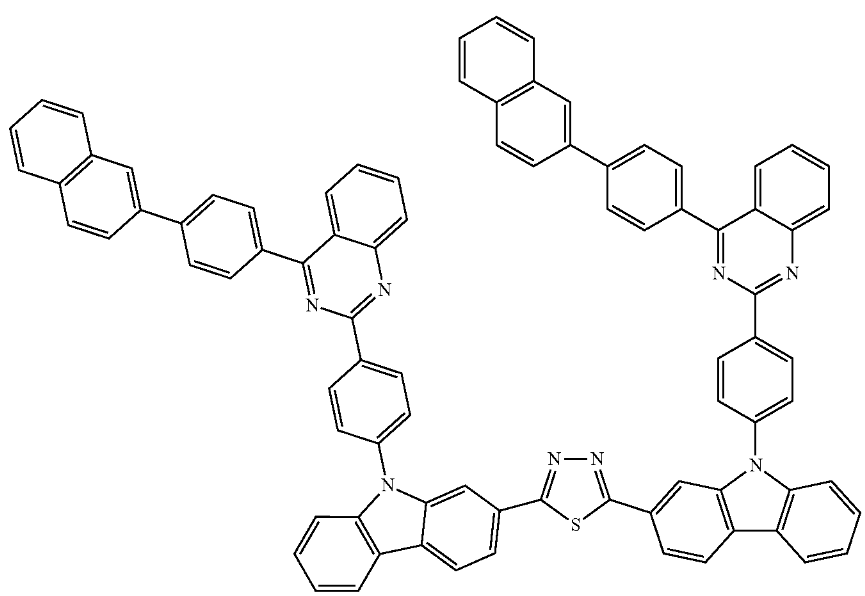

-continued
C320
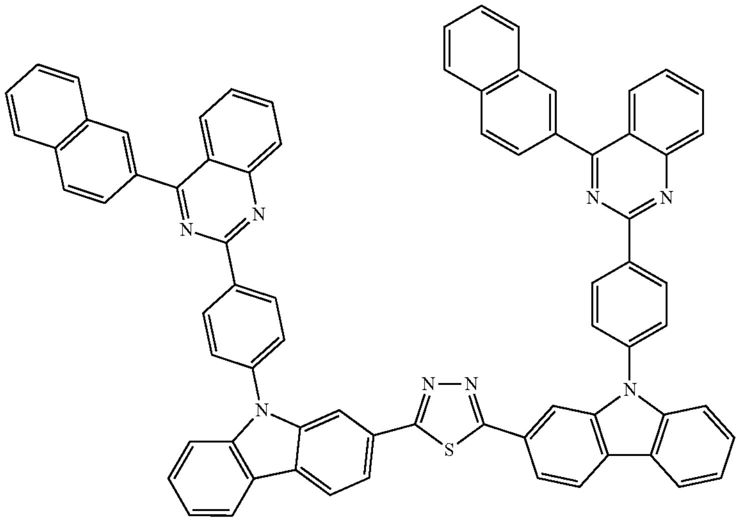
C321
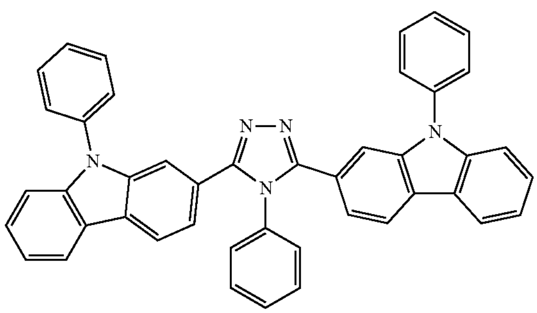
C322
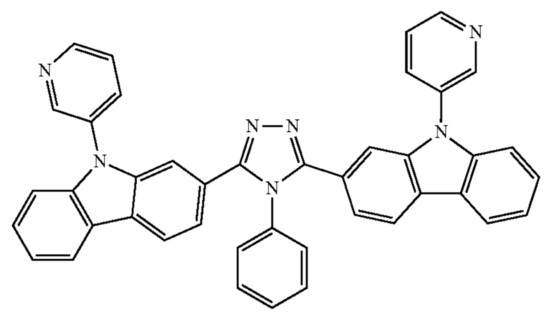
C323
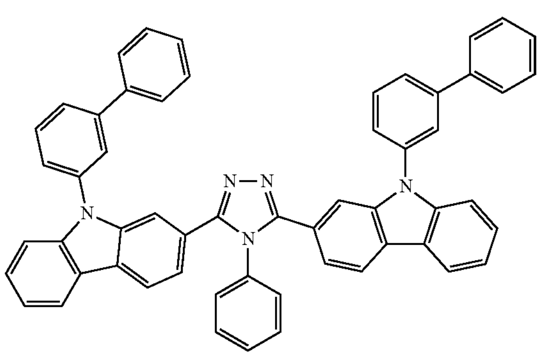
C324
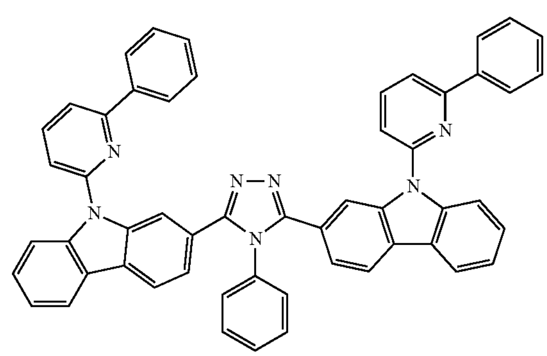
C325
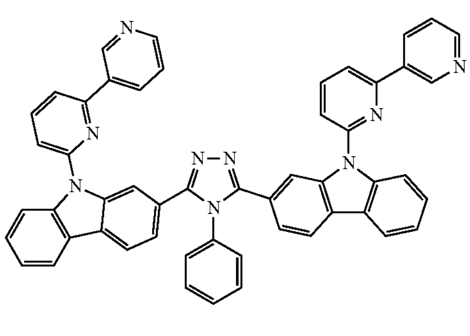
C326
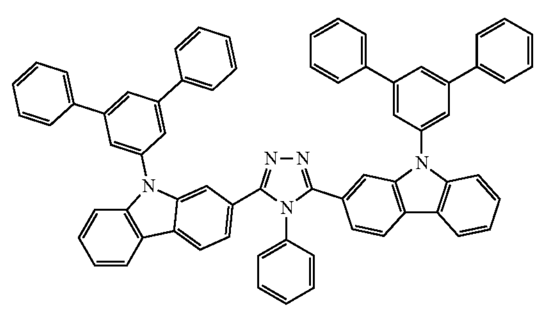

-continued
C327
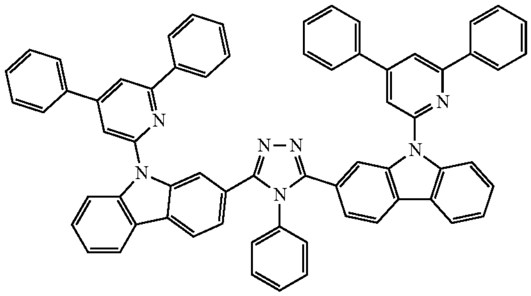
C328
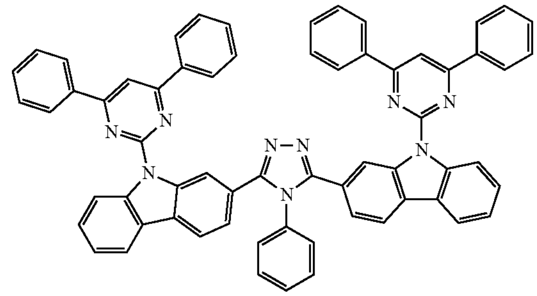
C329
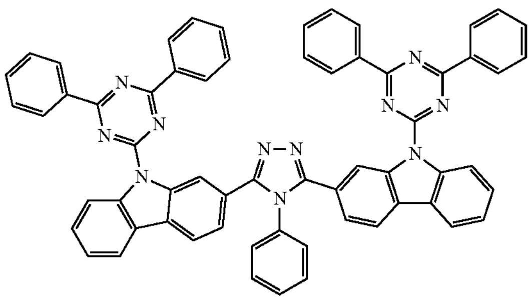
C330
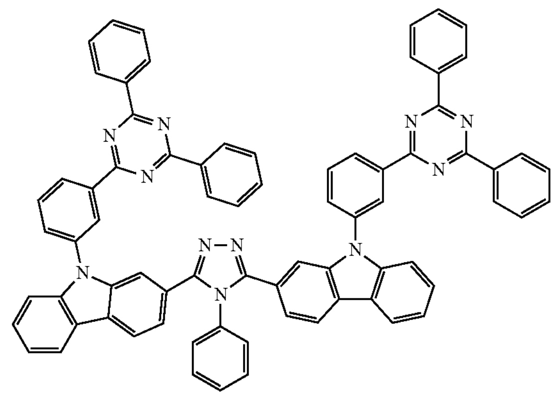
C331
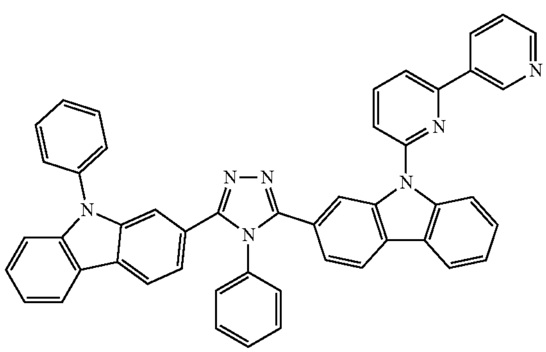
C332
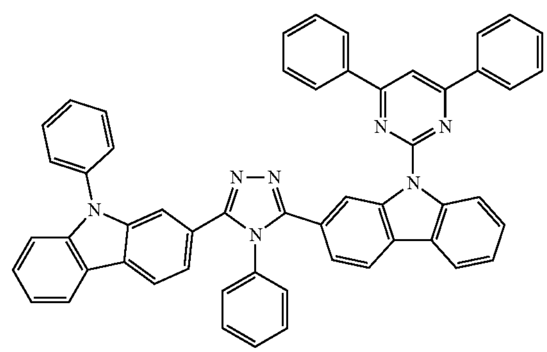
C333
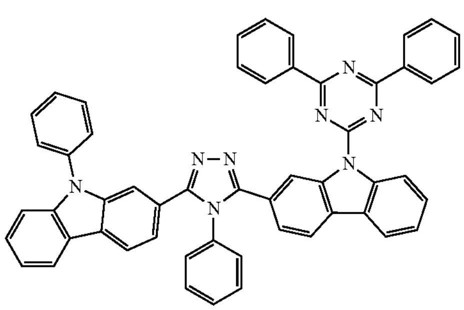
C334
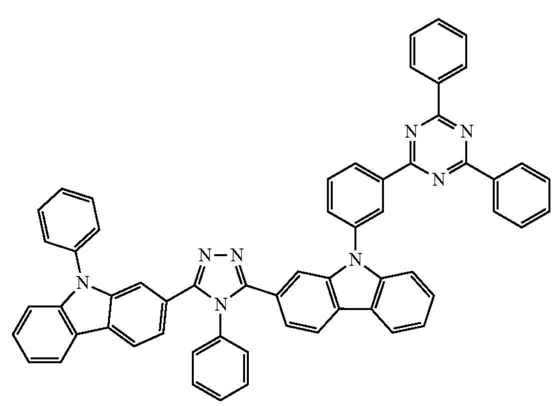

-continued
C335
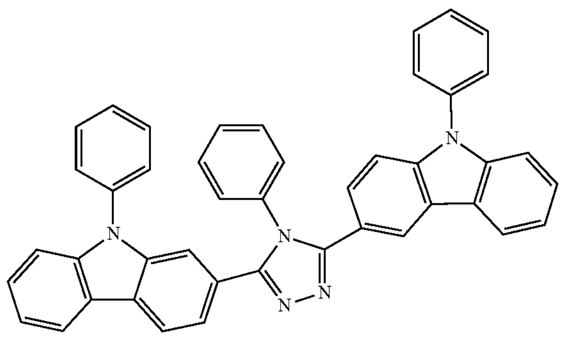
C336
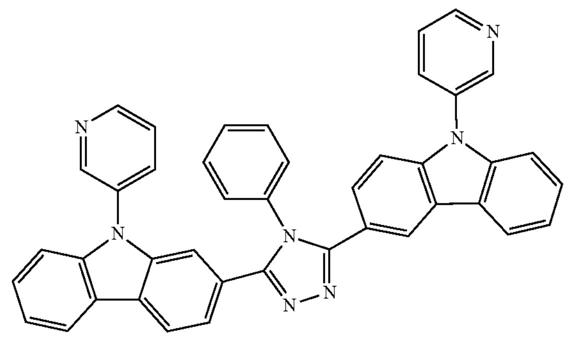
C337
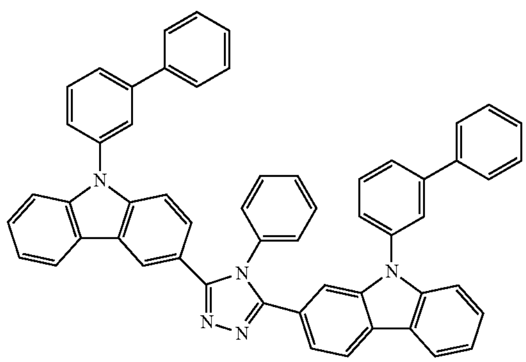
C338
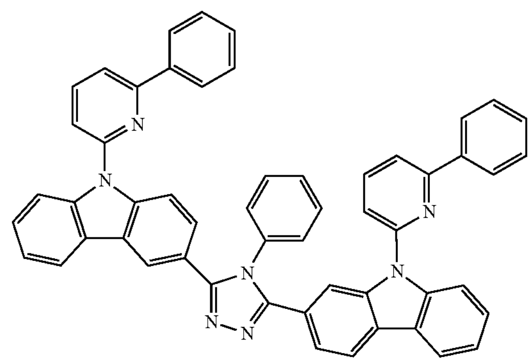
C339
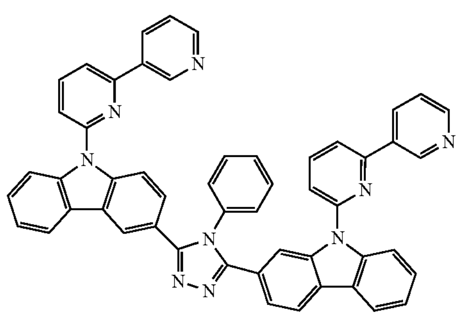
C340
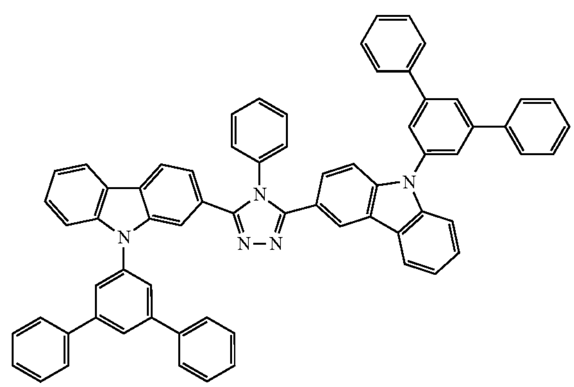
C341
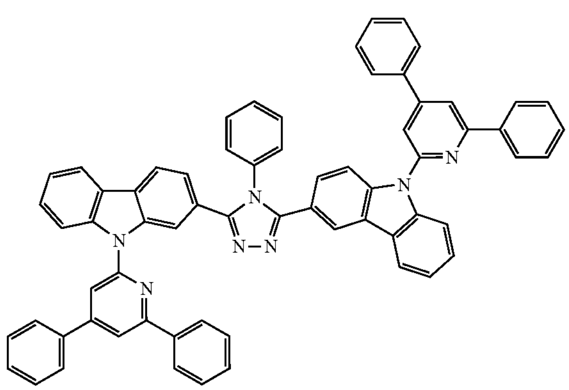
C342
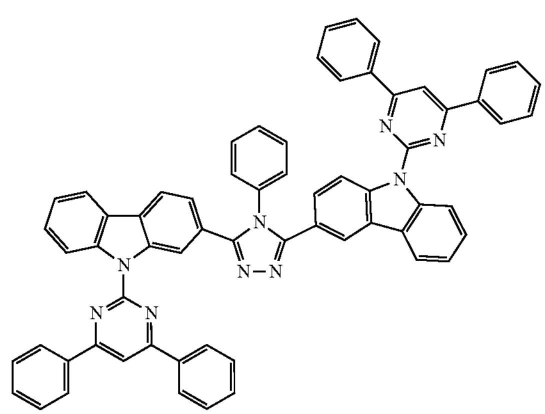

-continued
C343
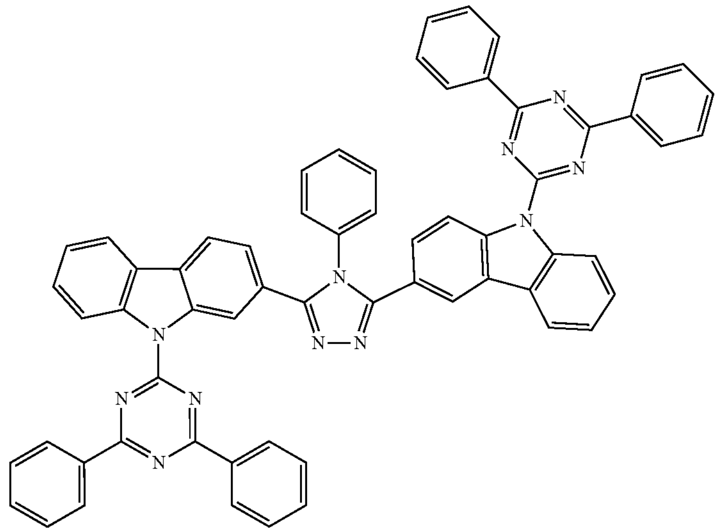
C344
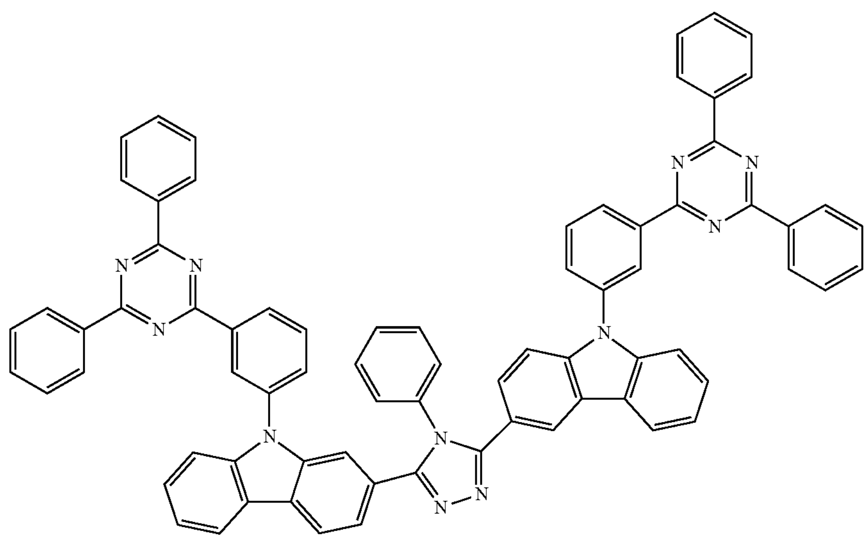
C345
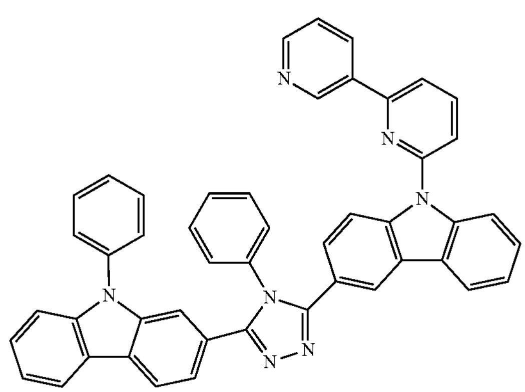
C346
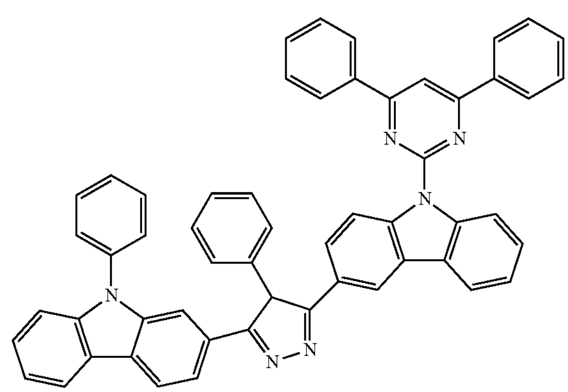

-continued
C347
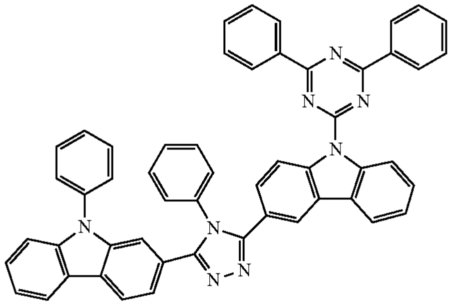
C348
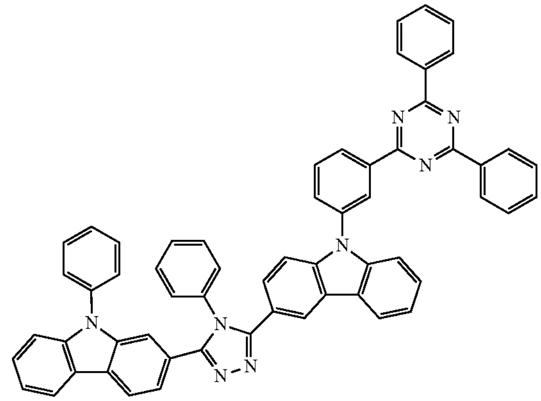
C349
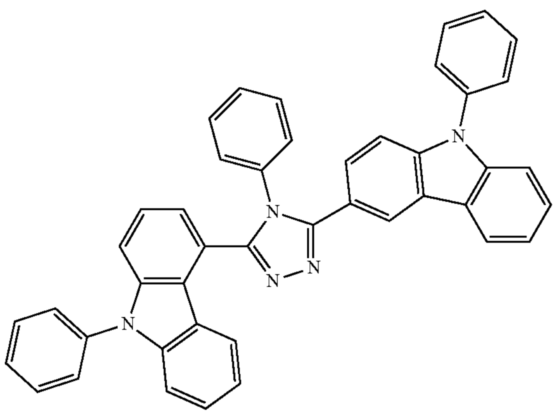
C350
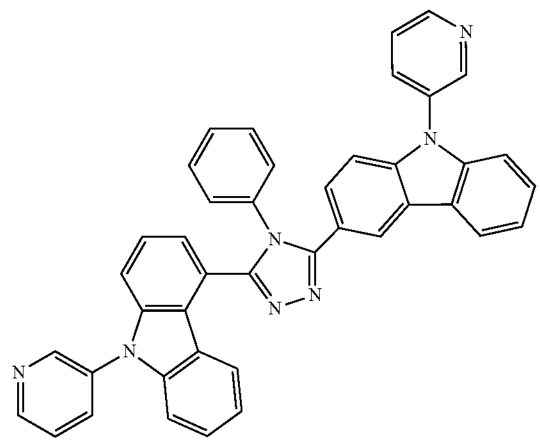
C351
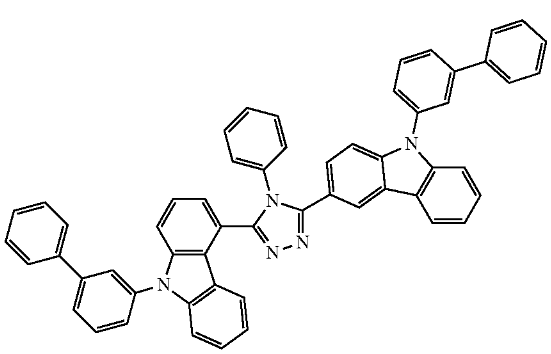
C352
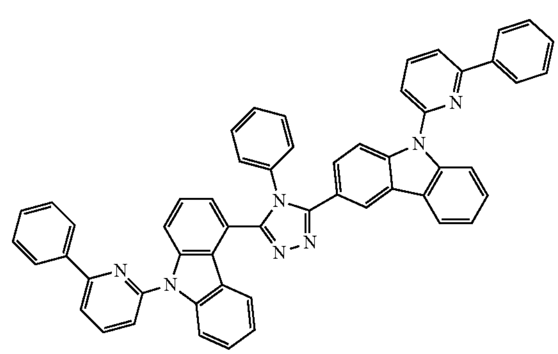

-continued
C353
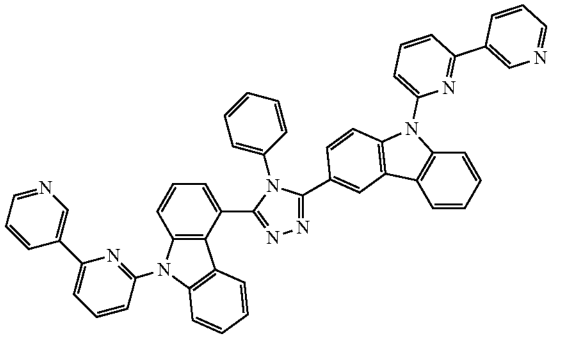
C354
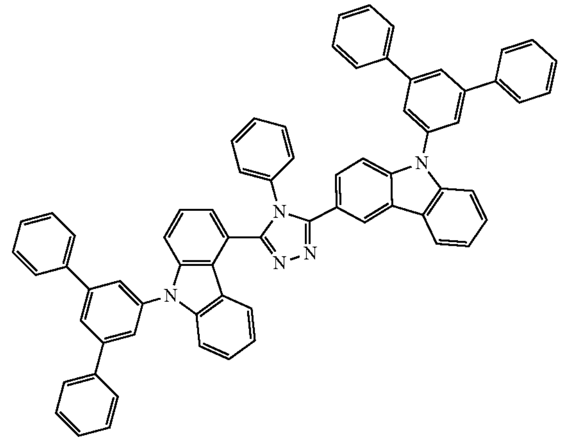
C355
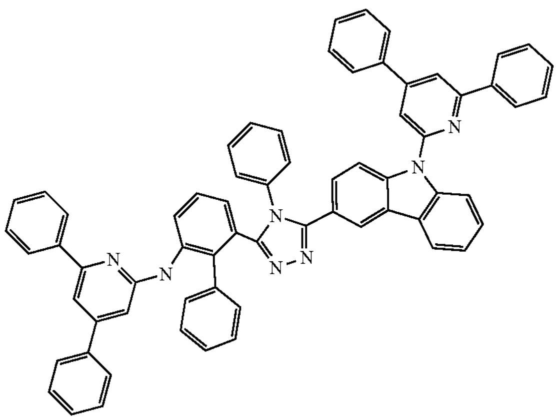
C356
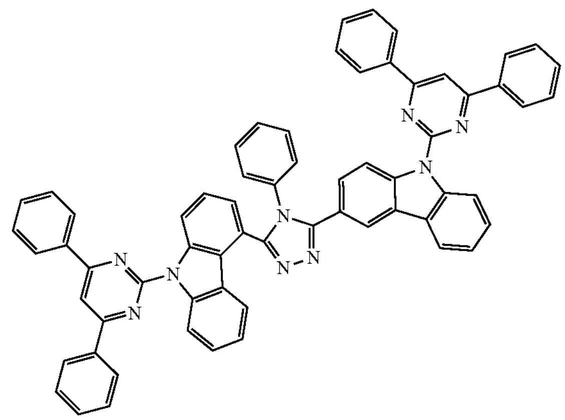
C357
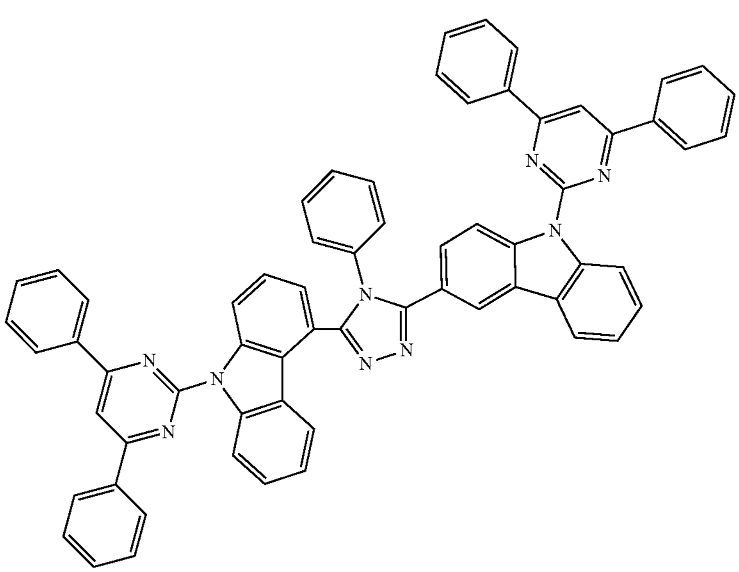

-continued
C358
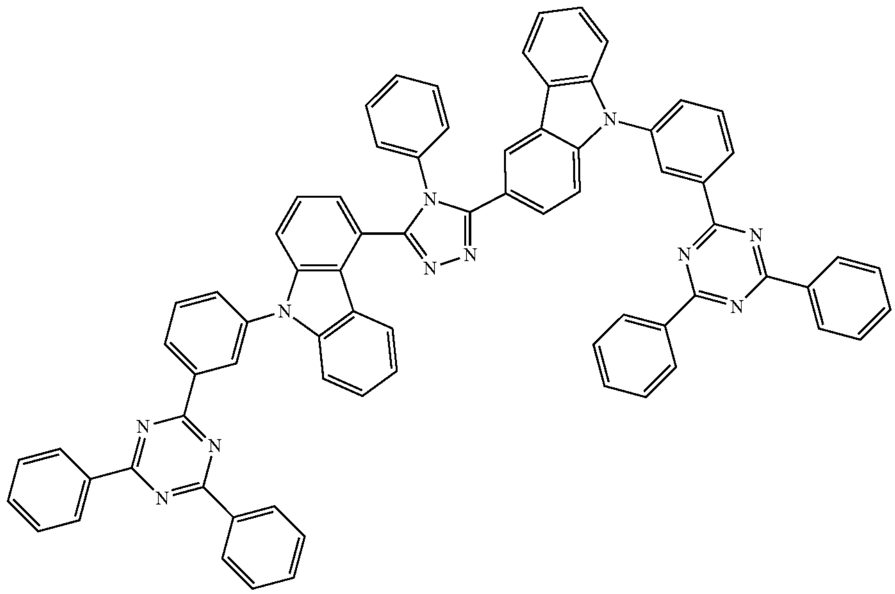
C359
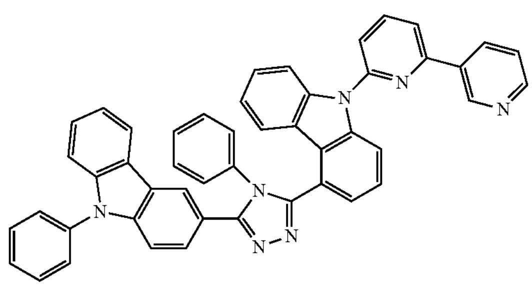
C360
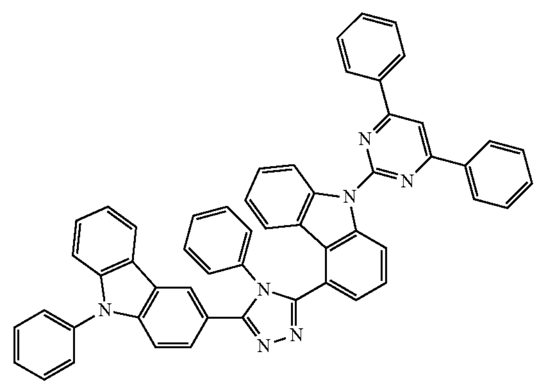
C361
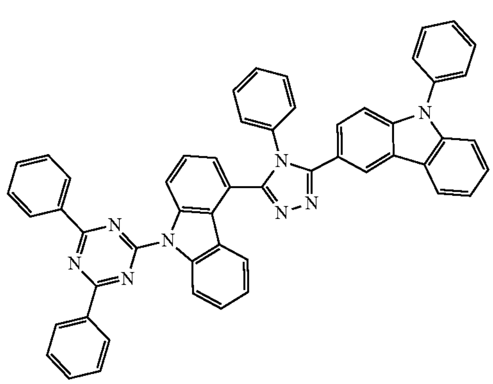
C362
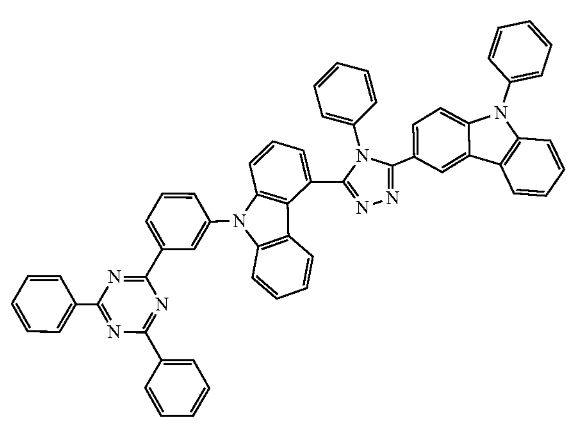

-continued
C363
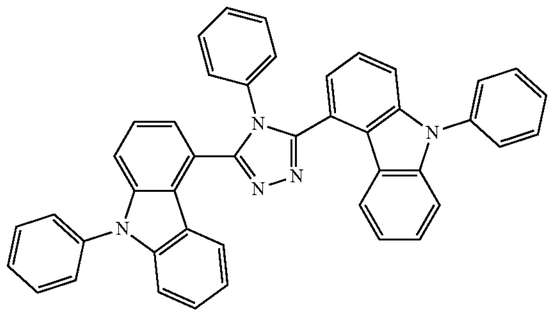
C364
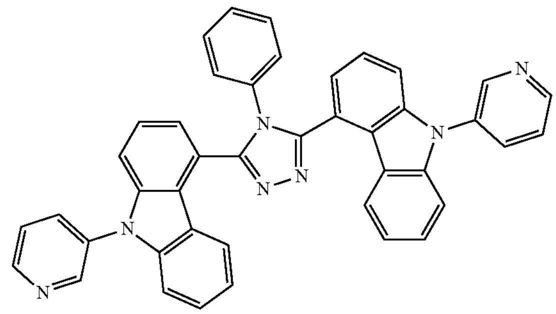
C365
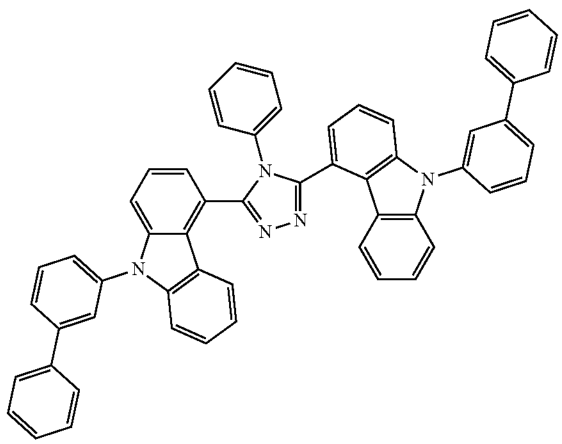
C366
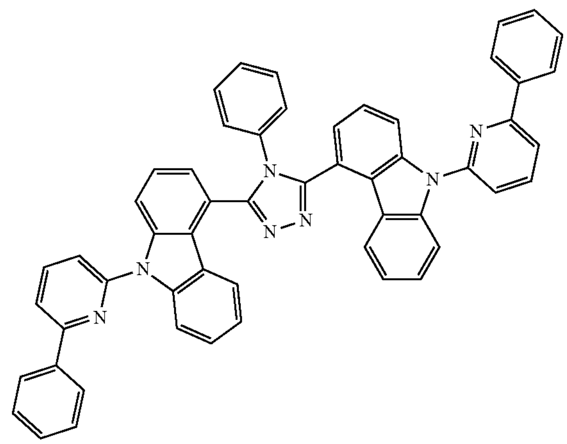
C367
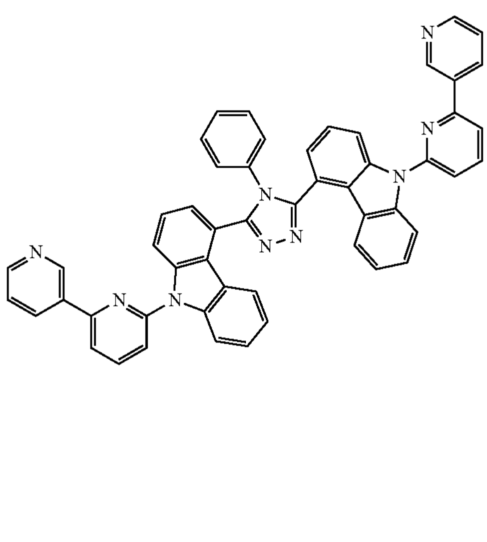
C368
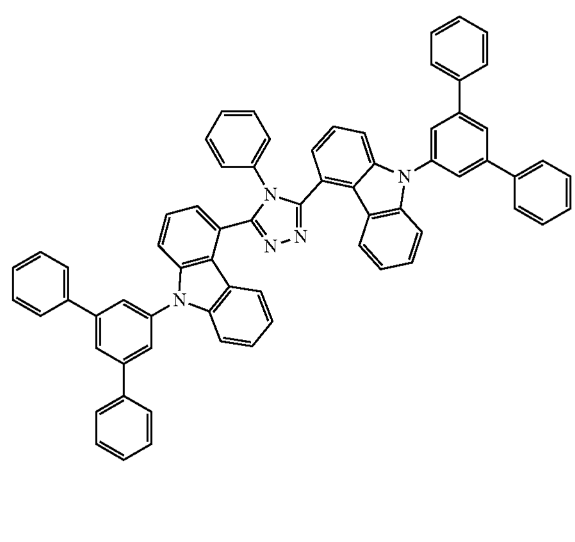

-continued
C369
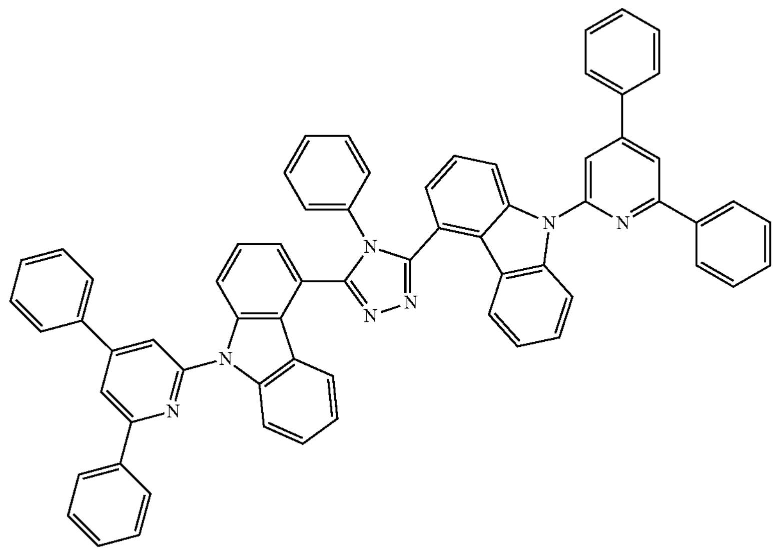
C370
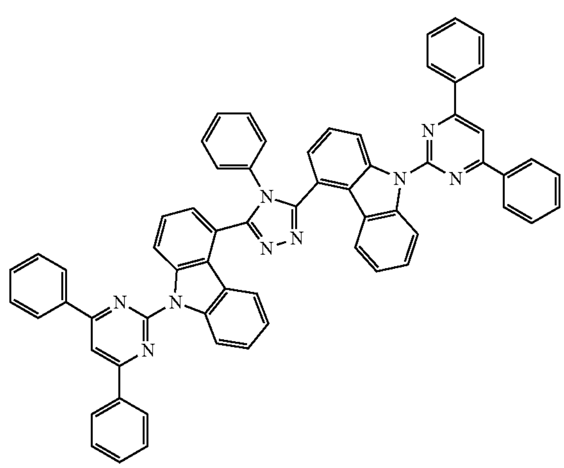
C371
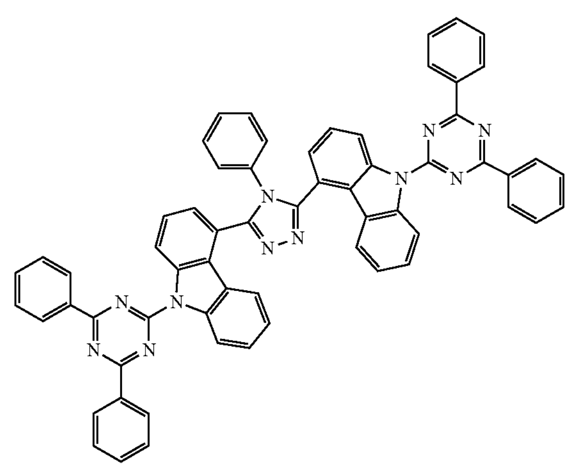

-continued
C372
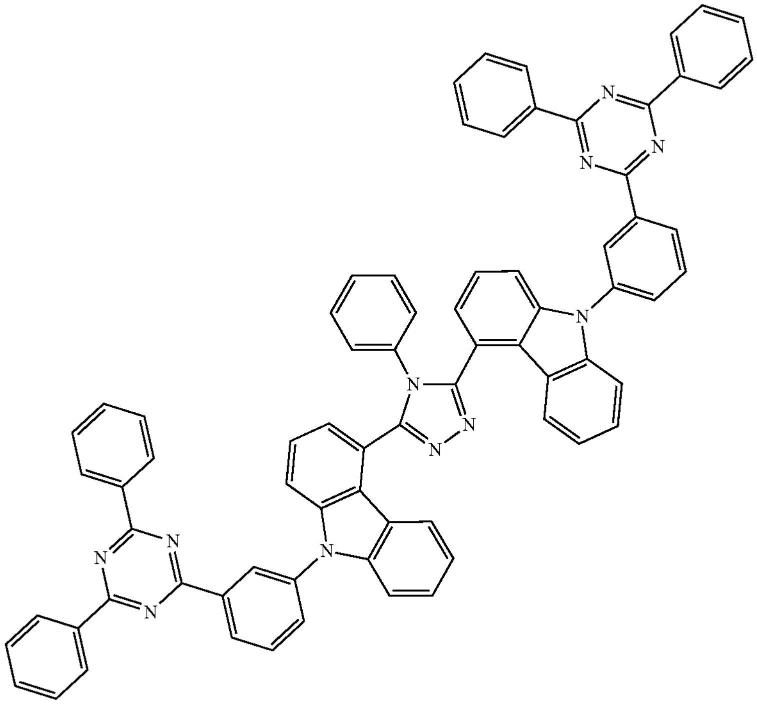
C373
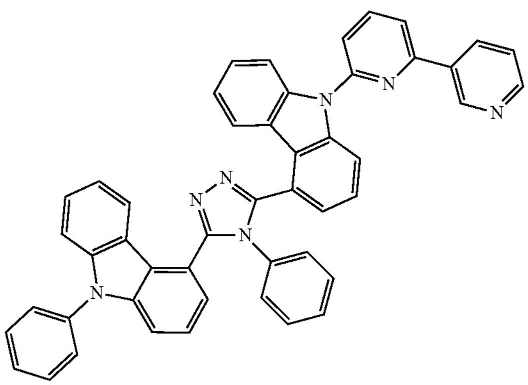
C374
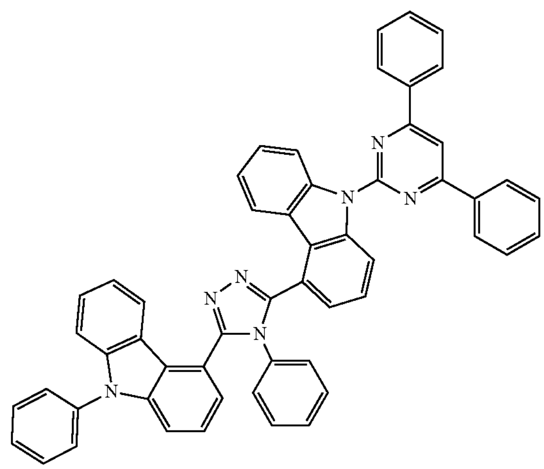
C375
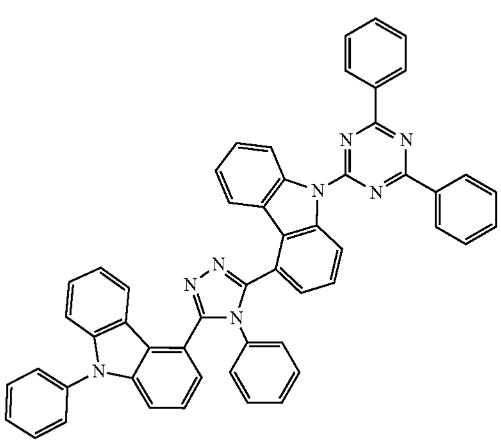
C376
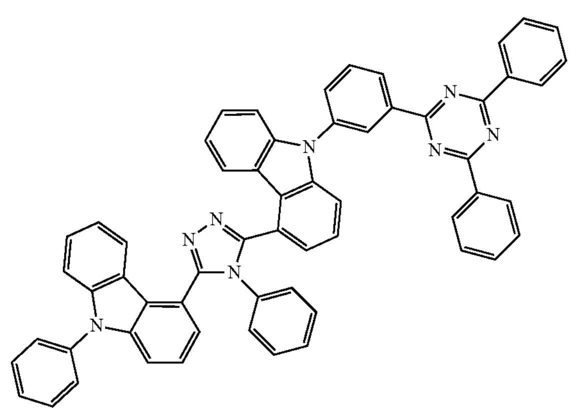

-continued
C377
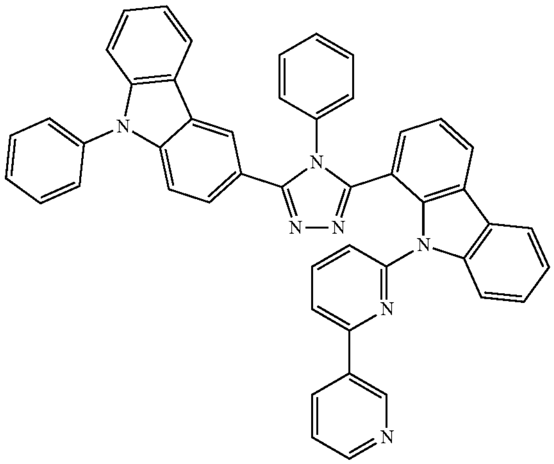
C378
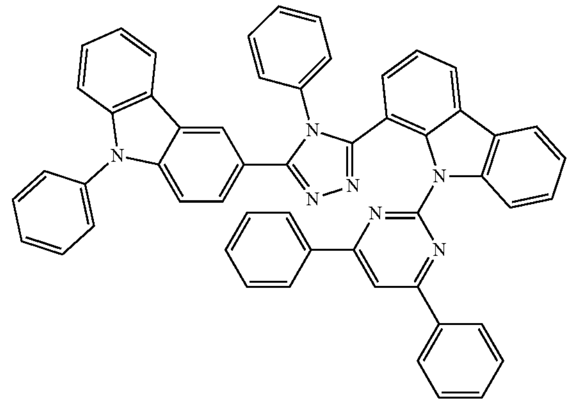
C379
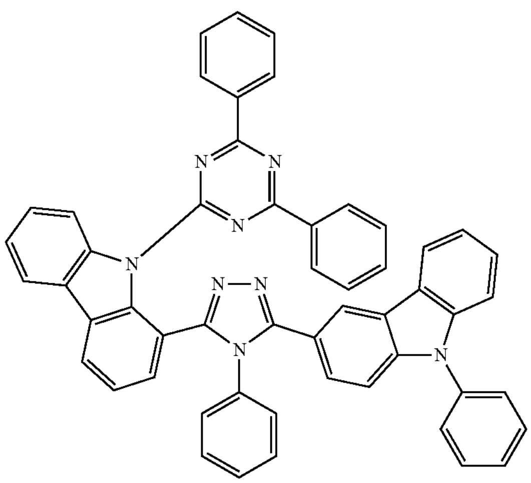
C380
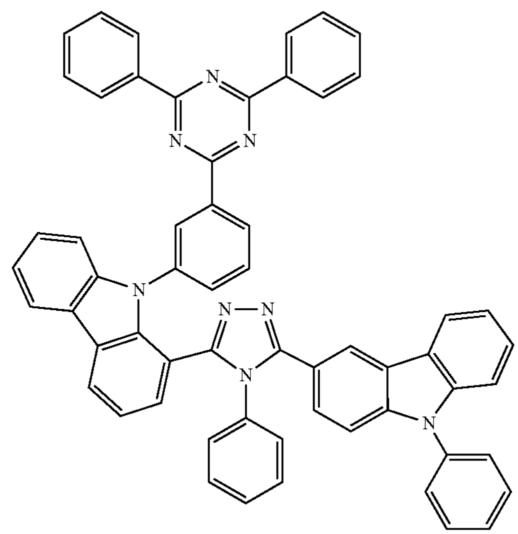
C381
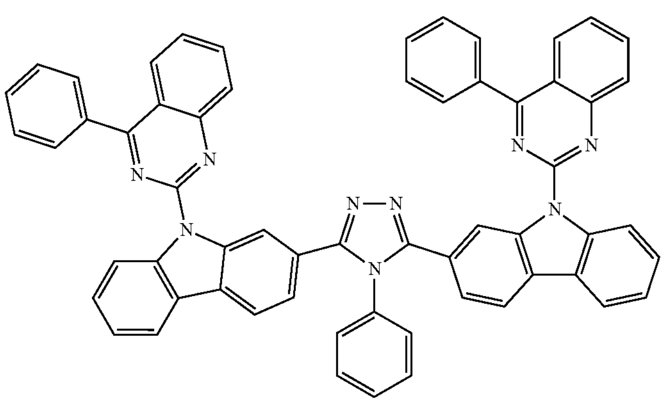

-continued
C382
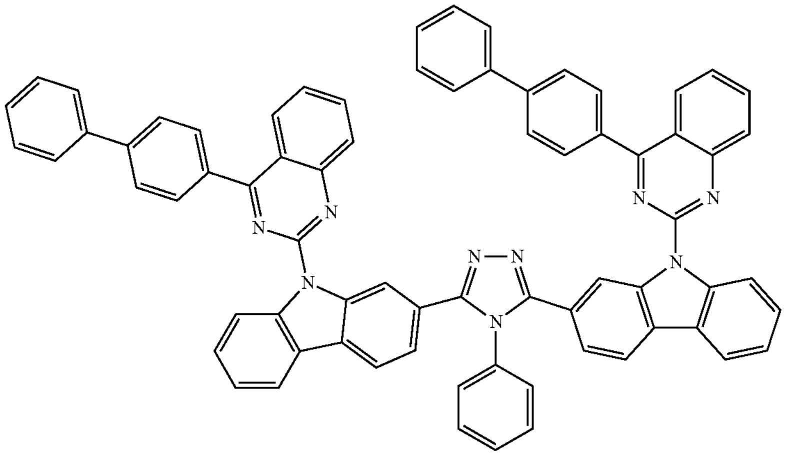
C383
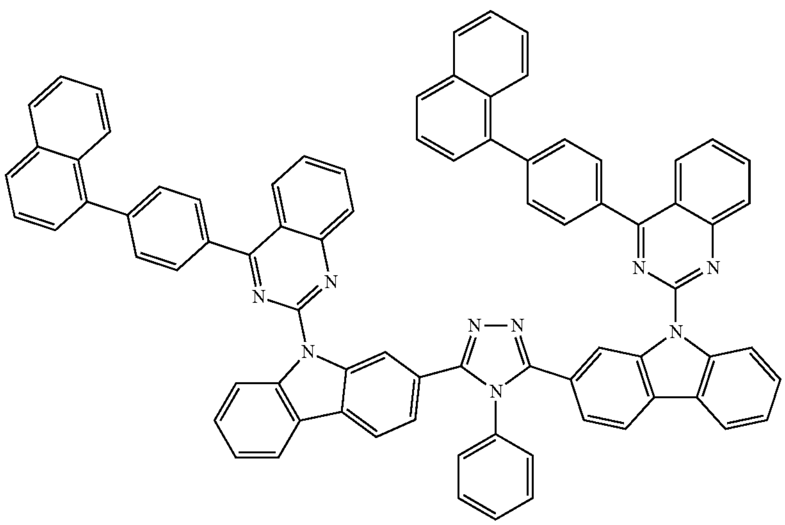
C384
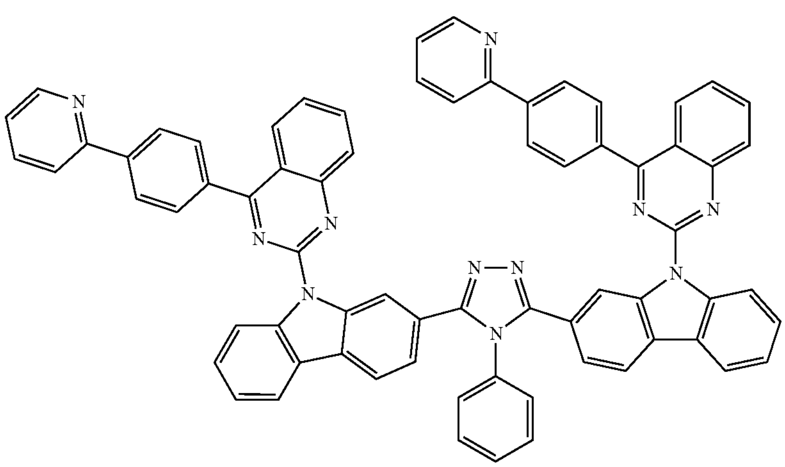

-continued
C385
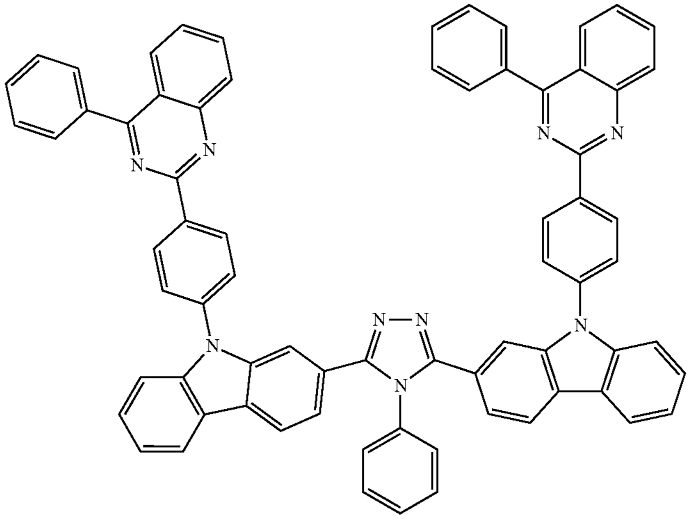
C386
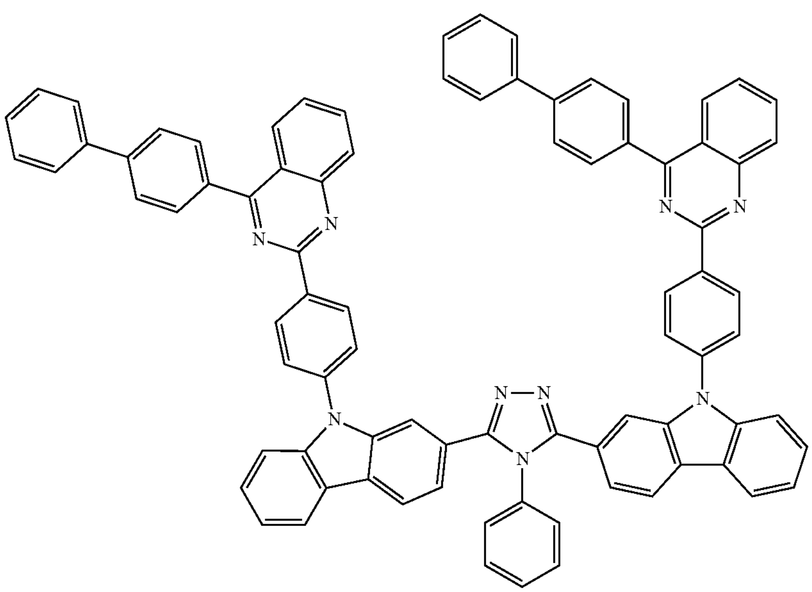

-continued
C387
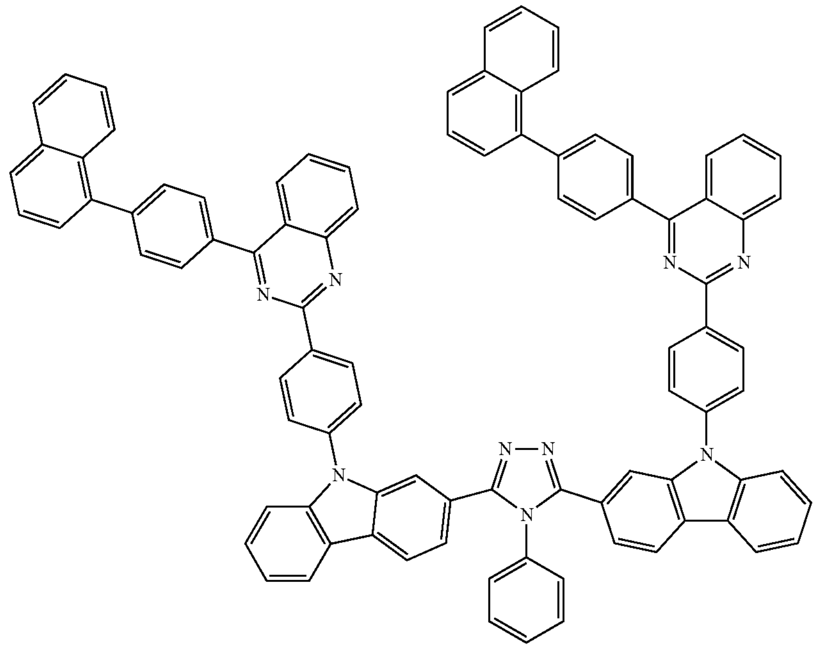
C388
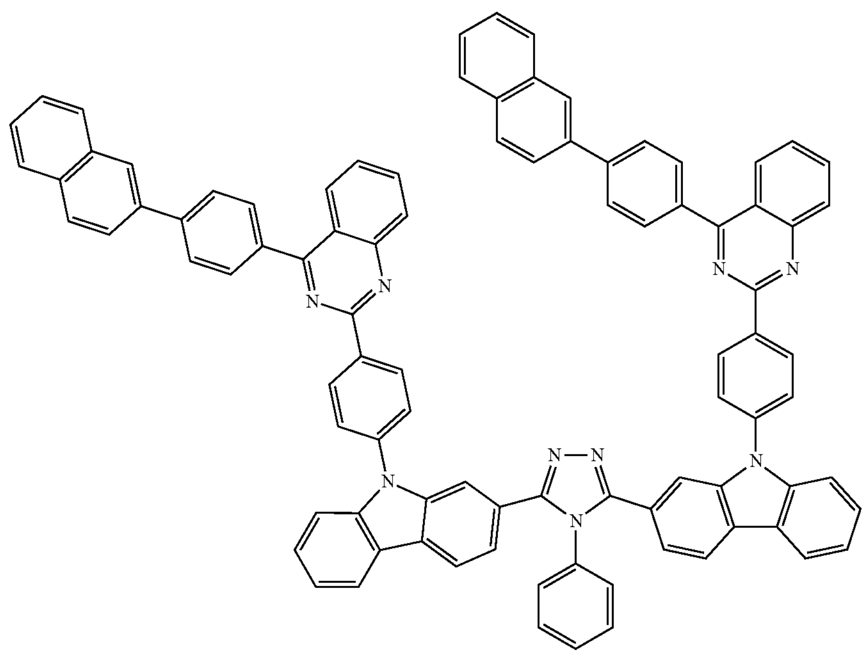

-continued

C389

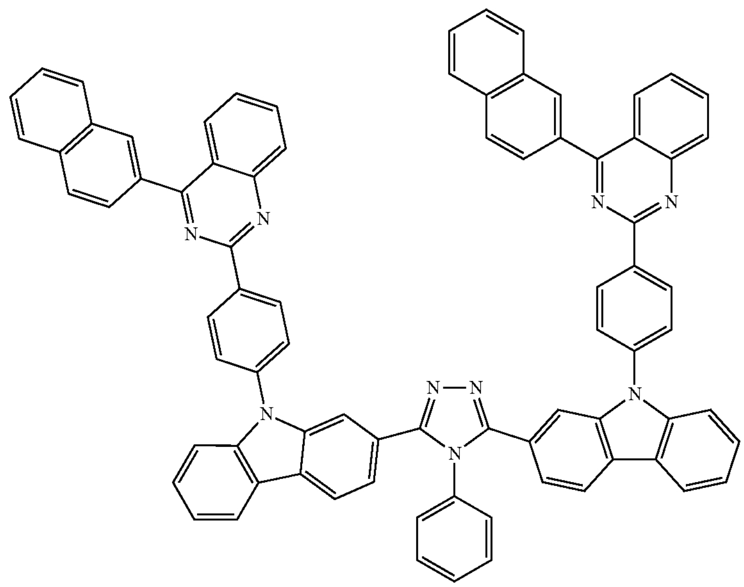

The first compound represented by one of Formulae 1-1 to 1-3 may have both fluorescent and phosphorescent characteristics, and thus when the first compound is included in the emission layer of the organic light-emitting device, the effect produced therefrom may be maximized and thus may contribute to improving the efficiency of the organic light-emitting device.

The core of the second compound may include a triazole moiety (where, in Formula 2, $X_{41}$ is $N[(L_{41})_{a41}$-$(Ar_{41})_{b41}]$), an oxadiazole moiety (where, in Formula 2, $X_{41}$ is O), or a thiadiazole moiety (where, in Formula 2, $X_{41}$ is S), and thus an electron transporting ability and thermal stability of an organic light-emitting device including the second compound may be excellent. Also, when a carbazole moiety (for example, when $X_{42}$ and/or $X_{43}$ include nitrogen) is linked to the core, the second compound may have a broad band gap and a triplet energy level appropriate for phosphorescent light emission. In addition, due to bipolar characteristics of the second compound itself, the organic light-emitting device including the second compound may have long lifespan.

Therefore, a synergetic effect may occur when the first compound and the second compound are combined, and thus electron and hole balance may improve. Also, when an organic light-emitting device includes the combination of the first compound and the second compound, the organic light-emitting device may have both long lifespan and high efficiency.

Both the first compound and the second compound may be included in the emission layer of the organic layer 150. Alternatively, the first compound may be included in the emission layer of the organic layer 150, and the second compound may be included in the electron transport region between the emission layer and the second electrode. In some embodiments, both the first compound and the second compound may be included in the emission layer of the organic layer 150, and the second compound may be additionally included in the electron transport region between the emission layer and the second electrode. Here, the second compound included in the emission layer and the second compound included in the electron transport region may be identical to or different from each other.

When both the first compound and the second compound are included in the emission layer, a binding region of holes and electrons may move toward an interface between the emission layer and the electron transport region, and thus lifespan of the organic light-emitting device including the emission layer may increase.

In some embodiments, the emission layer in the organic layer 150 may include a host and a dopant.

In the emission layer, a weight ratio of the host and the dopant may be in a range of about 90:10 to about 60:40, for example, about 85:15 to about 80:20, but embodiments of the present disclosure are not limited thereto.

A weight ratio of the first compound and the second compound may be in a range of about 1090 to about 90:10, for example, about 20:80 to about 80:20. In some embodiments, a weight ratio of the first compound and the second compound may be in a range of about 10:80 to about 80:10, about 15:75 to about 75:15, or, for example, about 20:70 to about 75:15. When the weight ratio of the first compound and the second compound is within any of these ranges, movement of the holes and movement of the electrons in the emission layer may balance effectively (e.g., suitably).

A thickness of the emission layer may be in a range of about 100 Å to about 1000 Å, for example, about 200 Å to about 600 Å. When the thickness of the emission layer is within any of these ranges, satisfactory light-emitting characteristics may be obtained without a substantial increase in driving voltage.

In some embodiments, the phosphorescent dopant may include an organometallic compound including at least one selected from iridium (Ir), platinum (Pt), osmium (Os), titanium (Ti), zirconium (Zr), hafnium (Hf), europium (Eu), terbium (Tb), thulium (Tm), Rh (rhodium), and Cu (copper).

In some embodiments, the phosphorescent dopant may include an organic metal complex represented by Formula 401:

Formula 401

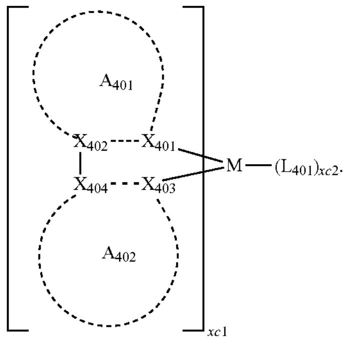

In Formula 401,

M may be selected from iridium (Ir), platinum (Pt), osmium (Os), titanium (Ti), zirconium (Zr), hafnium (Hf), europium (Eu), terbium (Tb), and thulium (Tm), $X_{401}$ to $X_{404}$ may be each independently nitrogen or carbon, rings $A_{401}$ and $A_{402}$ may be each independently selected from a substituted or unsubstituted benzene, a substituted or unsubstituted naphthalene, a substituted or unsubstituted fluorene, a substituted or unsubstituted spiro-fluorene, a substituted or unsubstituted indene, a substituted or unsubstituted pyrrole, a substituted or unsubstituted thiophene, a substituted or unsubstituted furan, a substituted or unsubstituted imidazole, a substituted or unsubstituted pyrazole, a substituted or unsubstituted thiazole, a substituted or unsubstituted isothiazole, a substituted or unsubstituted oxazole, a substituted or unsubstituted isoxazole, a substituted or unsubstituted pyridine, a substituted or unsubstituted pyrazine, a substituted or unsubstituted pyrimidine, a substituted or unsubstituted pyridazine, a substituted or unsubstituted quinoline, a substituted or unsubstituted isoquinoline, a substituted or unsubstituted benzoquinoline, a substituted or unsubstituted quinoxaline, a substituted or unsubstituted quinazoline, a substituted or unsubstituted carbazole, a substituted or unsubstituted benzoimidazole, a substituted or unsubstituted benzofuran, a substituted or unsubstituted benzothiophene, a substituted or unsubstituted isobenzothiophene, a substituted or unsubstituted benzoxazole, a substituted or unsubstituted isobenzoxazole, a substituted or unsubstituted triazole, a substituted or unsubstituted oxadiazole, a substituted or unsubstituted triazine, a substituted or unsubstituted dibenzofuran, and a substituted or unsubstituted dibenzothiophene, at least one substituent of the substituted benzene, substituted naphthalene, substituted fluorene, substituted spiro-fluorene, substituted indene, substituted pyrrole, substituted thiophene, substituted furan, substituted imidazole, substituted pyrazole, substituted thiazole, substituted isothiazole, substituted oxazole, substituted isoxazole, substituted pyridine, substituted pyrazine, substituted pyrimidine, substituted pyridazine, substituted quinoline, substituted isoquinoline, substituted benzoquinoline, substituted quinoxaline, substituted quinazoline, substituted carbazole, substituted benzoimidazole, substituted benzofuran, substituted benzothiophene, substituted isobenzothiophene, substituted benzoxazole, substituted isobenzoxazole, substituted triazole, substituted oxadiazole, substituted triazine, substituted dibenzofuran, and substituted dibenzothiophene may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group, —$N(Q_{401})(Q_{402})$, —$Si(Q_{403})(Q_{404})(Q_{405})$, and —$B(Q_{406})(Q_{407})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group, —$N(Q_{411})(Q_{412})$, —$Si(Q_{413})(Q_{414})(Q_{415})$, and —$B(Q_{416})(Q_{417})$; and —$N(Q_{421})(Q_{422})$, —$Si(Q_{423})(Q_{424})(Q_{425})$, and —$B(Q_{426})(Q_{427})$, $L_{401}$ may be an organic ligand, xc1 may be 1, 2, or 3, and xc2 may be 0, 1, 2, or 3, where $Q_{401}$ to $Q_{407}$, $Q_{411}$ to $Q_{417}$, and $Q_{421}$ to $Q_{427}$ may be each independently selected from hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group.

In Formula 401, $L_{401}$ may be any suitable monovalent, divalent, or trivalent organic ligand. In some embodiments, $L_{401}$ may be selected from a halogen ligand (e.g., Cl and/or F), a diketone ligand (e.g., acetylacetonate, 1,3-diphenyl-1,3-propanedionate, 2,2,6,6-tetramethyl-3,5-heptanedionate, and/or hexafluoroacetonate), a carboxylic acid ligand (e.g., picolinate, dimethyl-3-pyrazolecarboxylate, and/or benzoate), a carbon monoxide ligand, an isonitrile ligand, a cyano group ligand, and phosphorus ligand (e.g., phosphine and/or phosphite), but embodiments of the present disclosure are not limited thereto.

In Formula 401, when $A_{401}$ has at least two substituent groups, the at least two substituents of $A_{401}$ may be linked to each other and form a saturated or unsaturated ring.

In Formula 401, when $A_{402}$ has at least two substituent groups, the at least two substituents of $A_{402}$ may be linked to each other and form a saturated or unsaturated ring.

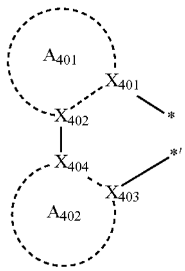

In Formula 401, when xc1 is 2 or greater, a plurality of ligands in Formula 401 may be identical to or different from each other. In Formula 401, when xc1 is 2 or greater, $A_{401}$ and $A_{402}$ of one ligand may each independently be linked to respective $A_{402}$ and $A_{402}$ of another neighboring ligand either directly (e.g., via a bond such as a single bond) or via a linking group (e.g., a $C_1$-$C_5$ alkylene group, —N(R')— (where, R' is a $C_1$-$C_{10}$ alkyl group or a $C_6$-$C_{20}$ aryl group), and/or —C(=O)—).

For example, the phosphorescent dopant may be selected from Compounds PD1 to PD76 (where "Ph" may refer to a phenyl group, "Me" may refer to a methyl group, and "$Bu^t$" may refer to a tert-butyl group), but embodiments are not limited thereto:

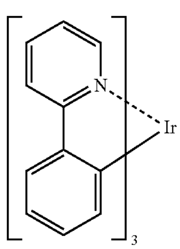
PD1

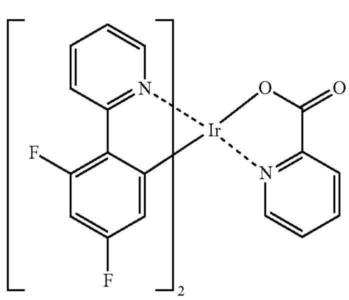
PD2

-continued

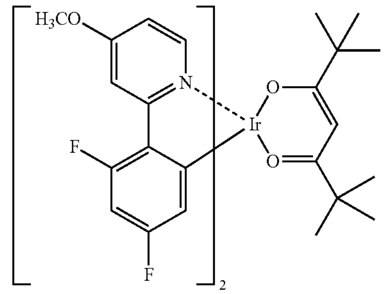
PD3

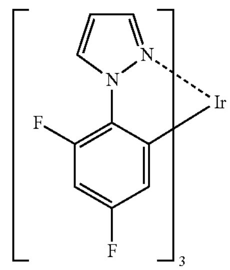
PD4

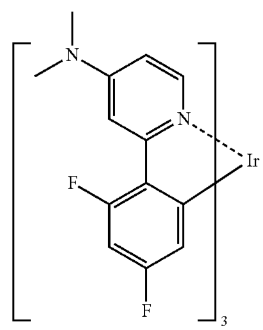
PD5

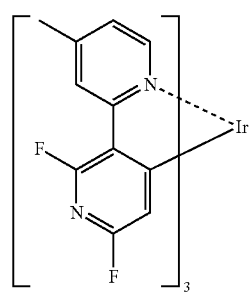
PD6

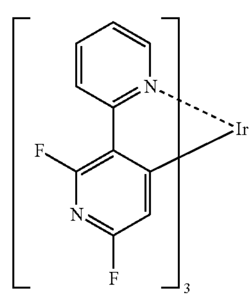
PD7

-continued
PD8
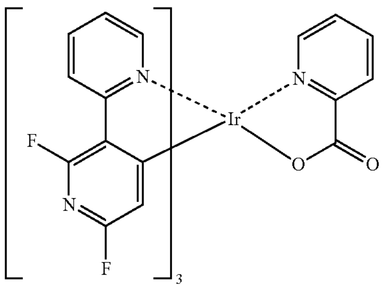
PD9
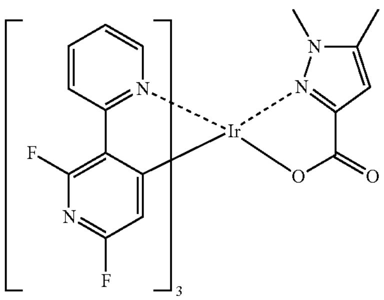
PD10
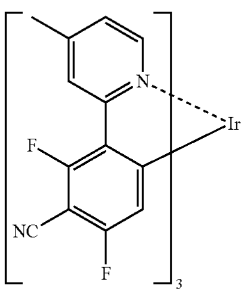
PD11
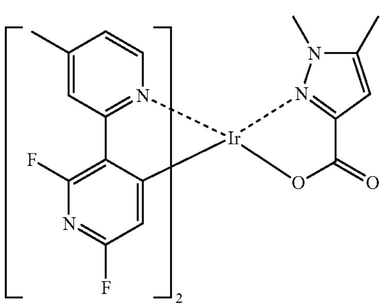
PD12
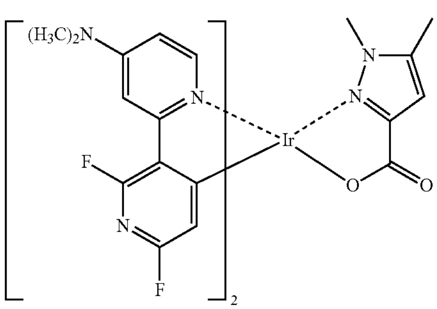
-continued
PD13
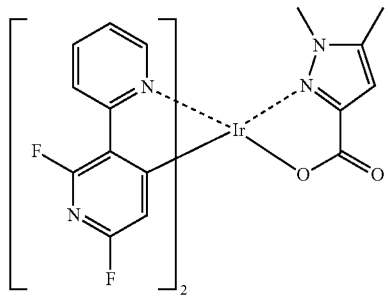
PD14
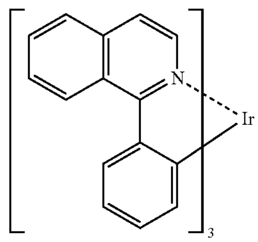
PD15
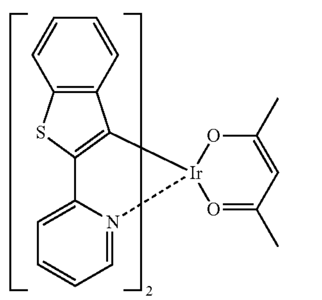
PD16
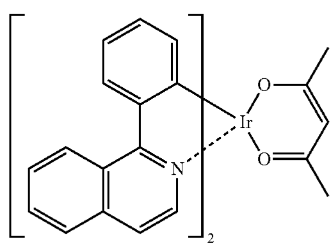
PD17
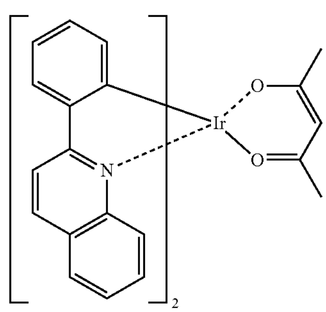

PD18
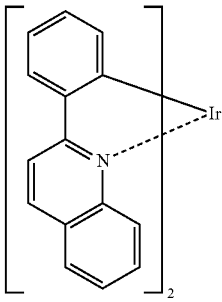
PD19
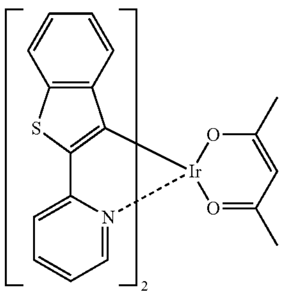
PD20
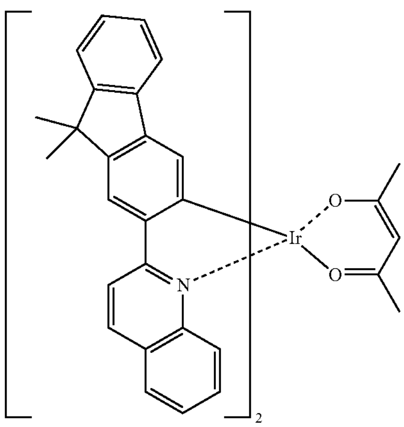
PD21
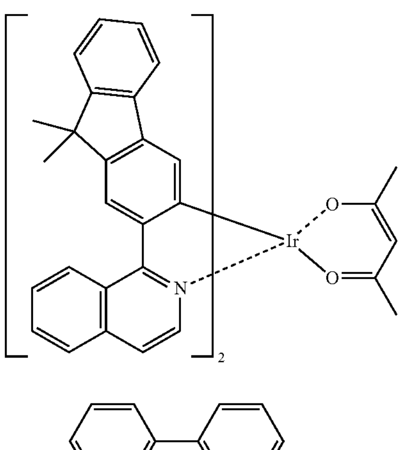
PD22
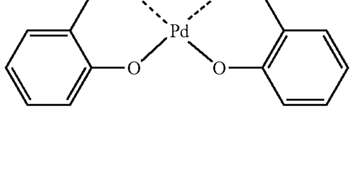
PD23
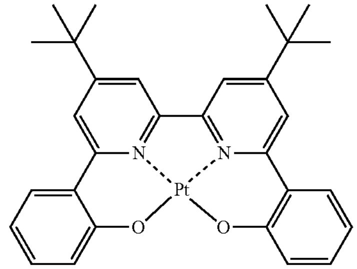
PD24
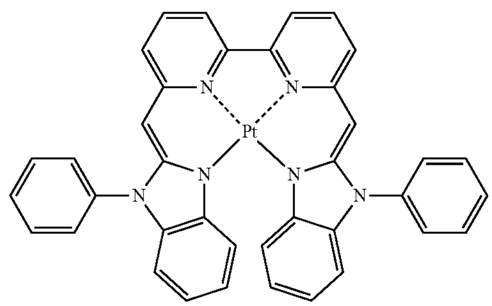
PD25
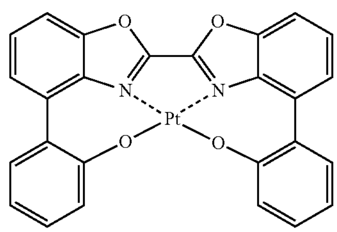
PD26
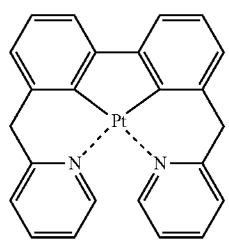
PD27
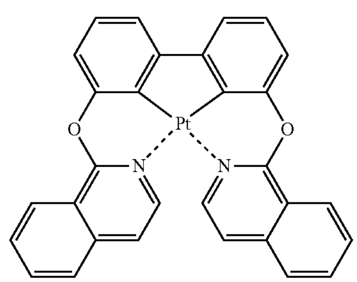
PD28
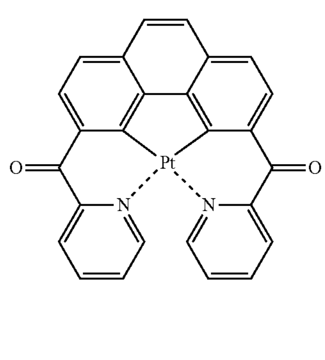

-continued
PD29
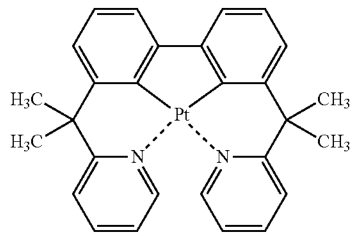
PD30
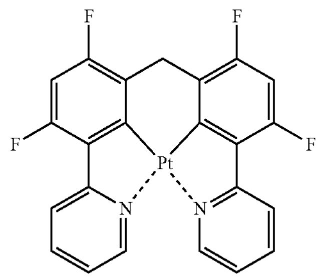
PD31
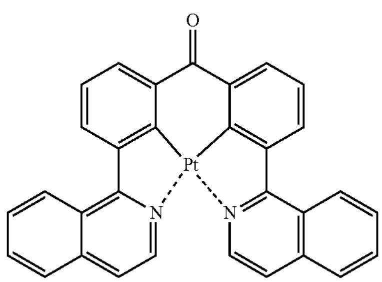
PD32
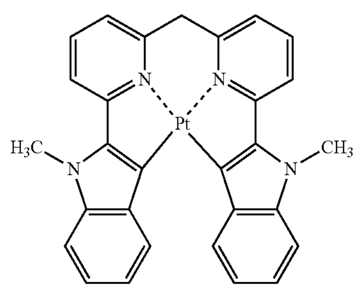
PD33
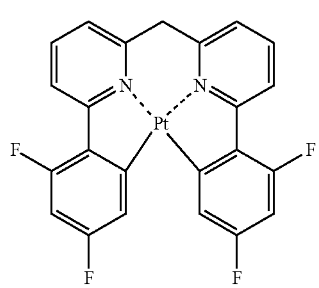
-continued
PD34
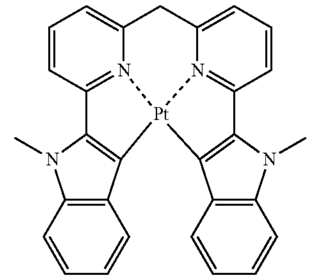
PD35
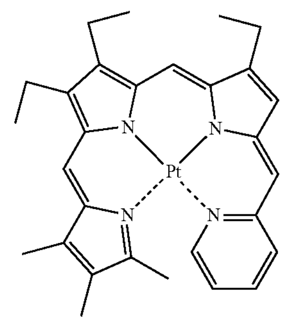
PD36
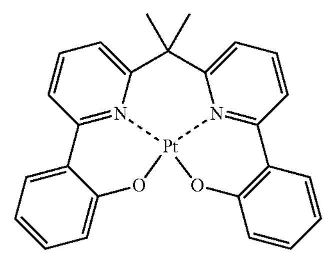
PD37
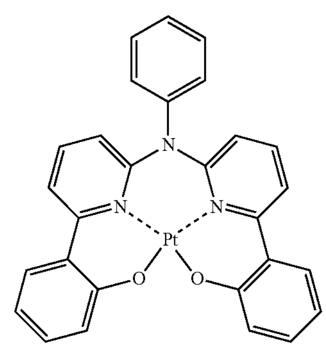
PD38
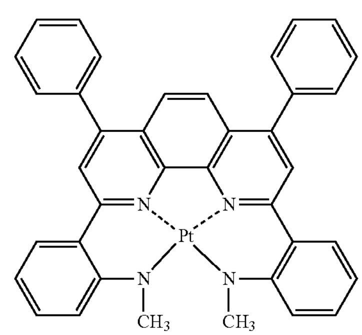

-continued
PD39
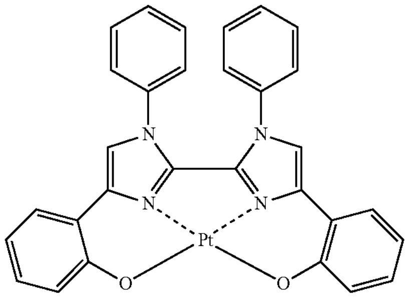
PD40
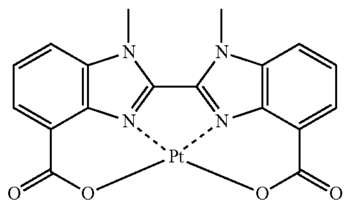
PD41
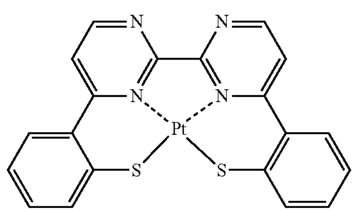
PD42
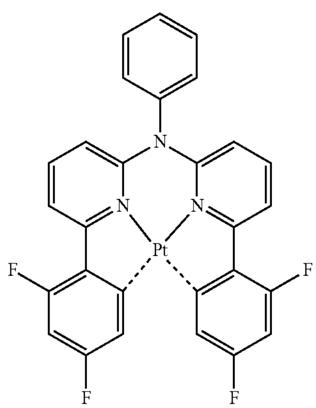
PD43
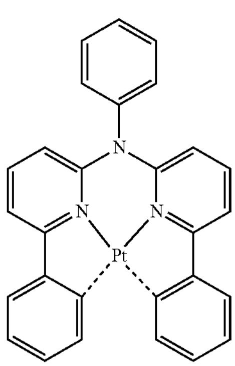
-continued
PD44
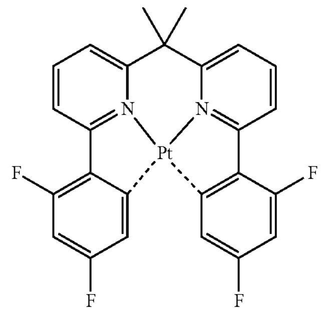
PD45
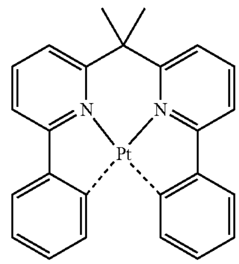
PD46
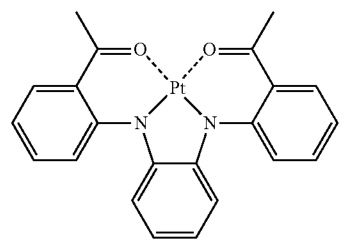
PD47
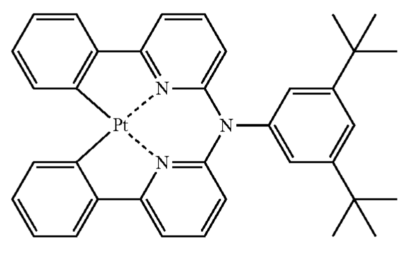
PD48
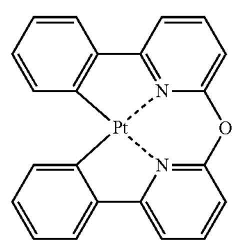
PD49
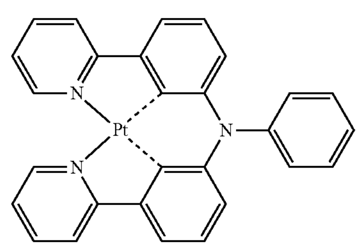

-continued
PD50
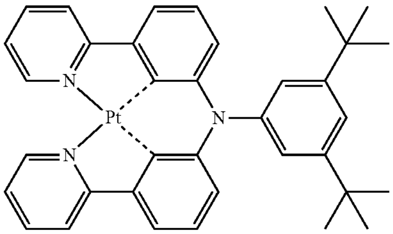
PD51
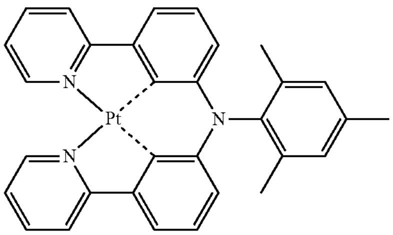
PD52
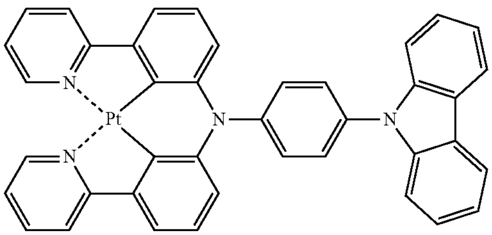
PD53
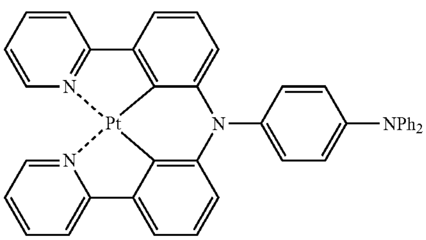
PD54
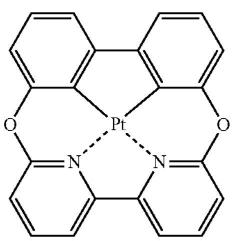
PD55
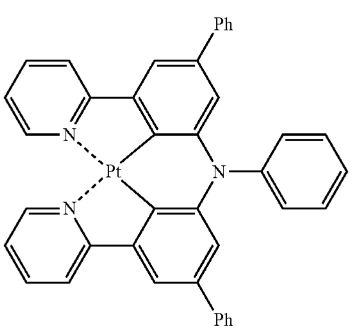
-continued
PD56
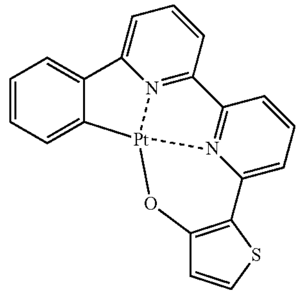
PD57
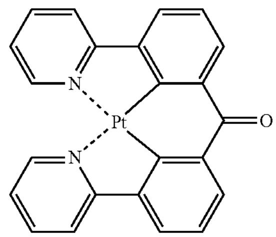
PD58
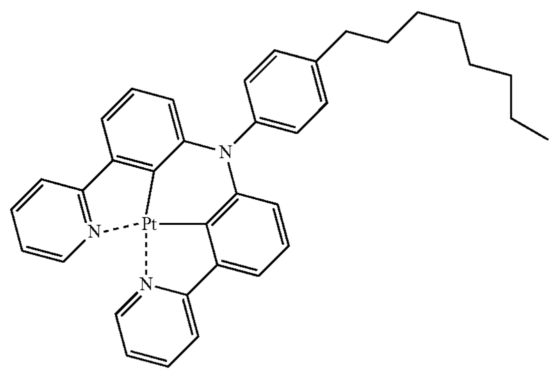
PD59
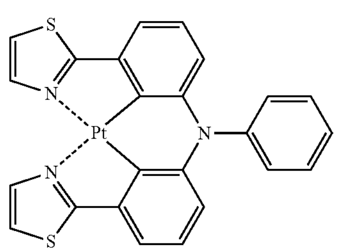
PD60
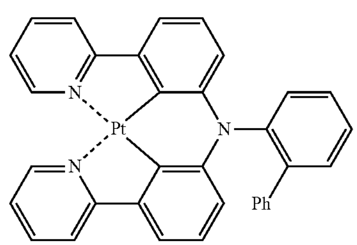

PD61
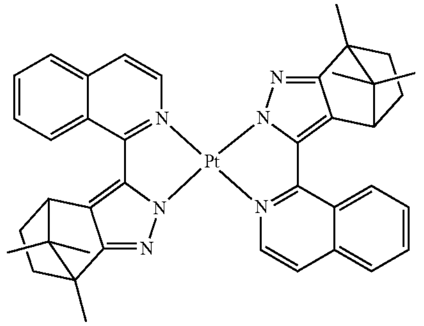
PD62
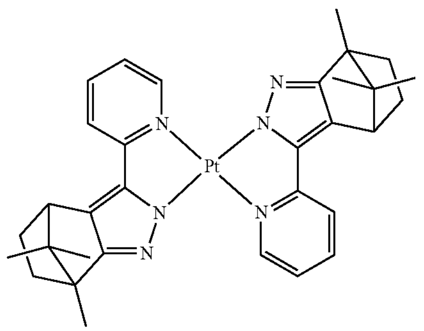
PD63
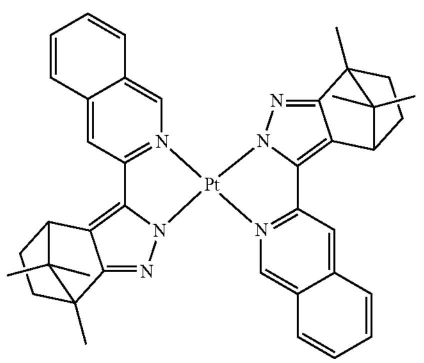
PD64
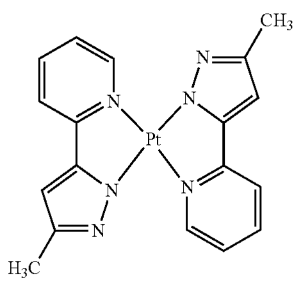
PD65
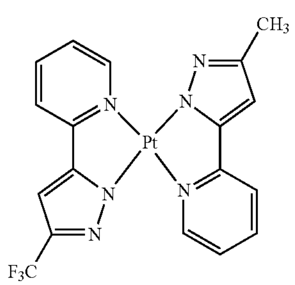
PD66
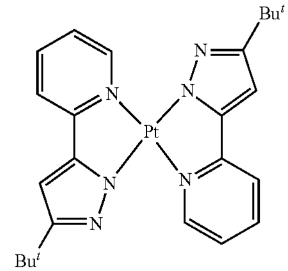
PD67
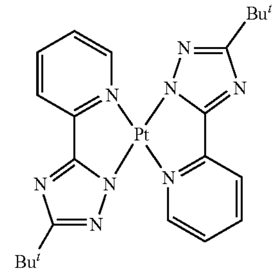
PD68
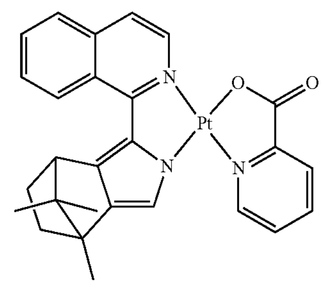
PD69
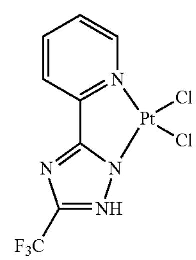
PD70
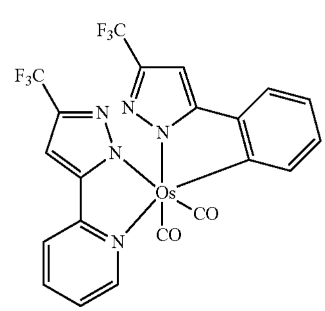

PD71
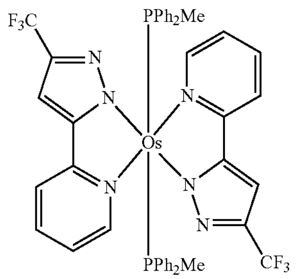
PD72
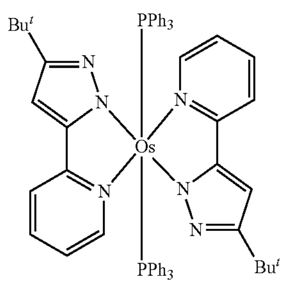
PD73
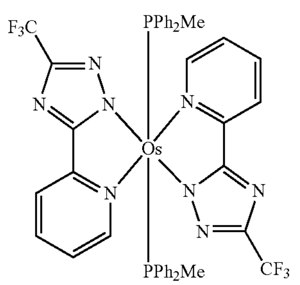
PD74
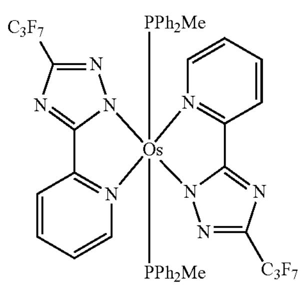
PD75
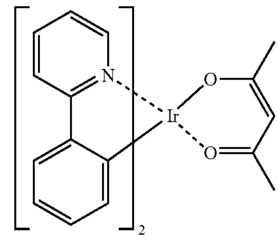
PD76
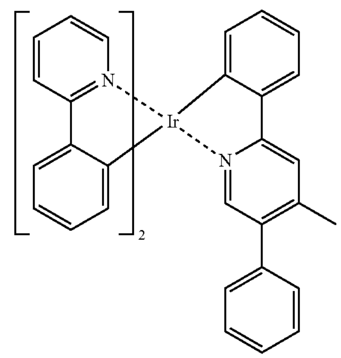
In some embodiments, the phosphorescent dopant may include PtOEP:
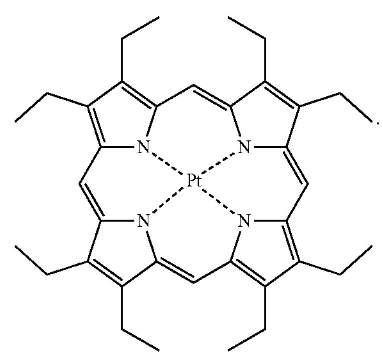
PtOEP
The fluorescent dopant may include at least one selected from DPVBi, DPAVBi, TBPe, DCM, DCJTB, Coumarin 6, and $C_{545}T$:
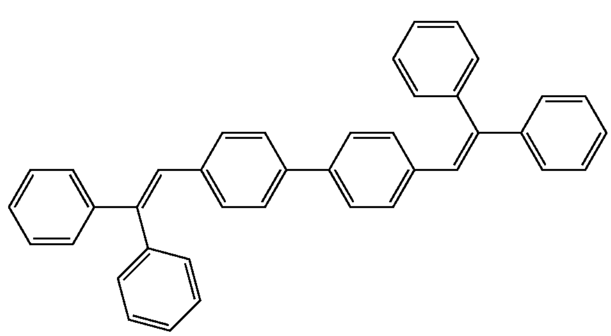
DPVBi -continued

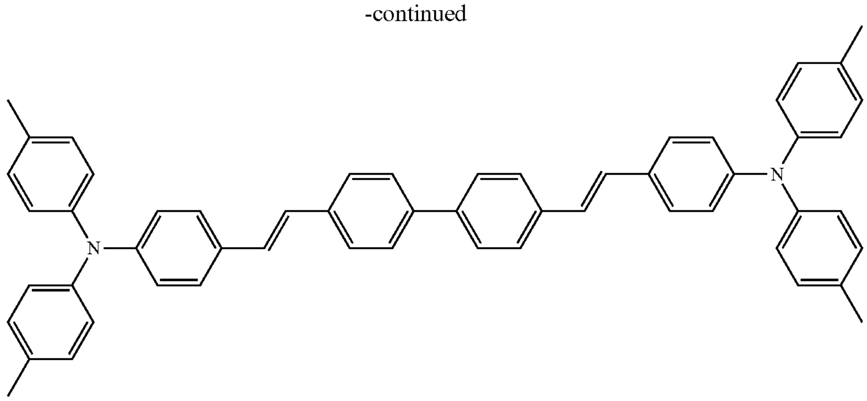

DPAVBi

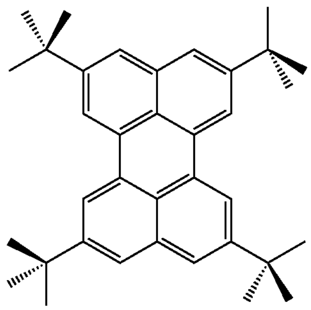

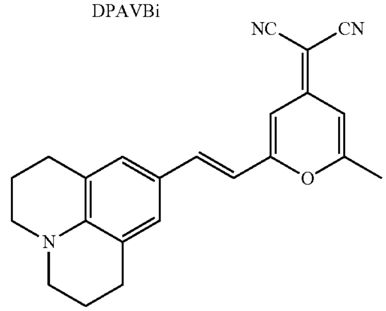

DCM

TBPe

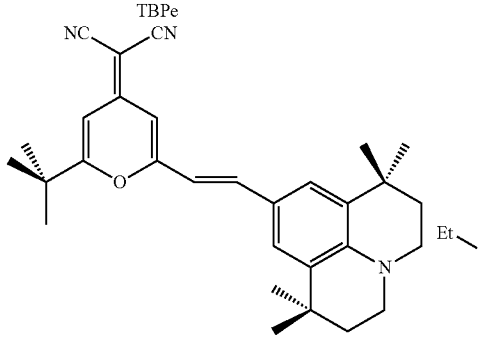

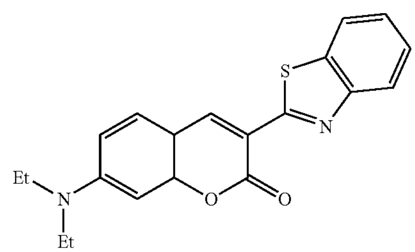

Coumarin 6

DCJTB

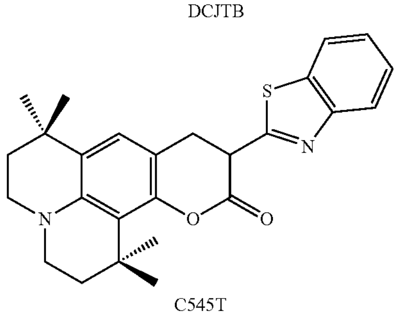

C545T

In some embodiments, the fluorescent dopant may include a compound represented by Formula 501:

Formula 501

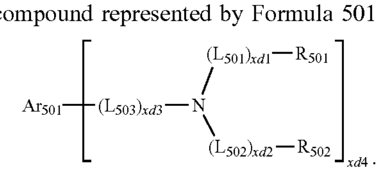

In Formula 501, $Ar_{501}$ may be selected from:

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, naphthacene, a picene, a perylene, a pentaphene, and an indenoanthracene; and a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, naphthacene, a picene, a perylene, a pentaphene, and an indenoanthracene, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{501}$)($Q_{502}$)($Q_{503}$) (where $Q_{501}$ to $Q_{503}$ may be each independently selected from hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group), $L_{501}$ to $L_{503}$ may be each independently defined the same as the definition provided herein in connection with $L_1$, $R_{501}$ and $R_{502}$ may be each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazole group, a triazinyl group, a dibenzofuranyl group, and a dibenzothiophenyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group, xd1 to xd3 may be each independently selected from 0, 1, 2, and 3, and xd4 may be selected from 1, 2, 3, and 4.

The fluorescent dopant may include at least one of Compounds FD1 to FD9:

FD1

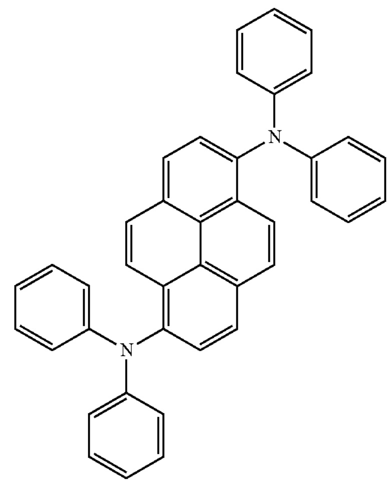

FD2

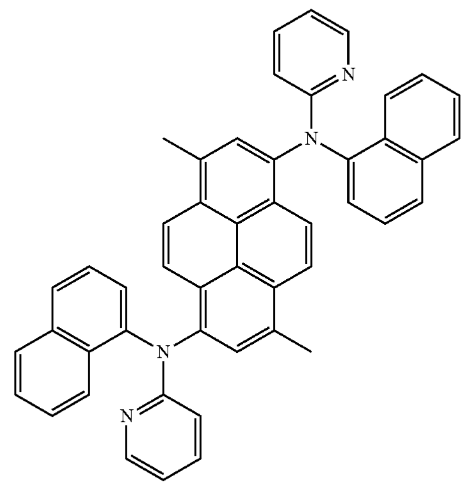

FD3

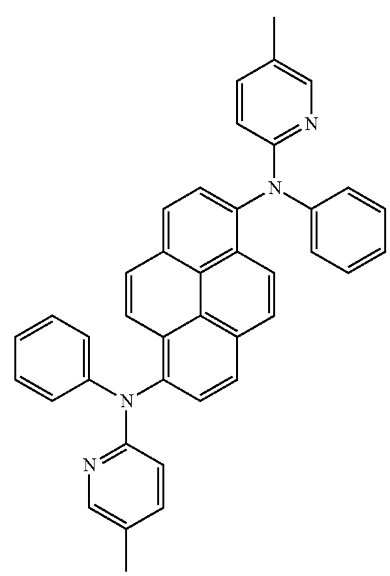

FD4

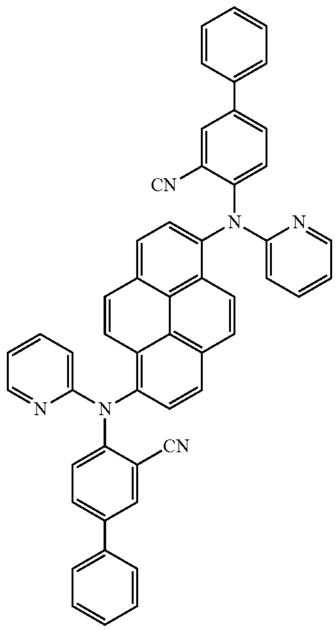

FD5

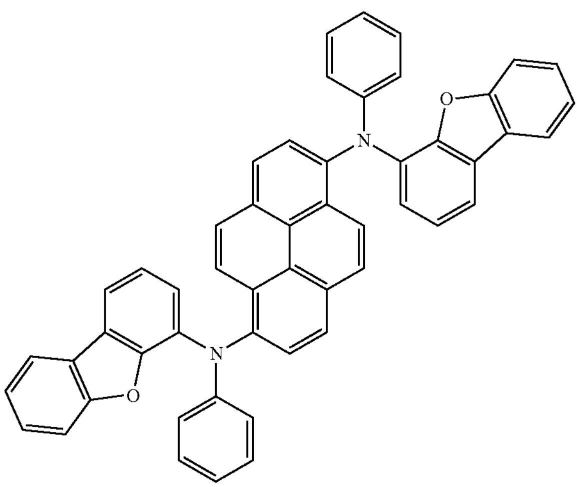

FD6

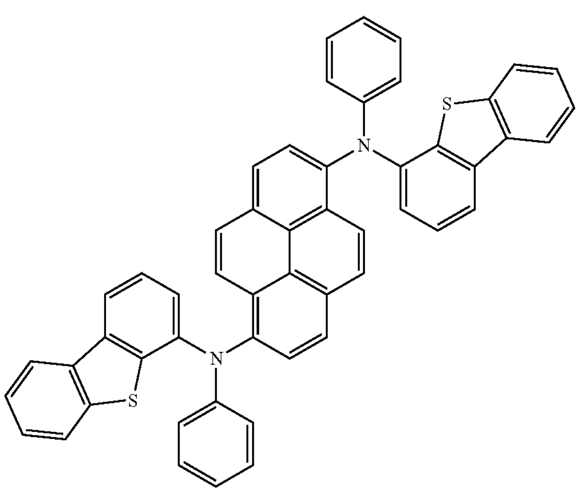

FD7

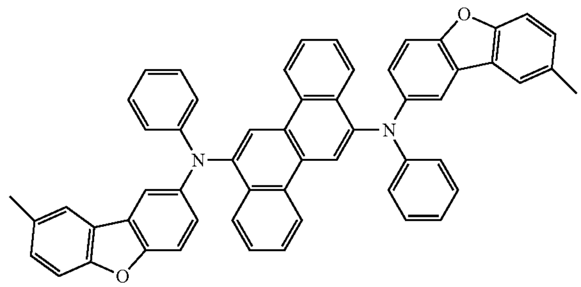

FD8

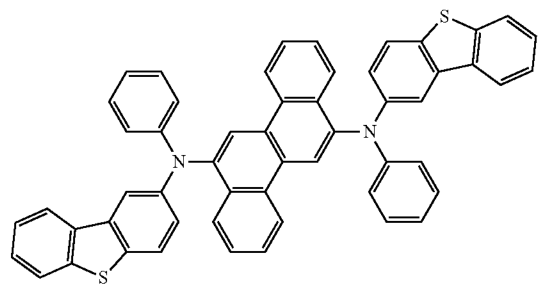

FD9

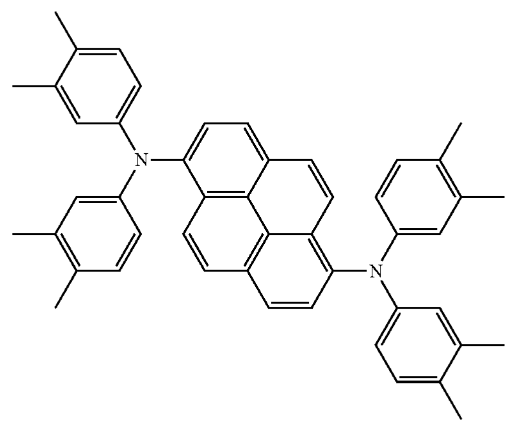

The hole transport region may include at least one selected from a hole injection layer (HIL), a hole transport layer (HTL), a buffer layer, and an electron blocking layer (EBL), and the electron transport region may include at least one selected from a hole blocking layer (HBL), an electron transport layer (ETL), and an electron injection layer (EIL), but embodiments of the present disclosure are not limited thereto.

The hole transport region may have a single-layered structure formed of a single material, a single-layered structure formed of a plurality of different materials, or a multi-layered structure having a plurality of layers formed of a plurality of different materials.

For example, the hole transport region may have a single-layered structure formed of a plurality of different materials, or a structure of hole injection layer/hole transport layer, a structure of hole injection layer/hole transport layer/buffer layer, a structure of hole injection layer/buffer layer, a structure of hole transport layer/buffer layer, or a structure of hole injection layer/hole transport layer/electron blocking layer, wherein the layers of each structure are sequentially stacked from the first electrode 110 in this stated order, but embodiments are not limited thereto.

When the hole transport region includes a hole injection layer, the hole injection layer may be formed on the first electrode 110 by using one or more suitable methods, such as vacuum-deposition, spin coating, casting, Langmuir-Blodgett (LB) method, ink-jet printing, laser-printing, and/or laser-induced thermal imaging (LITI).

When a hole injection layer is formed by vacuum deposition, for example, the vacuum deposition may be performed at a deposition temperature in a range of about 100° C. to about 500° C., at a vacuum degree in a range of about $10^{-8}$ torr to about $10^{-3}$ torr, and at a deposition rate in a range of about 0.01 Å/sec to about 100 Å/sec, in consideration of a compound for forming the hole injection layer to be deposited, and the structure of the hole injection layer to be formed.

When a hole injection layer is formed by spin coating, the spin coating may be performed at a coating rate in a range of about 2000 rpm to about 5000 rpm, and at a temperature in a range of about 80° C. to 200° C., in consideration of a compound for forming the hole injection layer to be deposited, and the structure of the hole injection layer to be formed.

When the hole transport region includes a hole transport layer, the hole transport layer may be formed on the first electrode 110 or the hole injection layer by using one or more suitable methods, such as vacuum-deposition, spin coating, casting, LB method, ink-jet printing, laser-printing, and/or LITI. When the hole transport layer is formed by vacuum-deposition and/or spin coating, conditions for vacuum-deposition and coating may be similar to the above-described vacuum-deposition and coating conditions for forming the hole injection layer.

The hole transport region may include at least one selected from m-MTDATA, TDATA, 2-TNATA, NPB, (3-NPB, TPD, spiro-TPD, spiro-NPB, methylated-NPB, TAPC, HMTPD, 4,4',4"-tris(N-carbazolyl)triphenylamine (TCTA), polyaniline/dodecylbenzenesulfonic acid (Pani/DBSA), poly(3,4-ethylenedioxythiophene)/poly(4-styrenesulfonate) (PEDOT/PSS), polyaniline/camphor sulfonicacid (Pani/CSA), (polyaniline)/poly(4-styrenesulfonate) (PANI/PSS), a compound represented by Formula 201 below, and a compound represented by Formula 202 below:

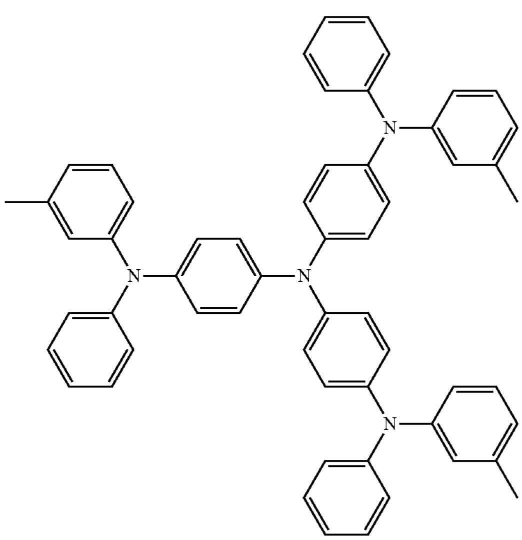

m-MTDATA

-continued

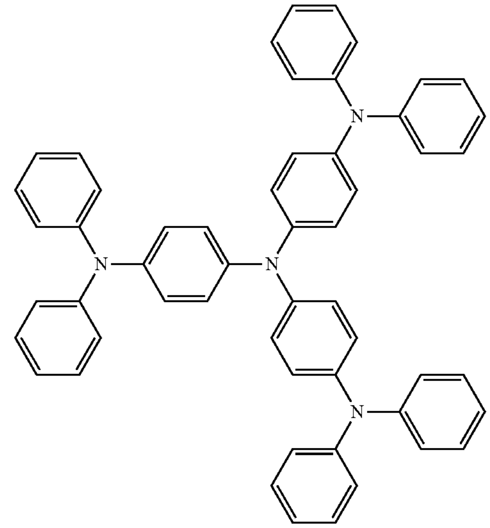

TDATA

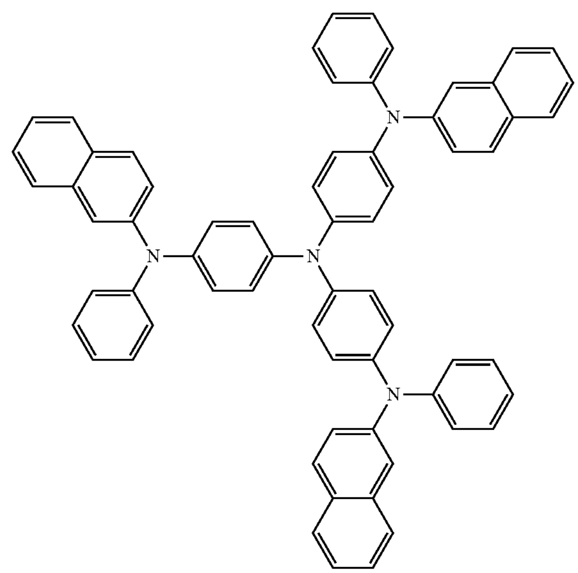

2-TNATA

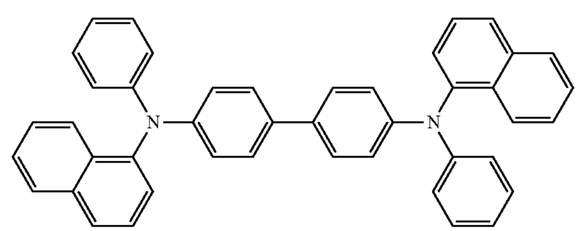

NPB

-continued
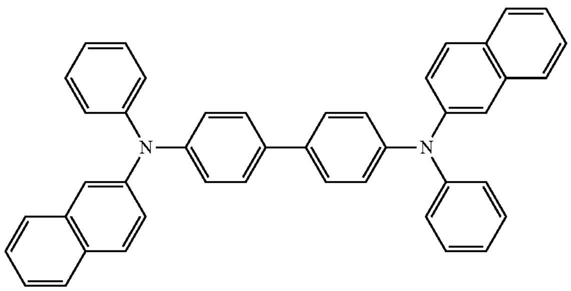
β-NPB
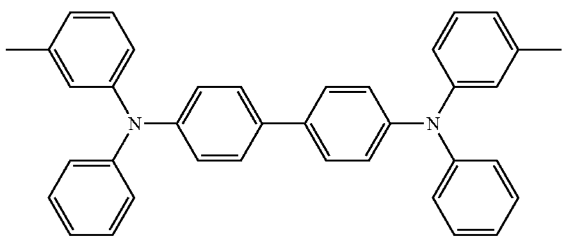
TPD
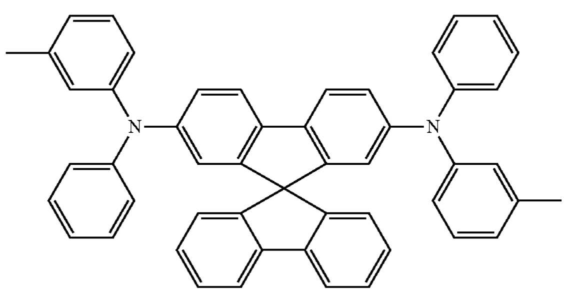
Spiro-TBD
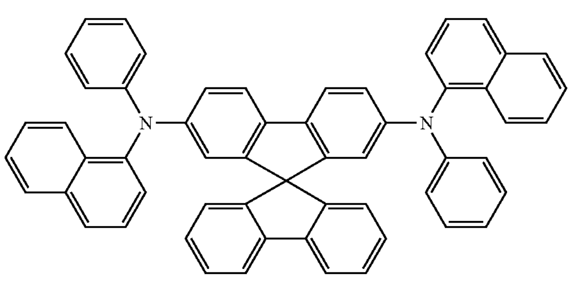
Spiro-NPB
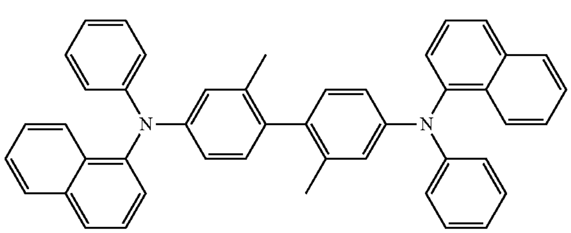
methylated NPB
-continued
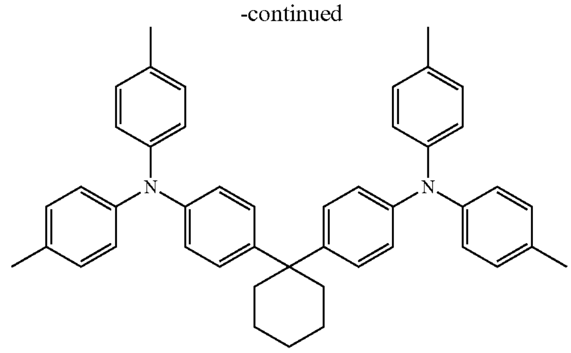
TAPC
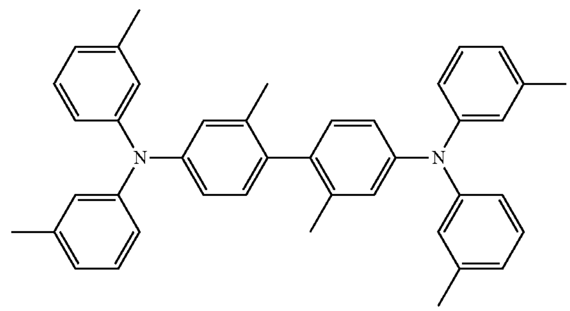
HMTPD
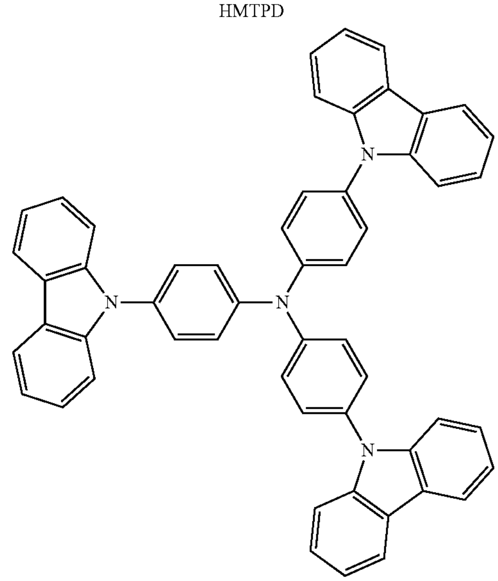
TCTA
Formula 201
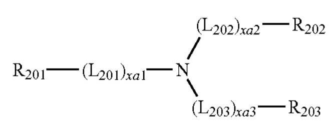
Formula 202
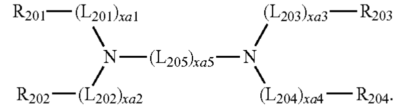
In Formulae 201 and 202,
$L_{201}$ to $L_{205}$ may be each independently defined the same as the definition provided herein in connection with $L_1$,
xa1 to xa4 may be each independently selected from 0, 1, 2, and 3,
xa5 may be selected from 1, 2, 3, 4, and 5, and $R_{201}$ to $R_{204}$ may be each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In some embodiments, in Formulae 201 and 202, $L_{201}$ to $L_{205}$ may be each independently selected from:

a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, an isoindolyl group, a quinolinyl group, an isoquinolinyl group, a quinoxalinyl group, a quinazolinyl group, a carbazolyl group, and a triazinyl group, xa1 to xa4 may be each independently 0, 1, or 2;

xa5 may be 1, 2, or 3;

$R_{201}$ to $R_{204}$ may be each independently selected from:

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, but embodiments are not limited thereto.

The compound represented by Formula 201 may be represented by Formula 201A:

Formula 201A

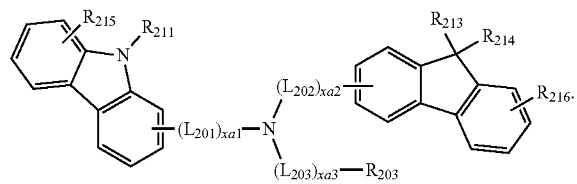

In some embodiments, the compound represented by Formula 201 may be represented by Formula 201A-1, but embodiments are not limited thereto:

Formula 201A-1

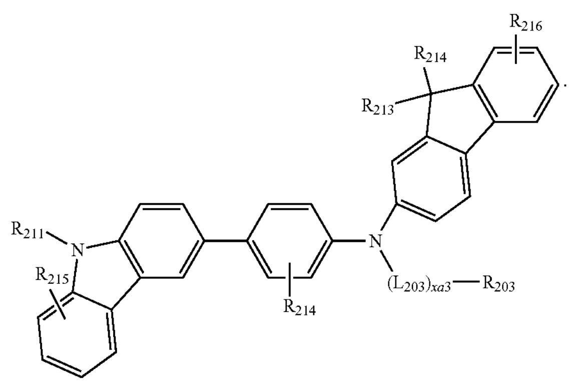

The compound represented by Formula 202 may be represented by Formula 202A, but embodiments are not limited thereto:

Formula 202A

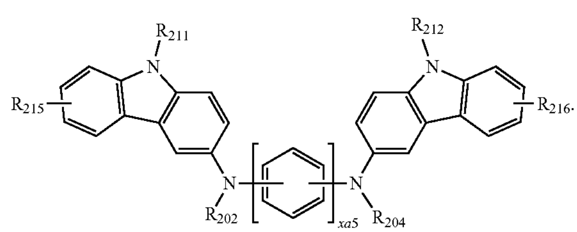

In Formulae 201A, 201A-1, and 202A, $L_{201}$ to $L_{203}$, xa1 to xa3, xa5, and $R_{202}$ to $R_{204}$ may be each independently understood by referring to their respective descriptions provided herein, $R_{211}$ and $R_{212}$ may be each independently defined the same as the definition provided in connection with $R_{203}$, and $R_{213}$ to $R_{216}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group.

In some embodiments, in Formulae 201A, 201A-1, and 202A, $L_{201}$ to $L_{203}$ may be each independently selected from:

a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, xa1 to xa3 may be each independently 0 or 1, $R_{203}$, $R_{204}$, $R_{211}$, and $R_{212}$ may be each independently selected from:

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, $R_{213}$ and $R_{214}$ may be each independently selected from:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, $R_{215}$ and $R_{216}$ may be each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, and xa5 may be 1 or 2.

In Formulae 201A and 201A-1, $R_{213}$ and $R_{214}$ may be linked to each other and form a saturated or unsaturated ring.

The compound represented by Formula 201 and the compound represented by Formula 202 may each independently include at least one selected from Compounds HT1 to HT20, but embodiments are not limited thereto:

HT1

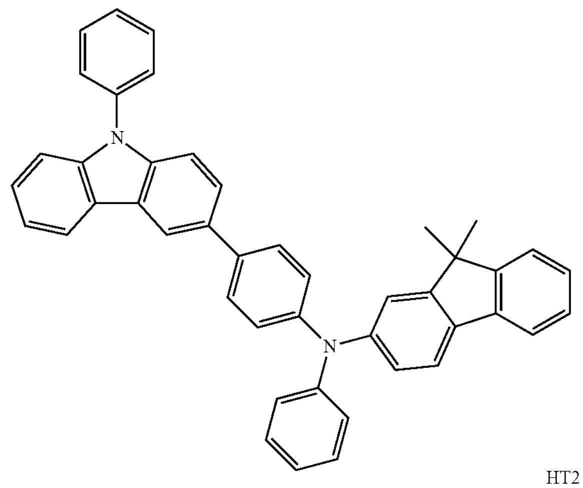

HT2

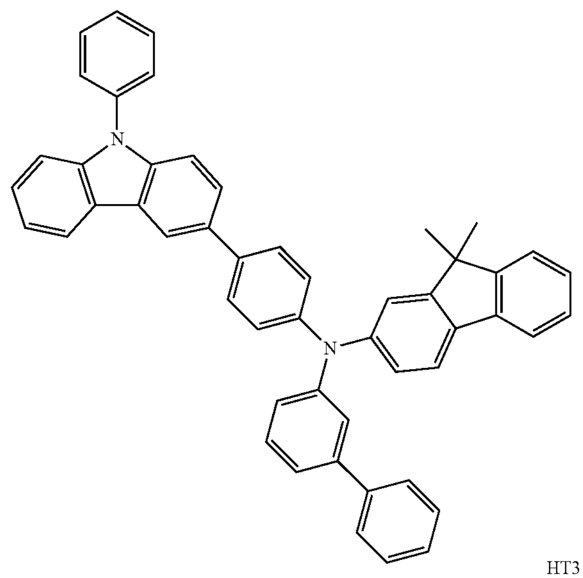

HT3

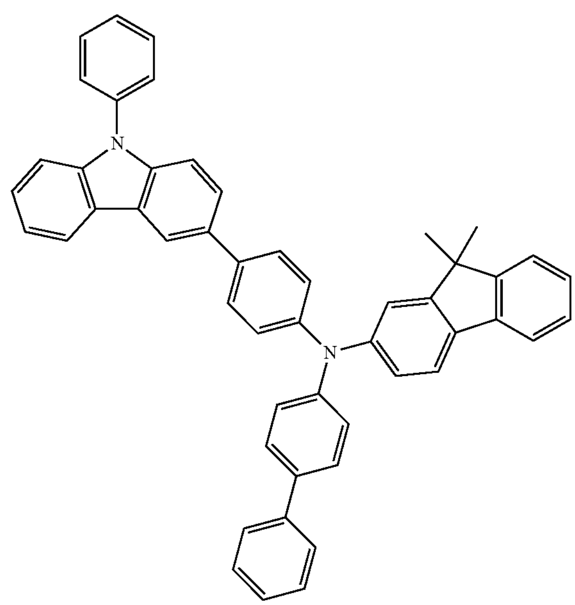

-continued
HT4
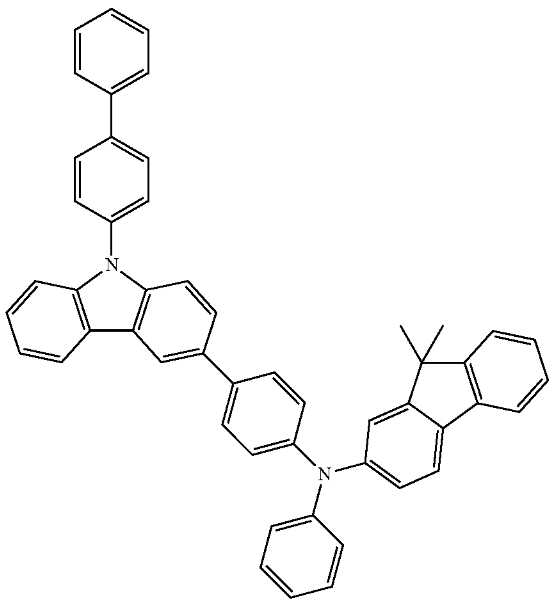
-continued
HT6
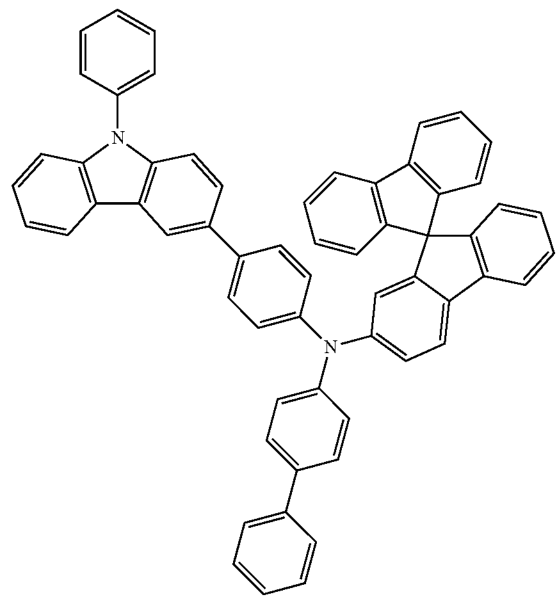
HT5
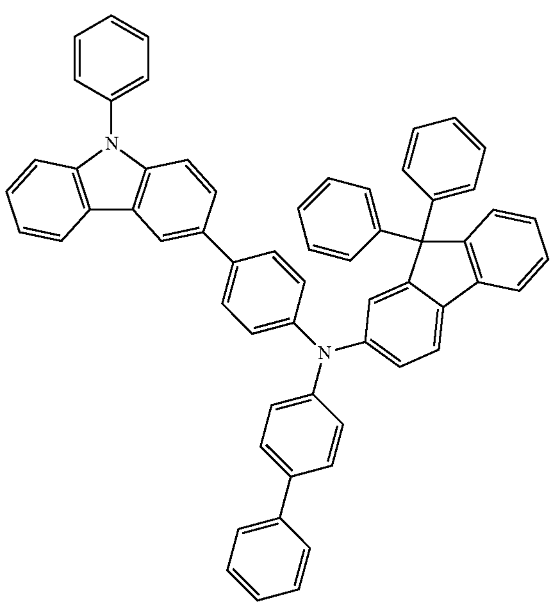
HT7
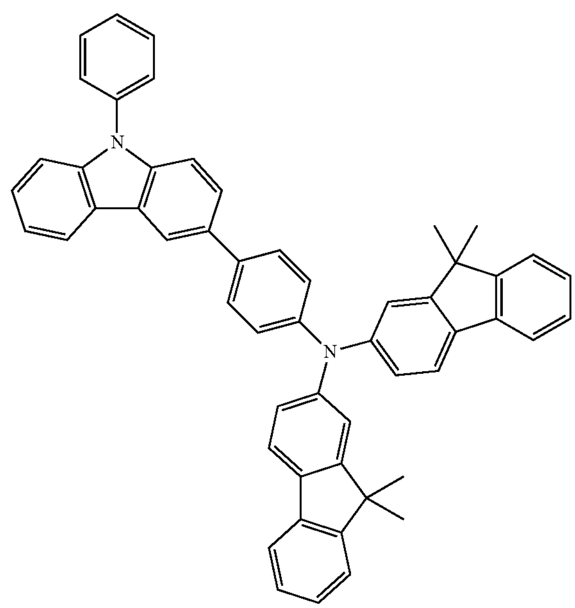

-continued
HT8
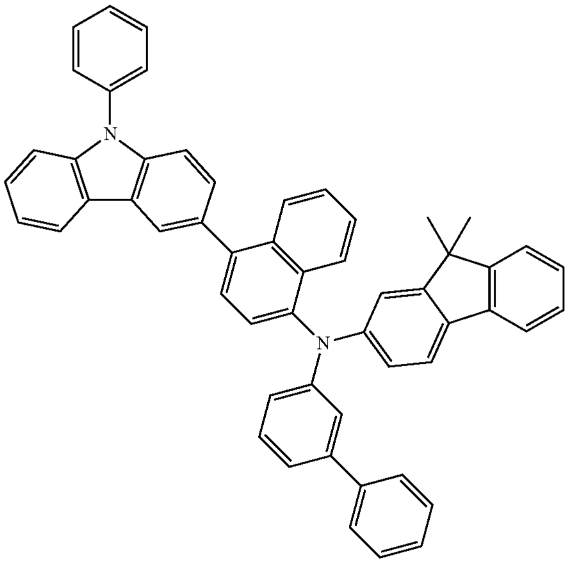
HT9
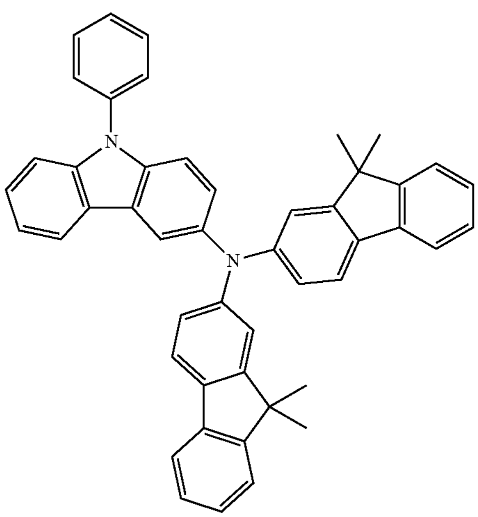
-continued
HT10
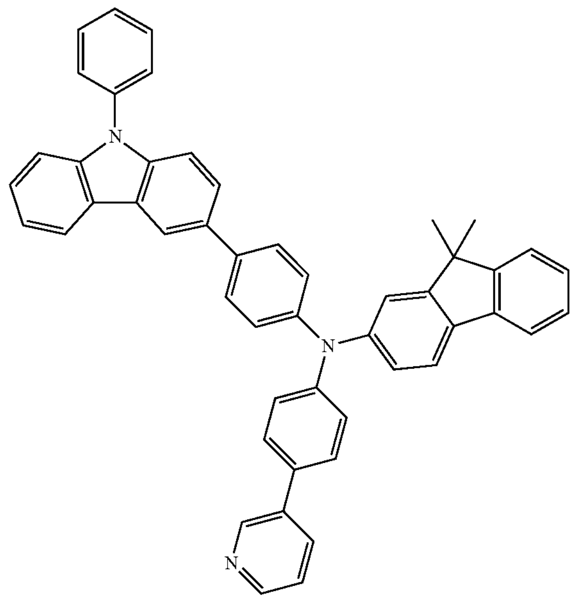
HT11
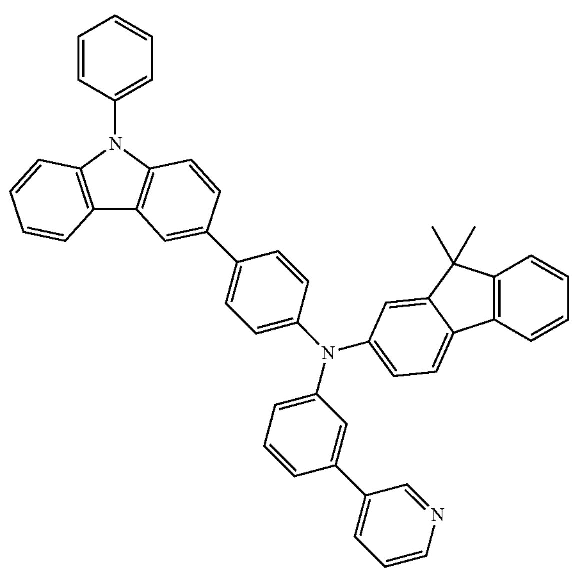

-continued
HT12
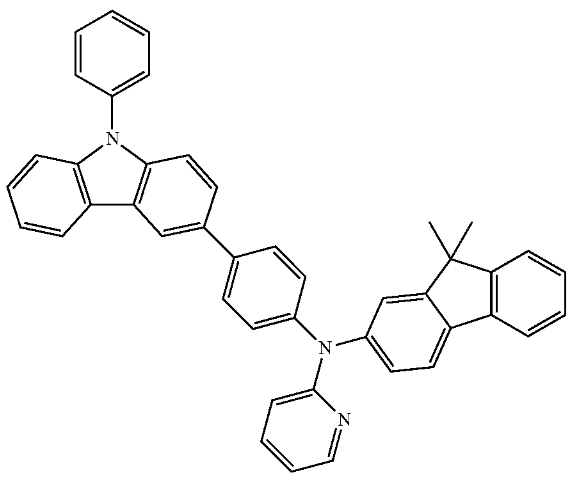
HT13
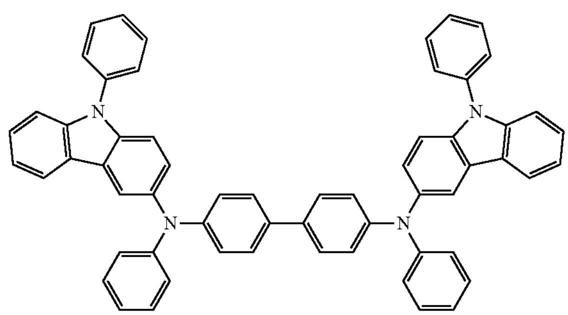
HT14
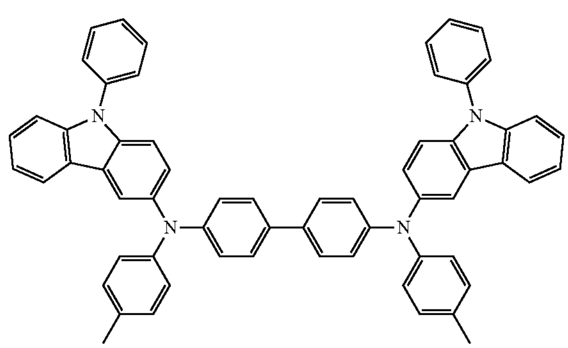
HT15
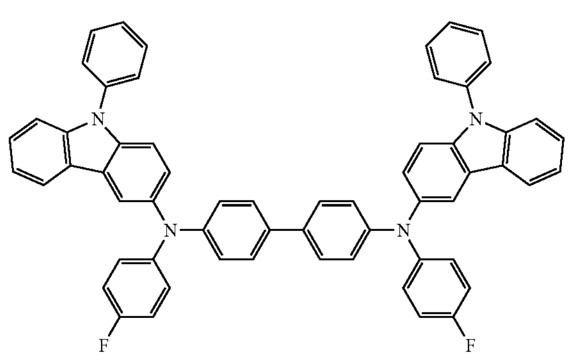
-continued
HT16
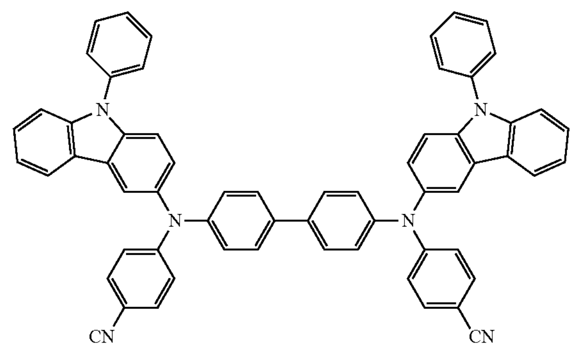
HT17
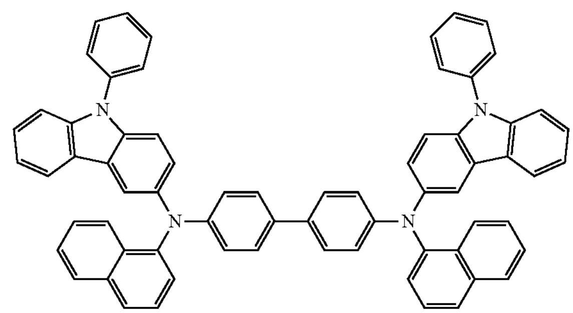
HT18
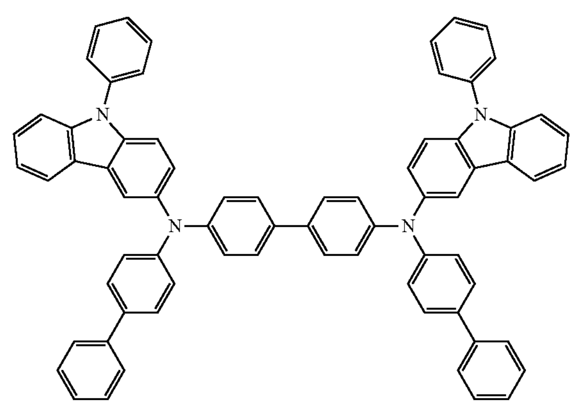
HT19
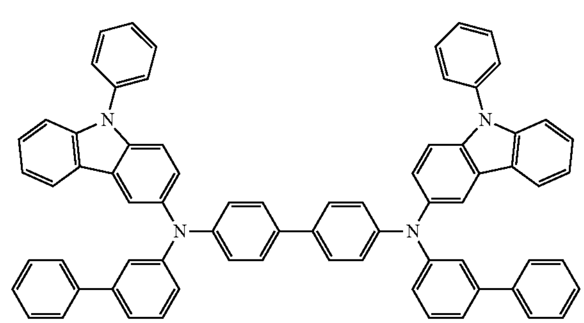

-continued

HT20

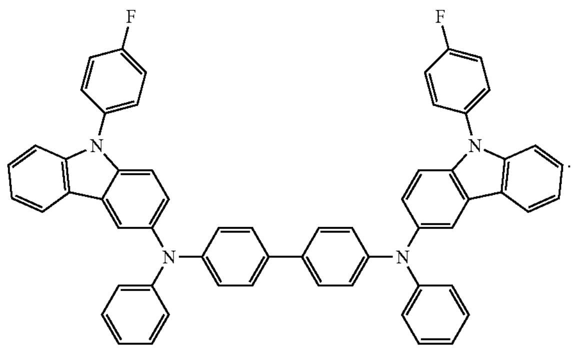

A thickness of the hole transport region may be in a range of about 100 Å to about 10,000 Å, for example, about 100 Å to about 1,000 Å. For example, when the hole transport region includes both the hole injection layer and the hole transport layer, a thickness of the hole injection layer may be in a range of about 100 Å to about 10,000 Å, for example about 100 Å to about 1,000 Å, and a thickness of the hole transport layer may be in a range of about 50 Å to about 2,000 Å, for example, about 100 Å to about 1,500 Å. When thicknesses of the hole transport region, hole injection layer, and hole transport layer are within any of these ranges, satisfactory hole transport characteristics may be obtained without a substantial increase in a driving voltage.

The hole transport region may further include a charge generating material to increase conductivity, in addition to the above-described materials. The charge generating material may be homogeneously or non-homogenously dispersed in the hole transport region.

The charge generating material may be, for example, a p-dopant. Examples of the p-dopant may include quinone derivatives, metal oxides, and cyano group-containing compounds. For example, the p-dopant may be selected from quinone derivatives (such as tetracyanoquinodimethane (TCNQ) and/or 2,3,5,6,-tetrafluoro-tetracyano-1,4-benzoquinoneodimethane (F4-TCNQ)); metal oxides (such as tungsten oxide and/or molybdenum oxide); and Compound HT-D1, but embodiments are not limited thereto.

Compound HT-D1

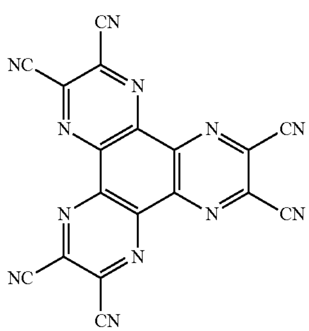

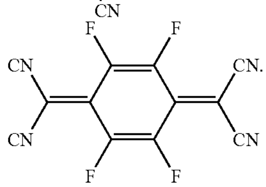

F4-TCNQ

The hole transport region may further include at least one selected from a buffer layer and an electron blocking layer, in addition to the hole injection layer and the hole transport layer. The buffer layer may compensate for an optical resonance distance according to a wavelength of light emitted from the emission layer. Accordingly, the light-emission efficiency of the organic light-emitting device including the buffer layer may improve. A material for the buffer layer may be a material that is also included in the hole transport region. The electron blocking layer may prevent or reduce the injection of electrons from the electron transport region.

For example, a material for the electron blocking layer may be mCP, but embodiments of the present disclosure are not limited thereto.

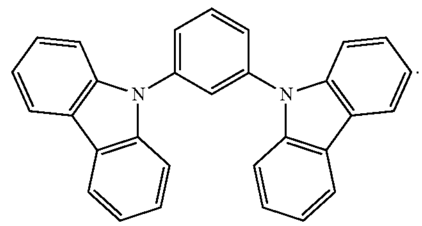

mCP

The electron transport region may include at least one selected from a hole blocking layer (HBL), an electron transport layer (ETL), and an electron injection layer (EIL), but embodiments of the present disclosure are not limited thereto.

For example, the electron transport region may have a structure of electron transport layer/electron injection layer or hole blocking layer/electron transport layer/electron injection layer, where the layers of each structure are sequentially stacked on the emission layer, but embodiments are not limited thereto.

The electron transport region may include a hole blocking layer. When the emission layer includes the phosphorescent dopant, the hole blocking layer may be formed to prevent or reduce the diffusion of triplet excitons or holes into the electron transport layer.

When the electron transport region includes a hole blocking layer, the hole blocking layer may be formed on the emission layer by using one or more suitable methods, such as vacuum-deposition, spin coating, casting, LB method, ink-jet printing, laser-printing, and/or LITI. When the hole blocking layer is formed by vacuum-deposition and/or spin coating, deposition and coating conditions for the hole blocking layer may be determined by referring to the deposition and coating conditions for the hole injection layer.

The hole blocking layer may include, for example, at least one selected from BCP and Bphen, but embodiments are not limited thereto:

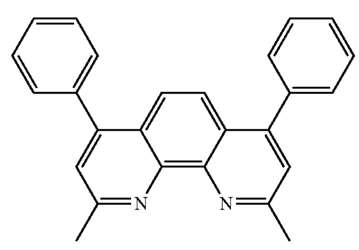

BCP

-continued

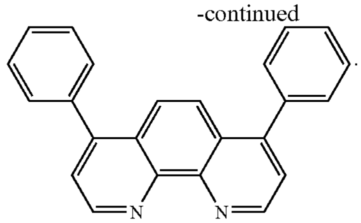

Bphen

A thickness of the hole blocking layer may be in a range of about 20 Å to about 1000 Å, for example, about 30 Å to about 300 Å. When the thickness of the hole blocking layer is within any of these ranges, excellent hole blocking characteristics may be obtained without a substantial increase in driving voltage.

The electron transport region may include an electron transport layer. The electron transport layer may be formed on the emission layer or the hole blocking layer by using one or more suitable methods, such as vacuum deposition, spin coating, casting, LB method, ink-jet printing, laser-printing, and/or LITI. When the electron transport layer is formed by using vacuum deposition and/or spin coating, vacuum deposition and coating conditions for the electron transport layer may be determined by referring to the vacuum deposition and coating conditions for the hole injection layer.

In some embodiments, the electron transport layer may include at least one selected from a compound represented by Formula 601 and a compound represented by Formula 602:

$$Ar_{601}\text{-}[(L_{601})_{xe1}\text{-}E_{601}]_{xe2}. \qquad \text{Formula 601}$$

In Formula 601, $Ar_{601}$ may be selected from:

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene; and a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, naphthacene, a picene, a perylene, a pentaphene and an indenoanthracene, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ ARYL group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{301}$)($Q_{302}$)($Q_{303}$); wherein $Q_{301}$ to $Q_{303}$ may be each independently selected from hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group;

the description for $L_{601}$ may be the same as the description provided in connection with $L_1$ herein;

$E_{601}$ may be selected from:

a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group;

xe1 may be selected from 0, 1, 2, and 3; and xe2 may be selected from 1, 2, 3, and 4.

Formula 602

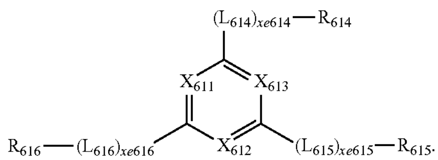

In Formula 602, $X_{611}$ may be N or C-$(L_{611})_{xe611}$-$R_{611}$, $X_{612}$ may be N or C-$(L_{612})_{xe612}$-$R_{612}$, $X_{613}$ may be N or C-$(L_{613})_{xe613}$-$R_{613}$, and at least one selected from $X_{611}$ to $X_{613}$ may be N;

$L_{611}$ to $L_{616}$ may be each independently defined the same as the description provided in connection with $L_1$;

$R_{611}$ to $R_{616}$ may be each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xe611 to xe616 may be each independently selected from 0, 1, 2, and 3.

The compound represented by Formula 601 and the compound represented by Formula 602 may be each independently selected from Compounds ET1 to ET15:

ET1

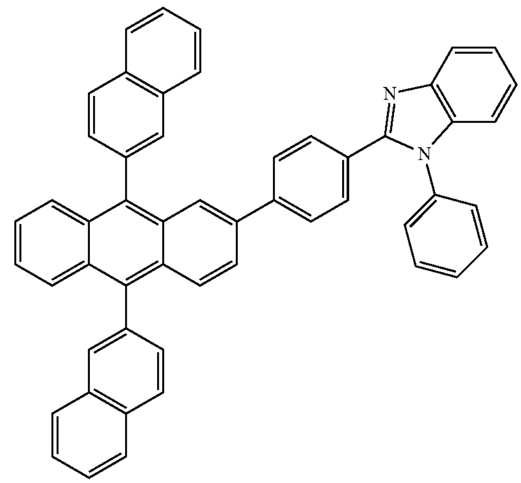

ET2

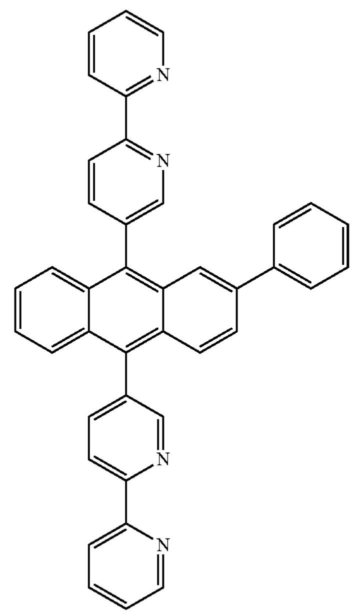

ET3

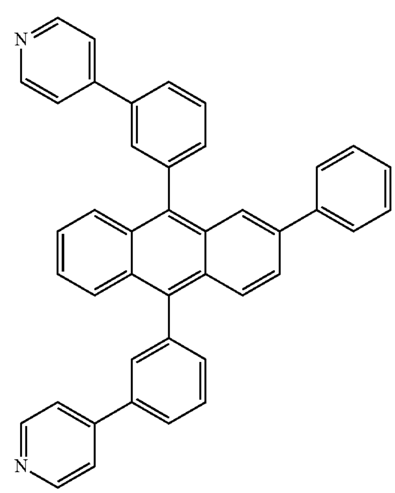

-continued
ET4
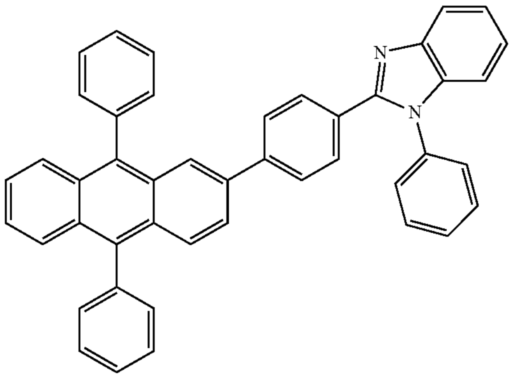
ET5
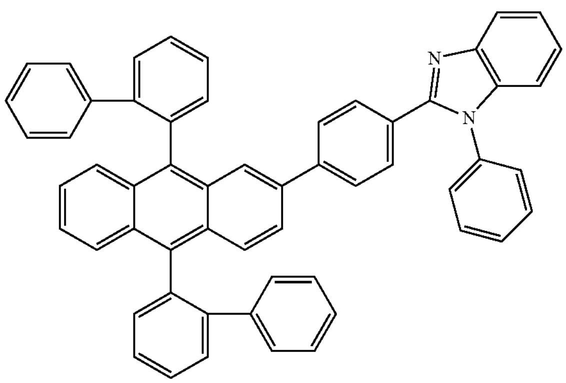
ET6
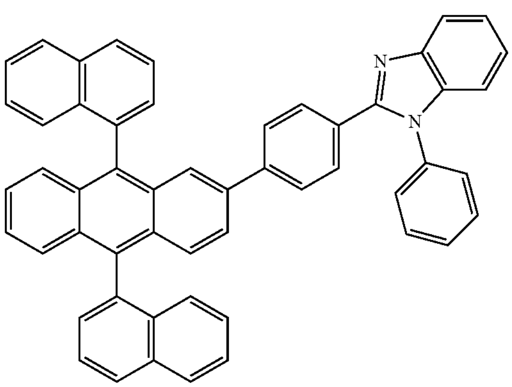
-continued
ET7
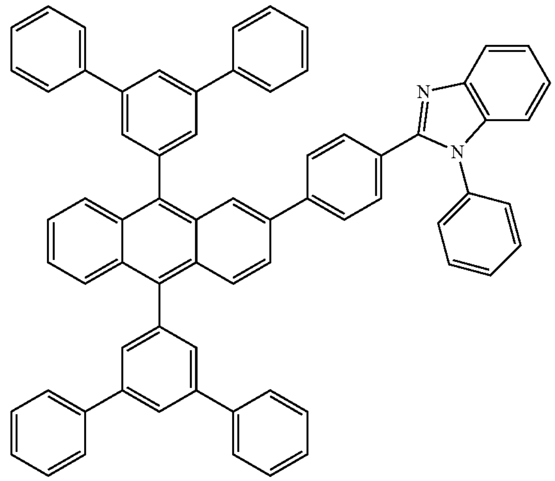
ET8
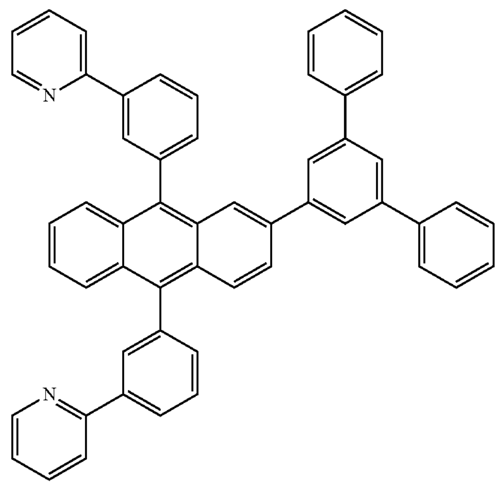
ET9
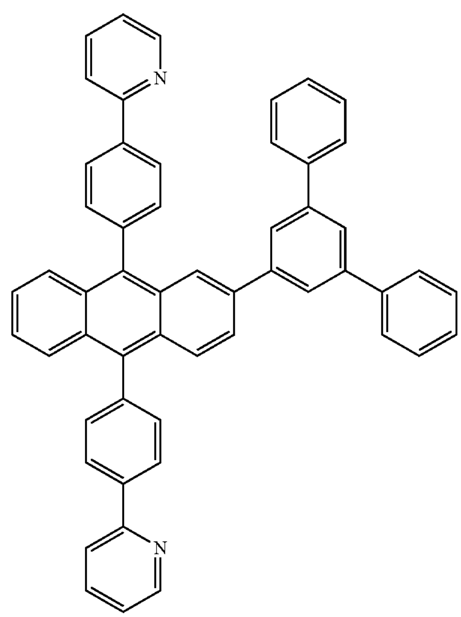

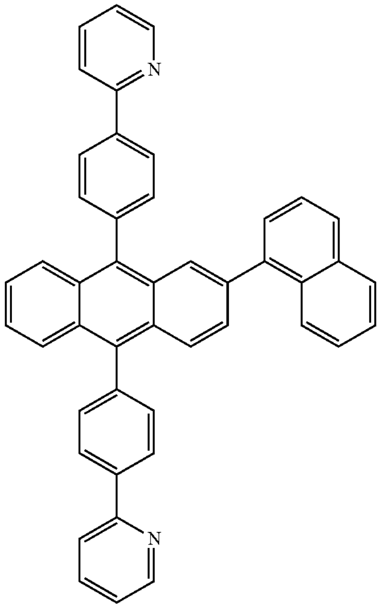
ET10
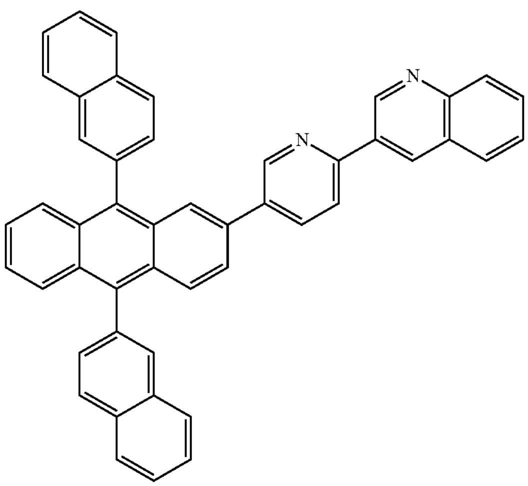
ET11
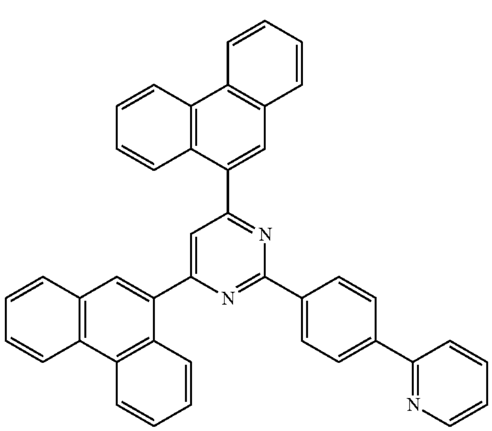
ET12
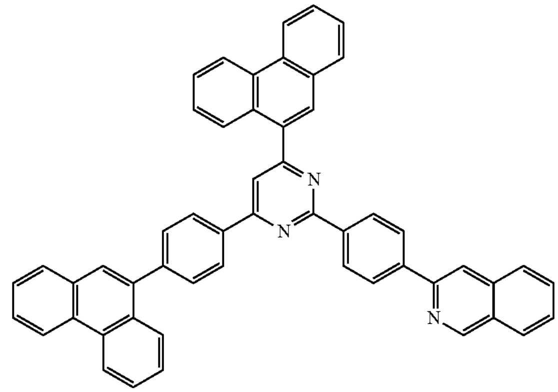
ET13
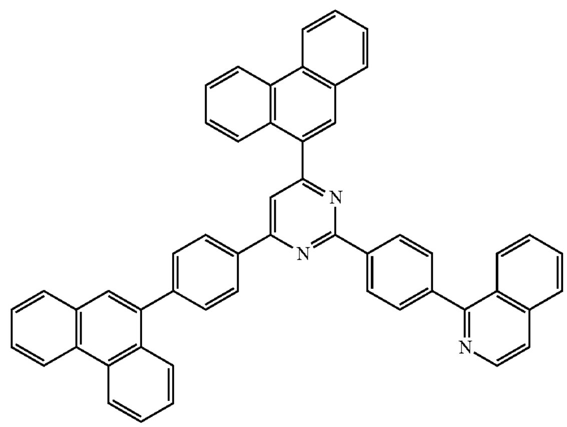
ET14
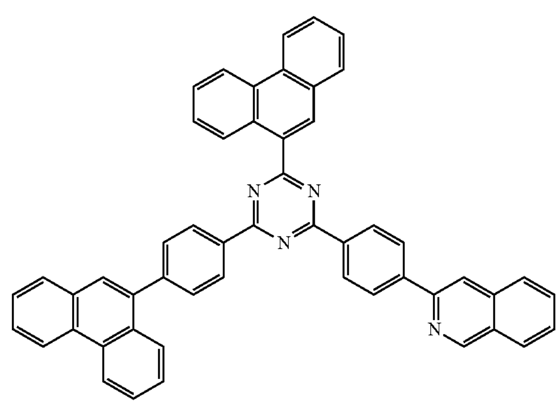
ET15
The electron transport layer may include at least one selected from BCP, Bphen, Alq3, BAlq, TAZ, and NTAZ:

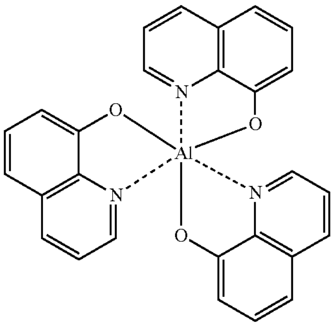

Alq3

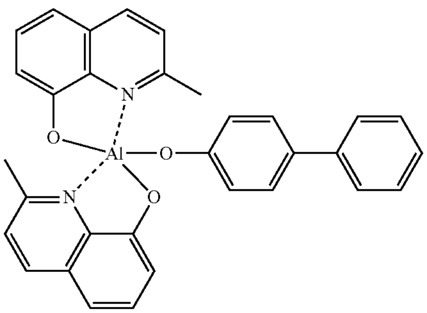

BAlq

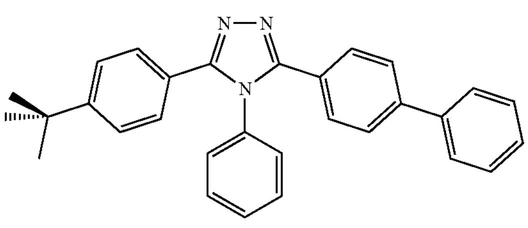

TAZ

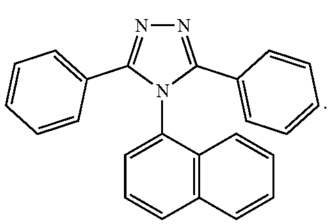

NTAZ

A thickness of the electron transport layer may be in a range of about 100 Å to about 1000 Å, for example, about 150 Å to about 500 Å. When the thickness of the electron transport layer is within any of these ranges, excellent electron transport characteristics may be obtained without a substantial increase in driving voltage.

The electron transport layer may further include a metal-containing material, in addition to the materials described above.

The metal-containing material may include a Li complex. The Li complex may include, for example, Compound ET-D1 (lithium quinolate, LiQ) and/or Compound ET-D2.

ET-D1

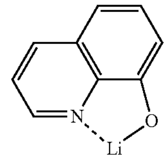

ET-D2

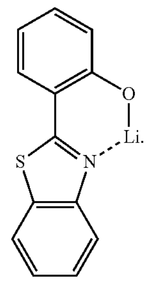

The electron transport region may include an electron injection layer that facilitates electron injection from the second electrode 190.

The electron injection layer may be formed on the electron transport layer by using one or more suitable methods, such as vacuum-deposition, spin coating, casting, LB method, ink-jet printing, laser-printing, and/or LITI. When the electron injection layer is formed by vacuum-deposition and/or spin coating, vacuum-deposition and coating conditions for the electron injection layer may be determined by referring to the vacuum-deposition and coating conditions for the hole injection layer.

The electron injection layer may include at least one selected from LiF, NaCl, CsF, $Li_2O$, BaO, and LiQ.

A thickness of the electron injection layer may be in a range of about 1 Å to about 100 Å, for example, about 3 Å to about 90 Å. When the thickness of the electron injection layer is within any of these ranges, excellent electron injection characteristics may be obtained without a substantial increase in driving voltage.

The second electrode 190 may be disposed (e.g., positioned) on the organic layer 150. The second electrode 190 may be a cathode that is an electron injection electrode, and in this regard, a material for forming the second electrode 190 may be a material having a low work function, for example, a metal, an alloy, an electrically conductive compound, or a mixture thereof. Non-limiting examples of the material for forming the second electrode 190 may include lithium (Li), magnesium (Mg), aluminum (Al), aluminum-lithium (Al—Li), calcium (Ca), magnesium-indium (Mg—In), and magnesium-silver (Mg—Ag). In some embodiments, the material for forming the second electrode 190 may be ITO and/or IZO. The second electrode 190 may be a semi-transmissive electrode or a transmissive electrode.

Hereinbefore, the organic light-emitting device has been described with reference to the drawing, but embodiments of the present disclosure are not limited thereto.

A $C_1$-$C_{60}$ alkyl group used herein may refer to a linear or branched aliphatic hydrocarbon monovalent group having 1 to 60 carbon atoms, and non-limiting examples thereof include a methyl group, an ethyl group, a propyl group, an isobutyl group, a sec-butyl group, a tert-butyl group, a pentyl group, an iso-amyl group, and a hexyl group. A $C_1$-$C_{60}$ alkylene group used herein may refer to a divalent group having the same structure as the $C_1$-$C_{60}$ alkyl group.

A $C_1$-$C_{60}$ alkoxy group used herein may refer to a monovalent group represented by —$OA_{101}$ (wherein $A_{101}$ is the $C_1$-$C_{60}$ alkyl group), and non-limiting examples thereof include a methoxy group, an ethoxy group, and an isopropoxy group.

A $C_2$-$C_{60}$ alkenyl group used herein may refer to a hydrocarbon group having at least one carbon double bond at one or more positions along the hydrocarbon chain of the $C_2$-$C_{60}$ alkyl group (e.g., in the middle or at either terminal end of the $C_2$-$C_{60}$ alkyl group), and non-limiting examples thereof include an ethenyl group, a propenyl group, and a butenyl group. A $C_2$-$C_{60}$ alkenylene group used herein may refer to a divalent group having the same structure as a $C_2$-$C_{60}$ alkenyl group.

A $C_2$-$C_{60}$ alkynyl group used herein may refer to a hydrocarbon group having at least one carbon triple bond at one or more positions along the hydrocarbon chain of the $C_2$-$C_{60}$ alkyl group (e.g., in the middle or at either terminal end of the $C_2$-$C_{60}$ alkyl group), and non-limiting examples thereof include an ethynyl group and a propynyl group. A $C_2$-$C_{60}$ alkynylene group used herein may refer to a divalent group having the same structure as a $C_2$-$C_{60}$ alkynyl group.

A $C_3$-$C_{10}$ cycloalkyl group used herein may refer to a monovalent monocyclic saturated hydrocarbon group including 3 to 10 carbon atoms, and non-limiting examples thereof include a cyclopropyl group, a cyclobutyl group, a cyclopentyl group, a cyclohexyl group, and a cycloheptyl group. A $C_3$-$C_{10}$ cycloalkylene group used herein may refer to a divalent group having the same structure as a $C_3$-$C_{10}$ cycloalkyl group.

A $C_1$-$C_{10}$ heterocycloalkyl group used herein may refer to a monovalent monocyclic group including at least one hetero atom selected from N, O, Si, P, and S as a ring-forming atom, and 1 to 10 carbon atoms, and non-limiting examples thereof include a tetrahydrofuranyl group and a tetrahydrothiophenyl group. A $C_1$-$C_{10}$ heterocycloalkylene group used herein may refer to a divalent group having the same structure as a $C_1$-$C_{10}$ heterocycloalkyl group.

A $C_3$-$C_{10}$ cycloalkenyl group used herein may refer to a monovalent monocyclic group that includes 3 to 10 carbon atoms and at least one double bond in the ring thereof, and does not have aromaticity, and non-limiting examples thereof include a cyclopentenyl group, a cyclohexenyl group, and a cycloheptenyl group. A $C_3$-$C_{10}$ cycloalkenylene group used herein may refer to a divalent group having the same structure as a $C_3$-$C_{10}$ cycloalkenyl group.

A $C_1$-$C_{10}$ heterocycloalkenyl group used herein may refer to a monovalent monocyclic group including at least one hetero atom selected from N, O, Si, P, and S as a ring-forming atom, 1 to 10 carbon atoms, and at least one double bond in its ring. Non-limiting examples of the $C_1$-$C_{10}$ heterocycloalkenyl group include a 2,3-hydrofuranyl group and a 2,3-hydrothiophenyl group. A $C_1$-$C_{10}$ heterocycloalkenylene group used herein may refer to a divalent group having the same structure as a $C_1$-$C_{10}$ heterocycloalkenyl group.

A $C_6$-$C_{60}$ aryl group used herein may refer to a monovalent group including a carbocyclic aromatic system having 6 to 60 carbon atoms, and a $C_6$-$C_{60}$ arylene group used herein may refer to a divalent group including a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each independently include a plurality of rings, the respective plurality of rings may be fused to each other.

A $C_1$-$C_{60}$ heteroaryl group used herein may refer to a monovalent group having a carbocyclic aromatic system that includes at least one hetero atom selected from N, O, Si, P, and S as a ring-forming atom, and 1 to 60 carbon atoms. A $C_1$-$C_{60}$ heteroarylene group used herein may refer to a divalent group having a carbocyclic aromatic system that includes at least one hetero atom selected from N, O, Si, P, and S as a ring-forming atom, and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each independently include a plurality of rings, the respective plurality of rings may be fused to each other.

A $C_6$-$C_{60}$ aryloxy group used herein may refer to a monovalent group represented by —$OA_{102}$ (wherein $A_{102}$ is the $C_6$-$C_{60}$ aryl group), and a $C_6$-$C_{60}$ arylthio group used herein may refer to a monovalent group represented by —$SA_{103}$ (wherein $A_{103}$ is the $C_6$-$C_{60}$ aryl group).

A monovalent non-aromatic condensed polycyclic group used herein may refer to a monovalent group that has two or more rings condensed to each other, has only carbon atoms (for example, the number of carbon atoms may be in a range of 8 to 60) as ring forming atoms, and does not have overall aromaticity. A non-limiting example of the monovalent non-aromatic condensed polycyclic group is a fluorenyl group. A divalent non-aromatic condensed polycyclic group used herein may refer to a divalent group having the same structure as the monovalent non-aromatic condensed polycyclic group.

A monovalent non-aromatic condensed heteropolycyclic group used herein may refer to a monovalent group that has two or more rings condensed to each other, has at least one hetero atom selected from N, O, Si, P, and S, other than carbon atoms (for example, the number of carbon atoms may be in a range of 1 to 60), as ring-forming atoms, and does not have overall aromaticity. A non-limiting example of the monovalent non-aromatic condensed heteropolycyclic group is a carbazolyl group. A divalent non-aromatic condensed heteropolycyclic group used herein may refer to a divalent group having the same structure as the monovalent non-aromatic condensed heteropolycyclic group.

At least one substituent of the substituted $C_1$-$C_{60}$ alkylene group, substituted $C_2$-$C_{60}$ alkenylene group, substituted $C_2$-$C_{60}$ alkynylene group, substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted a divalent non-aromatic condensed polycyclic group, substituted a divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{24}$)($Q_{25}$), and —B($Q_{26}$)($Q_{27}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{31}$)($Q_{32}$)($Q_{33}$), —N($Q_{34}$)($Q_{35}$), and —B($Q_{36}$)($Q_{37}$); and —Si($Q_{41}$)($Q_{42}$)($Q_{43}$), —N($Q_{44}$)($Q_{45}$), and —B($Q_{46}$)($Q_{47}$);

wherein $Q_{21}$ to $Q_{27}$, $Q_{31}$ to $Q_{37}$, and $Q_{41}$ to $Q_{47}$ may be each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group; and a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, and a $C_1$-$C_{60}$ alkyl group.

"Ph" used herein may refer to a phenyl group, "Me" may refer to a methyl group, "Et" may refer to an ethyl group, and "ter-Bu" or "Bu$^t$" may refer to a tert-butyl group.

As used herein, the term "a biphenyl group" may refer to a monovalent group in which two benzene rings are linked to each other by a single bond, and the term "a terphenyl group" may refer to a monovalent group in which three benzene rings are linked to each other by single bonds.

Hereinafter, an organic light-emitting device according to some embodiments of the present disclosure will be described in more detail with reference to Synthesis Examples and Examples.

EXAMPLES

Example 1

An indium tin oxide (ITO) glass substrate available from Corning Inc. (herein, an anode) at a thickness of 15 Ω/cm$^2$ (500 Å) was cut to a size of 50 mm×50 mm×0.5 mm, sonicated in isopropyl alcohol and pure water for 10 minutes each, and then, cleaned with UV and ozone for 10 minutes. 2-TNATA (available from Duksan Hi-Metal Co. Ltd.) was vacuum-deposited on the ITO glass substrate to form a hole injection layer having a thickness of 600 Å, and 4,4'-bis[N-(1-naphthyl)-N-phenylamino]biphenyl (NPB) (available from Duksan Hi-Metal Co. Ltd.) was vacuum-deposited on the hole injection layer to form a hole transport layer having a thickness of 300 Å.

Compound In-B-3 and Compound 4, as hosts, and Ir(ppy)3(Aldrich) (also, referred to as "PD1"), as a dopant, were co-deposited at a weight ratio of 75:15:10 to form an emission layer having a thickness of 400 Å. Then, Alq3 was deposited on the emission layer to form an electron transport layer having a thickness of 300 Å, and an Al cathode having a thickness of 2000 Å was formed on the electron transport layer, thereby completing the manufacture of an organic light-emitting device.

Examples 2 to 10 and Comparative Examples 1 to 4

Organic light-emitting devices were manufactured in the same (or substantially the same) manner as in Example 1, except that materials used in formation of the emission layer were changed as shown in Table 1.

Evaluation Example 1

Current densities, efficiencies, and lifespans ($T_{90}$) of the organic light-emitting devices prepared in Examples 1 to 10 and Comparative Examples 1 to 4 were evaluated using Keithley SMU 236 and a luminance meter PR650. The results are shown in Table 1. The lifespan ($T_{90}$) is defined as the time it took for the luminance of an organic light-emitting device to decline to 90% of its initial luminance (100%) after operating the organic light-emitting device at 9,000 nit.

TABLE 1

| | Emission layer host | | Emission layer dopant | Host: dopant (weight ratio) | Current density (mA/cm$^2$) | Efficiency (cd/A) | Lifespan ($T_{90}$) (hr) |
|---|---|---|---|---|---|---|---|
| Example 1 | In-B-3 | C4 | PD1 | 75:15:10 | 8 | 43.2 | 115 |
| Example 2 | In-B-3 | C4 | PD1 | 65:25:10 | 8 | 39.8 | 122 |
| Example 3 | In-B-3 | C71 | PD1 | 70:20:10 | 8 | 30.7 | 128 |
| Example 4 | In-B-3 | C71 | PD1 | 60:30:10 | 8 | 25.6 | 110 |
| Example 5 | In-B-3 | C4 | PD1 | 30:60:10 | 8 | 38.2 | 70 |
| Example 6 | In-B-3 | C4 | PD1 | 20:70:10 | 8 | 36.1 | 118 |
| Example 7 | In-B-3 | C71 | PD1 | 30:60:10 | 8 | 36.7 | 66 |
| Example 8 | In-B-3 | C71 | PD1 | 20:70:10 | 8 | 32.4 | 88 |
| Example 9 | In-B-3 | C4 | PD1 | 25:65:10 | 8 | 36.8 | 92 |
| Example 10 | In-B-3 | C71 | PD1 | 25:65:10 | 8 | 33.8 | 78 |
| Comparative Example 1 | In-B-3 | — | PD1 | 90:10 | 8 | 16.7 | 42 |
| Comparative Example 2 | In-B-3 | — | PD1 | 90:10 | 8 | 9.1 | 63 |
| Comparative Example 3 | — | C4 | PD1 | 90:10 | 8 | 11.9 | 20 |
| Comparative Example 4 | — | C71 | PD1 | 90:10 | 8 | 7.8 | 25 |

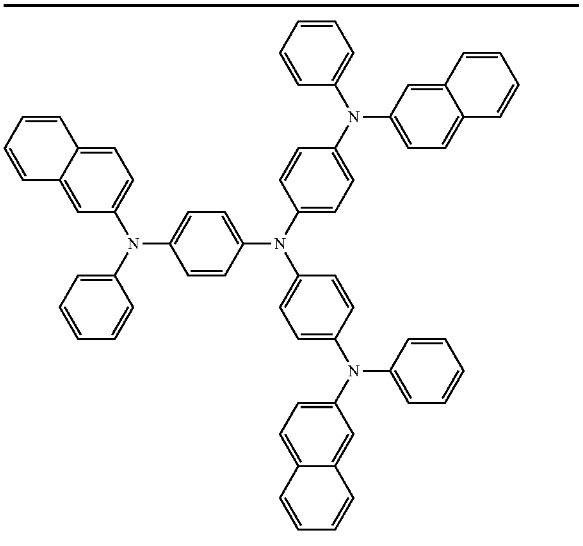

2-TNATA

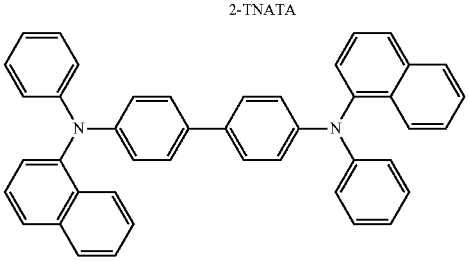

NPB

TABLE 1-continued

| Emission layer host | Emission layer dopant | Host: dopant (weight ratio) | Current density (mA/cm$^2$) | Efficiency (cd/A) | Lifespan ($T_{90}$) (hr) |
|---|---|---|---|---|---|

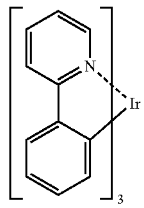

PD1

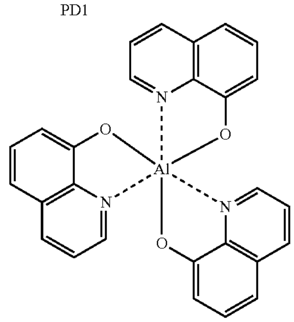

$Alq_3$

Referring to Table 1, the organic light-emitting devices of Examples 1 to 10 had better efficiency and lifespan characteristics than those of the organic light-emitting devices of Comparative Examples 1 to 4.

As described above, according to the one or more of the above-described example embodiments, the organic light-emitting device may have a high efficiency and long lifespan.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, the terms "use," "using," and "used" may be considered synonymous with the terms "utilize," "utilizing," and "utilized," respectively.

In addition, as used herein, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It should be understood that example embodiments described herein should be considered in a descriptive sense only and not for purposes of limitation. Descriptions of features or aspects within each example embodiment should typically be considered as available for other similar features or aspects in other example embodiments.

While one or more example embodiments have been described with reference to the drawing, it will be understood by those of ordinary skill in the art that various changes in form and details may be made therein without departing from the spirit and scope of the present disclosure as defined by the following claims and equivalents thereof.

What is claimed is:

1. An organic light-emitting device comprising:

a first electrode;

a second electrode facing the first electrode; and an organic layer between the first electrode and the second electrode, the organic layer comprising an emission layer, wherein the organic layer comprises a first compound represented by one of Formulae 1-1 to 1-3 and a second compound represented by Formula 2:

Formula 1-1

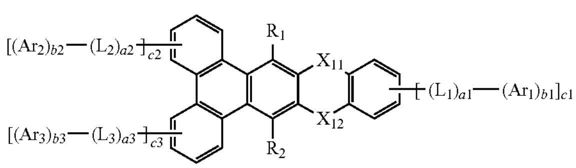

Formula 1-2

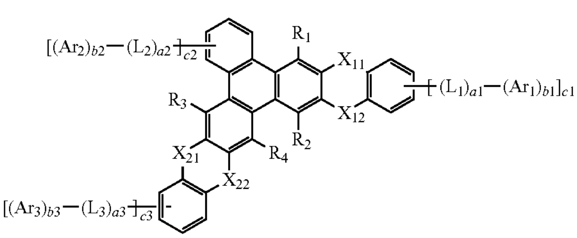

Formula 1-3

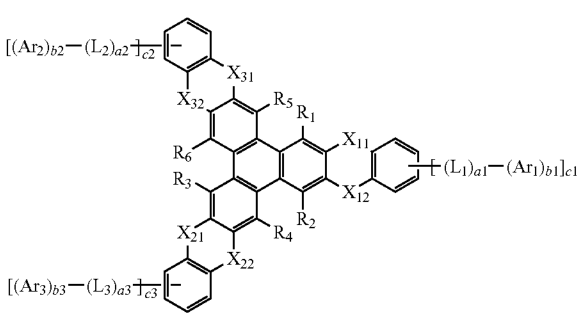

Formula 2

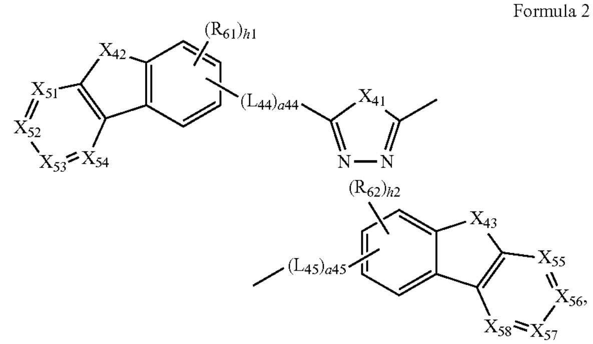

wherein, in Formulae 1-1 to 1-3 and 2, $X_{11}$ is selected from a single bond, $C(R_{11})(R_{12})$, $Si(R_{13})(R_{14})$, $N[(L_4)_{a4}\text{-}(Ar_4)_{b4}]$, O, S, S(=O), and $S(=O)_2$, $X_{12}$ is selected from a single bond, $C(R_{15})(R_{16})$, $Si(R_{17})(R_{18})$, $N[(L_5)_{a5}\text{-}(Ar_5)_{b5}]$, O, S, S(=O), and $S(=O)_2$, $X_{21}$ is selected from a single bond, $C(R_{21})(R_{22})$, $Si(R_{23})(R_{24})$, $N[(L_6)_{a6}\text{-}(Ar_6)_{b6}]$, O, S, S(=O), and $S(=O)_2$, $X_{22}$ is selected from a single bond, $C(R_{25})(R_{26})$, $Si(R_{27})(R_{28})$, $N[(L_7)_{a7}\text{-}(Ar_7)_{b7}]$, O, S, S(=O), and $S(=O)_2$, $X_{31}$ is selected from a single bond, $C(R_{31})(R_{32})$, $Si(R_{33})(R_{34})$, $N[(L_8)_{a8}\text{-}(Ar_8)_{b8}]$, O, S, S(=O), and $S(=O)_2$, $X_{32}$ is selected from a single bond, $C(R_{35})(R_{36})$, $Si(R_{37})(R_{38})$, $N[(L_9)_{a9}\text{-}(Ar_9)_{b9}]$, O, S, S(=O), and $S(=O)_2$, $X_{41}$ is selected from $N[(L_{41})_{a41}\text{-}(Ar_{41})_{b41}]$, O, and S, $X_{42}$ is selected from $N[(L_{42})_{a42}\text{-}(Ar_{42})_{b42}]$, O, S, $C(R_{41})(R_{42})$, and $Si(R_{43})(R_{44})$, $X_{43}$ is selected from $N[(L_{43})_{a43}\text{-}(Ar_{43})_{b43}]$, O, S, $C(R_{45})(R_{46})$, and $Si(R_{47})(R_{48})$, $X_{51}$ is N or $C(R_{51})$, $X_{52}$ is N or $C(R_{52})$, $X_{53}$ is N or $C(R_{53})$, $X_{54}$ is N or $C(R_{54})$, $X_{55}$ is N or $C(R_{55})$, $X_{56}$ is N or $C(R_{56})$, $X_{57}$ is N or $C(R_{57})$, and $X_{58}$ is N or $C(R_{58})$, $L_1$ to $L_9$ and $L_{41}$ to $L_{45}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a1 to a9 and a41 to a45 are each independently an integer selected from 0 to 3, $Ar_1$ to $Ar_9$ and $Ar_{41}$ to $Ar_{43}$ are each independently selected from a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_4$)($Q_5$), —B($Q_6$)($Q_7$), and —P(=O)($Q_8$)($Q_9$)

b1 to b9 and b41 to b43 are each independently an integer selected from 1 to 3, c1 to c3 are each independently an integer selected from 0 to 4, and the sum of c1 to c3 is 1 or greater, $R_1$ to $R_6$, $R_{11}$ to $R_{18}$, $R_{21}$ to $R_{28}$, $R_{31}$ to $R_{38}$, $R_{41}$ to $R_{48}$, $R_{51}$ to $R_{68}$, and $R_{61}$ and $R_{62}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, and —Si($Q_{11}$)($Q_{12}$)($Q_{13}$), h1 and h2 are each independently an integer selected from 0 to 3, and at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group is selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group, —Si($Q_{21}$)($Q_{22}$)($Q_{23}$), —N($Q_{24}$)($Q_{25}$), and —B($Q_{26}$)($Q_{27}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group, —Si($Q_{31}$)($Q_{32}$)($Q_{33}$), —N($Q_{34}$)($Q_{35}$), and —B($Q_{36}$)($Q_{37}$); and —Si($Q_{41}$)($Q_{42}$)($Q_{43}$), —N($Q_{44}$)($Q_{45}$), and —B($Q_{46}$)($Q_{47}$), wherein $Q_1$ to $Q_9$, $Q_{11}$ to $Q_{13}$, $Q_{21}$ to $Q_{27}$, $Q_{31}$ to $Q_{37}$, and $Q_{41}$ to $Q_{47}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group; and a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, and a $C_1$-$C_{60}$ alkyl group.

2. The organic light-emitting device of claim 1, wherein, in Formulae 1-1 to 1-3 and 2, $X_{11}$ is $C(R_{ii})(R_{12})$ or $N[(L_4)_{a4}$-$(Ar_4)_{b4}]$, $X_{12}$ is $C(R_{15})(R_{16})$ or $N[(L_5)_{a5}$-$(Ar_5)_{b5}]$, $X_{21}$ is $C(R_{21})(R_{22})$ or $N[(L_6)_{a6}$-$(Ar_6)_{b6}]$, $X_{22}$ is $C(R_{25})(R_{26})$ or $N[(L_7)_{a7}$-$(Ar_7)_{b7}]$, $X_{31}$ is $C(R_{31})(R_{32})$ or $N[(L_8)_{a8}$-$(Ar_8)_{b8}]$, $X_{32}$ is $C(R_{35})(R_{36})$ or $N[(L_9)_{a9}$-$(Ar_9)_{b9}]$, $X_{41}$ is selected from $N[(L_{41})_{a41}$-$(Ar_{41})_{b41}]$, O, and S, $X_{42}$ is $N[(L_{42})_{a42}$-$(Ar_{42})_{b42}]$, and $X_{43}$ is $N[(L_{43})_{a43}$-$(Ar_{43})_{b43}]$.

3. The organic light-emitting device of claim 1, wherein, in Formula 2, $X_{51}$ is $C(R_{51})$, $X_{52}$ is $C(R_{52})$, $X_{53}$ is $C(R_{53})$, $X_{54}$ is $C(R_{54})$, $X_{55}$ is $C(R_{55})$, $X_{56}$ is $C(R_{56})$, $X_{57}$ is $C(R_{57})$, and $X_{58}$ is $C(R_{58})$.

4. The organic light-emitting device of claim 1, wherein, in Formulae 1-1 to 1-3 and 2, $L_1$ to $L_9$ and $L_{41}$ to $L_{45}$ are each independently selected from:

a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, a thiadiazolylene group, an imidazopyridinylene group, and an imidazopyrimidinylene group; and a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, a thiadiazolylene group, an imidazopyridinylene group, and an imidazopyrimidinylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group.

5. The organic light-emitting device of claim 1, wherein, in Formulae 1-1 to 1-3 and 2, $L_1$ to $L_9$ and $L_{41}$ to $L_{45}$ are each independently selected from groups represented by Formulae 3-1 to 3-43:

3-1

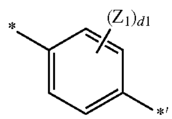

3-2

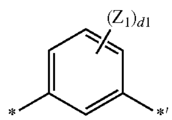

3-3

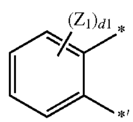

3-4

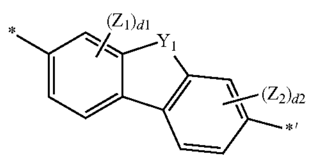

3-5

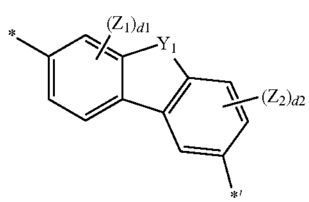

3-6

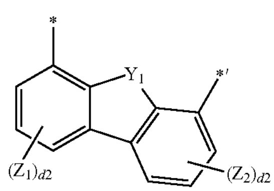

3-7

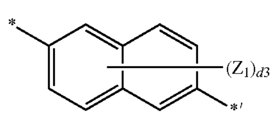

3-8

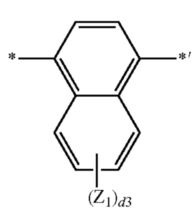

-continued 3-9

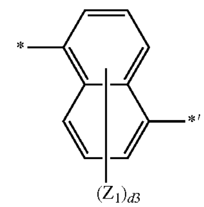

3-10

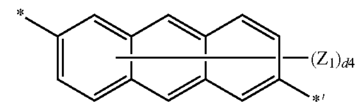

3-11

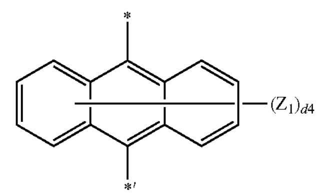

3-12

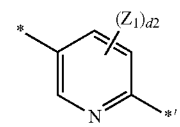

3-13

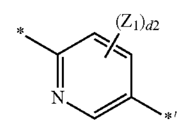

3-14

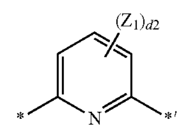

3-15

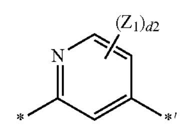

3-16

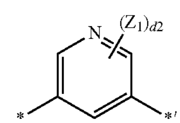

3-17

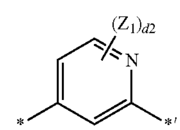

3-18

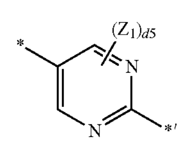

3-19

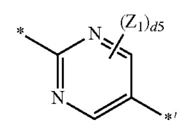

-continued
3-20
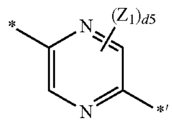
3-21
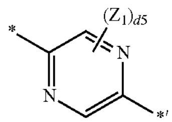
3-22
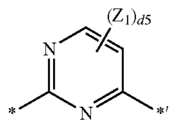
3-23
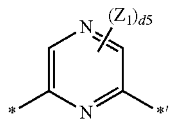
3-24
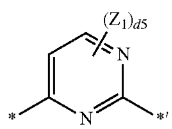
3-25
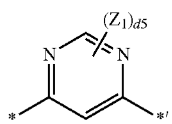
3-26
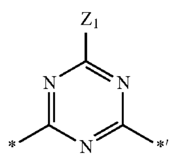
3-27
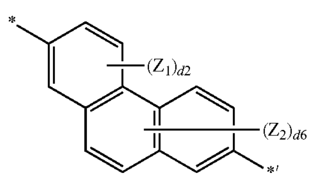
3-28
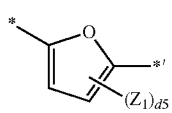
3-29
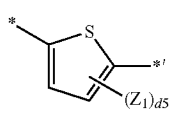
3-30
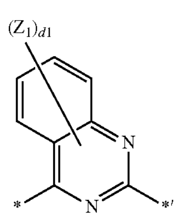
-continued
3-31
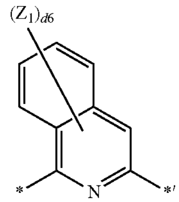
3-32
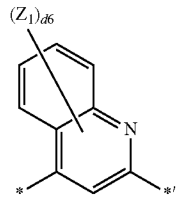
3-33
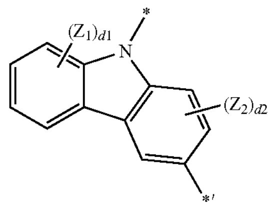
3-34
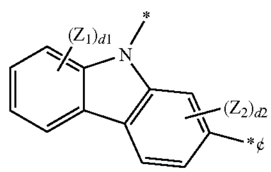
3-35
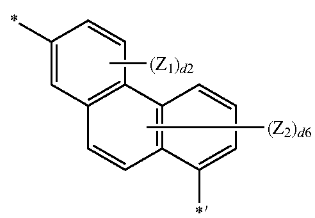
3-36
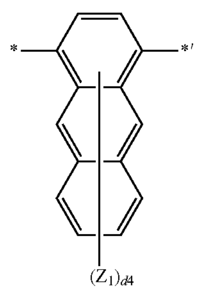
3-37
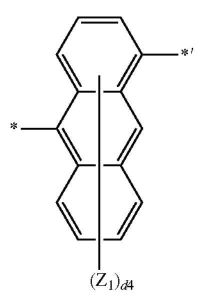

-continued 3-38

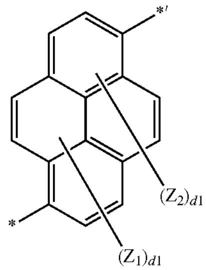

3-39

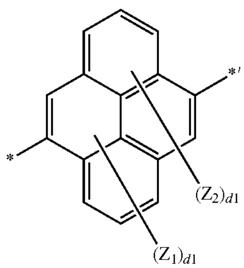

3-40

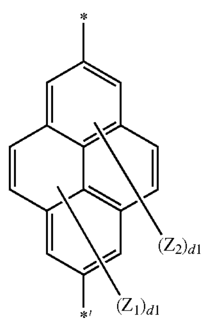

3-41

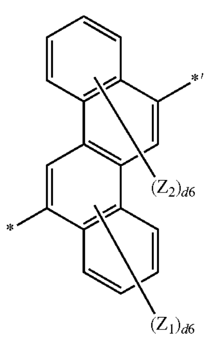

3-42

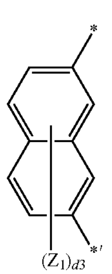

-continued 3-43

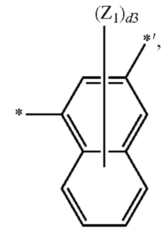

wherein, in Formulae 3-1 to 3-43, $Y_1$ is selected from O, S, $C(Z_3)(Z_4)$, $N(Z_5)$, and $Si(Z_6)(Z_7)$, $Z_1$ to $Z_7$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, and $—Si(Q_{41})(Q_{42})(Q_{43})$, wherein, $Q_{41}$ to $Q_{43}$ are each independently selected from a $C_1$-$C_{10}$ alkyl group, a $C_1$-$C_{10}$ alkoxy group, a phenyl group, a biphenyl group, a terphenyl group, and a naphthyl group, d1 is an integer selected from 1 to 4, d2 is an integer selected from 1 to 3, d3 is an integer selected from 1 to 6, d4 is an integer selected from 1 to 8, d5 is an integer of 1 or 2, and d6 is an integer selected from 1 to 5, and and *' are each independently a binding site to a neighboring atom.

6. The organic light-emitting device of claim 1, wherein, in Formulae 1-1 to 1-3 and 2, $L_1$ to $L_9$ and $L_{41}$ to $L_{45}$ are each independently selected from groups represented by Formulae 4-1 to 4-45:

4-1

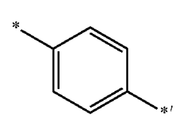

4-2

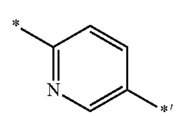

4-3

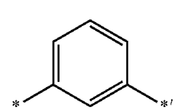

4-4

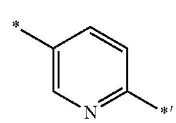

-continued
4-5
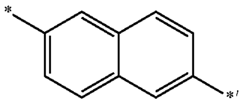
4-6
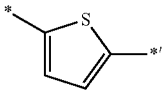
4-7
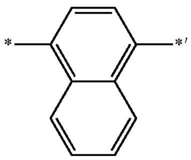
4-8
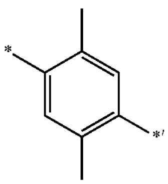
4-9
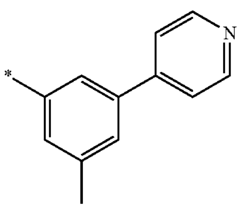
4-10
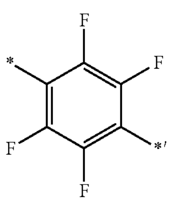
4-11
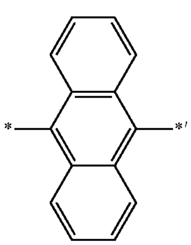
4-12
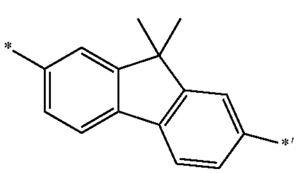
4-13
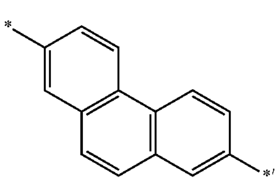
-continued
4-14
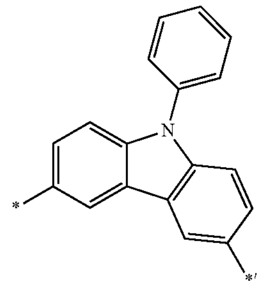
4-15
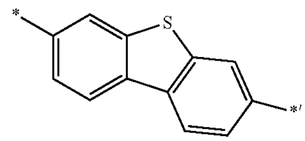
4-16
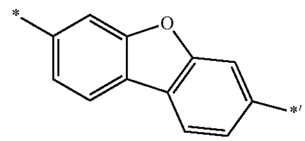
4-17
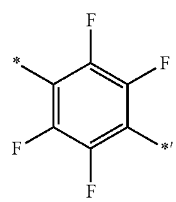
4-18
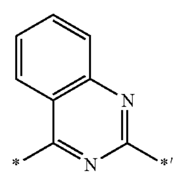
4-19
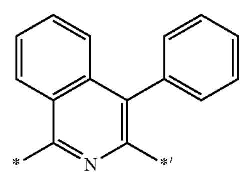
4-20
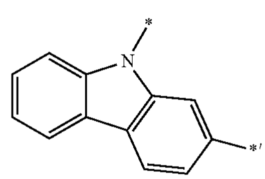
4-21
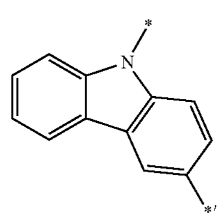

-continued
4-22
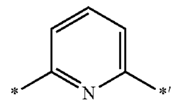
4-23
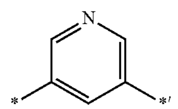
4-24
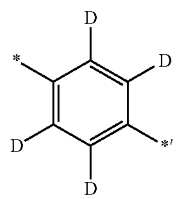
4-25
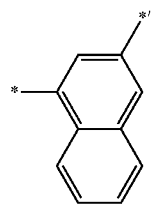
4-26
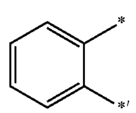
4-27
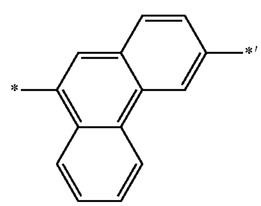
4-28
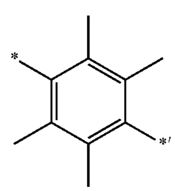
4-29
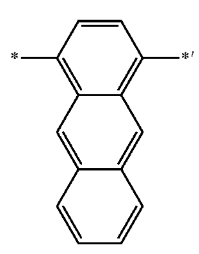
4-30
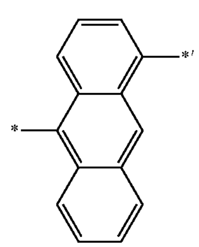
-continued
4-31
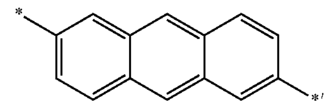
4-32
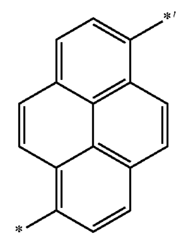
4-33
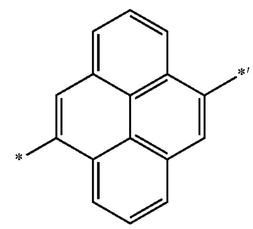
4-34
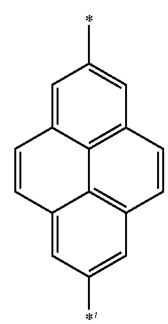
4-35
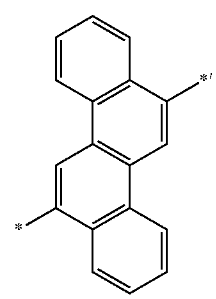
4-36
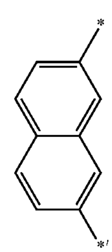
4-37
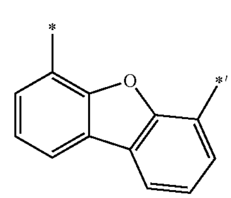

-continued 4-38

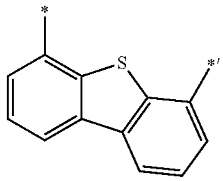

4-39

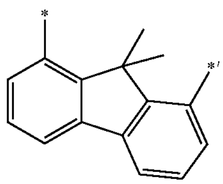

4-40

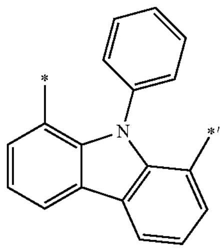

4-41

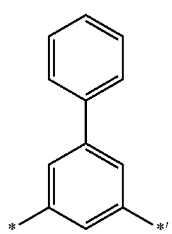

4-42

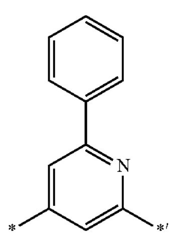

4-43

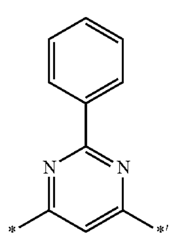

4-44

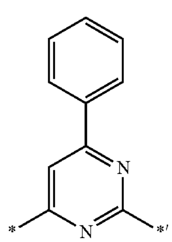

-continued 4-45

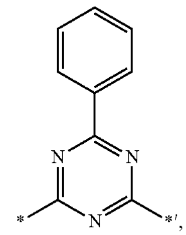

wherein, in Formulae 4-1 to 4-45, * and *' are each independently a binding site to a neighboring atom.

7. The organic light-emitting device of claim 1, wherein, in Formulae 1-1 to 1-3 and 2, a1 to a9 are each independently an integer selected from 0, 1, and 2, a41 to a43 are each independently an integer selected from 0 to 3, and a44 and a45 are each independently an integer of 0 or 1.

8. The organic light-emitting device of claim 1, wherein, in Formulae 1-1 to 1-3 and 2, $Ar_1$ to $Ar_9$ and $Ar_{41}$ to $Ar_{43}$ are each independently selected from:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from a phenyl group, a biphenyl group, a terphenyl group, a naphthyl group, a pyridinyl group, and a pyrimidinyl group;

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a dibenzosilolyl group, a thiadiazolyl group, an imidazopyridinyl group, an imidazopyrimidinyl group, —$Si(Q_1)(Q_2)(Q_3)$, —$N(Q_4)(Q_5)$, —$B(Q_6)(Q_7)$, and —$P(=O)(Q_8)(Q_9)$; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a dibenzosilolyl group, a thiadiazolyl group, an imidazopyridinyl group, and an imidazopyrimidinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, $C_1$-$C_{20}$ alkyl group, $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, an imidazopyrimidinyl group, and —Si($Q_{41}$)($Q_{42}$)($Q_{43}$), wherein $Q_1$ to $Q_9$ and $Q_{41}$ to $Q_{43}$ are each independently selected from:

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, an oxadiazolyl group, a triazinyl group, a dibenzofuranyl group, a dibenzothiophenyl group, a benzocarbazolyl group, a dibenzocarbazolyl group, a dibenzosilolyl group, a thiadiazolyl group, an imidazopyridinyl group, and an imidazopyrimidinyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, an oxadiazolyl group, a triazinyl group, a dibenzofuranyl group, a dibenzothiophenyl group, a benzocarbazolyl group, a dibenzocarbazolyl group, a dibenzosilolyl group, a thiadiazolyl group, an imidazopyridinyl group, and an imidazopyrimidinyl group, each substituted with at least one selected from a $C_1$-$C_{10}$ alkyl group and a $C_1$-$C_{10}$ alkoxy group.

9. The organic light-emitting device of claim 1, wherein, in Formulae 1-1 to 1-3 and 2, $Ar_1$ to $Ar_9$ and $Ar_{41}$ to $Ar_{43}$ are each independently selected from:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from a phenyl group, a biphenyl group, a terphenyl group, a naphthyl group, a pyridinyl group, and a pyrimidinyl group;

—Si($Q_1$)($Q_2$)($Q_3$), —N($Q_4$)($Q_5$), —B($Q_6$)($Q_7$), and —P(=O)($Q_8$)($Q_9$), wherein $Q_1$ to $Q_9$ are each independently selected from:

a $C_1$-$C_{10}$ alkyl group and a $C_1$-$C_{10}$ alkoxy group;

a phenyl group, a biphenyl group, a terphenyl group, and a naphthyl group; and a phenyl group, a biphenyl group, a terphenyl group, and a naphthyl group, each substituted with at least one selected from a $C_1$-$C_{10}$ alkyl group and a $C_1$-$C_{10}$ alkoxy group; and
groups represented by Formulae 5-1 to 5-58:
5-1
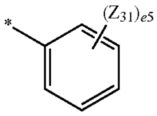
5-2
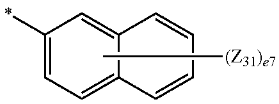
5-3
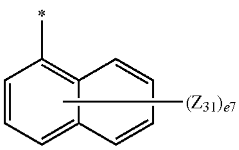
5-4
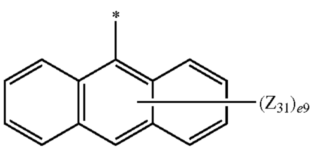
5-5
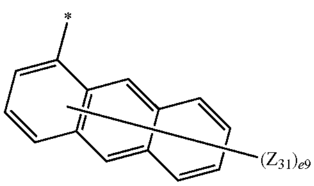
5-6
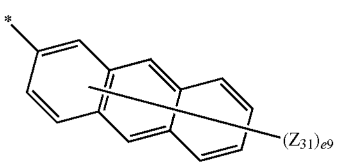
5-7
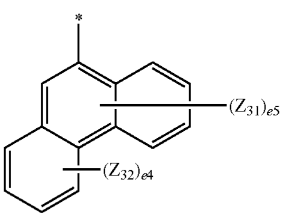
5-8
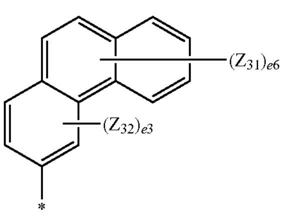
-continued
5-9
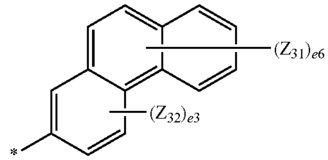
5-10
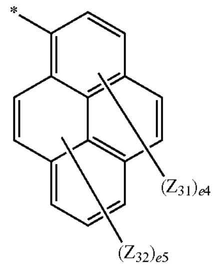
5-11
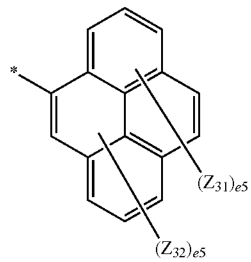
5-12
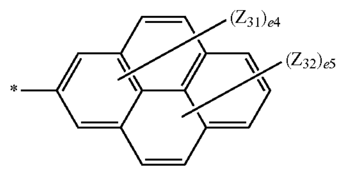
5-13
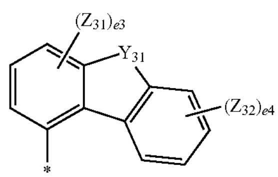
5-14
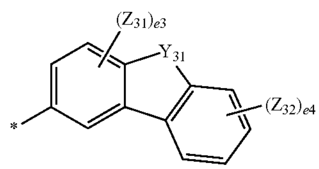
5-15
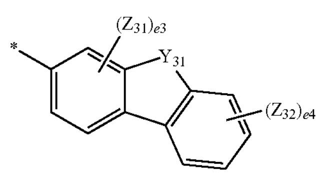
5-16
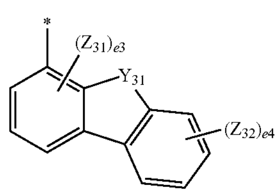

-continued
5-17
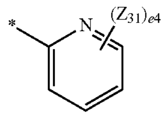
5-18
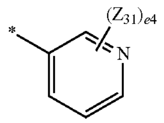
5-19
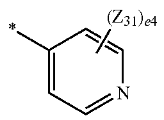
5-20
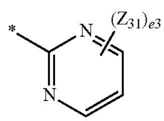
5-21
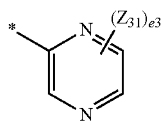
5-22
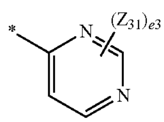
5-23
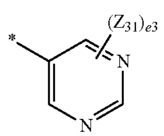
5-24
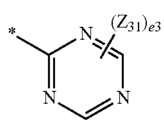
5-25
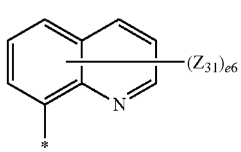
5-26
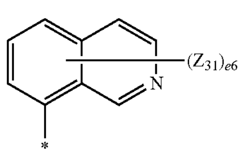
5-27
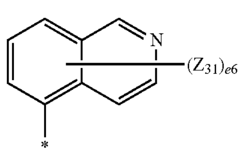
-continued
5-28
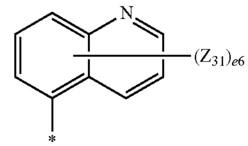
5-29
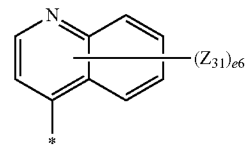
5-30
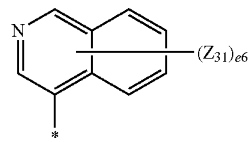
5-31
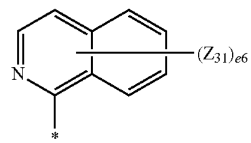
5-32
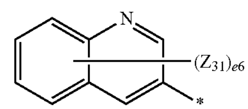
5-33
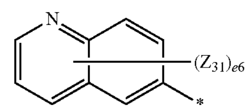
5-34
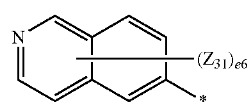
5-35
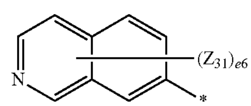
5-36
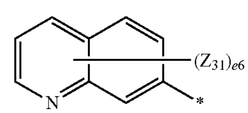
5-37
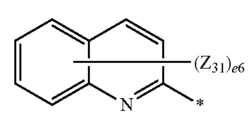
5-38
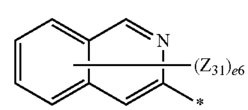
5-39
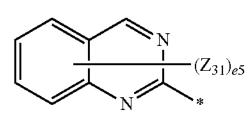

-continued 5-40

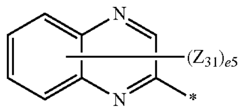

5-41

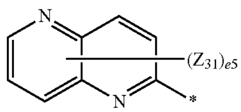

5-42

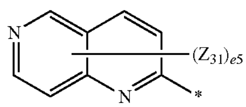

5-43

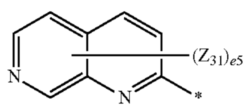

5-44

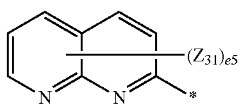

5-45

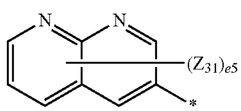

5-46

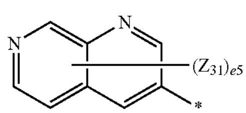

5-47

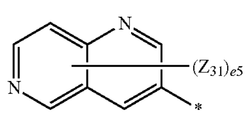

5-48

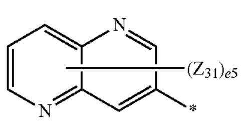

5-49

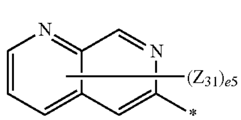

5-50

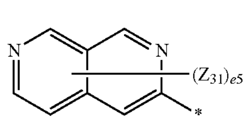

5-51

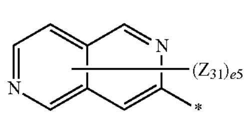

5-52

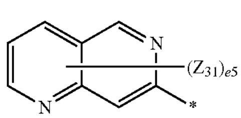

-continued 5-53

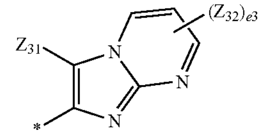

5-54

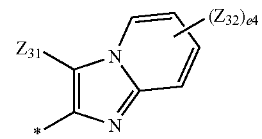

5-55

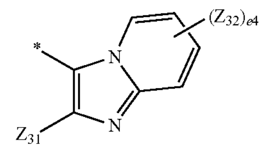

5-56

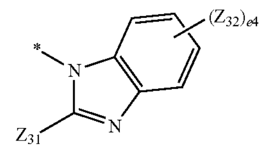

5-57

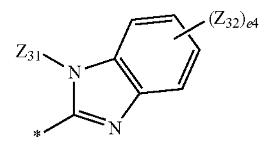

5-58

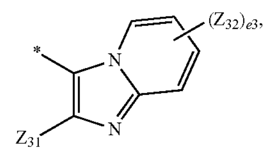

wherein, in Formulae 5-1 to 5-58, $Y_{31}$ is selected from O, S, $C(Z_{33})(Z_{34})$, $N(Z_{35})$, and $Si(Z_{36})(Z_{37})$, $Z_{31}$ to $Z_{37}$ are each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, and a dibenzothiophenyl group;

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, and a dibenzothiophenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, and a dibenzothiophenyl group; and —Si($Q_{41}$)($Q_{42}$)($Q_{43}$), wherein $Q_{41}$ to $Q_{43}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, and a carbazolyl group, e2 is 1 or 2, e3 is an integer selected from 1 to 3, e4 is an integer selected from 1 to 4, e5 is an integer selected from 1 to 5, e6 is an integer selected from 1 to 6, e7 is an integer selected from 1 to 7, and e9 is an integer selected from 1 to 9, and is a binding site to a neighboring atom.

10. The organic light-emitting device of claim 1, wherein, in Formulae 1-1 to 1-3 and 2, $Ar_1$ to $Ar_9$ and $Ar_{41}$ to $Ar_{43}$ are each independently selected from:

a $C_1$-$C_{20}$ alkyl group and a $C_1$-$C_{20}$ alkoxy group; and groups represented by Formulae 6-1 to 6-178:

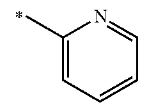

6-1

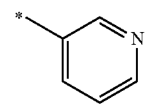

6-2

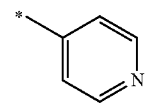

6-3

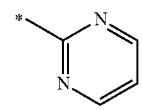

6-4

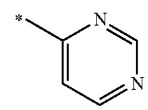

6-5

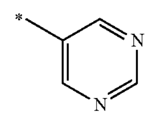

6-6

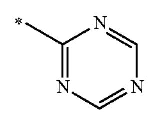

6-7

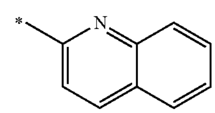

6-8

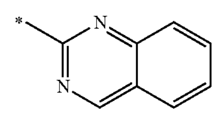

6-9

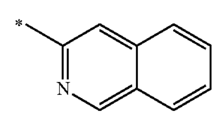

6-10

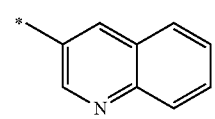

6-11

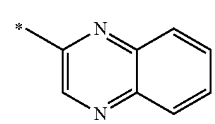

6-12

-continued
6-13
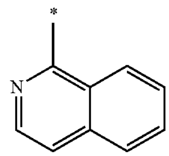
6-14
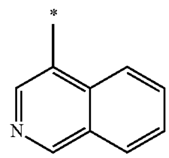
6-15
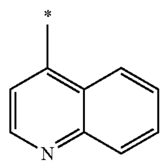
6-16
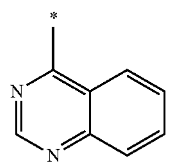
6-17
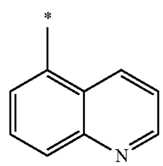
6-18
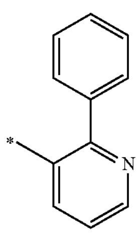
6-19
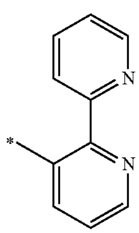
6-20
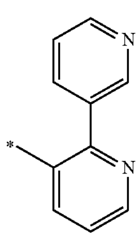
-continued
6-21
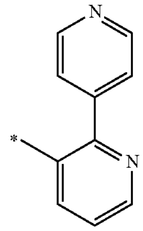
6-22
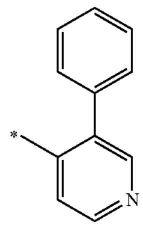
6-23
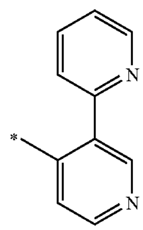
6-24
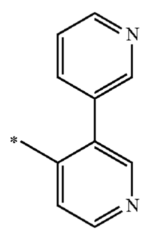
6-25
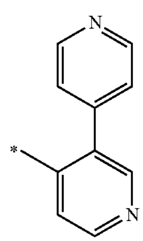
6-26
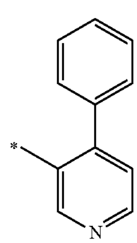

-continued
6-27
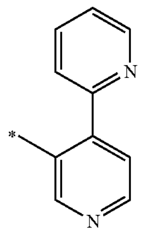
6-28
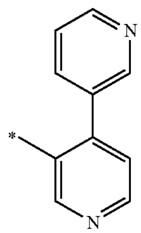
6-29
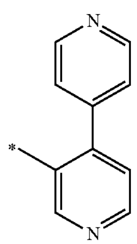
6-30
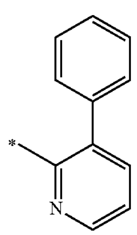
6-31
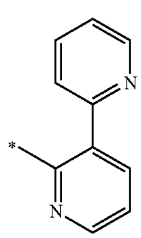
6-32
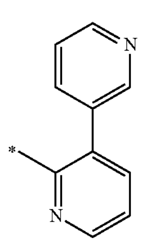
-continued
6-33
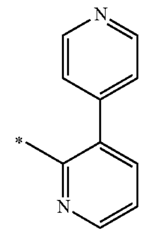
6-34
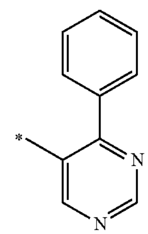
6-35
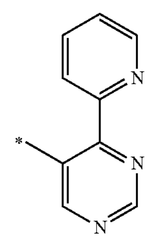
6-36
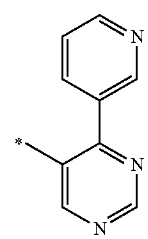
6-37
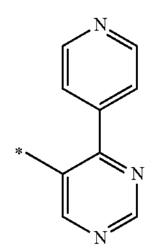
6-38
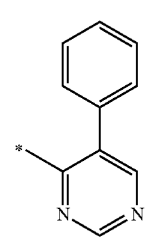

-continued
6-39
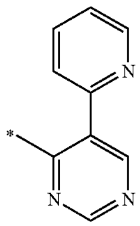
6-40
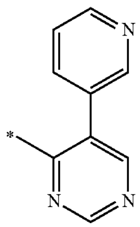
6-41
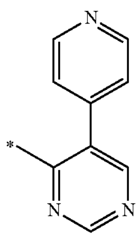
6-42
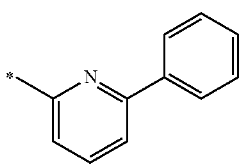
6-43
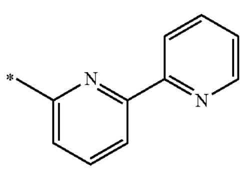
6-44
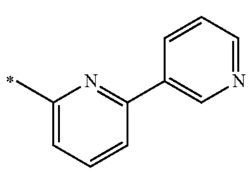
6-45
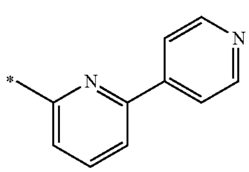
6-46
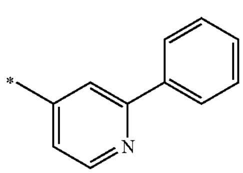
-continued
6-47
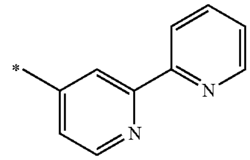
6-48
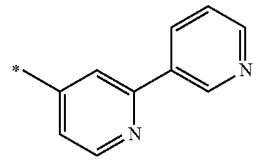
6-49
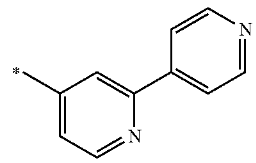
6-50
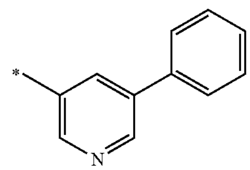
6-51
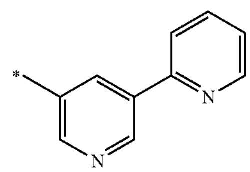
6-52
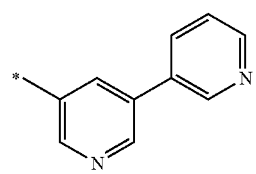
6-53
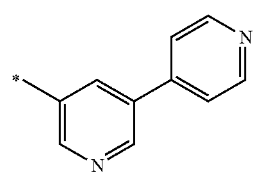
6-54
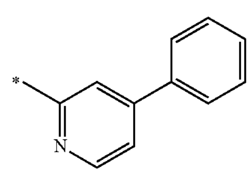
6-55
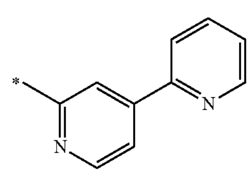

-continued
6-56
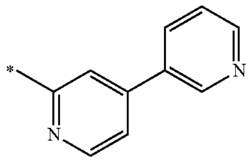
6-57
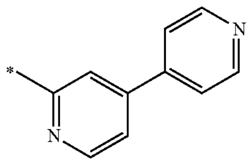
6-58
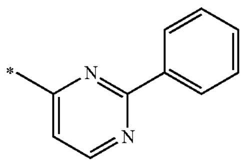
6-59
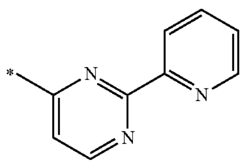
6-60
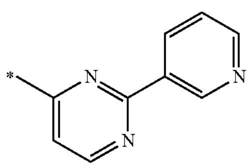
6-61
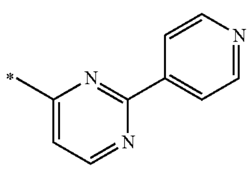
6-62
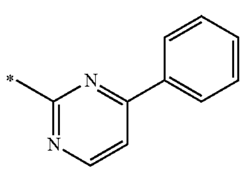
6-63
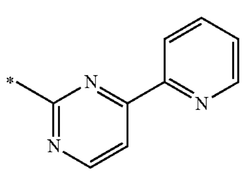
6-64
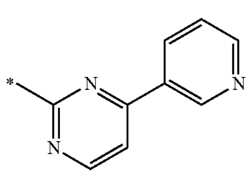
-continued
6-65
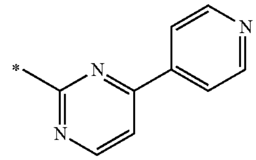
6-66
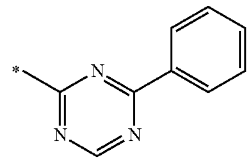
6-67
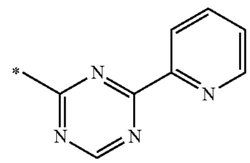
6-68
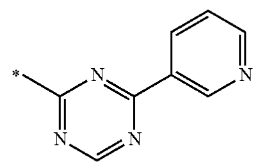
6-69
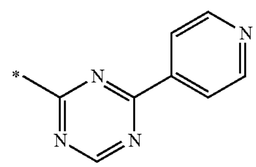
6-70
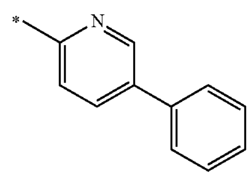
6-71
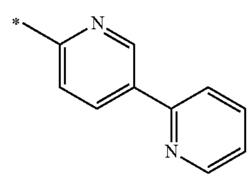
6-72
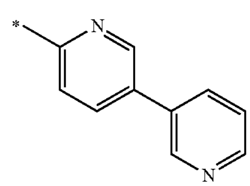
6-73
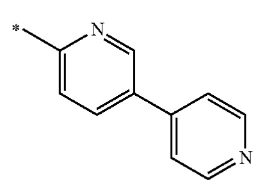

-continued
6-74
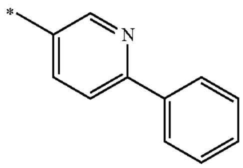
6-75
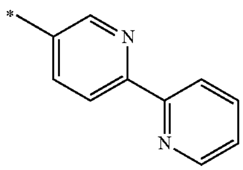
6-76
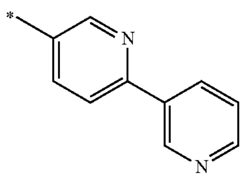
6-77
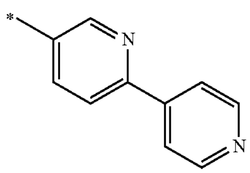
6-78
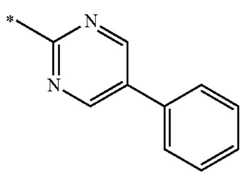
6-79
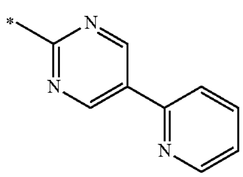
6-80
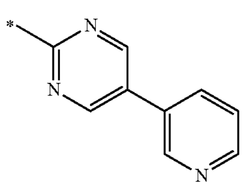
6-81
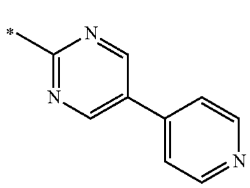
6-82
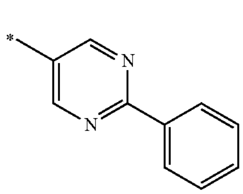
-continued
6-83
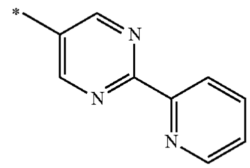
6-84
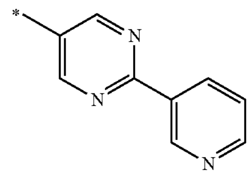
6-85
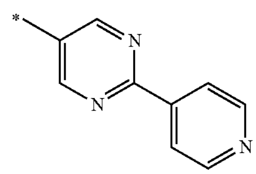
6-86
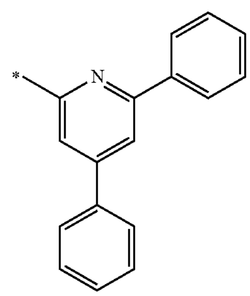
6-87
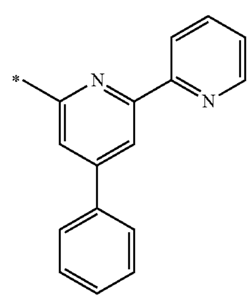
6-88
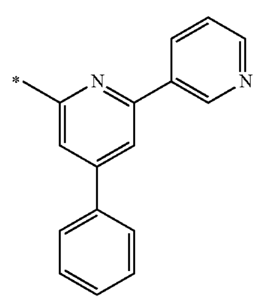

-continued
6-89
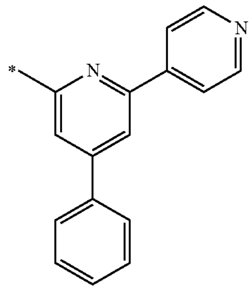
6-90
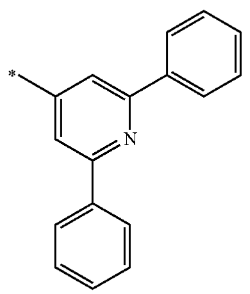
6-91
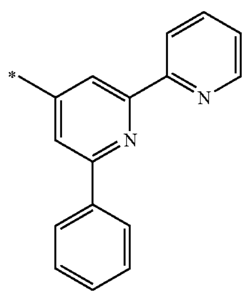
6-92
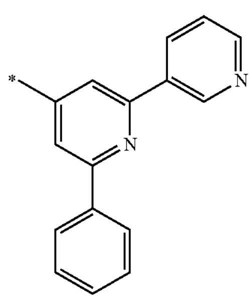
6-93
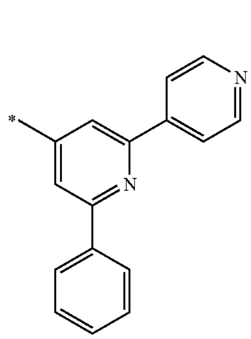
-continued
6-94
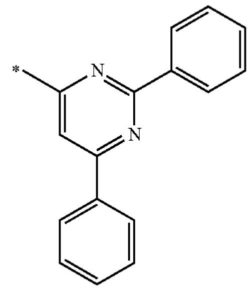
6-95
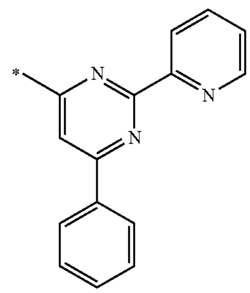
6-96
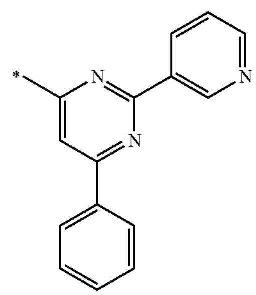
6-97
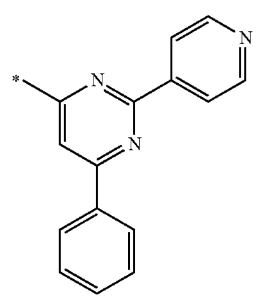
6-98
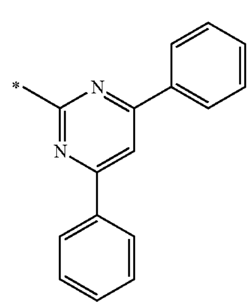

-continued
6-99
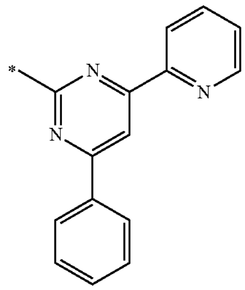
6-100
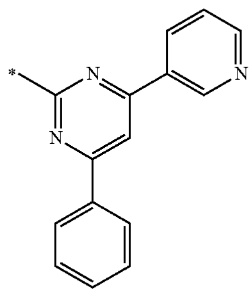
6-101
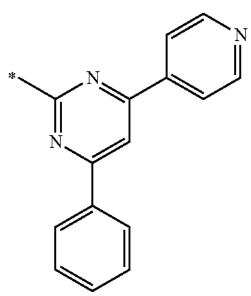
6-102
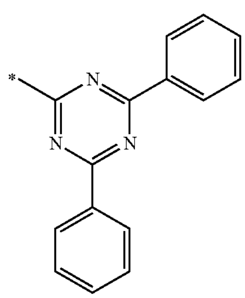
6-103
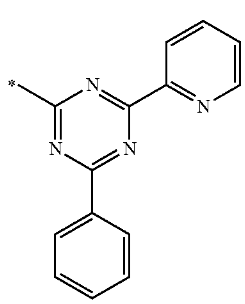
-continued
6-104
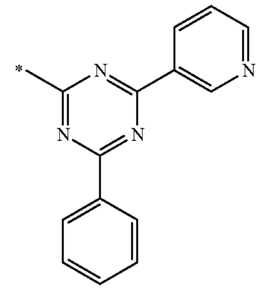
6-105
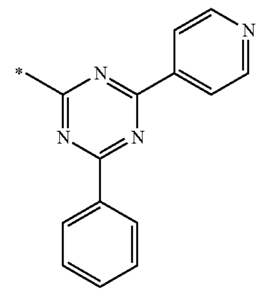
6-106
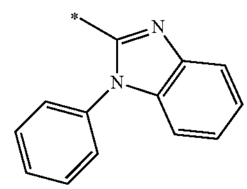
6-107
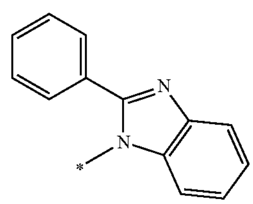
6-108
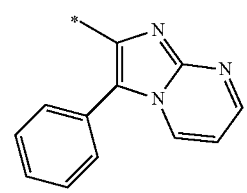
6-109
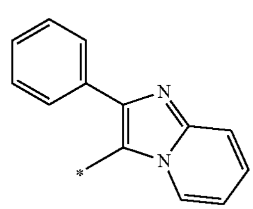
6-110
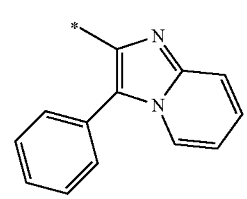

-continued
6-111
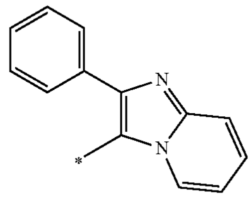
6-112
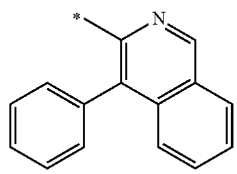
6-113
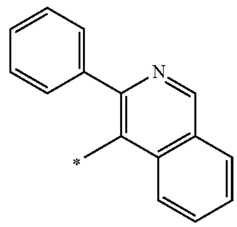
6-114
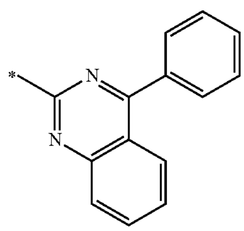
6-115
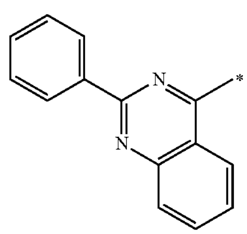
6-116
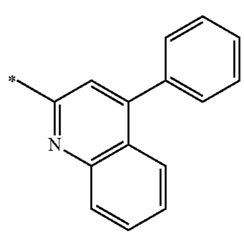
6-117
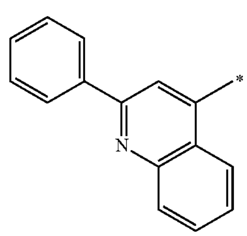
-continued
6-118
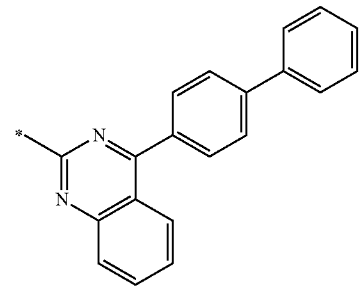
6-119
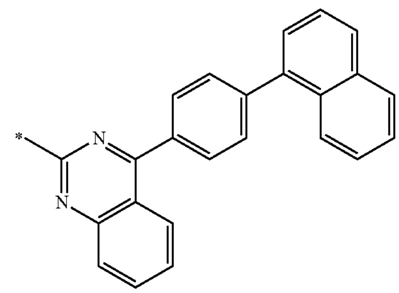
6-120
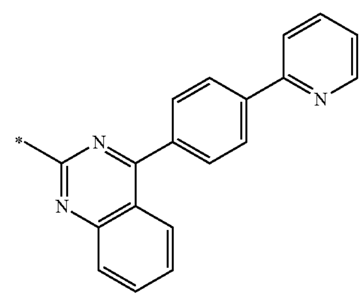
6-121
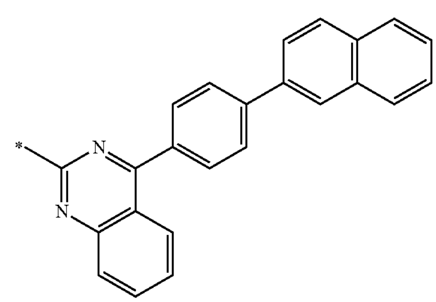
6-122
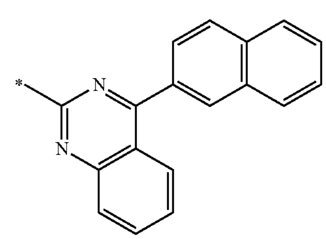

-continued
6-123
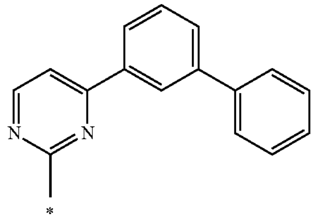
6-124
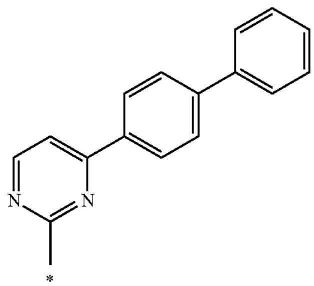
6-125
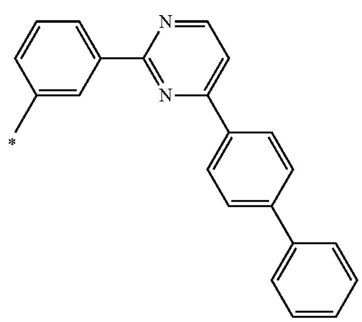
6-126
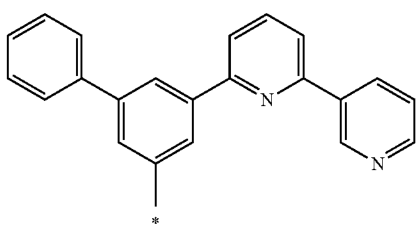
6-127
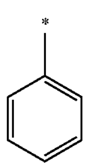
6-128
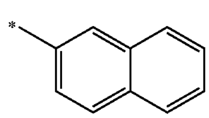
6-129
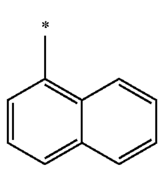
-continued
6-130
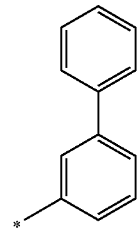
6-131
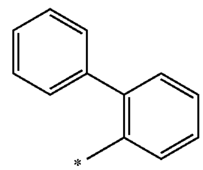
6-132
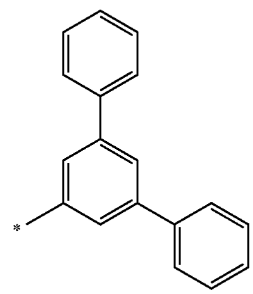
6-133
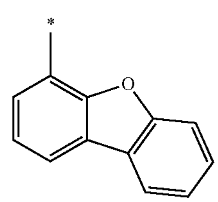
6-134
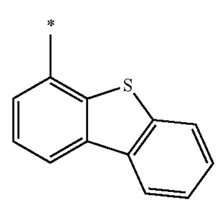
6-135
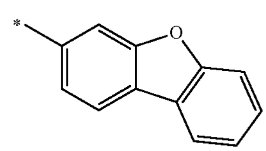
6-136
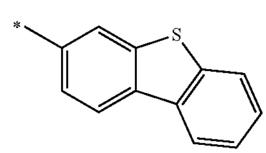
6-137
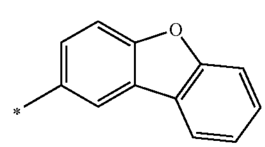

-continued
6-138
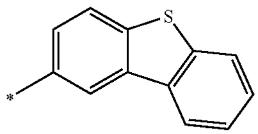
6-139
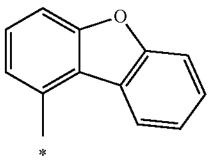
6-140
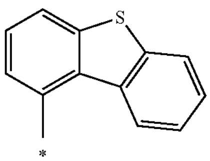
6-141
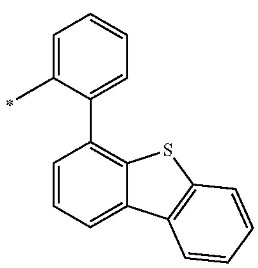
6-142
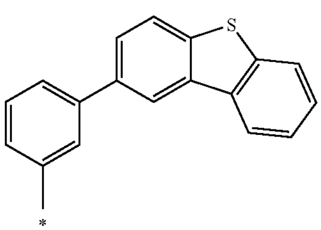
6-143
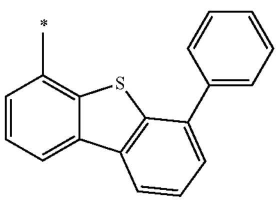
6-144
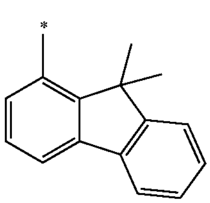
-continued
6-145
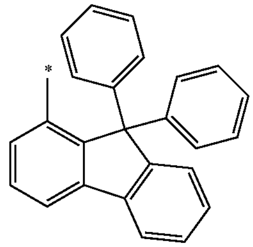
6-146
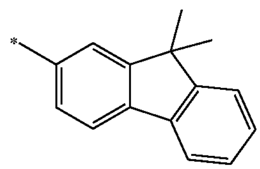
6-147
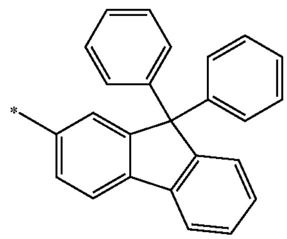
6-148
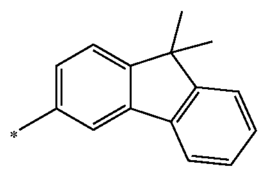
6-149
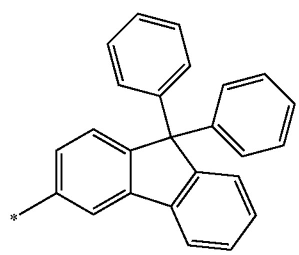
6-150
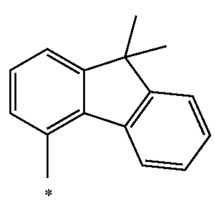
6-151
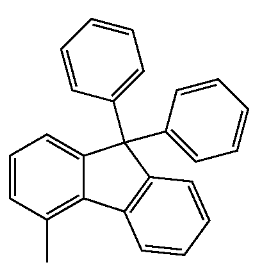

-continued
6-152
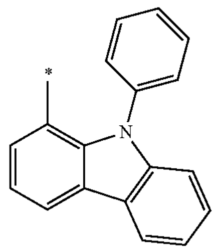
6-153
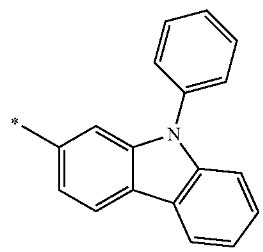
6-154
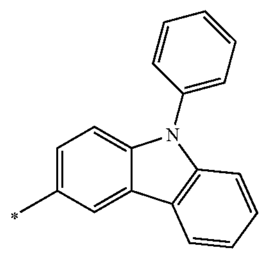
6-155
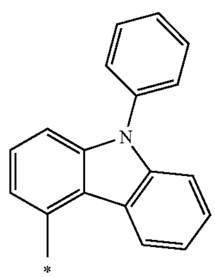
6-156
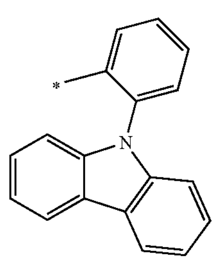
6-157
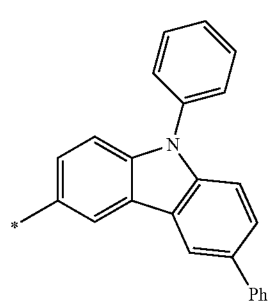
-continued
6-158
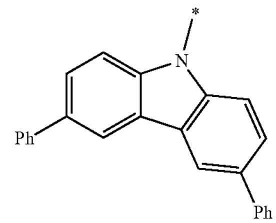
6-159
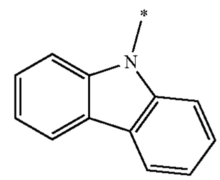
6-160
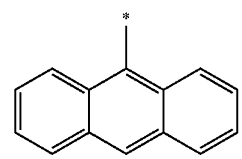
6-161
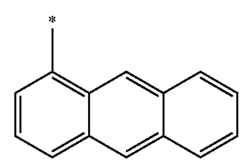
6-162
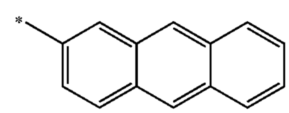
6-163
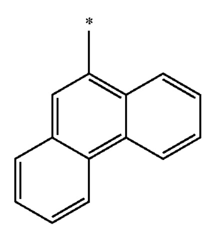
6-164
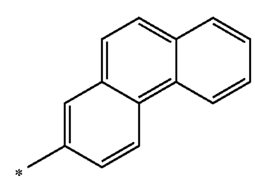
6-165
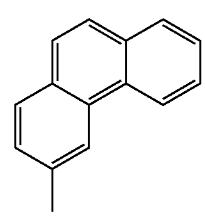

-continued 6-166

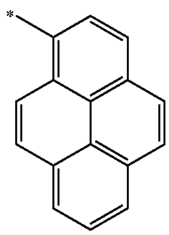

6-167

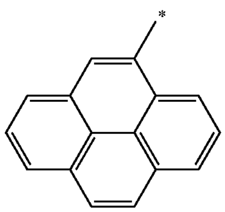

6-168

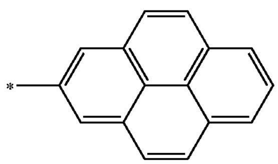

6-169

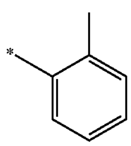

6-170

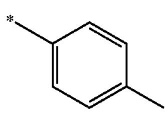

6-171

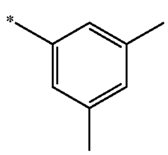

6-172

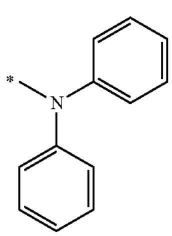

6-173

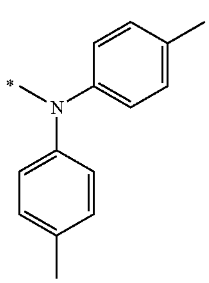

-continued 6-174

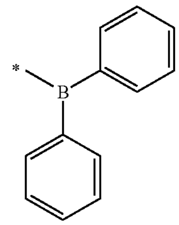

6-175

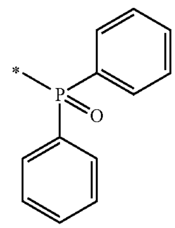

6-176

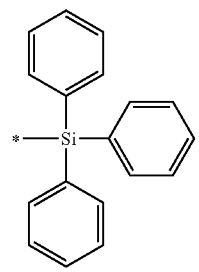

6-177

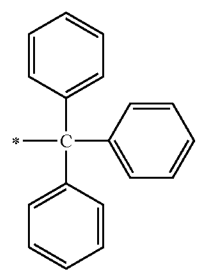

6-178

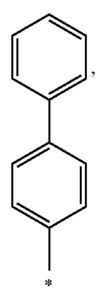

wherein, in Formulae 6-1 to 6-178, * is a binding site to a neighboring atom, and Ph is a phenyl group.

11. The organic light-emitting device of claim 1, wherein, in Formulae 1-1 to 1-3, c1 is 1, and c2 and c3 are each 0.

12. The organic light-emitting device of claim 1, wherein, Formulae 1-1 to 1-3 and 2, $R_1$ to $R_6$, $R_{11}$ to $R_{18}$, $R_{21}$ to $R_{28}$, $R_{31}$ to $R_{38}$, $R_{41}$ to $R_{48}$, $R_{51}$ to $R_{58}$, and $R_{61}$ and $R_{62}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group.

13. The organic light-emitting device of claim 1, wherein, Formulae 1-1 to 1-3 and 2, $R_1$ to $R_6$, $R_{41}$ to $R_{48}$, $R_{51}$ to $R_{58}$, and $R_{61}$ and $R_{62}$ are each independently selected from hydrogen, deuterium, —F, —Cl, —Br, —I, a methyl group, an ethyl group, a propyl group, an iso-propyl group, a butyl group, iso-butyl group, a sec-butyl group, and a tert-butyl group, and $R_{11}$ to $R_{18}$, $R_{21}$ to $R_{28}$, and $R_{31}$ to $R_{38}$ are each independently selected from a methyl group, an ethyl group, a propyl group, an iso-propyl group, a butyl group, iso-butyl group, a sec-butyl group, and a tert-butyl group.

14. The organic light-emitting device of claim 1, wherein, the first compound is represented by one of Formulae 1A to 1F, and the second compound is represented by one of Formulae 2A to 2J:

Formula 1A

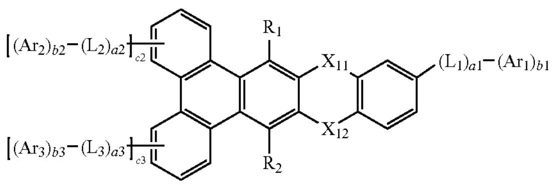

Formula 1B

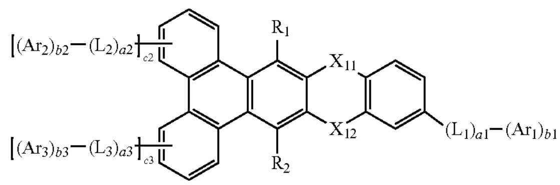

Formula 1C

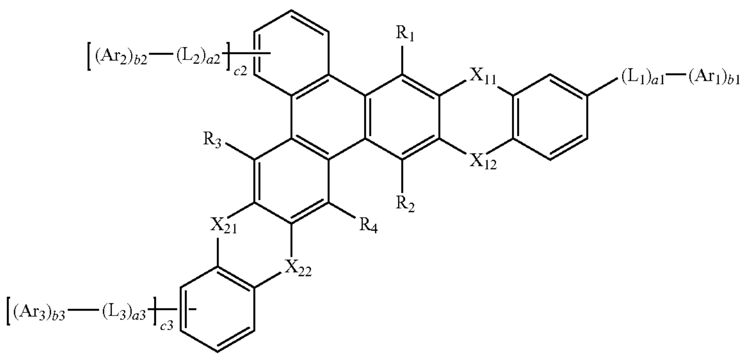

Formula 1D

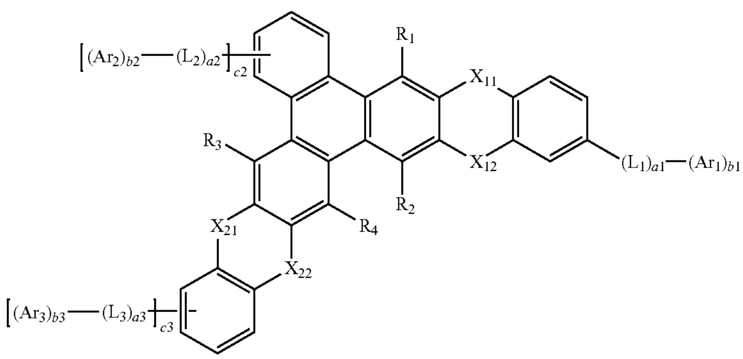

Formula 1E

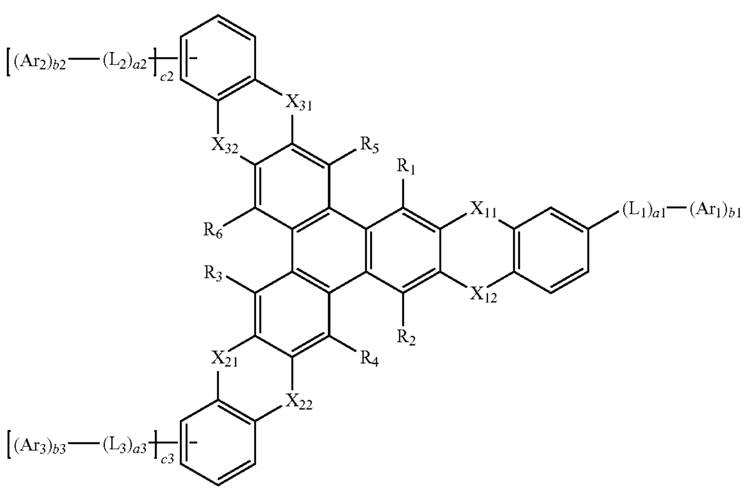

-continued
Formula 1F
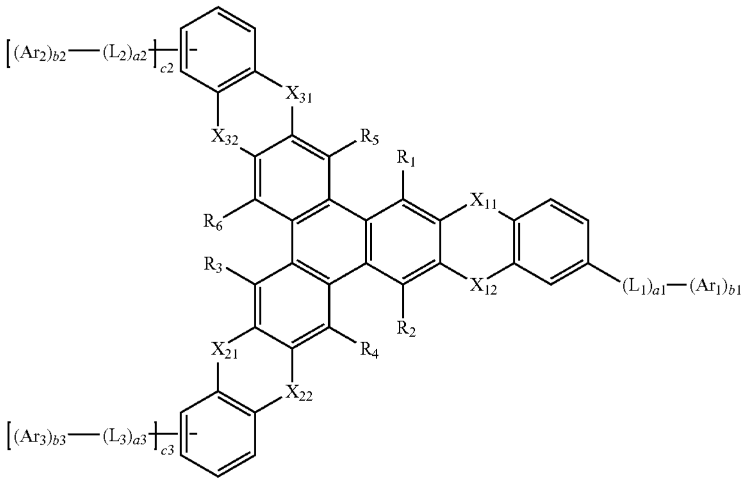
Formula 2A
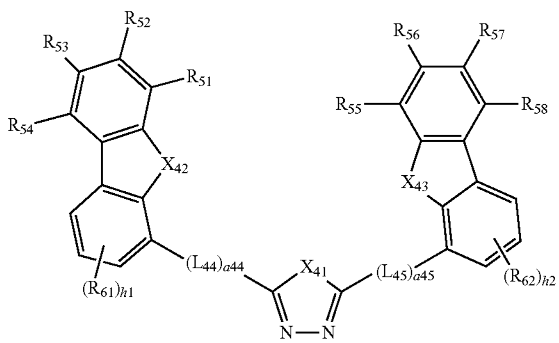
Formula 2B
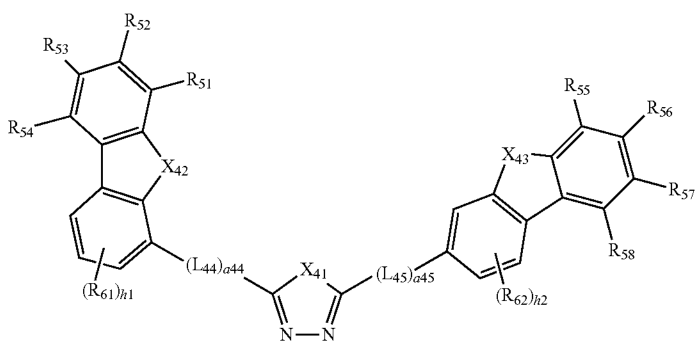
Formula 2C
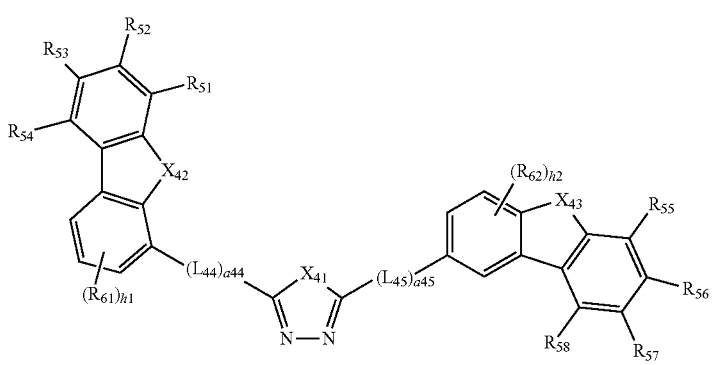

-continued
Formula 2D
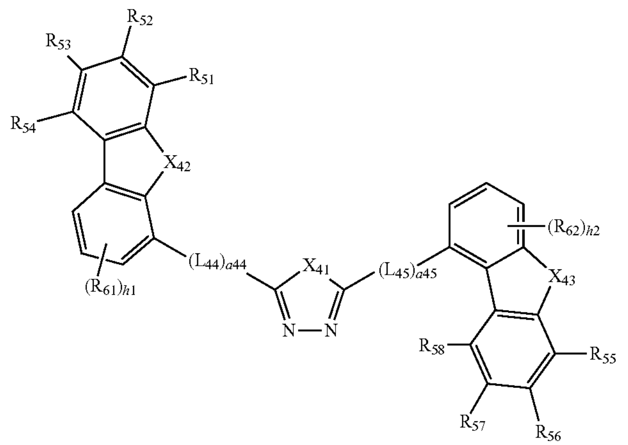
Formula 2E
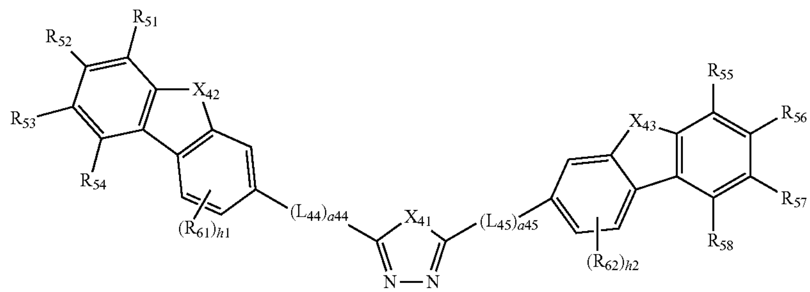
Formula 2F
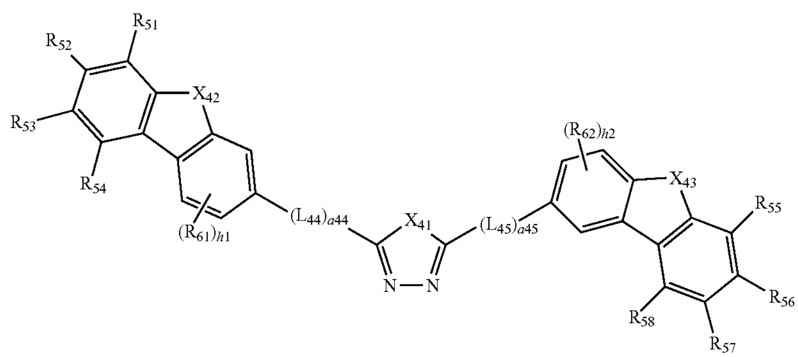
Formula 2G
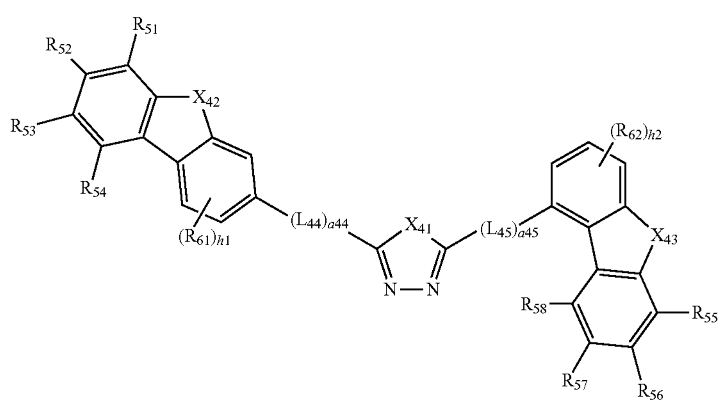

-continued
Formula 2H
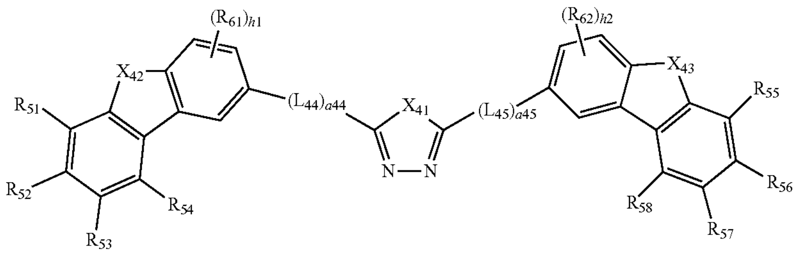
Formula 2I
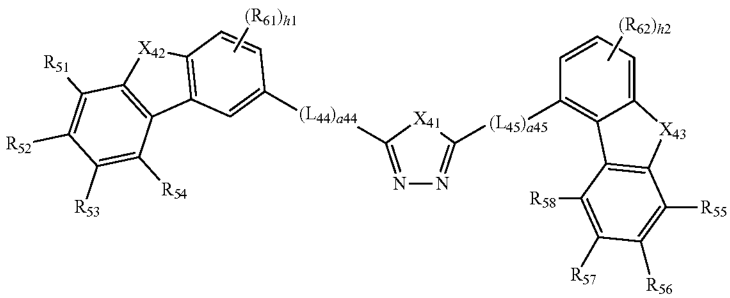
Formula 2J
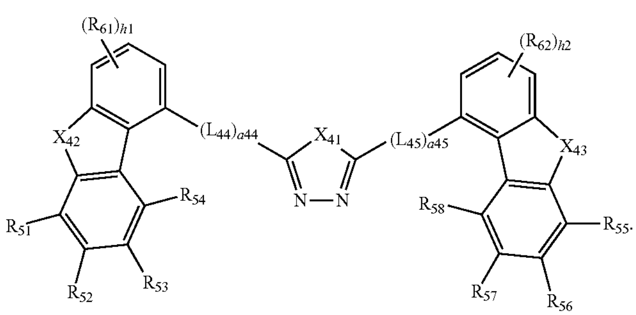
15. The organic light-emitting device of claim 1, wherein the first compound is represented by one of Formulae 1A(1), 1A(2), 1B(1), 1C(1), 1C(2), 1D(1), 1D(2), 1E(1), 1E(2), 1F(1), and 1F(2), and the second compound is represented by one of Formulae 2A(1) to 2J(1):
Formula 1A(1)
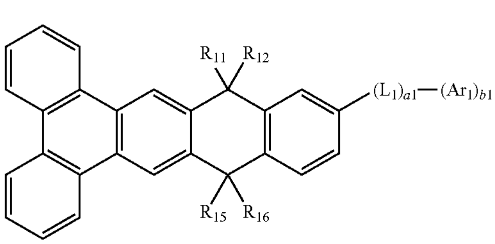
Formula 1A(2)
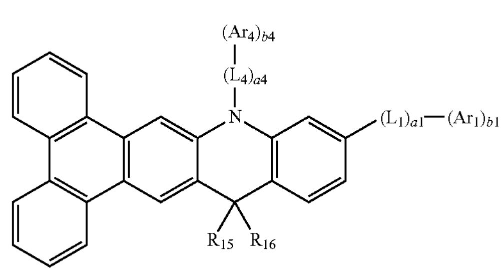

-continued
Formula 1B(1)
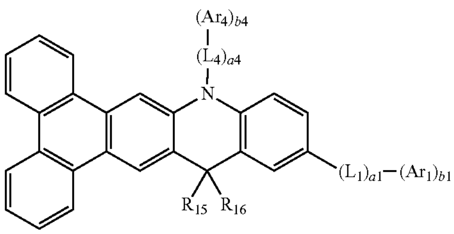
Formula 1C(1)
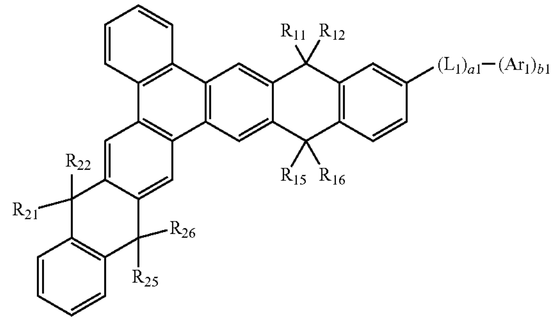
Formula 1C(2)
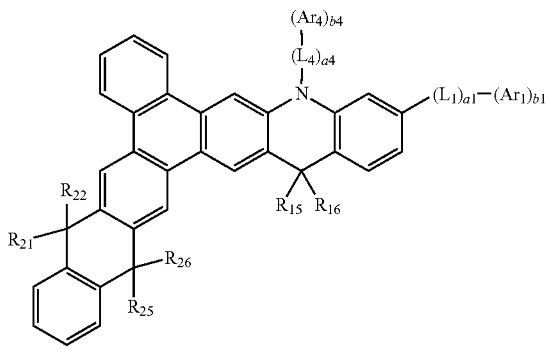
Formula 1D(1)
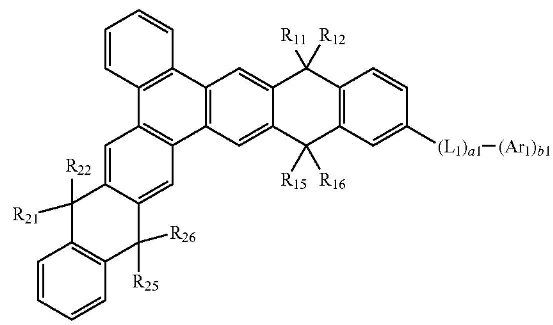
Formula 1D(2)
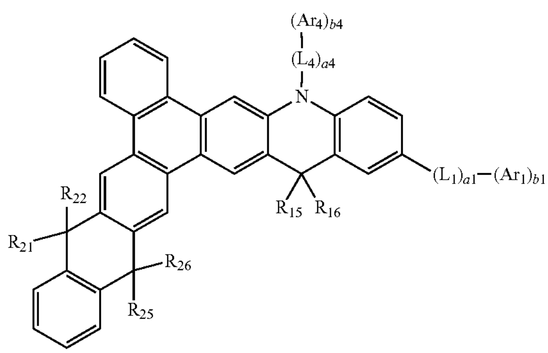
Formula 1E(1)
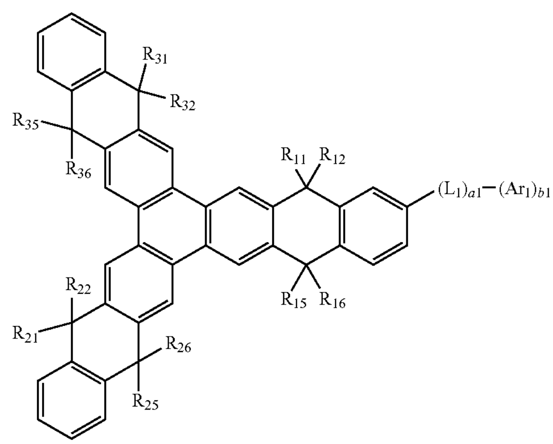
Formula 1E(2)
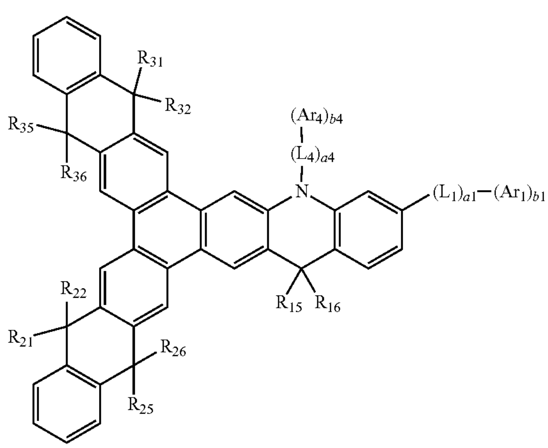
Formula 1F(1)
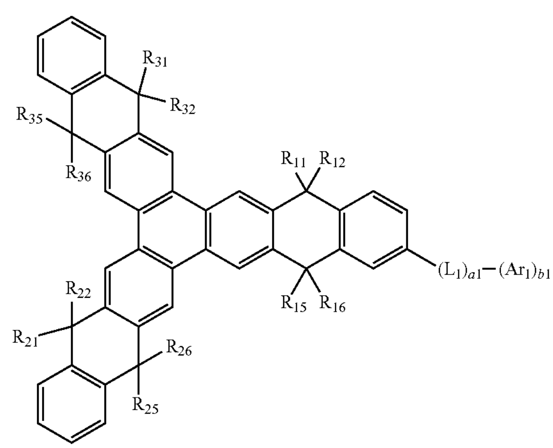

-continued
Formula 1F(2)
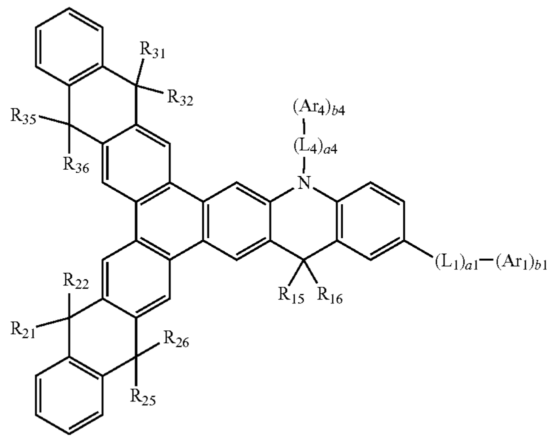
Formula 2A(1)
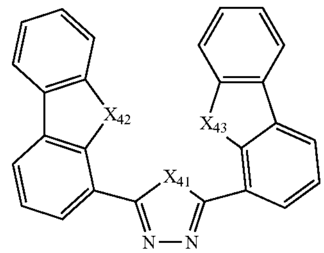
Formula 1B(1)
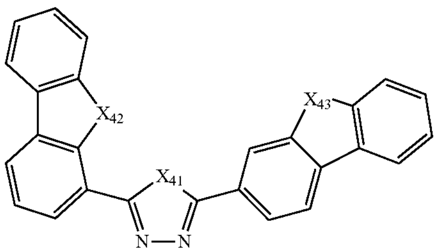
Formula 1C(1)
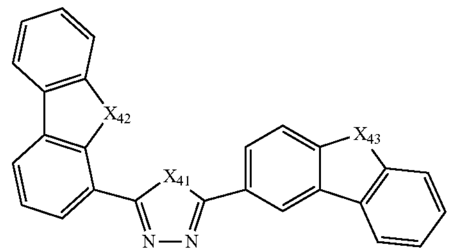
Formula 2D(1)
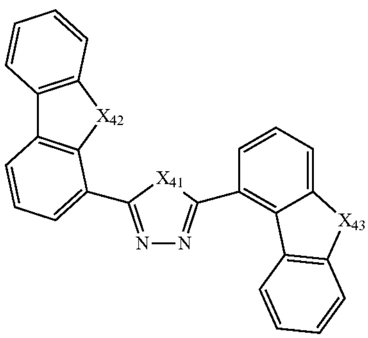
Formula 2E(1)
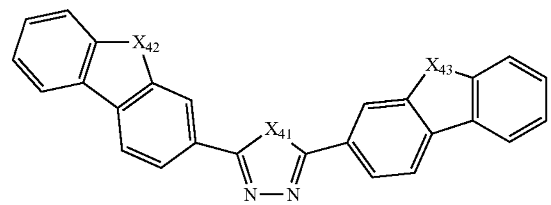
Formula 2F(1)
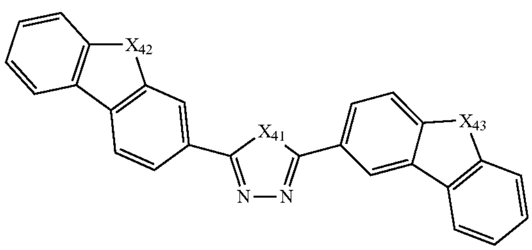
Formula 2G(1)
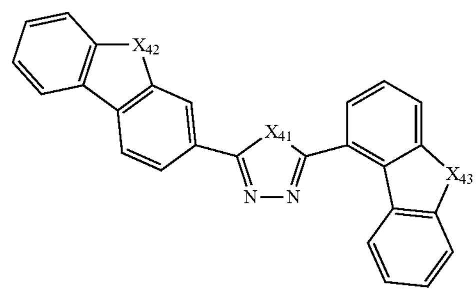
Formula 2H(1)
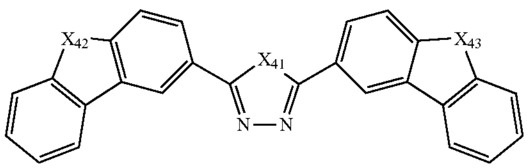
Formula 2I(1)
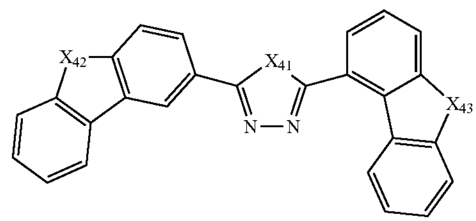

-continued
Formula 2J(1)
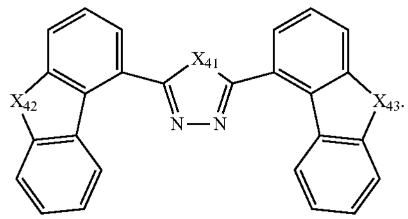
16. The organic light-emitting device of claim 15, wherein, in Formulae 2A(1) to 2J(1), $X_{42}$ is $N[(L_{42})_{a42}-(Ar_{42})_{b42}]$, and $X_{43}$ is $N[(L_{43})_{a43}-(Ar_{43})_{b43}]$.
17. The organic light-emitting device of claim 1, wherein, the first compound is one selected from Compounds In-A-1 to In-A-16, In-B-1 to In-B-18, and In-C-1 to In-C-14, and the second compound is one selected from Compounds C1 to C389:
In-A-1
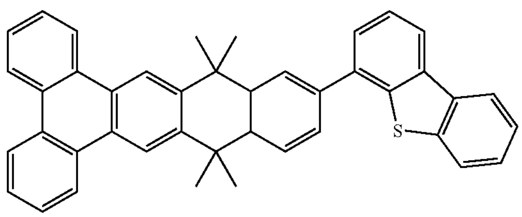
In-A-2
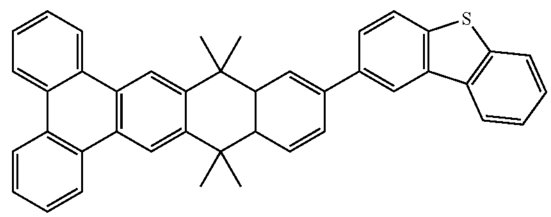
In-A-3
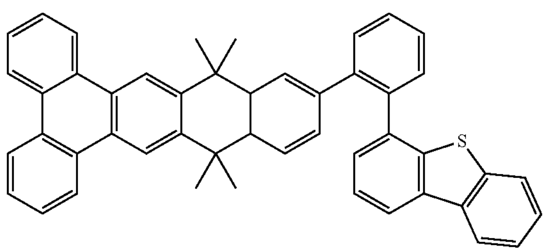
In-A-4
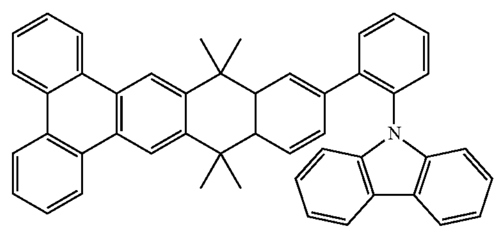
In-A-5
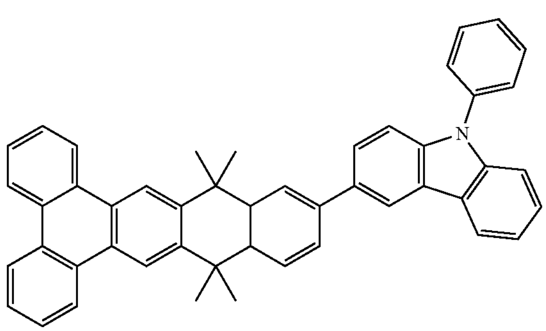
In-A-6
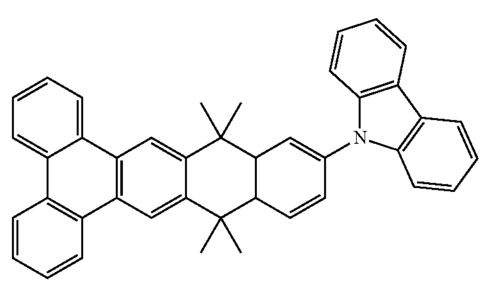

-continued
In-A-7
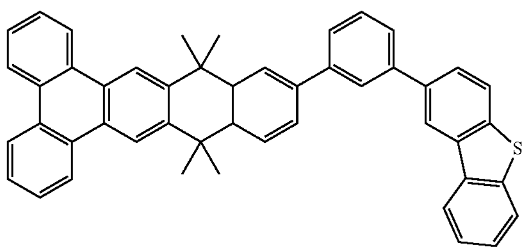
In-A-8
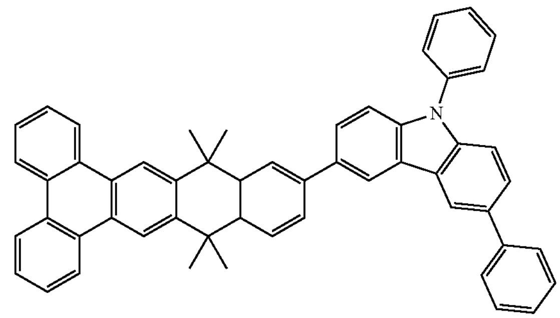
In-A-9
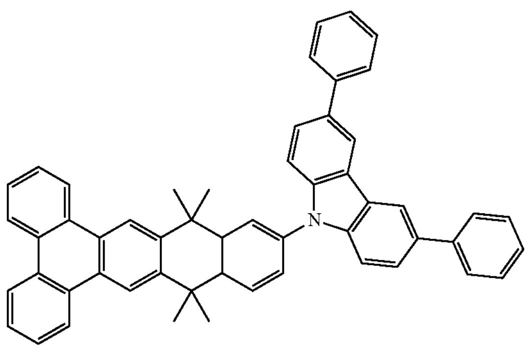
In-A-10
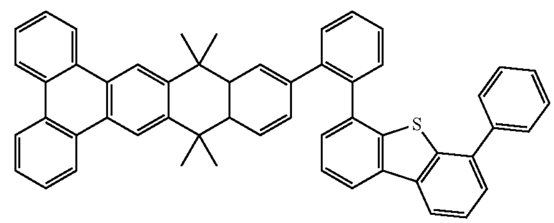
In-A-11
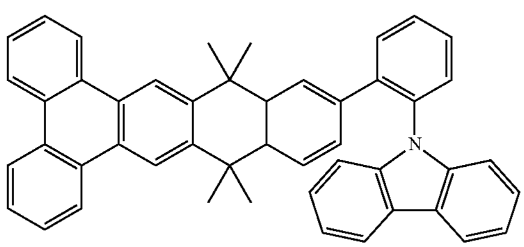
In-A-12
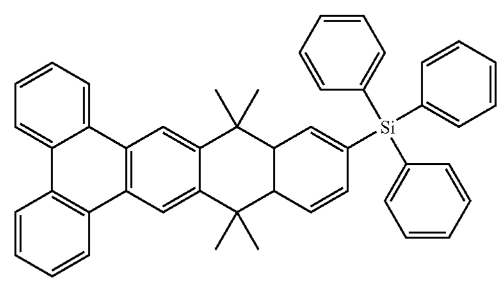
In-A-13
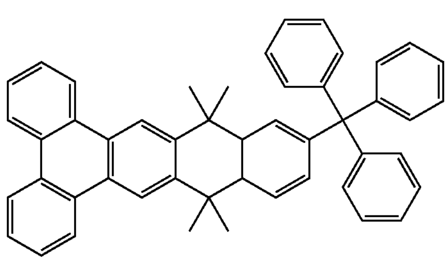
In-A-14
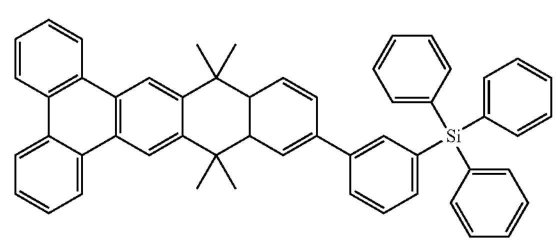
In-A-15
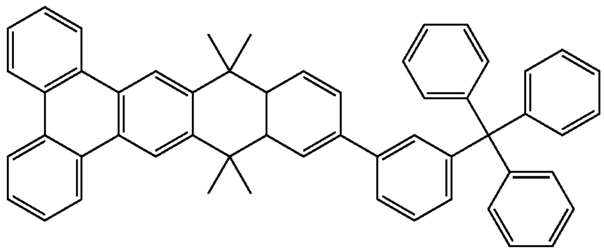

-continued
In-A-16
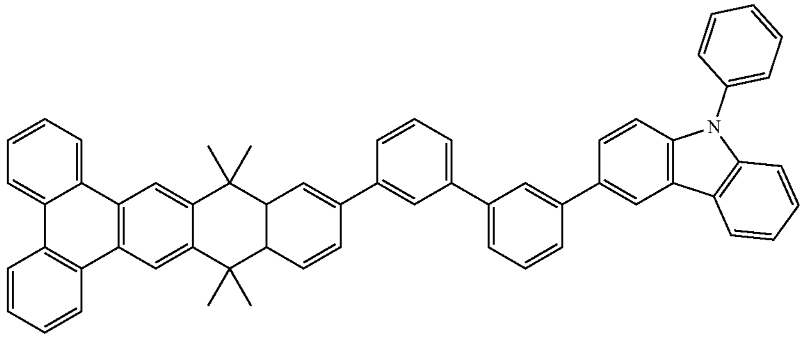
In-B-1
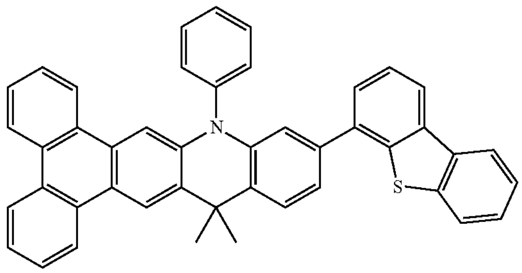
In-B-2
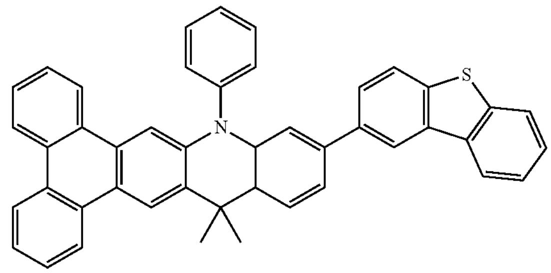
In-B-3
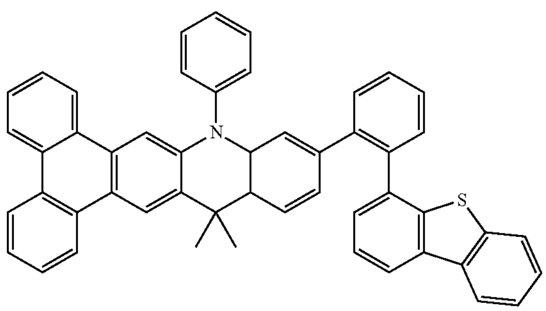
In-B-4
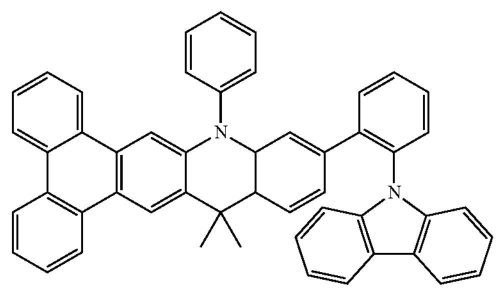
In-B-5
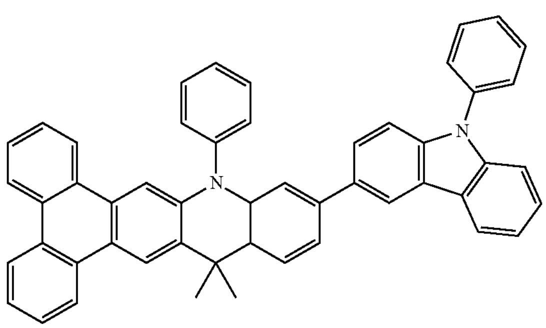
In-B-6
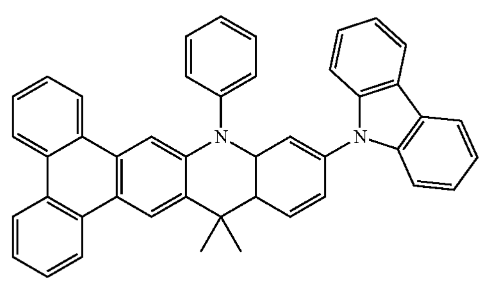
In-B-7
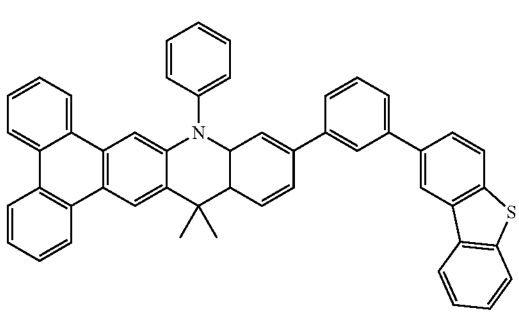
In-B-8
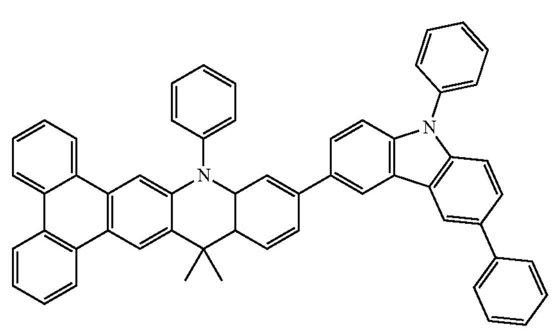

-continued
In-B-9
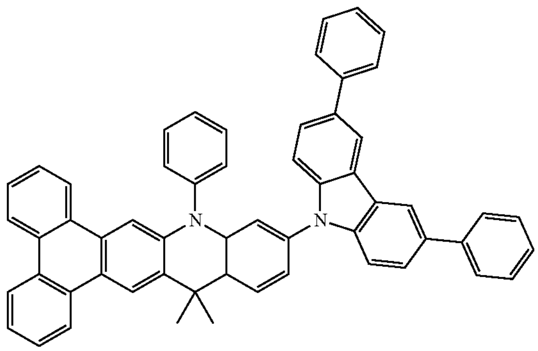
In-B-10
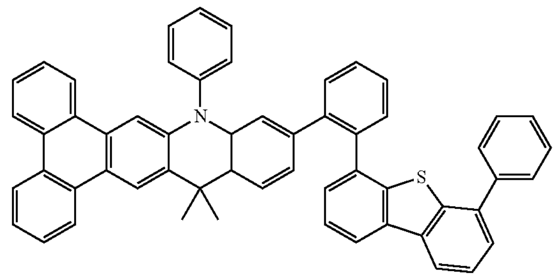
In-B-11
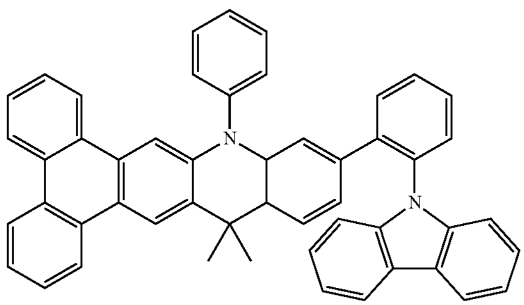
In-B-12
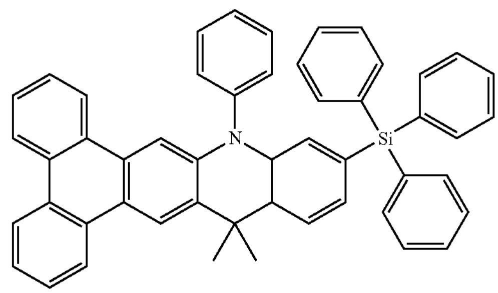
In-B-13
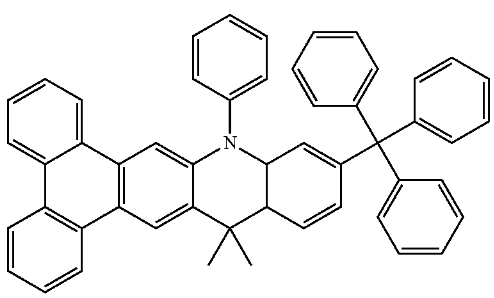
In-B-14
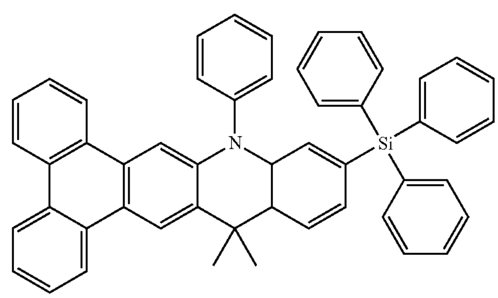
In-B-15
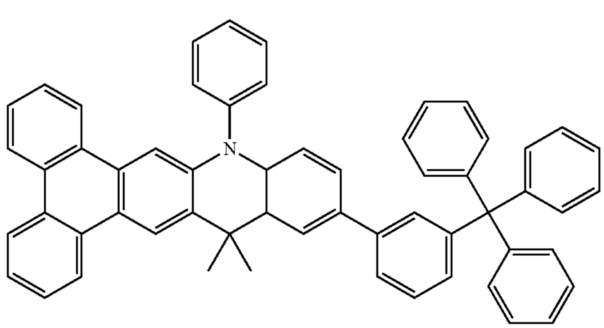

-continued
In-B-16
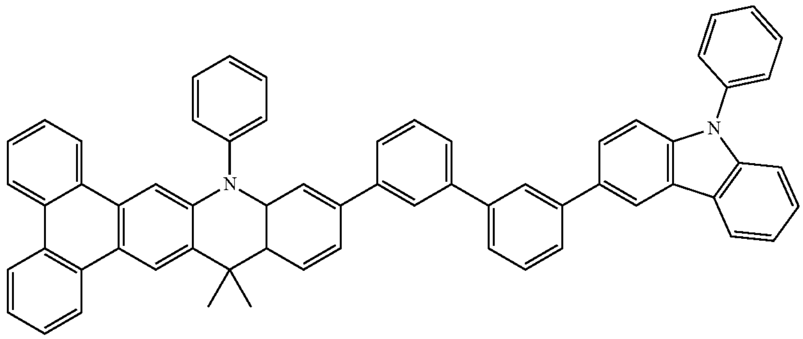
In-B-17
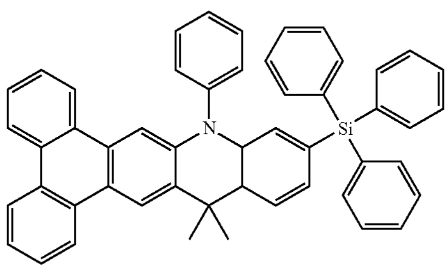
In-B-18
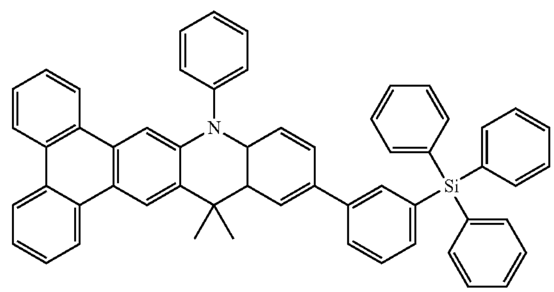
In-C-1
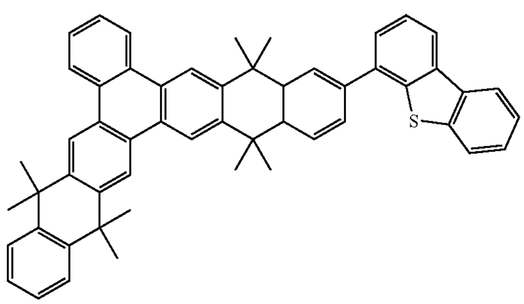
In-C-2
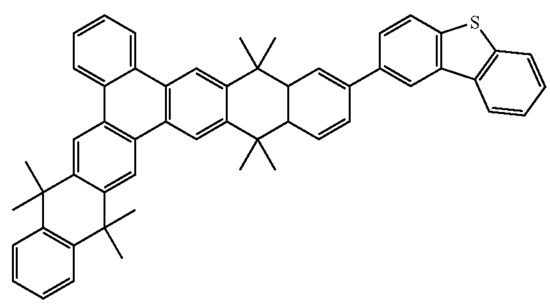
In-C-3
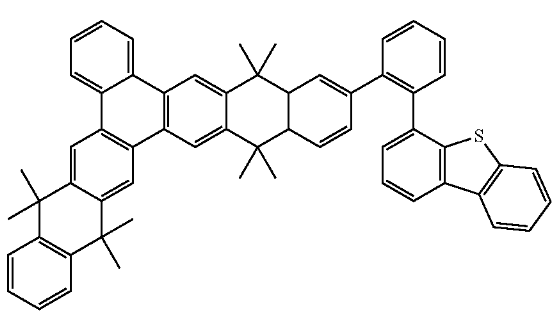
In-C-4
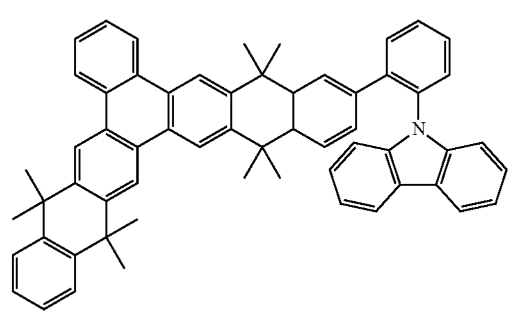

-continued
In-C-5
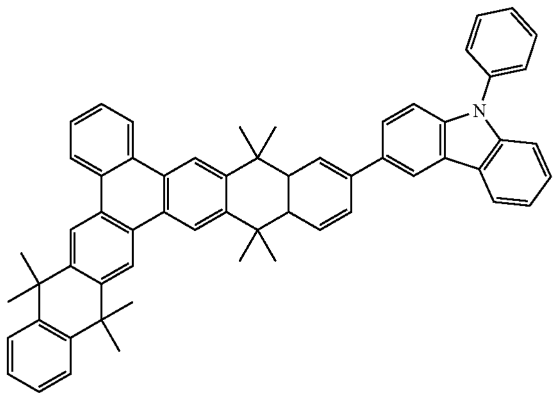
In-C-6
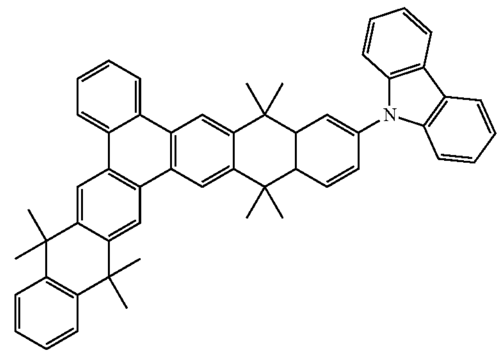
In-C-7
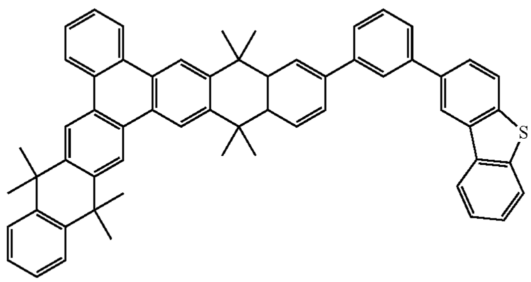
In-C-8
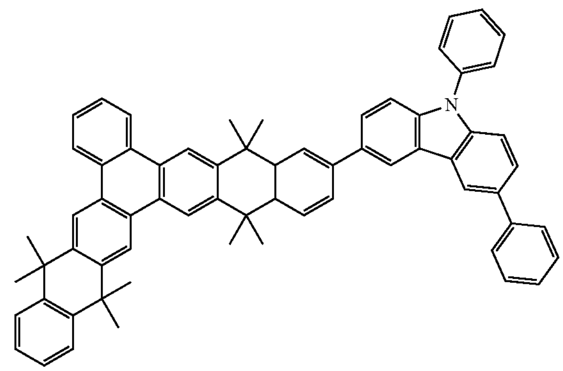
In-C-9
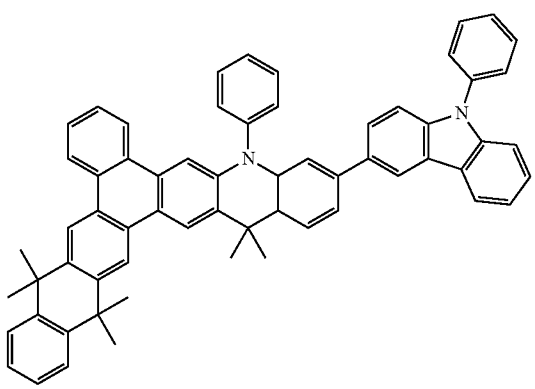
In-C-10
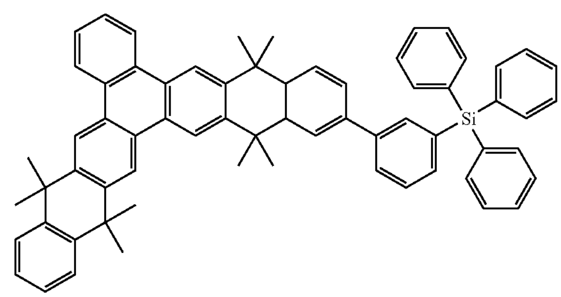
In-C-11
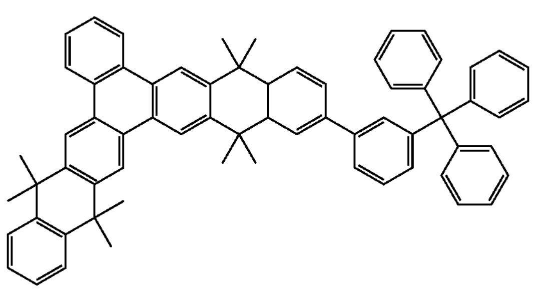
In-C-12
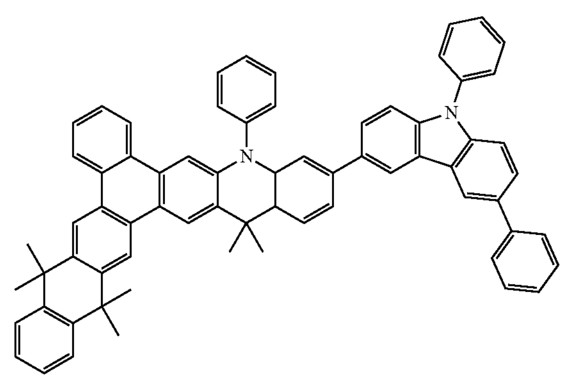

-continued
In-C-13
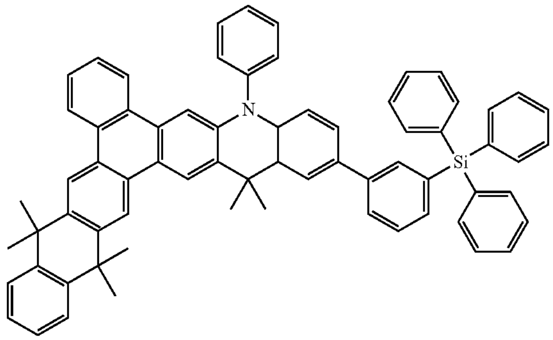
In-C-14
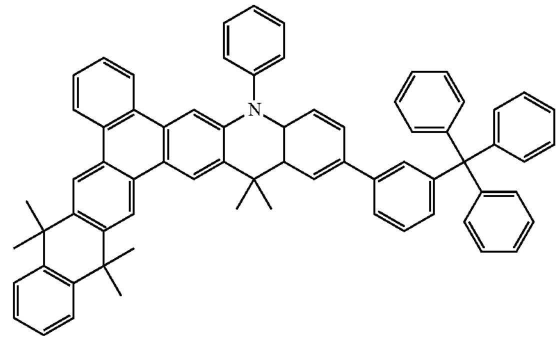
C 1
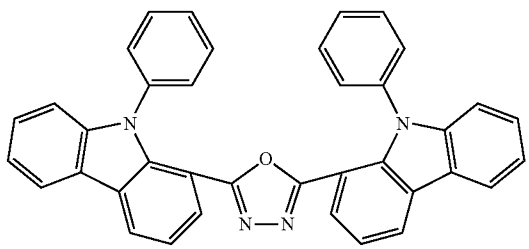
C 2
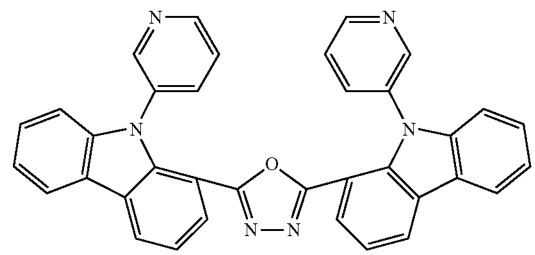
C 3
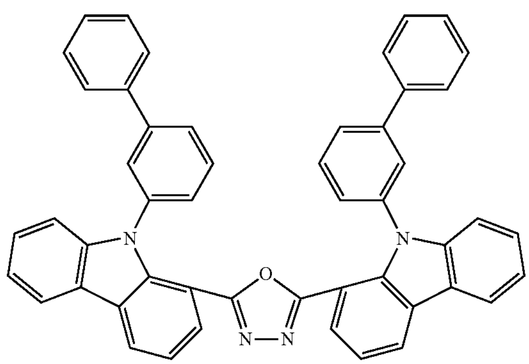
C 4
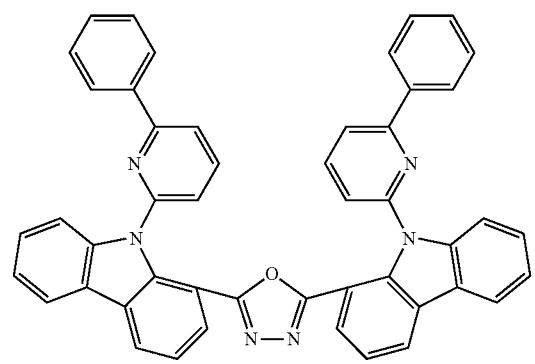
C 5
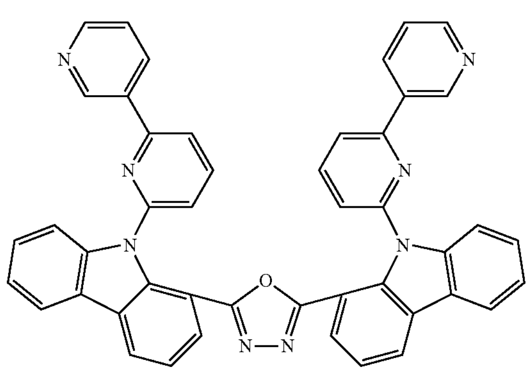
C 6
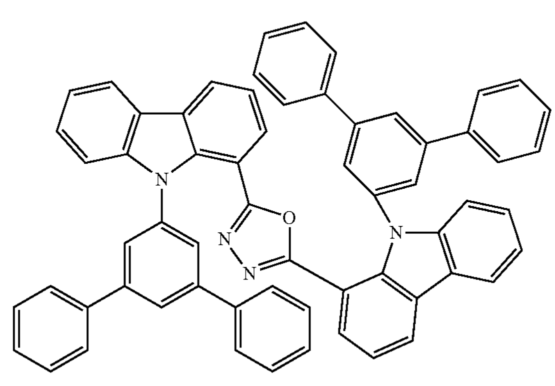

-continued
C 7
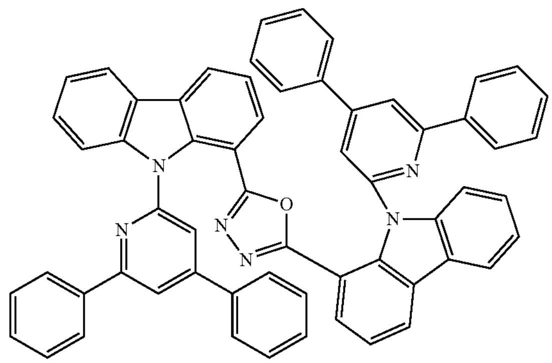
C 8
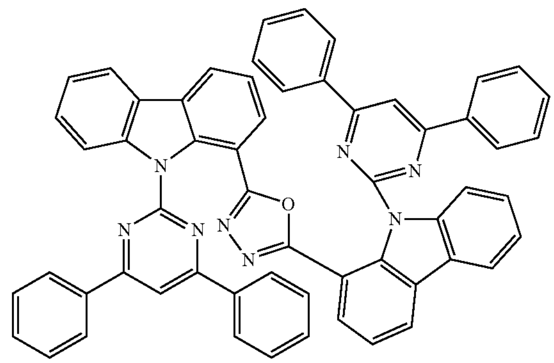
C 9
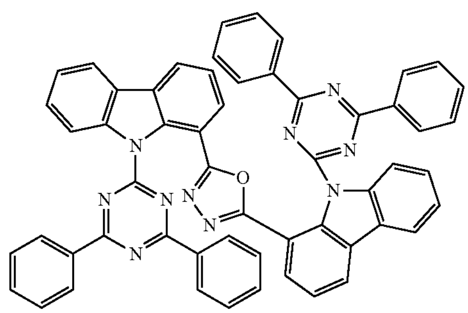
C 10
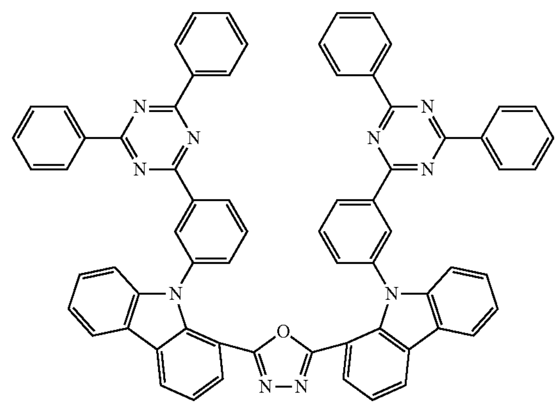
C 11
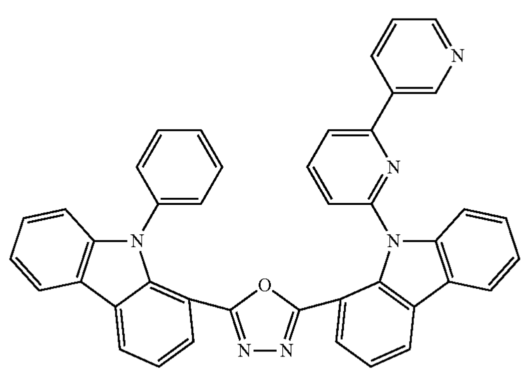
C 12
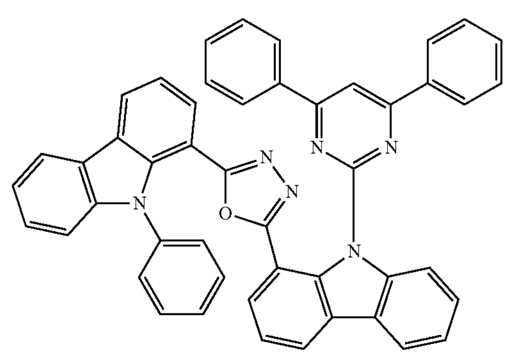
C 13
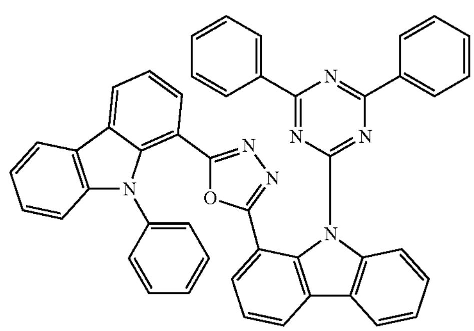
C 14
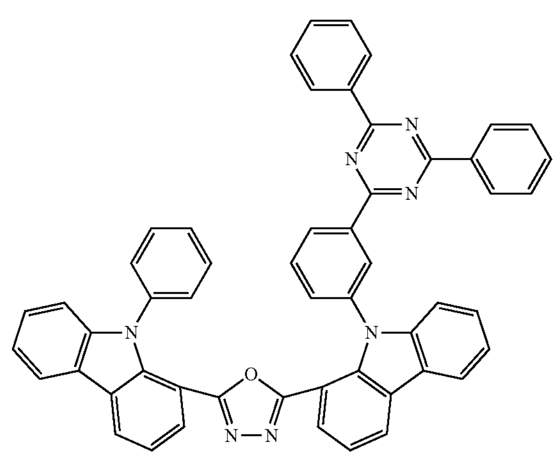

-continued
C 15
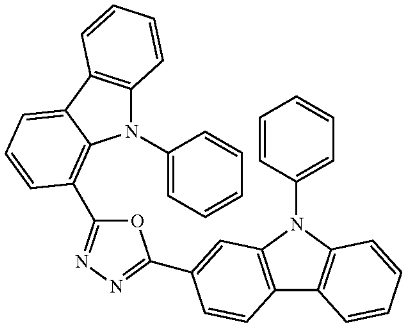
C 16
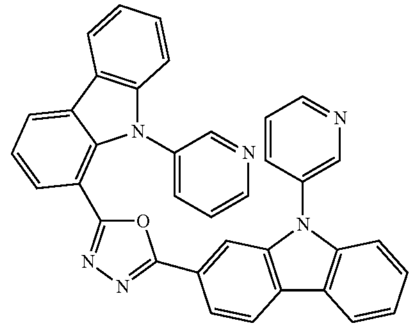
C 17
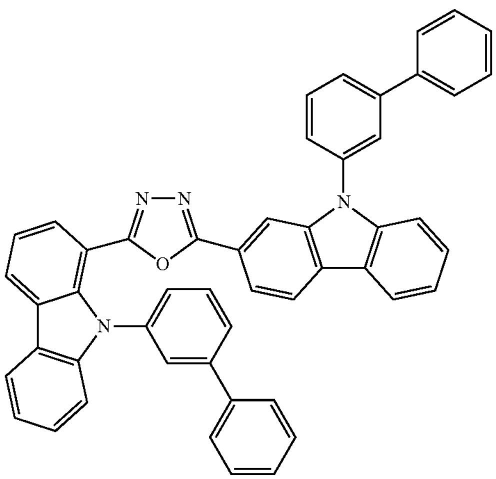
C 18
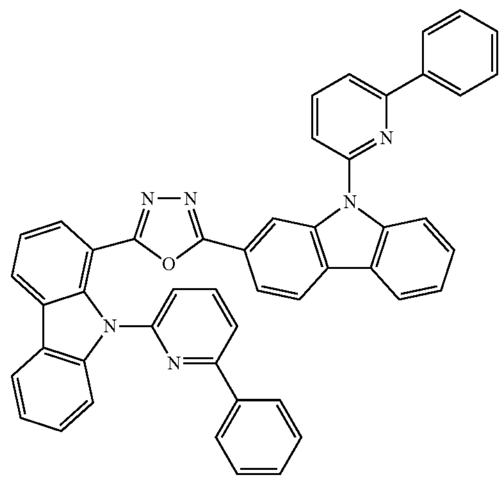
C 19
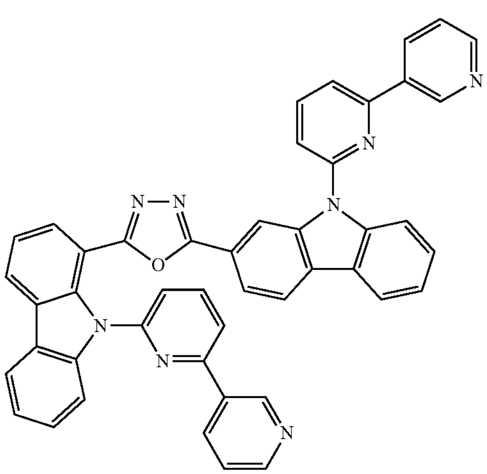
C 20
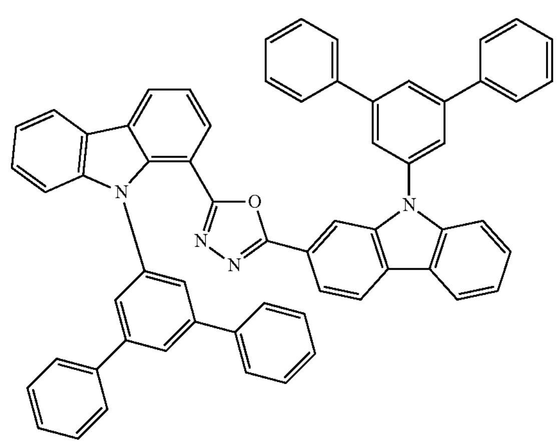

-continued
C 21
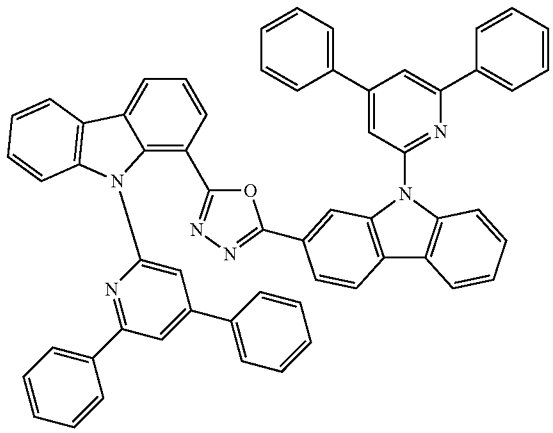
C 22
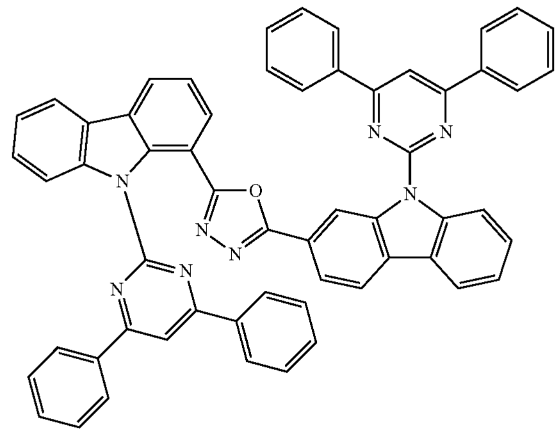
C 23
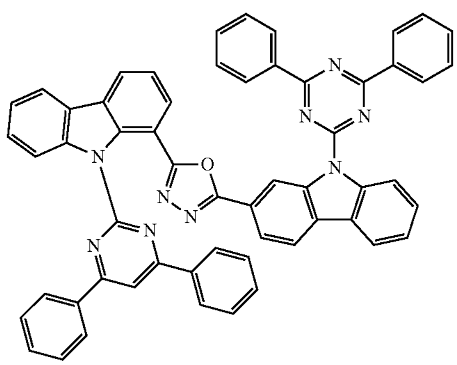
C 24
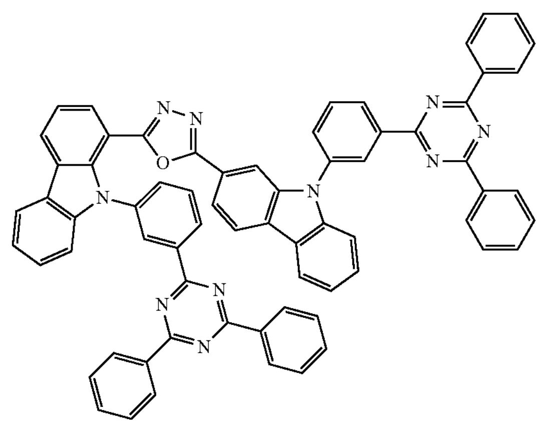
C 26
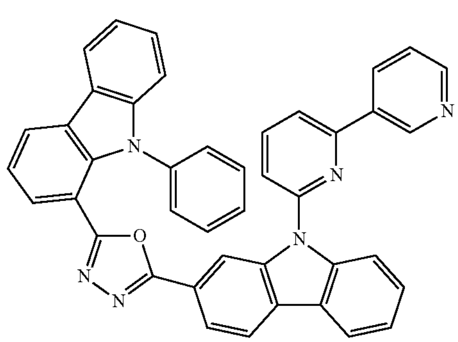
C 26
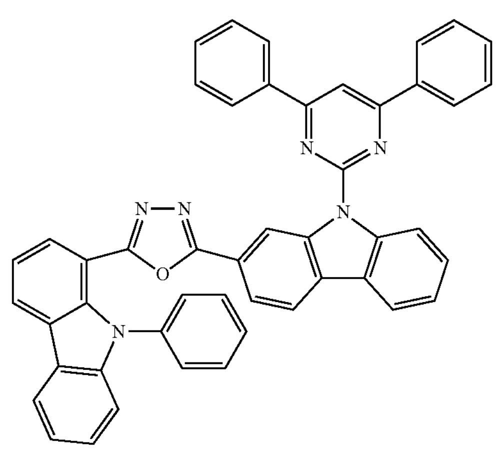

-continued
C 27
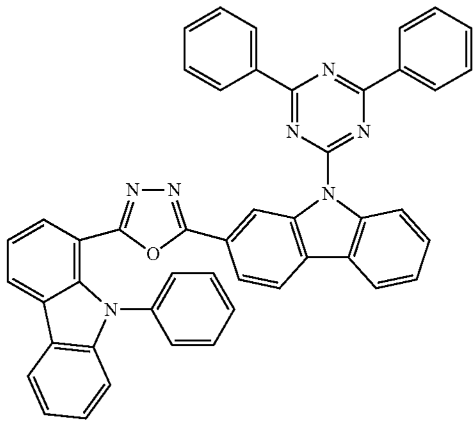
C 28
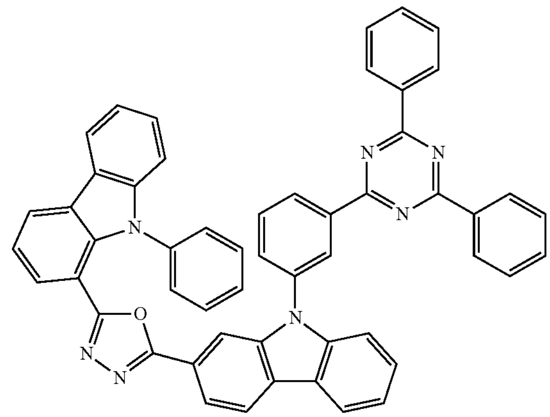
C 29
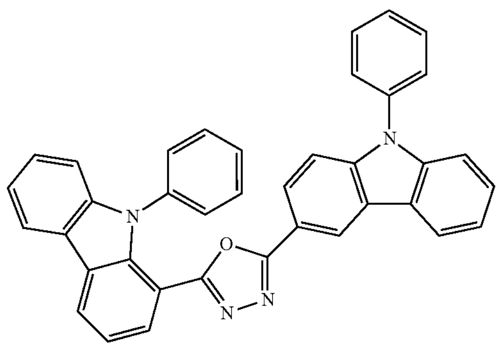
C 30
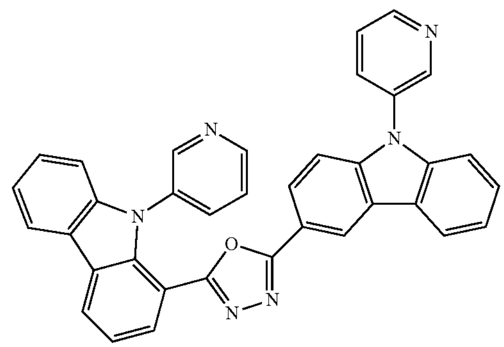
C 31
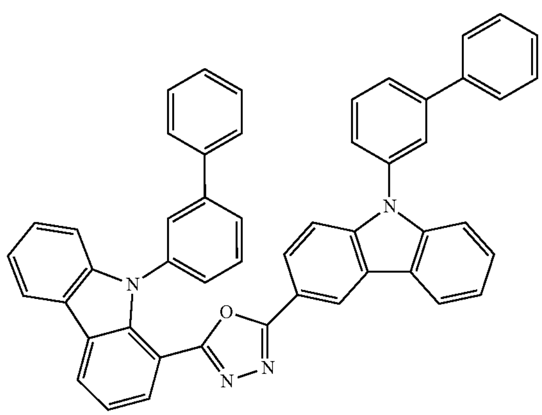
C 32
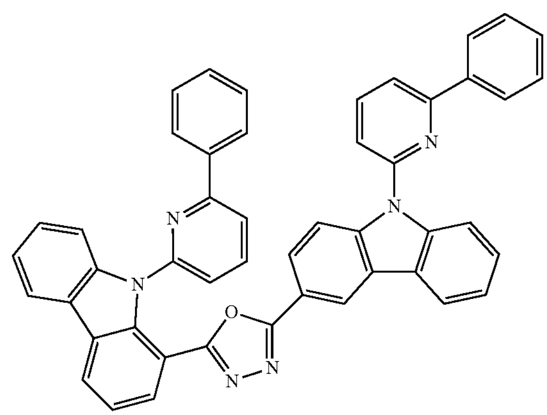
C 33
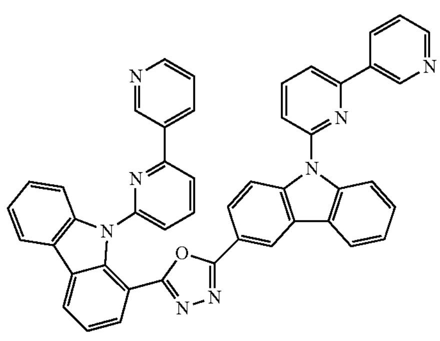
C 34
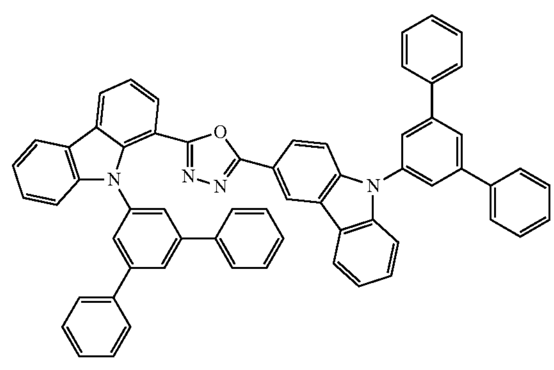

-continued
C 35
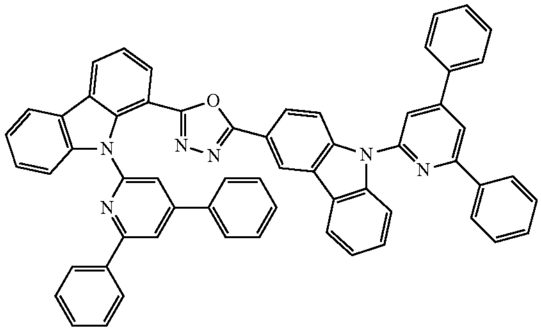
C 36
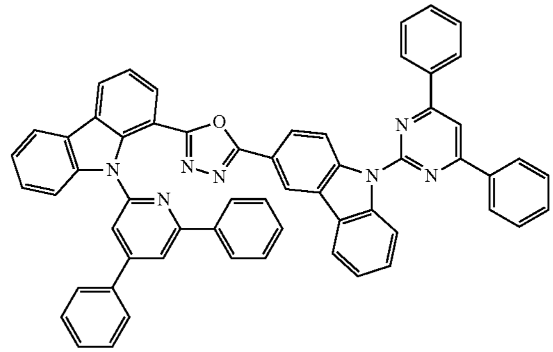
C 37
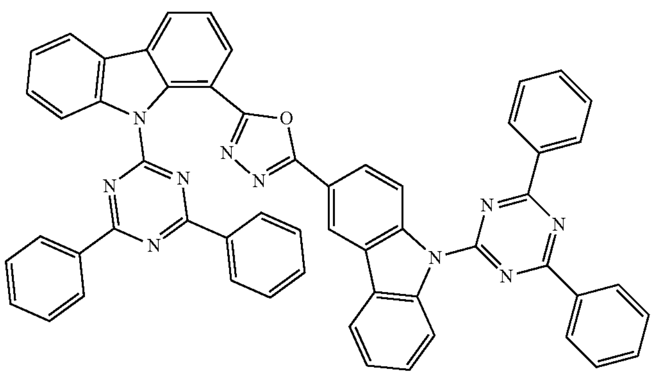
C 38
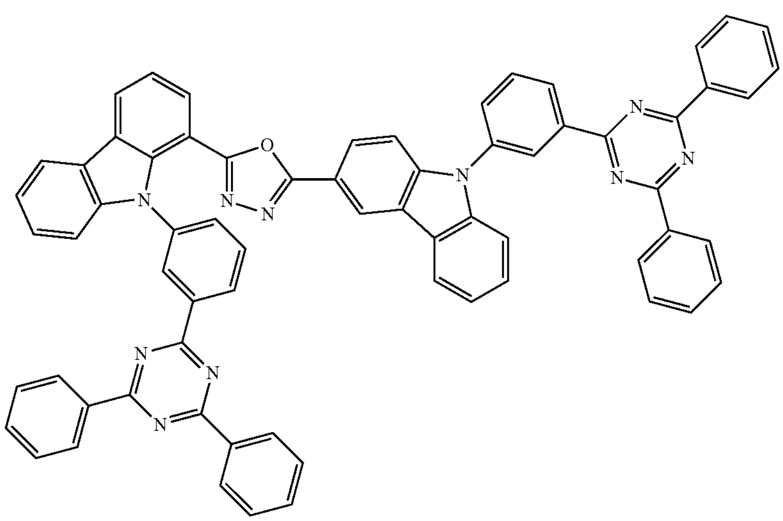

-continued
C 39
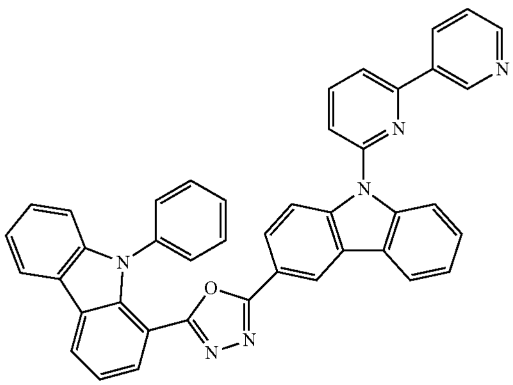
C 40
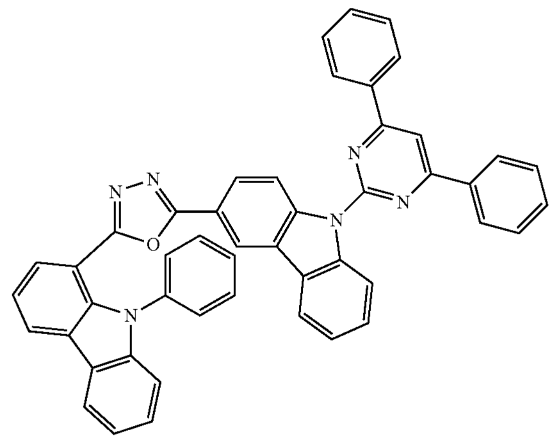
C 41
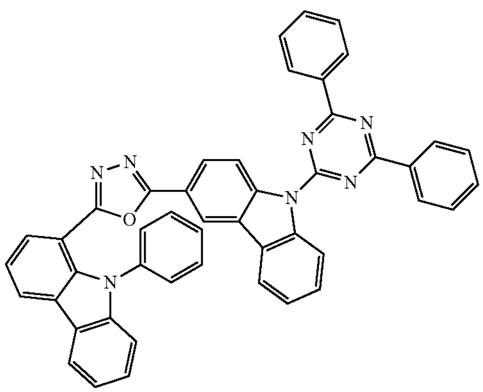
C 42
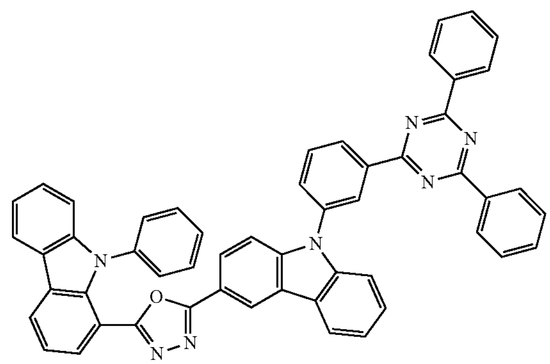
C 43
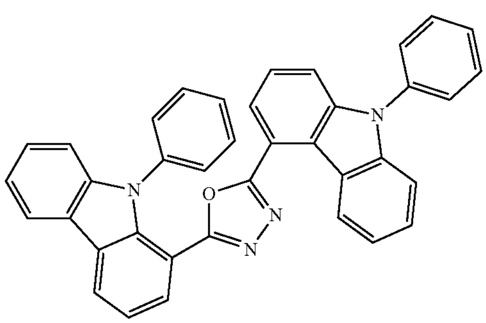
C 44
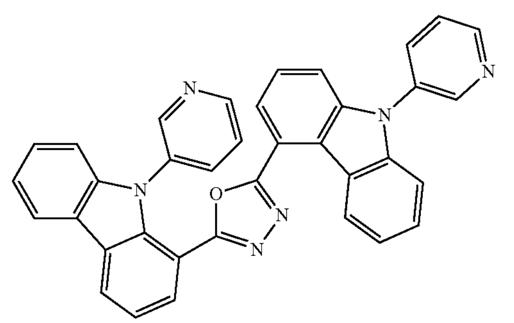
C 46
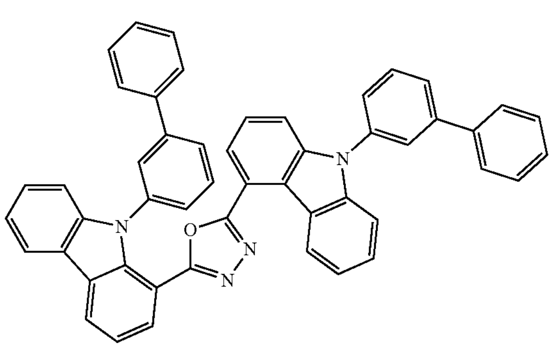
C 46
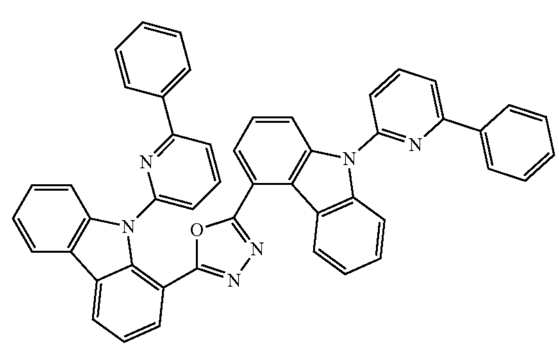

-continued
C 47
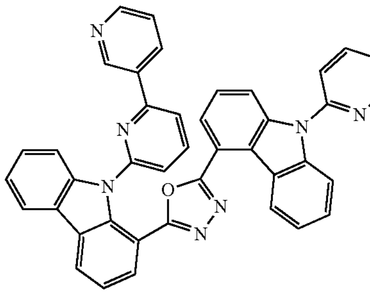
C 48
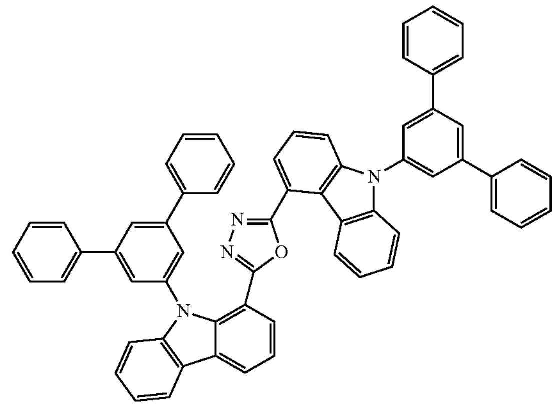
C 49
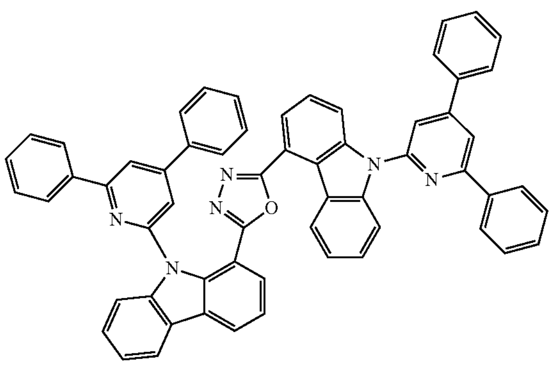
C 50
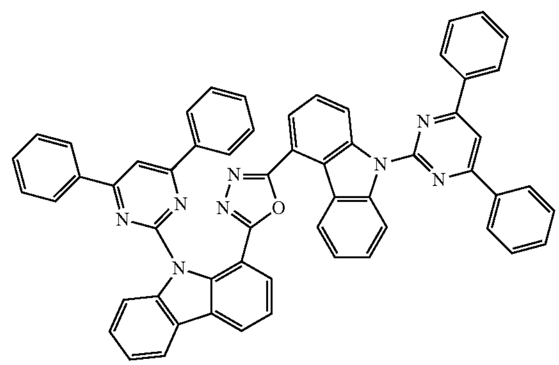
C 51
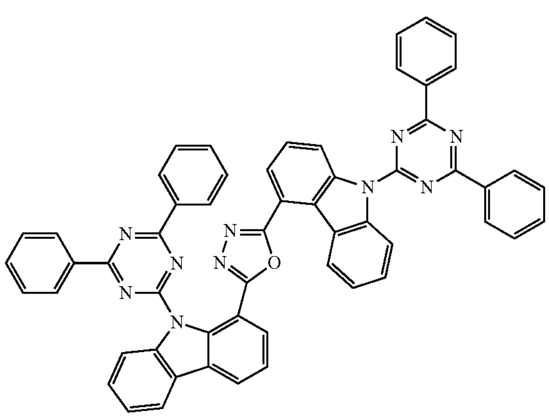
C 52
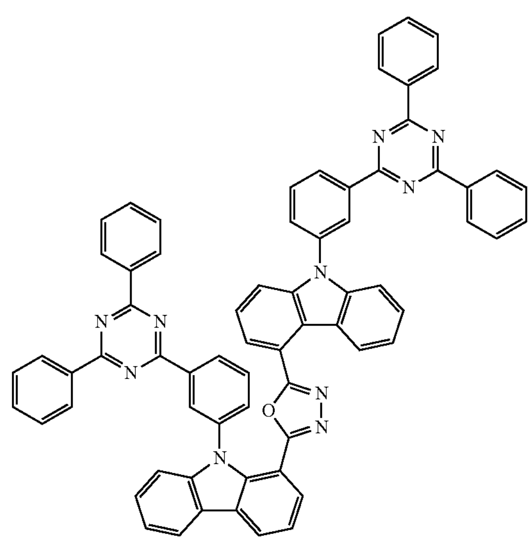

-continued
C 53
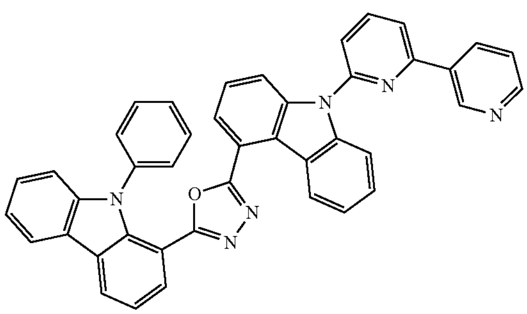
C 54
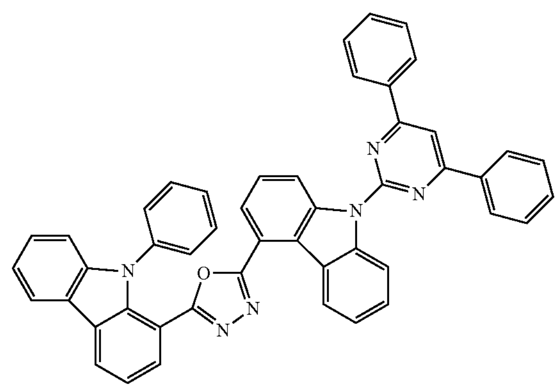
C 55
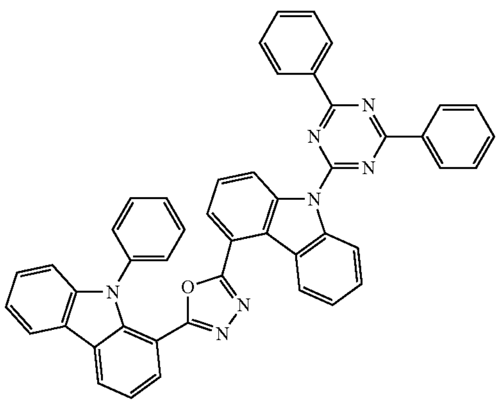
C 56
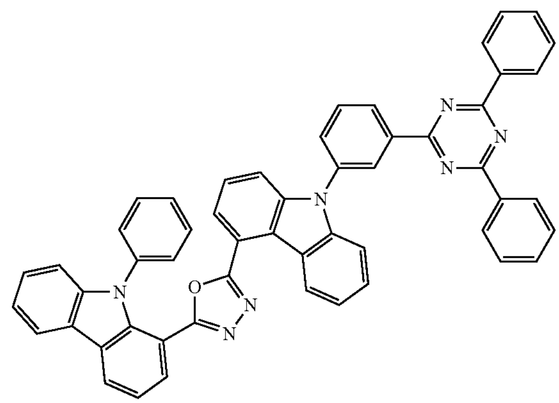
C 57
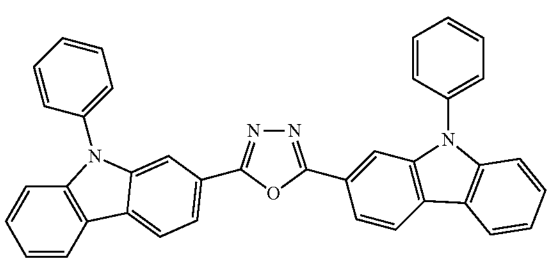
C 58
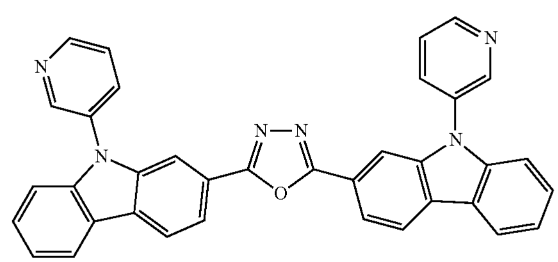
C 59
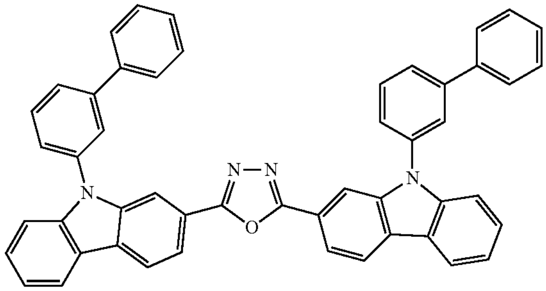
C 60
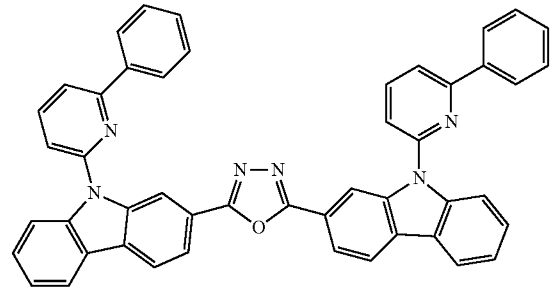

-continued
C 61
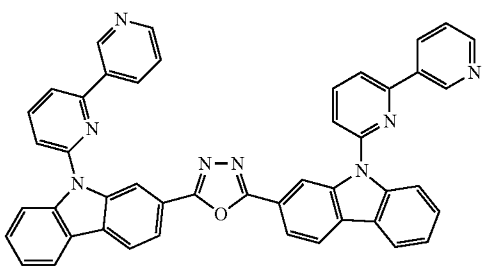
C 62
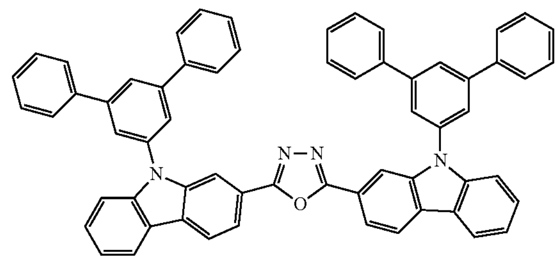
C 63
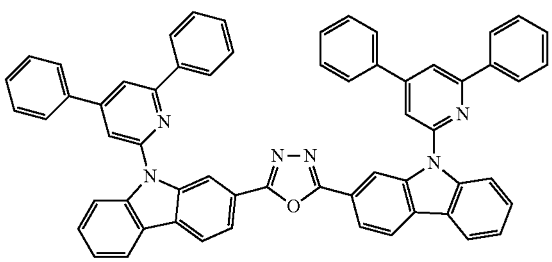
C 64
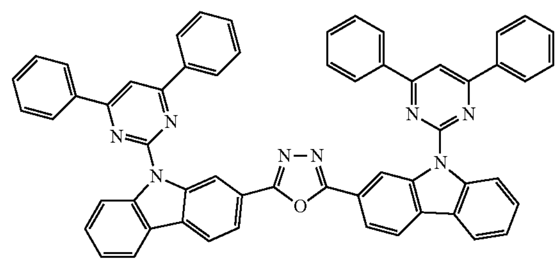
C 65
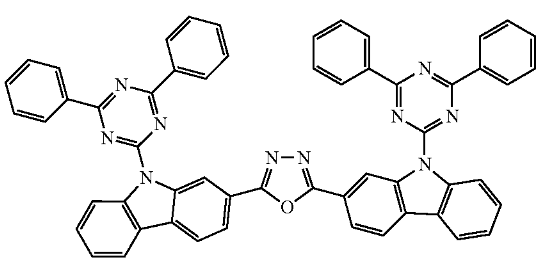
C 66
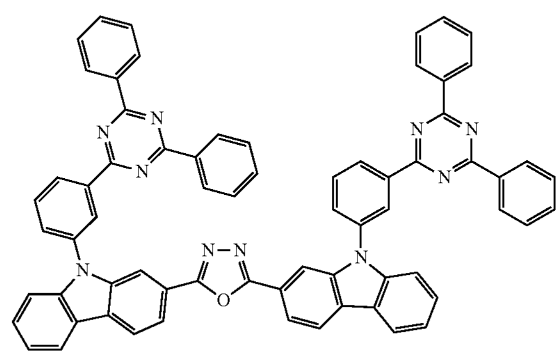
C 67
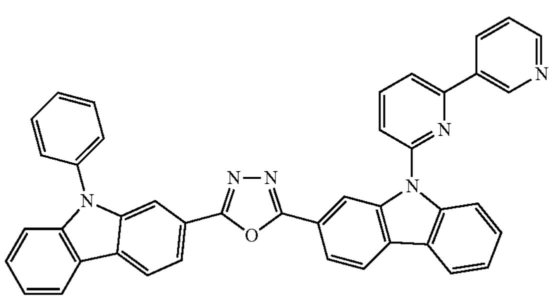
C 68
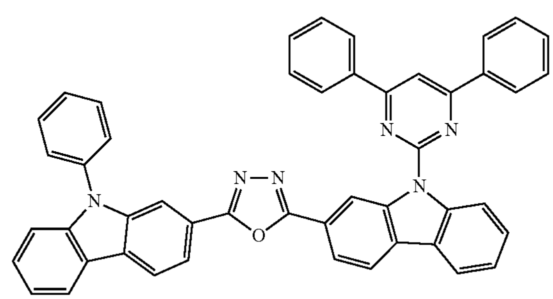
C 69
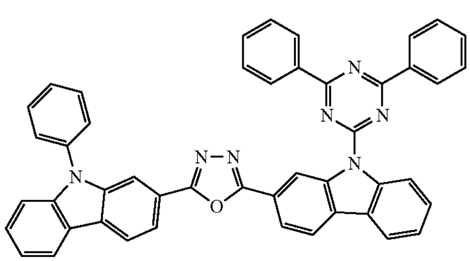
C 70
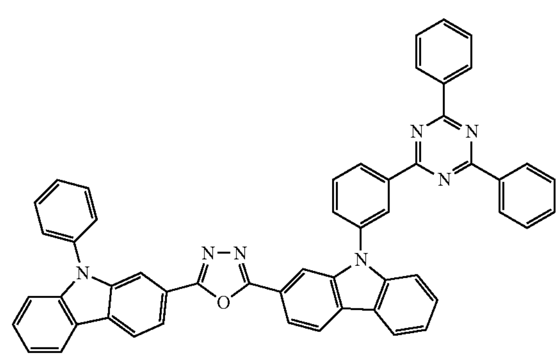

-continued
C 71
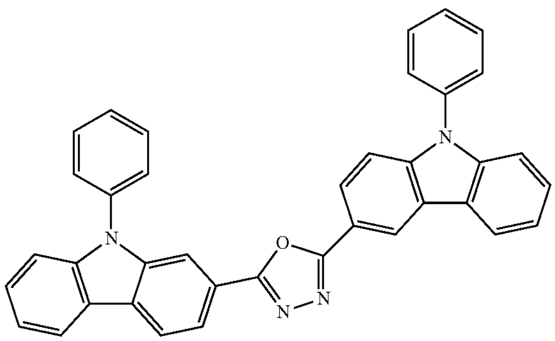
C 72
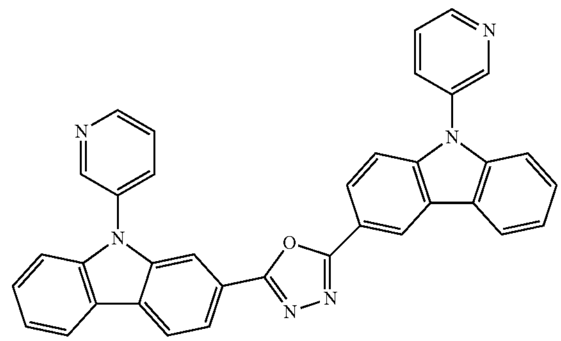
C 73
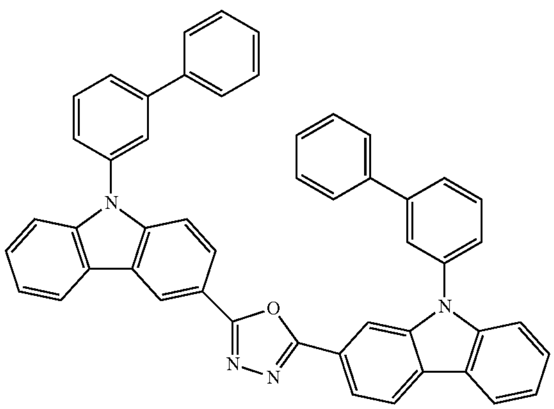
C 74
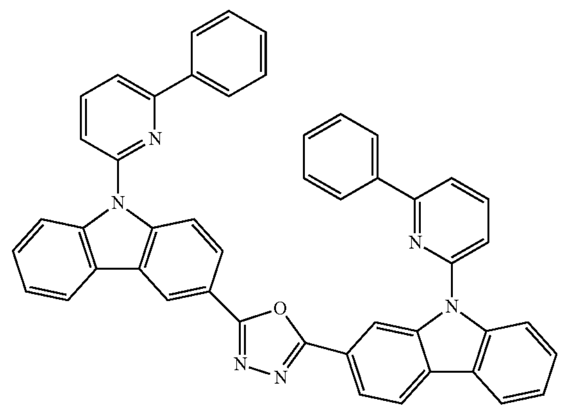
C 75
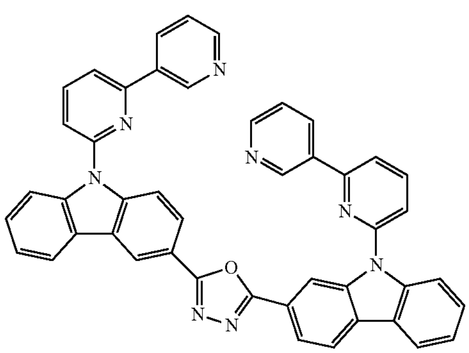
C 76
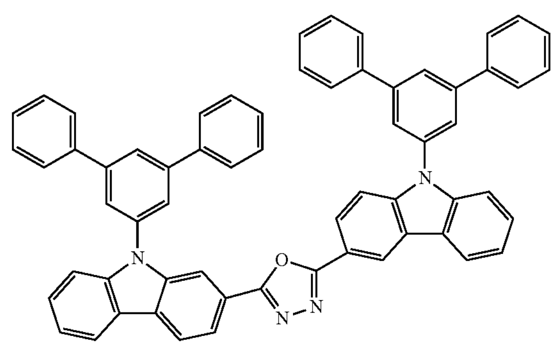
C 77
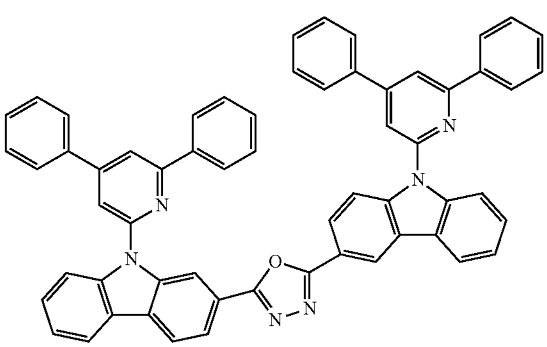
C 78
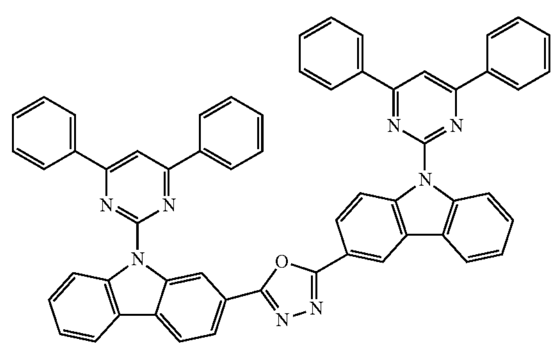

-continued
C 79
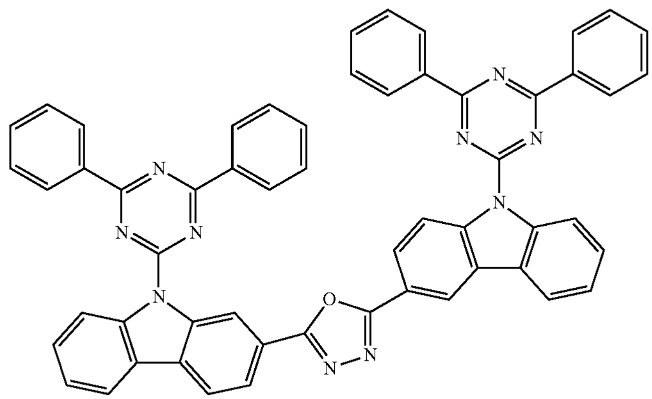
C 80
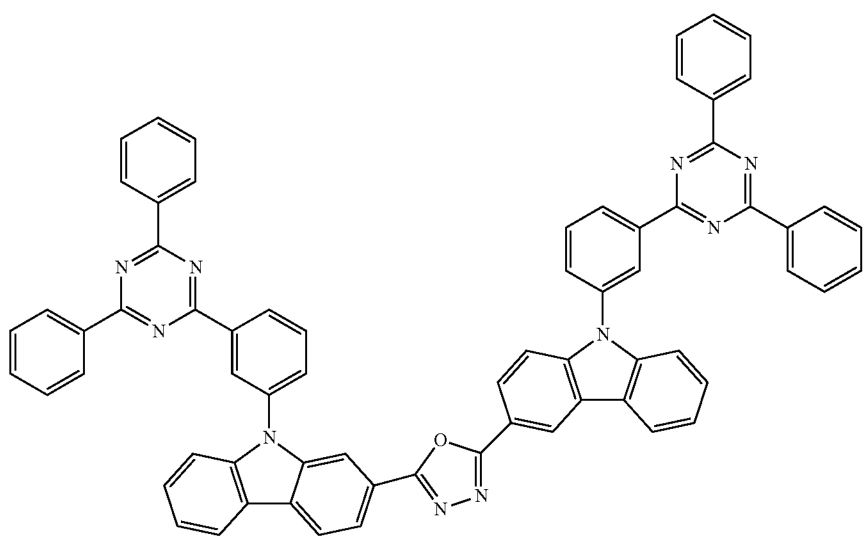
C 81
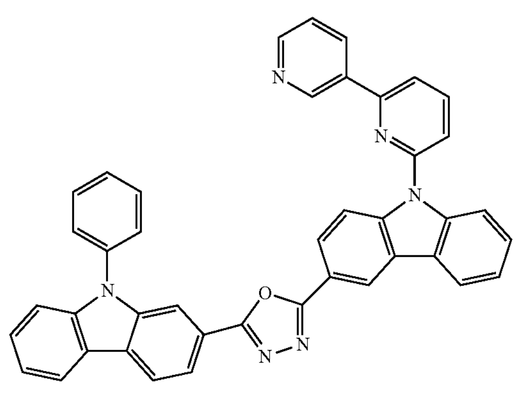
C 82
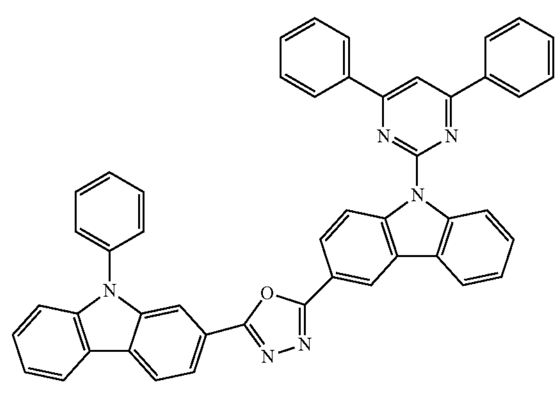

-continued
C 83
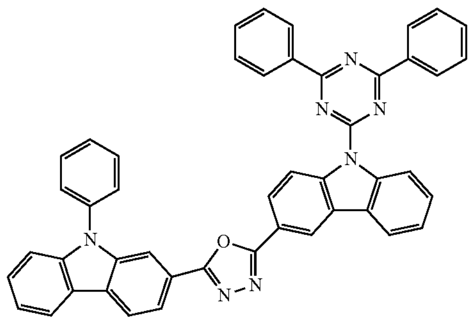
C 84
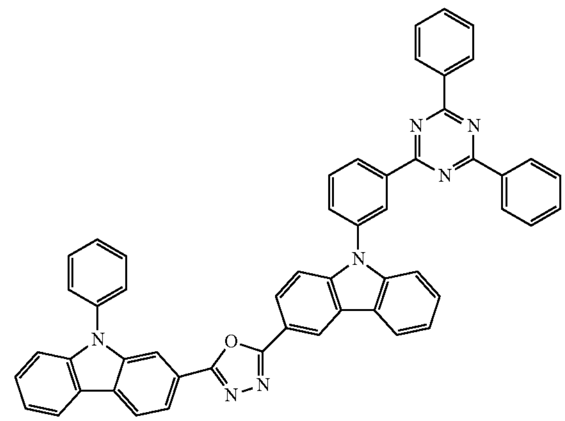
C 85
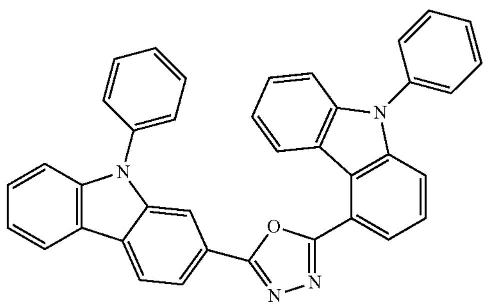
C 86
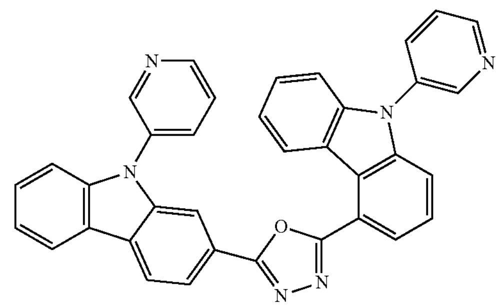
C 87
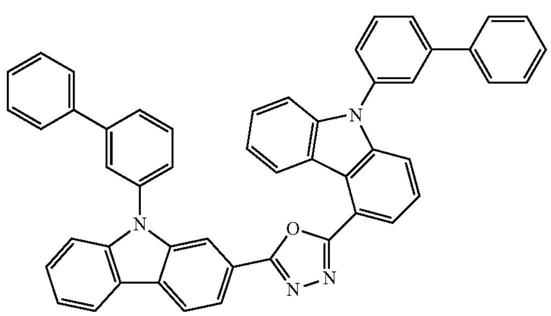
C 88
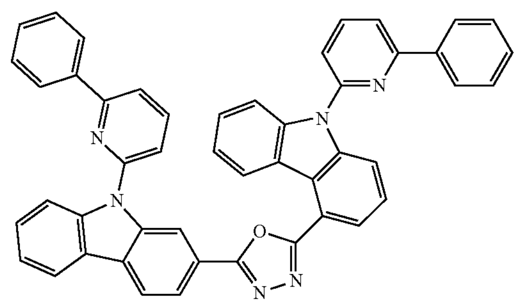
C 89
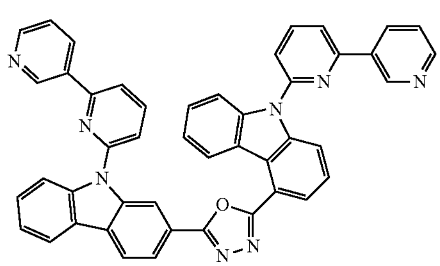
C 90
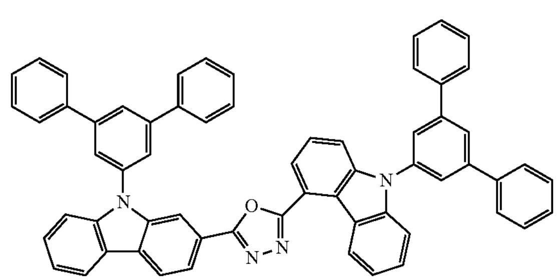

-continued
C 91
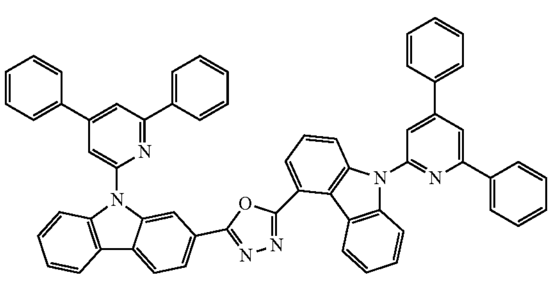
C 92
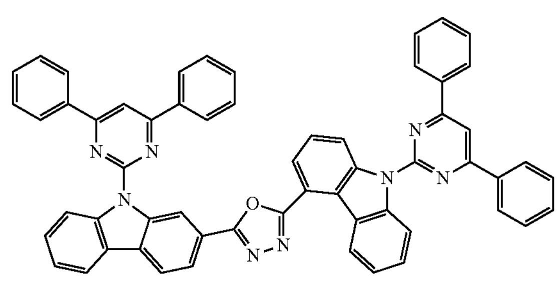
C 93
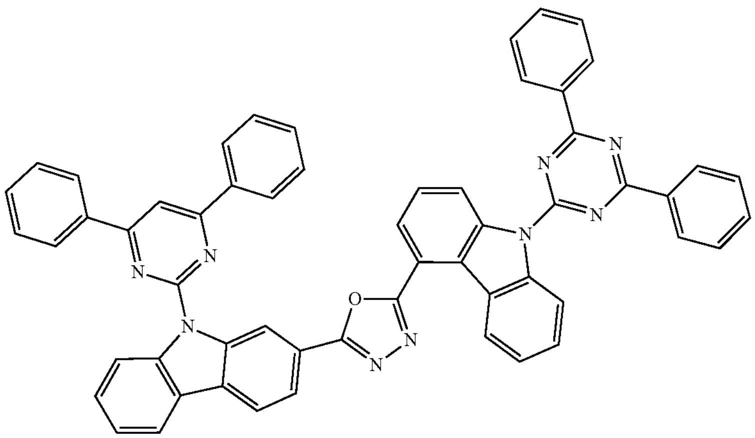
C 94
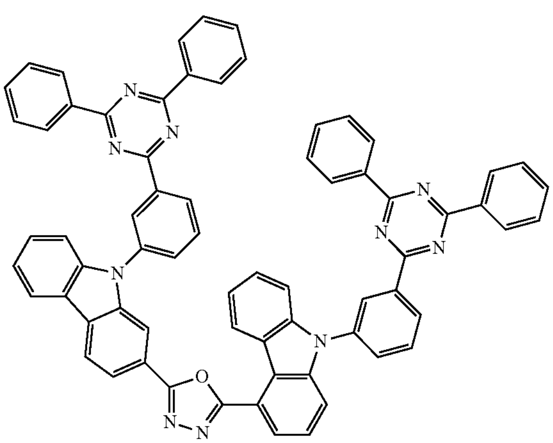
C 95
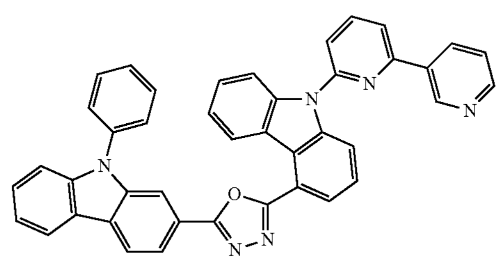
C 96
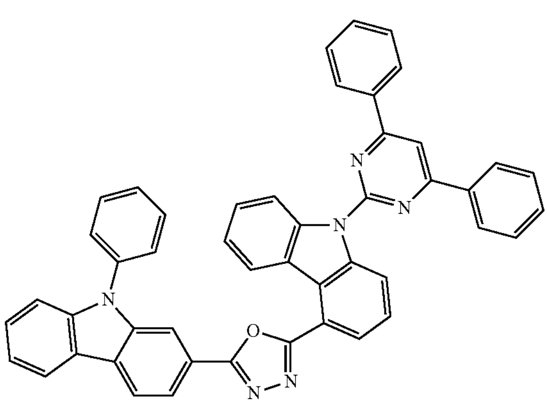
C 97
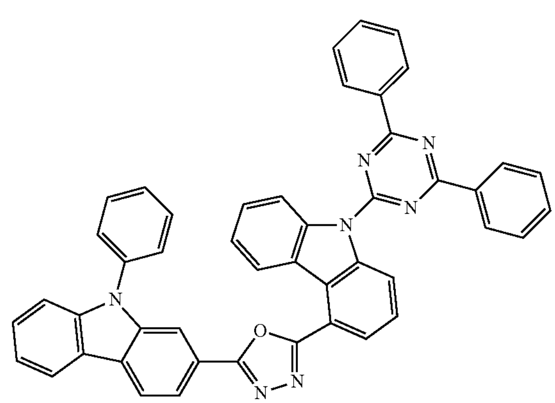

-continued
C 98
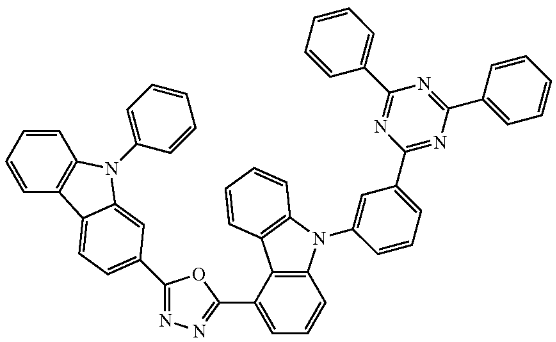
C 99
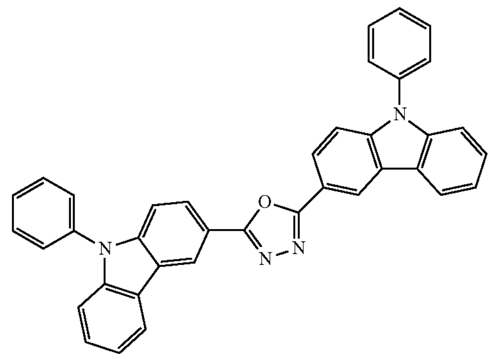
C 100
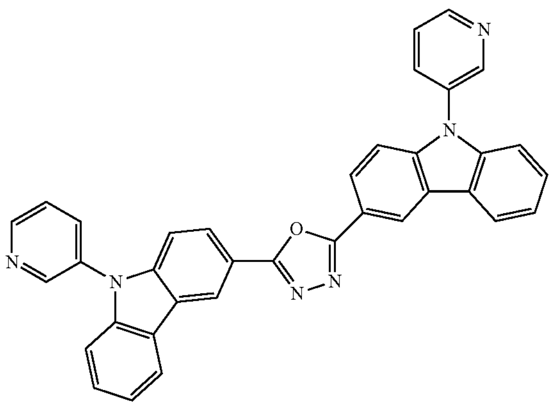
C 101
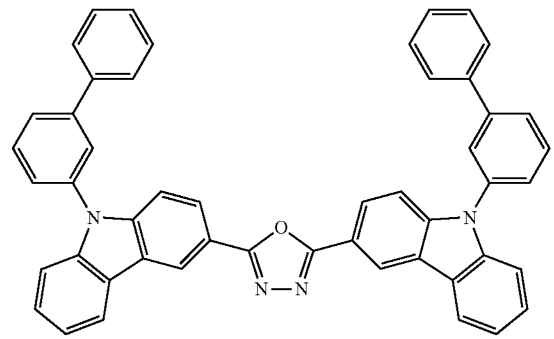
C 102
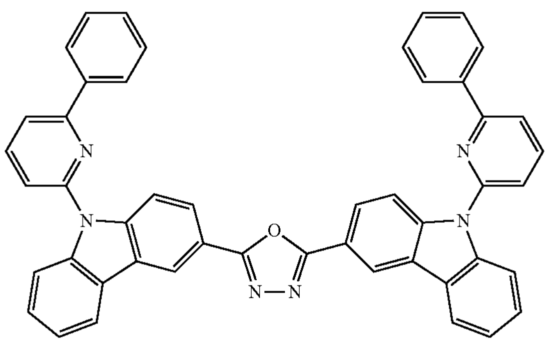
C 103
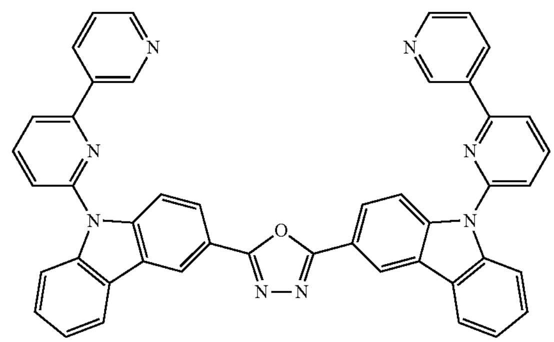
C 104
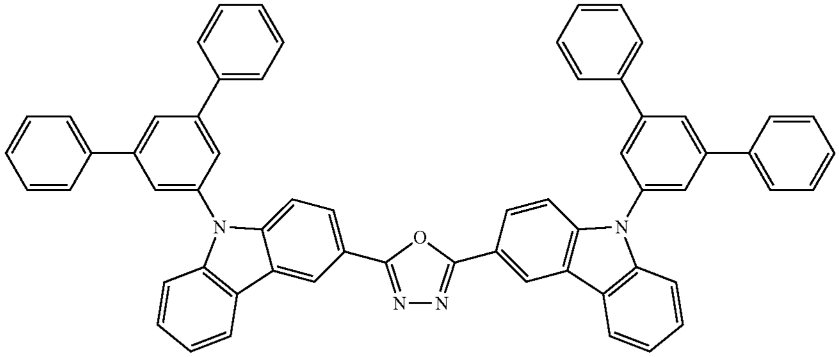

-continued
C 105
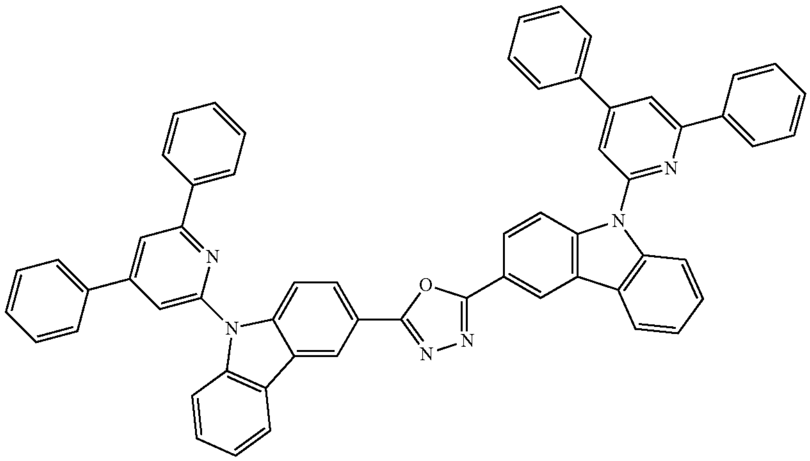
C 106
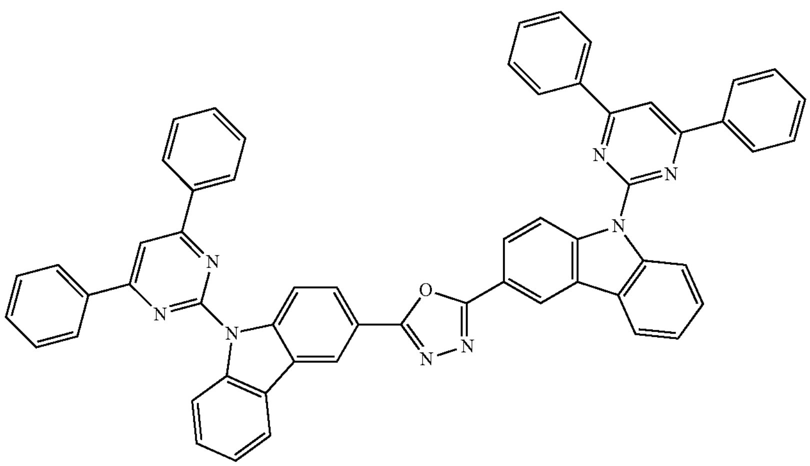
C 107
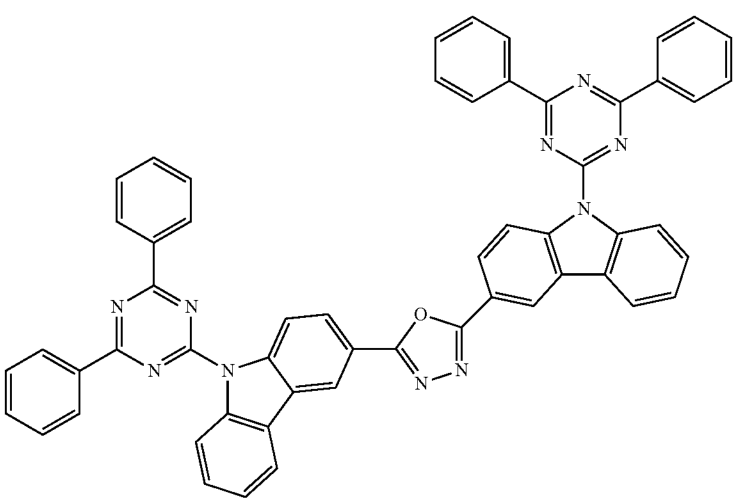

-continued
C 108
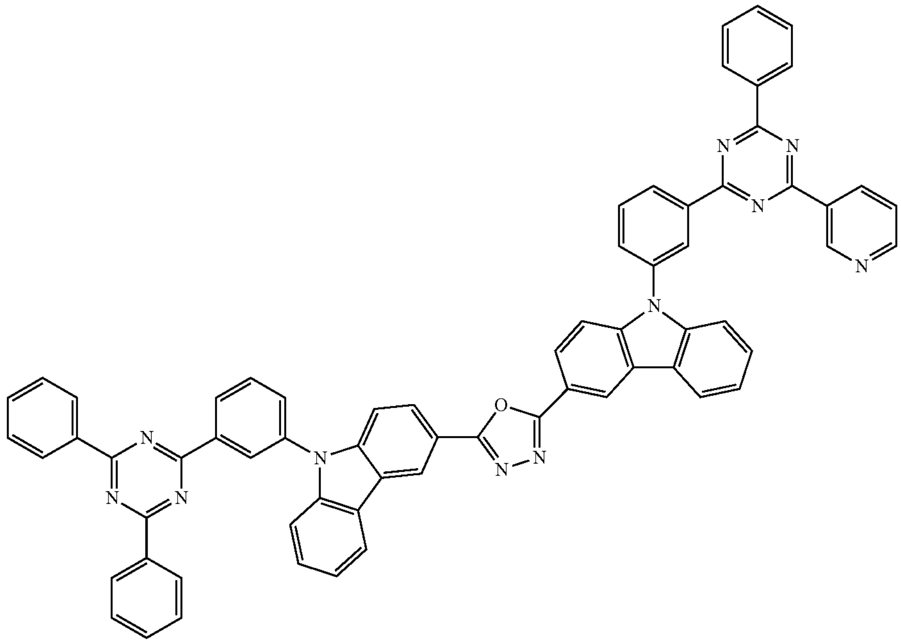
C 109
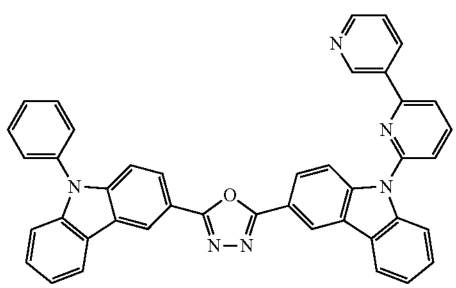
C 110
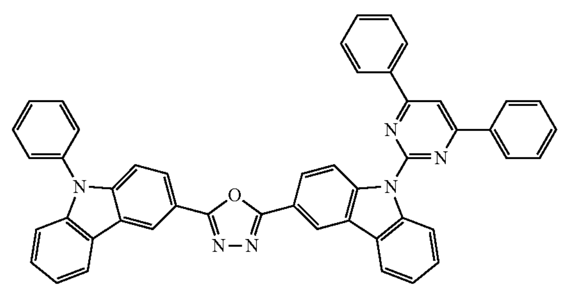
C 111
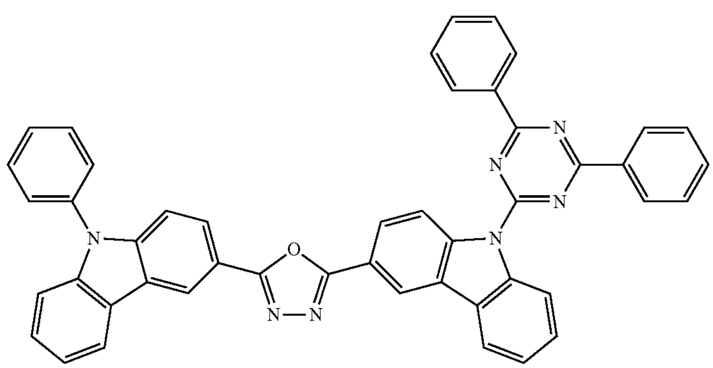

-continued
C 112
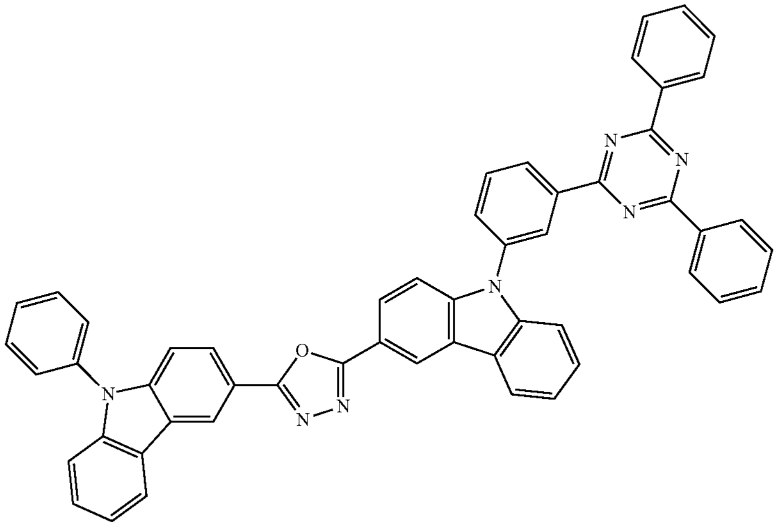
C 113
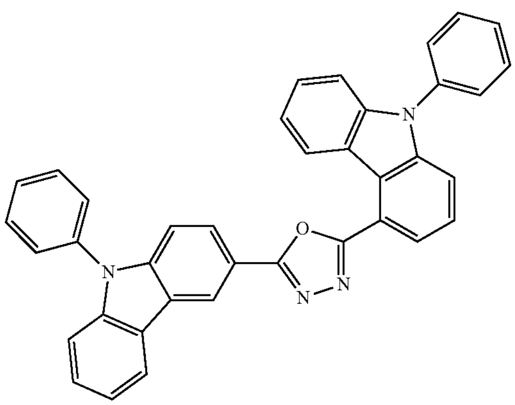
C 114
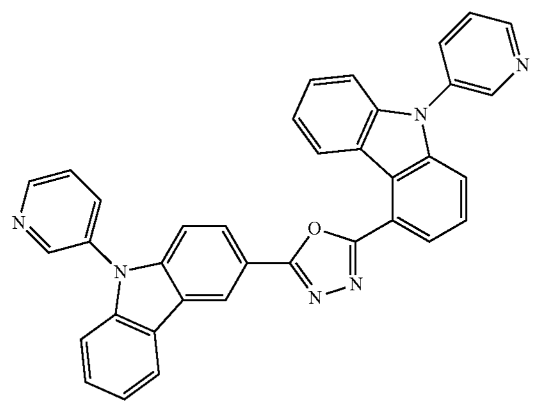
C 115
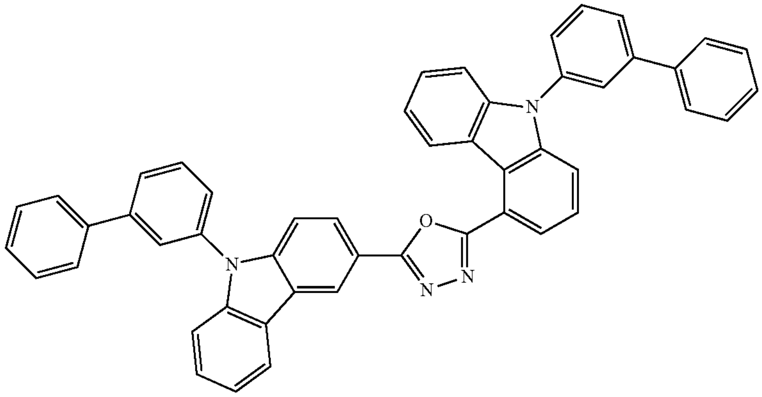

-continued
C 116
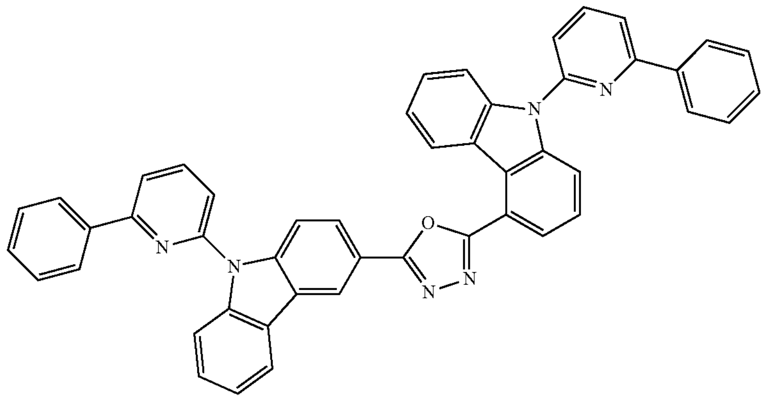
C 117
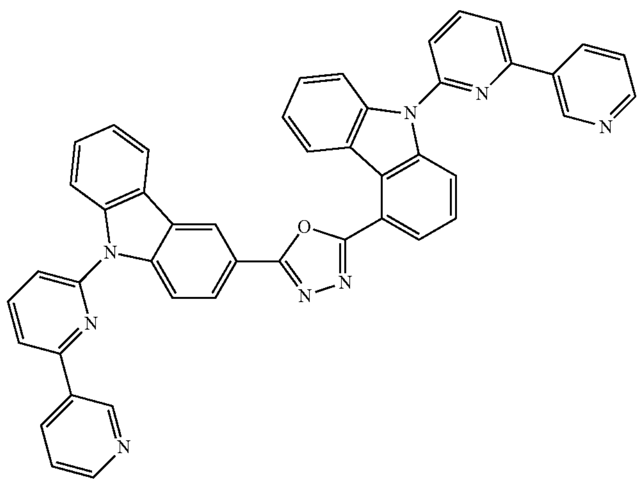
C 118
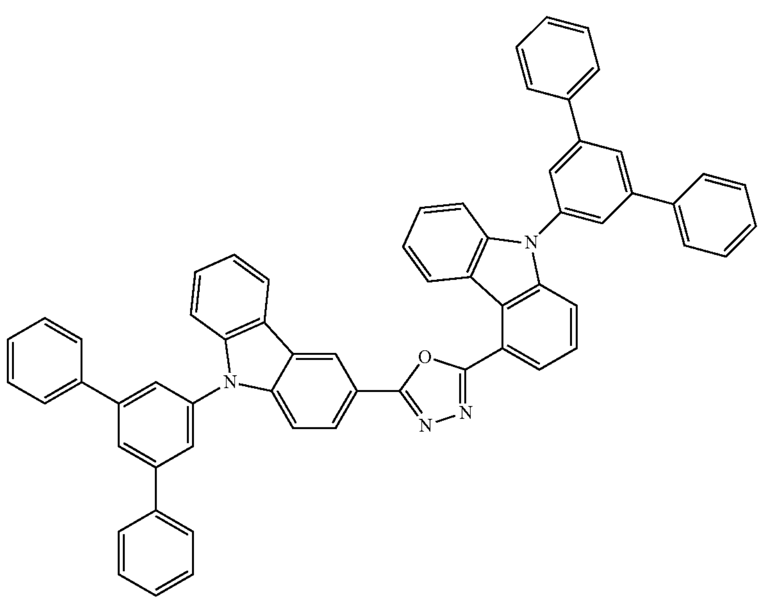

-continued
C 119
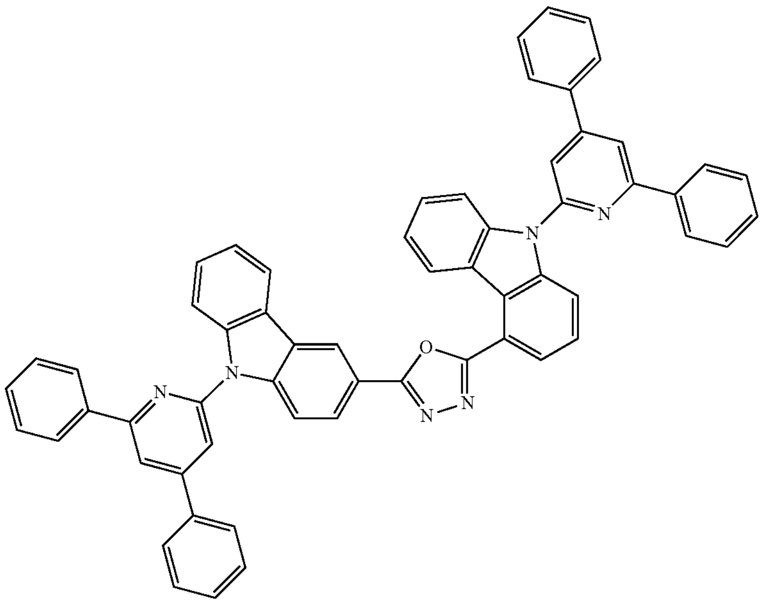
C 120
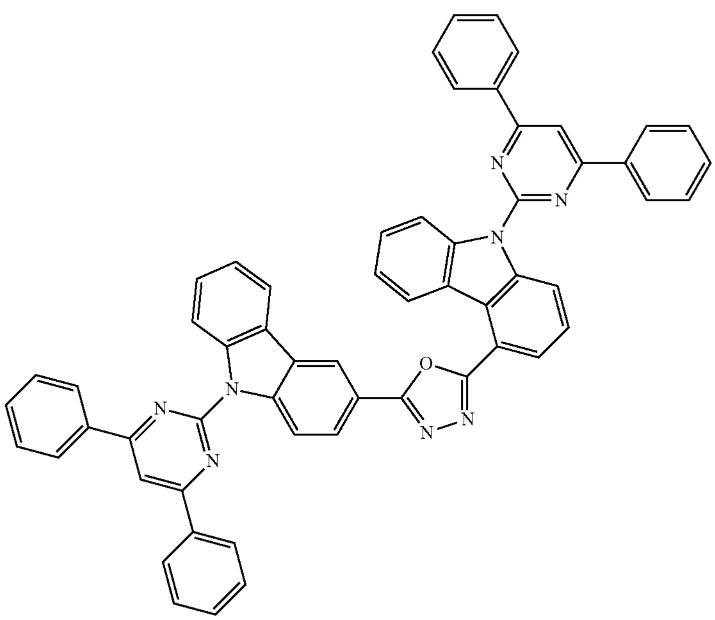

-continued
C 121
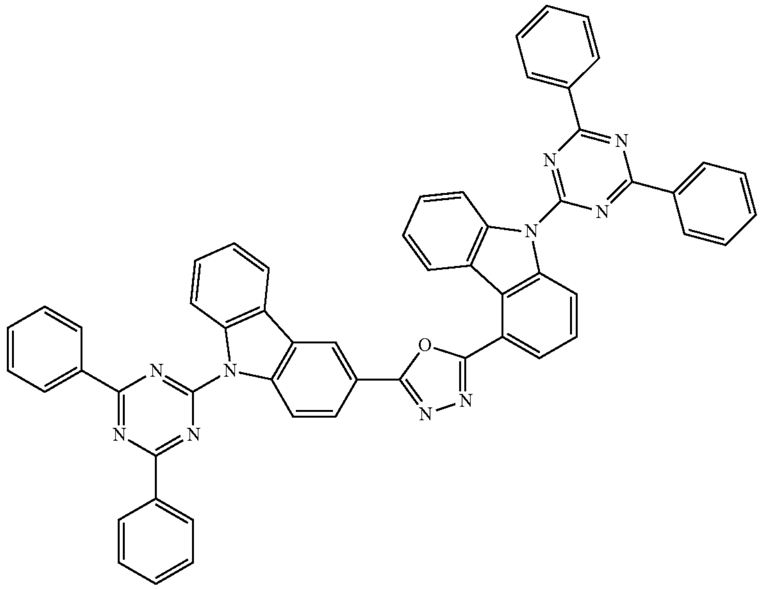
C 122
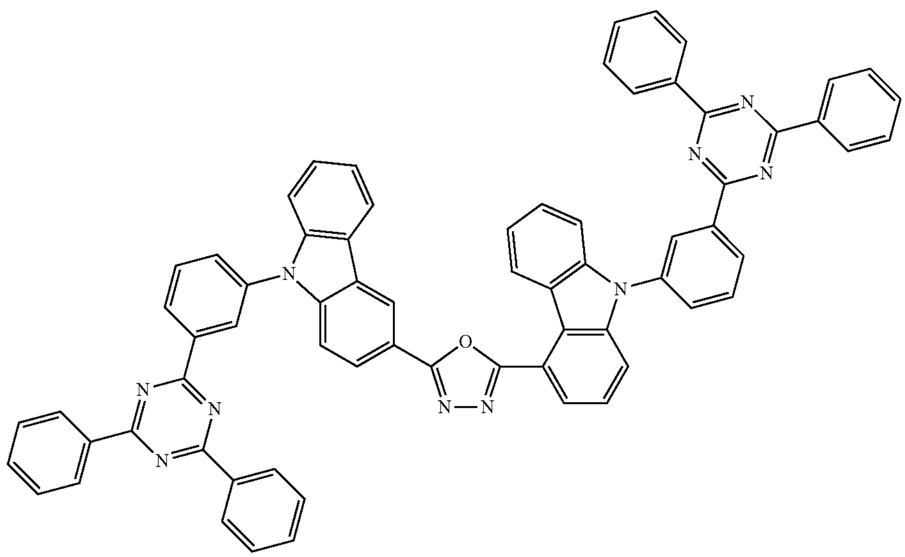
C 123
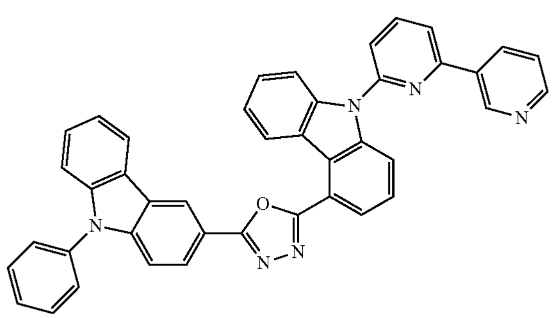
C 124
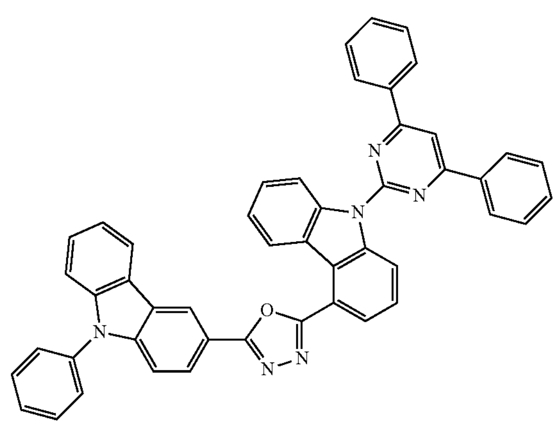

-continued
C 125
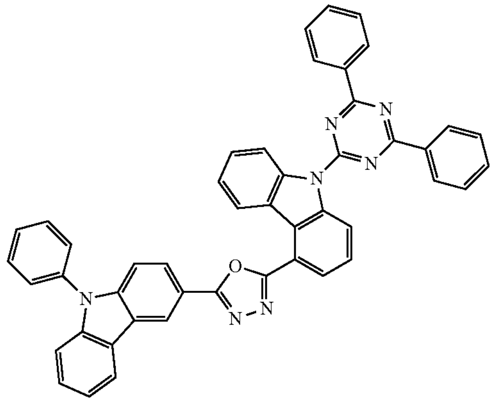
C 126
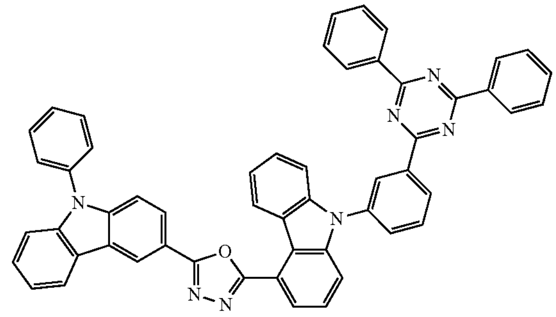
C 127
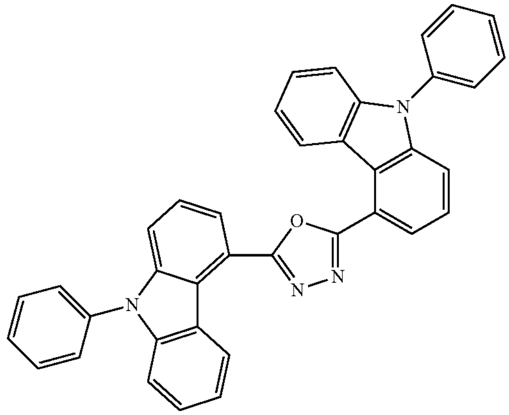
C 128
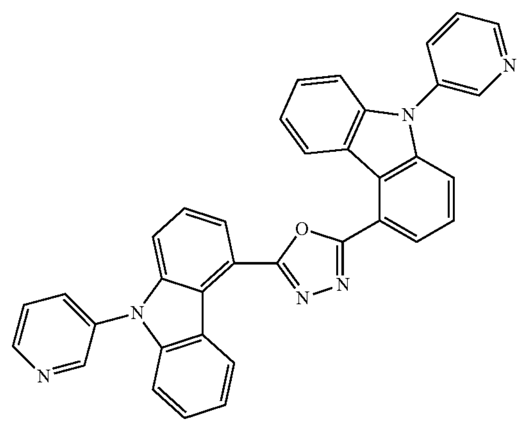
C 129
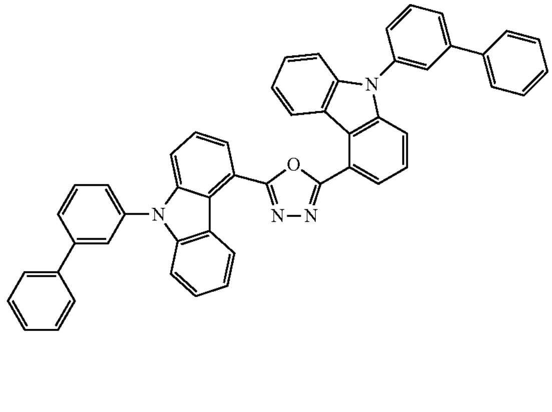
C 130
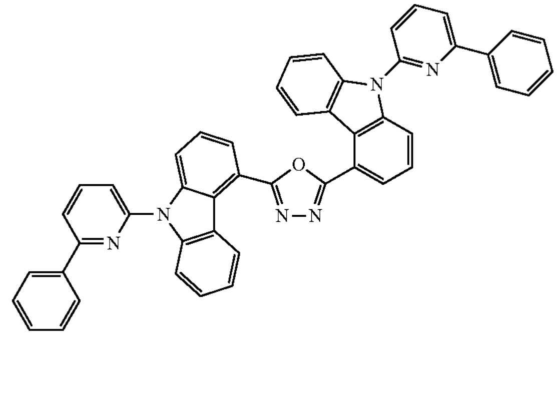

-continued
C 131
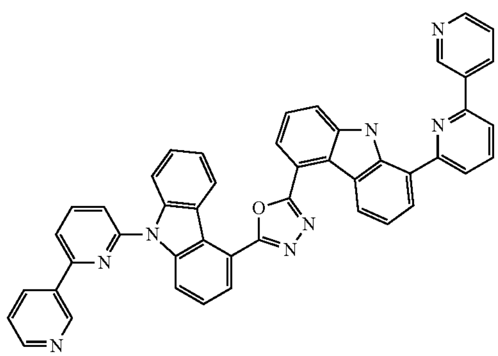
C 132
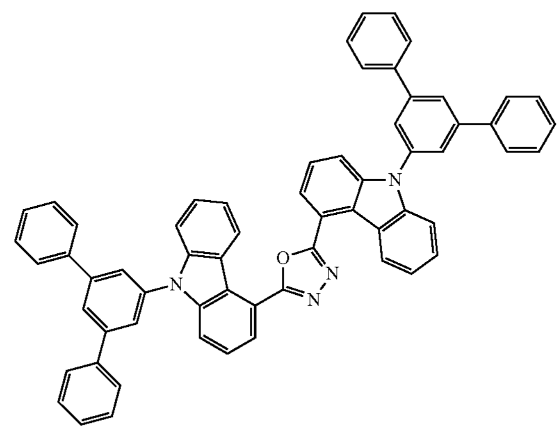
C 133
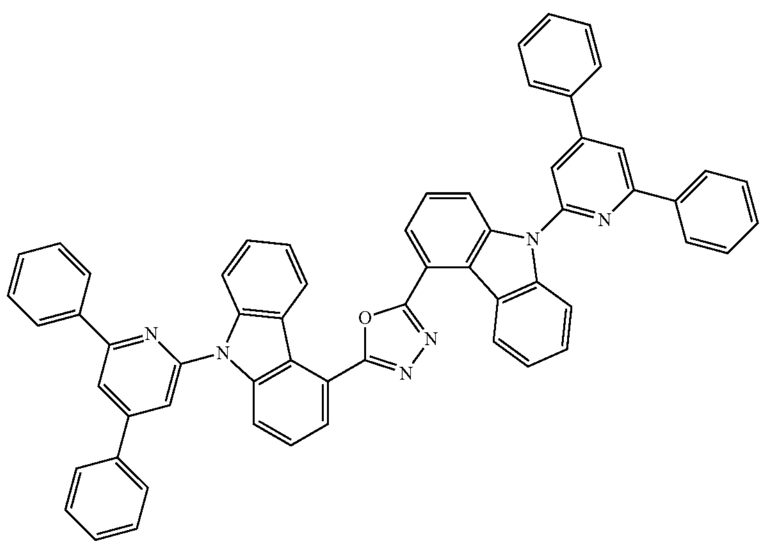
C 134
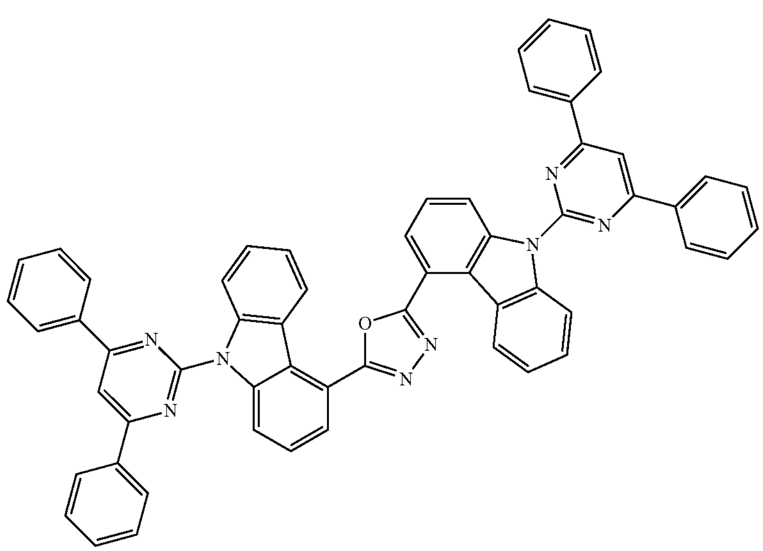

-continued
C 135
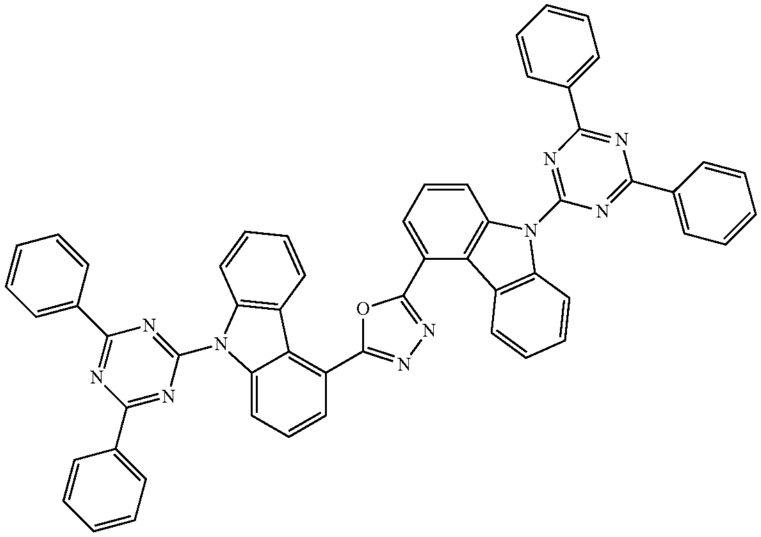
C 136
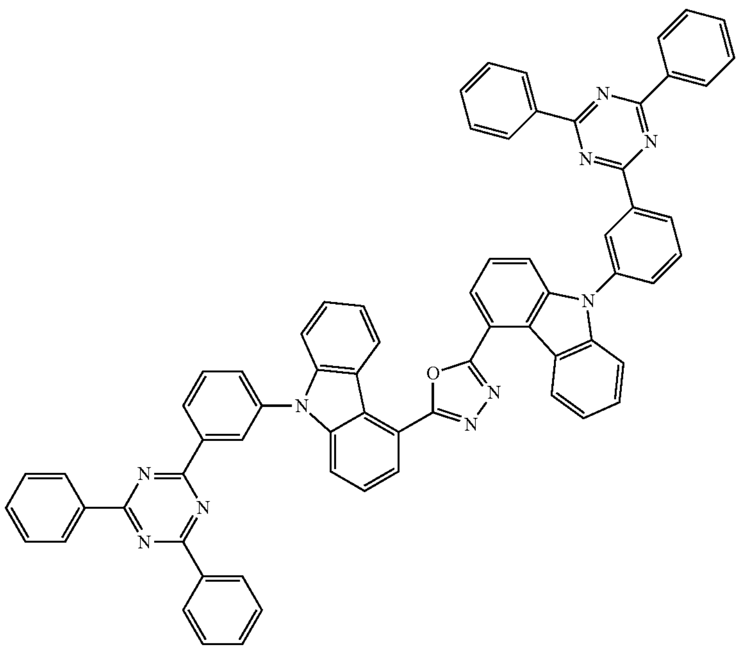
C 137
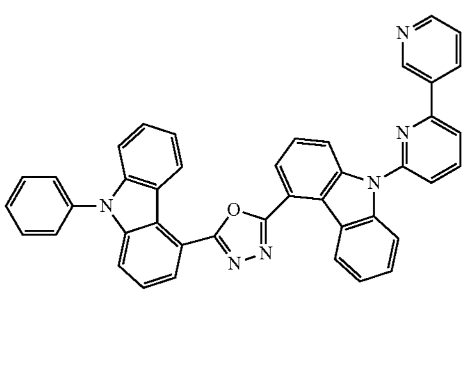
C 138
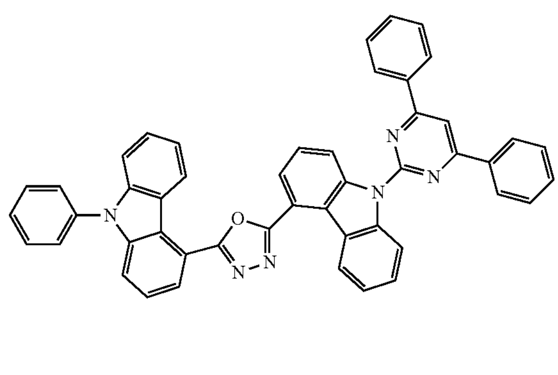

-continued
C 139
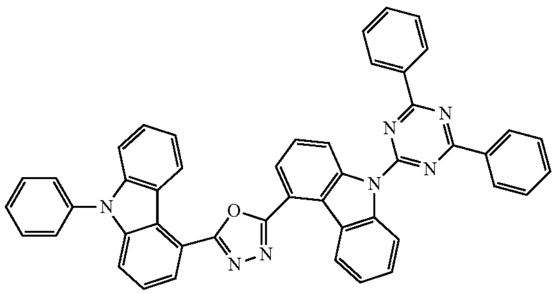
C 140
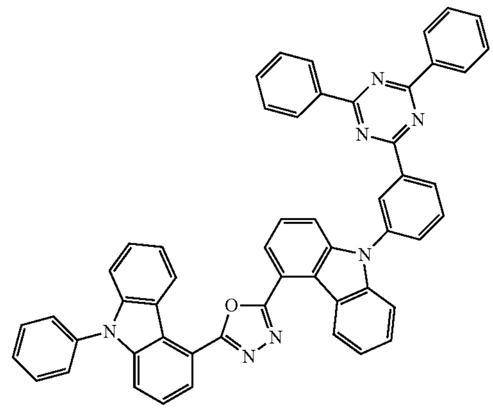
C 141
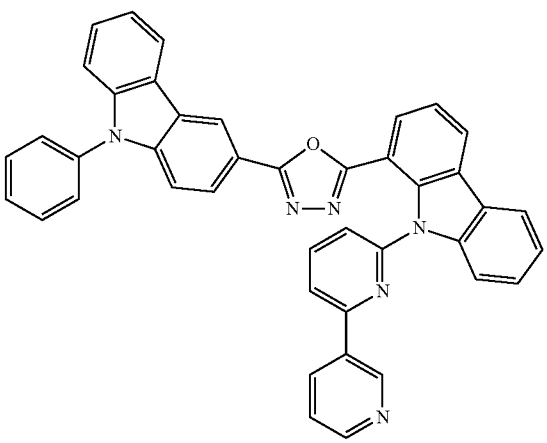
C 142
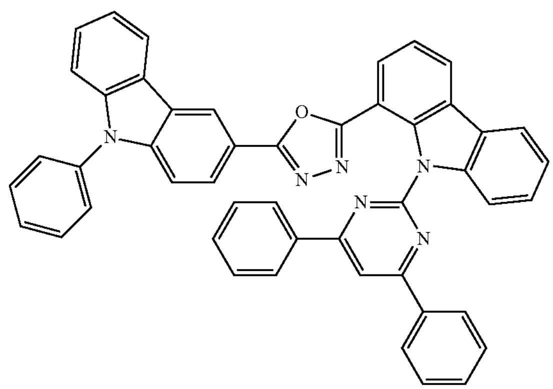
C 143
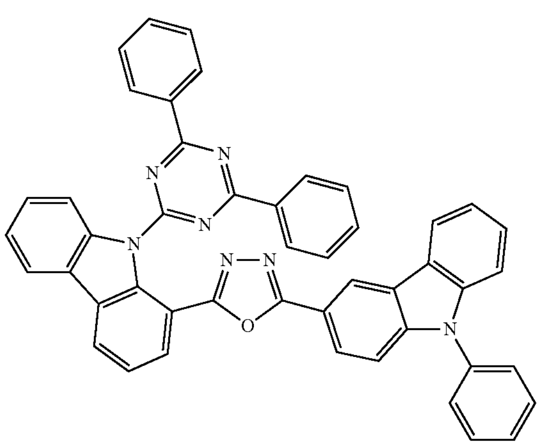
C 144
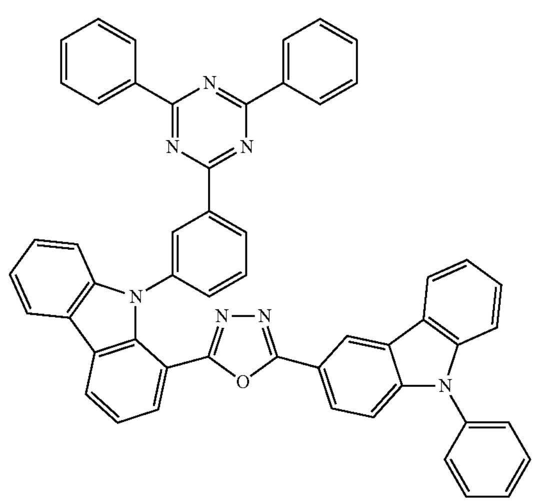

-continued
C 145
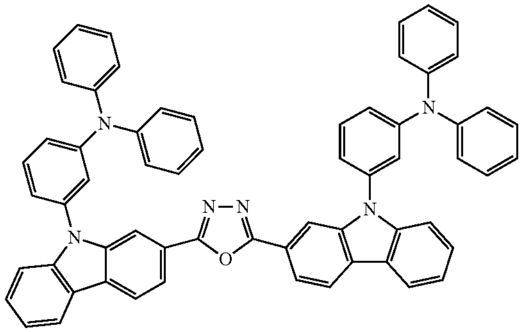
C 146
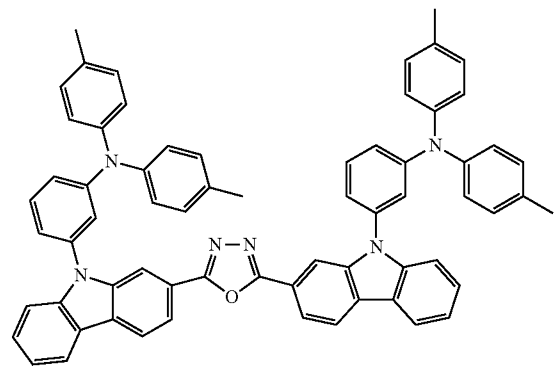
C 147
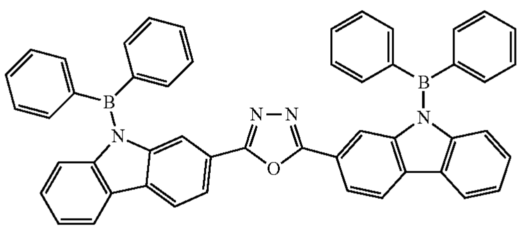
C 148
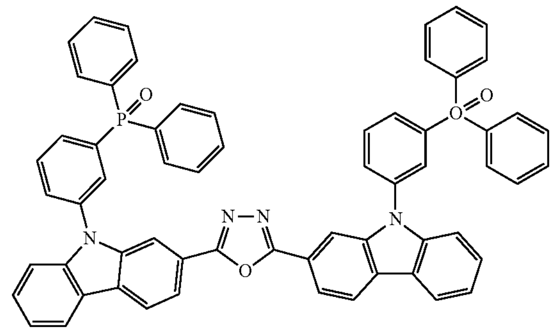
C 149
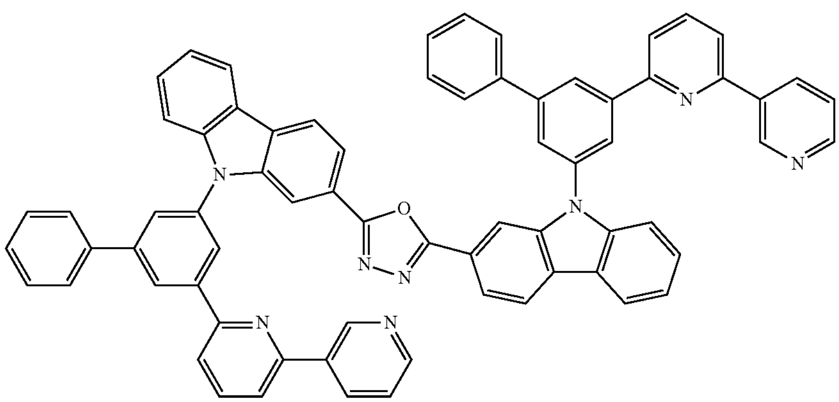
C 150
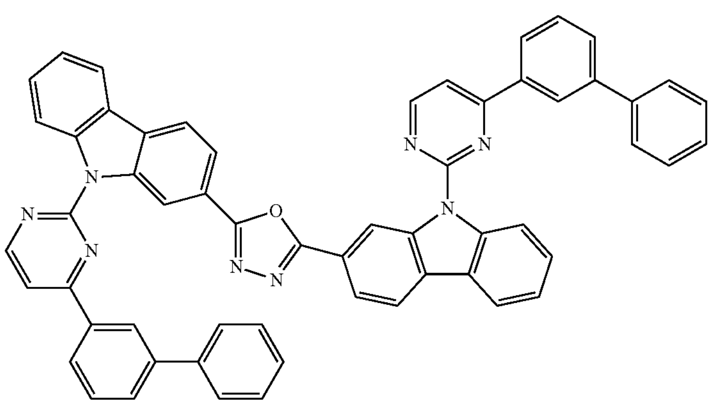

-continued
C 151
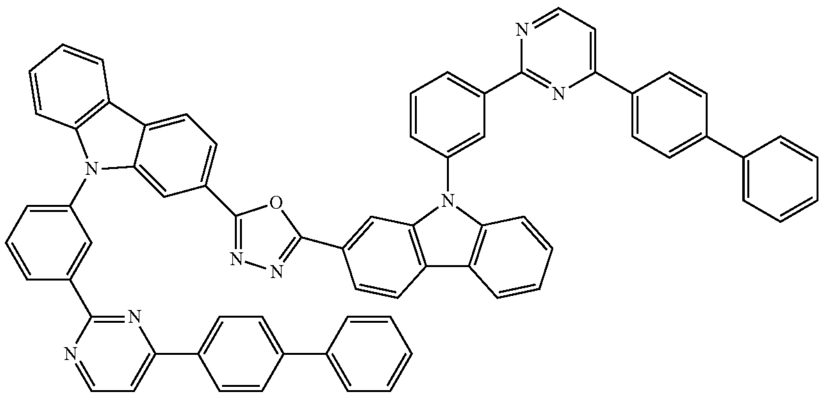
C 152
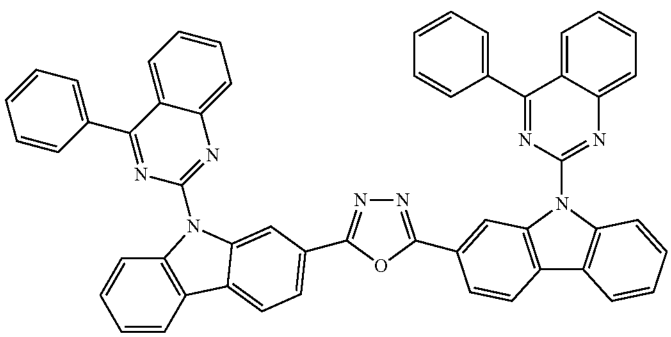
C 153
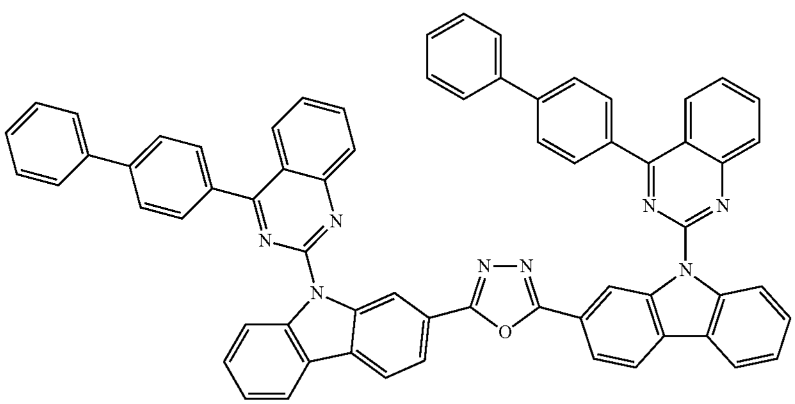
C 154
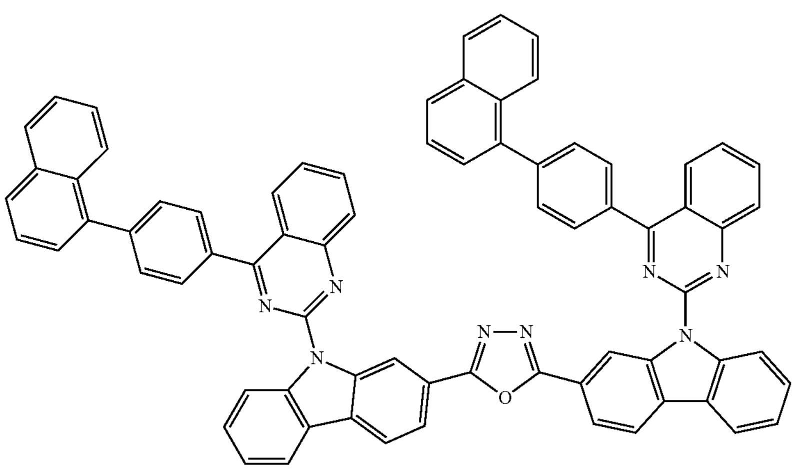

-continued
C 155
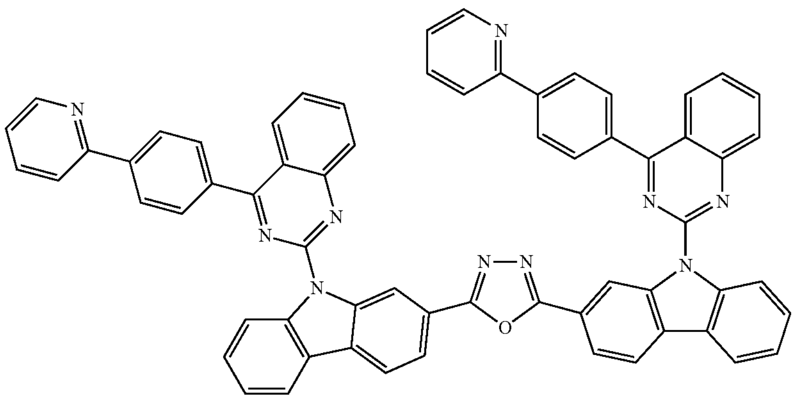
C 156
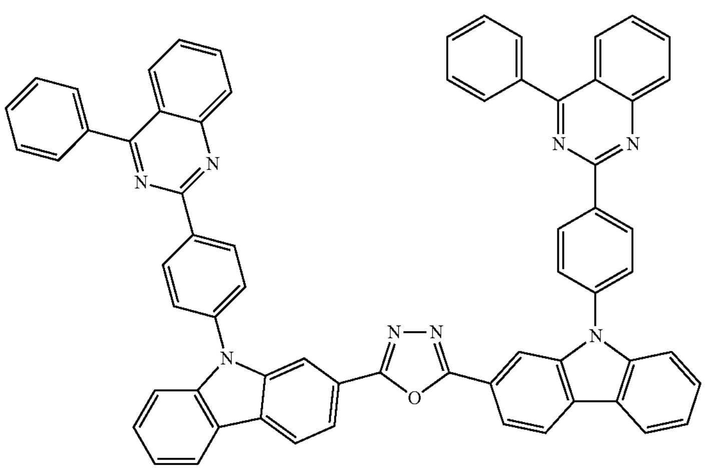
C 157
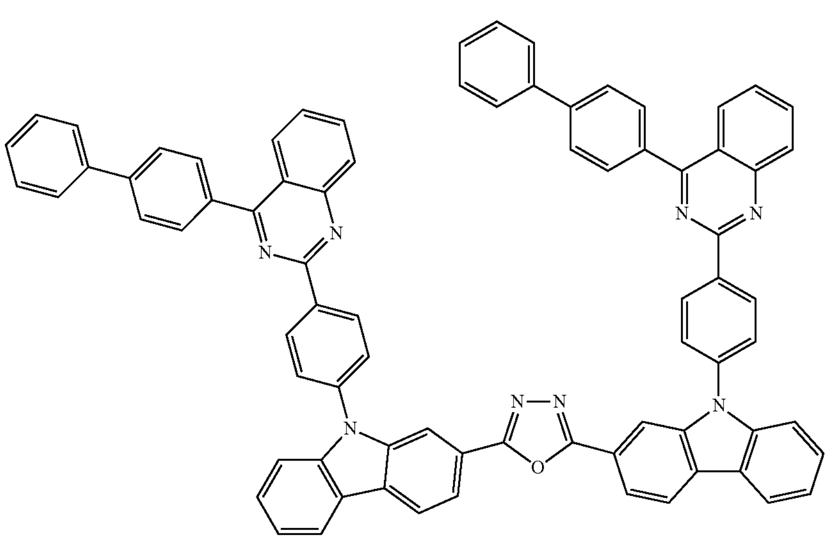

-continued
C 158
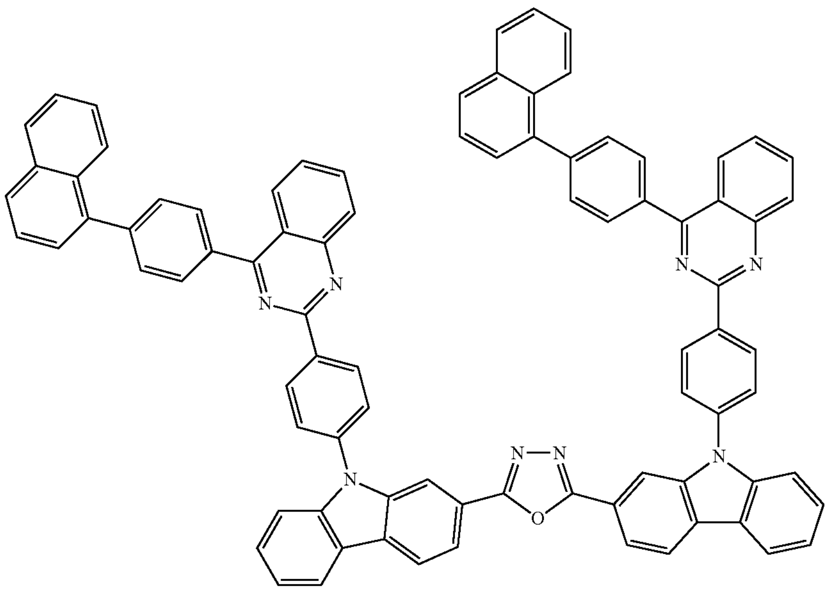
C 159
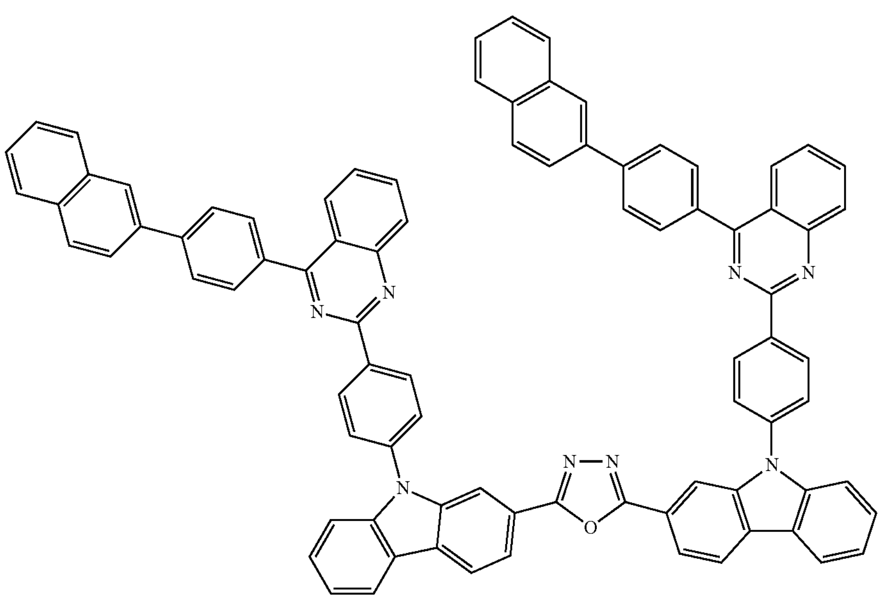

-continued
C 160
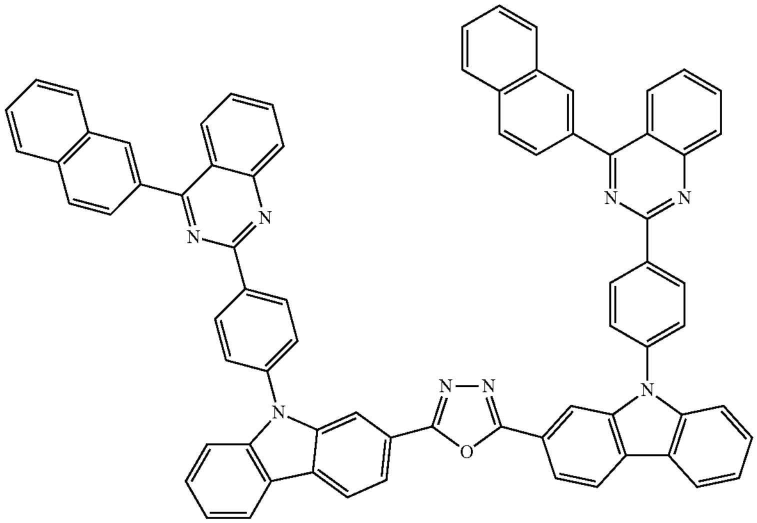
C 161
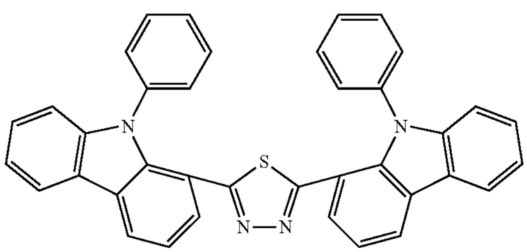
C 162
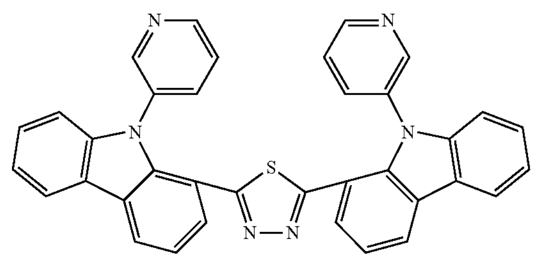
C 163
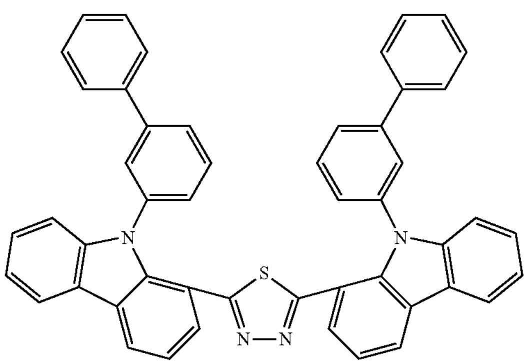
C 164
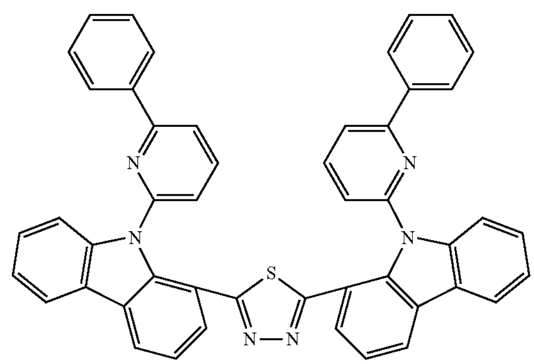
C 165
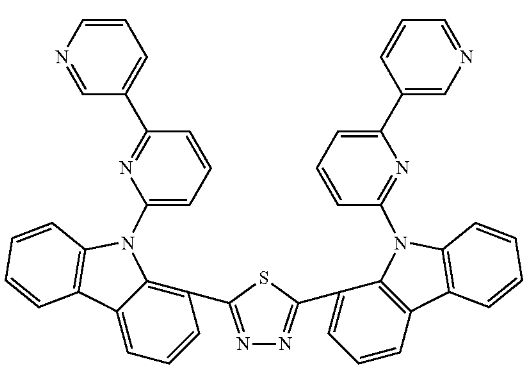
C 166
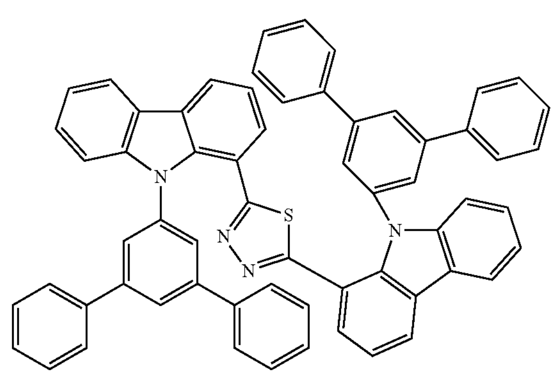

-continued
C 167
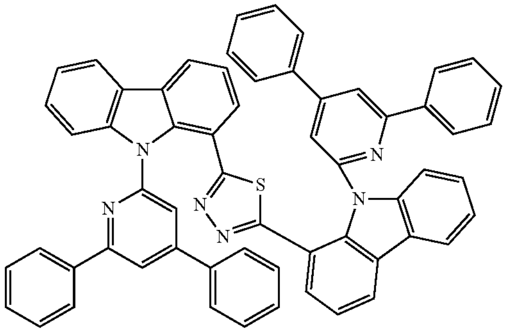
C 168
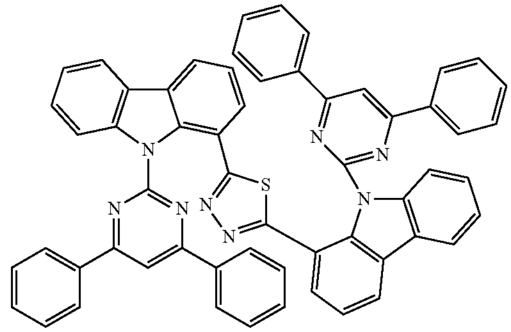
C 169
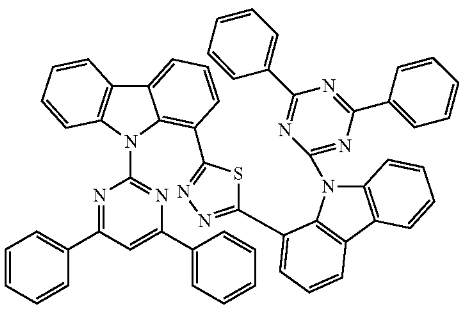
C 170
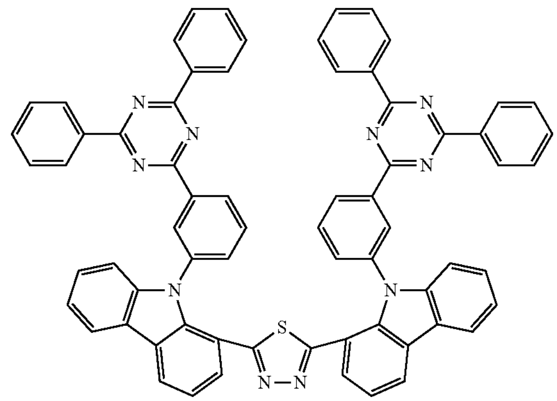
C 171
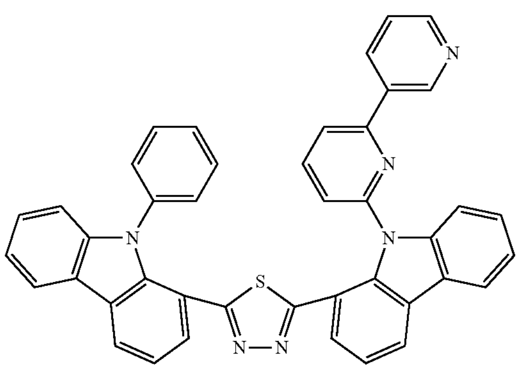
C 172
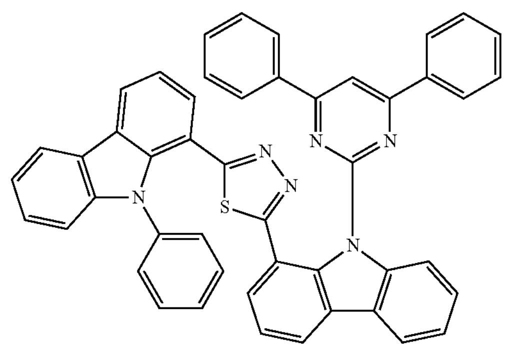
C 173
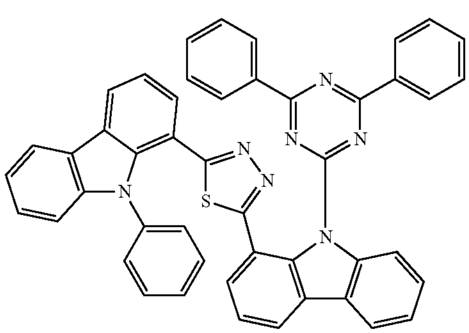
C 174
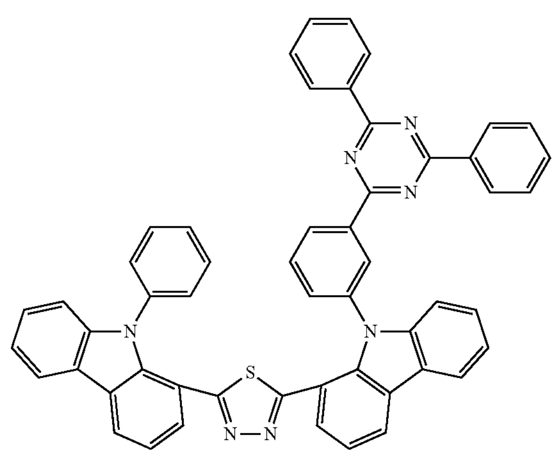

-continued
C 175
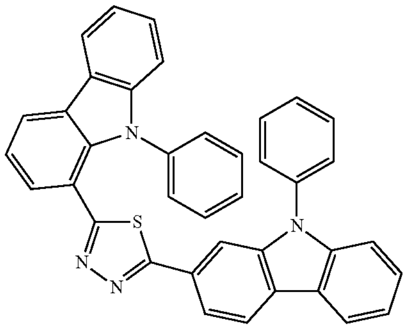
C 176
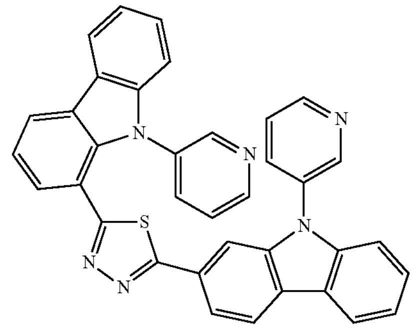
C 177
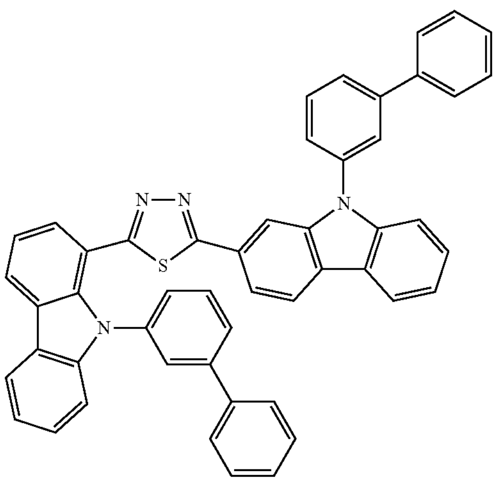
C 178
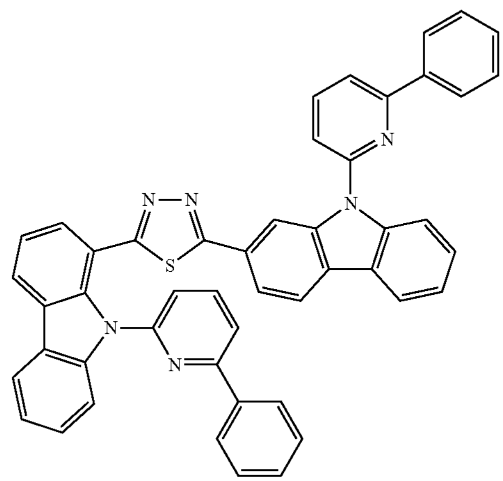
C 179
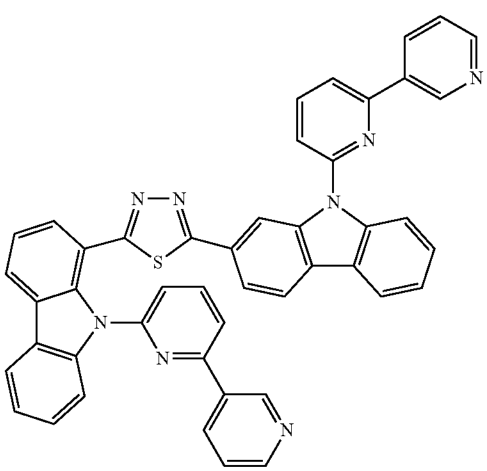
C 180
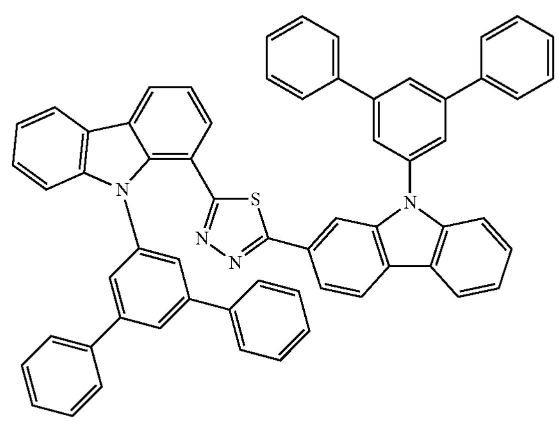

-continued
C 181
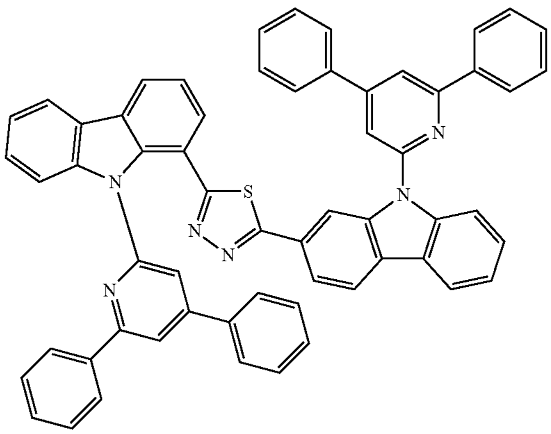
C 182
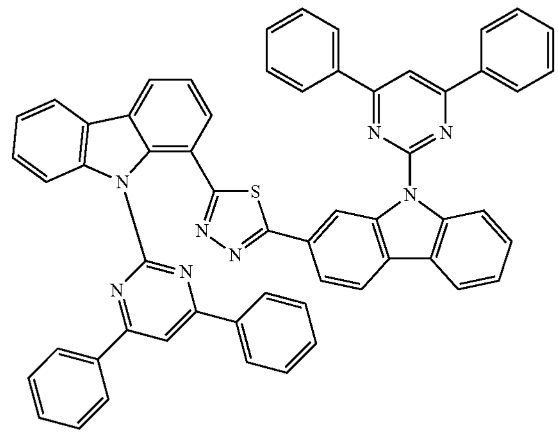
C 183
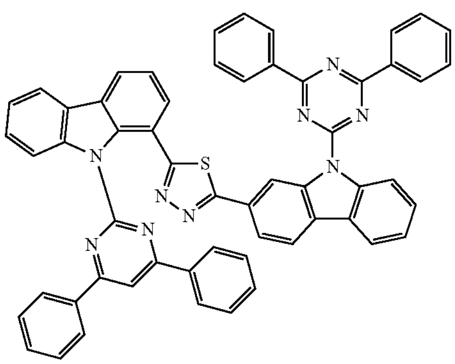
C 184
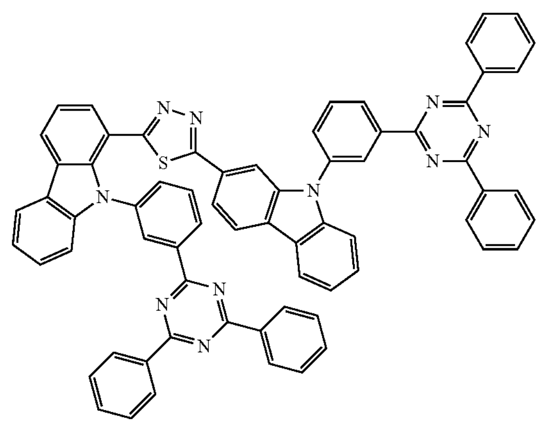
C 185
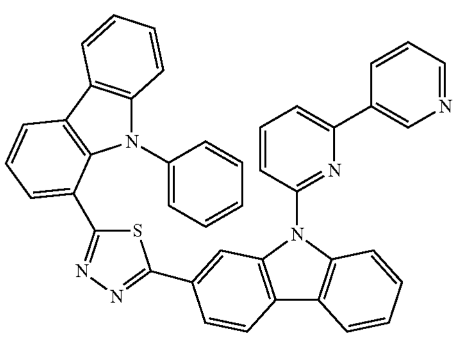
C 186
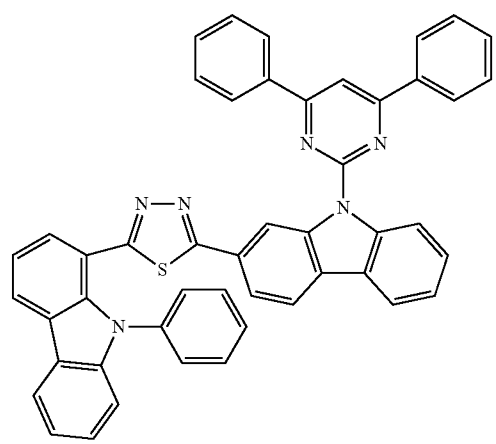

-continued
C 187
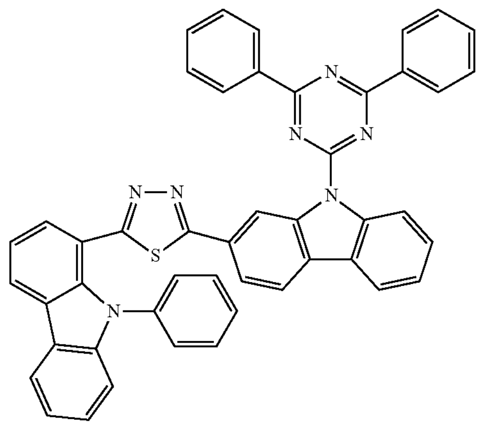
C 188
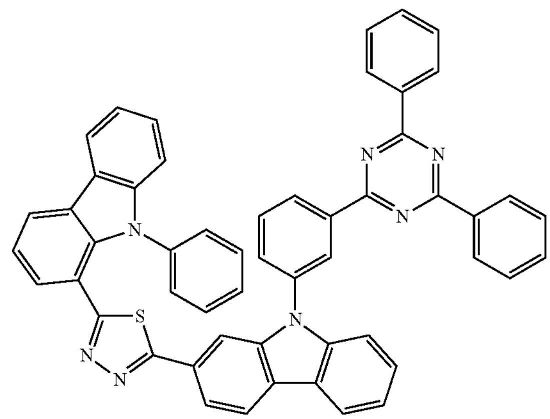
C 189
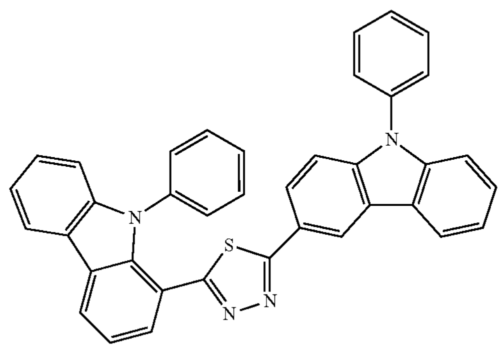
C 190
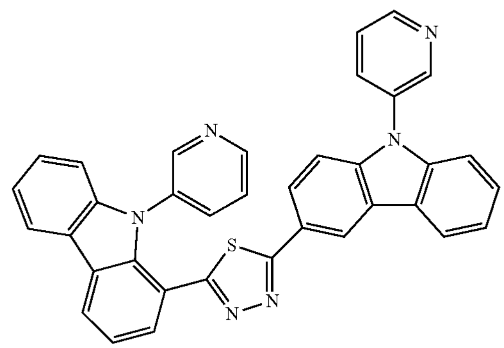
C 191
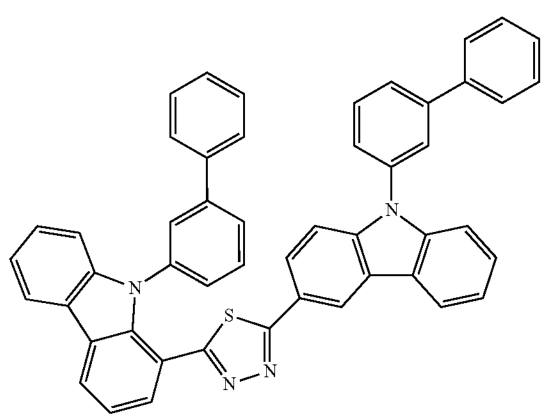
C 192
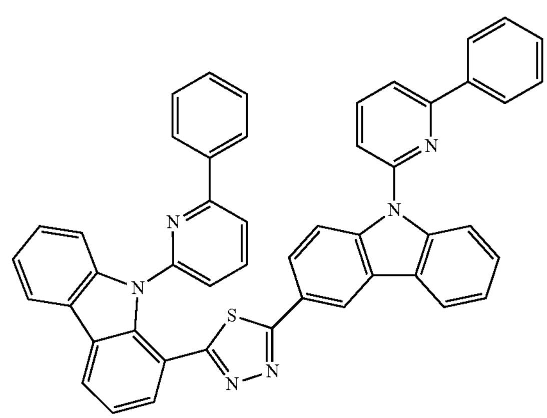
C 193
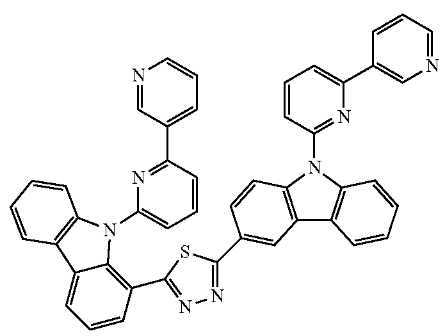
C 194
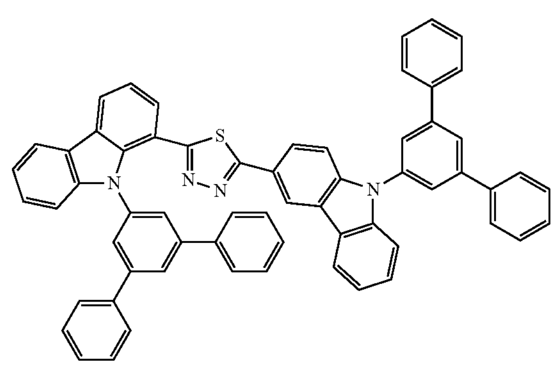

-continued
C 195
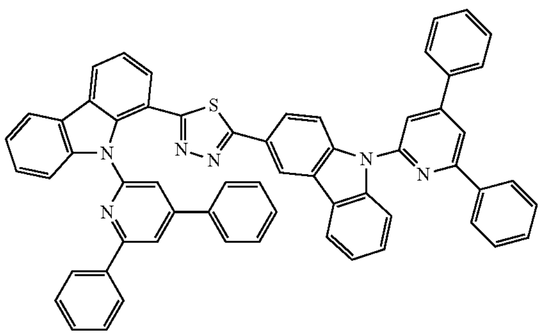
C 196
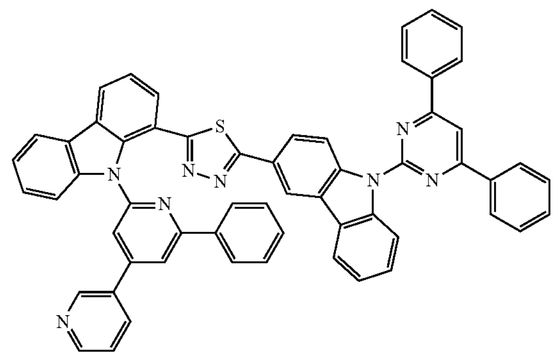
C 197
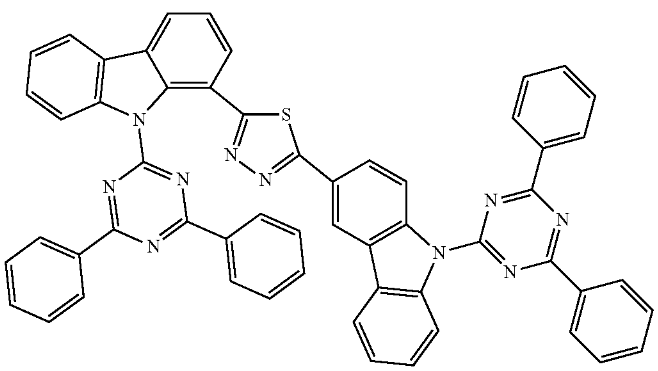
C 198
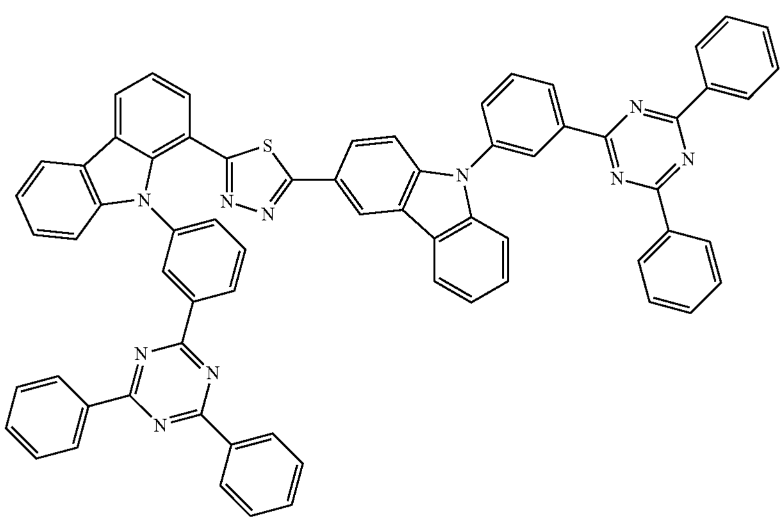

-continued
C 199
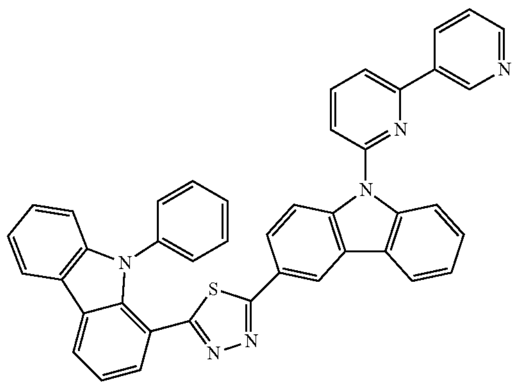
C 200
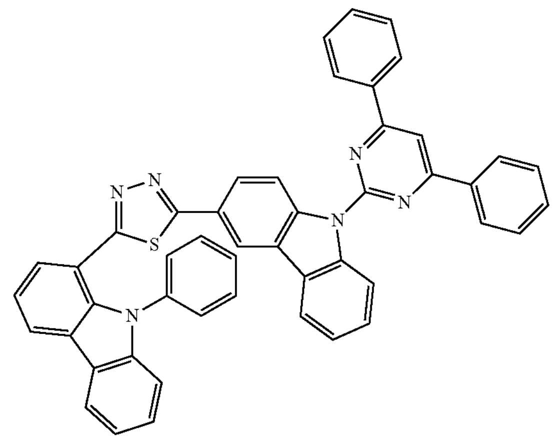
C 201
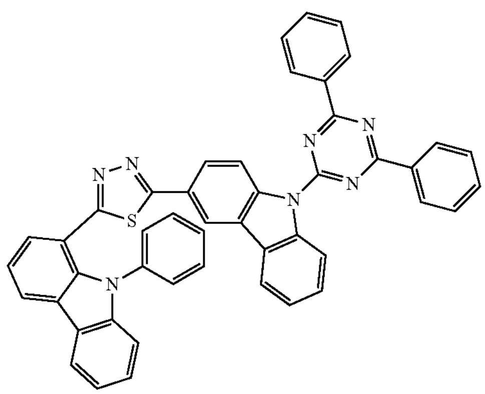
C 202
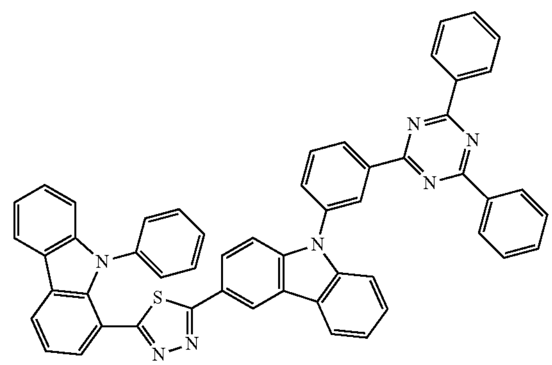
C 203
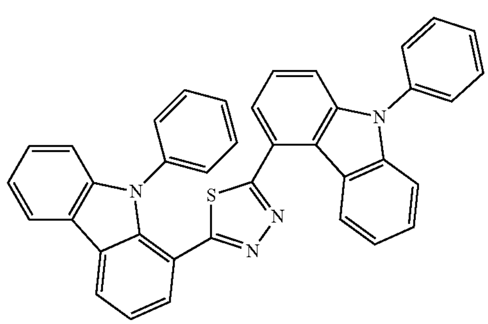
C 204
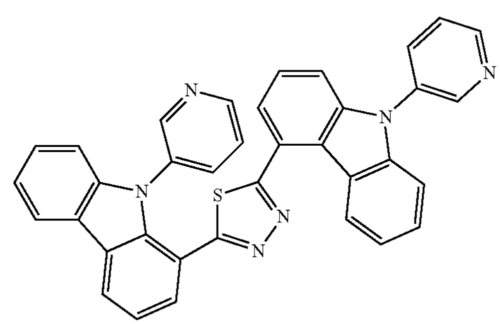
C 205
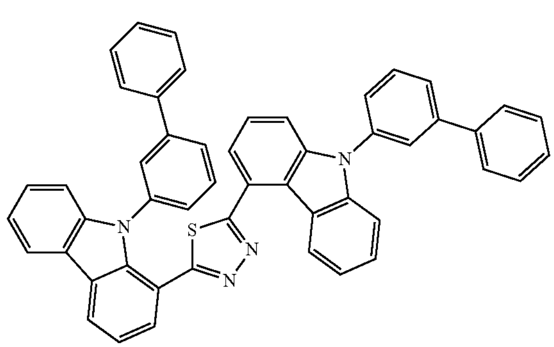
C 206
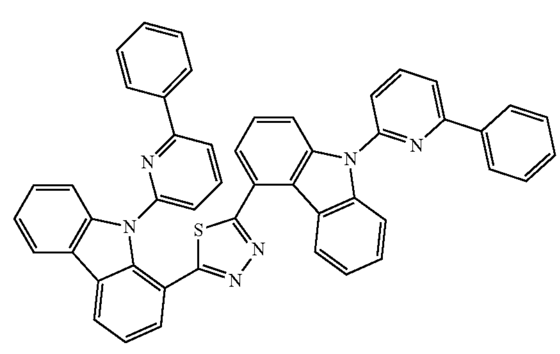

-continued
C 207
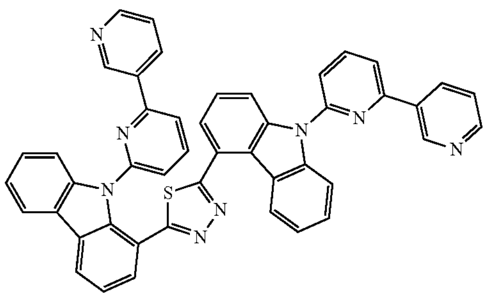
C 208
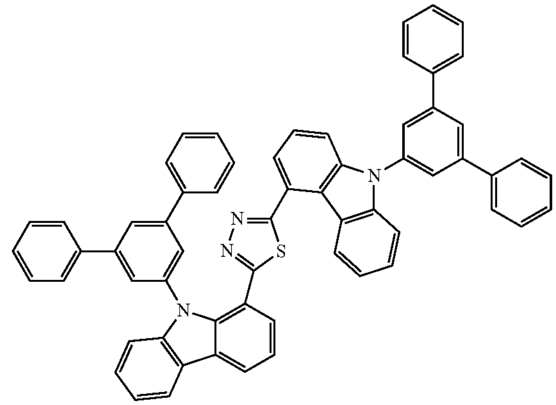
C 209
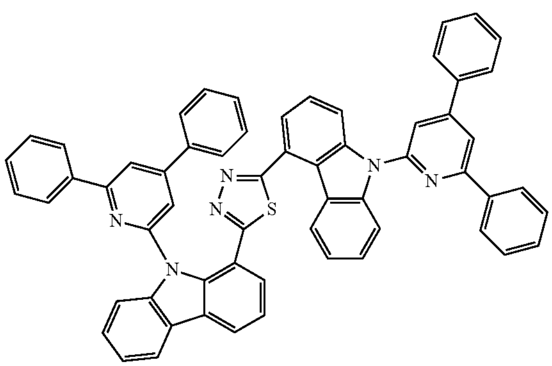
C 210
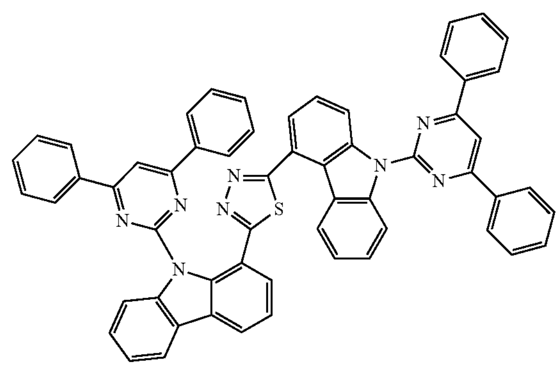
C 211
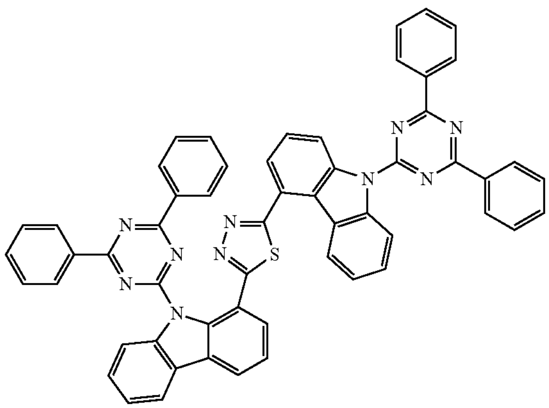
C 212
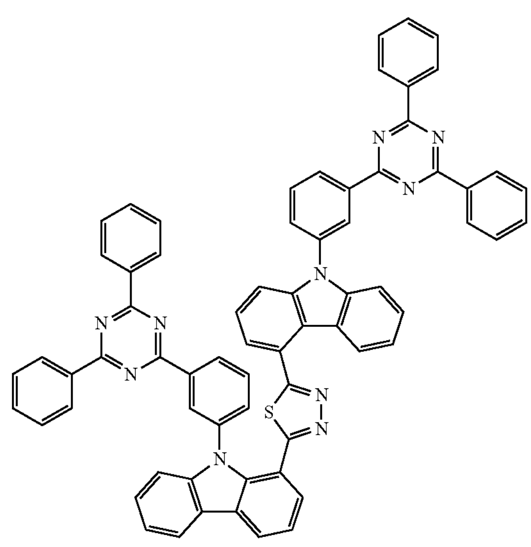

-continued
C 213
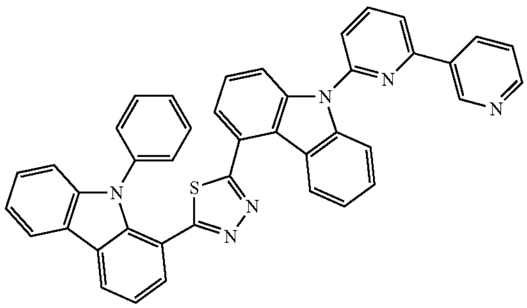
C 214
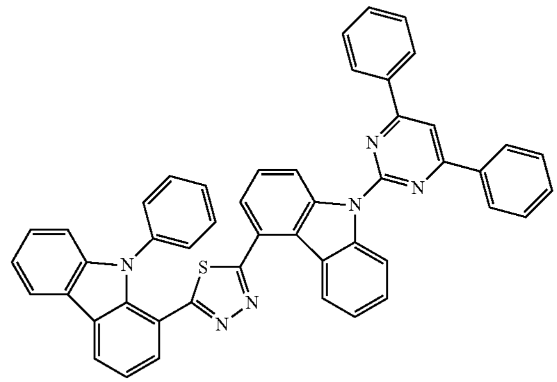
C 215
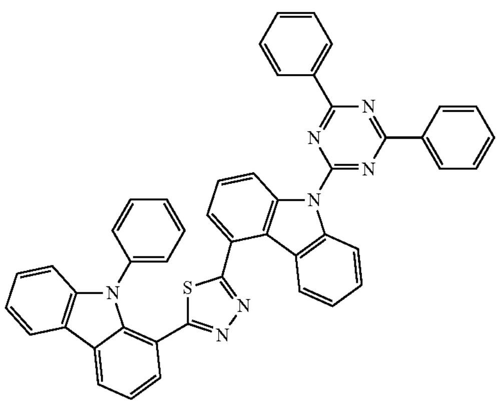
C 216
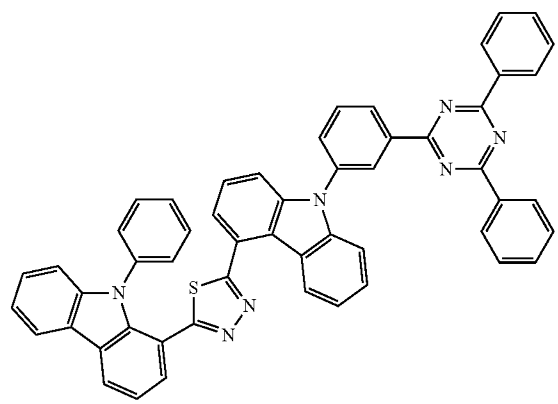
C 217
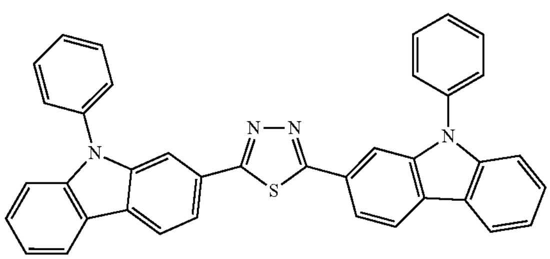
C 218
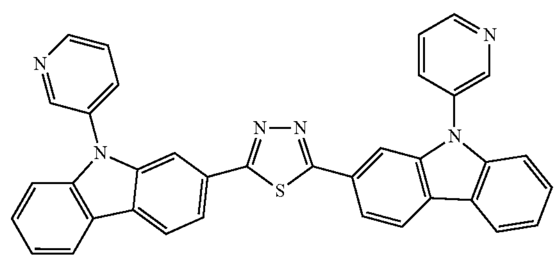
C 219
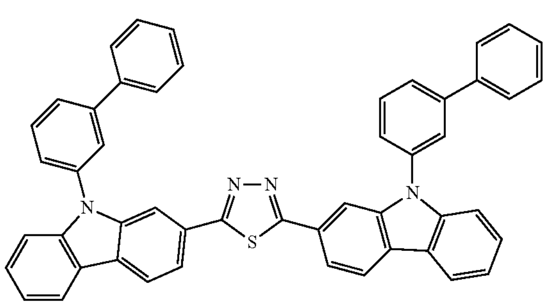
C 220
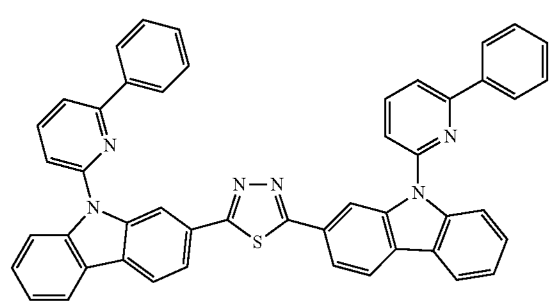

-continued
C 221
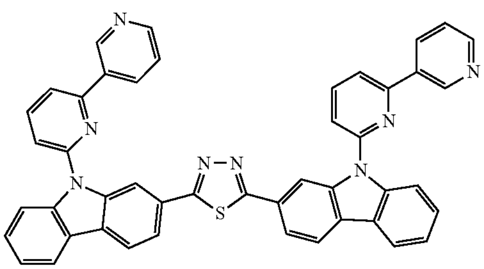
C 222
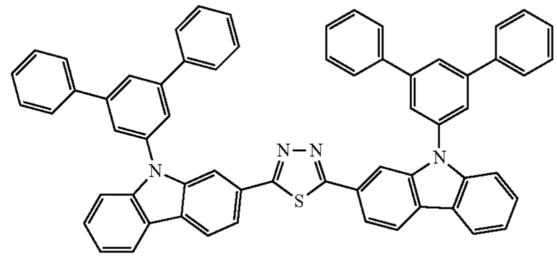
C 223
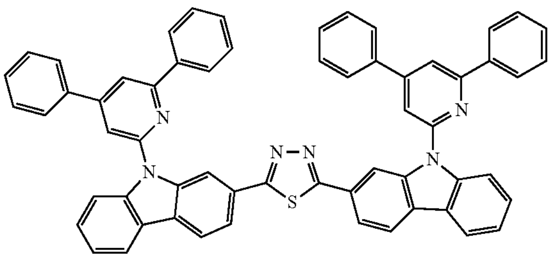
C 224
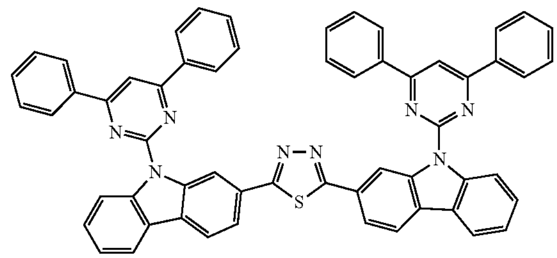
C 225
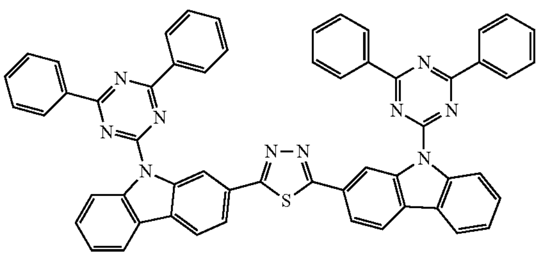
C 226
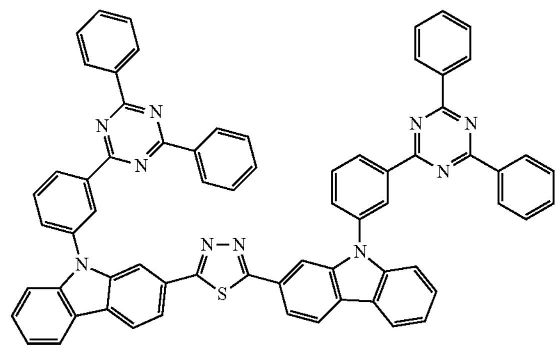
C 227
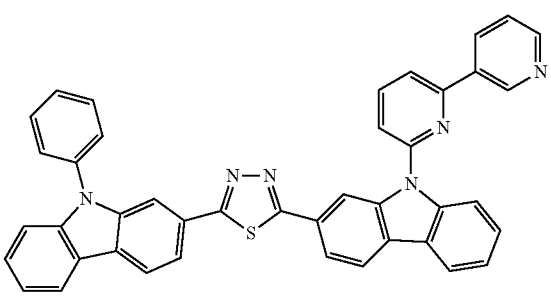
C 228
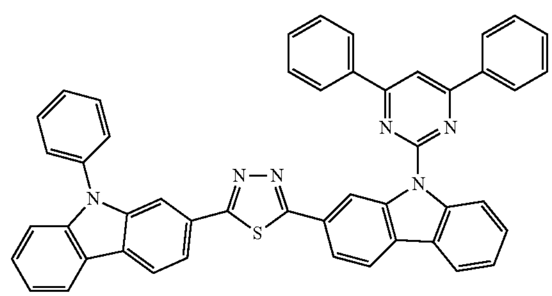
C 229
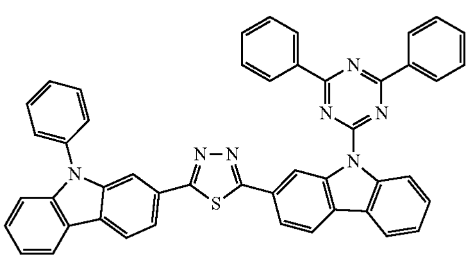
C 230
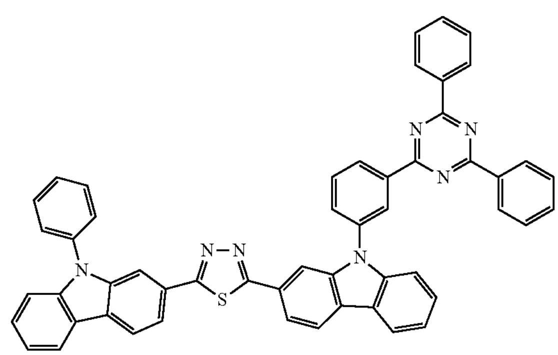

-continued
C 231
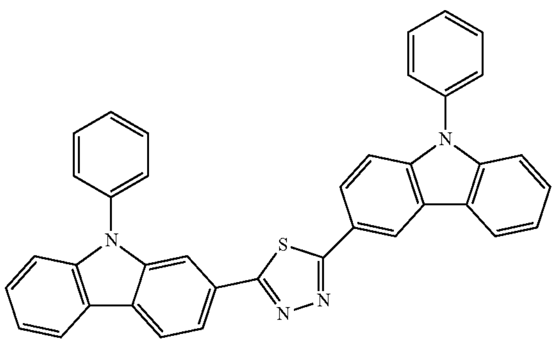
C 232
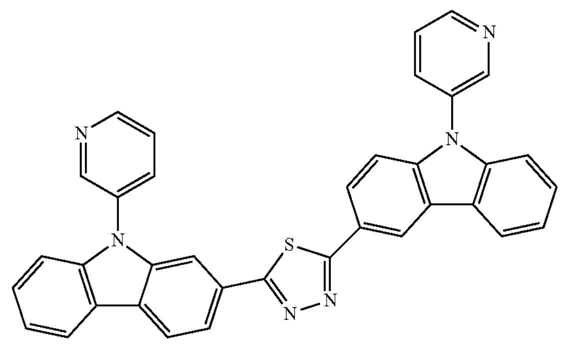
C 233
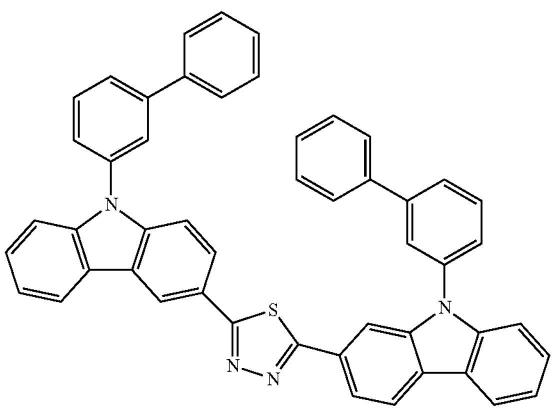
C 234
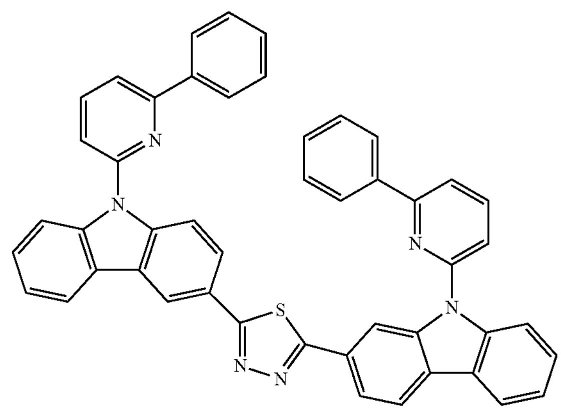
C 235
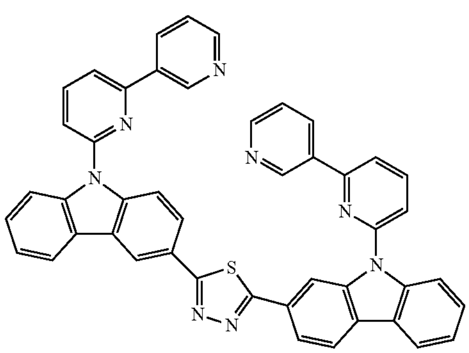
C 236
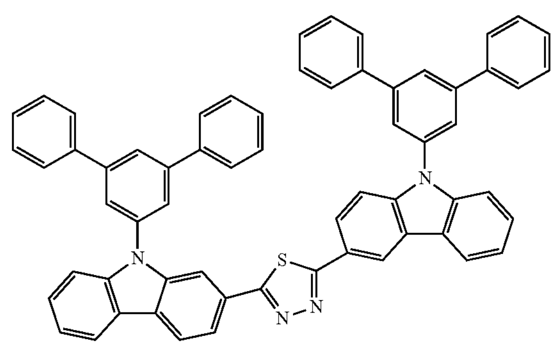
C 237
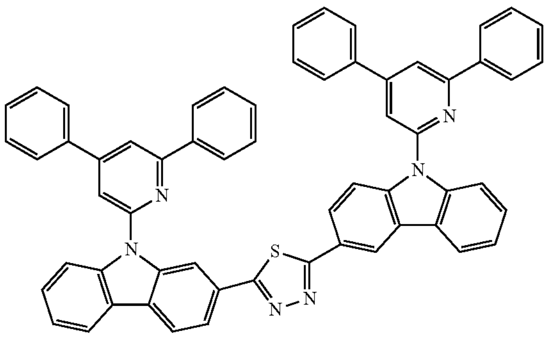
C 238
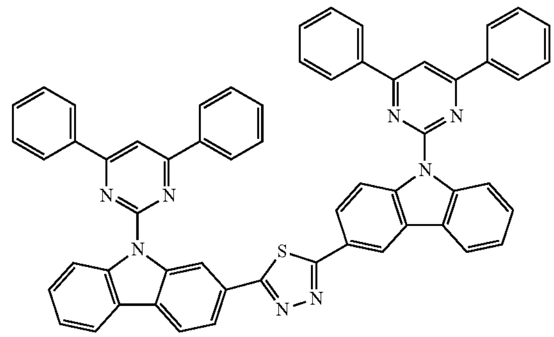

-continued
C 239
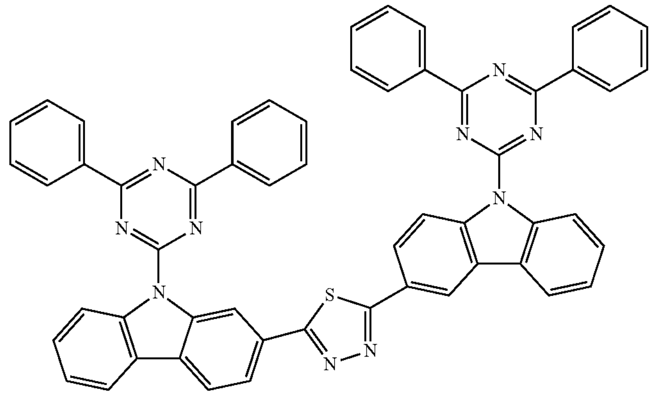
C 240
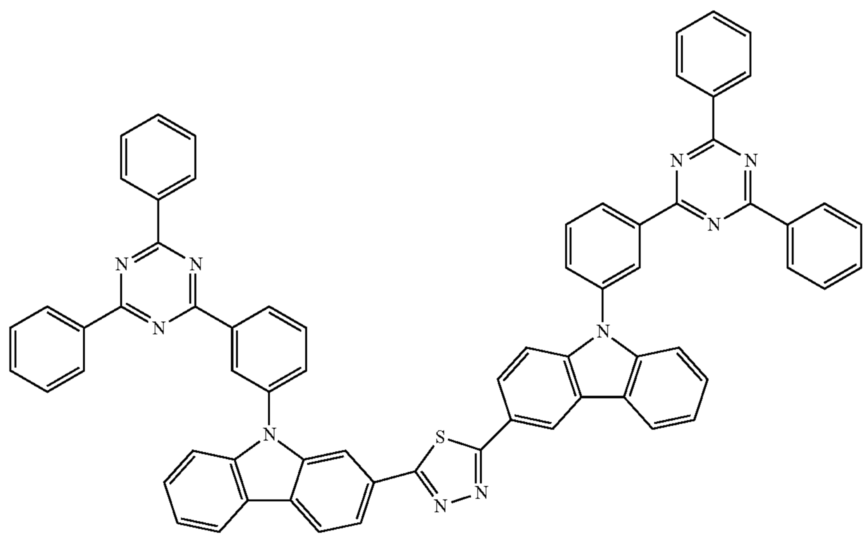
C 241
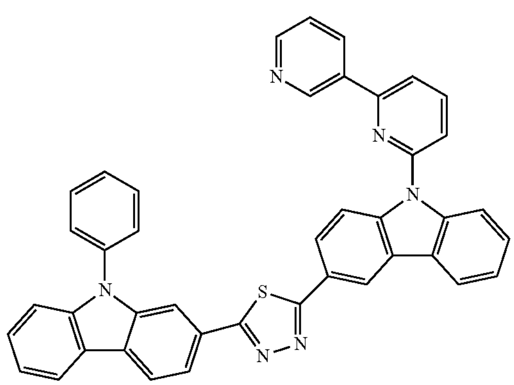
C 242
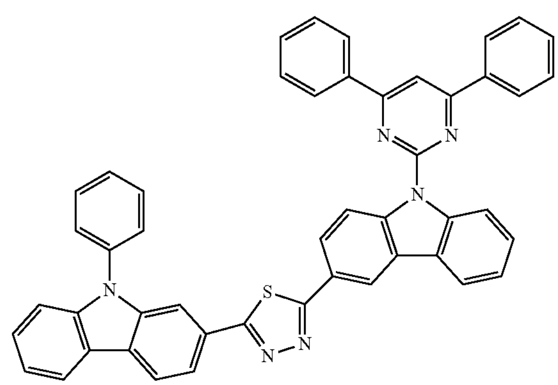

-continued
C 243
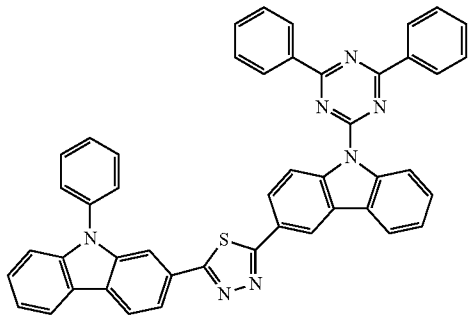
C 244
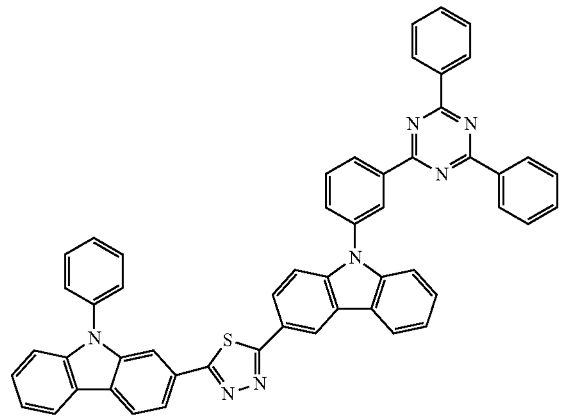
C 245
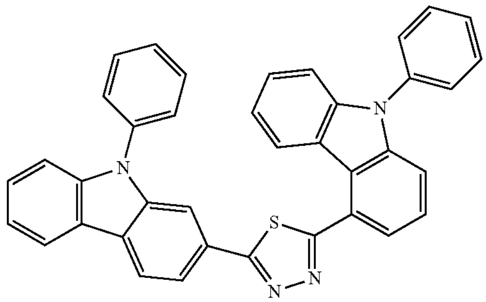
C 246
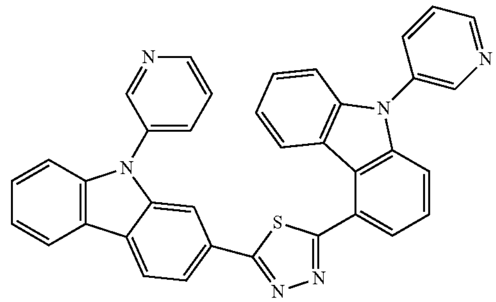
C 247
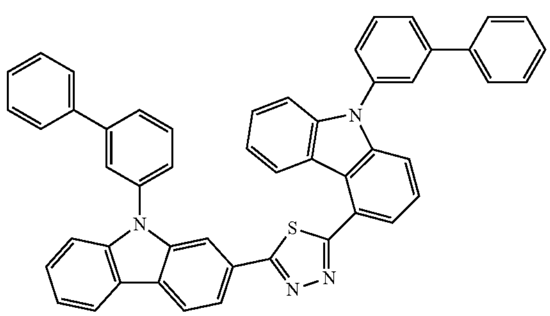
C 248
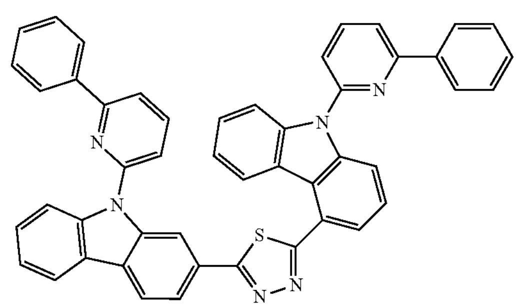
C 249
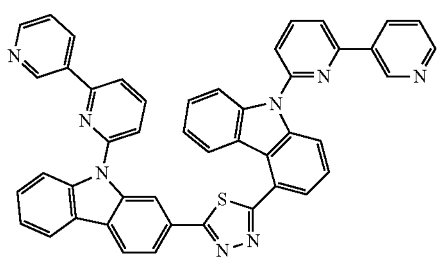
C 250
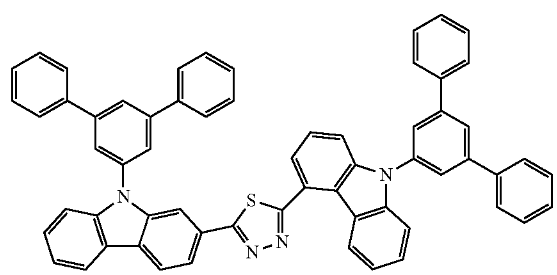

-continued
C 251
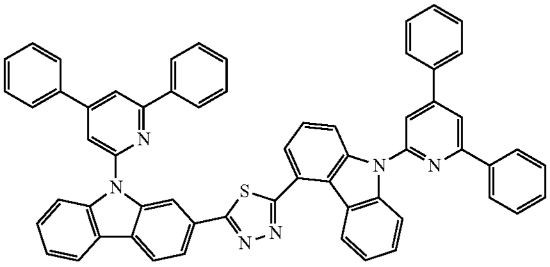
C 252
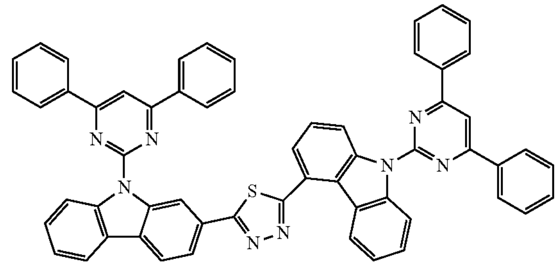
C 253
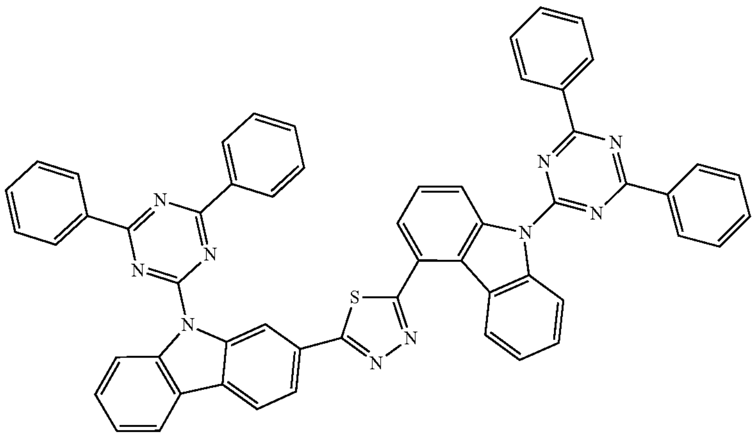
C 254
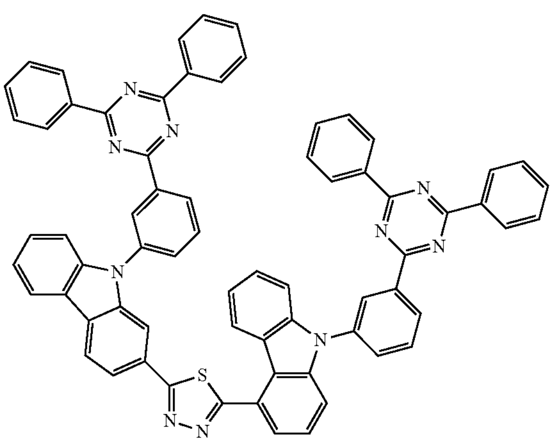
C 255
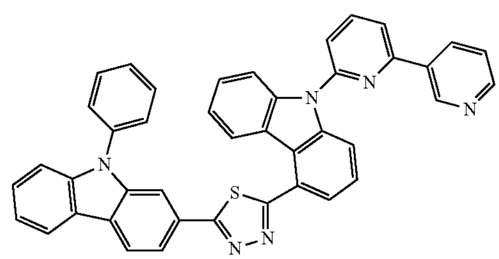
C 256
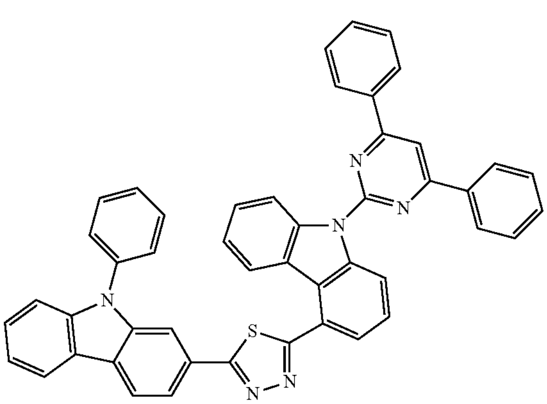
C 257
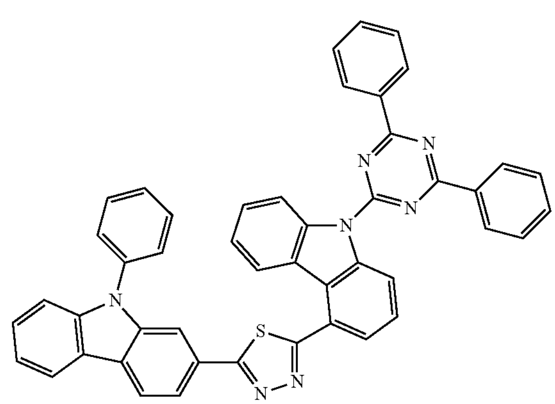

-continued
C 258
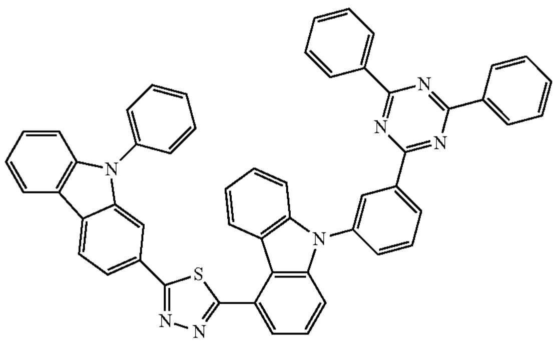
C 259
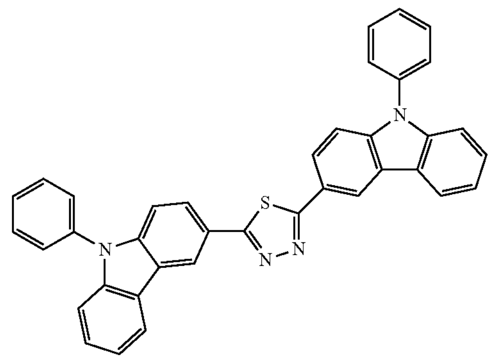
C 260
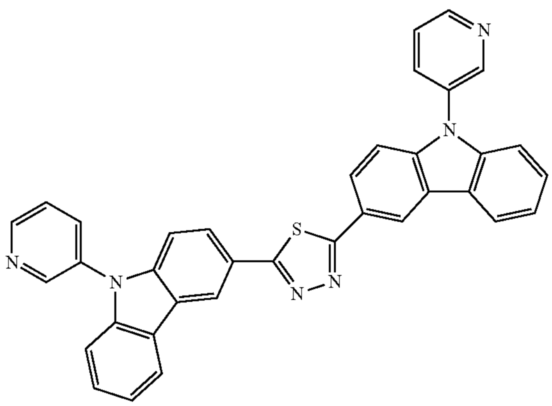
C 261
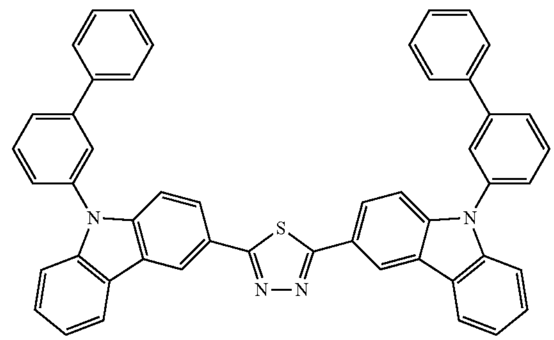
C 262
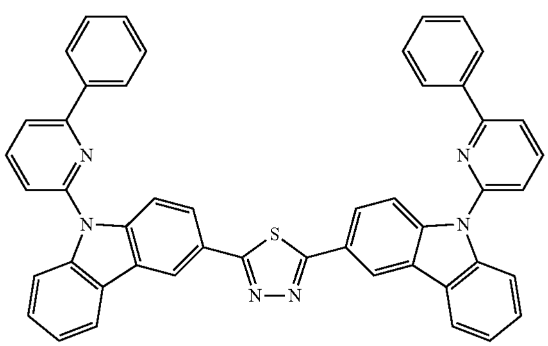
C 263
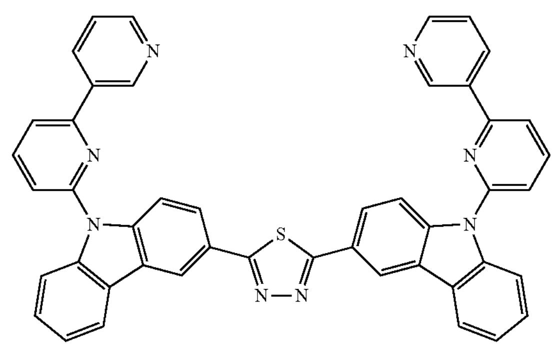
C 264
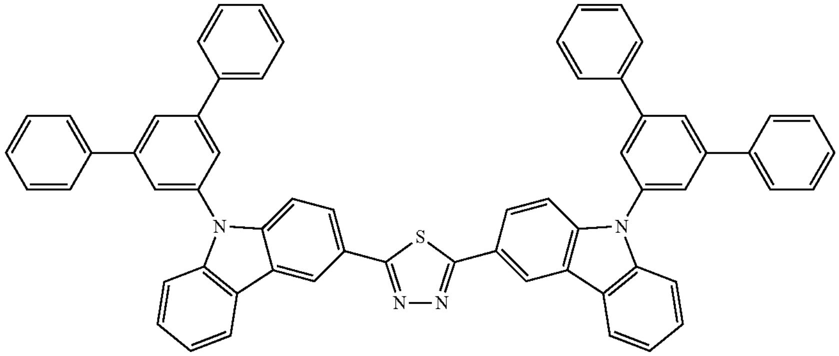

-continued
C 265
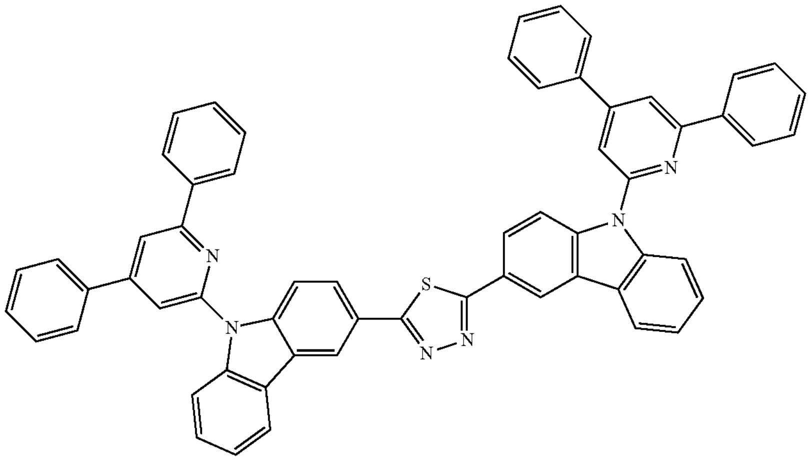
C 266
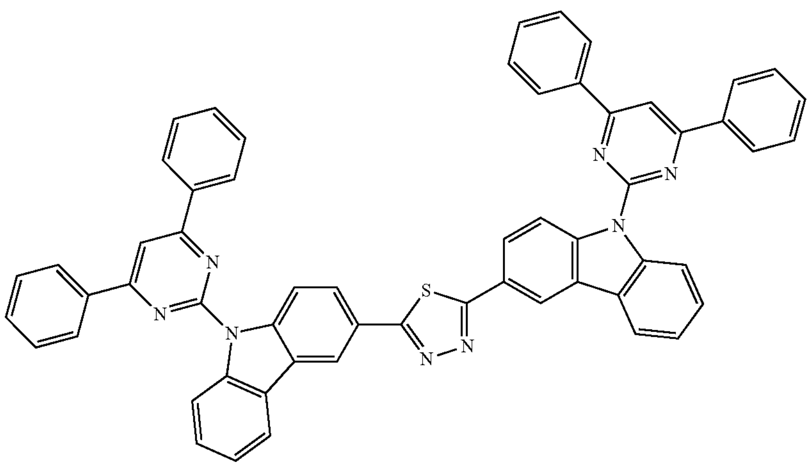
C 267
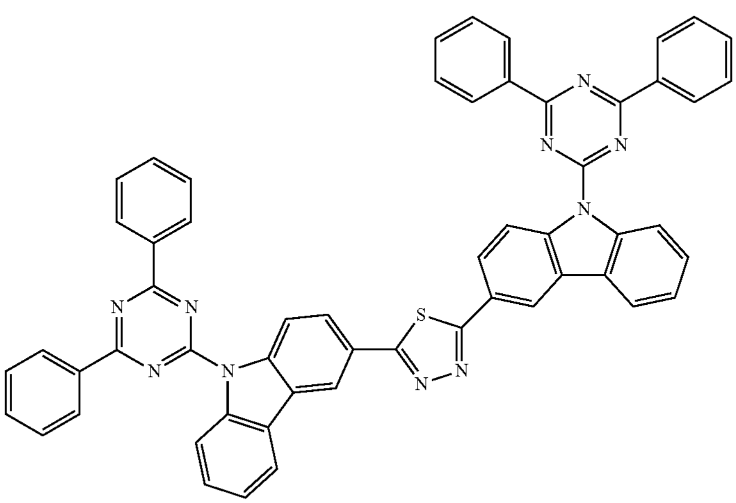

-continued
C 268
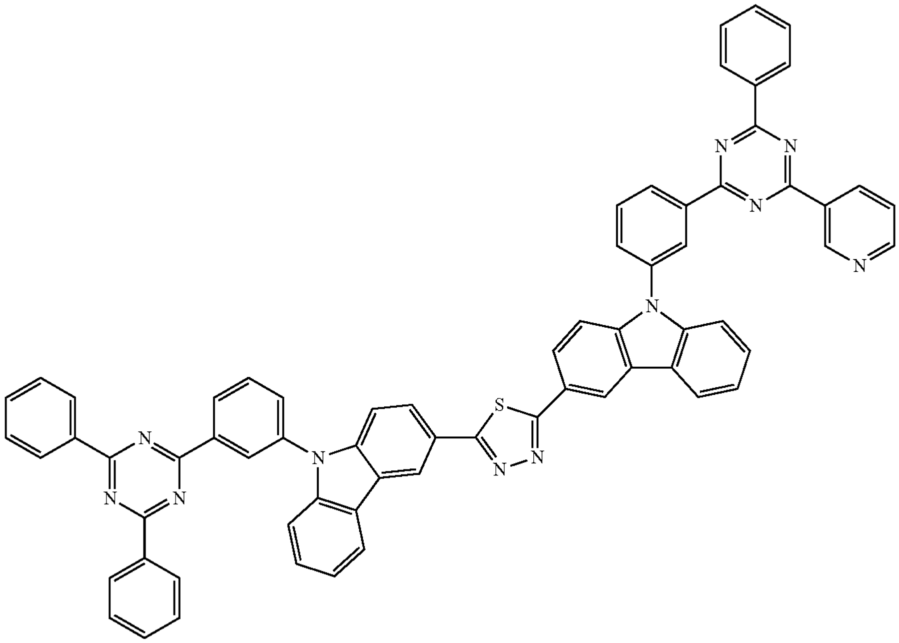
C 269
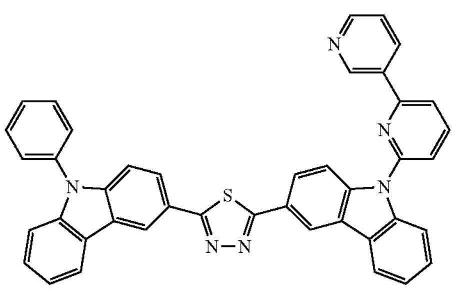
C 270
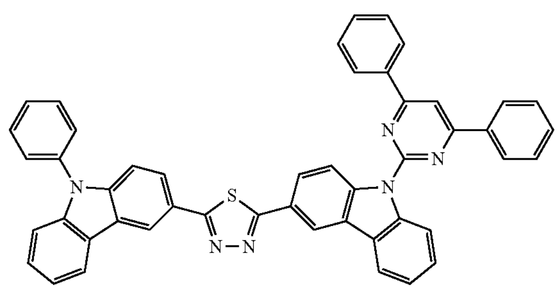
C 271
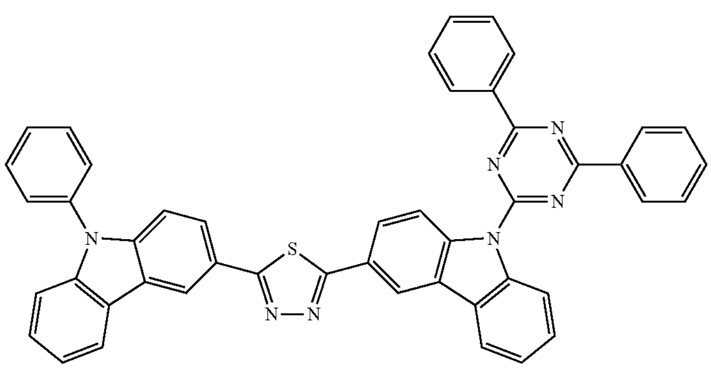

-continued
C 272
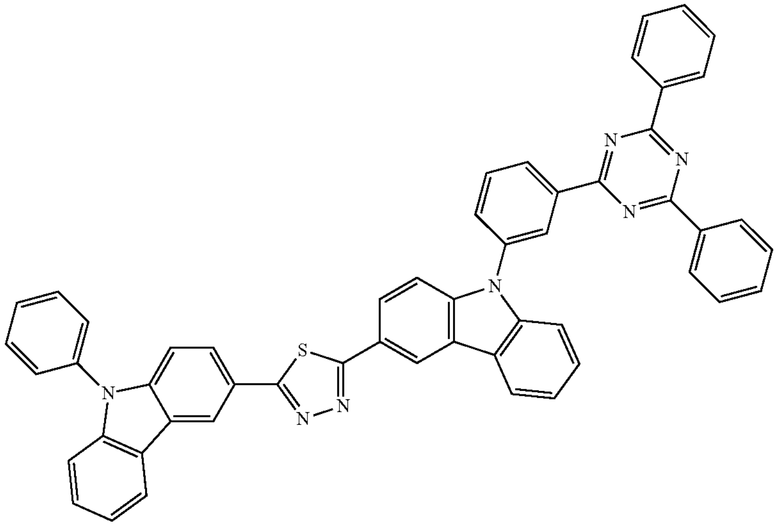
C 273
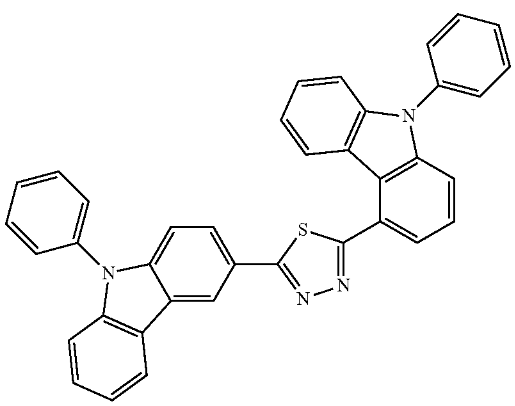
C 274
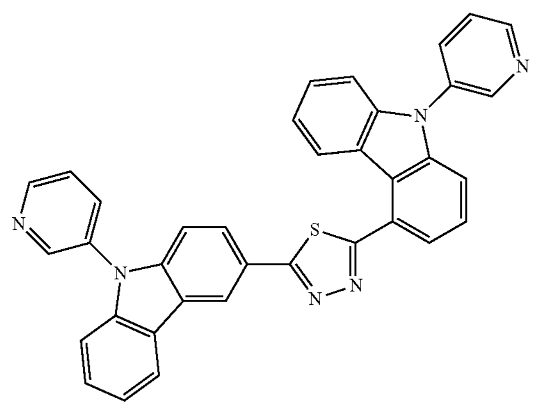
C 276
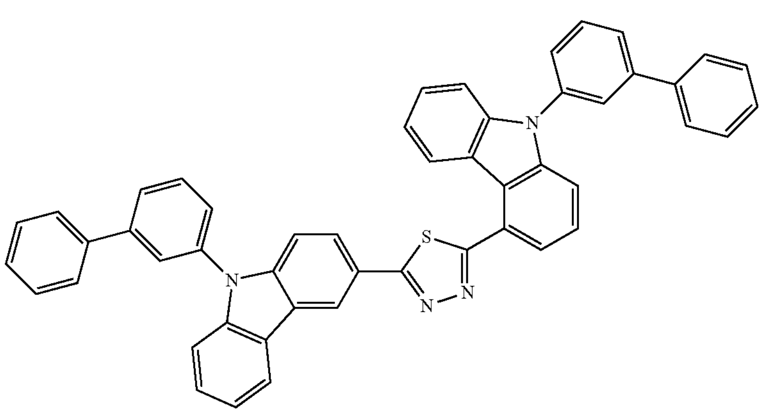

-continued
C 276
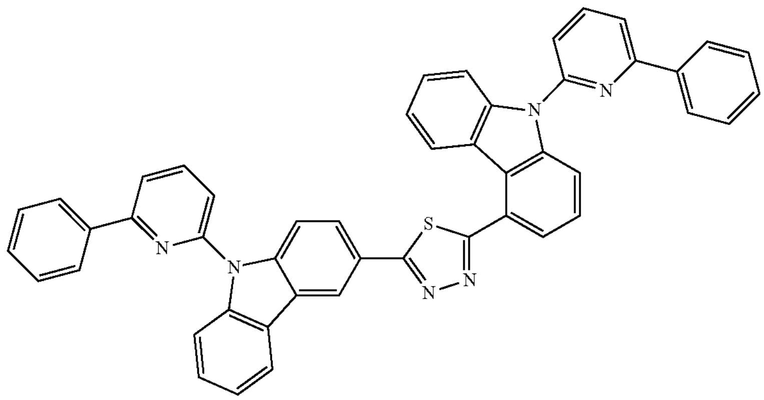
C 277
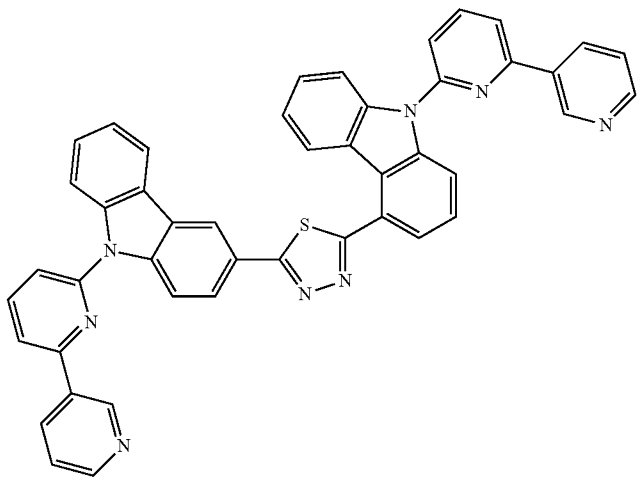
C 278
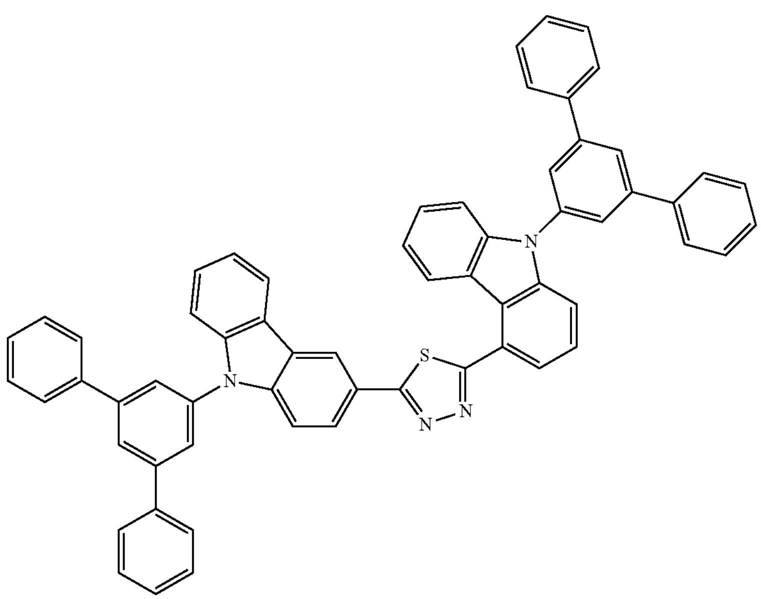

-continued
C 279
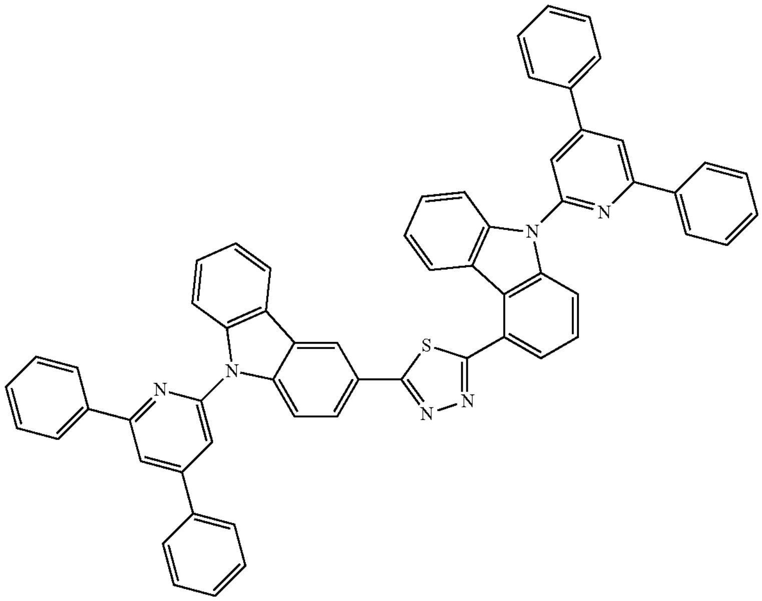
C 280
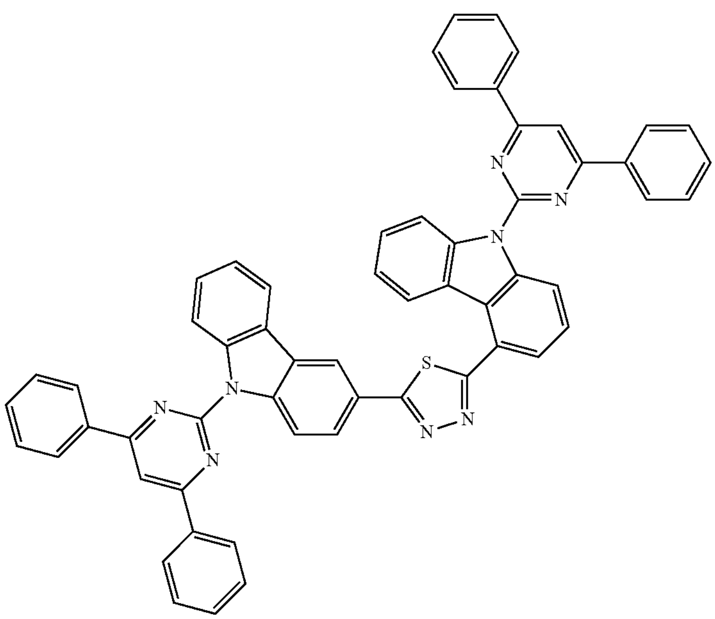

-continued
C 281
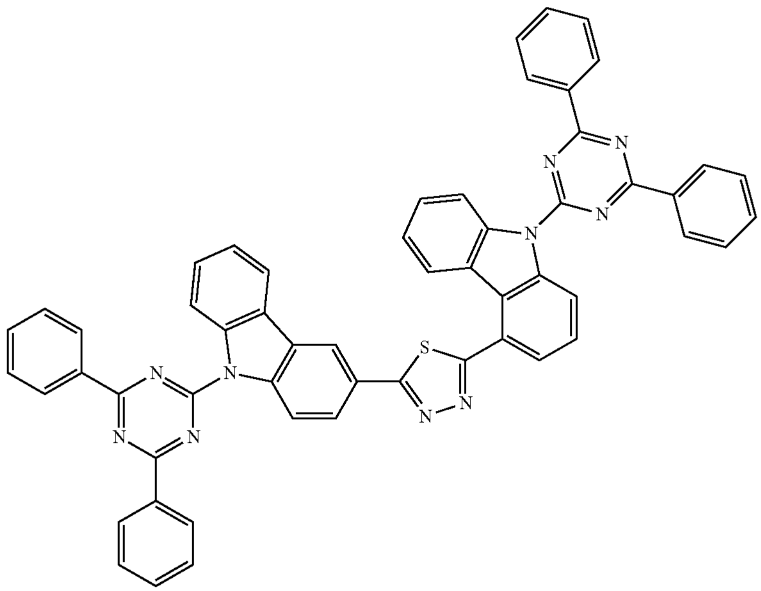
C 282
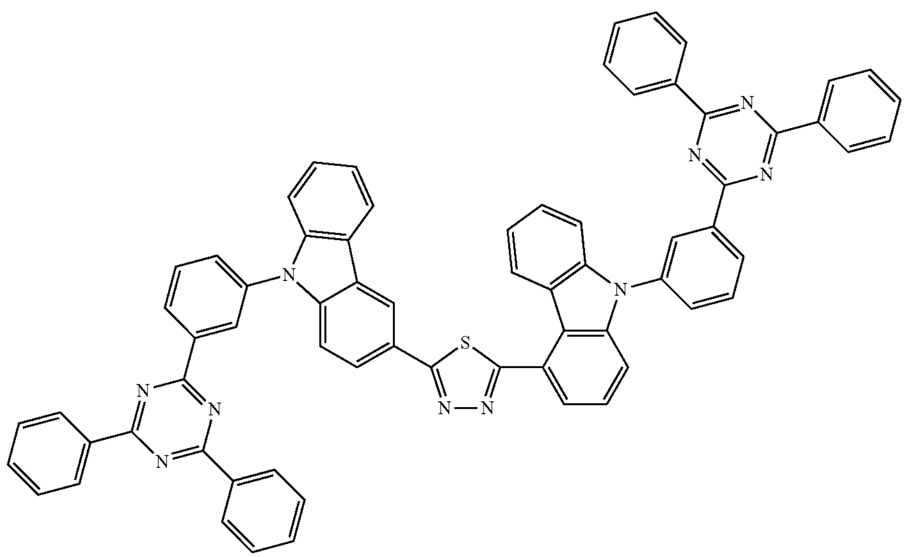
C 283
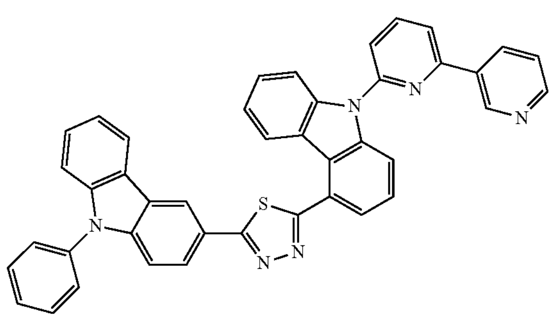
C 284
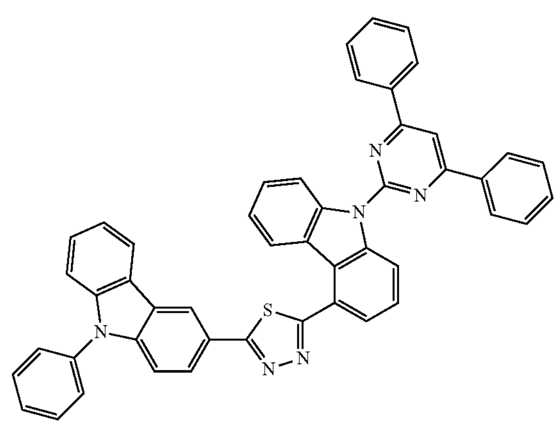

-continued
C 285
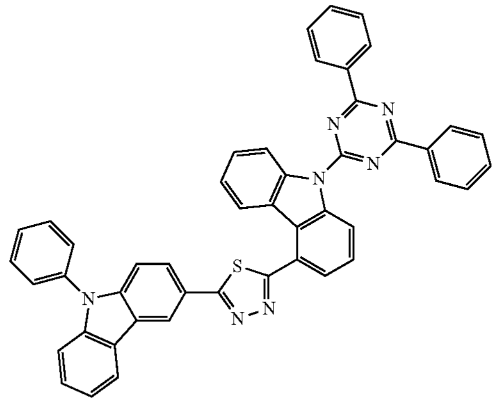
C 286
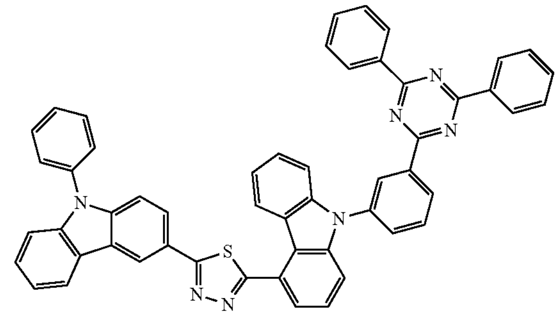
C 287
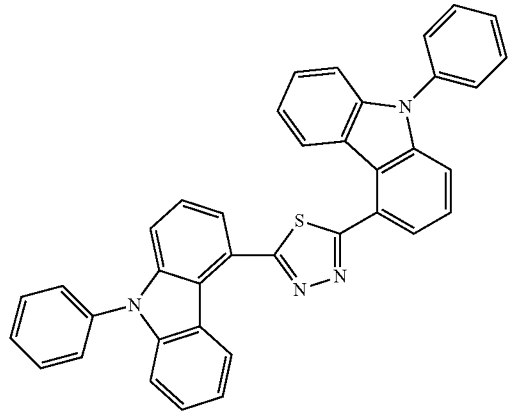
C 288
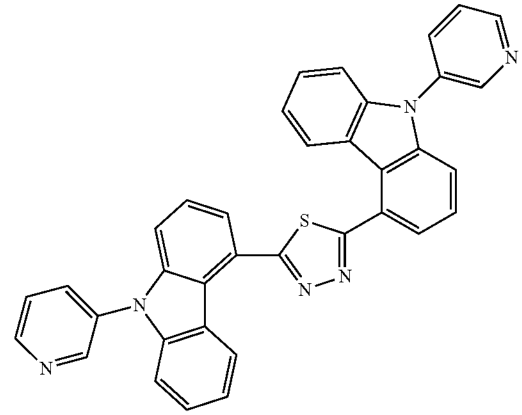
C 289
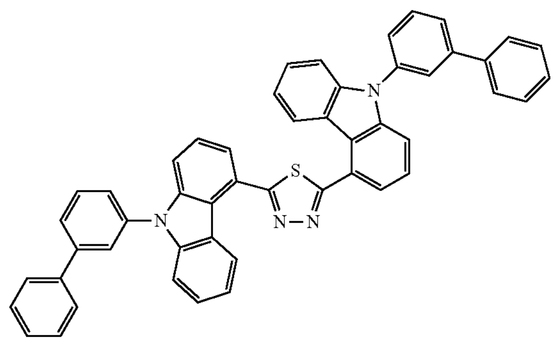
C 290
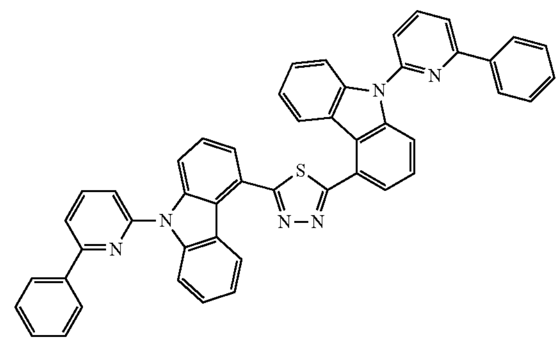

-continued
C 291
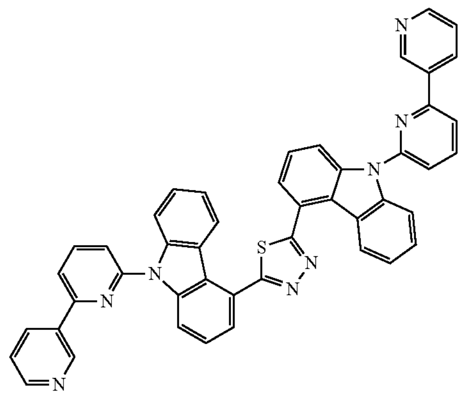
C 292
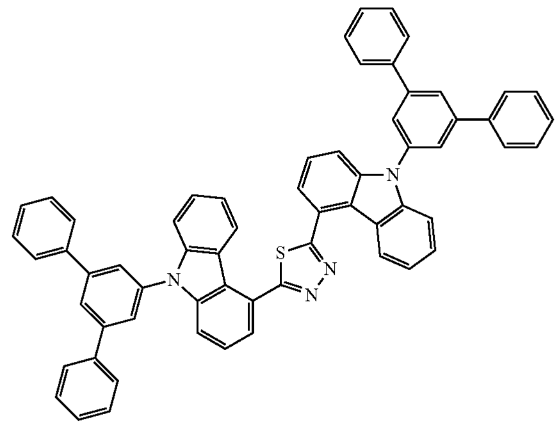
C 293
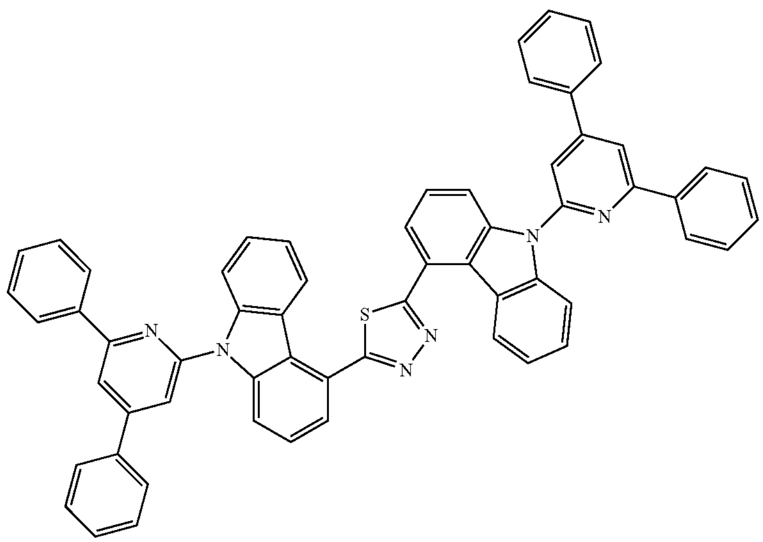
C 294
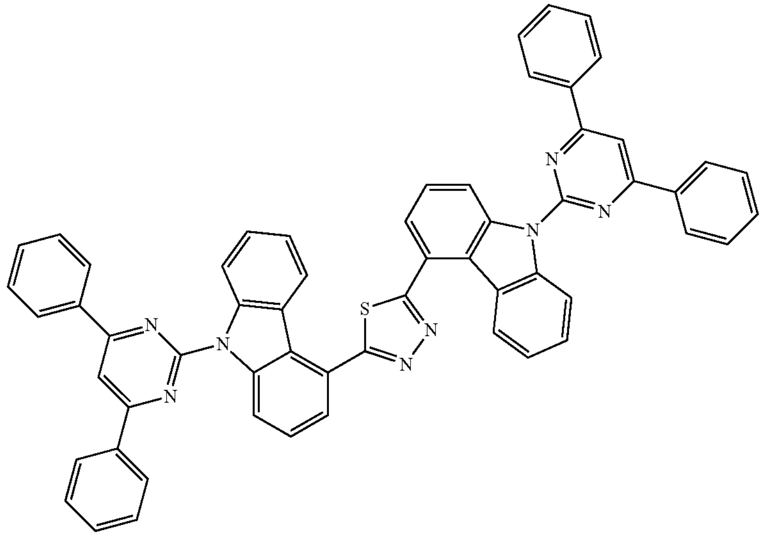

-continued
C 295
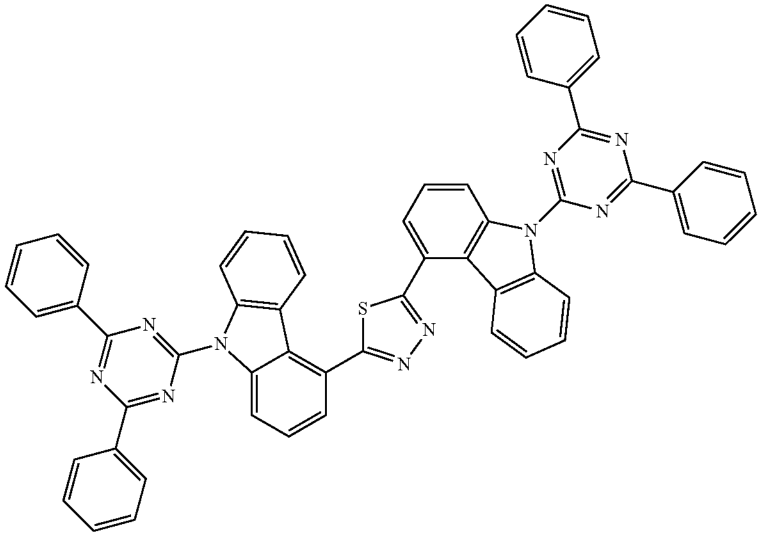
C 286
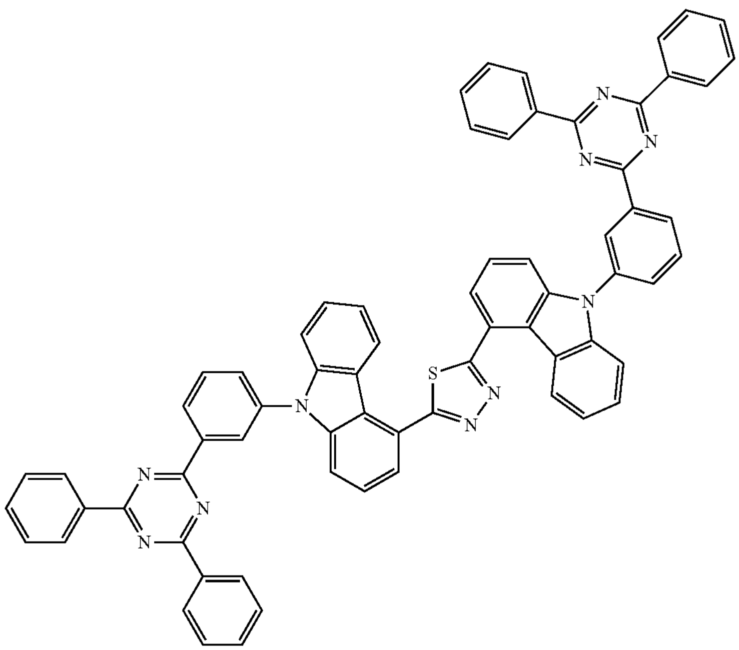
C 297
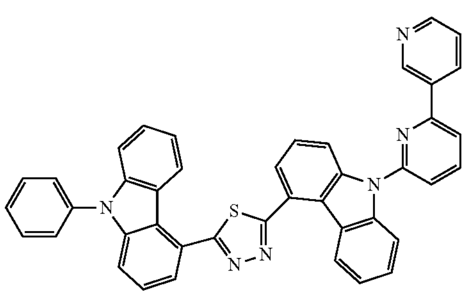
C 298
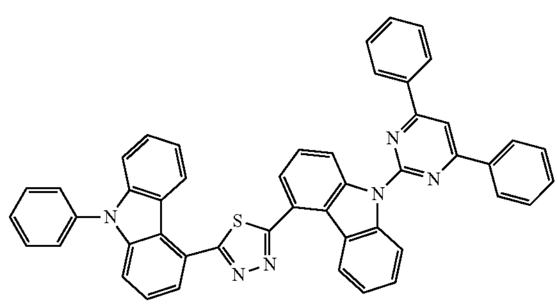

-continued
C 299
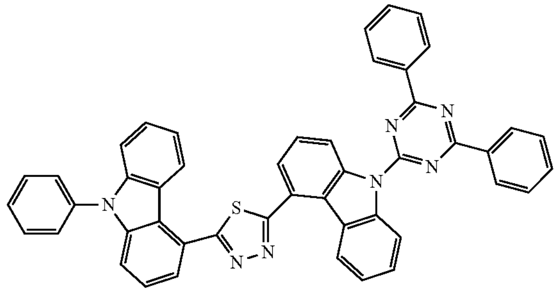
C 300
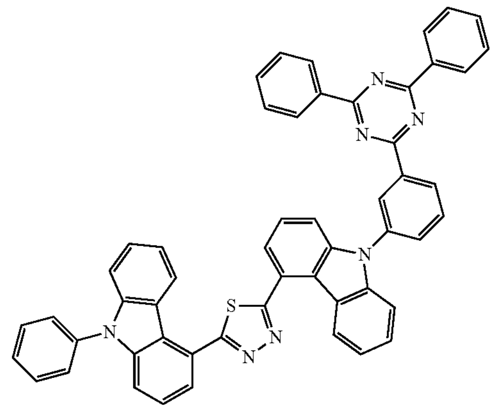
C 301
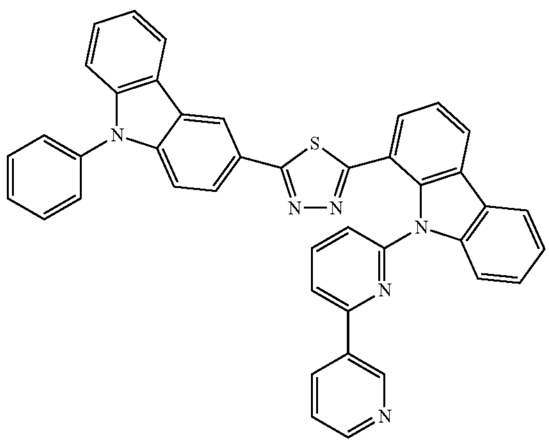
C 302
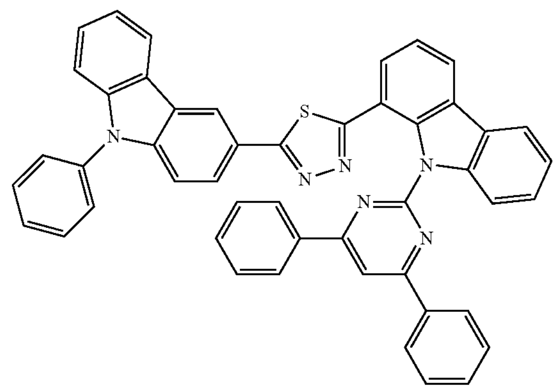
C 303
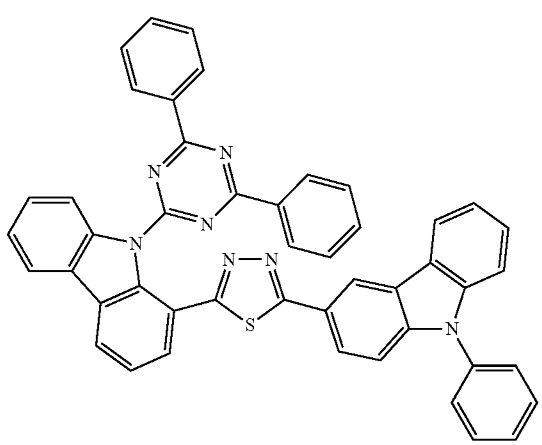
C 304
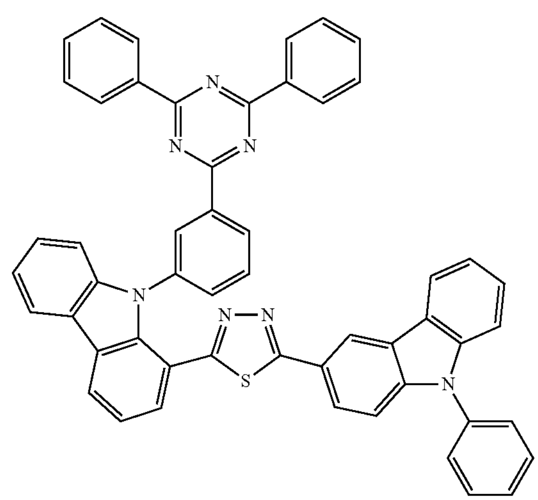

-continued
C 305
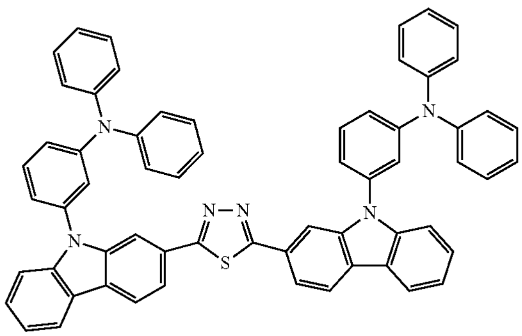
C 306
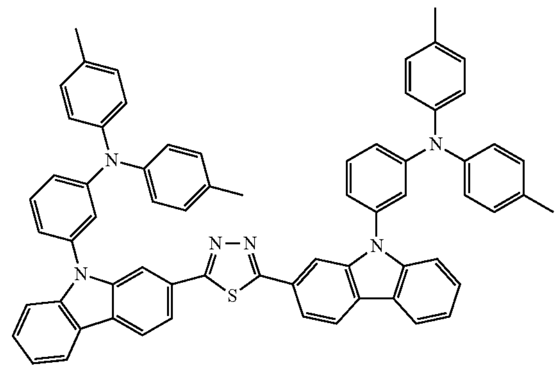
C 307
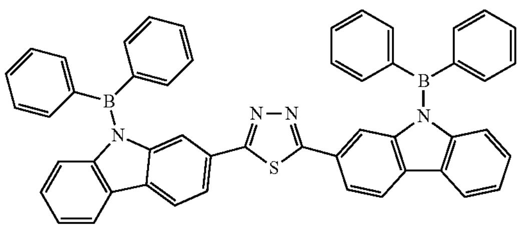
C 308
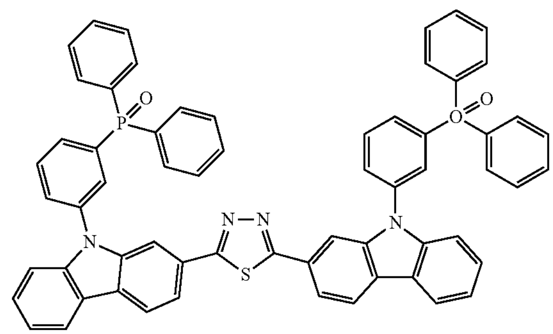
C 209
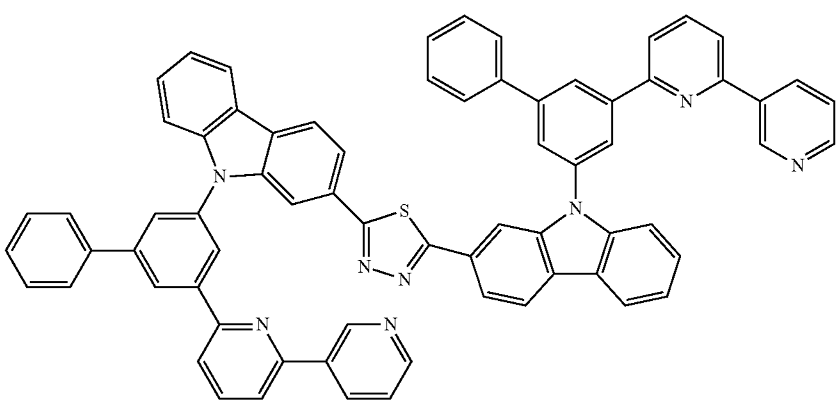
C 310
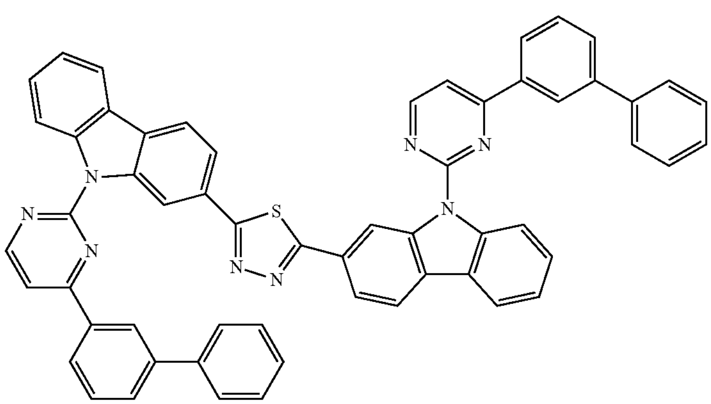

-continued
C 311
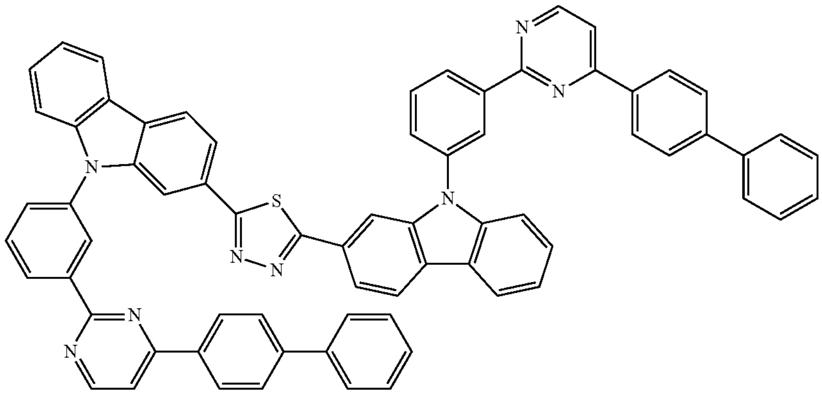
C 312
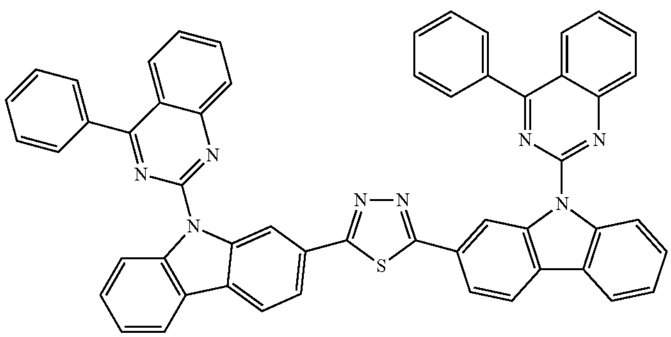
C 313
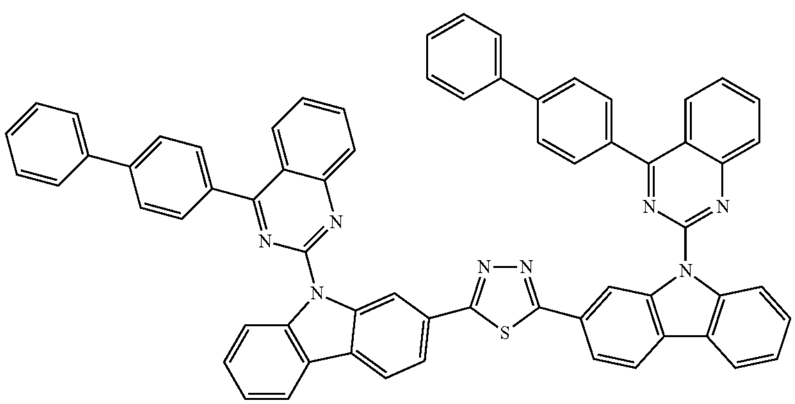
C 314
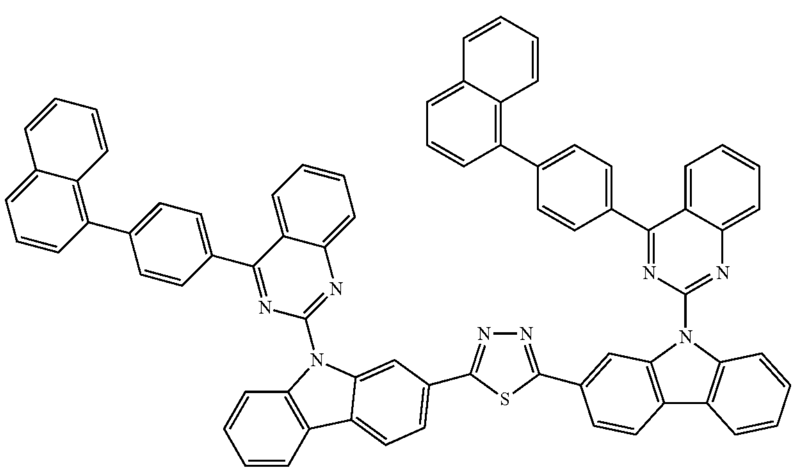

-continued
C 315
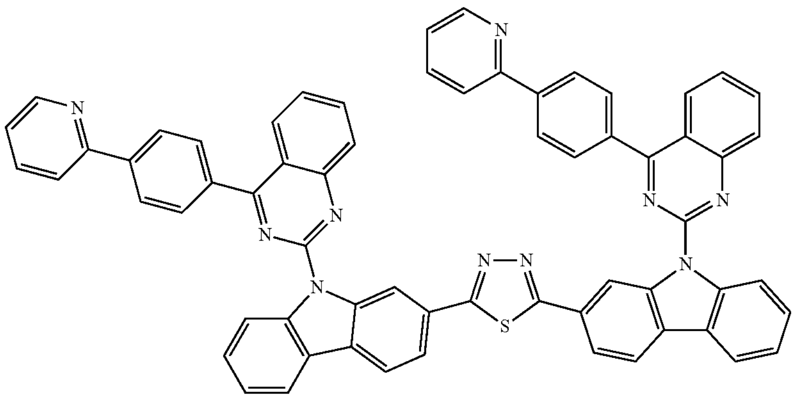
C 316
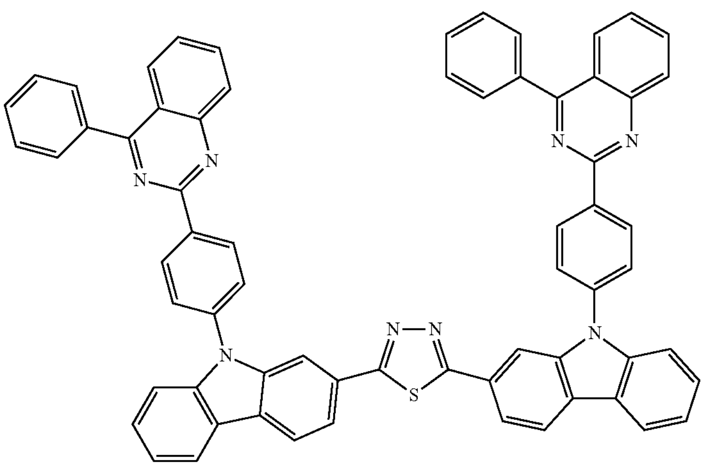
C 317
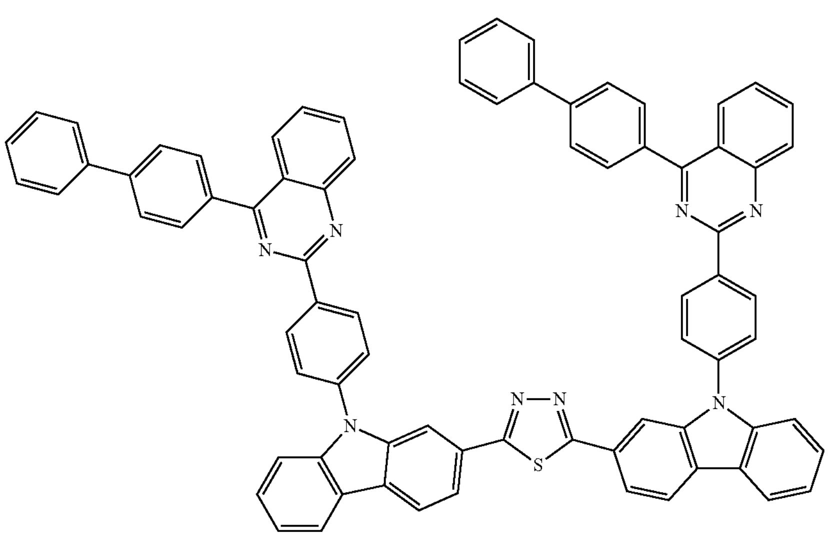

-continued
C 318
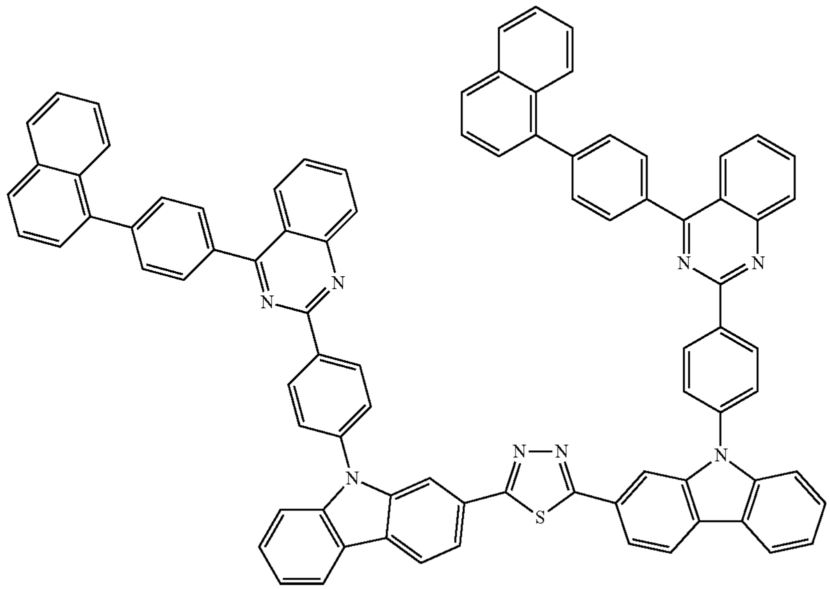
C 319
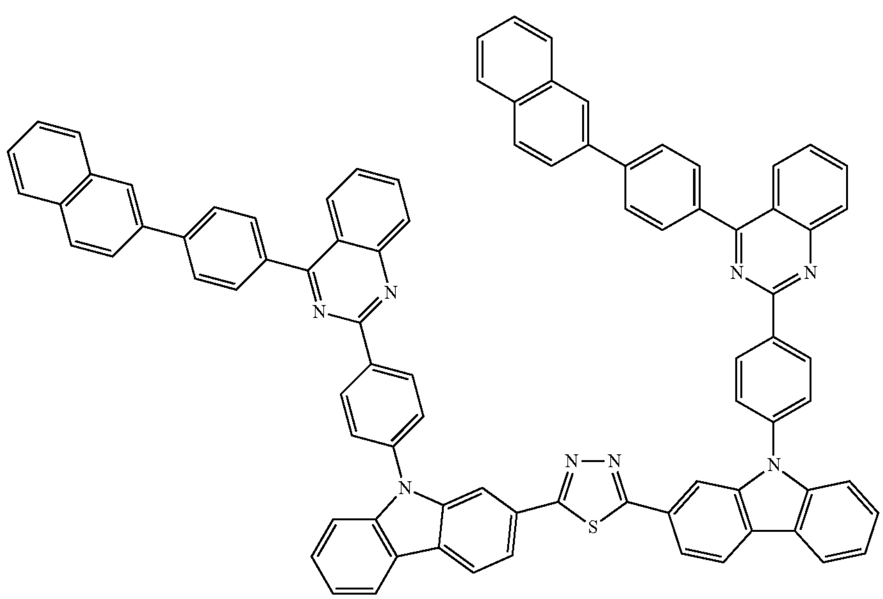

-continued
C 320
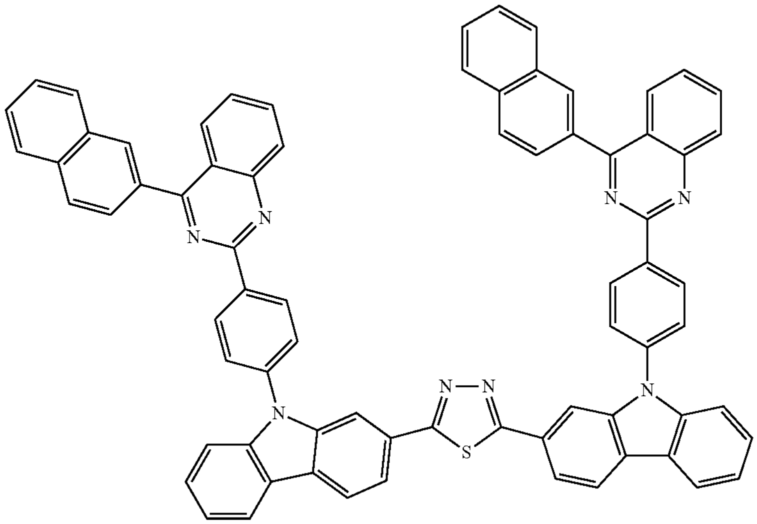
C 321
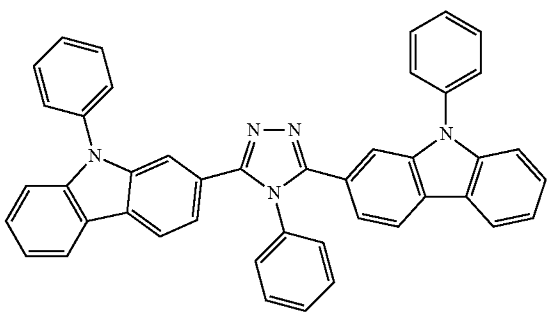
C 322
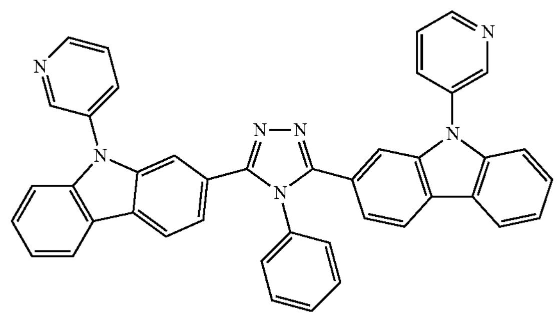
C 323
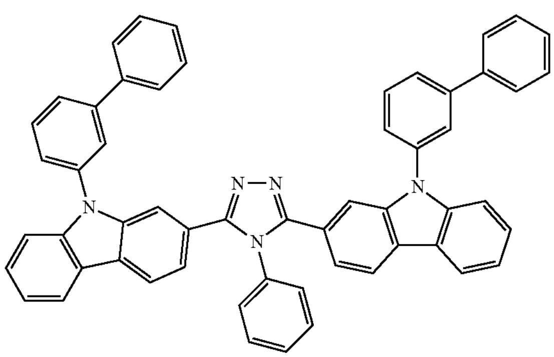
C 324
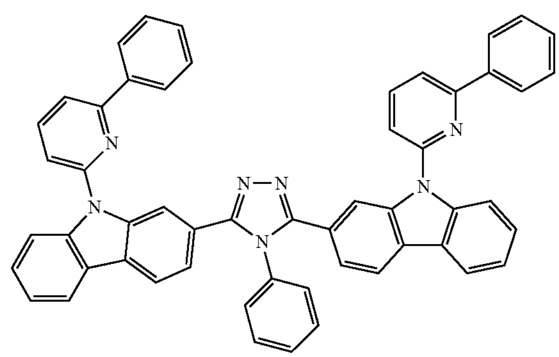
C 325
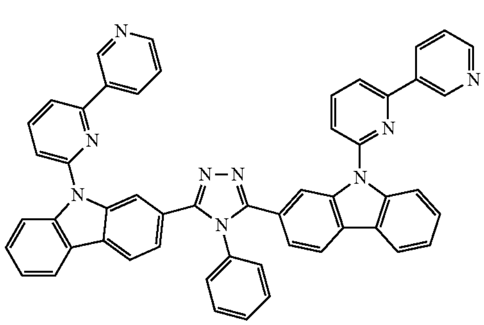
C 326
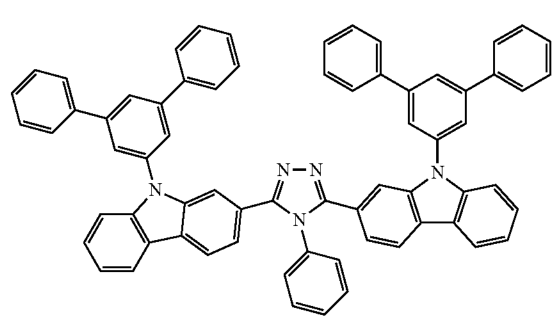

-continued
C 327
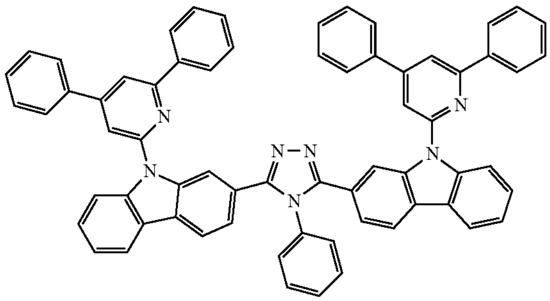
C 328
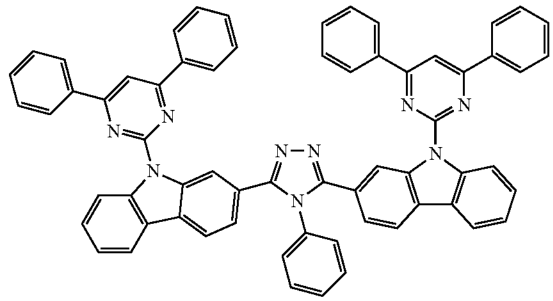
C 329
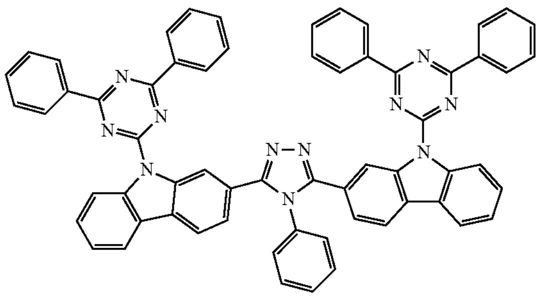
C 330
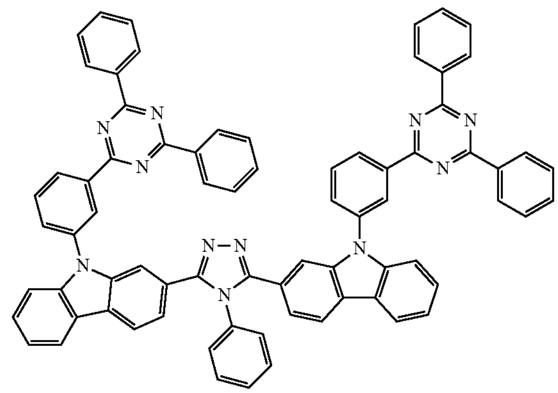
C 331
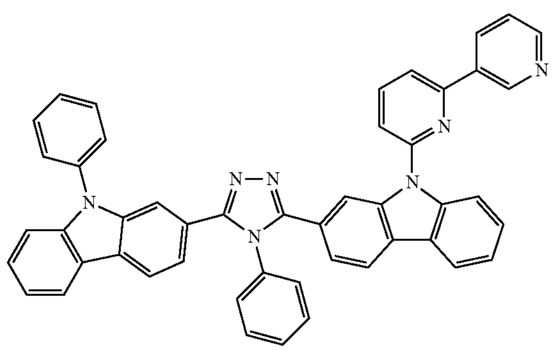
C 332
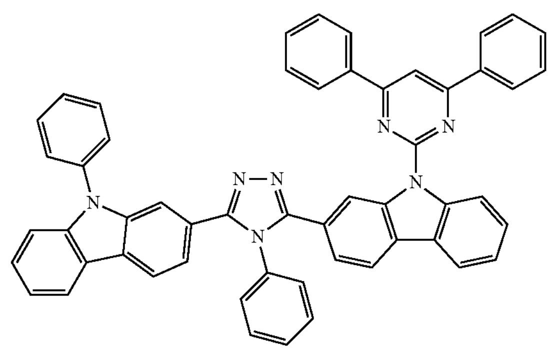
C 333
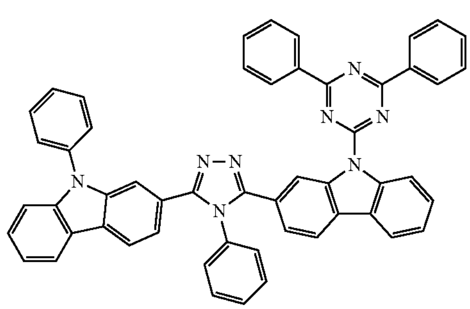
C 334
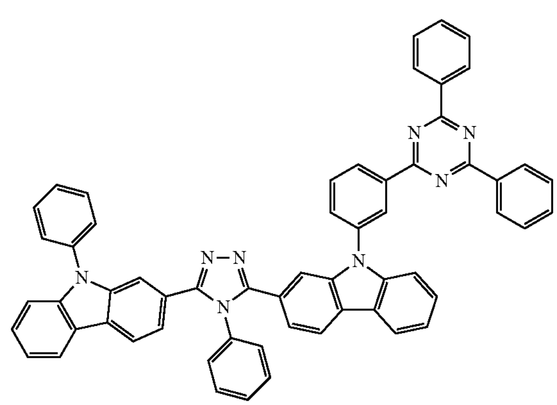

-continued
C 336
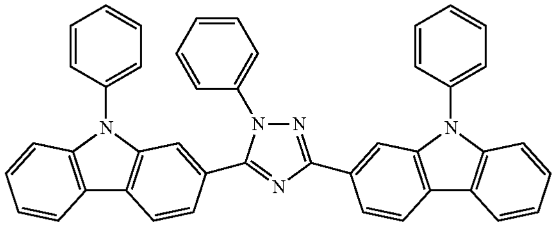
C 336
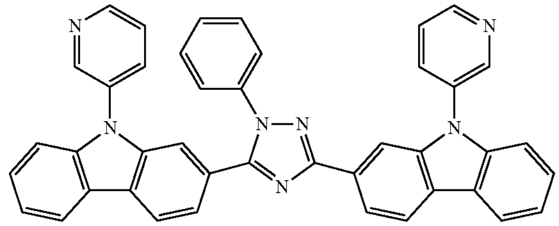
C 337
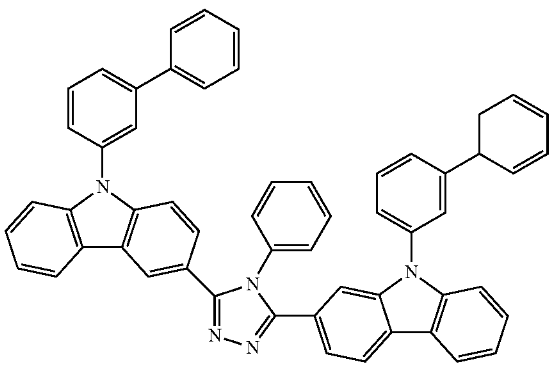
C 338
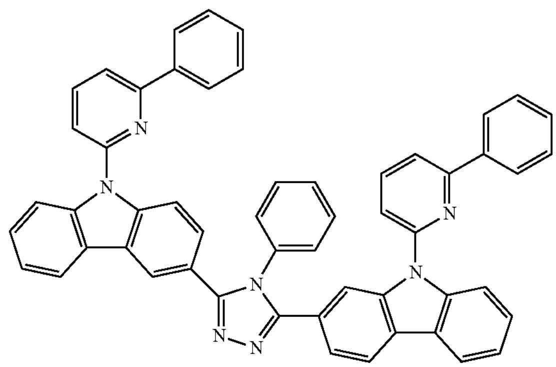
C 339
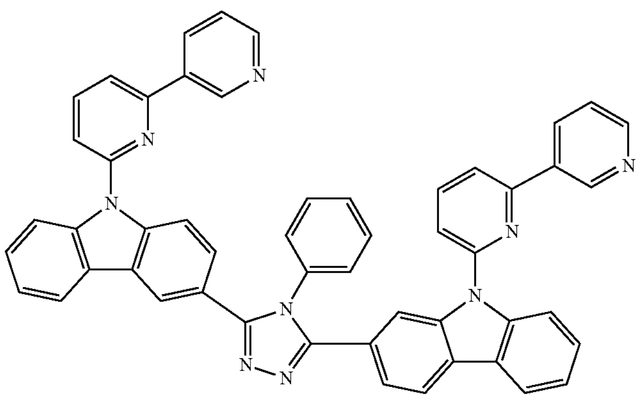
C 340
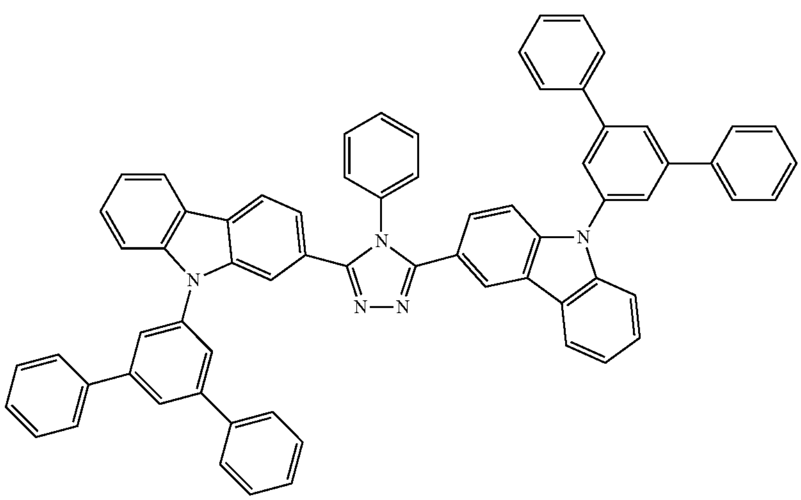

-continued
C 341
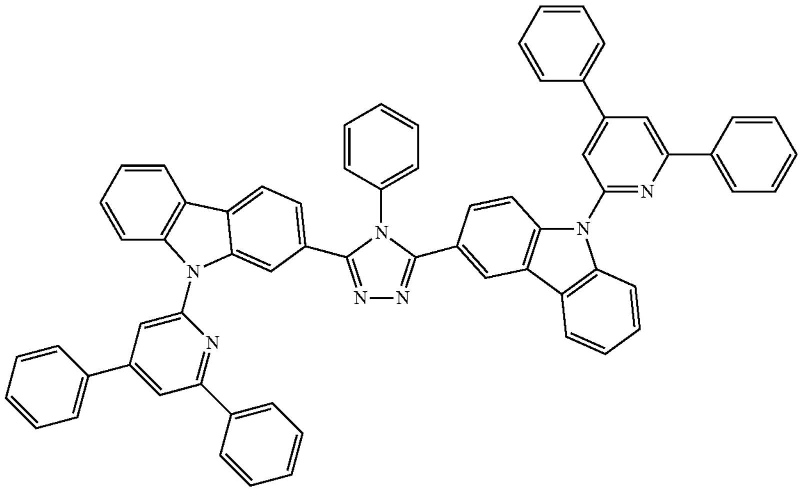
C 342
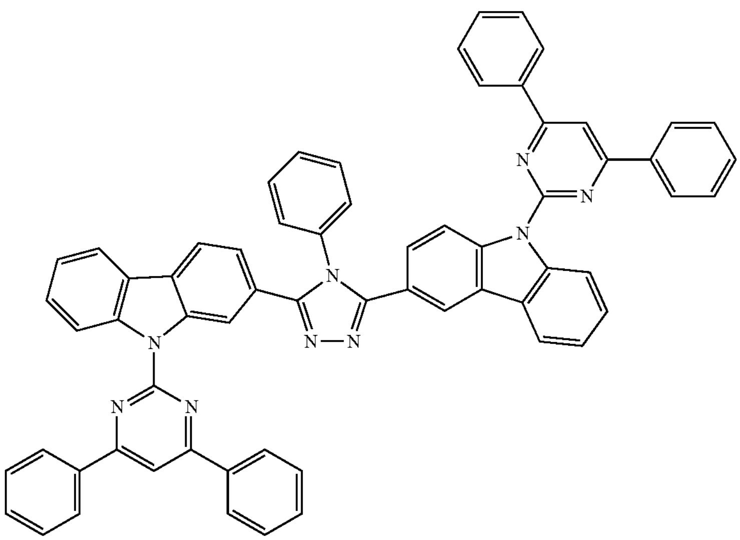
C 343
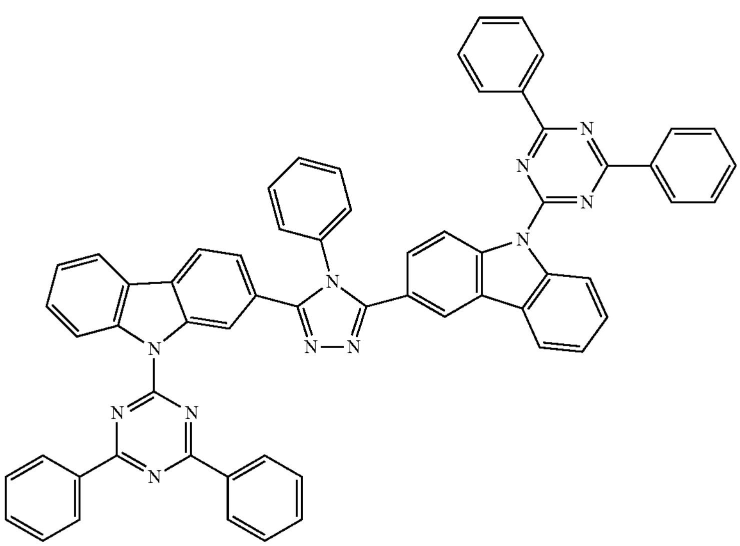

-continued
C 344
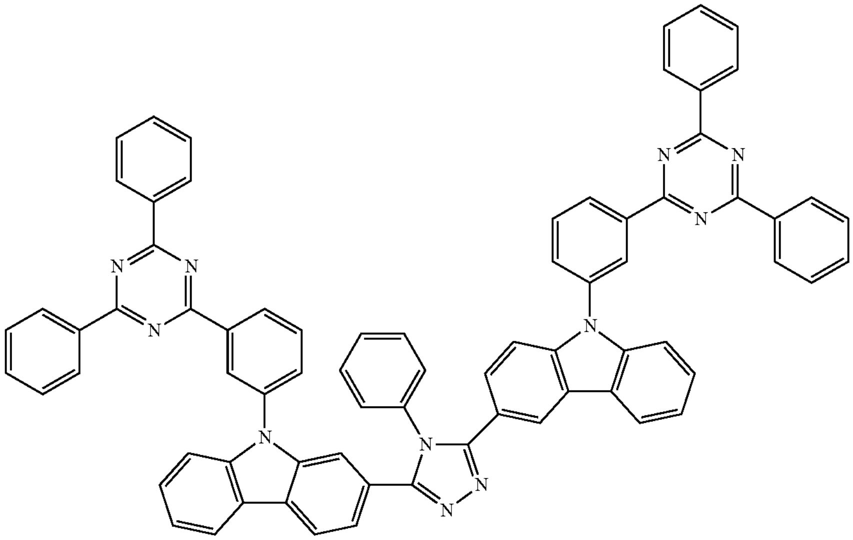
C 345
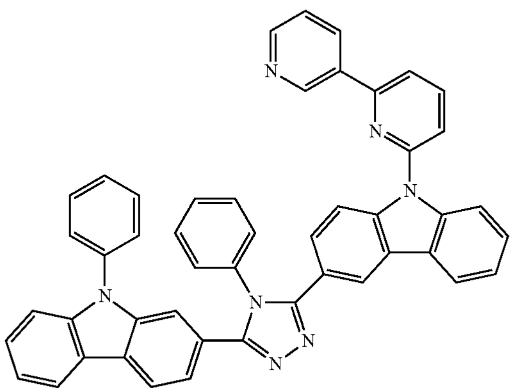
C 346
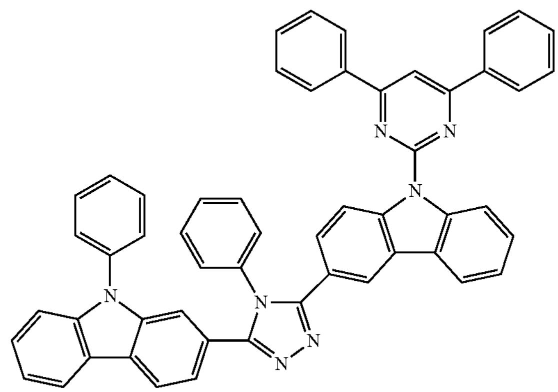
C 347
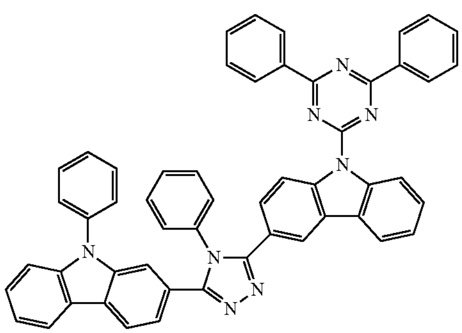
C 348
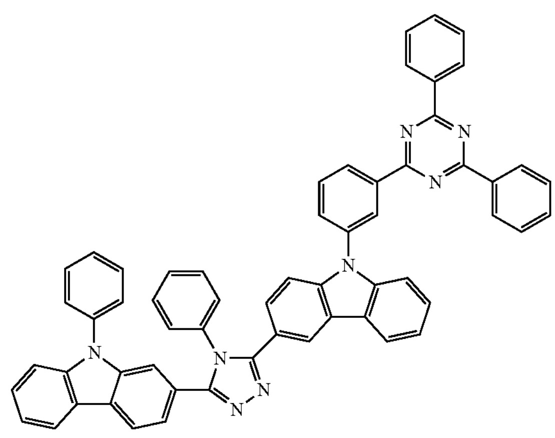

-continued
C 349
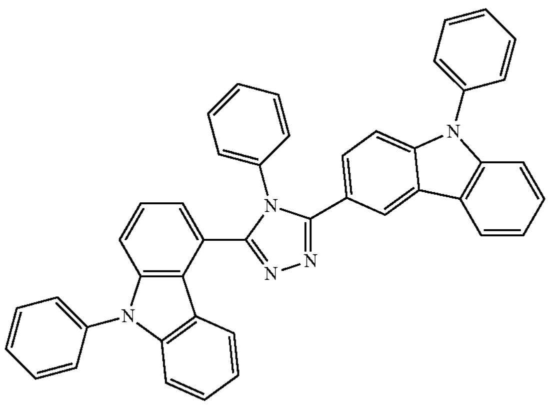
C 350
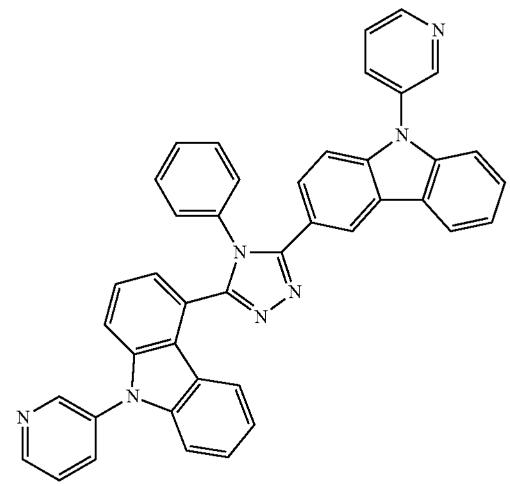
C 351
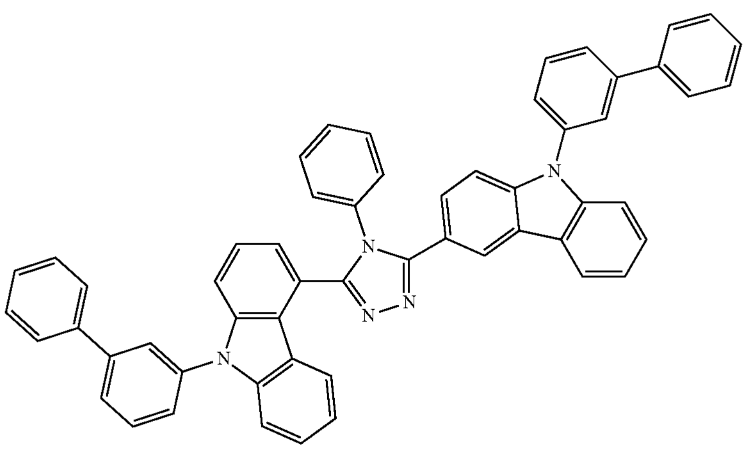
C 352
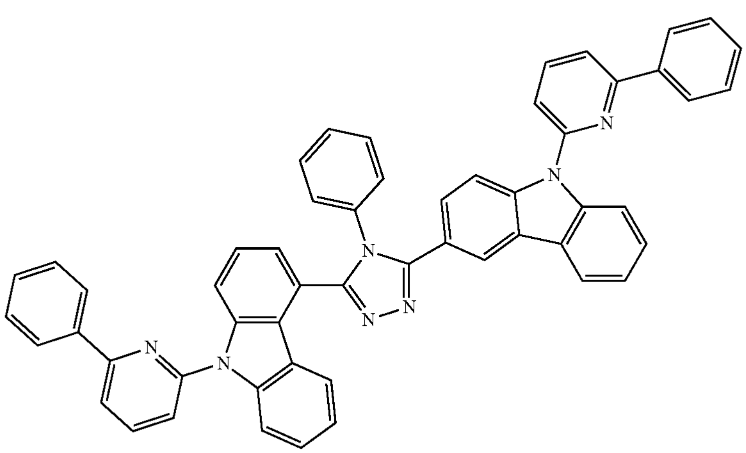

-continued
C 353
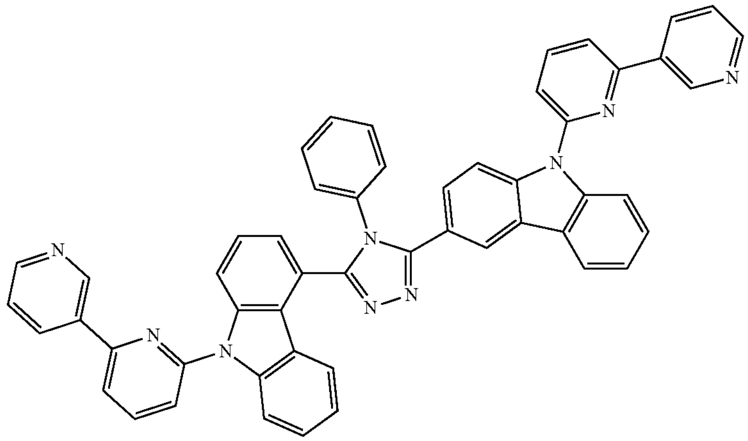
C 354
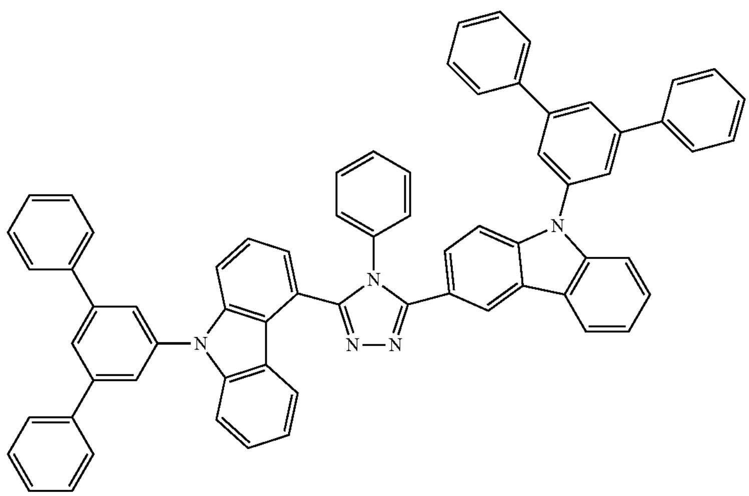
C 355
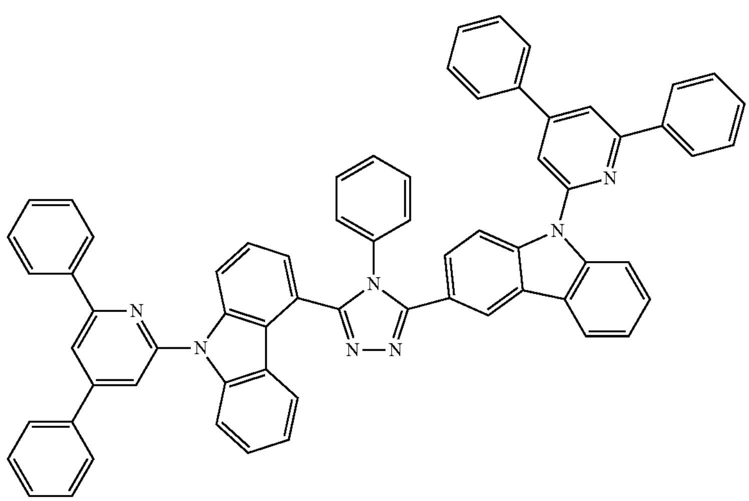

-continued
C 356
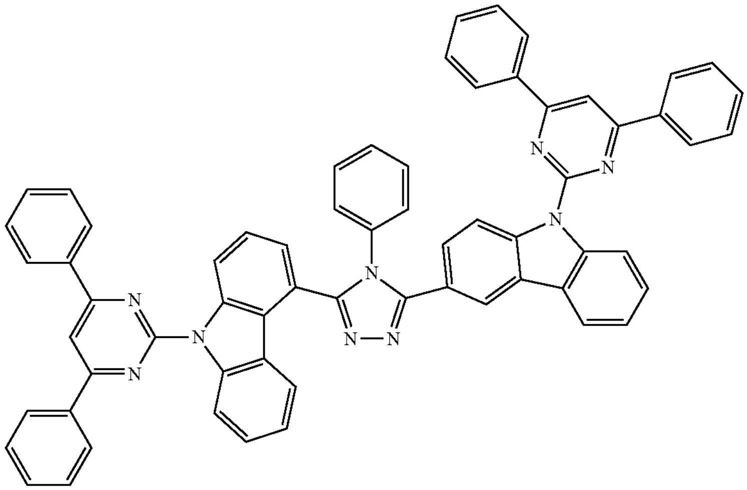
C 357
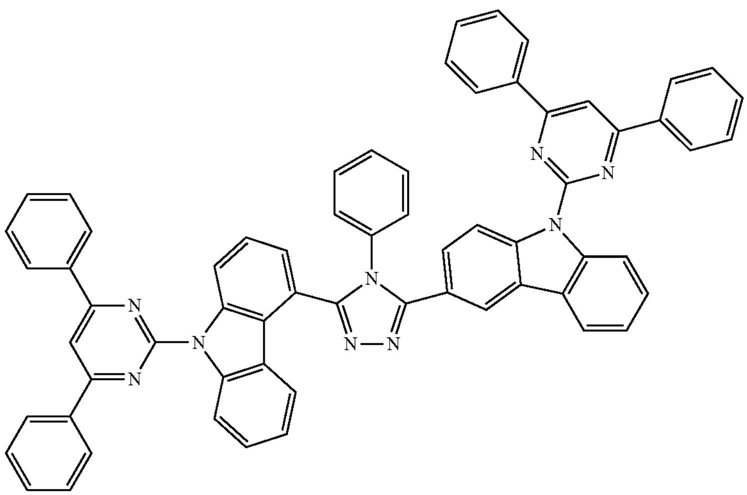
C 358
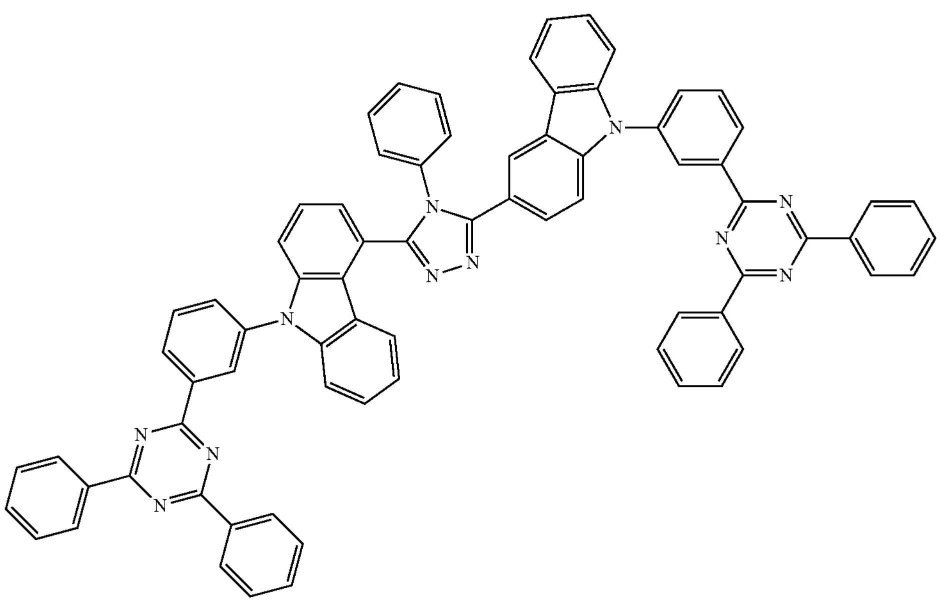

-continued
C 359
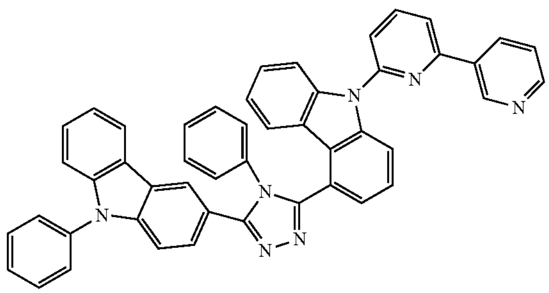
C 360
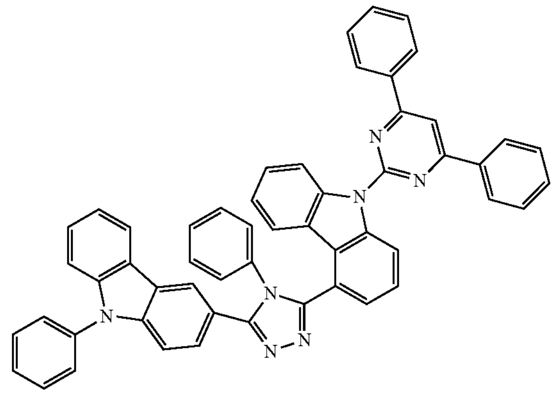
C 361
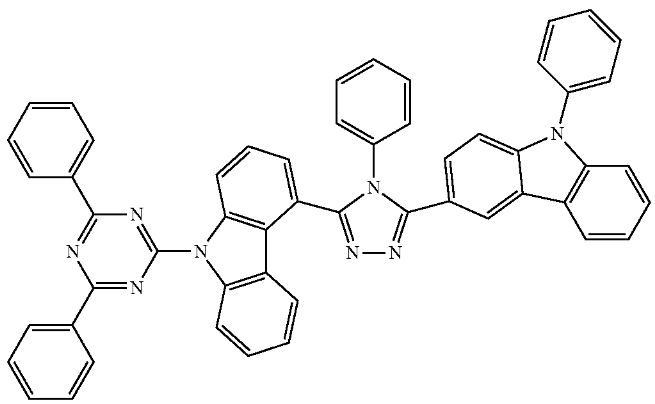
C 362
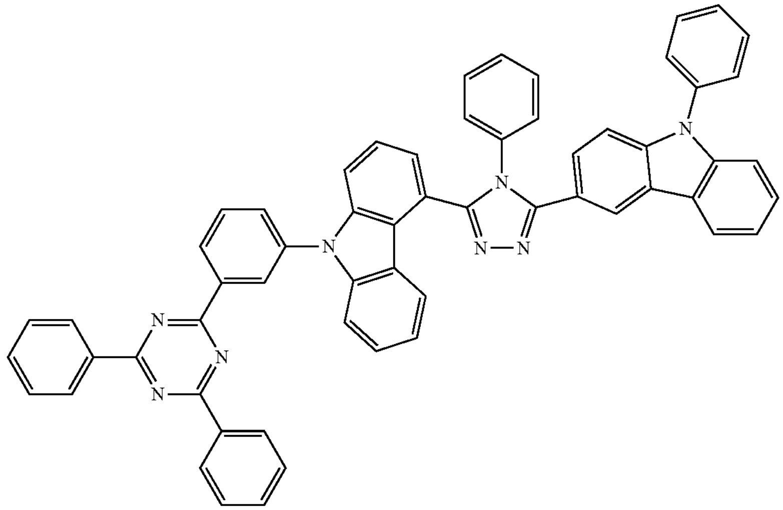

-continued
C 363
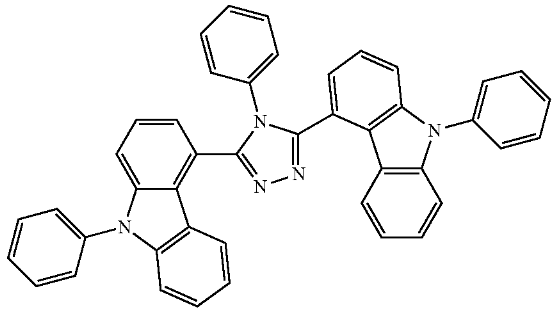
C 364
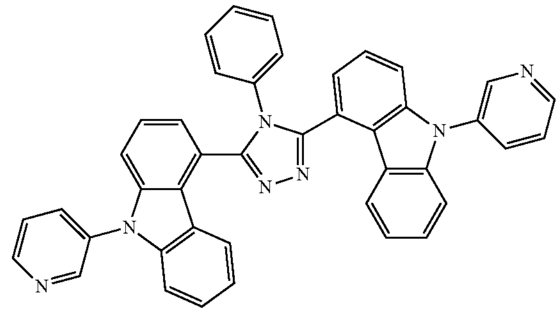
C 365
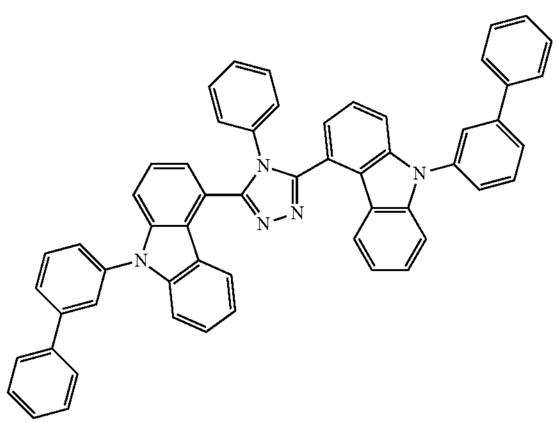
C 366
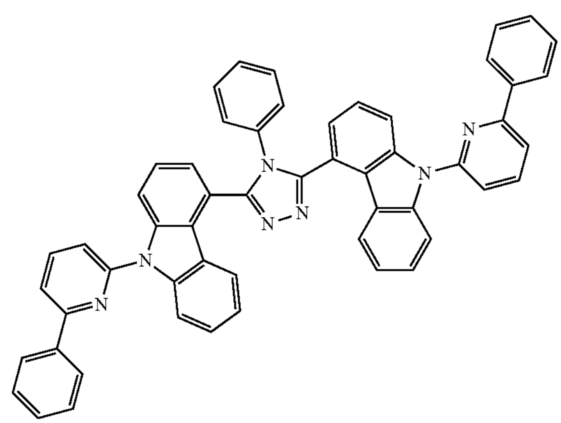
C 367
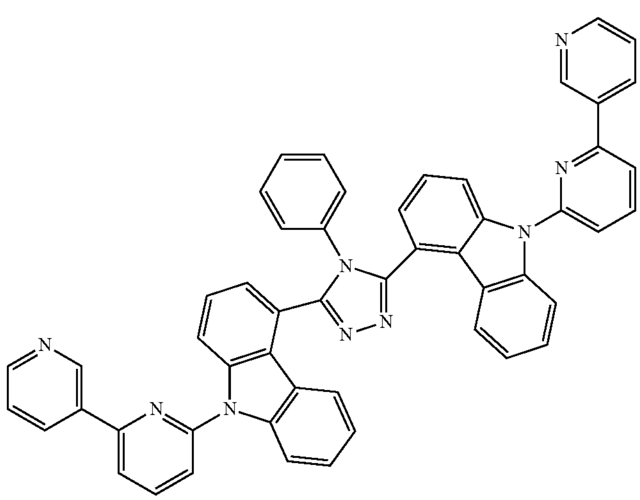

-continued
C 368
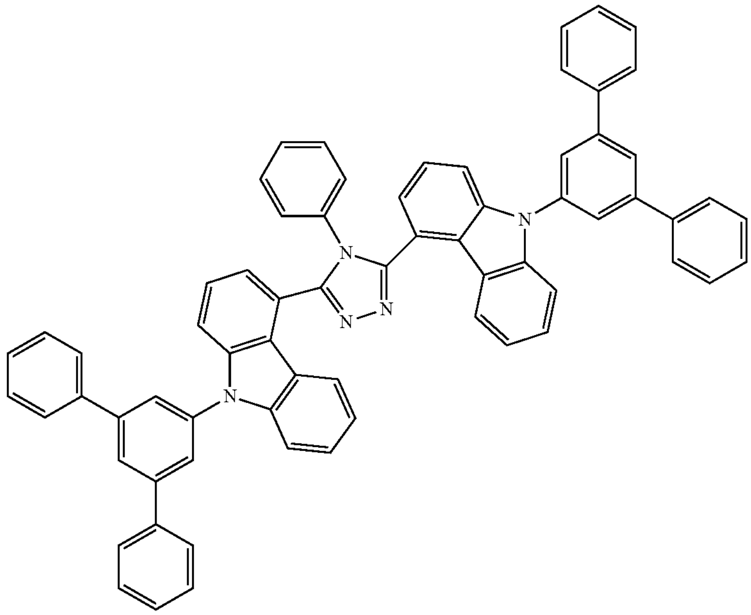
C 369
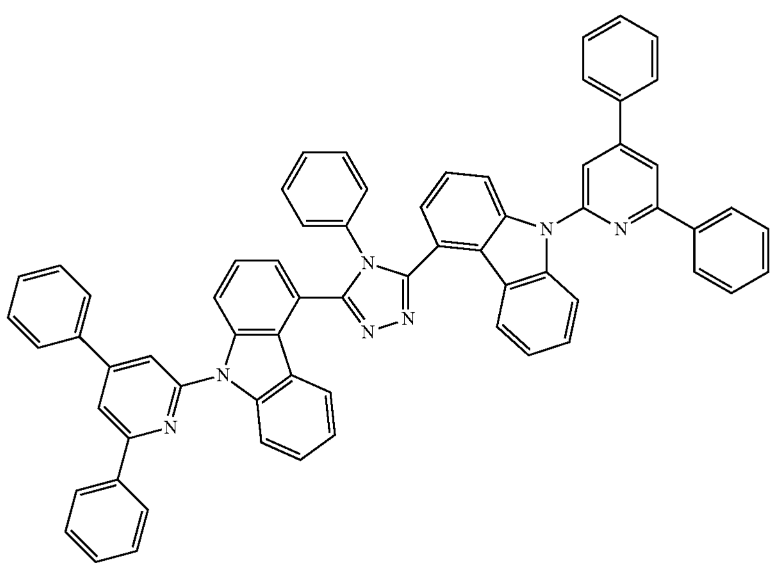

-continued
C 370
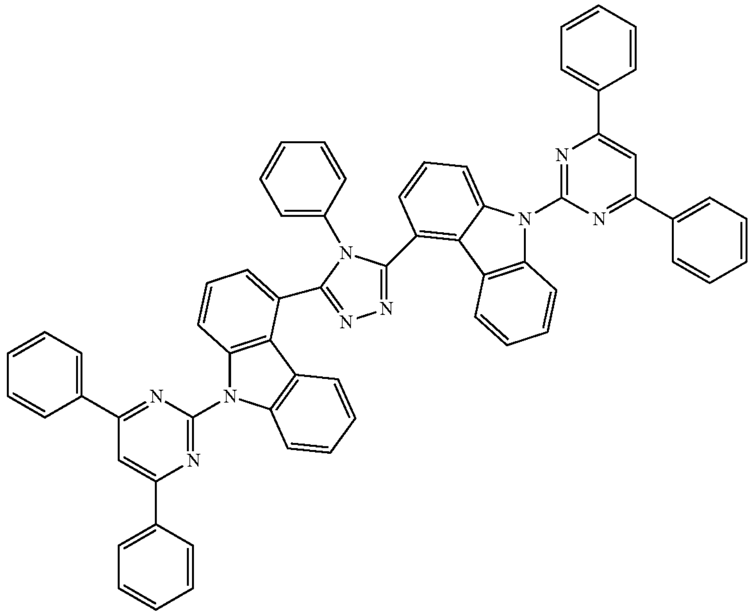
C 371
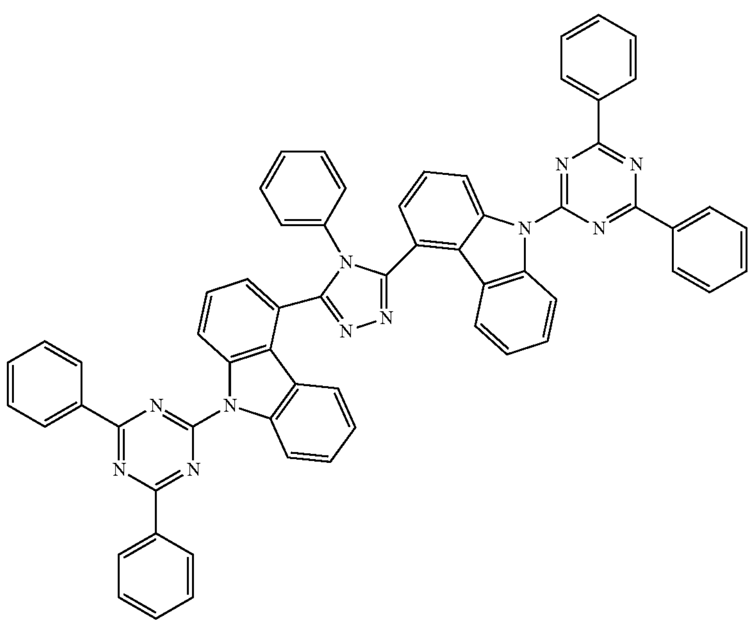

-continued
C 372
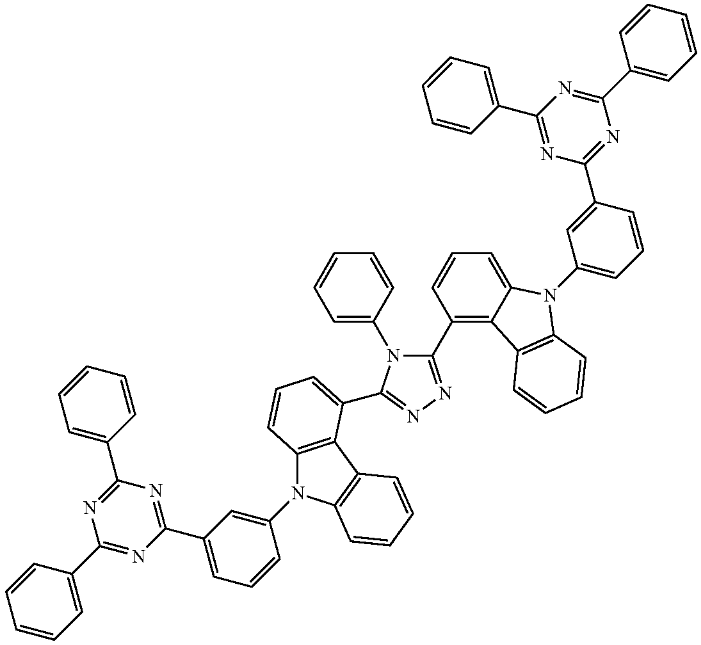
C 373
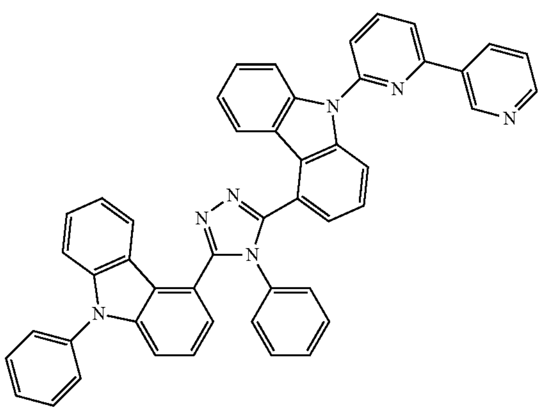
C 374
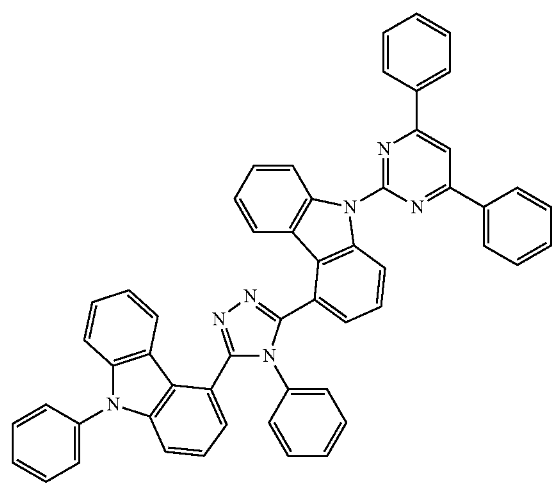
C 375
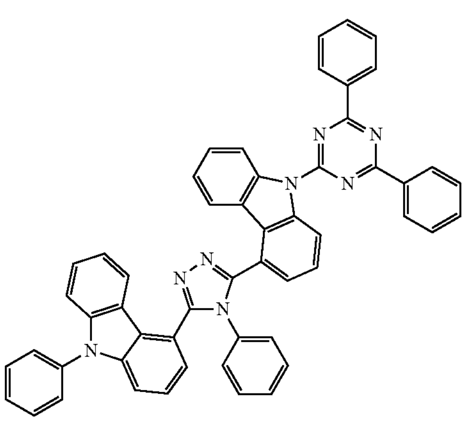
C 376
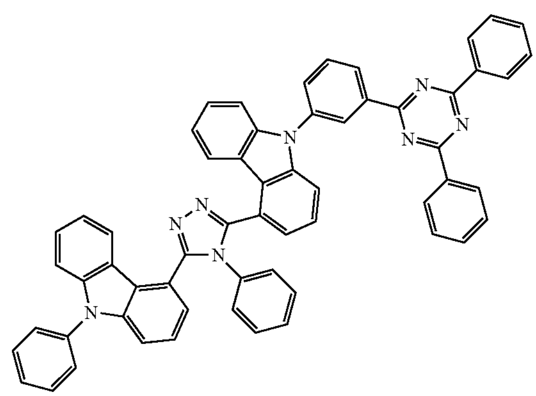

-continued
C 377
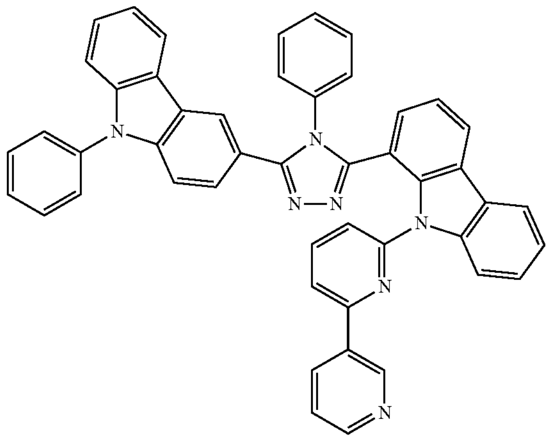
C 378
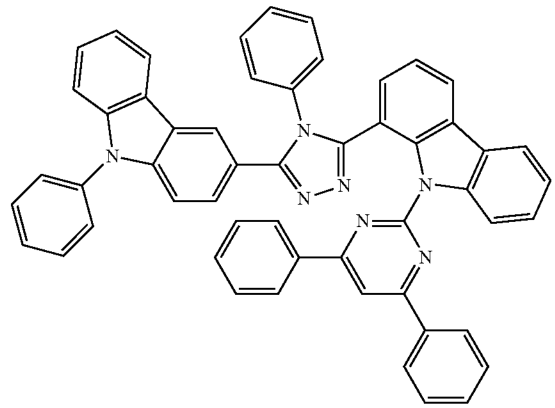
C 379
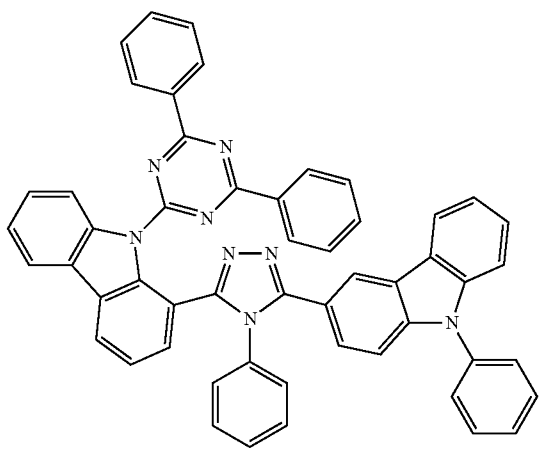
C 380
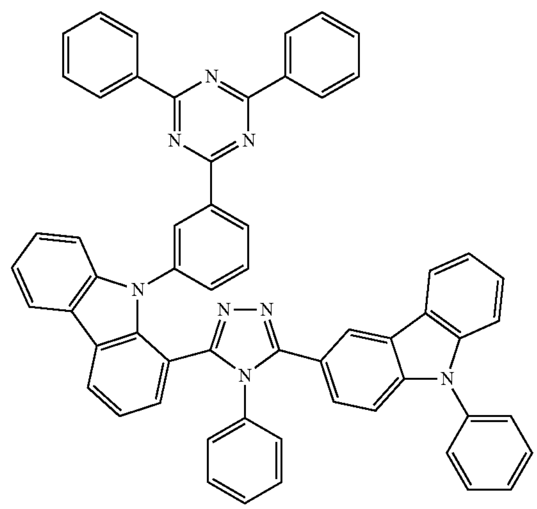
C 381
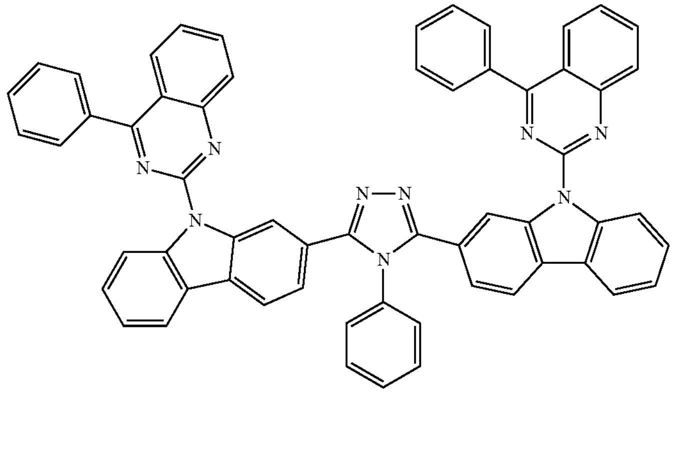

-continued
C 382
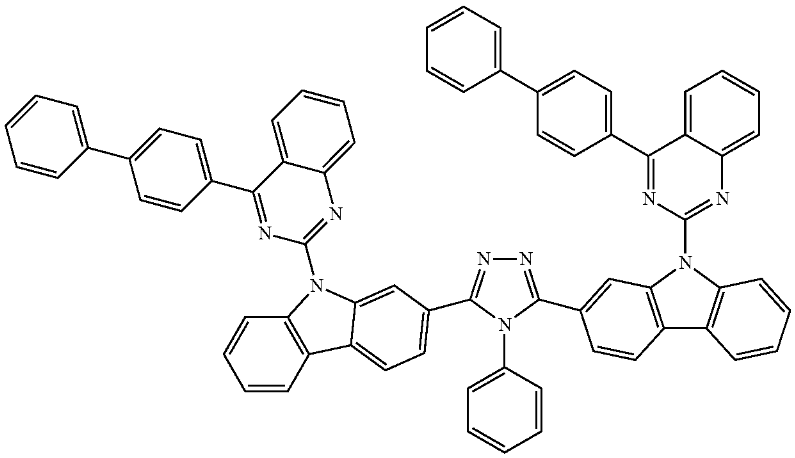
C 383
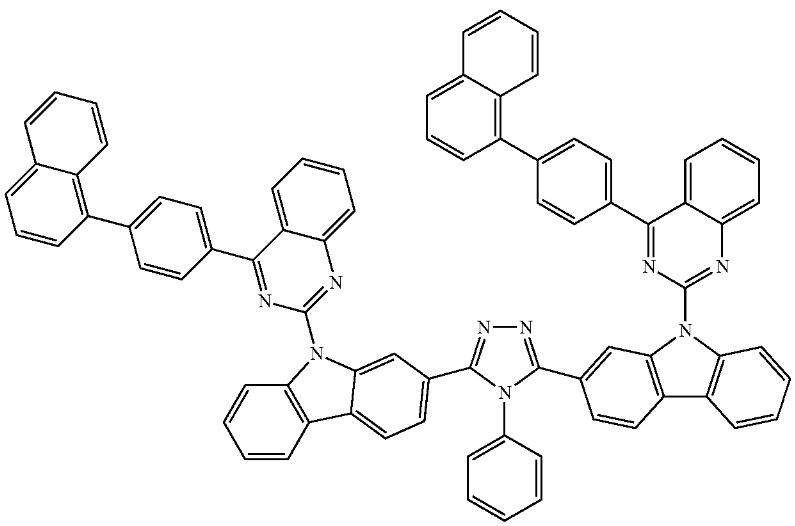
C 384
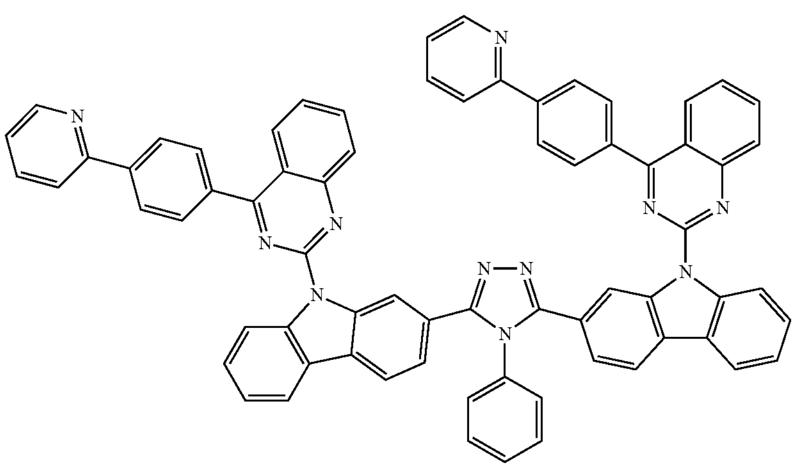

-continued
C 385
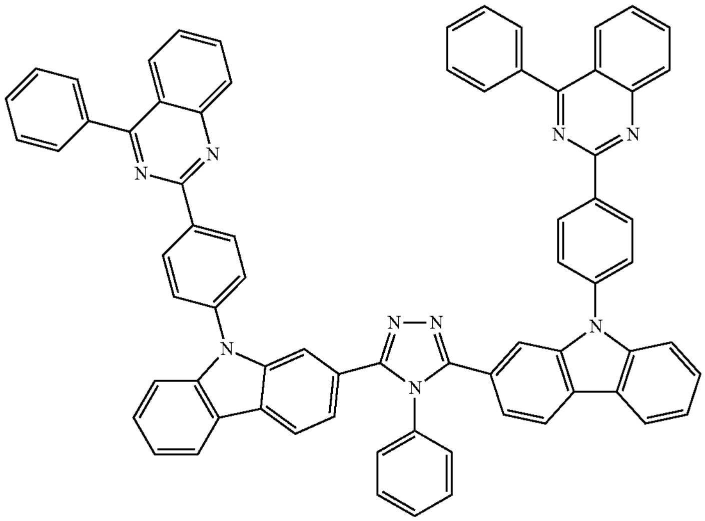
C 386
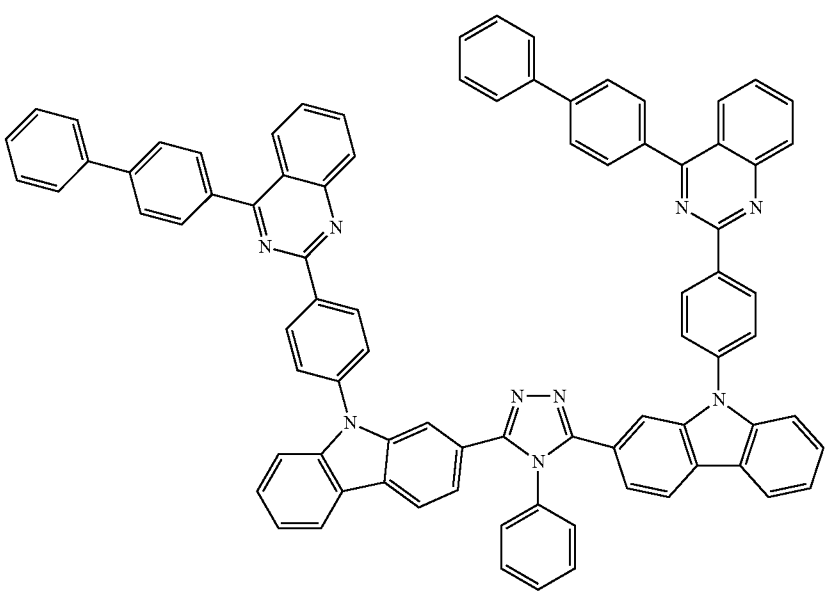

-continued
C 387
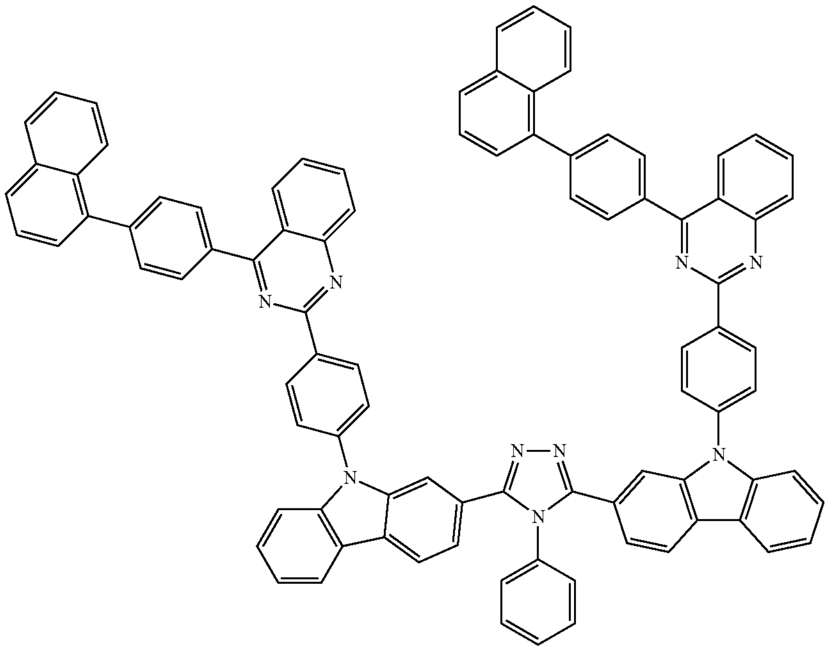
C 388
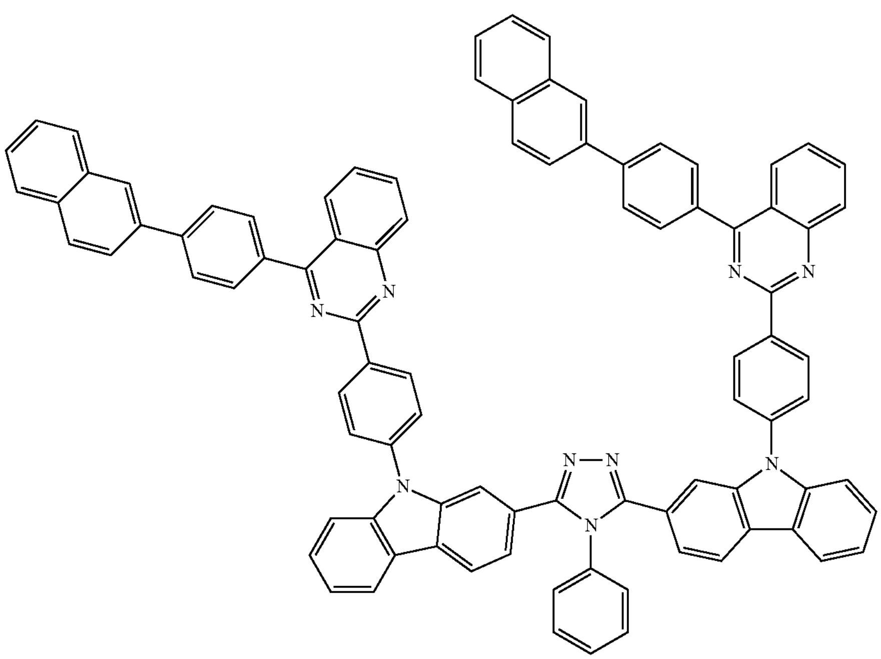

-continued

C 389

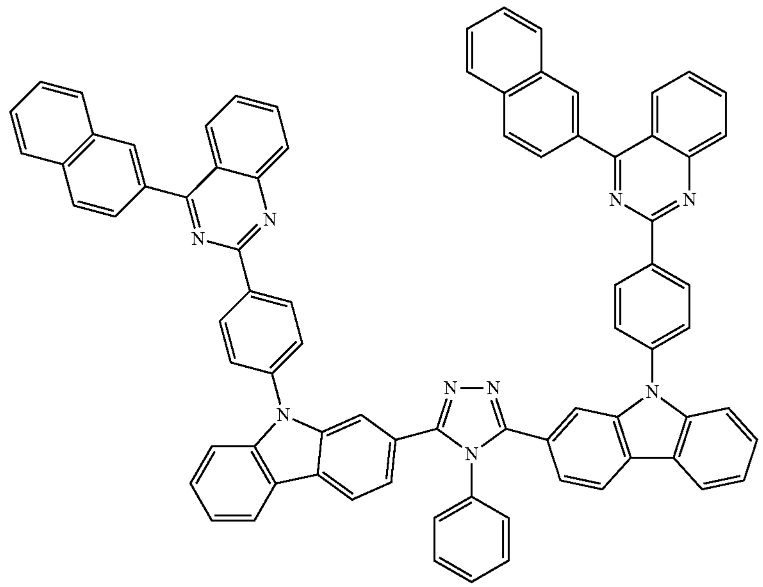

18. The organic light-emitting device of claim 1, wherein the first compound and the second compound are both in the emission layer.

19. The organic light-emitting device of claim 1, wherein a weight ratio of the first compound and the second compound is in a range of about 20:80 to about 80:20.

20. The organic light-emitting device of claim 1, wherein the emission layer comprises an organic metal complex represented by Formula 401:

Formula 401

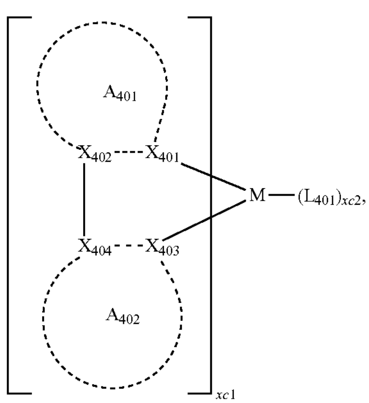

wherein, in Formula 401,

M is selected from iridium (Ir), platinum (Pt), osmium (Os), titanium (Ti), zirconium (Zr), hafnium (Hf), europium (Eu), terbium (Tb), and thulium (Tm), $X_{401}$ to $X_{404}$ are each independently nitrogen or carbon, rings $A_{401}$ and $A_{402}$ are each independently selected from a substituted or unsubstituted benzene, a substituted or unsubstituted naphthalene, a substituted or unsubstituted fluorene, a substituted or unsubstituted spiro-fluorene, a substituted or unsubstituted indene, a substituted or unsubstituted pyrrole, a substituted or unsubstituted thiophene, a substituted or unsubstituted furan, a substituted or unsubstituted imidazole, a substituted or unsubstituted pyrazole, a substituted or unsubstituted thiazole, a substituted or unsubstituted isothiazole, a substituted or unsubstituted oxazole, a substituted or unsubstituted isoxazole, a substituted or unsubstituted pyridine, a substituted or unsubstituted pyrazine, a substituted or unsubstituted pyrimidine, a substituted or unsubstituted pyridazine, a substituted or unsubstituted quinoline, a substituted or unsubstituted isoquinoline, a substituted or unsubstituted benzoquinoline, a substituted or unsubstituted quinoxaline, a substituted or unsubstituted quinazoline, a substituted or unsubstituted carbazole, a substituted or unsubstituted benzoimidazole, a substituted or unsubstituted benzofuran, a substituted or unsubstituted benzothiophene, a substituted or unsubstituted isobenzothiophene, a substituted or unsubstituted benzoxazole, a substituted or unsubstituted isobenzoxazole, a substituted or unsubstituted triazole, a substituted or unsubstituted oxadiazole, a substituted or unsubstituted triazine, a substituted or unsubstituted dibenzofuran, and a substituted or unsubstituted dibenzothiophene, at least one substituent of the substituted benzene, substituted naphthalene, substituted fluorene, substituted spiro-fluorene, substituted indene, substituted pyrrole, substituted thiophene, substituted furan, substituted imidazole, substituted pyrazole, substituted thiazole, substituted isothiazole, substituted oxazole, substituted isoxazole, substituted pyridine, substituted pyrazine, substituted pyrimidine, substituted pyridazine, substituted quinoline, substituted isoquinoline, substituted benzoquinoline, substituted quinoxaline, substituted quinazoline, substituted carbazole, substituted benzoimidazole, substituted benzofuran, substituted benzothiophene, substituted isobenzothiophene, substituted benzoxazole, substituted isobenzoxazole, substituted triazole, substituted oxadiazole, substituted triazine, substituted dibenzofuran, and substituted dibenzothiophene is selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group, —Si($Q_{401}$)($Q_{402}$)($Q_{403}$), —N($Q_{404}$)($Q_{405}$), and —B($Q_{406}$)($Q_{407}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group, each substituted with at least one selected from deuterium, —F, -Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group, —Si($Q_{411}$)($Q_{412}$)($Q_{413}$), —N($Q_{414}$)($Q_{415}$), and —B($Q_{416}$)($Q_{417}$); and —Si($Q_{421}$)($Q_{422}$)($Q_{423}$), —N($Q_{424}$)($Q_{425}$), and —B($Q_{426}$)($Q_{427}$), $L_{401}$ is an organic ligand, xc1 is 1, 2, or 3, and xc2 is 0, 1, 2, or 3, wherein $Q_{401}$ to $Q_{407}$, $Q_{411}$ to $Q_{417}$, and $Q_{421}$ to $Q_{427}$ are each independently selected from hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group.

* * * * *